US012154817B1

(12) United States Patent
Or-Bach et al.

(10) Patent No.: US 12,154,817 B1
(45) **Date of Patent: *Nov. 26, 2024**

(54) METHODS FOR PRODUCING A 3D SEMICONDUCTOR MEMORY DEVICE AND STRUCTURE

(71) Applicant: Monolithic 3D Inc., Klamath Falls, OR (US)

(72) Inventors: Zvi Or-Bach, Haifa (IL); Brian Cronquist, Klamath Falls, OR (US); Deepak C. Sekar, Sunnyvale, CA (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/942,109

(22) Filed: Sep. 9, 2022

Related U.S. Application Data

(63) Continuation-in-part of application No. 17/340,004, filed on Jun. 5, 2021, now Pat. No. 11,482,438, which (Continued)

(51) Int. Cl.
*H01L 21/683* (2006.01)
*G11C 8/16* (2006.01)

(Continued)

(52) U.S. Cl.
CPC ............ *H01L 21/6835* (2013.01); *G11C 8/16* (2013.01); *H01L 21/743* (2013.01);

(Continued)

(58) Field of Classification Search
CPC ...... H10B 10/00; H10B 12/053; H10B 12/09; H10B 12/20; H10B 12/50; H10B 20/00;

(Continued)

(56) References Cited

U.S. PATENT DOCUMENTS 3,007,090 A 10/1961 Rutz
3,819,959 A 6/1974 Chang et al.

(Continued)

FOREIGN PATENT DOCUMENTS

EP 1267594 A2 12/2002
WO PCT/US2008/063483 5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.

(Continued)

*Primary Examiner* — Brook Kebede
(74) *Attorney, Agent, or Firm* — PatentPC/PowerPatent; Bao Tran

(57) ABSTRACT

A method for producing a 3D memory device including: providing a first level including a first single-crystal layer and control circuits, where the first level includes at least two interconnecting metal layers; forming at least one second level disposed above the first level; performing a first etch step including etching holes within the second level; forming at least one third level above the second level; performing a second etch step including etching holes within the third level; and performing additional processing steps to form a plurality of first memory cells within the second level and a plurality of second memory cells within the third level; each of first memory cells include one first transistor and each of second memory cells include one second transistor, where first memory cells and second memory cells are a NAND nonvolatile type memory, and at least one of the second transistors include a metal gate.

20 Claims, 91 Drawing Sheets

Related U.S. Application Data is a continuation-in-part of application No. 16/537,564, filed on Aug. 10, 2019, which is a continuation-in-part of application No. 15/460,230, filed on Mar. 16, 2017, now Pat. No. 10,497,713, which is a continuation-in-part of application No. 14/821,683, filed on Aug. 7, 2015, now Pat. No. 9,613,844, which is a continuation-in-part of application No. 13/492,395, filed on Jun. 8, 2012, now Pat. No. 9,136,153, which is a continuation of application No. 13/273,712, filed on Oct. 14, 2011, now Pat. No. 8,273,610, which is a continuation-in-part of application No. 13/016,313, filed on Jan. 28, 2011, now Pat. No. 8,362,482, which is a continuation-in-part of application No. 12/970,602, filed on Dec. 16, 2010, now Pat. No. 9,711,407, which is a continuation-in-part of application No. 12/949,617, filed on Nov. 18, 2010, now Pat. No. 8,754,533, application No. 17/942,109, filed on Sep. 9, 2022 is a continuation-in-part of application No. 17/340,004, filed on Jun. 5, 2021, now Pat. No. 11,482,438, which is a continuation-in-part of application No. 17/147,320, filed on Jan. 12, 2021, now Pat. No. 11,004,719, which is a continuation-in-part of application No. 16/537,564, filed on Aug. 10, 2019.

(51) Int. Cl.

| | |
|---|---|
| ***H01L 21/74*** | (2006.01) |
| ***H01L 21/762*** | (2006.01) |
| ***H01L 21/768*** | (2006.01) |
| ***H01L 21/822*** | (2006.01) |
| ***H01L 21/8238*** | (2006.01) |
| ***H01L 21/84*** | (2006.01) |
| ***H01L 23/48*** | (2006.01) |
| ***H01L 23/525*** | (2006.01) |
| ***H01L 27/02*** | (2006.01) |
| ***H01L 27/06*** | (2006.01) |
| ***H01L 27/092*** | (2006.01) |
| ***H01L 27/10*** | (2006.01) |
| ***H01L 27/105*** | (2023.01) |
| ***H01L 27/118*** | (2006.01) |
| ***H01L 27/12*** | (2006.01) |
| ***H01L 29/423*** | (2006.01) |
| ***H01L 29/66*** | (2006.01) |
| ***H01L 29/78*** | (2006.01) |
| ***H01L 29/788*** | (2006.01) |
| ***H01L 29/792*** | (2006.01) |
| ***H10B 10/00*** | (2023.01) |
| ***H10B 12/00*** | (2023.01) |
| ***H10B 20/00*** | (2023.01) |
| ***H10B 41/20*** | (2023.01) |
| ***H10B 41/40*** | (2023.01) |
| ***H10B 41/41*** | (2023.01) |
| ***H10B 43/20*** | (2023.01) |
| ***H10B 43/40*** | (2023.01) |
| *H01L 23/00* | (2006.01) |
| *H01L 23/367* | (2006.01) |
| *H01L 25/00* | (2006.01) |
| *H01L 25/065* | (2023.01) |
| *H10B 20/20* | (2023.01) |

(52) U.S. Cl.

CPC .. *H01L 21/76254* (2013.01); *H01L 21/76898* (2013.01); *H01L 21/8221* (2013.01); *H01L 21/823828* (2013.01); *H01L 21/84* (2013.01); *H01L 23/481* (2013.01); *H01L 23/5252* (2013.01); *H01L 27/0207* (2013.01); *H01L 27/0688* (2013.01); *H01L 27/092* (2013.01); *H01L 27/10* (2013.01); *H01L 27/105* (2013.01); *H01L 27/11807* (2013.01); *H01L 27/11898* (2013.01); *H01L 27/1203* (2013.01); *H01L 29/4236* (2013.01); *H01L 29/66272* (2013.01); *H01L 29/66621* (2013.01); *H01L 29/66825* (2013.01); *H01L 29/66833* (2013.01); *H01L 29/66901* (2013.01); *H01L 29/78* (2013.01); *H01L 29/7841* (2013.01); *H01L 29/7843* (2013.01); *H01L 29/7881* (2013.01); *H01L 29/792* (2013.01); *H10B 10/00* (2023.02); *H10B 10/125* (2023.02); *H10B 12/053* (2023.02); *H10B 12/09* (2023.02); *H10B 12/20* (2023.02); *H10B 12/50* (2023.02); *H10B 20/00* (2023.02); *H10B 41/20* (2023.02); *H10B 41/40* (2023.02); *H10B 41/41* (2023.02); *H10B 43/20* (2023.02); *H10B 43/40* (2023.02); *H01L 23/3677* (2013.01); *H01L 24/13* (2013.01); *H01L 24/16* (2013.01); *H01L 24/45* (2013.01); *H01L 24/48* (2013.01); *H01L 25/0655* (2013.01); *H01L 25/0657* (2013.01); *H01L 25/50* (2013.01); *H01L 27/1214* (2013.01); *H01L 27/1266* (2013.01); *H01L 2221/68368* (2013.01); *H01L 2223/5442* (2013.01); *H01L 2223/54426* (2013.01); *H01L 2224/131* (2013.01); *H01L 2224/16145* (2013.01); *H01L 2224/16146* (2013.01); *H01L 2224/16227* (2013.01); *H01L 2224/16235* (2013.01); *H01L 2224/32145* (2013.01); *H01L 2224/32225* (2013.01); *H01L 2224/45124* (2013.01); *H01L 2224/45147* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/81005* (2013.01); *H01L 2224/83894* (2013.01); *H01L 2225/06513* (2013.01); *H01L 2225/06541* (2013.01); *H01L 2924/00011* (2013.01); *H01L 2924/01002* (2013.01); *H01L 2924/01004* (2013.01); *H01L 2924/01013* (2013.01); *H01L 2924/01018* (2013.01); *H01L 2924/01019* (2013.01); *H01L 2924/01029* (2013.01); *H01L 2924/01046* (2013.01); *H01L 2924/01066* (2013.01); *H01L 2924/01068* (2013.01); *H01L 2924/01077* (2013.01); *H01L 2924/01078* (2013.01); *H01L 2924/01322* (2013.01); *H01L 2924/10253* (2013.01); *H01L 2924/10329* (2013.01); *H01L 2924/12032* (2013.01); *H01L 2924/12033* (2013.01); *H01L 2924/12036* (2013.01); *H01L 2924/12042* (2013.01); *H01L 2924/1301* (2013.01); *H01L 2924/1305* (2013.01); *H01L 2924/13062* (2013.01); *H01L 2924/13091* (2013.01); *H01L 2924/14* (2013.01); *H01L 2924/1461* (2013.01); *H01L 2924/15311* (2013.01); *H01L 2924/1579* (2013.01); *H01L 2924/16152* (2013.01); *H01L 2924/181* (2013.01); *H01L 2924/19041* (2013.01); *H01L 2924/30105* (2013.01); *H01L 2924/3011* (2013.01); *H01L 2924/3025* (2013.01); *H10B 12/05* (2023.02); *H10B 20/20* (2023.02)

(58) Field of Classification Search

CPC ........ H10B 43/40; H10B 41/20; H10B 41/40; H10B 41/41; H10B 10/125; H10B 43/20; H01L 21/6835; H01L 21/743; H01L

21/76254; H01L 21/76898; H01L 21/8221; H01L 21/823828; H01L 21/84; H01L 23/481; H01L 23/5252; H01L 27/0207; H01L 27/0688; H01L 27/092; H01L 27/10; H01L 27/105; H01L 27/10802; H01L 27/10876; H01L 27/10894; H01L 27/10897; H01L 27/11; H01L 27/1108; H01L 27/112; H01L 27/11526; H01L 27/11529; H01L 27/11551; H01L 27/11573; H01L 27/11578; H01L 27/11807; H01L 27/11898; H01L 27/1203; H01L 29/4236; H01L 29/66272; H01L 29/66621; H01L 29/66825; H01L 29/66833; H01L 29/66901; H01L 29/78; H01L 29/7841; H01L 29/7843; H01L 29/17881; H01L 29/792; G11C 8/16

See application file for complete search history.

(56) References Cited

U.S. PATENT DOCUMENTS 4,009,483 A 2/1977 Clark
4,197,555 A 4/1980 Uehara et al.
4,213,139 A 7/1980 Rao et al.
4,400,715 A 8/1983 Barbee et al.
4,487,635 A 12/1984 Kugimiya et al.
4,510,670 A 4/1985 Schwabe
4,522,657 A 6/1985 Rohatgi et al.
4,612,083 A 9/1986 Yasumoto et al.
4,643,950 A 2/1987 Ogura et al.
4,704,785 A 11/1987 Curran
4,711,858 A 12/1987 Harder et al.
4,721,885 A 1/1988 Brodie
4,732,312 A 3/1988 Kennedy et al.
4,733,288 A 3/1988 Sato
4,829,018 A 5/1989 Wahlstrom
4,854,986 A 8/1989 Raby
4,866,304 A 9/1989 Yu
4,939,568 A 7/1990 Kato et al.
4,956,307 A 9/1990 Pollack et al.
5,012,153 A 4/1991 Atkinson et al.
5,032,007 A 7/1991 Silverstein et al.
5,047,979 A 9/1991 Leung
5,087,585 A 2/1992 Hayashi
5,093,704 A 3/1992 Sato et al.
5,106,775 A 4/1992 Kaga et al.
5,152,857 A 10/1992 Ito et al.
5,162,879 A 11/1992 Gill
5,189,500 A 2/1993 Kusunoki
5,217,916 A 6/1993 Anderson et al.
5,250,460 A 10/1993 Yamagata et al.
5,258,643 A 11/1993 Cohen
5,265,047 A 11/1993 Leung et al.
5,266,511 A 11/1993 Takao
5,277,748 A 1/1994 Sakaguchi et al.
5,286,670 A 2/1994 Kang et al.
5,294,556 A 3/1994 Kawamura
5,308,782 A 5/1994 Mazure et al.
5,312,771 A 5/1994 Yonehara
5,317,236 A 5/1994 Zavracky et al.
5,324,980 A 6/1994 Kusunoki
5,355,022 A 10/1994 Sugahara et al.
5,371,037 A 12/1994 Yonehara
5,374,564 A 12/1994 Bruel
5,374,581 A 12/1994 Ichikawa et al.
5,424,560 A 6/1995 Norman et al.
5,475,280 A 12/1995 Jones et al.
5,478,762 A 12/1995 Chao
5,485,031 A 1/1996 Zhang et al.
5,498,978 A 3/1996 Takahashi et al.
5,527,423 A 6/1996 Neville et al.
5,535,342 A 7/1996 Taylor
5,554,870 A 9/1996 Fitch et al.
5,563,084 A 10/1996 Ramm et al.
5,583,349 A 12/1996 Norman et al.
5,583,350 A 12/1996 Norman et al.
5,586,291 A 12/1996 Lasker
5,594,563 A 1/1997 Larson
5,604,137 A 2/1997 Yamazaki et al.
5,617,991 A 4/1997 Pramanick et al.
5,627,106 A 5/1997 Hsu
5,656,548 A 8/1997 Zavracky et al.
5,656,553 A 8/1997 Leas et al.
5,659,194 A 8/1997 Iwamatsu
5,670,411 A 9/1997 Yonehara
5,681,756 A 10/1997 Norman et al.
5,695,557 A 12/1997 Yamagata et al.
5,701,027 A 12/1997 Gordon et al.
5,707,745 A 1/1998 Forrest et al.
5,714,395 A 2/1998 Bruel
5,721,160 A 2/1998 Forrest et al.
5,737,748 A 4/1998 Shigeeda
5,739,552 A 4/1998 Kimura et al.
5,744,979 A 4/1998 Goetting
5,748,161 A 5/1998 Lebby et al.
5,757,026 A 5/1998 Forrest et al.
5,770,483 A 6/1998 Kadosh
5,770,881 A 6/1998 Pelella et al.
5,781,031 A 7/1998 Bertin et al.
5,817,574 A 10/1998 Gardner
5,829,026 A 10/1998 Leung et al.
5,835,396 A 11/1998 Zhang
5,854,123 A 12/1998 Sato et al.
5,861,929 A 1/1999 Spitzer
5,877,034 A 3/1999 Ramm
5,877,070 A 3/1999 Goesele et al.
5,882,987 A 3/1999 Srikrishnan
5,883,525 A 3/1999 Tavana et al.
5,889,903 A 3/1999 Rao
5,893,721 A 4/1999 Huang et al.
5,915,167 A 6/1999 Leedy
5,920,788 A 7/1999 Reinberg
5,937,312 A 8/1999 Iyer et al.
5,943,574 A 8/1999 Tehrani et al.
5,952,680 A 9/1999 Strite
5,952,681 A 9/1999 Chen
5,965,875 A 10/1999 Merrill
5,977,579 A 11/1999 Noble
5,977,961 A 11/1999 Rindal
5,980,633 A 11/1999 Yamagata et al.
5,985,742 A 11/1999 Henley et al.
5,994,746 A 11/1999 Reisinger
5,998,808 A 12/1999 Matsushita
6,001,693 A 12/1999 Yeouchung et al.
6,009,496 A 12/1999 Tsai
6,020,252 A 2/2000 Aspar et al.
6,020,263 A 2/2000 Shih et al.
6,027,958 A 2/2000 Vu et al.
6,030,700 A 2/2000 Forrest et al.
6,052,498 A 4/2000 Paniccia
6,054,370 A 4/2000 Doyle
6,057,212 A 5/2000 Chan et al.
6,071,795 A 6/2000 Cheung et al.
6,075,268 A 6/2000 Gardner et al.
6,103,597 A 8/2000 Aspar et al.
6,111,260 A 8/2000 Dawson et al.
6,125,217 A 9/2000 Paniccia et al.
6,153,495 A 11/2000 Kub et al.
6,191,007 B1 2/2001 Matsui et al.
6,200,878 B1 3/2001 Yamagata
6,222,203 B1 4/2001 Ishibashi et al.
6,226,197 B1 5/2001 Nishimura
6,229,161 B1 5/2001 Nemati et al.
6,242,324 B1 6/2001 Kub et al.
6,242,778 B1 6/2001 Marmillion et al.
6,252,465 B1 6/2001 Katoh
6,259,623 B1 7/2001 Takahashi
6,261,935 B1 7/2001 See et al.
6,264,805 B1 7/2001 Forrest et al.
6,281,102 B1 8/2001 Cao et al.
6,294,018 B1 9/2001 Hamm et al.
6,306,705 B1 10/2001 Parekh et al.

(56) References Cited

U.S. PATENT DOCUMENTS 6,321,134 B1 11/2001 Henley et al.
6,322,903 B1 11/2001 Siniaguine et al.
6,331,468 B1 12/2001 Aronowitz et al.
6,331,790 B1 12/2001 Or-Bach et al.
6,331,943 B1 12/2001 Naji et al.
6,353,492 B2 3/2002 McClelland et al.
6,355,501 B1 3/2002 Fung et al.
6,355,976 B1 3/2002 Faris
6,358,631 B1 3/2002 Forrest et al.
6,365,270 B2 4/2002 Forrest et al.
6,376,337 B1 4/2002 Wang et al.
6,377,504 B1 4/2002 Hilbert
6,380,046 B1 4/2002 Yamazaki
6,392,253 B1 5/2002 Saxena
6,404,043 B1 6/2002 Isaak
6,417,108 B1 7/2002 Akino et al.
6,420,215 B1 7/2002 Knall et al.
6,423,614 B1 7/2002 Doyle
6,429,481 B1 8/2002 Mo et al.
6,429,484 B1 8/2002 Yu
6,430,734 B1 8/2002 Zahar
6,448,615 B1 9/2002 Forbes
6,475,869 B1 11/2002 Yu
6,476,493 B2 11/2002 Or-Bach et al.
6,479,821 B1 11/2002 Hawryluk et al.
6,483,707 B1 11/2002 Freuler et al.
6,507,115 B2 1/2003 Hofstee
6,515,334 B2 2/2003 Yamazaki et al.
6,515,511 B2 2/2003 Sugibayashi et al.
6,526,559 B2 2/2003 Schiefele et al.
6,528,391 B1 3/2003 Henley et al.
6,534,352 B1 3/2003 Kim
6,534,382 B1 3/2003 Sakaguchi et al.
6,544,837 B1 4/2003 Divakauni et al.
6,545,314 B2 4/2003 Forbes et al.
6,555,901 B1 4/2003 Yoshihara et al.
6,563,139 B2 5/2003 Hen
6,580,124 B1 6/2003 Cleeves
6,580,289 B2 6/2003 Cox
6,600,173 B2 7/2003 Tiwari
6,617,694 B2 9/2003 Kodaira et al.
6,620,659 B2 9/2003 Emmma et al.
6,624,046 B1 9/2003 Zavracky et al.
6,627,518 B1 9/2003 Inoue et al.
6,627,985 B2 9/2003 Huppenthal et al.
6,630,713 B2 10/2003 Geusic
6,635,552 B1 10/2003 Gonzalez
6,635,588 B1 10/2003 Hawryluk et al.
6,638,834 B2 10/2003 Gonzalez
6,642,744 B2 11/2003 Or-Bach et al.
6,653,209 B1 11/2003 Yamagata
6,653,712 B2 11/2003 Knall et al.
6,661,085 B2 12/2003 Kellar et al.
6,677,204 B2 1/2004 Cleeves et al.
6,686,253 B2 2/2004 Or-Bach
6,689,660 B1 2/2004 Noble
6,701,071 B2 3/2004 Wada et al.
6,703,328 B2 3/2004 Tanaka et al.
6,756,633 B2 6/2004 Wang et al.
6,756,811 B2 6/2004 Or-Bach
6,759,282 B2 7/2004 Campbell et al.
6,762,076 B2 7/2004 Kim et al.
6,774,010 B2 8/2004 Chu et al.
6,805,979 B2 10/2004 Ogura et al.
6,806,171 B1 10/2004 Ulyashin et al.
6,809,009 B2 10/2004 Aspar et al.
6,815,781 B2 11/2004 Vyvoda et al.
6,819,136 B2 11/2004 Or-Bach
6,821,826 B1 11/2004 Chan et al.
6,841,813 B2 1/2005 Walker et al.
6,844,243 B1 1/2005 Gonzalez
6,864,534 B2 3/2005 Ipposhi et al.
6,875,671 B2 4/2005 Faris
6,882,572 B2 4/2005 Wang et al.
6,888,375 B2 5/2005 Feng et al.
6,917,219 B2 7/2005 New
6,927,431 B2 8/2005 Gonzalez
6,930,511 B2 8/2005 Or-Bach
6,943,067 B2 9/2005 Greenlaw
6,943,407 B2 9/2005 Ouyang et al.
6,949,421 B1 9/2005 Padmanabhan et al.
6,953,956 B2 10/2005 Or-Bach et al.
6,967,149 B2 11/2005 Meyer et al.
6,985,012 B2 1/2006 Or-Bach
6,989,687 B2 1/2006 Or-Bach
6,995,430 B2 2/2006 Langdo et al.
6,995,456 B2 2/2006 Nowak
7,015,719 B1 3/2006 Feng et al.
7,016,569 B2 3/2006 Mule et al.
7,018,875 B2 3/2006 Madurawe
7,019,557 B2 3/2006 Madurawe
7,043,106 B2 5/2006 West et al.
7,052,941 B2 5/2006 Lee
7,064,579 B2 6/2006 Madurawe
7,067,396 B2 6/2006 Aspar et al.
7,067,909 B2 6/2006 Reif et al.
7,068,070 B2 6/2006 Or-Bach
7,068,072 B2 6/2006 New et al.
7,078,739 B1 7/2006 Nemati et al.
7,094,667 B1 8/2006 Bower
7,098,691 B2 8/2006 Or-Bach et al.
7,105,390 B2 9/2006 Brask et al.
7,105,871 B2 9/2006 Or-Bach et al.
7,109,092 B2 9/2006 Tong
7,110,629 B2 9/2006 Bjorkman et al.
7,111,149 B2 9/2006 Eilert
7,112,815 B2 9/2006 Prall
7,115,945 B2 10/2006 Lee et al.
7,115,966 B2 10/2006 Ido et al.
7,141,853 B2 11/2006 Campbell et al.
7,148,119 B1 12/2006 Sakaguchi et al.
7,157,787 B2 1/2007 Kim et al.
7,157,937 B2 1/2007 Apostol et al.
7,166,520 B1 1/2007 Henley
7,170,807 B2 1/2007 Fazan et al.
7,173,369 B2 2/2007 Forrest et al.
7,180,091 B2 2/2007 Yamazaki et al.
7,180,379 B1 2/2007 Hopper et al.
7,183,611 B2 2/2007 Bhattacharyya
7,189,489 B2 3/2007 Kunimoto et al.
7,205,204 B2 4/2007 Ogawa et al.
7,209,384 B1 4/2007 Kim
7,217,636 B1 5/2007 Atanackovic
7,223,612 B2 5/2007 Sarma
7,242,012 B2 7/2007 Leedy
7,245,002 B2 7/2007 Akino et al.
7,256,104 B2 8/2007 Ito et al.
7,259,091 B2 8/2007 Schuehrer et al.
7,265,421 B2 9/2007 Madurawe
7,271,420 B2 9/2007 Cao
7,274,207 B2 9/2007 Sugawara et al.
7,282,951 B2 10/2007 Huppenthal et al.
7,284,226 B1 10/2007 Kondapalli
7,296,201 B2 11/2007 Abramovici
7,304,355 B2 12/2007 Zhang
7,312,109 B2 12/2007 Madurawe
7,312,487 B2 12/2007 Alam et al.
7,314,788 B2 1/2008 Shaw
7,335,573 B2 2/2008 Takayama et al.
7,337,425 B2 2/2008 Kirk
7,338,884 B2 3/2008 Shimoto et al.
7,342,415 B2 3/2008 Teig et al.
7,351,644 B2 4/2008 Henley
7,358,601 B1 4/2008 Plants et al.
7,362,133 B2 4/2008 Madurawe
7,369,435 B2 5/2008 Forbes
7,371,660 B2 5/2008 Henley et al.
7,378,702 B2 5/2008 Lee
7,381,989 B2 6/2008 Kim
7,385,283 B2 6/2008 Wu
7,393,722 B1 7/2008 Issaq et al.
7,402,483 B2 7/2008 Yu et al.
7,402,897 B2 7/2008 Leedy
7,419,844 B2 9/2008 Lee et al.

(56) References Cited

U.S. PATENT DOCUMENTS 7,432,185 B2 10/2008 Kim
7,436,027 B2 10/2008 Ogawa et al.
7,439,773 B2 10/2008 Or-Bach et al.
7,446,563 B2 11/2008 Madurawe
7,459,752 B2 12/2008 Doris et al.
7,459,763 B1 12/2008 Issaq et al.
7,459,772 B2 12/2008 Speers
7,463,062 B2 12/2008 Or-Bach et al.
7,463,502 B2 12/2008 Stipe
7,470,142 B2 12/2008 Lee
7,470,598 B2 12/2008 Lee
7,476,939 B2 1/2009 Okhonin et al.
7,477,540 B2 1/2009 Okhonin et al.
7,485,968 B2 2/2009 Enquist et al.
7,486,563 B2 2/2009 Waller et al.
7,488,980 B2 2/2009 Takafuji et al.
7,492,632 B2 2/2009 Carman
7,495,473 B2 2/2009 McCollum et al.
7,498,675 B2 3/2009 Farnworth et al.
7,499,352 B2 3/2009 Singh
7,499,358 B2 3/2009 Bauser
7,508,034 B2 3/2009 Takafuji et al.
7,514,748 B2 4/2009 Fazan et al.
7,521,806 B2 4/2009 Trezza
7,525,186 B2 4/2009 Kim et al.
7,535,089 B2 5/2009 Fitzgerald
7,541,616 B2 6/2009 Fazan et al.
7,547,589 B2 6/2009 Iriguchi
7,553,745 B2 6/2009 Lim
7,557,367 B2 7/2009 Rogers et al.
7,558,141 B2 7/2009 Katsumata et al.
7,563,659 B2 7/2009 Kwon et al.
7,566,855 B2 7/2009 Olsen et al.
7,566,974 B2 7/2009 Konevecki
7,586,778 B2 9/2009 Ho et al.
7,589,375 B2 9/2009 Jang et al.
7,608,848 B2 10/2009 Ho et al.
7,612,411 B2 11/2009 Walker
7,615,462 B2 11/2009 Kim et al.
7,622,367 B1 11/2009 Nuzzo et al.
7,632,738 B2 12/2009 Lee
7,633,162 B2 12/2009 Lee
7,666,723 B2 2/2010 Frank et al.
7,670,912 B2 3/2010 Yeo
7,671,371 B2 3/2010 Lee
7,671,460 B2 3/2010 Lauxtermann et al.
7,674,687 B2 3/2010 Henley
7,687,372 B2 3/2010 Jain
7,687,872 B2 3/2010 Cazaux
7,688,619 B2 3/2010 Lung et al.
7,692,202 B2 4/2010 Bensch
7,692,448 B2 4/2010 Solomon
7,692,944 B2 4/2010 Bernstein et al.
7,697,316 B2 4/2010 Lai et al.
7,709,932 B2 5/2010 Nemoto et al.
7,718,508 B2 5/2010 Lee
7,719,876 B2 5/2010 Chevallier
7,723,207 B2 5/2010 Alam et al.
7,728,326 B2 6/2010 Yamazaki et al.
7,732,301 B1 6/2010 Pinnington et al.
7,741,673 B2 6/2010 Tak et al.
7,742,331 B2 6/2010 Watanabe
7,745,250 B2 6/2010 Han
7,749,884 B2 7/2010 Mathew et al.
7,750,669 B2 7/2010 Spangaro
7,755,622 B2 7/2010 Yvon
7,759,043 B2 7/2010 Tanabe et al.
7,768,115 B2 8/2010 Lee et al.
7,772,039 B2 8/2010 Kerber
7,772,096 B2 8/2010 DeSouza et al.
7,774,735 B1 8/2010 Sood
7,776,715 B2 8/2010 Wells et al.
7,777,330 B2 8/2010 Pelley et al.
7,786,460 B2 8/2010 Lung et al.
7,786,535 B2 8/2010 Abou-Khalil et al.
7,790,524 B2 9/2010 Abadeer et al.
7,795,619 B2 9/2010 Hara
7,799,675 B2 9/2010 Lee
7,800,099 B2 9/2010 Yamazaki et al.
7,800,148 B2 9/2010 Lee et al.
7,800,163 B2 9/2010 Izumi et al.
7,800,199 B2 * 9/2010 Oh ..................... H01L 21/2007
257/532
7,816,721 B2 10/2010 Yamazaki
7,843,718 B2 11/2010 Koh et al.
7,846,814 B2 12/2010 Lee
7,863,095 B2 1/2011 Sasaki et al.
7,864,568 B2 1/2011 Fujisaki et al.
7,867,822 B2 1/2011 Lee
7,888,764 B2 2/2011 Lee
7,910,432 B2 3/2011 Tanaka et al.
7,915,164 B2 3/2011 Konevecki et al.
7,919,845 B2 4/2011 Karp
7,965,102 B1 6/2011 Bauer et al.
7,968,965 B2 6/2011 Kim
7,969,193 B1 6/2011 Wu et al.
7,973,314 B2 7/2011 Yang
7,982,250 B2 7/2011 Yamazaki et al.
7,983,065 B2 7/2011 Samachisa
8,008,732 B2 8/2011 Kiyotoshi
8,013,399 B2 9/2011 Thomas et al.
8,014,166 B2 9/2011 Yazdani
8,014,195 B2 9/2011 Okhonin et al.
8,022,493 B2 9/2011 Bang
8,030,780 B2 10/2011 Kirby et al.
8,031,544 B2 10/2011 Kim et al.
8,032,857 B2 10/2011 McIlrath
8,044,448 B2 10/2011 Kamigaichi et al.
8,044,464 B2 10/2011 Yamazaki et al.
8,068,364 B2 11/2011 Maejima
8,106,520 B2 1/2012 Keeth et al.
8,107,276 B2 1/2012 Breitwisch et al.
8,129,256 B2 3/2012 Farooq et al.
8,129,258 B2 3/2012 Hosier et al.
8,130,547 B2 3/2012 Widjaja et al.
8,136,071 B2 3/2012 Solomon
8,138,502 B2 3/2012 Nakamura et al.
8,153,520 B1 4/2012 Chandrashekar
8,158,515 B2 4/2012 Farooq et al.
8,178,919 B2 5/2012 Fujiwara et al.
8,183,630 B2 5/2012 Batude et al.
8,184,463 B2 5/2012 Saen et al.
8,185,685 B2 5/2012 Selinger
8,203,187 B2 6/2012 Lung et al.
8,208,279 B2 6/2012 Lue
8,209,649 B2 6/2012 McIlrath
8,228,684 B2 7/2012 Losavio et al.
8,266,560 B2 8/2012 McIlrath
8,264,065 B2 9/2012 Su et al.
8,288,816 B2 10/2012 Komori et al.
8,294,199 B2 10/2012 Yahashi et al.
8,324,680 B2 12/2012 Izumi et al.
8,338,882 B2 12/2012 Tanaka et al.
8,343,851 B2 1/2013 Kim et al.
8,354,308 B2 1/2013 Kang et al.
8,355,273 B2 1/2013 Liu
8,374,033 B2 2/2013 Kito et al.
8,426,294 B2 4/2013 Lung et al.
8,432,719 B2 4/2013 Lue
8,432,751 B2 4/2013 Hafez
8,455,941 B2 6/2013 Ishihara et al.
8,470,689 B2 6/2013 Desplobain et al.
8,497,512 B2 7/2013 Nakamura et al.
8,501,564 B2 8/2013 Suzawa
8,507,972 B2 8/2013 Oota et al.
8,508,994 B2 8/2013 Okhonin
8,513,725 B2 8/2013 Sakuma et al.
8,514,623 B2 8/2013 Widjaja et al.
8,516,408 B2 8/2013 Dell
8,566,762 B2 8/2013 Morimoto et al.
8,525,342 B2 10/2013 Chandrasekaran
8,546,956 B2 10/2013 Nguyen
8,603,888 B2 12/2013 Liu
8,611,388 B2 12/2013 Krasulick et al.

(56) References Cited

U.S. PATENT DOCUMENTS 8,619,490 B2 12/2013 Yu
8,630,326 B2 1/2014 Krasulick et al.
8,643,162 B2 2/2014 Madurawe
8,650,516 B2 2/2014 McIlrath
8,654,584 B2 2/2014 Kim et al.
8,679,861 B2 3/2014 Bose
8,736,068 B2 5/2014 Bartley et al.
8,773,562 B1 7/2014 Fan
8,775,998 B2 7/2014 Morimoto
8,824,183 B2 9/2014 Samachisa et al.
8,841,777 B2 9/2014 Farooq
8,853,785 B2 10/2014 Augendre
8,896,054 B2 11/2014 Sakuma et al.
8,928,119 B2 1/2015 Leedy
8,971,114 B2 3/2015 Kang
9,105,689 B1 8/2015 Fanelli
9,172,008 B2 10/2015 Hwang
9,227,456 B2 1/2016 Chien
9,230,973 B2 1/2016 Pachamuthu et al.
9,269,608 B2 2/2016 Fanelli
9,334,582 B2 5/2016 See
9,391,090 B2 7/2016 Manorotkul et al.
9,472,568 B2 10/2016 Shin et al.
9,564,450 B2 2/2017 Sakuma et al.
9,570,683 B1 2/2017 Jo
9,589,982 B1 3/2017 Cheng et al.
9,595,530 B1 3/2017 Zhou
9,627,287 B2 4/2017 Engelhardt et al.
9,673,257 B1 6/2017 Takaki
9,997,530 B2 6/2018 Yon et al.
10,199,354 B2 2/2019 Modi et al.
11,004,719 B1 * 5/2021 Or-Bach ............... H01L 23/481
11,158,674 B2 * 10/2021 Or-Bach ............... H01L 29/785
11,482,438 B2 * 10/2022 Or-Bach ............... H10B 12/20
2001/0000005 A1 3/2001 Forrest et al.
2001/0014391 A1 8/2001 Forrest et al.
2001/0028059 A1 10/2001 Emma et al.
2002/0024140 A1 2/2002 Nakajima et al.
2002/0025604 A1 2/2002 Tiwari
2002/0074668 A1 6/2002 Hofstee et al.
2002/0081823 A1 6/2002 Cheung et al.
2002/0090758 A1 7/2002 Henley et al.
2002/0096681 A1 7/2002 Yamazaki et al.
2002/0113289 A1 8/2002 Cordes et al.
2002/0132465 A1 9/2002 Leedy
2002/0140091 A1 10/2002 Callahan
2002/0141233 A1 10/2002 Hosotani et al.
2002/0153243 A1 10/2002 Forrest et al.
2002/0153569 A1 10/2002 Katayama
2002/0175401 A1 11/2002 Huang et al.
2002/0180069 A1 12/2002 Houston
2002/0190232 A1 12/2002 Chason
2002/0199110 A1 12/2002 Kean
2003/0015713 A1 1/2003 Yoo
2003/0032262 A1 2/2003 Dennison et al.
2003/0059999 A1 3/2003 Gonzalez
2003/0060034 A1 3/2003 Beyne et al.
2003/0061555 A1 3/2003 Kamei
2003/0067043 A1 4/2003 Zhang
2003/0076706 A1 4/2003 Andoh
2003/0102079 A1 6/2003 Kalvesten et al.
2003/0107117 A1 6/2003 Antonell et al.
2003/0113963 A1 6/2003 Wurzer
2003/0119279 A1 6/2003 Enquist
2003/0139011 A1 7/2003 Cleeves et al.
2003/0153163 A1 8/2003 Letertre
2003/0157748 A1 8/2003 Kim et al.
2003/0160888 A1 8/2003 Yoshikawa
2003/0173631 A1 9/2003 Murakami
2003/0206036 A1 11/2003 Or-Bach
2003/0213967 A1 11/2003 Forrest et al.
2003/0224582 A1 12/2003 Shimoda et al.
2003/0224596 A1 12/2003 Marxsen et al.
2004/0007376 A1 1/2004 Urdahl et al.
2004/0014299 A1 1/2004 Moriceau et al.
2004/0033676 A1 2/2004 Coronel et al.
2004/0036126 A1 2/2004 Chau et al.
2004/0047539 A1 3/2004 Okubora et al.
2004/0061176 A1 4/2004 Takafuji et al.
2004/0113207 A1 6/2004 Hsu et al.
2004/0143797 A1 7/2004 Nguyen
2004/0150068 A1 8/2004 Leedy
2004/0150070 A1 8/2004 Okada
2004/0152272 A1 8/2004 Fladre et al.
2004/0155301 A1 8/2004 Zhang
2004/0156172 A1 8/2004 Lin et al.
2004/0156233 A1 8/2004 Bhattacharyya
2004/0164425 A1 8/2004 Urakawa
2004/0166649 A1 8/2004 Bressot et al.
2004/0174732 A1 9/2004 Morimoto
2004/0175902 A1 9/2004 Rayssac et al.
2004/0178819 A1 9/2004 New
2004/0195572 A1 10/2004 Kato et al.
2004/0219765 A1 11/2004 Reif et al.
2004/0229444 A1 11/2004 Couillard
2004/0259312 A1 12/2004 Schlosser et al.
2004/0262635 A1 12/2004 Lee
2004/0262772 A1 12/2004 Ramanathan et al.
2005/0003592 A1 1/2005 Jones
2005/0010725 A1 1/2005 Eilert
2005/0023656 A1 2/2005 Leedy
2005/0045919 A1 3/2005 Kaeriyama et al.
2005/0067620 A1 3/2005 Chan et al.
2005/0067625 A1 3/2005 Hata
2005/0073060 A1 4/2005 Datta et al.
2005/0082526 A1 4/2005 Bedell et al.
2005/0098822 A1 5/2005 Mathew
2005/0110041 A1 5/2005 Boutros et al.
2005/0121676 A1 6/2005 Fried et al.
2005/0121789 A1 6/2005 Madurawe
2005/0130351 A1 6/2005 Leedy
2005/0130429 A1 6/2005 Rayssac et al.
2005/0148137 A1 7/2005 Brask et al.
2005/0176174 A1 8/2005 Leedy
2005/0218521 A1 10/2005 Lee
2005/0225237 A1 10/2005 Winters
2005/0266659 A1 12/2005 Ghyselen et al.
2005/0273749 A1 12/2005 Kirk
2005/0280061 A1 12/2005 Lee
2005/0280090 A1 12/2005 Anderson et al.
2005/0280154 A1 12/2005 Lee
2005/0280155 A1 12/2005 Lee
2005/0280156 A1 12/2005 Lee
2005/0282019 A1 12/2005 Fukushima et al.
2006/0014331 A1 1/2006 Tang et al.
2006/0024923 A1 2/2006 Sarma et al.
2006/0033110 A1 2/2006 Alam et al.
2006/0033124 A1 2/2006 Or-Bach et al.
2006/0043367 A1 2/2006 Chang et al.
2006/0049449 A1 3/2006 Iino
2006/0065953 A1 3/2006 Kim et al.
2006/0067122 A1 3/2006 Verhoeven
2006/0071322 A1 4/2006 Kitamura
2006/0071332 A1 4/2006 Speers
2006/0083280 A1 4/2006 Tauzin et al.
2006/0108613 A1 5/2006 Song
2006/0108627 A1 5/2006 Choi et al.
2006/0113522 A1 6/2006 Lee et al.
2006/0118935 A1 6/2006 Kamiyama et al.
2006/0121690 A1 6/2006 Pogge et al.
2006/0150137 A1 7/2006 Madurawe
2006/0158511 A1 7/2006 Harrold
2006/0170046 A1 8/2006 Hara
2006/0179417 A1 8/2006 Madurawe
2006/0181202 A1 8/2006 Liao et al.
2006/0189095 A1 8/2006 Ghyselen et al.
2006/0194401 A1 8/2006 Hu et al.
2006/0195729 A1 8/2006 Huppenthal et al.
2006/0207087 A1 9/2006 Jafri et al.
2006/0224814 A1 10/2006 Kim et al.
2006/0237777 A1 10/2006 Choi
2006/0249859 A1 11/2006 Eiles et al.
2006/0275962 A1 12/2006 Lee
2007/0004150 A1 1/2007 Huang

(56) References Cited

U.S. PATENT DOCUMENTS

| | | | |
|---|---|---|---|
| 2007/0014508 | A1 | 1/2007 | Chen et al. |
| 2007/0035329 | A1 | 2/2007 | Madurawe |
| 2007/0063259 | A1 | 3/2007 | Derderian et al. |
| 2007/0072391 | A1 | 3/2007 | Pocas et al. |
| 2007/0076509 | A1 | 4/2007 | Zhang |
| 2007/0077694 | A1 | 4/2007 | Lee |
| 2007/0077743 | A1 | 4/2007 | Rao et al. |
| 2007/0090416 | A1 | 4/2007 | Doyle et al. |
| 2007/0102737 | A1 | 5/2007 | Kashiwabara et al. |
| 2007/0103191 | A1 | 5/2007 | Sugawara et al. |
| 2007/0108523 | A1 | 5/2007 | Ogawa et al. |
| 2007/0109831 | A1 | 5/2007 | RaghuRam |
| 2007/0111386 | A1 | 5/2007 | Kim et al. |
| 2007/0111406 | A1 | 5/2007 | Joshi et al. |
| 2007/0132049 | A1 | 6/2007 | Stipe |
| 2007/0132369 | A1 | 6/2007 | Forrest et al. |
| 2007/0135013 | A1 | 6/2007 | Faris |
| 2007/0141781 | A1 | 6/2007 | Park |
| 2007/0158659 | A1 | 7/2007 | Bensce |
| 2007/0158831 | A1 | 7/2007 | Cha et al. |
| 2007/0176214 | A1 | 8/2007 | Kwon et al. |
| 2007/0187775 | A1 | 8/2007 | Okhonin et al. |
| 2007/0190746 | A1 | 8/2007 | Ito et al. |
| 2007/0194453 | A1 | 8/2007 | Chakraborty et al. |
| 2007/0206408 | A1 | 9/2007 | Schwerin |
| 2007/0210336 | A1 | 9/2007 | Madurawe |
| 2007/0211535 | A1 | 9/2007 | Kim |
| 2007/0215903 | A1 | 9/2007 | Sakamoto et al. |
| 2007/0218622 | A1 | 9/2007 | Lee et al. |
| 2007/0228383 | A1 | 10/2007 | Bernstein et al. |
| 2007/0252201 | A1 | 11/2007 | Kito et al. |
| 2007/0252203 | A1 | 11/2007 | Zhu et al. |
| 2007/0262457 | A1 | 11/2007 | Lin |
| 2007/0275520 | A1 | 11/2007 | Suzuki |
| 2007/0281439 | A1 | 12/2007 | Bedell et al. |
| 2007/0283298 | A1 | 12/2007 | Bernstein et al. |
| 2007/0287224 | A1 | 12/2007 | Alam et al. |
| 2007/0296073 | A1 | 12/2007 | Wu |
| 2007/0297232 | A1 | 12/2007 | Iwata |
| 2008/0001204 | A1 | 1/2008 | Lee |
| 2008/0003818 | A1 | 1/2008 | Seidel et al. |
| 2008/0030228 | A1 | 2/2008 | Amarilio |
| 2008/0032463 | A1 | 2/2008 | Lee |
| 2008/0038902 | A1 | 2/2008 | Lee |
| 2008/0048239 | A1 | 2/2008 | Huo |
| 2008/0048327 | A1 | 2/2008 | Lee |
| 2008/0054359 | A1 | 3/2008 | Yang et al. |
| 2008/0067573 | A1 | 3/2008 | Jang et al. |
| 2008/0070340 | A1 | 3/2008 | Borrelli et al. |
| 2008/0072182 | A1 | 3/2008 | He et al. |
| 2008/0099780 | A1 | 5/2008 | Tran |
| 2008/0099819 | A1 | 5/2008 | Kito et al. |
| 2008/0108171 | A1 | 5/2008 | Rogers et al. |
| 2008/0123418 | A1 | 5/2008 | Widjaja |
| 2008/0124845 | A1 | 5/2008 | Yu et al. |
| 2008/0128745 | A1 | 6/2008 | Mastro et al. |
| 2008/0128780 | A1 | 6/2008 | Nishihara |
| 2008/0135949 | A1 | 6/2008 | Lo et al. |
| 2008/0136455 | A1 | 6/2008 | Diamant et al. |
| 2008/0142937 | A1 | 6/2008 | Chen et al. |
| 2008/0142959 | A1 | 6/2008 | DeMulder et al. |
| 2008/0143379 | A1 | 6/2008 | Norman |
| 2008/0150579 | A1 | 6/2008 | Madurawe |
| 2008/0160431 | A1 | 7/2008 | Scott et al. |
| 2008/0160726 | A1 | 7/2008 | Lim et al. |
| 2008/0165521 | A1 | 7/2008 | Bernstein et al. |
| 2008/0175032 | A1 | 7/2008 | Tanaka et al. |
| 2008/0179678 | A1 | 7/2008 | Dyer et al. |
| 2008/0180132 | A1 | 7/2008 | Ishikawa |
| 2008/0185648 | A1 | 8/2008 | Jeong |
| 2008/0191247 | A1 | 8/2008 | Yin et al. |
| 2008/0191312 | A1 | 8/2008 | Oh et al. |
| 2008/0194068 | A1 | 8/2008 | Temmler et al. |
| 2008/0203452 | A1 | 8/2008 | Moon et al. |
| 2008/0213982 | A1 | 9/2008 | Park et al. |
| 2008/0220558 | A1 | 9/2008 | Zehavi et al. |
| 2008/0220565 | A1 | 9/2008 | Hsu et al. |
| 2008/0224260 | A1 | 9/2008 | Schmit et al. |
| 2008/0237591 | A1 | 10/2008 | Leedy |
| 2008/0239818 | A1 | 10/2008 | Mokhlesi |
| 2008/0242028 | A1 | 10/2008 | Mokhlesi |
| 2008/0248618 | A1 | 10/2008 | Ahn et al. |
| 2008/0251862 | A1 | 10/2008 | Fonash et al. |
| 2008/0254561 | A2 | 10/2008 | Yoo |
| 2008/0254572 | A1 | 10/2008 | Leedy |
| 2008/0254623 | A1 | 10/2008 | Chan |
| 2008/0261378 | A1 | 10/2008 | Yao et al. |
| 2008/0266960 | A1 | 10/2008 | Kuo |
| 2008/0272492 | A1 | 11/2008 | Tsang |
| 2008/0277778 | A1 | 11/2008 | Furman et al. |
| 2008/0283873 | A1 | 11/2008 | Yang |
| 2008/0283875 | A1 | 11/2008 | Mukasa et al. |
| 2008/0284611 | A1 | 11/2008 | Leedy |
| 2008/0296681 | A1 | 12/2008 | Georgakos et al. |
| 2008/0315253 | A1 | 12/2008 | Yuan |
| 2008/0315351 | A1 | 12/2008 | Kakehata |
| 2009/0001469 | A1 | 1/2009 | Yoshida et al. |
| 2009/0001504 | A1 | 1/2009 | Takei et al. |
| 2009/0016716 | A1 | 1/2009 | Ishida |
| 2009/0026541 | A1 | 1/2009 | Chung |
| 2009/0026618 | A1 | 1/2009 | Kim |
| 2009/0032899 | A1 | 2/2009 | Irie |
| 2009/0032951 | A1 | 2/2009 | Andry et al. |
| 2009/0039918 | A1 | 2/2009 | Madurawe |
| 2009/0052827 | A1 | 2/2009 | Durfee et al. |
| 2009/0055789 | A1 | 2/2009 | McIlrath |
| 2009/0057879 | A1 | 3/2009 | Garrou et al. |
| 2009/0061572 | A1 | 3/2009 | Hareland et al. |
| 2009/0064058 | A1 | 3/2009 | McIlrath |
| 2009/0065827 | A1 | 3/2009 | Hwang |
| 2009/0066365 | A1 | 3/2009 | Solomon |
| 2009/0066366 | A1 | 3/2009 | Solomon |
| 2009/0070721 | A1 | 3/2009 | Solomon |
| 2009/0070727 | A1 | 3/2009 | Solomon |
| 2009/0078970 | A1 | 3/2009 | Yamazaki |
| 2009/0079000 | A1 | 3/2009 | Yamazaki et al. |
| 2009/0081848 | A1 | 3/2009 | Erokhin |
| 2009/0087759 | A1 | 4/2009 | Matsumoto et al. |
| 2009/0096009 | A1 | 4/2009 | Dong et al. |
| 2009/0096024 | A1 | 4/2009 | Shingu et al. |
| 2009/0108318 | A1 | 4/2009 | Yoon et al. |
| 2009/0115042 | A1 | 5/2009 | Koyanagi |
| 2009/0128189 | A1 | 5/2009 | Madurawe et al. |
| 2009/0134397 | A1 | 5/2009 | Yokoi et al. |
| 2009/0144669 | A1 | 6/2009 | Bose et al. |
| 2009/0144678 | A1 | 6/2009 | Bose et al. |
| 2009/0146172 | A1 | 6/2009 | Pumyea |
| 2009/0159870 | A1 | 6/2009 | Lin et al. |
| 2009/0160482 | A1 | 6/2009 | Karp et al. |
| 2009/0161401 | A1 | 6/2009 | Bigler et al. |
| 2009/0162993 | A1 | 6/2009 | Yui et al. |
| 2009/0166627 | A1 | 7/2009 | Han |
| 2009/0174018 | A1 | 7/2009 | Dungan |
| 2009/0179268 | A1 | 7/2009 | Abou-Khalil et al. |
| 2009/0185407 | A1 | 7/2009 | Park |
| 2009/0194152 | A1 | 8/2009 | Liu et al. |
| 2009/0194768 | A1 | 8/2009 | Leedy |
| 2009/0194829 | A1 | 8/2009 | Chung |
| 2009/0194836 | A1 | 8/2009 | Kim |
| 2009/0204933 | A1 | 8/2009 | Rezgui |
| 2009/0212317 | A1 | 8/2009 | Kolodin et al. |
| 2009/0218627 | A1 | 9/2009 | Zhu |
| 2009/0221110 | A1 | 9/2009 | Lee et al. |
| 2009/0224330 | A1 | 9/2009 | Hong |
| 2009/0224364 | A1 | 9/2009 | Oh et al. |
| 2009/0230462 | A1 | 9/2009 | Tanaka et al. |
| 2009/0234331 | A1 | 9/2009 | Langereis et al. |
| 2009/0236749 | A1 | 9/2009 | Otemba et al. |
| 2009/0242893 | A1 | 10/2009 | Tomiyasu |
| 2009/0242935 | A1 | 10/2009 | Fitzgerald |
| 2009/0250686 | A1 | 10/2009 | Sato et al. |
| 2009/0262572 | A1 | 10/2009 | Krusin-Elbaum |
| 2009/0262583 | A1 | 10/2009 | Lue |
| 2009/0263942 | A1 | 10/2009 | Ohnuma et al. |

(56) References Cited

U.S. PATENT DOCUMENTS

| | | | |
|---|---|---|---|
| 2009/0267233 | A1 | 10/2009 | Lee |
| 2009/0268983 | A1 | 10/2009 | Stone et al. |
| 2009/0272989 | A1 | 11/2009 | Shum et al. |
| 2009/0290434 | A1 | 11/2009 | Kurjanowicz |
| 2009/0294822 | A1 | 12/2009 | Batude et al. |
| 2009/0294836 | A1 | 12/2009 | Kiyotoshi |
| 2009/0294861 | A1 | 12/2009 | Thomas et al. |
| 2009/0294990 | A1 | 12/2009 | Ishino et al. |
| 2009/0302294 | A1 | 12/2009 | Kim |
| 2009/0302387 | A1 | 12/2009 | Joshi et al. |
| 2009/0302394 | A1 | 12/2009 | Fujita |
| 2009/0309152 | A1 | 12/2009 | Knoefler et al. |
| 2009/0315095 | A1 | 12/2009 | Kim |
| 2009/0317950 | A1 | 12/2009 | Okihara |
| 2009/0321830 | A1 | 12/2009 | Maly |
| 2009/0321853 | A1 | 12/2009 | Cheng |
| 2009/0321948 | A1 | 12/2009 | Wang et al. |
| 2009/0325343 | A1 | 12/2009 | Lee |
| 2010/0001282 | A1 | 1/2010 | Mieno |
| 2010/0013049 | A1 | 1/2010 | Tanaka |
| 2010/0025766 | A1 | 2/2010 | Nuttinck et al. |
| 2010/0025825 | A1 | 2/2010 | DeGraw et al. |
| 2010/0031217 | A1 | 2/2010 | Sinha et al. |
| 2010/0032635 | A1 | 2/2010 | Schwerin |
| 2010/0038699 | A1 | 2/2010 | Katsumata et al. |
| 2010/0038743 | A1 | 2/2010 | Lee |
| 2010/0045849 | A1 | 2/2010 | Yamasaki |
| 2010/0052134 | A1 | 3/2010 | Werner et al. |
| 2010/0058580 | A1 | 3/2010 | Yazdani |
| 2010/0059796 | A1 | 3/2010 | Scheuerlein |
| 2010/0059864 | A1 | 3/2010 | Mahler et al. |
| 2010/0078770 | A1 | 4/2010 | Purushothaman et al. |
| 2010/0081232 | A1 | 4/2010 | Furman et al. |
| 2010/0089627 | A1 | 4/2010 | Huang et al. |
| 2010/0090188 | A1 | 4/2010 | Fatasuyama |
| 2010/0112753 | A1 | 5/2010 | Lee |
| 2010/0112810 | A1 | 5/2010 | Lee et al. |
| 2010/0117048 | A1 | 5/2010 | Lung et al. |
| 2010/0123202 | A1 | 5/2010 | Hofmann |
| 2010/0123480 | A1 | 5/2010 | Kitada et al. |
| 2010/0133695 | A1 | 6/2010 | Lee |
| 2010/0133704 | A1 | 6/2010 | Marimuthu et al. |
| 2010/0137143 | A1 | 6/2010 | Rothberg et al. |
| 2010/0139836 | A1 | 6/2010 | Horikoshi |
| 2010/0140790 | A1 | 6/2010 | Setiadi et al. |
| 2010/0155932 | A1 | 6/2010 | Gambino |
| 2010/0157117 | A1 | 6/2010 | Wang |
| 2010/0159650 | A1 | 6/2010 | Song |
| 2010/0181600 | A1 | 7/2010 | Law |
| 2010/0190334 | A1 | 7/2010 | Lee |
| 2010/0193884 | A1 | 8/2010 | Park et al. |
| 2010/0193964 | A1 | 8/2010 | Farooq et al. |
| 2010/0219392 | A1 | 9/2010 | Awaya |
| 2010/0221867 | A1 | 9/2010 | Bedell et al. |
| 2010/0224876 | A1 | 9/2010 | Zhu |
| 2010/0224915 | A1 | 9/2010 | Kawashima et al. |
| 2010/0225002 | A1 | 9/2010 | Law et al. |
| 2010/0232200 | A1 | 9/2010 | Shepard |
| 2010/0252934 | A1 | 10/2010 | Law |
| 2010/0264551 | A1 | 10/2010 | Farooq |
| 2010/0276662 | A1 | 11/2010 | Colinge |
| 2010/0289144 | A1 | 11/2010 | Farooq |
| 2010/0297844 | A1 | 11/2010 | Yelehanka |
| 2010/0307572 | A1 | 12/2010 | Bedell et al. |
| 2010/0308211 | A1 | 12/2010 | Cho et al. |
| 2010/0308863 | A1 | 12/2010 | Gliese et al. |
| 2010/0320514 | A1 | 12/2010 | Tredwell |
| 2010/0320526 | A1 | 12/2010 | Kidoh et al. |
| 2010/0330728 | A1 | 12/2010 | McCarten |
| 2010/0330752 | A1 | 12/2010 | Jeong |
| 2011/0001172 | A1 | 1/2011 | Lee |
| 2011/0003438 | A1 | 1/2011 | Lee |
| 2011/0024724 | A1 | 2/2011 | Frolov et al. |
| 2011/0026263 | A1 | 2/2011 | Xu |
| 2011/0027967 | A1 | 2/2011 | Beyne |
| 2011/0037052 | A1 | 2/2011 | Schmidt et al. |
| 2011/0042696 | A1 | 2/2011 | Smith et al. |
| 2011/0049336 | A1 | 3/2011 | Matsunuma |
| 2011/0050125 | A1 | 3/2011 | Medendorp et al. |
| 2011/0053332 | A1 | 3/2011 | Lee |
| 2011/0101537 | A1 | 5/2011 | Barth et al. |
| 2011/0102014 | A1 | 5/2011 | Madurawe |
| 2011/0111560 | A1 | 5/2011 | Purushothaman |
| 2011/0115023 | A1 | 5/2011 | Cheng |
| 2011/0128777 | A1 | 6/2011 | Yamazaki |
| 2011/0134683 | A1 | 6/2011 | Yamazaki |
| 2011/0143506 | A1 | 6/2011 | Lee |
| 2011/0147791 | A1 | 6/2011 | Norman et al. |
| 2011/0147849 | A1 | 6/2011 | Augendre et al. |
| 2011/0159635 | A1 | 6/2011 | Doan et al. |
| 2011/0170331 | A1 | 7/2011 | Oh |
| 2011/0204917 | A1 | 8/2011 | O'Neill |
| 2011/0221022 | A1 | 9/2011 | Toda |
| 2011/0222356 | A1 | 9/2011 | Banna |
| 2011/0227158 | A1 | 9/2011 | Zhu |
| 2011/0241082 | A1 | 10/2011 | Bernstein et al. |
| 2011/0284946 | A1 | 11/2011 | Kiyotoshi |
| 2011/0284992 | A1 | 11/2011 | Zhu |
| 2011/0286283 | A1 | 11/2011 | Lung et al. |
| 2011/0304765 | A1 | 12/2011 | Yogo et al. |
| 2011/0309432 | A1 | 12/2011 | Ishihara et al. |
| 2011/0314437 | A1 | 12/2011 | McIlrath |
| 2012/0001184 | A1 | 1/2012 | Ha et al. |
| 2012/0003815 | A1 | 1/2012 | Lee |
| 2012/0013013 | A1 | 1/2012 | Sadaka et al. |
| 2012/0025388 | A1 | 2/2012 | Law et al. |
| 2012/0032250 | A1 | 2/2012 | Son et al. |
| 2012/0034759 | A1 | 2/2012 | Sakaguchi et al. |
| 2012/0063090 | A1 | 3/2012 | Hsiao et al. |
| 2012/0074466 | A1 | 3/2012 | Setiadi et al. |
| 2012/0086100 | A1 | 4/2012 | Andry |
| 2012/0126197 | A1 | 5/2012 | Chung |
| 2012/0146193 | A1 | 6/2012 | Stuber et al. |
| 2012/0161310 | A1 | 6/2012 | Brindle et al. |
| 2012/0169319 | A1 | 7/2012 | Dennard |
| 2012/0178211 | A1 | 7/2012 | Hebert |
| 2012/0181654 | A1 | 7/2012 | Lue |
| 2012/0182801 | A1 | 7/2012 | Lue |
| 2012/0187444 | A1 | 7/2012 | Oh |
| 2012/0193785 | A1 | 8/2012 | Lin |
| 2012/0241919 | A1 | 9/2012 | Mitani |
| 2012/0286822 | A1 | 11/2012 | Madurawe |
| 2012/0304142 | A1 | 11/2012 | Morimoto |
| 2012/0317528 | A1 | 12/2012 | McIlrath |
| 2012/0319728 | A1 | 12/2012 | Madurawe |
| 2013/0026663 | A1 | 1/2013 | Radu et al. |
| 2013/0037802 | A1 | 2/2013 | England |
| 2013/0049796 | A1 | 2/2013 | Pang |
| 2013/0070506 | A1 | 3/2013 | Kajigaya |
| 2013/0082235 | A1 | 4/2013 | Gu et al. |
| 2013/0097574 | A1 | 4/2013 | Balabanov et al. |
| 2013/0100743 | A1 | 4/2013 | Lue |
| 2013/0128666 | A1 | 5/2013 | Avila |
| 2013/0187720 | A1 | 7/2013 | Ishii |
| 2013/0193550 | A1 | 8/2013 | Sklenard et al. |
| 2013/0196500 | A1 | 8/2013 | Batude et al. |
| 2013/0203248 | A1 | 8/2013 | Ernst et al. |
| 2013/0207243 | A1 | 8/2013 | Fuergut et al. |
| 2013/0263393 | A1 | 10/2013 | Mazumder |
| 2013/0337601 | A1 | 12/2013 | Kapur |
| 2014/0015136 | A1 | 1/2014 | Gan et al. |
| 2014/0030871 | A1 | 1/2014 | Arriagada et al. |
| 2014/0035616 | A1 | 2/2014 | Oda et al. |
| 2014/0048867 | A1 | 2/2014 | Toh |
| 2014/0099761 | A1 | 4/2014 | Kim et al. |
| 2014/0103959 | A1 | 4/2014 | Andreev |
| 2014/0117413 | A1 | 5/2014 | Madurawe |
| 2014/0120695 | A1 | 5/2014 | Ohtsuki |
| 2014/0131885 | A1 | 5/2014 | Samadi et al. |
| 2014/0137061 | A1 | 5/2014 | McIlrath |
| 2014/0145347 | A1 | 5/2014 | Samadi et al. |
| 2014/0146630 | A1 | 5/2014 | Xie et al. |
| 2014/0149958 | A1 | 5/2014 | Samadi et al. |
| 2014/0151774 | A1 | 6/2014 | Rhie |

(56) References Cited

U.S. PATENT DOCUMENTS

| | | | |
|---|---|---|---|
| 2014/0191357 | A1 | 7/2014 | Lee |
| 2014/0225218 | A1 | 8/2014 | Du |
| 2014/0225235 | A1 | 8/2014 | Du |
| 2014/0252306 | A1 | 9/2014 | Du |
| 2014/0253196 | A1 | 9/2014 | Du et al. |
| 2014/0264228 | A1 | 9/2014 | Toh |
| 2014/0357054 | A1 | 12/2014 | Son et al. |
| 2015/0021785 | A1 | 1/2015 | Lin |
| 2015/0034898 | A1 | 2/2015 | Wang |
| 2015/0243887 | A1 | 8/2015 | Saitoh |
| 2015/0255418 | A1 | 9/2015 | Gowda |
| 2015/0279829 | A1 | 10/2015 | Kuo |
| 2015/0340369 | A1 | 11/2015 | Lue |
| 2016/0049201 | A1 | 2/2016 | Lue |
| 2016/0104780 | A1 | 4/2016 | Mauder |
| 2016/0133603 | A1 | 5/2016 | Ahn |
| 2016/0141299 | A1 | 5/2016 | Hong |
| 2016/0141334 | A1 | 5/2016 | Takaki |
| 2016/0307952 | A1 | 10/2016 | Huang |
| 2016/0343687 | A1 | 11/2016 | Vadhavkar |
| 2017/0069601 | A1 | 3/2017 | Park |
| 2017/0092371 | A1 | 3/2017 | Harari |
| 2017/0098596 | A1 | 4/2017 | Lin |
| 2017/0148517 | A1 | 5/2017 | Harari |
| 2017/0179146 | A1 | 6/2017 | Park |
| 2017/0221900 | A1 | 8/2017 | Widjaja |
| 2017/0278858 | A1 | 9/2017 | Walker et al. |
| 2018/0090219 | A1 | 3/2018 | Harari |
| 2018/0090368 | A1 | 3/2018 | Kim |
| 2018/0108416 | A1 | 4/2018 | Harari |
| 2018/0294284 | A1 | 10/2018 | Tarakji |
| 2019/0006009 | A1 | 1/2019 | Harari |
| 2019/0043836 | A1 | 2/2019 | Fastow et al. |
| 2019/0067327 | A1 | 2/2019 | Herner et al. |
| 2019/0157296 | A1 | 5/2019 | Harari et al. |
| 2020/0020408 | A1 | 1/2020 | Norman et al. |
| 2020/0020718 | A1 | 1/2020 | Harari et al. |
| 2020/0051990 | A1 | 2/2020 | Harari et al. |
| 2020/0105773 | A1 | 4/2020 | Morris et al. |
| 2020/0227123 | A1 | 7/2020 | Salahuddin et al. |
| 2020/0243486 | A1 | 7/2020 | Quader et al. |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (ϕFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C. et al., "Reconfigurable Circuit Design with Nanomaterials," Design, Automation & Test in Europe Conference & Exhibition, Apr. 20-24, 2009, pp. 442-447.

(56) References Cited

OTHER PUBLICATIONS

Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "CELONCEL: Effective Design Technique for 3-D Monolithic Integration targeting High Performance Integrated Circuits", *Asia pacific DAC 2011*, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PHD Thesis, Stanford, Jul. 2003.
Quemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.

(56) References Cited

OTHER PUBLICATIONS

Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration", www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (Cubic) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Kuroda, T., "ThruChip Interface for Heterogeneous Chip Stacking," ElectroChemicalSociety Transactions, 50(14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Physics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to IEDM19-49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to IEDM19-405.
Rachmady, W., et al., "300mm Heterogeneous 3D Integration of Record Performance Layer Transfer Germanium PMOS with Silicon NMOS for Low Power High Performance Logic Applications", IEDM 2019, paper 29.7, pp. IEDM19-697 to IEDM19-700.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

(56) References Cited

OTHER PUBLICATIONS

Abramovici, Breuer and Friedman, Digital Systems Testing and Testable Design, Computer Science Press, 1990, pp. 432-447.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.
Burr, G. W., et al., "Overview of candidate device technologies for storage-class memory," IBM Journal of Research and Development , vol. 52, No. 4.5, pp. 449-464, Jul. 2008.
Bez, R., et al., "Introduction to Flash memory," Proceedings IEEE, 91(4), 489-502 (2003).
Auth, C., et al., "45nm High-k + Metal Gate Strain-Enchanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.

(56) References Cited

OTHER PUBLICATIONS

Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54(11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
Mclaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-GB/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed Sram", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

(56) References Cited

OTHER PUBLICATIONS

He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S .- J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+'" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.

(56) References Cited

OTHER PUBLICATIONS

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Miller, D.A.B., "Optical interconnects to electronic chips," Applied Optics, vol. 49, No. 25, Sep. 1, 2010, pp. F59-F70.
En, W. G., et al., "The Genesis Process: A New SOI wafer fabrication method", Proceedings 1998 IEEE International SOI Conference, Oct. 1998, pp. 163-164.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Yang, M., et al., "High Performance CMOS Fabricated on Hybrid Substrate with Different Crystal Orientation," Proceedings IEDM 2003.
Yin, H., et al., "Scalable 3-D finlike poly-Si TFT and its nonvolatile memory application," IEEE Trans. Electron Devices, vol. 55, No. 2, pp. 578-584, Feb. 2008.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Applied Physics, vol. 46, No. 1, 2007, pp. 21-23.
Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.
Khakifirooz, A., "ETSOI Technology for 20nm and Beyond", SOI Consortium Workshop: Fully Depleted SOI, Apr. 28, 2011, Hsinchu Taiwan.
Kim, I.-K., et al., "Advanced Integration Technology for a Highly Scalable SOI DRAM with SOC (Silicon-On-Capacitors)", IEDM 1996, pp. 96-605-608, May 4, 2022.
Lee, B.H., et al., "A Novel CMP Method for cost-effective Bonded SOI Wafer Fabrication," Proceedings 1995 IEEE International SOI Conference, Oct. 1995, pp. 60-61.
Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.
Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

* cited by examiner

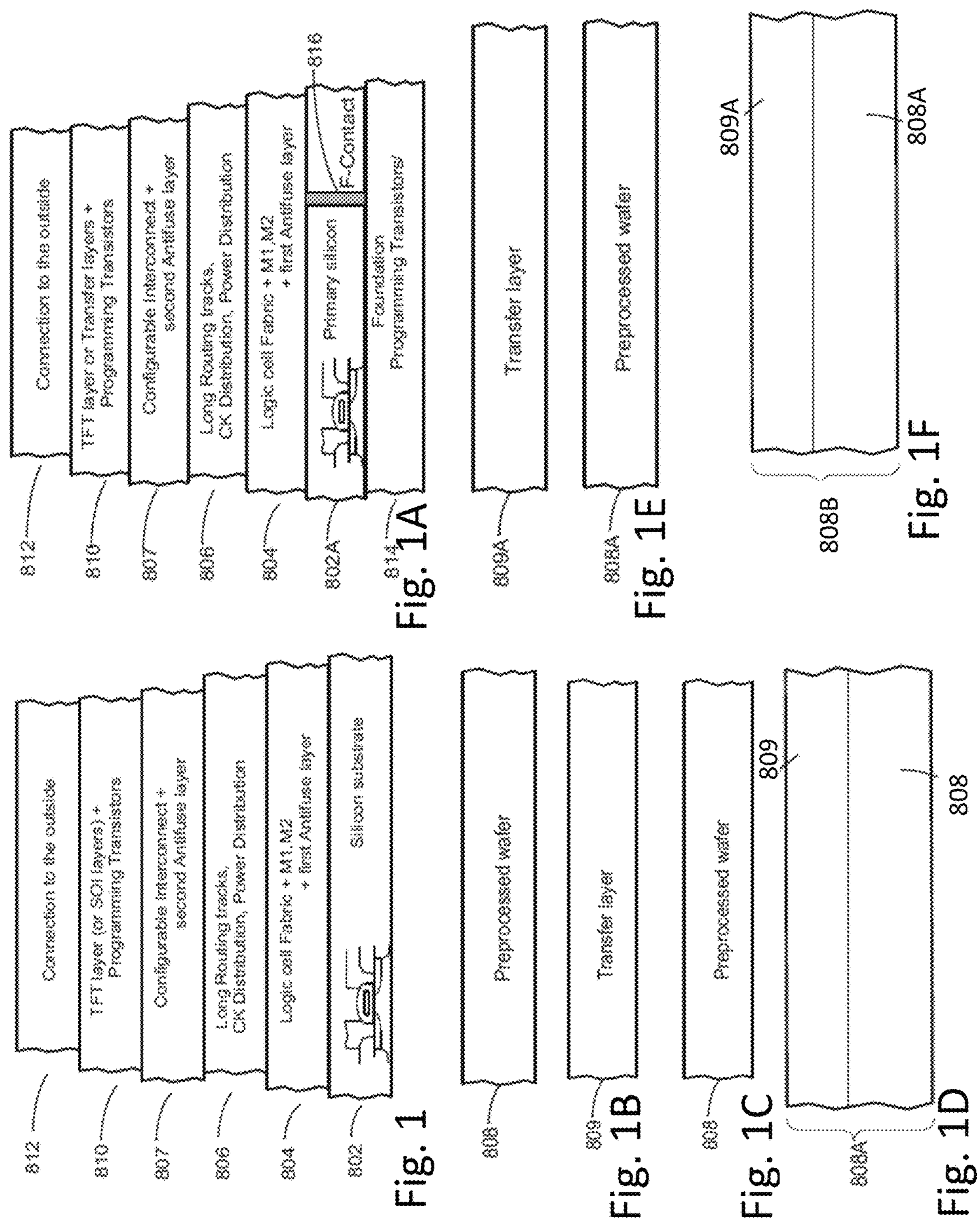
Connection to the outside
TFT layer (or SOI layers) + Programming Transistors
Configurable Interconnect + second Antifuse layer
Long Routing tracks, CK Distribution, Power Distribution
Logic cell Fabric + M1,M2 + first Antifuse layer
Silicon substrate
812
810
807
806
804
802
Fig. 1
Preprocessed wafer
808
Transfer layer
809
Fig. 1B
Preprocessed wafer
808
Fig. 1C
809
808
808A
Fig. 1D
Connection to the outside
TFT layer or Transfer layers + Programming Transistors
Configurable Interconnect + second Antifuse layer
Long Routing tracks, CK Distribution, Power Distribution
Logic cell Fabric + M1,M2 + first Antifuse layer
Primary silicon
F-Contact
Foundation Programming Transistors/
816
812
810
807
806
804
802A
814
Fig. 1A
Transfer layer
809A
Preprocessed wafer
808A
Fig. 1E
809A
808A
808B
Fig. 1F

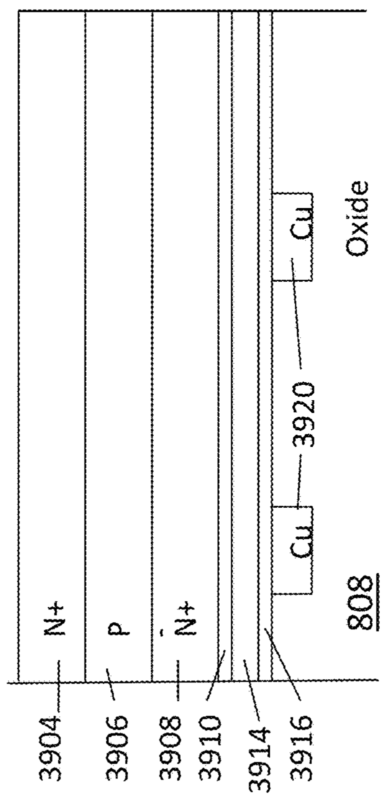
Fig. 15C
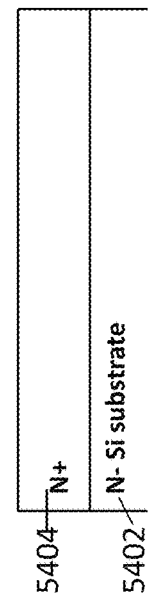
Fig. 17A
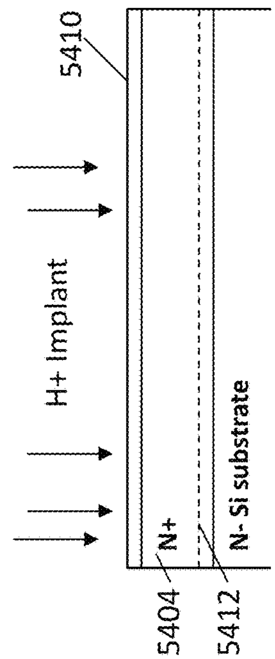
Fig. 17B
Fig. 16
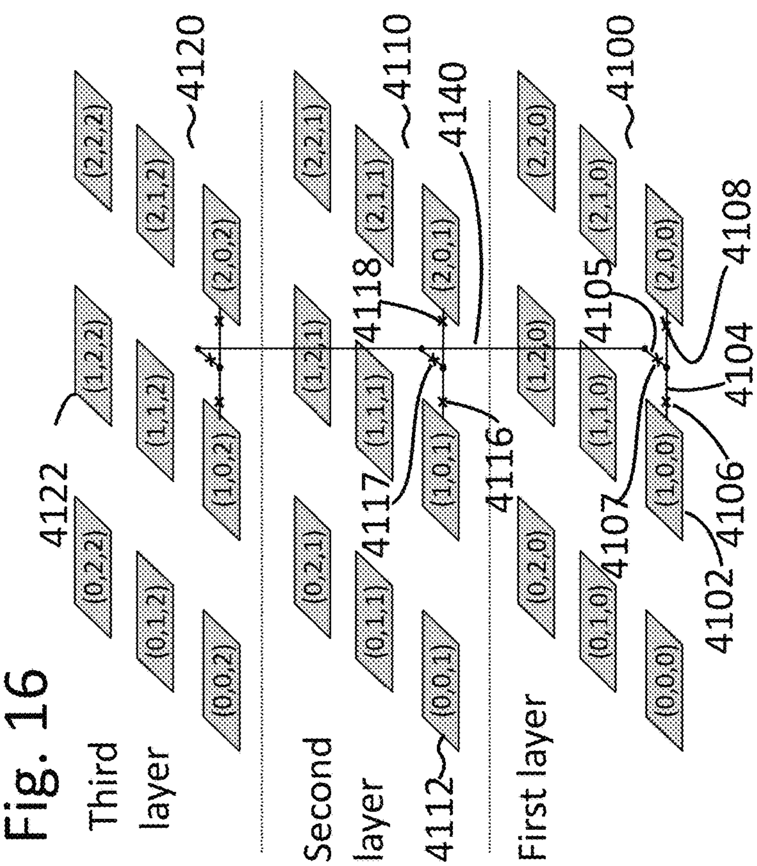

5702
5704
5700

5707
5799
5700

5704
5702
5706
808

5708
5706
808

5710
5712
808

5714
5708
808

5720
5716
5722
5724
5714
5708
5706
808

5802
5804
5800

5803
5807
5808
5800

5805
5804
5802
5806
808

5808
5806
808

5810
5812
808

5808
5814
808

5816
5820
5814
5808
5822
5824
5806
808

7000
7001
7002
7008
7012
7014
7016
7018
7020
7022
7024
7026
7028
7030
7031
7032
7034
7036
7040
7092
7094
7097
7099/7095
808
NMOS
PMOS

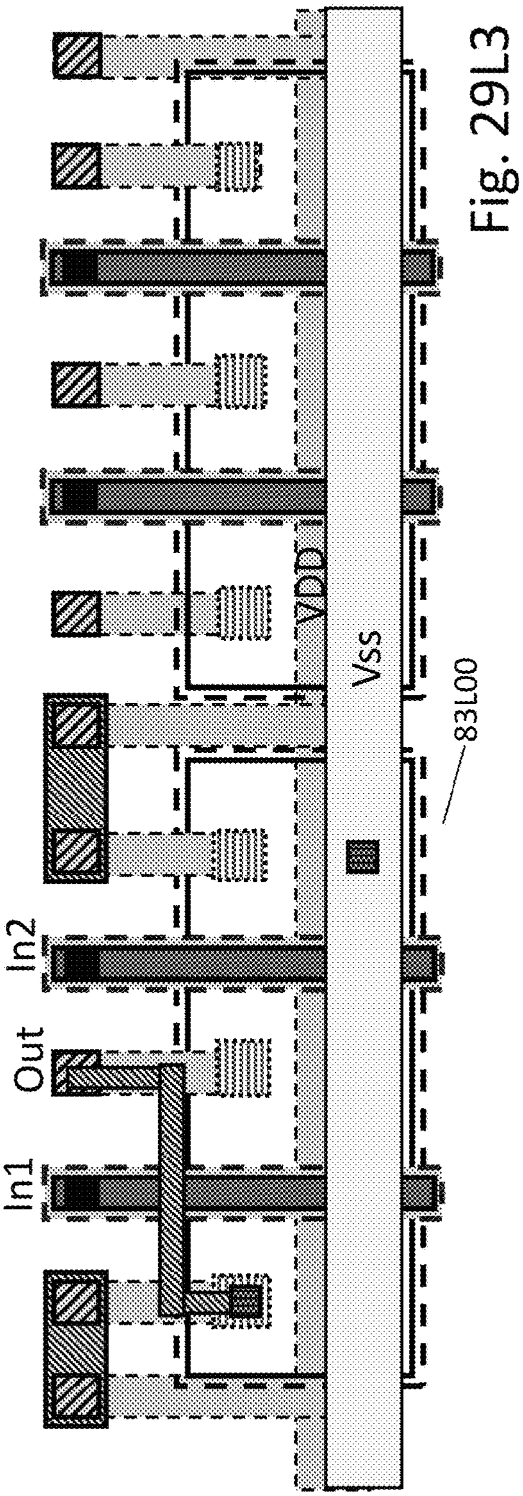
Fig. 29L3
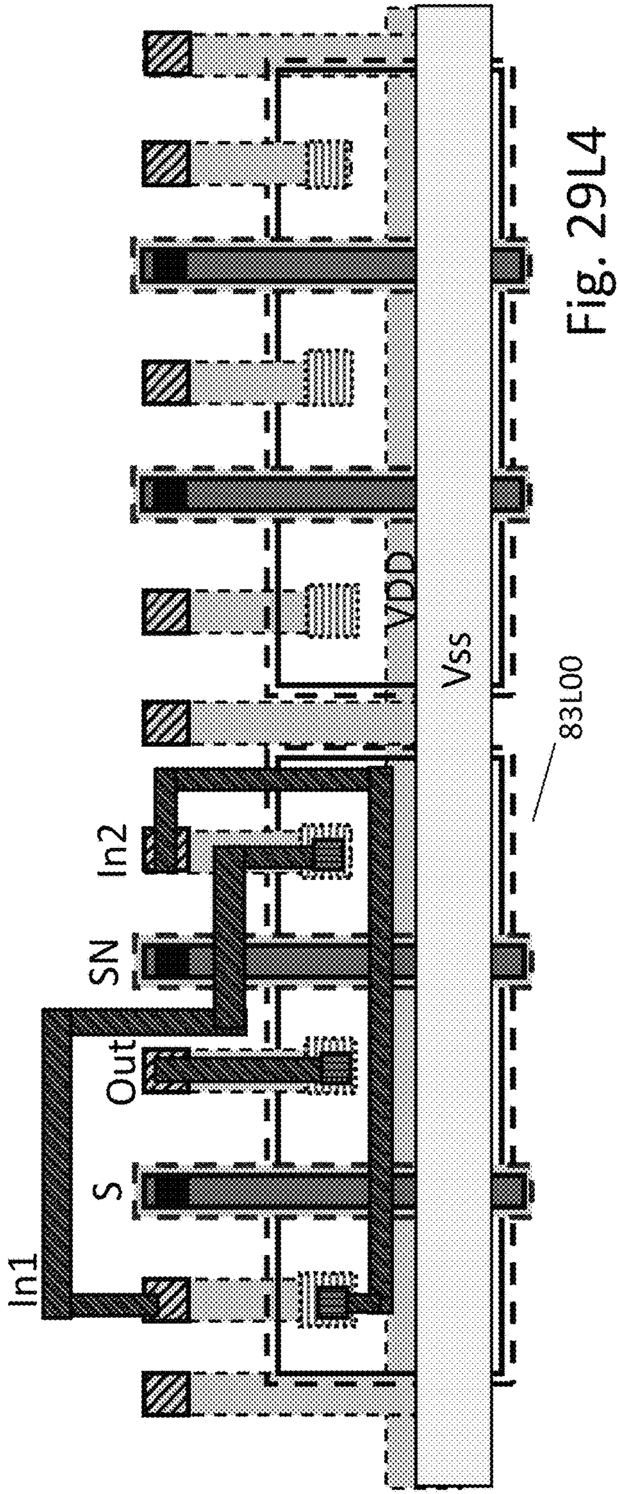
Fig. 29L4

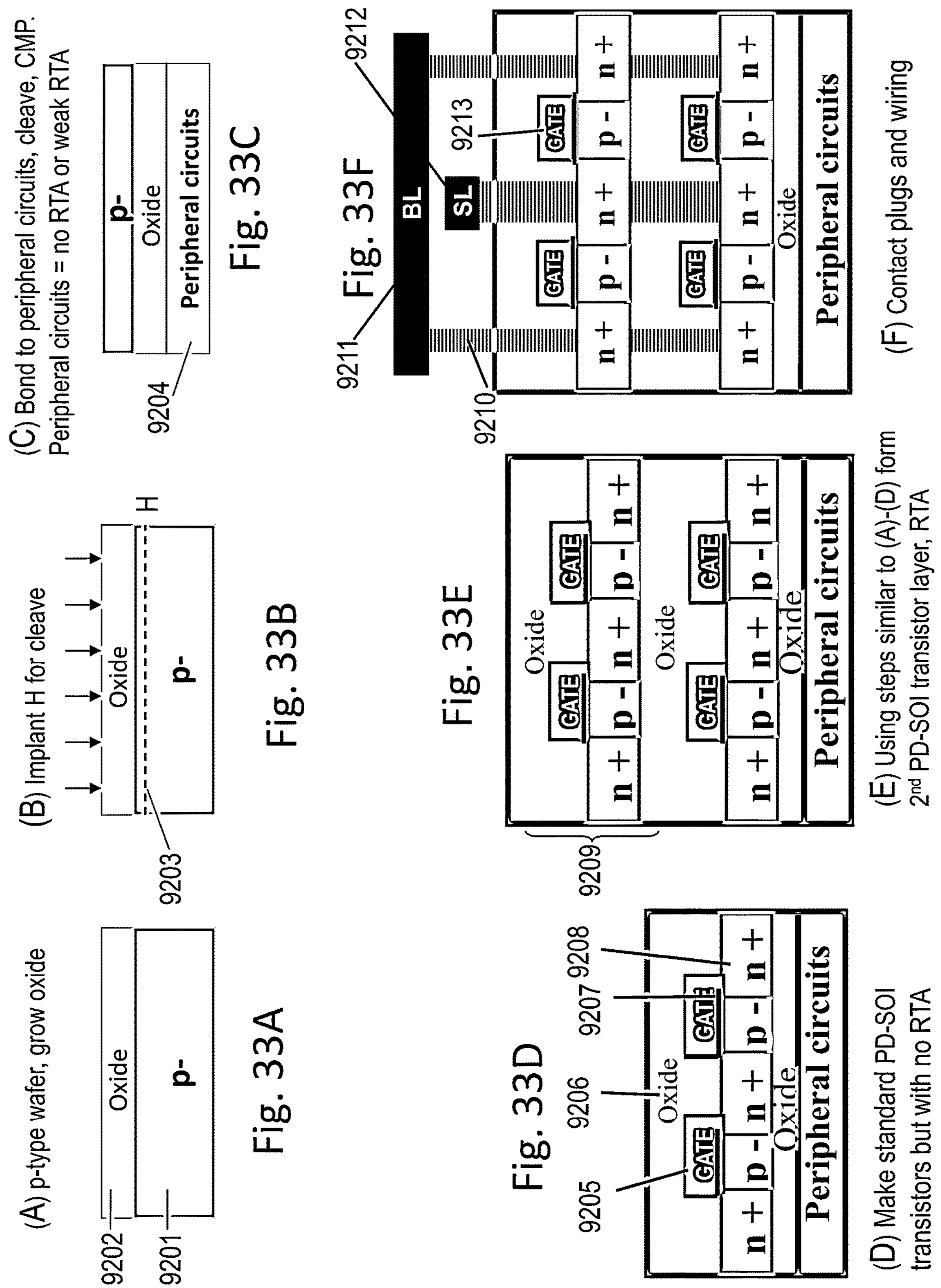
(A) p-type wafer, grow oxide
Oxide
p-
9202
9201
Fig. 33A
(B) Implant H for cleave
Oxide
p-
H
9203
Fig. 33B
(C) Bond to peripheral circuits, cleave, CMP.
Peripheral circuits = no RTA or weak RTA
p-
Oxide
Peripheral circuits
9204
Fig. 33C
Fig. 33D
9205
9206
9207
9208
GATE
Oxide
n+ p- n+ p- n+
Oxide
Peripheral circuits
(D) Make standard PD-SOI transistors but with no RTA
Fig. 33E
9209
Oxide
GATE
n+ p- n+ p- n+
Oxide
Peripheral circuits
(E) Using steps similar to (A)-(D) form 2nd PD-SOI transistor layer, RTA
Fig. 33F
9210
9211
9212
9213
BL
SL
GATE
n+ p- n+ p- n+
Oxide
Peripheral circuits
(F) Contact plugs and wiring

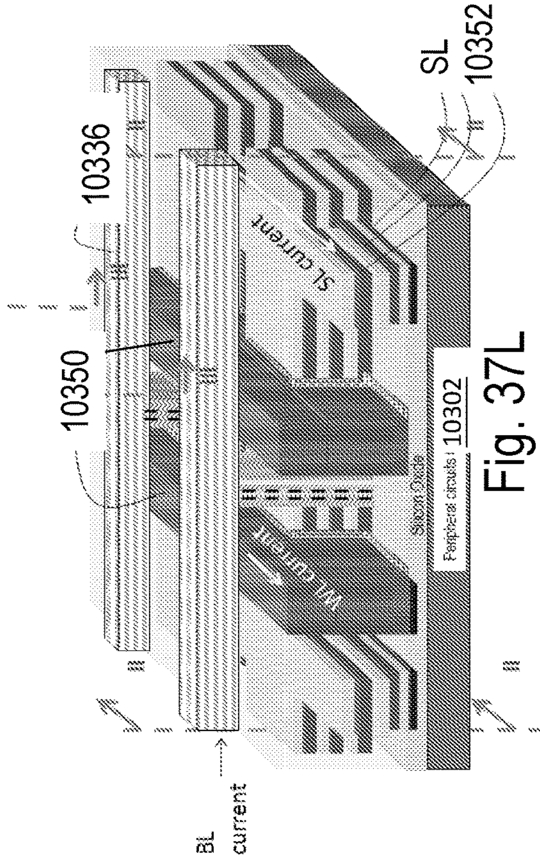
Fig. 37L
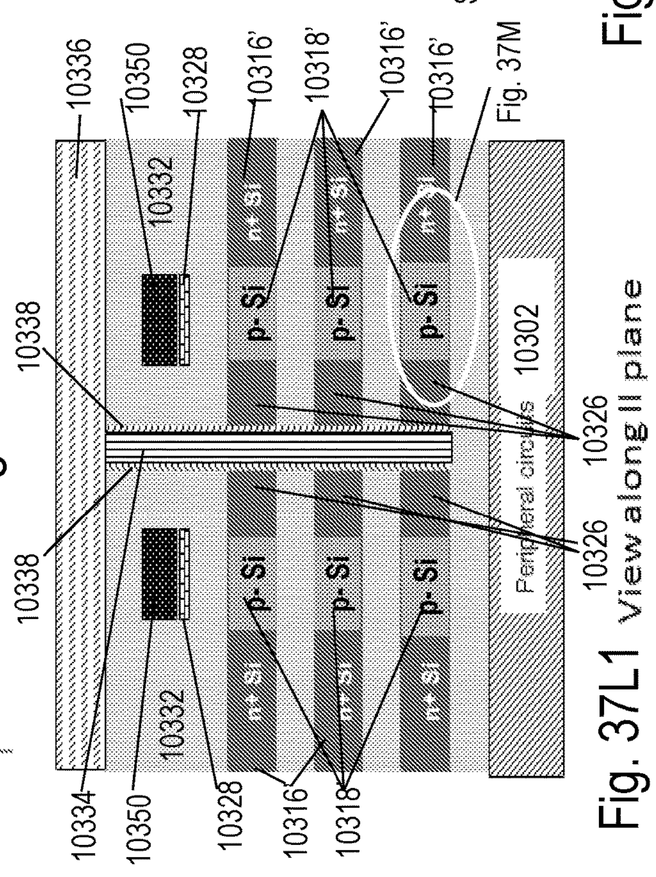
Fig. 37L1
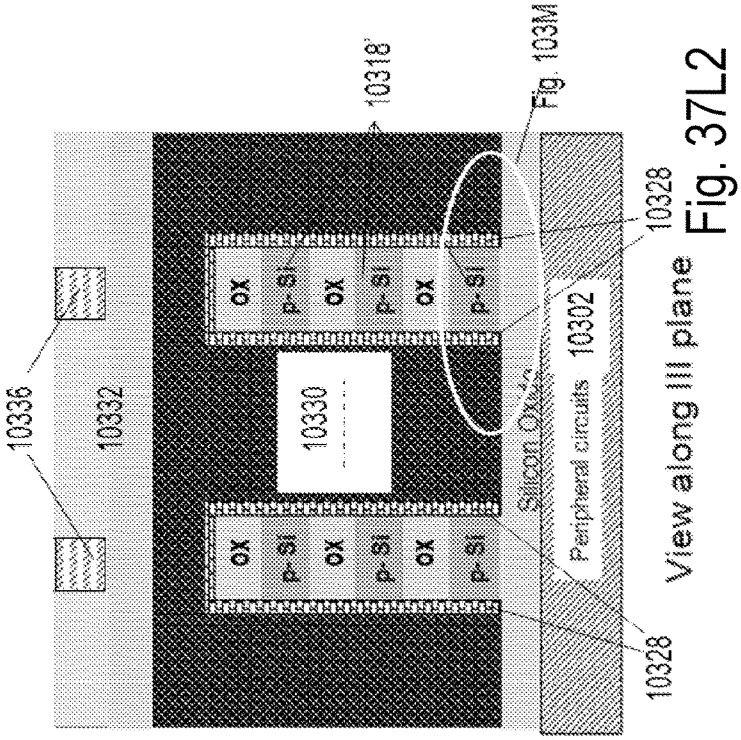
Fig. 37L2
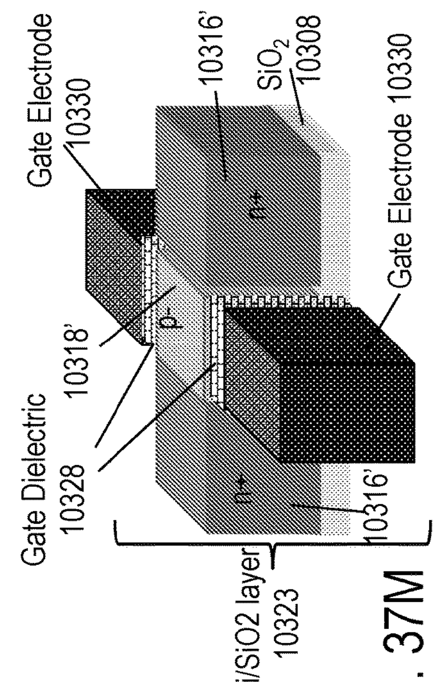
Fig. 37M

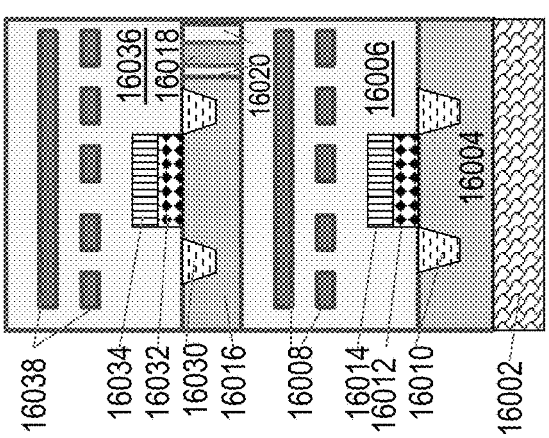
Fig. 64
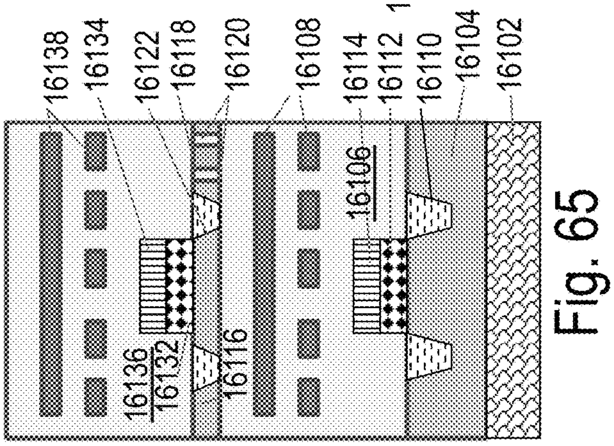
Fig. 65
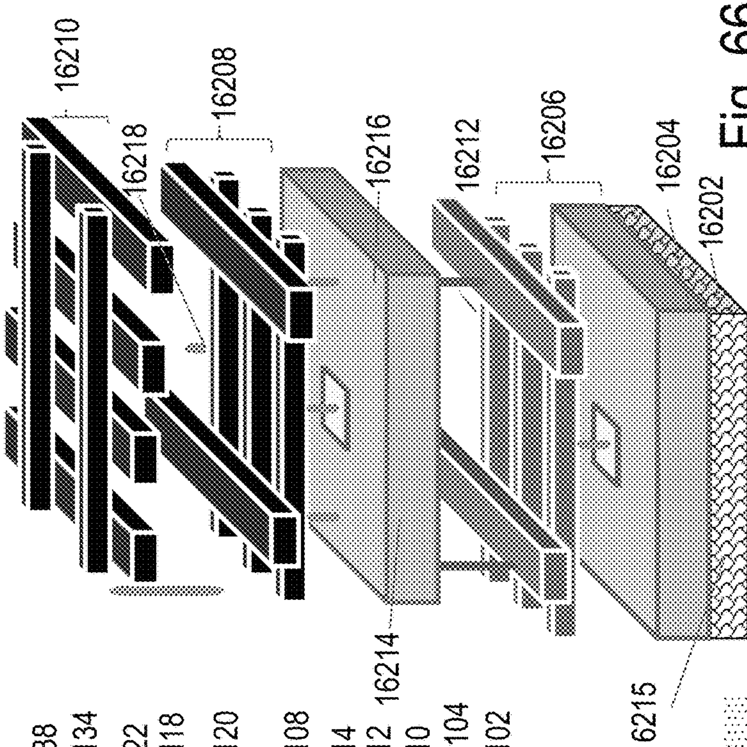
Fig. 66
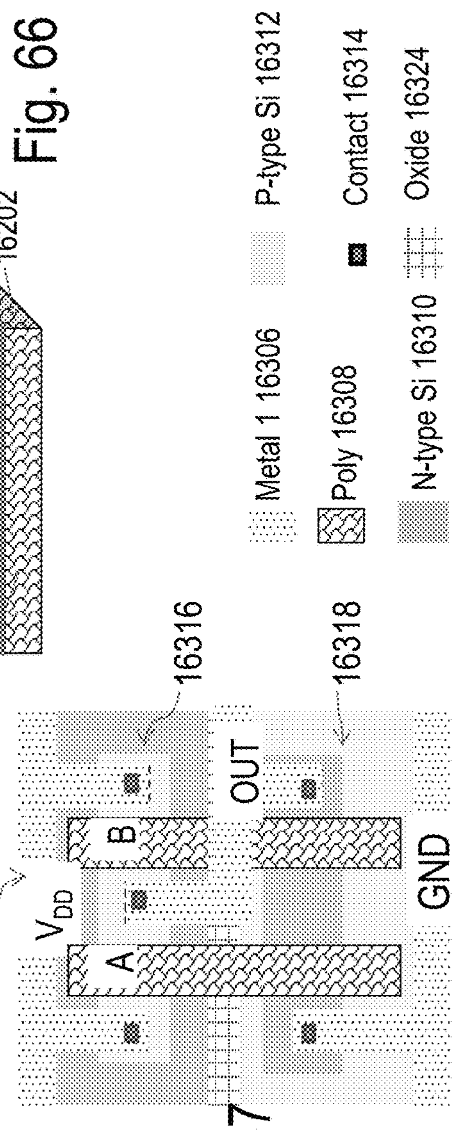
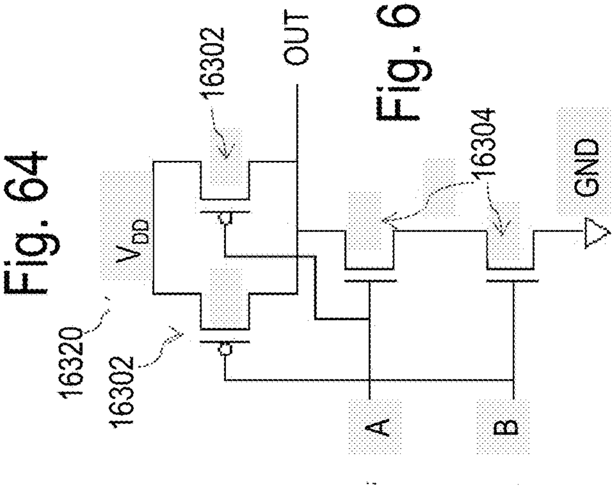
Fig. 67

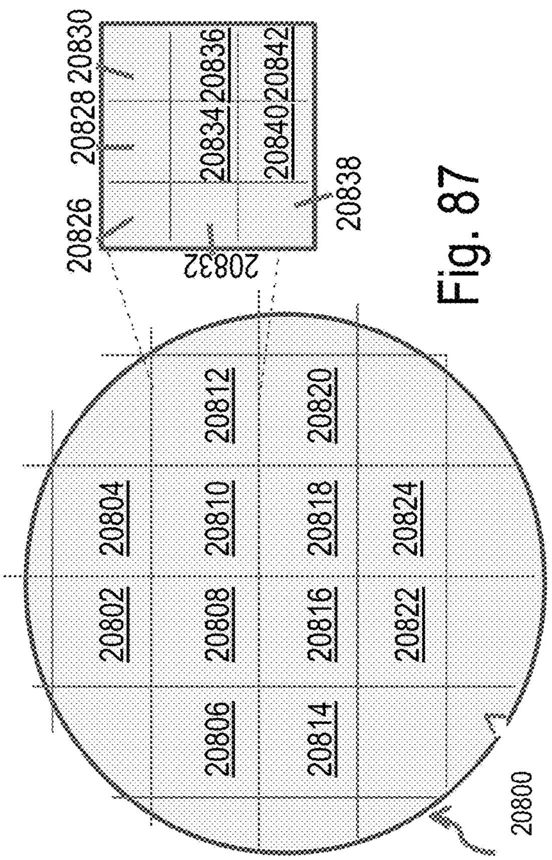
Fig. 87
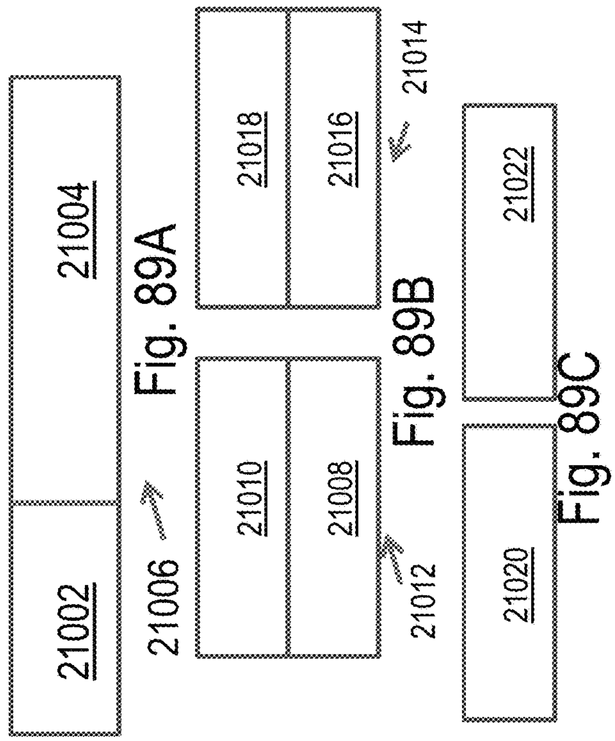
Fig. 89A
Fig. 89B
Fig. 89C
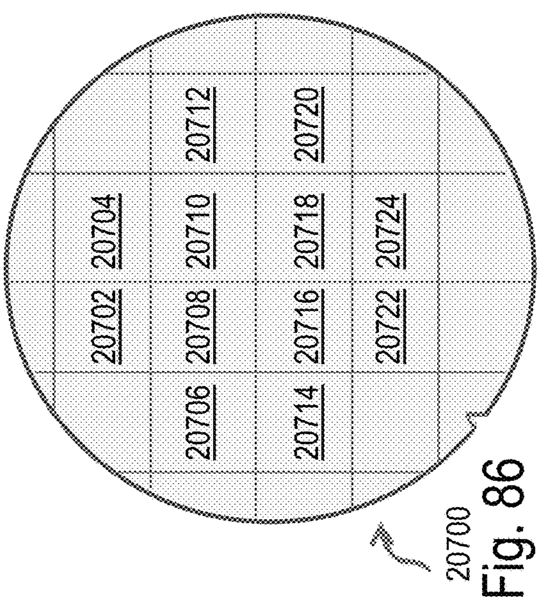
Fig. 86
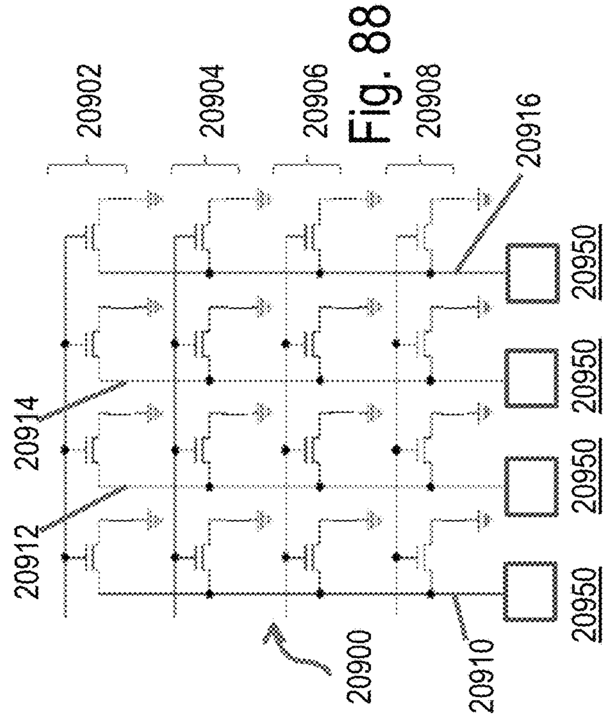
Fig. 88

METHODS FOR PRODUCING A 3D SEMICONDUCTOR MEMORY DEVICE AND STRUCTURE

CROSS-REFERENCE OF RELATED APPLICATIONS

This is a continuation-in-part of U.S. patent application Ser. No. 17/340,004, filed on Jun. 5, 2021, which is a continuation-in-part of U.S. patent application Ser. No. 16/537,564, filed on Aug. 10, 2019, which is a continuation-in-part of U.S. patent application Ser. No. 15/460,230, (now U.S. Pat. No. 10,497,713 issued on Dec. 3, 2019) filed on Mar. 16, 2017, which is a continuation-in-part of U.S. patent application Ser. No. 14/821,683, (now U.S. Pat. No. 9,613, 844 issued on Apr. 4, 2017) filed on Aug. 7, 2015, which is a continuation-in-part of U.S. patent application Ser. No. 13/492,395, (now U.S. Pat. No. 9,136,153 issued on Sep. 15, 2015) filed on Jun. 8, 2012, which is a continuation of U.S. patent application Ser. No. 13/273,712 (now U.S. Pat. No. 8,273,610 issued on Sep. 25, 2012) filed Oct. 14, 2011, which is a continuation-in-part of U.S. patent application Ser. No. 13/016,313 (now U.S. Pat. No. 8,362,482 issued on Jan. 29, 2013) filed on Jan. 28, 2011, which is a continuation-in-part of U.S. patent application Ser. No. 12/970,602, (now U.S. Pat. No. 9,711,407 issued on Jul. 18, 2017) filed on Dec. 16, 2010, which is a continuation-in-part of U.S. patent application Ser. No. 12/949,617, (now U.S. Pat. No. 8,754,533 issued on Jun. 17, 2014) filed on Nov. 18, 2010. The contents of the foregoing applications are incorporated herein by reference.

This application is also a continuation-in-part of U.S. patent application Ser. No. 17/340,004, filed on Jun. 5, 2021, which is continuation-in-part of U.S. patent application Ser. No. 17/147,320, (now U.S. Pat. No. 11,004,719 issued on May 11, 2021) filed on Jan. 12, 2021, which is a continuation-in-part of U.S. patent application Ser. No. 16/537,564, filed on Aug. 10, 2019, and domestic benefit continues as above.

BACKGROUND OF THE INVENTION

Field of the Invention

This application relates to the general field of Integrated Circuit (IC) devices and fabrication methods, and more particularly to multilayer or Three Dimensional Integrated Circuit (3D IC) devices and fabrication methods.

SUMMARY

The invention may be directed to multilayer or Three Dimensional Integrated Circuit (3D IC) devices and fabrication methods.

In one aspect, a method for producing a 3D memory device, the method comprising: providing a first level comprising a single-crystal layer and control circuits, wherein said first level comprises at least two interconnecting metal layers; forming at least one second level disposed above said first level; performing a first etch step comprising etching holes within said at least one second level; forming at least one third level disposed above said at least one second level; performing a second etch step comprising etching holes within said third level; and performing additional processing steps to form a plurality of first memory cells within said second level and a plurality of second memory cells within said third level, wherein each of said first memory cells comprise one first transistor, wherein each of said second memory cells comprise one second transistor, wherein said control circuits comprise a plurality of third transistors, wherein at least one of said first or second transistors has a channel, a source, and a drain each having a same doping type, wherein said first etch step is directly followed by a first deposition of a tunneling dielectric and then a second deposition comprising polysilicon, wherein said control circuits comprise memory peripheral circuits, wherein at least one of said first memory cells is at least partially atop a portion of said memory peripheral circuits, and wherein said first memory cells and said second memory cells are a NAND nonvolatile type memory.

In another aspect, a method for producing a 3D memory device, the method comprising: providing a first level comprising a first single-crystal layer and control circuits, wherein said first level comprises at least two interconnecting metal layers; forming at least one second level disposed above said first level; performing a first etch step comprising etching holes within said second level; forming at least one third level above said at least one second level; performing a second etch step comprising etching holes within said third level; and performing additional processing steps to form a plurality of first memory cells within said second level and a plurality of second memory cells within said third level; wherein each of said first memory cells comprise one first transistor, wherein each of said second memory cells comprise one second transistor, wherein said first memory cells and said second memory cells are a NAND nonvolatile type memory, and wherein at least one of said second transistors comprise a metal gate.

In another aspect, a method for producing a 3D memory device, the method comprising: providing a first level comprising a first single crystal layer and control circuits, wherein said control level comprises at least two interconnecting metal layers; forming at least one second level above said first level; performing a first etch step comprising etching holes within said second level; forming at least one third level above said at least one second level; performing a second etch step comprising etching holes within said third level; and performing additional processing steps to form a plurality of first memory cells within said second level and a plurality of second memory cells within said third level, wherein each of said first memory cells comprise one first transistor, wherein each of said second memory cells comprise one second transistor, wherein said performing additional processing steps comprises performing Atomic Layer Deposition ("ALD"), and wherein at least one of said first or second transistors has a channel, a source, and a drain having a same doping type.

BRIEF DESCRIPTION OF THE DRAWINGS

Various embodiments of the invention will be understood and appreciated more fully from the following detailed description, taken in conjunction with the drawings in which:

FIG. 1 is an exemplary drawing illustration of a programmable device layers structure;

FIG. 1A is an exemplary drawing illustration of a programmable device layers structure;

FIG. 1B-1I are exemplary drawing illustrations of the preprocessed wafers and layers and generalized layer transfer;

FIG. 15A-15C are exemplary drawing illustrations of pre-processed wafers used for vertical transistors;

FIG. 16 is an exemplary drawing illustration of a 3D IC system with redundancy;

FIG. 17A-FIG. 17C are exemplary drawing illustrations of the formation of a junction-less transistor;

FIG. 27A, FIG. 27B, FIG. 27B-1, and FIG. 27C-FIG. 27H are exemplary drawing illustrations of formation of top planar transistors;

FIG. 29L1-FIG. 29L4 are exemplary drawing illustrations of a formation of top planar transistors;

FIG. 33A-FIG. 33F are exemplary drawing illustrations of a formation of 3D DRAM;

FIG. 37A-FIG. 37L, FIG. 37L1, FIG. 37L2, and FIG. 37M are exemplary drawing illustrations of the formation of a resistive memory transistor;

FIG. 64 is an exemplary drawing illustration of a 3D integrated circuit;

FIG. 65 is an exemplary drawing illustration of another 3D integrated circuit;

FIG. 66 is an exemplary drawing illustration of the power distribution network of a 3D integrated circuit;

FIG. 67 is an exemplary drawing illustration of a NAND gate;

FIG. 86 is an exemplary drawing illustration of different write voltages utilized for different dice across a wafer;

FIG. 87 is an exemplary drawing illustration of different write voltages utilized for different parts of a chip (or die);

FIG. 88 is an exemplary drawing illustration of write voltages for floating-body RAM cells may be based on the distance of the memory cell from its write circuits;

FIG. 89A-FIG. 89C are exemplary drawing illustrations of configurations useful for controller functions;

FIG. 92 is an exemplary drawing illustration of a dual-port refresh scheme for capacitor-based DRAM;

FIG. 93 is an exemplary drawing illustration of a double gate device used for monolithic 3D floating-body RAM;

FIG. 94A is an exemplary drawing illustration of a 2D chip with memory, peripheral circuits, and logic circuits;

FIG. 94B is an exemplary drawing illustration of peripheral circuits may be stacked monolithically above or below memory arrays;

FIG. 94C is an exemplary drawing illustration of peripheral circuits may be monolithically stacked above and below memory arrays;

FIG. 95A-FIG. 95J are exemplary drawing illustrations of a technique to construct a horizontally-oriented monolithic 3D DRAM that utilizes the floating body effect and has independently addressable double-gate transistors; and FIG. 96A-FIG. 96F are exemplary drawing illustrations of a procedure for layer transfer using an etch-stop layer controlled etch-back.

DETAILED DESCRIPTION

Figure 1H:
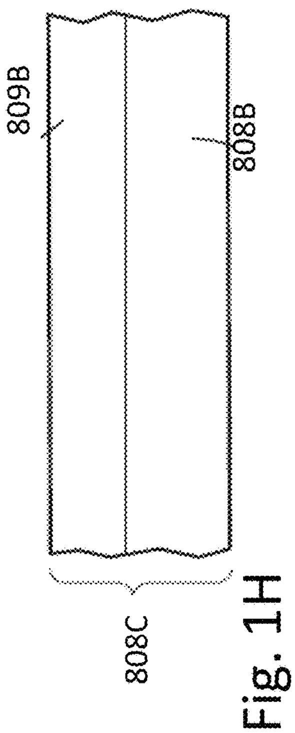

Embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

Some embodiments of the invention may provide a new method for semiconductor device fabrication that may be highly desirable for custom products. Some embodiments of the invention may suggest the use of a re-programmable antifuse in conjunction with 'Through Silicon Via' to construct a new type of configurable logic, or as usually called, FPGA devices. Some embodiments of the invention may provide a solution to the challenge of high mask-set cost and low flexibility that exists in the current common methods of semiconductor fabrication. An additional illustrated advantage of some embodiments of the present invention may be that it could reduce the high cost of manufacturing the many different mask sets needed in order to provide a commercially viable logic family with a range of products each with a different set of master slices. Some embodiments of the invention may improve upon the prior art in many respects, including, for example, the structuring of the semiconductor device and methods related to the fabrication of semiconductor devices.

Some embodiments of the invention may reflect the motivation to save on the cost of masks with respect to the investment that would otherwise have been necessary to put in place a commercially viable set of master slices. Some embodiments of the invention may also provide the ability to incorporate various types of memory blocks in the configurable device. Some embodiments of the invention may provide a method to construct a configurable device with the desired amount of logic, memory, I/Os, and analog functions.

In addition, some embodiments of the invention may allow the use of repeating logic tiles that provide a continuous terrain of logic. Some embodiments of the invention may use a modular approach to construct various configurable systems with Through-Silicon-Via (TSV). Once a standard size and location of TSV has been defined one could build various configurable logic dies, configurable memory dies, configurable I/O dies and configurable analog dies which could be connected together to construct various configurable systems. In fact, these embodiments of the invention may allow mixing and matching among configurable dies, fixed function dies, and dies manufactured in different processes.

Moreover in accordance with an embodiment of the invention, the integrated circuit system may include an I/O die that may be fabricated utilizing a different process than the process utilized to fabricate the configurable logic die.

Further in accordance with an embodiment of the invention, the integrated circuit system may include at least two logic dies connected by the use of Through-Silicon-Via and wherein some of the Through-Silicon-Vias may be utilized to carry the system bus signal.

Additionally there is a growing need to reduce the impact of inter-chip interconnects. In fact, interconnects may be now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs may be that their large size, usually a few microns each, may severely limit the number of connections that can be made. Some embodiments of the invention may provide multiple alternatives to constructing a 3D IC wherein many connections may be made less than one micron in size, thus enabling the use of 3D IC technology for most device applications.

Figure 27A:
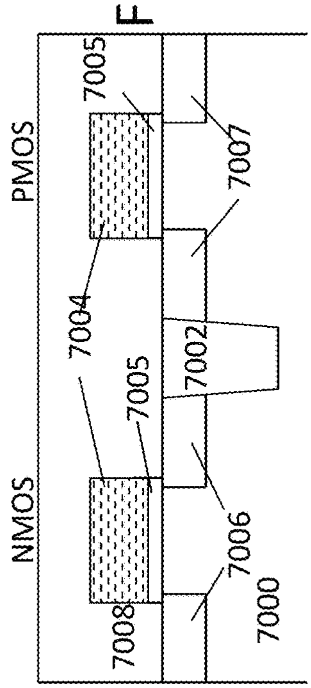
Figure 27B:
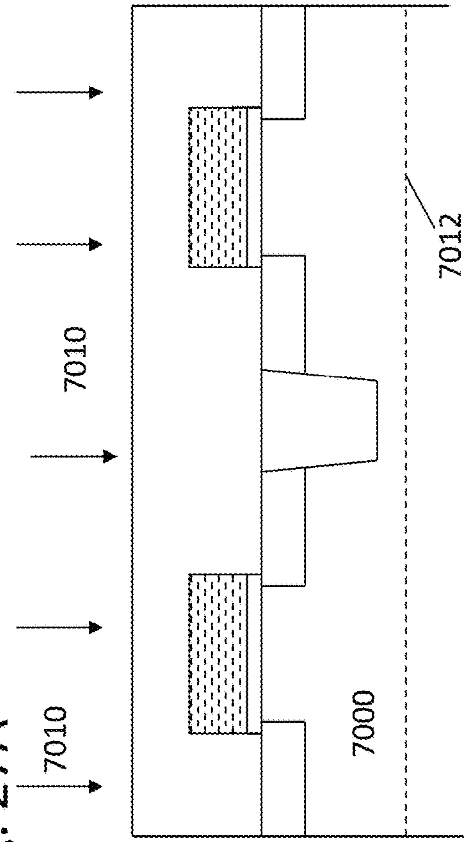
Figures 1, 27B:
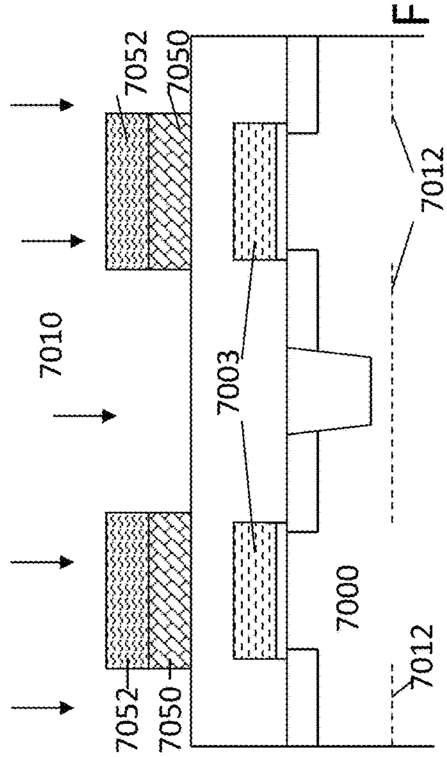

Additionally some embodiments of the invention may offer new device alternatives by utilizing the proposed 3D IC technology FIG. 1 is a drawing illustration of a programmable device layers structure according to an alternative embodiment of the invention. In this alternative embodiment, there are two layers including antifuses. The first may be designated to configure the logic terrain and, in some cases, may also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 1 may start with the semiconductor substrate, such as monocrystalline silicon substrate 802, comprising the transistors used for the logic cells and also the first antifuse layer programming transistors. Thereafter, logic fabric/first antifuse layer 804 may be constructed, which may include multiple layers, such as Metal 1, dielectric, Metal 2, and sometimes Metal 3. These layers may be used to construct the logic cells and often I/O and other analog cells. In this alternative embodiment of the invention, a plurality of first antifuses may be incorporated in the isolation layer between metal 1 and metal 2 or in the isolation layer between metal 2 and metal 3 and the corresponding programming transistors could be embedded in the silicon substrate 802 being underneath the first antifuses.

Interconnection layer 806 could include multiple layers of long interconnection tracks for power distribution and clock networks, or a portion thereof, in addition to structures already fabricated in the first few layers, for example, logic fabric/first antifuse layer 804.

Second antifuse layer 807 could include many layers, including the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric programming transistors 810. The programming element could be a thin film transistor or other alternatives for over oxide transistors as was mentioned previously. In such case the antifuse programming transistors may be placed over the antifuse layer, which may thereby enable the configurable interconnect in second antifuse layer 807 or logic fabric/first antifuse layer 804. It should be noted that in some cases it might be useful to construct part of the control logic for the second antifuse programming circuits, in the base layers such as silicon substrate 802 and logic fabric/first antifuse layer 804.

The final step may include constructing the connection to the outside 812. The connection could be pads for wire bonding, soldering balls for flip chip, optical, or other connection structures such as those connection structures for TSV.

In another alternative embodiment of the invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

FIG. 1A is a drawing illustration of a programmable device layers structure according to another alternative embodiment of the invention. In this alternative embodiment, there may be an additional circuit of Foundation layer 814 connected by through silicon via connections 816 to the fabric/first antifuse layer 804 logic or antifuses. This underlying device of circuit of Foundation layer 814 may provide the programming transistor for the logic fabric/first antifuse layer 804. In this way, the programmable device substrate diffusion, such as primary silicon layer 802A, may not be prone to the cost penalty of the programming transistors for the logic fabric/first antifuse layer 804. Accordingly the programming connection of the logic fabric/first antifuse layer 804 may be directed downward to connect to the underlying programming device of Foundation layer 814 while the programming connection to the second antifuse layer 807 may be directed upward to connect to the programming circuit programming transistors 810. This could provide less congestion of the circuit internal interconnection routes.

FIG. 1A is a cut illustration of a programmable device, with two antifuse layers. The programming transistors for the first logic fabric/first antifuse layer 804 could be prefabricated on Foundation layer 814, and then, utilizing "smart-cut", a single crystal, or mono-crystalline, transferred silicon layer 1404 may be transferred on which the primary programmable logic of primary silicon layer 802A may be fabricated with advanced logic transistors and other circuits. Then multi-metal layers are fabricated including a lower layer of antifuses in logic fabric/first antifuse layer 804, interconnection layer 806 and second antifuse layer 807 with its configurable interconnects. For the second antifuse layer 807 the programming transistors 810 could be fabricated also utilizing a second "smart-cut" layer transfer.

The term layer transfer in the use herein may be defined as the technological process or method that enables the transfer of very fine layers of crystalline material onto a mechanical support, wherein the mechanical support may be another layer or substrate of crystalline material. For example, the "SmartCut" process, also used herein as the term 'ion-cut' process, together with wafer bonding technology, may enable a "Layer Transfer" whereby a thin layer of a single or mono-crystalline silicon wafer may be transferred from one wafer or substrate to another wafer or substrate. Other specific layer transfer processes may be described or referenced herein.

The terms monocrystalline or mono-crystalline in the use herein of, for example, monocrystalline or mono-crystalline layer, material, or silicon, may be defined as "a single crystal body of crystalline material that contains no large-angle boundaries or twin boundaries as in ASTM F1241, also called monocrystal" and "an arrangement of atoms in a solid that has perfect periodicity (that is, no defects)" as in the SEMATECH dictionary. The terms single crystal and monocrystal are equivalent in the SEMATECH dictionary. The term single crystal in the use herein of, for example, single crystal silicon layer, single crystal layer, may be equivalently defined as monocrystalline.

The term via in the use herein may be defined as "an opening in the dielectric layer(s) through which a riser passes, or in which the walls are made conductive; an area that provides an electrical pathway [connection path] from one metal layer to the metal layer above or below," as in the SEMATECH dictionary. The term through silicon via (TSV) in the use herein may be defined as an opening in a silicon layer(s) through which an electrically conductive riser passes, and in which the walls are made isolative from the silicon layer; a riser that provides an electrical pathway [connection path] from one metal layer to the metal layer above or below. The term through layer via (TLV) in the use herein may be defined as an opening in a layer transferred layer(s) through which an electrically conductive riser passes, wherein the riser may pass through at least one isolating region, for example, a shallow trench isolation (STI) region in the transferred layer, may typically have a riser diameter of less than 200 nm, a riser that provides an electrical pathway [connection path] from one metal layer to the metal layer above or below. In some cases, a TLV may additionally pass thru an electrically conductive layer, and the walls may be made isolative from the conductive layer.

The reference 808 in subsequent figures can be any one of a vast number of combinations of possible preprocessed wafers or layers containing many combinations of transfer layers that fall within the scope of the invention. The term "preprocessed wafer or layer" may be generic and reference number 808 when used in a drawing figure to illustrate an embodiment of the present invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, an acceptor substrate, target wafer, preprocessed circuitry, a preprocessed circuitry acceptor wafer, a base wafer layer, a lower layer, an underlying main wafer, a foundation layer, an attic layer, or a house wafer.

FIG. 1B is a drawing illustration of a generalized preprocessed wafer or layer 808. The wafer or layer 808 may have preprocessed circuitry, such as, for example, logic circuitry, microprocessors, MEMS, circuitry comprising transistors of various types, and other types of digital or analog circuitry including, but not limited to, the various embodiments described herein. Preprocessed wafer or layer 808 may have preprocessed metal interconnects and may include copper or aluminum. The metal layer or layers of interconnect may be constructed of lower (less than about 400° C.) thermal damage resistant metals such as, for example, copper or aluminum, or may be constructed with refractory metals such as tungsten to provide high temperature utility at greater than about 400° C. The preprocessed metal interconnects may be designed and prepared for layer transfer and electrical coupling from preprocessed wafer or layer 808 to the layer or layers to be transferred.

FIG. 1C is a drawing illustration of a generalized transfer layer 809 prior to being attached to preprocessed wafer or layer 808. Transfer layer 809 may be attached to a carrier wafer or substrate during layer transfer. Preprocessed wafer or layer 808 may be called a target wafer, acceptor substrate, or acceptor wafer. The acceptor wafer may have acceptor wafer metal connect pads or strips designed and prepared for electrical coupling to transfer layer 809. Transfer layer 809 may be attached to a carrier wafer or substrate during layer transfer. Transfer layer 809 may have metal interconnects designed and prepared for layer transfer and electrical coupling to preprocessed wafer or layer 808. The metal interconnects now on transfer layer 809 may include copper or aluminum.

Electrical coupling from transferred layer 809 to preprocessed wafer or layer 808 may utilize through layer vias (TLVs) as the connection path. Transfer layer 809 may be comprised of single crystal silicon, or mono-crystalline silicon, or doped mono-crystalline layer or layers, or other semiconductor, metal, and insulator materials, layers; or multiple regions of single crystal silicon, or mono-crystalline silicon, or doped mono-crystalline silicon, or other semiconductor, metal, or insulator materials.

FIG. 1D is a drawing illustration of a preprocessed wafer or layer 808A created by the layer transfer of transfer layer 809 on top of preprocessed wafer or layer 808. The top of preprocessed wafer or layer 808A may be further processed with metal interconnects designed and prepared for layer transfer and electrical coupling from preprocessed wafer or layer 808A to the next layer or layers to be transferred.

FIG. 1E is a drawing illustration of a generalized transfer layer 809A prior to being attached to preprocessed wafer or layer 808A. Transfer layer 809A may be attached to a carrier wafer or substrate during layer transfer. Transfer layer 809A may have metal interconnects designed and prepared for layer transfer and electrical coupling to preprocessed wafer or layer 808A.

FIG. 1F is a drawing illustration of a preprocessed wafer or layer 808B created by the layer transfer of transfer layer 809A on top of preprocessed wafer or layer 808A. The top of preprocessed wafer or layer 808B may be further processed with metal interconnects designed and prepared for layer transfer and electrical coupling from preprocessed wafer or layer 808B to the next layer or layers to be transferred.

Figure 1G:
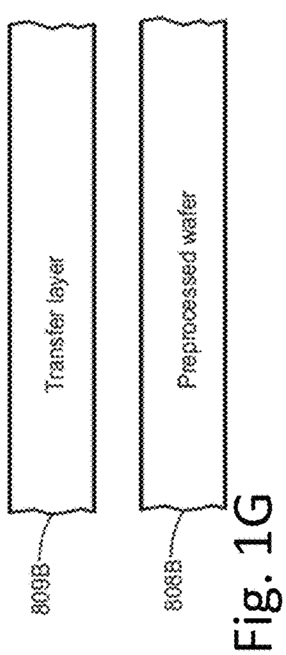

FIG. 1G is a drawing illustration of a generalized transfer layer 809B prior to being attached to preprocessed wafer or layer 808B. Transfer layer 809B may be attached to a carrier wafer or substrate during layer transfer. Transfer layer 809B may have metal interconnects designed and prepared for layer transfer and electrical coupling to preprocessed wafer or layer 808B.

FIG. 1H is a drawing illustration of preprocessed wafer or layer 808C created by the layer transfer of transfer layer 809B on top of preprocessed wafer or layer 808B. The top of preprocessed wafer or layer 808C may be further processed with metal interconnect designed and prepared for layer transfer and electrical coupling from preprocessed wafer or layer 808C to the next layer or layers to be transferred.

Figure 1I:
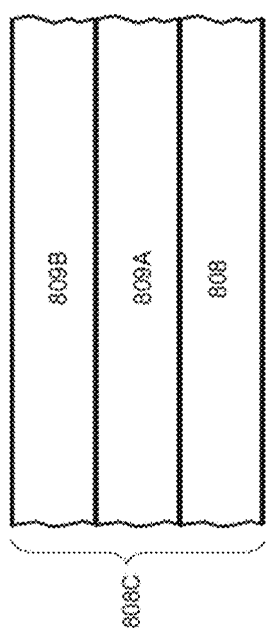

FIG. 1I is a drawing illustration of preprocessed wafer or layer 808C, a 3D IC stack, which may comprise transferred layers 809A and 809B on top of the original preprocessed wafer or layer 808. Transferred layers 809A and 809B and the original preprocessed wafer or layer 808 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel array transistors. Transferred layers 809A and 809B and the original preprocessed wafer or layer 808 may further comprise semiconductor devices such as resistors and capacitors and inductors, one or more programmable interconnects, memory structures and devices, sensors, radio frequency devices, or optical interconnect with associated transceivers. Transferred layers 809A and 809B and the original preprocessed wafer or layer 808 may further include isolation layers, such as, for example, silicon and/or carbon containing oxides and/or low-k dielectrics and/or polymers, which may facilitate oxide to oxide wafer or substrate bonding and may electrically isolate, for example, one layer, such as transferred layer 809A, from another layer, such as preprocessed wafer or layer 808. The terms carrier wafer or carrier substrate may also be called holder wafer or holder substrate. The terms carrier wafer or substrate used herein may be a wafer, for example, a monocrystalline silicon wafer, or a substrate, for example, a glass substrate, used to hold, flip, or move, for example, other wafers, layers, or substrates, for further processing. The attachment of the carrier wafer or substrate to the carried wafer, layer, or substrate may be permanent or temporary.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

The thinner the transferred layer, the smaller the through layer via (TLV) diameter obtainable, due to the potential limitations of manufacturable via aspect ratios. Thus, the transferred layer may be, for example, less than about 2 microns thick, less than about 1 micron thick, less than about 0.4 microns thick, less than about 200 nm thick, or less than about 100 nm thick. The TLV diameter may be less than about 400 nm, less than about 200 nm, less than about 80 nm, less than about 40 nm, or less than about 20 nm. The thickness of the layer or layers transferred according to some embodiments of the present invention may be designed as such to match and enable the best obtainable lithographic resolution capability of the manufacturing process employed to create the through layer vias or any other structures on the transferred layer or layers.

In many of the embodiments of the invention, the layer or layers transferred may be of a crystalline material, for example, mono-crystalline silicon, and after layer transfer, further processing, such as, for example, plasma/RIE or wet etching, may be done on the layer or layers that may create islands or mesas of the transferred layer or layers of crystalline material, for example, mono-crystalline silicon, the crystal orientation of which has not changed. Thus, a mono-crystalline layer or layers of a certain specific crystal orientation may be layer transferred and then processed whereby the resultant islands or mesas of mono-crystalline silicon have the same crystal specific orientation as the layer or layers before the processing. After this processing, the resultant islands or mesas of crystalline material, for example, mono-crystalline silicon, may be still referred to herein as a layer, for example, mono-crystalline layer, layer of mono-crystalline silicon, and so on.

Persons of ordinary skill in the art will appreciate that the illustrations in FIG. 1 through 1I are exemplary only and are not drawn to scale. Such skilled persons will further appreciate that many variations may be possible such as, for example, the preprocessed wafer or layer 808 may act as a base or substrate layer in a wafer transfer flow, or as a preprocessed or partially preprocessed circuitry acceptor wafer in a wafer transfer process flow. Moreover, layer transfer techniques, such as 'ion-cut' that may form a layer transfer demarcation plane by ion implantation of hydrogen molecules or atoms, or any other layer transfer technique described herein or utilized in industry, may be utilized in the generalized FIG. 1 flows and applied throughout herein. Furthermore, metal interconnect strips may be formed on the acceptor wafer and/or transferred layer to assist the electrical coupling of circuitry between the two layers, and may utilize TLVs. Many other modifications within the scope of the illustrated embodiments of the invention described herein will suggest themselves to such skilled persons after reading this specification. Thus the invention is to be limited only by the appended claims.

A technology for such underlying circuitry may be to use the "SmartCut" process. The "SmartCut" process is a well understood technology used for fabrication of SOI wafers. The "SmartCut" process, together with wafer bonding technology, may enable a "Layer Transfer" whereby a thin layer of a single or mono-crystalline silicon wafer may be transferred from one wafer to another wafer. The "Layer Transfer" could be done at less than about 400° C. and the resultant transferred layer could be even less than about 100 nm thick. The transferred layer thickness may typically be about 100 nm, and may be a thin as about 5 nm in currently demonstrated fully depleted SOI (FDSOI) wafer manufacturing by Soitec. In most applications described herein in this invention the transferred layer thickness may be less than about 400 nm and may be less than about 200 nm for logic applications. The process with some variations and under different names may be commercially available by two companies, namely, Soitec (Crolles, France) and SiGen—Silicon Genesis Corporation (San Jose, CA). A room temperature wafer bonding process utilizing ion-beam preparation of the wafer surfaces in a vacuum has been recently demonstrated by Mitsubishi Heavy Industries Ltd., Tokyo, Japan. This process may allow for room temperature layer transfer.

Alternatively, other technology may also be used. For example, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer may be subsequently aligned and low-temperature oxide-to-oxide bonded to the acceptor wafer topside. A low temperature release of the glass handle wafer from the thinned donor wafer may be performed, and then through bond via connections may be made. Additionally, epitaxial liftoff (ELO) technology as shown by P. Demeester, et. al, of IMEC in Semiconductor Science Technology 1993 may be utilized for layer transfer. ELO may make use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, may etch the exposed release layer, such as, for example, silicon oxide in SOI or AlAs. After liftoff, the transferred layer may then be aligned and bonded to the acceptor substrate or wafer. The manufacturability of the ELO process for multilayer layer transfer use was recently improved by J. Yoon, et. al., of the University of Illinois at Urbana-Champaign as described in Nature May 20, 2010. Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 14:
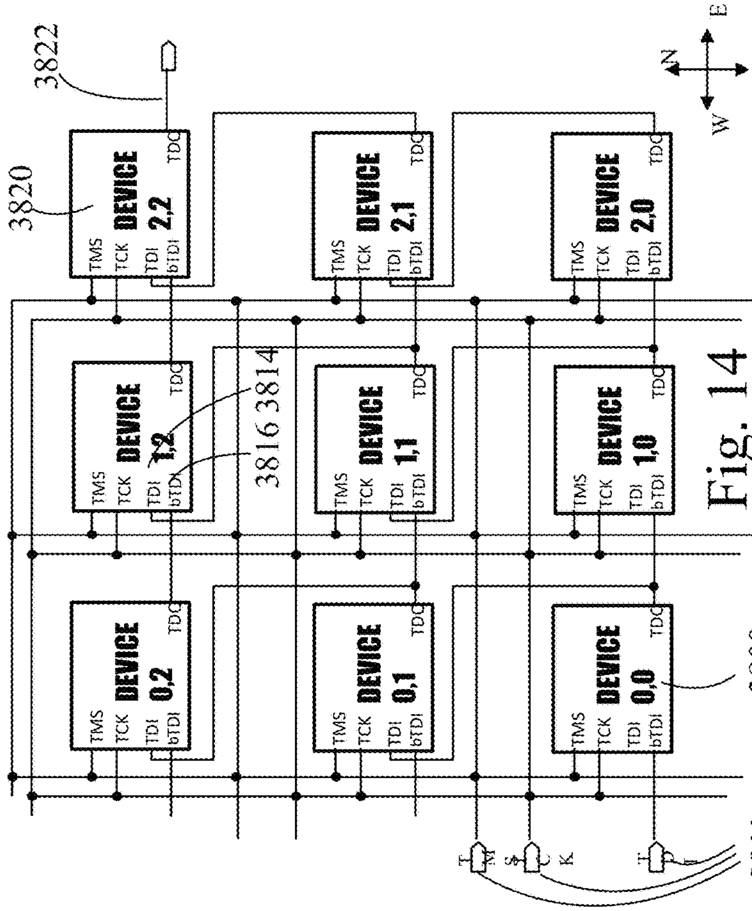
FIG. 14 is an exemplary drawing illustration of modified JTAG connections.

FIG. 14 is a drawing illustration of a layer transfer process flow. In another illustrative embodiment of the invention, "Layer-Transfer" may be used for construction of the underlying circuitry of Foundation layer 814. Wafer 1402 may include a monocrystalline silicon wafer that was processed to construct the underlying circuitry. The wafer 1402 could be of the most advanced process or more likely a few generations behind. It could include the programming circuits of Foundation layer 814 and other useful structures and may be a preprocessed CMOS silicon wafer, or a partially processed CMOS, or other prepared silicon or semiconductor substrate. Wafer 1402 may also be called an acceptor substrate or a target wafer. An oxide layer 1412 may then be deposited on top of the wafer 1402 and thereafter may be polished for better planarization and surface preparation. A donor wafer 1406 may then be brought in to be bonded to wafer 1402. The surfaces of both donor wafer 1406 and wafer 1402 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 1406 may be pre-prepared for "SmartCut" by an ion implant of an atomic species, such as H+ ions, at the desired depth to prepare the SmartCut line 1408. SmartCut line 1408 may also be called a layer transfer demarcation plane, shown as a dashed line. The SmartCut line 1408 or layer transfer demarcation plane may be formed before or after other processing on the donor wafer 1406. Donor wafer 1406 may be bonded to wafer 1402 by bringing the donor wafer 1406 surface in physical contact with the wafer 1402 surface, and then applying mechanical force and/or thermal annealing to strengthen the oxide to oxide bond.

Alignment of the donor wafer 1406 with the wafer 1402 may be performed immediately prior to the wafer bonding. Acceptable bond strengths may be obtained with bonding thermal cycles that do not exceed about 400° C. After bonding the two wafers a SmartCut step may be performed to cleave and remove the top portion 1414 of the donor wafer 1406 along the SmartCut line 1408. The cleaving may be accomplished by various applications of energy to the SmartCut line 1408, or layer transfer demarcation plane, such as a mechanical strike by a knife or jet of liquid or jet of air, or by local laser heating, by application of ultrasonic or megasonic energy, or other suitable methods. The result may be a 3D wafer 1410 which may include wafer 1402 with a transferred silicon layer 1404 of mono-crystalline silicon, or multiple layers of materials. Transferred silicon layer 1404 may be polished chemically and mechanically to provide a suitable surface for further processing. Transferred silicon layer 1404 could be quite thin at the range of about 50-200 nm. The described flow may be called "layer transfer". Layer transfer may be commonly utilized in the fabrication of SOI—Silicon On Insulator—wafers. For SOI wafers the upper surface may be oxidized so that after "layer transfer" a buried oxide—BOX—may provide isolation between the top thin mono-crystalline silicon layer and the bulk of the wafer. The use of an implanted atomic species, such as Hydrogen or Helium or a combination, to create a cleaving plane as described above may be referred to in this document as "SmartCut" or "ion-cut" and may be generally the illustrated layer transfer method.

Persons of ordinary skill in the art will appreciate that the illustrations in FIG. 14 are exemplary only and are not drawn to scale. Such skilled persons will further appreciate that many variations may be possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without an implant cleave process and the donor wafer may be, for example, etched away until the etch stop layer is reached. Such skilled persons will further appreciate that the oxide layer within an SOI or GeOI donor wafer may serve as the etch stop layer, and hence one edge of the oxide layer may function as a layer transfer demarcation plane. Moreover, the dose and energy of the implanted specie or species may be uniform across the surface area of the wafer or may have a deliberate variation, including, for example, a higher dose of hydrogen at the edges of a monocrystalline silicon wafer to promote cleaving. Many other modifications within the scope of the illustrated embodiments of the invention will suggest themselves to such skilled persons after reading this specification. Thus the invention is to be limited only by the appended claims.

Now that a "layer transfer" process may be used to bond a thin mono-crystalline silicon layer transferred silicon layer 1404 on top of the preprocessed wafer 1402, a standard process could ensue to construct the rest of the desired circuits as illustrated in FIG. 1A, starting with primary silicon layer 802A on the transferred silicon layer 1404. The lithography step may use alignment marks on wafer 1402 so the following circuits of primary silicon layer 802A and logic fabric/first antifuse layer 804 and so forth could be properly connected to the underlying circuits of Foundation layer 814. An aspect that should be accounted for is the high temperature that may be needed for the processing of circuits of primary silicon layer 802A. The pre-processed circuits on wafer 1402 may need to withstand this high temperature associated with the activation of the semiconductor transistors of primary silicon layer 802A fabricated on the transferred silicon layer 1404. Those circuits on wafer 1402 may include transistors and local interconnects of poly-crystalline silicon (polysilicon or poly) and some other type of interconnection that could withstand high temperature such as tungsten. A processed wafer that can withstand subsequent processing of transistors on top at high temperatures may be a called the "Foundation" or a foundation wafer, layer or circuitry. An illustrated advantage of using layer transfer for the construction of the underlying circuits may include having the transferred silicon layer 1404 be very thin which may enable the through silicon via connections 816, or through layer vias (TLVs), to have low aspect ratios and be more like normal contacts, which could be made very small and with minimum area penalty. The thin transferred layer may also allow conventional direct through-layer alignment techniques to be performed, thus increasing the density of through silicon via connections 816.

An additional alternative embodiment of the invention is where the foundation wafer 1402 layer may be pre-processed to carry a plurality of back bias voltage generators. A known challenge in advanced semiconductor logic devices may be die-to-die and within-a-die parameter variations. Various sites within the die might have different electrical characteristics due to dopant variations and such. The parameters that can affect the variation may include the threshold voltage of the transistor. Threshold voltage variability across the die may be mainly due to channel dopant, gate dielectric, and critical dimension variability. This variation may become profound in sub 45 nm node devices. The usual implication may be that the design should be done for the worst case, resulting in a quite significant performance penalty. Alternatively complete new designs of devices are being proposed to solve this variability problem with significant uncertainty in yield and cost. A possible solution may be to use localized back bias to drive upward the performance of the worst zones and allow better overall performance with minimal additional power. The foundation-located back bias could also be used to minimize leakage due to process variation.

Figure 5A:
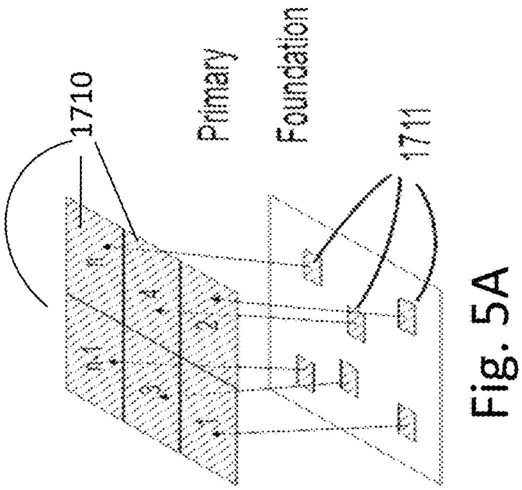
FIG. 5A is an exemplary topology drawing illustration of underlying back bias circuitry.

FIG. 5A is a topology drawing illustration of back bias circuitry. The foundation wafer 1402 layer may carry back bias circuits 1711 to allow enhancing the performance of some of the zones 1710 on the primary device which otherwise will have lower performance.

Figure 5B:
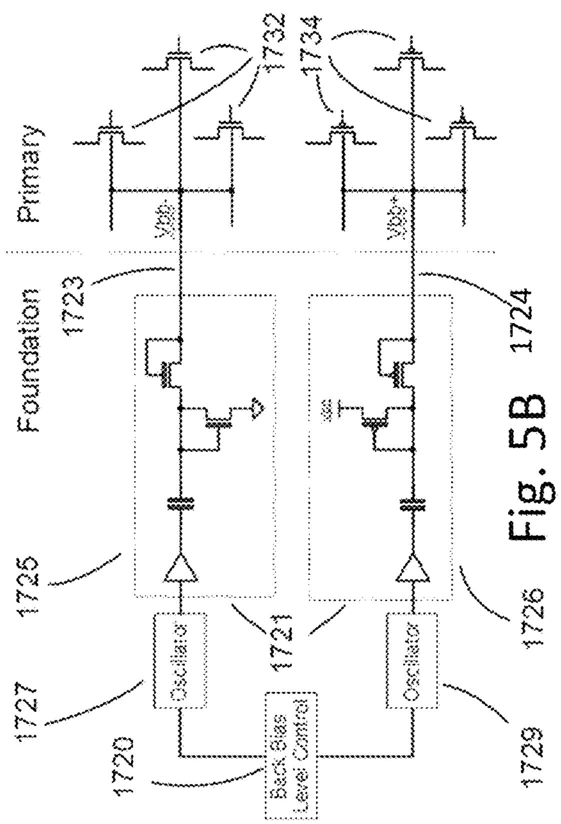
FIG. 5B is an exemplary drawing illustration of underlying back bias circuits.

FIG. 5B is a drawing illustration of back bias circuits. A back bias level control circuit 1720 may be controlling the oscillators 1727 and 1729 to drive the voltage generators 1721. The negative voltage generator 1725 may generate the desired negative bias which may be connected to the primary circuit by connection 1723 to back bias the N-channel Metal-Oxide-Semiconductor (NMOS) transistors 1732 on the primary silicon transferred silicon layer 1404. The positive voltage generator 1726 may generate the desired negative bias which may be connected to the primary circuit by connection 1724 to back bias the P-channel Metal-Oxide-Semiconductor (PMOS) transistors 1734 on the primary silicon transferred silicon layer 1404. The setting of the proper back bias level per zone may be done in the initiation phase. It could be done by using external tester and controller or by on-chip self test circuitry. As an example, a non volatile memory may be used to store the per zone back bias voltage level so the device could be properly initialized at power up. Alternatively a dynamic scheme could be used where different back bias level(s) are used in different operating modes of the device. Having the back bias circuitry in the foundation allows better utilization of the primary device silicon resources and less distortion for the logic operation on the primary device.

Figure 5C:
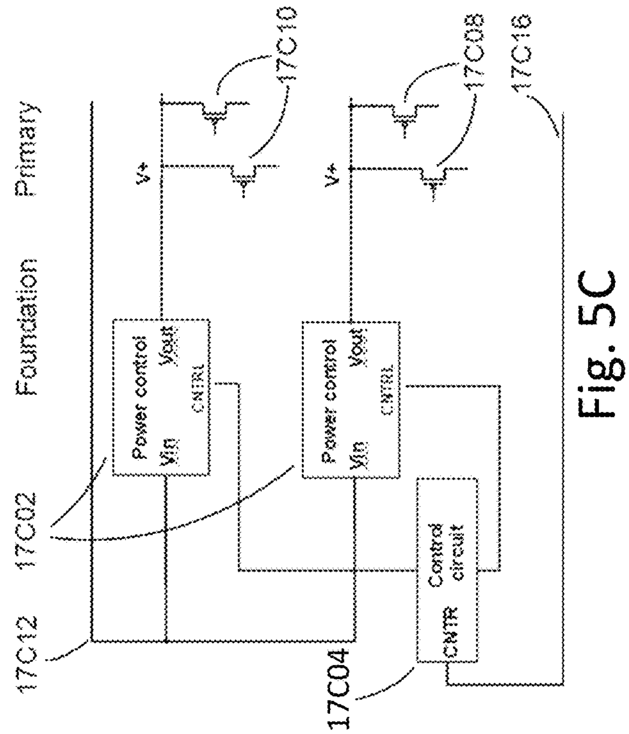
FIG. 5C is an exemplary drawing illustration of power control circuits.

FIG. 5C illustrates an alternative circuit function that may fit well in the "Foundation." In many IC designs it may be desired to integrate power control to reduce either voltage to sections of the device or to substantially totally power off these sections when those sections may not be needed or in an almost 'sleep' mode. In general such power control may be best done with higher voltage transistors. Accordingly a power control circuit cell 17C02 may be constructed in the Foundation. Such power control circuit cell 17C02 may have its own higher voltage supply and control or regulate supply voltage for sections 17C10 and 17C08 in the "Primary" device. The control may come from the primary device 17C16 and be managed by control circuit 17C04 in the Foundation.

Figure 6:
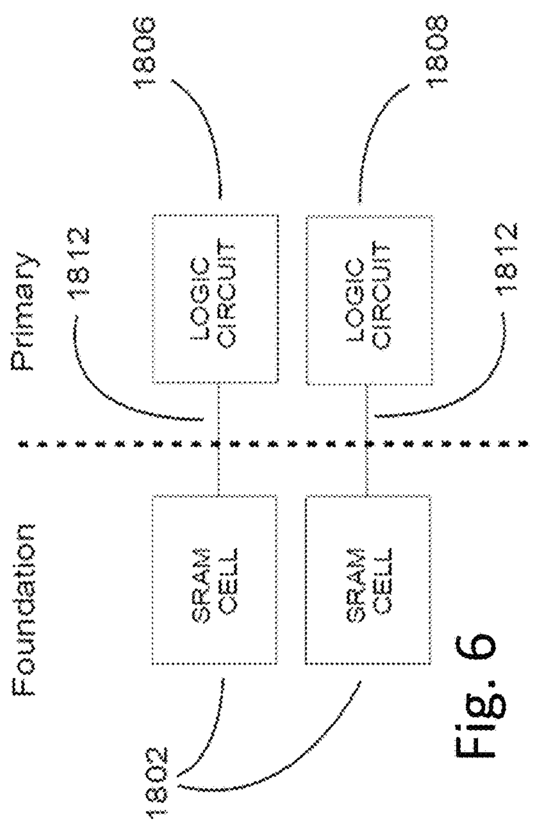
FIG. 6 is an exemplary drawing illustration of an underlying SRAM.

In another alternative the foundation substrate wafer 1402 could additionally carry SRAM cells as illustrated in FIG. 6. The SRAM cells 1802 pre-fabricated on the underlying substrate wafer 1402 could be connected 1812 to the primary logic circuit 1806, 1808 built on transferred silicon layer 1404. As mentioned before, the layers built on transferred silicon layer 1404 could be aligned to the pre-fabricated structure on the underlying substrate wafer 1402 so that the logic cells could be properly connected to the underlying RAM cells.

Figure 7A:
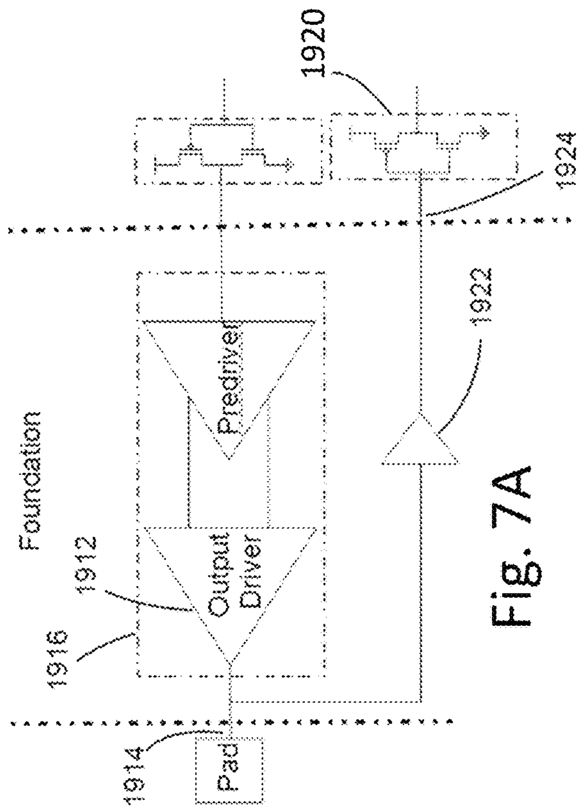
FIG. 7A is an exemplary drawing illustration of an underlying I/O.

FIG. 7A is a drawing illustration of an underlying I/O. The foundation wafer 1402 could also be preprocessed to carry the I/O circuits or part of it, such as the relatively large transistors of the output drive 1912. Additionally TSV in the foundation could be used to bring the I/O connection 1914 all the way to the back side of the foundation.

Figure 7B:
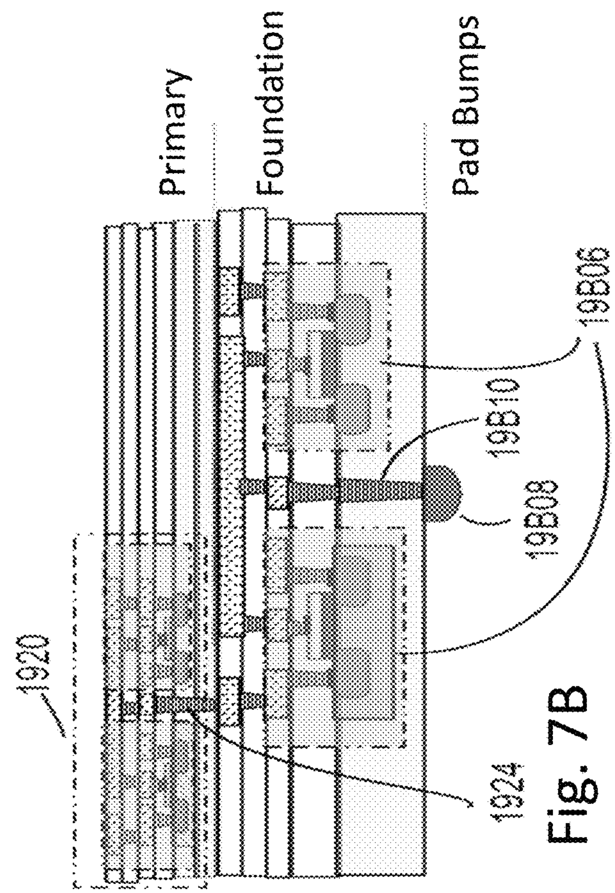
FIG. 7B is an exemplary drawing illustration of side "cut"

FIG. 7B is a drawing illustration of a side "cut" of an integrated device according to an embodiment of the present invention. The Output Driver may be illustrated by PMOS and NMOS output transistors 19B06 coupled through TSV 19B10 to connect to a backside pad or pad bump 19B08. The connection material used in the foundation wafer 1402 can be selected to withstand the temperature of the following process constructing the full device on transferred silicon layer 1404 as illustrated in FIG. 1A—802, 804, 806, 807, 810, 812, such as tungsten. The foundation could also carry the input protection circuit 1916 connecting the pad or pad bump 19B08 to the primary silicon circuitry, such as input logic 1920, in the primary circuits or buffer 1922.

An additional embodiment may use TSVs in the foundation such as TSV 19B10 to connect between wafers to form 3D Integrated Systems. In general each TSV may take a relatively large area, typically a few square microns. When the need is for many TSVs, the overall cost of the area for these TSVs might be high if the use of that area for high density transistors is substantially precluded. Pre-processing these TSVs on the donor wafer on a relatively older process line may significantly reduce the effective costs of the 3D TSV connections. The connection 1924 to the primary silicon circuitry, such as input logic 1920, could be then made at the minimum contact size of few tens of square nanometers, which may be two orders of magnitude lower than the few square microns needed by the TSVs. Those of ordinary skill in the art will appreciate that FIG. 7B is for illustration only and is not drawn to scale. Such skilled persons will understand there are many alternative embodiments and component arrangements that could be constructed using the inventive principles shown and that FIG. 7B is not limiting in any way.

Figure 7C:
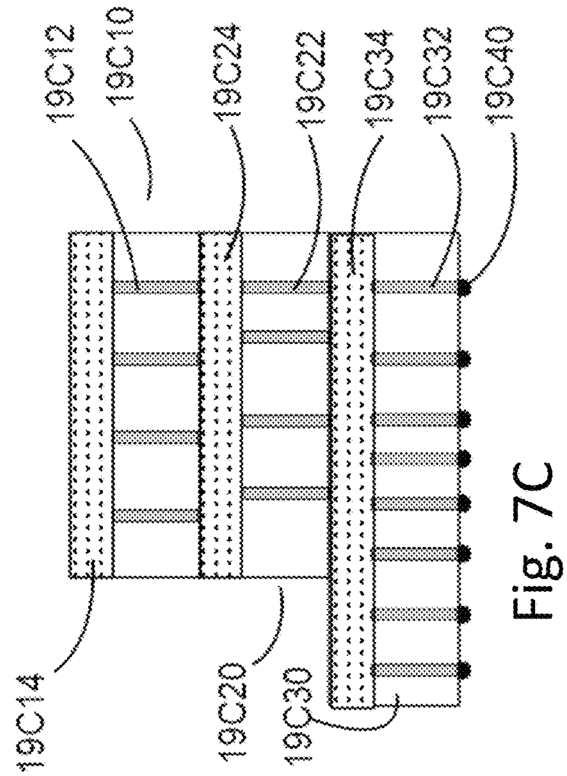
FIG. 7C is an exemplary drawing illustration of a 3D IC system.
Figures 19A, 19B, 19C, 19D, 19E, 19F, 19G:
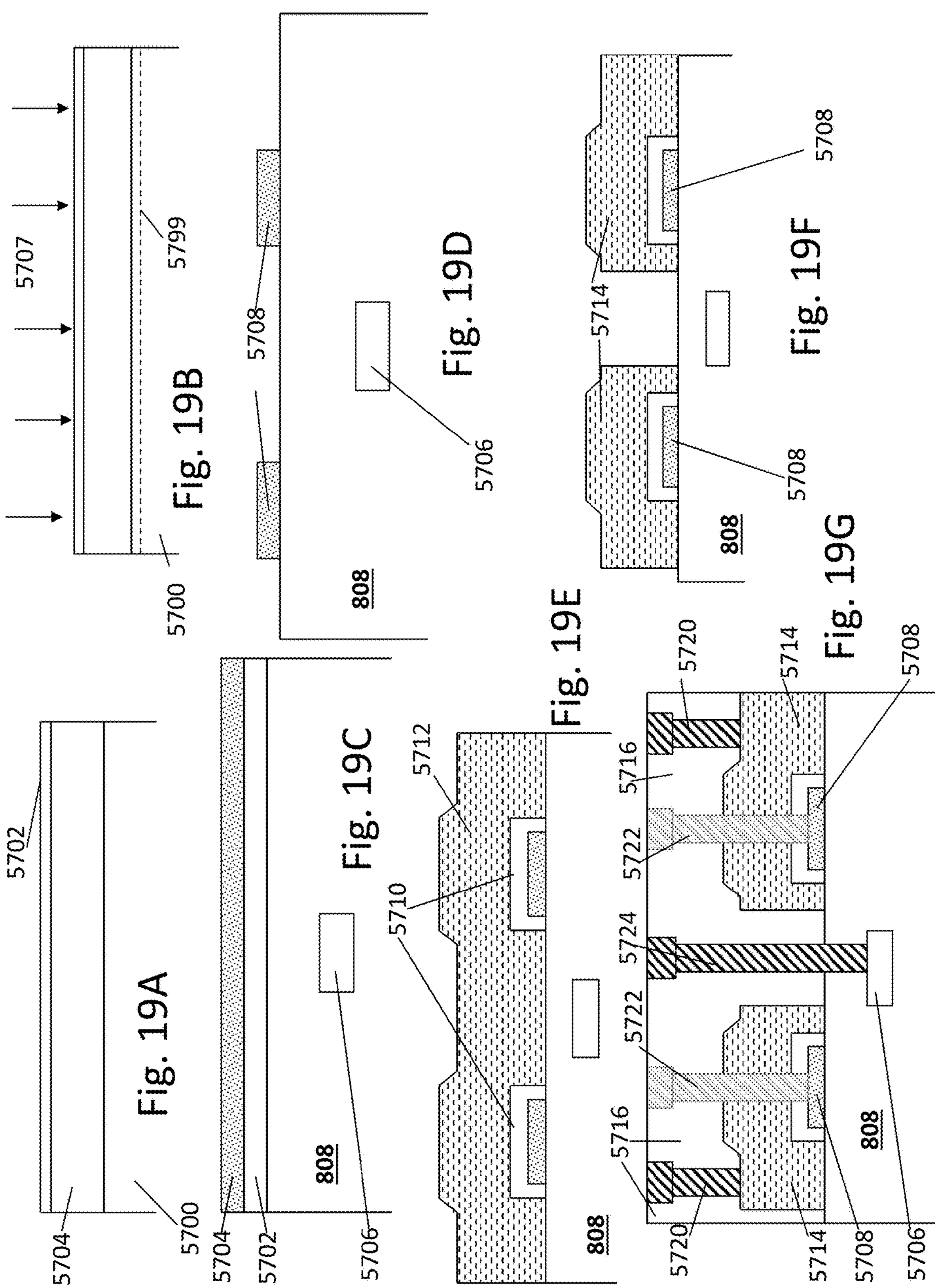
FIG. 19A-FIG. 19G are exemplary drawing illustrations of the formation of a junction-less transistor.

FIG. 19C demonstrates a 3D system including three dice 19C10, 19C20 and 19C30 coupled together with TSVs 19C12, 19C22 and 19C32 similar to TSV 19B10 as described in association with FIG. 7A. The stack of three dice may utilize TSV in the Foundations 19C12, 19C22, and 19C32 for the 3D interconnect which may allow for minimum effect or silicon area loss of the Primary silicon 19C14, 19C24 and 19C34 connected to their respective Foundations with minimum size via connections. The three die stacks may be connected to a PC Board using bumps 19C40 connected to the bottom die TSVs 19C32. Those of ordinary skill in the art will appreciate that FIG. 7C is for illustration only and is not drawn to scale. Such skilled persons will understand there are many alternative embodiments and component arrangements that could be constructed using the inventive principles shown and that FIG. 7C is not limiting in any way. For example, a die stack could be placed in a package using flip chip bonding or the bumps 19C40 could be replaced with bond pads and the part flipped over and bonded in a conventional package with bond wires.

Figures 7D, 7E, 7F, 7G, 7H, 7I:
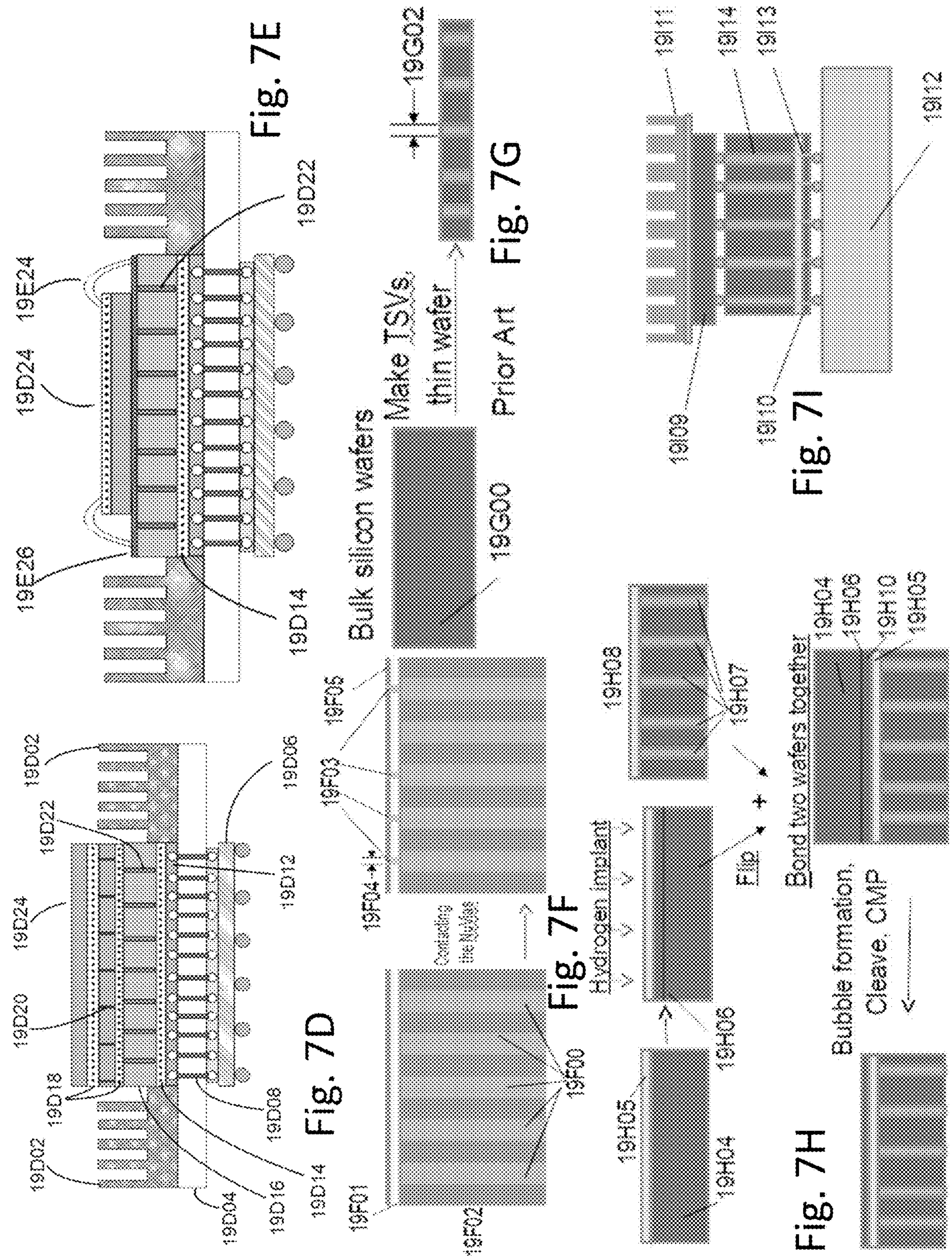
FIG. 7D is an exemplary drawing illustration of a 3D IC processor and DRAM system.
FIG. 7E is an exemplary drawing illustration of a 3D IC processor and DRAM system.
FIG. 7F is an exemplary drawing illustration of a custom SOI wafer used to build through-silicon connections.
FIG. 7G is an exemplary drawing illustration of a prior art method to make through-silicon vias.
FIG. 7H is an exemplary drawing illustration of a process flow for making custom SOI wafers.
FIG. 7I is an exemplary drawing illustration of a processor-DRAM stack.

FIG. 7D illustrates a 3D IC processor and DRAM system. A well known problem in the computing industry is the "memory wall" that may relate to the speed the processor can access the DRAM. The prior art proposed solution was to connect a DRAM stack using TSV directly on top of the processor and use a heat spreader attached to the processor back to remove the processor heat. But in order to do so, a special via needs to go "through DRAM" so that the processor I/Os and power could be connected. Having many processor-related 'through-DRAM vias" may lead to a few severe potential disadvantages. First, it may reduce the usable silicon area of the DRAM by a few percent. Second, it may increase the power overhead by a few percent. Third, it may require that the DRAM design be coordinated with the processor design which may be very commercially challenging. The embodiment of FIG. 7D illustrates one solution to mitigate the above mentioned disadvantages by having a foundation with TSVs as illustrated in FIGS. 7B and 19C. The use of the foundation and primary structure may enable the connections of the processor without going through the DRAM.

In FIG. 7D the processor I/Os and power may be coupled from the face-down microprocessor active area 19D14—the primary layer, by vias 19D08 through heat spreader substrate 19D04 to an interposer 19D06. Heat spreader 19D12, heat spreader substrate 19D04, and heat sink 19D02 may be used to spread the heat generated on the microprocessor active area 19D14. TSVs 19D22 through the Foundation 19D16 may be used for the connection of the DRAM stack 19D24. The DRAM stack may include multiple thinned DRAM chips 19D18 interconnected by TSV 19D20. Accordingly the DRAM stack may not need to pass through the processor I/O and power planes and could be designed and produced independent of the processor design and layout. The thinned DRAM chip 19D18 substantially closest to the Foundation 19D16 may be designed to connect to the Foundation TSVs 19D22, or a separate ReDistribution Layer (or RDL, not shown) may be added in between, or the Foundation 19D16 could serve that function with preprocessed high temperature interconnect layers, such as Tungsten, as described previously. And the processor's active area may not be compromised by having TSVs through it as those are done in the Foundation 19D16.

Alternatively the Foundation TSVs 19D22 could be used to pass the processor I/O and power to the heat spreader substrate 19D04 and to the interposer 19D06 while the DRAM stack would be coupled directly to the microprocessor active area 19D14. Persons of ordinary skill in the art will appreciate that many more combinations are possible within the scope of the disclosed embodiments illustrating the invention.

FIG. 7E illustrates another embodiment of the present invention wherein the DRAM stack 19D24 may be coupled by wire bonds 19E24 to an RDL (ReDistribution Layer) 19E26 that may couple the DRAM to the Foundation vias 19D22, and thus may couple them to the face-down microprocessor active area 19D14.

In yet another embodiment, custom SOI wafers may be used where NuVias 19F00 may be processed by the wafer supplier. NuVias 19F00 may be conventional TSVs that may be 1 micron or larger in diameter and may be preprocessed by an SOI wafer vendor. This is illustrated in FIG. 7F with handle wafer 19F02 and Buried Oxide (BOX) 19F01. The handle wafer 19F02 may typically be many hundreds of microns thick, and the BOX 19F01 may typically be a few hundred nanometers thick. The Integrated Device Manufacturer (IDM) or foundry may then process NuContacts 19F03 to connect to the NuVias 19F00. NuContacts may be conventionally dimensioned contacts etched through the thin silicon 19F05 and the BOX 19F01 of the SOI and filled with metal. The NuContact diameter DNuContact 19F04, in FIG. 7F may then be processed having diameters in the tens of nanometer range. The prior art of construction with bulk silicon wafers 19G00 as illustrated in FIG. 7G typically may have a TSV diameter, DTSV_prior_art 19G02, in the micron range. The reduced dimension of NuContact DNuContact 19F04 in FIG. 7F may have implications for semiconductor designers. The use ofNuContacts may provide reduced die size penalty of through-silicon connections, reduced handling of very thin silicon wafers, and reduced design complexity. The arrangement of TSVs in custom SOI wafers can be based on a high-volume integrated device manufacturer (IDM) or foundry's request, or may be based on a commonly agreed industry standard.

A process flow as illustrated in FIG. 7H may be utilized to manufacture these custom SOI wafers. Such a flow may be used by a wafer supplier. A silicon donor wafer 19H04 may be taken and its surface 19H05 may be oxidized. An atomic species, such as, for example, hydrogen, may then be implanted at a certain depth 19H06. Oxide-to-oxide bonding as described in other embodiments may then be used to bond this wafer with an acceptor wafer 19H08 having pre-processed NuVias 19H07. The NuVias 19H07 may be constructed with a conductive material, such as tungsten or doped silicon, which can withstand high-temperature processing. An insulating barrier, such as, for example, silicon oxide, may be utilized to electrically isolate the NuVias 19H07 from the silicon of the acceptor wafer 19H08. Alternatively, the wafer supplier may construct NuVias 19H07 with silicon oxide. The integrated device manufacturer or foundry may etch out the silicon oxide after the high-temperature (more than about 400° C.) transistor fabrication may be complete and may replace this oxide with a metal such as copper or aluminum. This process may allow a low-melting point, but highly conductive metal, such as, for example, copper or aluminum to be used. Following the bonding, a portion 19H10 of the silicon donor wafer 19H04 may be cleaved at 19H06 and then chemically mechanically polished as described in other embodiments.

Figure 7J:
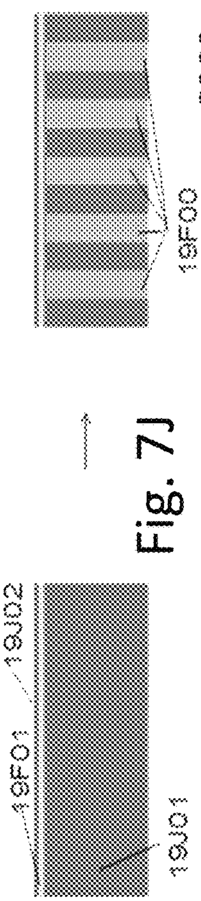
FIG. 7J is an exemplary drawing illustration of a process flow for making custom SOI wafers.

FIG. 7J depicts another technique to manufacture custom SOI wafers. A standard SOI wafer with substrate 19J01, BOX 19F01, and top silicon layer 19J02 may be taken and NuVias 19F00 may be formed from the back-side up to the oxide layer. This technique might have a thicker BOX 19F01 than a standard SOI process.

FIG. 7I depicts how a custom SOI wafer may be used for 3D stacking of a processor 19109 and a DRAM 19110. In this configuration, a processor's power distribution and I/O connections may pass from the substrate 19112, go through the DRAM 19110 and then connect onto the processor 19109. The above described technique in FIG. 7F may result in a small contact area on the DRAM active silicon, which may be very convenient for this processor-DRAM stacking application. The transistor area lost on the DRAM die due to the through-silicon connection 19113 and 19114 may be very small due to the tens of nanometer diameter of NuContact 19113 in the active DRAM silicon. It may be difficult to design a DRAM when large areas in its center may be blocked by large through-silicon connections. Having small size through-silicon connections may help tackle this issue. Persons of ordinary skill in the art will appreciate that this technique may be applied to building processor-SRAM stacks, processor-flash memory stacks, processor-graphics-memory stacks, any combination of the above, and any other combination of related integrated circuits such as, for example, SRAM-based programmable logic devices and their associated configuration ROM/PROM/EPROM/EEPROM devices, ASICs and power regulators, microcontrollers and analog functions, etc. Additionally, the silicon on insulator (SOI) may be a material such as polysilicon, GaAs, GaN, Ge, etc. on an insulator. Such skilled persons will appreciate that the applications of NuVia and NuContact technology are extremely general and the scope of the illustrated embodiments of the invention is to be limited only by the appended claims.

Figure 8:
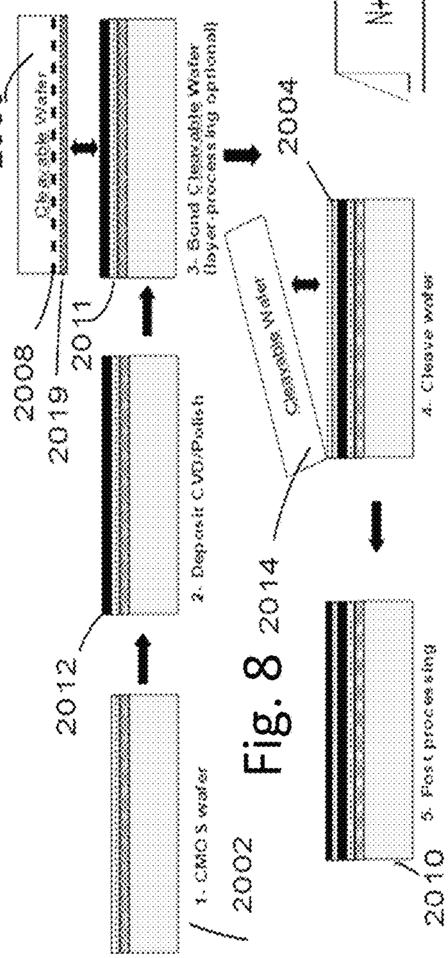
FIG. 8 is an exemplary drawing illustration of a layer transfer process flow.

FIG. 8 is a drawing illustration of the second layer transfer process flow. The primary processed wafer 2002 may include all the prior layers—814, 802, 804, 806, and 807. Layer 2011 may include metal interconnect for said prior layers. An oxide layer 2012 may then be deposited on top of the wafer 2002 and then be polished for better planarization and surface preparation. A donor wafer 2006 (or cleavable wafer as labeled in the drawing) may be then brought in to be bonded to 2002. The donor wafer 2006 may be preprocessed to include the semiconductor layers 2019 which may be later used to construct the top layer of programming transistors 810 as an alternative to the TFT transistors. The donor wafer 2006 may also be prepared for "SmartCut" by ion implant of an atomic species, such as H+, at the desired depth to prepare the SmartCut line 2008. After bonding the two wafers a SmartCut step may be performed to pull out the top portion 2014 of the donor wafer 2006 along the ion-cut layer/plane 2008. This donor wafer may now also be processed and reused for more layer transfers. The result may be a 3D wafer 2010 which may include wafer 2002 with an added transferred layer 2004 of single crystal silicon pre-processed to carry additional semiconductor layers. The transferred layer 2004 could be quite thin at the range of about 10-200 nm. Utilizing "SmartCut" layer transfer may provide single crystal semiconductors layer on top of a pre-processed wafer without heating the pre-processed wafer to more than 400° C.

There may be a few alternative methods to construct the top transistors precisely aligned to the underlying pre-fabricated layers such as pre-processed wafer or layer 808, utilizing "SmartCut" layer transfer and not exceeding the temperature limit, typically about 400° C., of the underlying pre-fabricated structure, which may include low melting temperature metals or other construction materials such as, for example, aluminum or copper. As the layer transfer may be less than about 200 nm thick, then the transistors defined on it could be aligned precisely to the top metal layer of the pre-processed wafer or layer 808 as may be needed and those transistors may have state of the art layer to layer misalignment capability, for example, less than about 40 nm misalignment or less than about 4 nm misalignment, as well as through layer via, or layer to layer metal connection, diameters of less than about 50 nm, or even less than about 20 nm. The thinner the transferred layer, the smaller the through layer via diameter obtainable, due to the potential limitations of manufacturable via aspect ratios. The transferred layer may be, for example, less than about 2 microns thick, less than about 1 micron thick, less than about 0.4 microns thick, less than about 200 nm thick, or less than about 100 nm thick.

One alternative method may be to have a thin layer transfer of single crystal silicon which will be used for epitaxial Ge crystal growth using the transferred layer as the seed for the germanium. Another alternative method may be to use the thin layer transfer of mono-crystalline silicon for epitaxial growth of GexSil-x. The percent Ge in Silicon of such layer may be determined by the transistor specifications of the circuitry. Prior art have presented approaches whereby the base silicon may be used to crystallize the germanium on top of the oxide by using holes in the oxide to drive crystal or lattice seeding from the underlying silicon crystal. However, it may be very hard to do such on top of multiple interconnection layers. By using layer transfer a mono-crystalline layer of silicon crystal may be constructed on top, allowing a relatively easy process to seed and crystallize an overlying germanium layer. Amorphous germanium could be conformally deposited by CVD at about 300° C. and a pattern may be aligned to the underlying layer, such as the pre-processed wafer or layer 808, and then encapsulated by a low temperature oxide. A short microsecond-duration heat pulse may melt the Ge layer while keeping the underlying structure below about 400° C. The Ge/Si interface may start the crystal or lattice epitaxial growth to crystallize the germanium or GexSil-x layer. Then implants may be made to form Ge transistors and activated by laser pulses without damaging the underlying structure taking advantage of the low activation temperature of dopants in germanium.

Figure 10A:
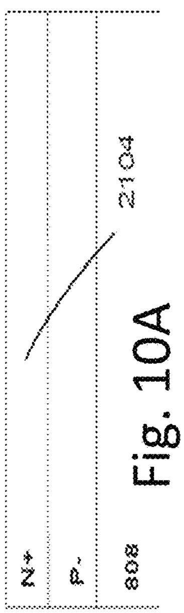
FIG. 10A-10H are exemplary drawing illustrations of formation of top planar transistors.
Figure 10B:
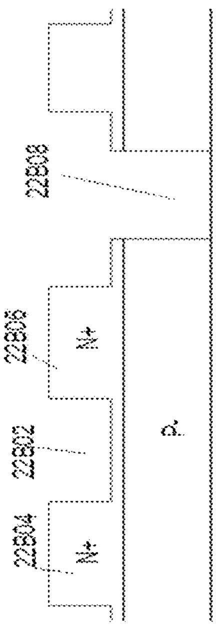
Figure 10C:
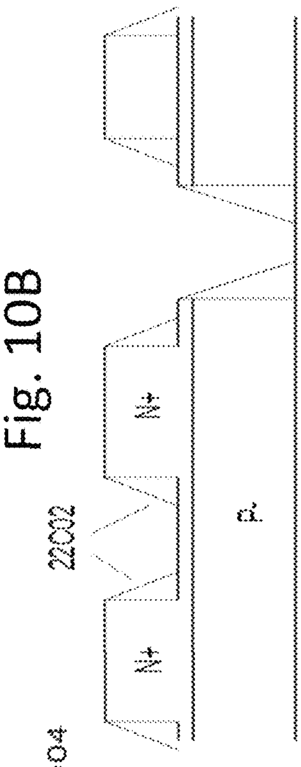
Figure 10E:
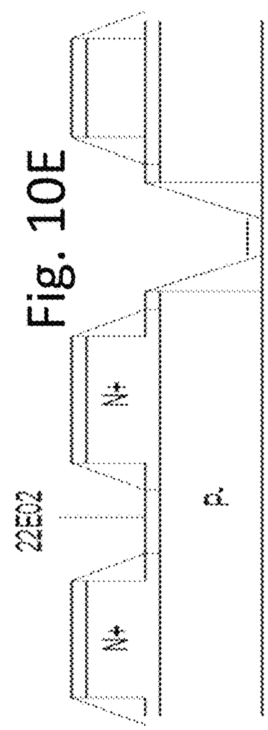
Figure 10D:
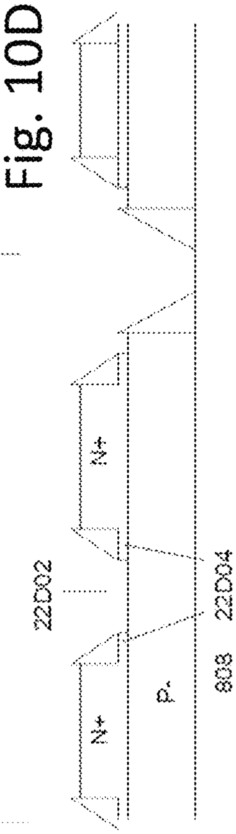

FIG. 10A-10H are drawing illustrations of the formation of planar top source extension transistors. FIG. 10A illustrates the layer transferred on top of preprocessed wafer or layer 808 after the smart cut wherein the N+ 2104 may be on top. Then the top transistor source 22B04 and drain 22B06 may be defined by etching away the N+ from the region designated for gates 22B02, leaving a thin more lightly doped N+ layer for the future source and drain extensions, and the isolation region 22B08 between transistors. Utilizing an additional masking layer, the isolation region 22B08 may be defined by an etch substantially all the way to the top of pre-processed wafer or layer 808 to provide substantially full isolation between transistors or groups of transistors. Etching away the N+ layer between transistors may be helpful as the N+ layer is conducting. This step may be aligned to the top of the pre-processed wafer or layer 808 so that the formed transistors could be properly connected to metal layers of the pre-processed wafer or layer 808. Then a highly conformal Low-Temperature Oxide 22C02 (or Oxide/Nitride stack) may be deposited and etched resulting in the structure illustrated in FIG. 10C. FIG. 10D illustrates the structure following a self-aligned etch step in preparation for gate formation 22D02, thereby forming the source and drain extensions 22D04. FIG. 10E illustrates the structure following a low temperature microwave oxidation technique, such as, for example, the TEL SPA (Tokyo Electron Limited Slot Plane Antenna) oxygen radical plasma, that may grow or deposit a low temperature Gate Dielectric 22E02 to serve as the MOSFET gate oxide, or an atomic layer deposition (ALD) technique may be utilized. Alternatively, the gate structure may be formed by a high k metal gate process flow as follows. Following an industry standard HF/SC1/SC2 clean protocol to create an atomically smooth surface, a high-k gate dielectric 22E02 may be deposited. The semiconductor industry has chosen Hafnium-based dielectrics as the leading material of choice to replace SiO2 and Silicon oxynitride. The Hafnium-based family of dielectrics may include hafnium oxide and hafnium silicate/hafnium silicon oxynitride. Hafnium oxide, HfO2, may have a dielectric constant twice as much as that of hafnium silicate/hafnium silicon oxynitride (HfSiO/HfSiON k~15). The choice of the metal may affect proper device performance. A metal replacing N+ poly as the gate electrode may need to have a work function of about 4.2 eV for the device to operate properly and at the right threshold voltage. Alternatively, a metal replacing P+ poly as the gate electrode may need to have a work function of about 5.2 eV to operate properly. The TiAl and TiAlN based family of metals, for example, could be used to tune the work function of the metal from about 4.2 eV to about 5.2 eV.

Figures 10F, 10G, 10H, 11A, 11B, 11C:
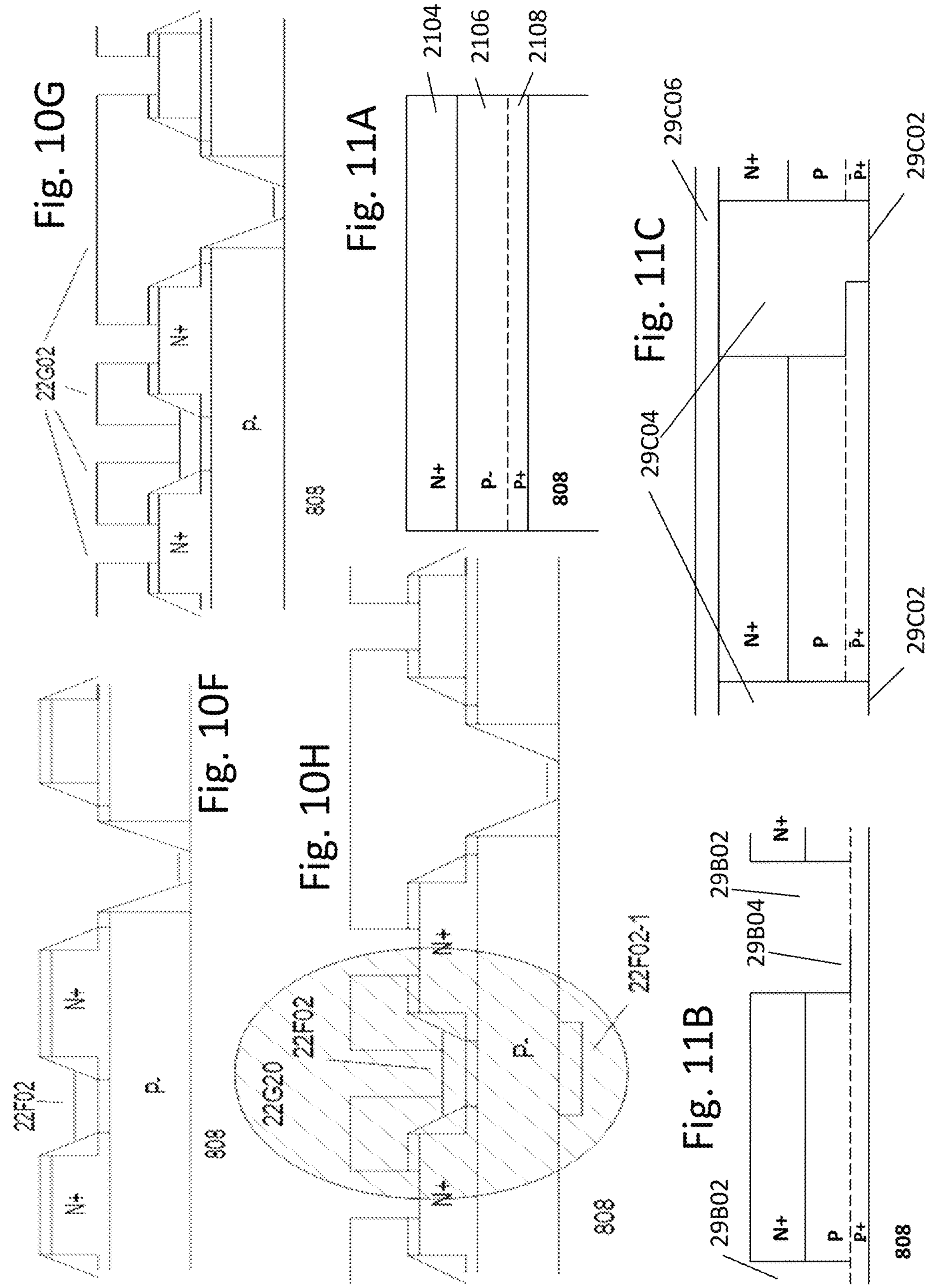
FIG. 11A-11G are exemplary drawing illustrations of formations of top planar transistors.

FIG. 10F illustrates the structure following deposition, mask, and etch of metal gate 22F02. For example, to improve transistor performance, a targeted stress layer to induce a higher channel strain may be employed. A tensile nitride layer may be deposited at low temperature to increase channel stress for the NMOS devices illustrated in FIG. 10. A PMOS transistor may be constructed via the above process flow by changing the initial P− wafer or epi-formed P− on N+ layer 2104 to an N− wafer or an N− on P+ epi layer, and the N+ layer 2104 to a P+ layer. Then a compressively stressed nitride film would be deposited post metal gate formation to improve the PMOS transistor performance.

Finally a thick oxide 22G02 may be deposited and contact openings may be masked and etched preparing the transistors to be connected as illustrated in FIG. 10G. This thick or any low-temperature oxide in this document may be deposited via Chemical Vapor Deposition (CVD), Physical Vapor Deposition (PVD), or Plasma Enhanced Chemical Vapor Deposition (PECVD) techniques. This flow may enable the formation of mono-crystalline top MOS transistors that could be connected to the underlying multi-metal layer semiconductor device without exposing the underlying devices and interconnects metals to high temperature. These transistors could be used as programming transistors of the Antifuse on second antifuse layer 807, coupled to the pre-processed wafer or layer 808 to create a monolithic 3D circuit stack, or for other functions in a 3D integrated circuit. These transistors can be considered "planar transistors,"

meaning that the current flow in the transistor channel is substantially in the horizontal direction, and may be substantially between drain and source. The horizontal direction may be defined as the direction being parallel to the largest area of surface ('face') of the substrate or wafer that the transistor may be built or layer transferred onto. These transistors, as well as others herein this document wherein the current flow in the transistor channel is substantially in the horizontal direction, can also be referred to as horizontal transistors, horizontally oriented transistors, or lateral transistors. In some embodiments of the invention the horizontal transistor may be constructed in a two-dimensional plane where the source and the drain may be within the same monocrystalline layer. Additionally, the gates of transistors described herein that include gates on 2 or more sides of the transistor channel may be referred to as side gates. A gate may be an electrode that regulates the flow of current in a transistor, for example, a metal oxide semiconductor transistor. An additional advantage of this flow is that the SmartCut H+, or other atomic species, implant step may be done prior to the formation of the MOS transistor gates avoiding potential damage to the gate function. If needed the top layer of the pre-processed wafer or layer 808 could include a back-gate 22F02-1 whereby gate 22F02 may be aligned to be directly on top of the back-gate 22F02-1 as illustrated in FIG. 10H. The back gate 22F02-1 may be formed from the top metal layer in the pre-processed wafer or layer 808 and may utilize the oxide layer deposited on top of the metal layer for the wafer bonding (not shown) to act as a gate oxide for the back gate.

According to some embodiments of the invention, during a normal fabrication of the device layers as illustrated in FIG. 1, every new layer may be aligned to the underlying layers using prior alignment marks. Sometimes the alignment marks of one layer could be used for the alignment of multiple layers on top of it and sometimes the new layer may also have alignment marks to be used for the alignment of additional layers put on top of it in the following fabrication step. So layers of logic fabric/first antifuse layer 804 may be aligned to layers of 802, layers of interconnection layer 806 may be aligned to layers of logic fabric/first antifuse layer 804 and so forth. An advantage of the described process flow may be that the layer transferred may be thin enough so that during the following patterning step as described in connection to FIG. 10B, the transferred layer may be aligned to the alignment marks of the pre-processed wafer or layer 808 or those of underneath layers such as layers 806, 804, 802, or other layers, to form the 3D IC. Therefore the back-gate 22F02-1 which may be part of the top metal layer of the pre-processed wafer or layer 808 would be precisely underneath gate 22F02 as all the layers may be patterned as being aligned to each other. In this context alignment precision may be highly dependent on the equipment used for the patterning steps. For processes of 45 nm and below, overlay alignment of better than 5 nm may be usually needed. The alignment requirement may only get tighter with scaling where modern steppers now can do better than about 2 nm. This alignment requirement can be orders of magnitude better than what could be achieved for TSV based 3D IC systems as described below in relation to FIG. 12 where even 0.5 micron overlay alignment may be extremely hard to achieve. Connection between top-gate and back-gate would be made through a top layer via, or TLV. This may allow further reduction of leakage as both the gate 22F02 and the back-gate 22F02-1 could be connected together to better shut off the transistor 22G20. As well, one could create a sleep mode, a normal speed mode, and fast speed mode by dynamically changing the threshold voltage of the top gated transistor by independently changing the bias of the back-gate 22F02-1

The term alignment mark in the use herein may be defined as "an image selectively placed within or outside an array for either testing or aligning, or both [ASTM F127-84], also called alignment key and alignment target," as in the SEMATECH dictionary. The alignment mark may, for example, be within a layer, wafer, or substrate of material processing or to be processed, and/or may be on a photomask or photoresist image, or may be a calculated position within, for example, a lithographic wafer stepper's software or memory.

An additional aspect of this technique for forming top transistors may be the size of the via, or TLV, used to connect the top transistors 22G20 to the metal layers in pre-processed wafer and layer 808 underneath. The general rule of thumb may be that the size of a via should be larger than one tenth the thickness of the layer that the via is going through. Since the thickness of the layers in the structures presented in FIG. 12 may be usually more than 50 micron, the TSV used in such structures may be about 10 micron on the side. The thickness of the transferred layer in FIG. 10A may be less than 100 nm and accordingly the vias to connect top transistors 22G20 to the metal layers in pre-processed wafer and layer 808 underneath could have diameters of less than about 10 nm. As the process may be scaled to smaller feature sizes, the thickness of the transferred layer and accordingly the size of the via to connect to the underlying structures could be scaled down. For some advanced processes, the end thickness of the transferred layer could be made below about 10 nm.

Figure 9:
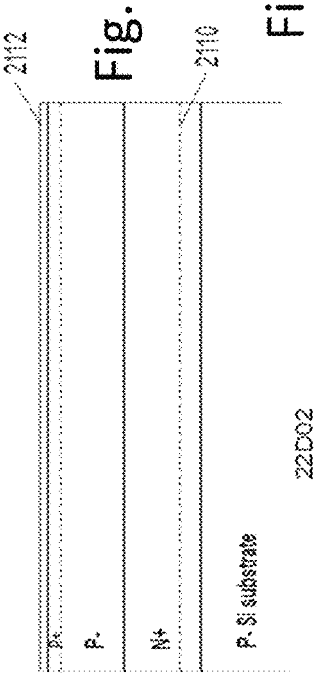
FIG. 9 is an exemplary drawing illustration of a pre-processed wafer ready for a layer transfer.
Figure 11D:
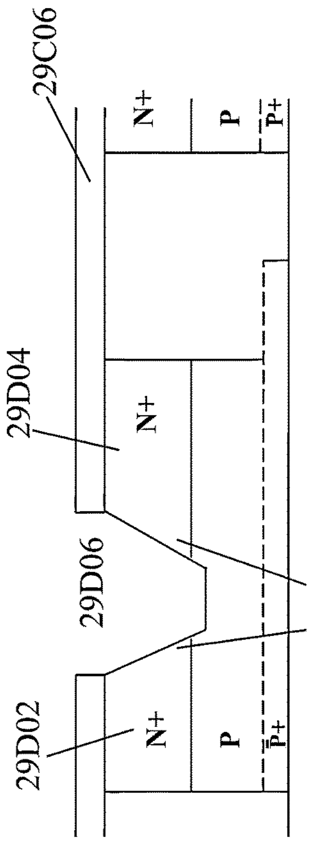
Figure 11E:
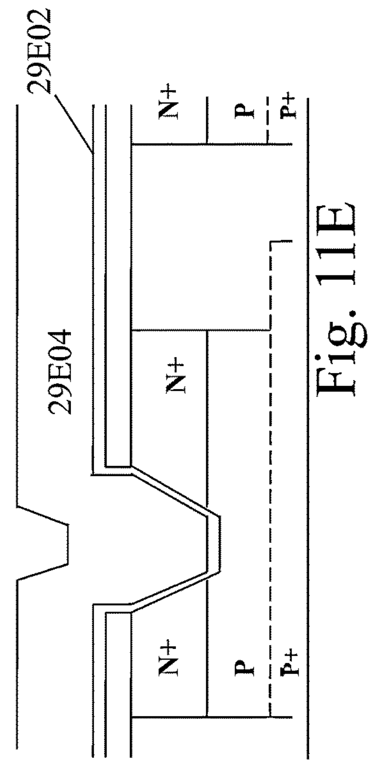

Another alternative for forming the planar top transistors with source and drain extensions may be to process the prepared wafer of FIG. 9 as shown in FIG. 11A-11G. FIG. 11A illustrates the layer transferred on top of pre-processed wafer or layer 808 after the smart cut wherein the N+ 2104 may be on top, the P− 2106, and P+ 2108. The oxide layers used to facilitate the wafer to wafer bond are not shown. Then the substrate P+ source 29B04 contact opening and transistor isolation 29B02 may be masked and etched as shown in FIG. 11B. Utilizing an additional masking layer, the isolation region 29C02 may be defined by etch substantially all the way to the top of the pre-processed wafer or layer 808 to provide substantially full isolation between transistors or groups of transistors in FIG. 11C. Etching away the P+ layer between transistors may be helpful as the P+ layer may be conducting. Then a Low-Temperature Oxide 29C04 may be deposited and chemically mechanically polished. Then a thin polish stop layer 29C06 such as low temperature silicon nitride may be deposited resulting in the structure illustrated in FIG. 11C. Source 29D02, drain 29D04 and self-aligned Gate 29D06 may be defined by masking and etching the thin polish stop layer 29C06 and then a sloped N+ etch as illustrated in FIG. 11D. The sloped (30-90 degrees, 45 is shown) etch or etches may be accomplished with wet chemistry or plasma etching techniques. This process may form angular source and drain extensions 29D08. FIG. 11E illustrates the structure following deposition and densification of a low temperature based Gate Dielectric 29E02, or alternatively a low temperature microwave plasma oxidation of the silicon surfaces, or an atomic layer deposited (ALD) gate dielectric, to serve as the MOSFET gate oxide, and then deposition of a gate material 29E04, such as aluminum or tungsten.

Alternatively, a high-k metal gate (HKMG) structure may be formed as follows. Following an industry standard HF/SC1/SC2 cleaning to create an atomically smooth surface, a high-k gate dielectric 29E02 may be deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal may affect proper device performance. A metal replacing NY poly as the gate electrode may need to have a work function of about 4.2 eV for the device to operate properly and at the right threshold voltage. Alternatively, a metal replacing P+ poly as the gate electrode may need to have a work function of about 5.2 eV to operate properly. The TiAl and TiAlN based family of metals, for example, could be used to tune the work function of the metal from about 4.2 eV to about 5.2 eV.

Figure 11F:
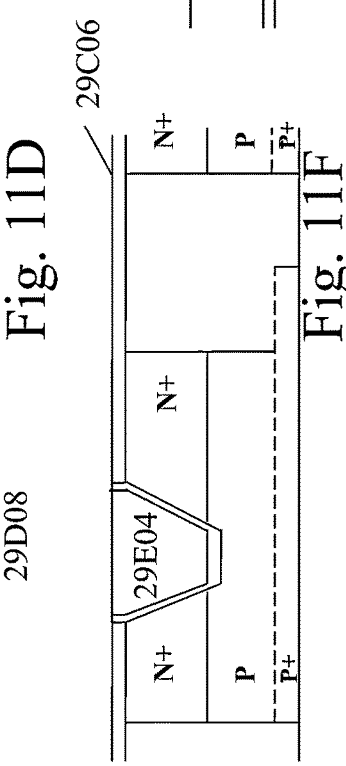

FIG. 11F illustrates the structure following a chemical mechanical polishing of the gate material 29E04, thus forming metal gate 29E04, and utilizing the nitride polish stop layer 29C06. A PMOS transistor could be constructed via the above process flow by changing the initial P− wafer or epi-formed P− on N+ layer 2104 to an N− wafer or an N− on P+ epi layer, and the N+ layer 2104 to a P+ layer. Similarly, layer 2108 may be changed from P+ to N+ if the substrate contact option was used.

Figure 11G:
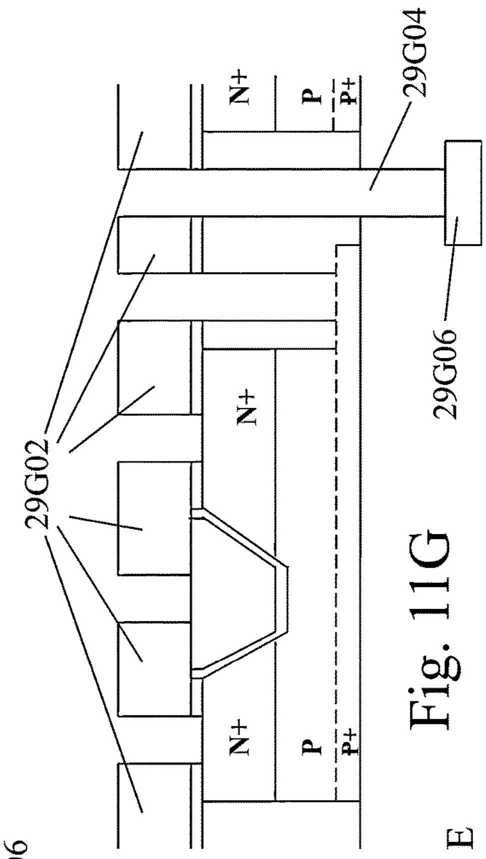

Finally a thick oxide 29G02 may be deposited and contact openings may be masked and etched preparing the transistors to be connected, for example, as illustrated in FIG. 11G. This figure also illustrates the layer transfer silicon via 29G04 masked and etched to provide interconnection of the top transistor wiring to the lower layer 808 interconnect wiring 29G06. This flow may enable the formation of mono-crystalline top MOS transistors that may be connected to the underlying multi-metal layer semiconductor device without exposing the underlying devices and interconnects metals to high temperature. These transistors may be used as programming transistors of the antifuses on second antifuse layer 807, to couple with the pre-processed wafer or layer 808 to form monolithic 3D ICs, or for other functions in a 3D integrated circuit. These transistors can be considered to be "planar transistors". These transistors can also be referred to as horizontal transistors or lateral transistors. An additional illustrated advantage of this flow may be that the SmartCut H+, or other atomic species, implant step may be done prior to the formation of the MOS transistor gates avoiding potential damage to the gate function. Additionally, an accumulation mode (fully depleted) MOSFET transistor may be constructed via the above process flow by changing the initial P− wafer or epi-formed P− on N+ layer 2104 to an N− wafer or an N− epi layer on N+. Additionally, a back gate similar to that shown in FIG. 10H may be utilized.

Another class of devices that may be constructed partly at high temperature before layer transfer to a substrate with metal interconnects and may then be completed at low temperature after a layer transfer may be a junction-less transistor (JLT). For example, in deep sub-micron processes copper metallization may be utilized, so a high temperature would be above about 400° C., whereby a low temperature would be about 400° C. and below. The junction-less transistor structure may avoid the sharply graded junctions that may be needed as silicon technology scales, and may provide the ability to have a thicker gate oxide for an equivalent performance when compared to a traditional MOSFET transistor. The junction-less transistor may also be known as a nanowire transistor without junctions, or gated resistor, or nanowire transistor as described in a paper by Jean-Pierre Colinge, et. al., published in Nature Nanotechnology on Feb. 21, 2010. The junction-less transistors may be constructed whereby the transistor channel is a thin solid piece of evenly and heavily doped single crystal silicon. The doping concentration of the channel may be identical to that of the source and drain. The considerations may include that the nanowire channel be thin and narrow enough to allow for full depletion of the carriers when the device is turned off, and the channel doping be high enough to allow a reasonable current to flow when the device is on. These considerations may lead to tight process variation boundaries for channel thickness, width, and doping for a reasonably obtainable gate work function and gate oxide thickness.

One of the challenges of a junction-less transistor device is turning the channel off with minimal leakage at a zero gate bias. As an embodiment of the invention, to enhance gate control over the transistor channel, the channel may be doped unevenly, whereby the heaviest doping may be closest to the gate or gates and the channel doping may be lighter the farther away from the gate electrode. One example may be where the center of a 2, 3, or 4 gate sided junction-less transistor channel is more lightly doped than the edges towards the gates. This may enable much lower off currents for the same gate work function and control.

The junction-less transistor channel may be constructed with even, graded, or discrete layers of doping. The channel may be constructed with materials other than doped mono-crystalline silicon, such as poly-crystalline silicon, or other semi-conducting, insulating, or conducting material, such as graphene or other graphitic material, and may be in combination with other layers of similar or different material. For example, the center of the channel may include a layer of oxide, or of lightly doped silicon, and the edges towards the gates more heavily doped single crystal silicon. This may enhance the gate control effectiveness for the off state of the junction-less transistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated 90 degrees with respect to the acceptor wafer prior to bonding to facilitate the creation of the P-channel in the <110> silicon plane direction.

Figure 18A:
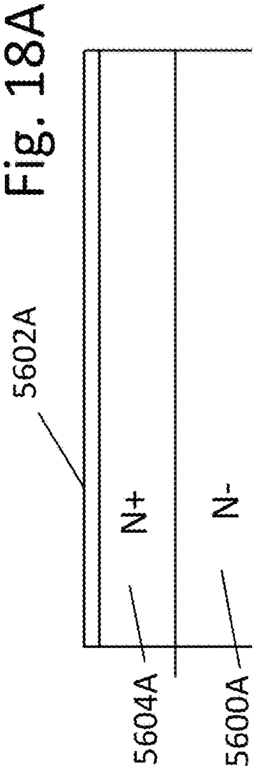
FIG. 18A-FIG. 18K, FIG. 18M are exemplary drawing illustrations of the formation of a junction-less transistor.
Figure 18B:
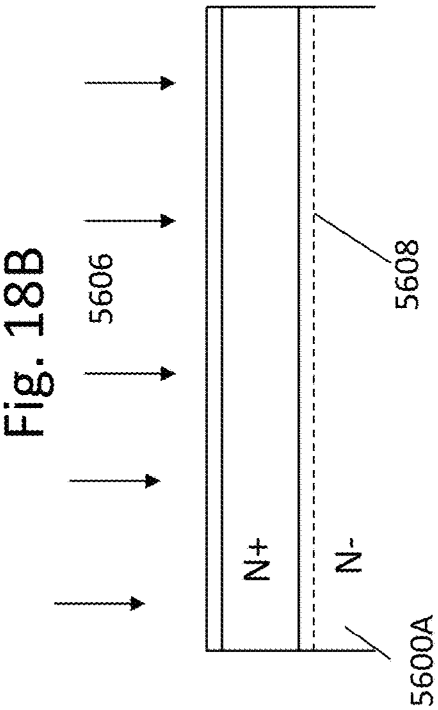
Figure 18C:
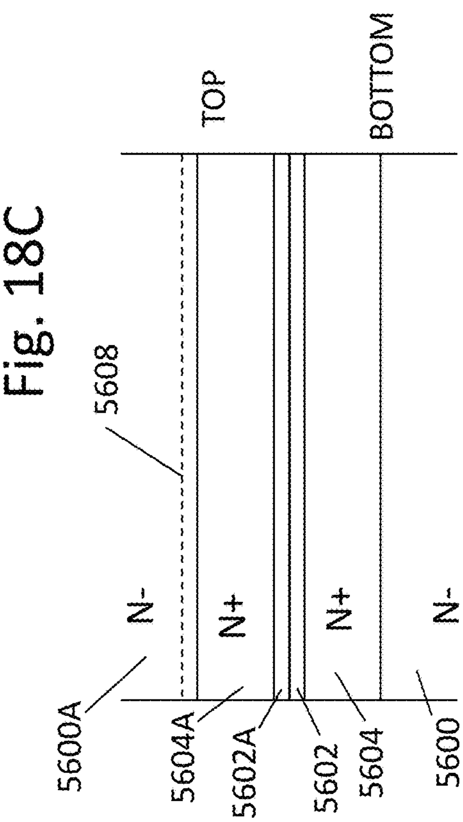
Figure 18D:
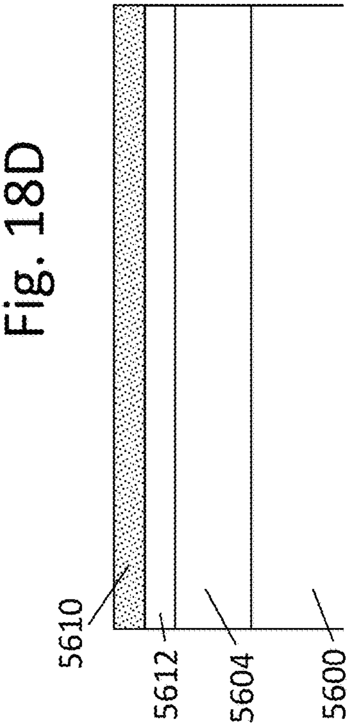

To construct an n-type 4-sided gated junction-less transistor a silicon wafer may be preprocessed to be used for layer transfer as illustrated in FIG. 18A-18G. These processes may be at temperatures above about 400 degrees Centigrade as the layer transfer to the processed substrate with metal interconnects has yet to be done. As illustrated in FIG. 18A, an N− wafer 5600A may be processed to have a layer of N+ 5604A, by implant and activation, by an N+ epitaxial growth, or may be a deposited layer of heavily N+ doped polysilicon. A gate oxide 5602A may be grown before or after the implant, to a thickness about half of the final top-gate oxide thickness. FIG. 18B is a drawing illustration of the pre-processed wafer made ready for a layer transfer by an implant 5606 of an atomic species, such as H+, preparing the "cleaving plane" 5608 in the N− region 5600A of the substrate, and plasma or other surface treatments to prepare the oxide surface for wafer oxide to oxide bonding. Another wafer may be prepared as above without the H+ implant and the two are bonded as illustrated in FIG. 18C, to transfer the pre-processed single crystal N− silicon with N+ layer and half gate oxide, on top of a similarly pre-processed, but not cleave implanted, N− wafer 5600 with N+ layer 5604 and oxide 5602. The top wafer may be cleaved and removed from the bottom wafer. This top wafer may now also be processed and reused for more layer transfers to form the resistor layer. The remaining top wafer N− and N+ layers may be chemically and mechanically polished to a very thin N+ silicon layer 5610 as illustrated in FIG. 18D. This thin N+ silicon layer 5610 may be on the order of 5 to 40 nm thick and will eventually form the junction-less transistor channel, or resistor, that may be gated on four sides. The two 'half' gate oxides 5602, 5602A may now be atomically bonded together to form the gate oxide 5612, which may eventually become the top gate oxide of the junction-less transistor in FIG. 18E. A high temperature anneal may be performed to remove any residual oxide or interface charges.

Alternatively, the wafer that becomes the bottom wafer in FIG. 18C may be constructed wherein the N+ layer 5604 may be formed with heavily doped polysilicon and the half gate oxide 5602 may be deposited or grown prior to layer transfer. The bottom wafer N+ silicon or polysilicon layer 5604 may eventually become the top-gate of the junction-less transistor.

Figure 18E:
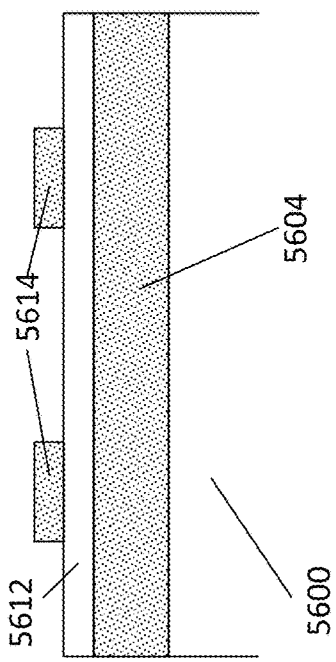
Figure 18F:
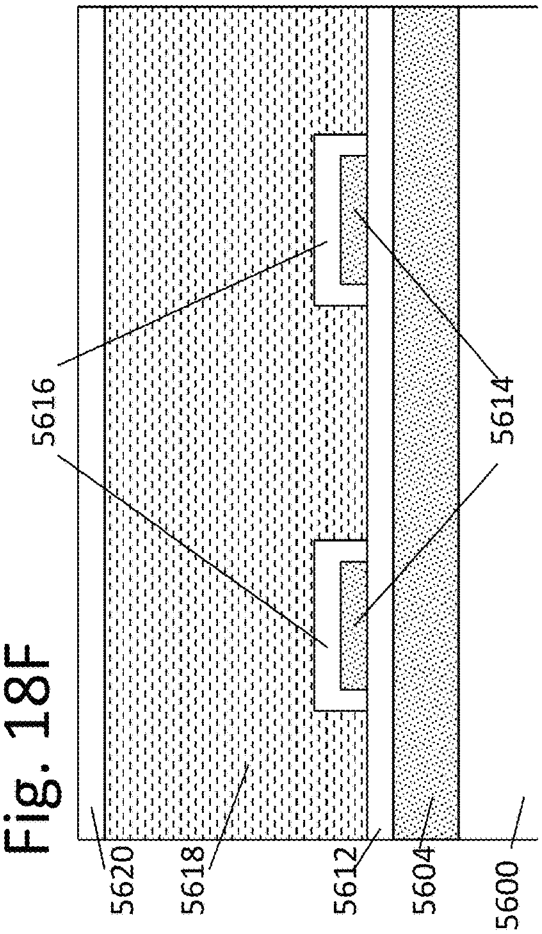
Figure 18G:
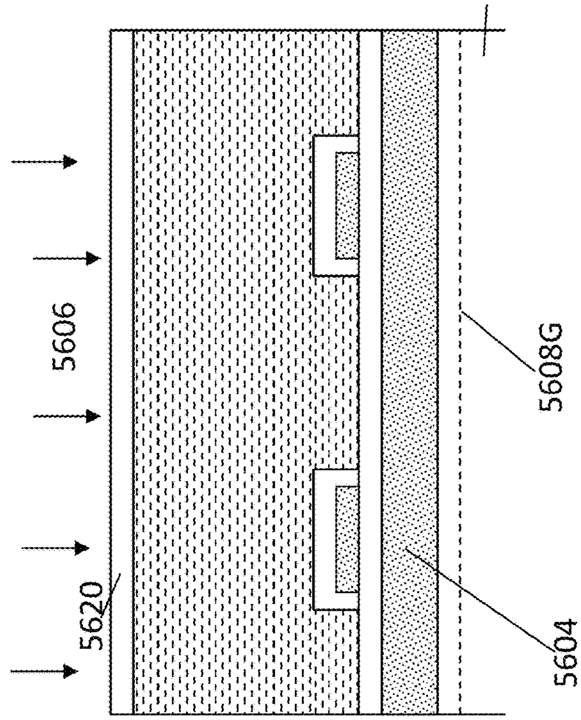
Figure 18H:
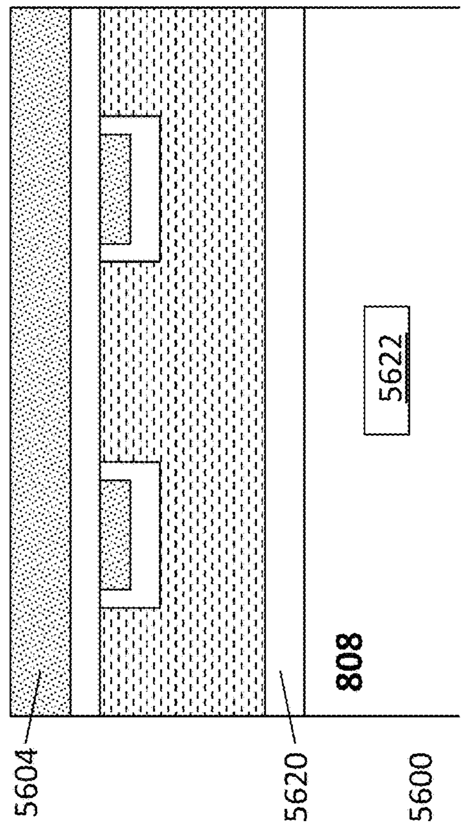

As illustrated in FIG. 18E to FIG. 18G, the wafer may be conventionally processed, at temperatures higher than about 400° C. as necessary, in preparation to layer transfer the junction-less transistor structure to the processed 'house' wafer 808. A thin oxide may be grown to protect the resistor silicon thin N+ silicon layer 5610 top, and then parallel wires, resistors 5614, of repeated pitch of the thin resistor layer may be masked and etched as illustrated in FIG. 18E and then the photoresist is removed. The thin oxide, if present, may be striped in a dilute hydrofluoric acid (HF) solution and a conventional gate oxide 5616 may be grown and polysilicon 5618, doped or undoped, may be deposited as illustrated in FIG. 18F. The polysilicon may be chemically and mechanically polished (CMP'ed) flat and a thin oxide 5620 may be grown or deposited to facilitate a low temperature oxide to oxide wafer bonding in the next step. The polysilicon 5618 may be implanted for additional doping either before or after the CMP. This polysilicon 5618, may eventually become the bottom and side gates of the junction-less transistor. FIG. 18G is a drawing illustration of the wafer being made ready for a layer transfer by an implant 5606 of an atomic species, such as H+, preparing the "cleaving plane" 5608G in the N− region 5600 of the substrate and plasma or other surface treatments to prepare the oxide surface for wafer oxide to oxide bonding. The acceptor wafer 808 with logic transistors and metal interconnects may be prepared for a low temperature oxide to oxide wafer bond with surface treatments of the top oxide and the two are bonded as illustrated in FIG. 18H. The top donor wafer may be cleaved and removed from the bottom acceptor wafer 808 and the top N− substrate may be removed by CMP (chemical mechanical polish). A metal interconnect strip 5622 in the house 808 may be also illustrated in FIG. 18H.

Figures 18I, 18J, 18K, 18M:
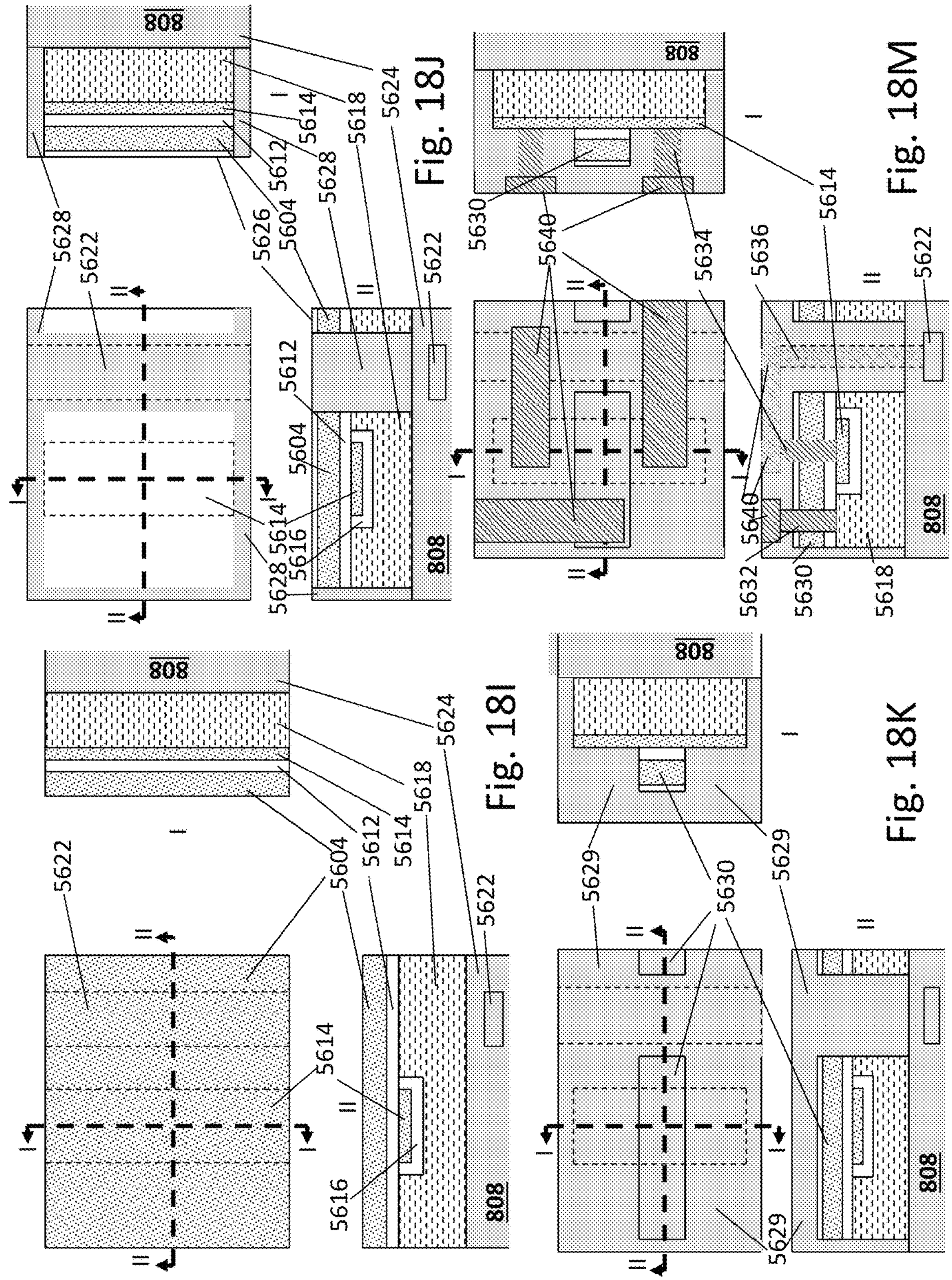

FIG. 18I is a top view of a wafer at the same step as FIG. 18H with two cross-sectional views I and II. The N+ layer 5604, which may eventually form the top gate of the resistor, and the top gate oxide 5612 may gate one side of the resistor 5614 line, and the bottom and side gate oxide 5616 with the polysilicon bottom and side gates 5618 may gate the other three sides of the resistor 5614 line. The logic house wafer 808 may have a top oxide layer 5624 that may also encase the top metal interconnect strip 5622, to an extent shown as dotted lines in the top view.

In FIG. 18J, a polish stop layer 5626 of a material such as oxide and silicon nitride may be deposited on the top surface of the wafer, and isolation openings 5628 may be masked and etched to the depth of the house 808 oxide layer 5624 to fully isolate transistors. The isolation openings 5628 may be filled with a low temperature gap fill oxide, and chemically and mechanically polished (CMP'ed) flat. The top gate 5630 may be masked and etched as illustrated in FIG. 18K, and then the etched openings 5629 may be filled with a low temperature gap fill oxide deposition, and chemically and mechanically (CMP'ed) polished flat, then an additional oxide layer may be deposited to enable interconnect metal isolation.

The contacts may be masked and etched. The gate contact 5632 may be masked and etched, so that the contact etches through the top gate 5630 layer, and during the metal opening mask and etch process the gate oxide may be etched and the top gate 5630 and bottom gate 5618 gates may be connected together. The contacts 5634 to the two terminals of the resistor 5614 may be masked and etched. And then the through vias 5636 to the house wafer 808 and metal interconnect strip 5622 may be masked and etched.

As illustrated in FIG. 18M, the metal lines 5640 may be mask defined and etched, filled with barrier metals and copper interconnect, and CMP'ed in a normal metal interconnect scheme, thereby completing the contact via 5632 simultaneous coupling to the top gate 5630 and bottom gate 5618 gates, the two terminal contacts 5634 of the resistor 5614, and the through via to the house wafer 808 metal interconnect strip 5622. This flow may enable the formation of a mono-crystalline 4-sided gated junction-less transistor that could be connected to the underlying multi-metal layer semiconductor device without exposing the underlying devices to high temperature.

Alternatively, as illustrated in FIG. 36A to 36F and FIG. 36H to 36J, an n-channel 4-sided gated junction-less transistor (JLT) may be constructed that is suitable for 3D IC manufacturing. 4-sided gated JLTs can also be referred to as gate-all around JLTs or silicon nano-wire JLTs.

Figure 36A:
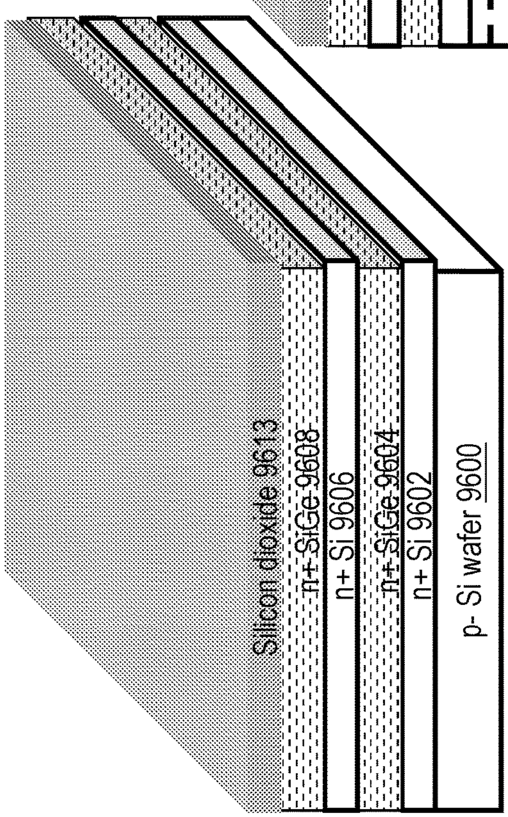
FIG. 36A-FIG. 36J are exemplary drawing illustrations of the formation of a junction-less transistor.

As illustrated in FIG. 36A, a P− (shown) or N− substrate donor wafer 9600 may be processed to include wafer sized layers of N+ doped silicon 9602 and 9606, and wafer sized layers of n+ SiGe 9604 and 9608. Layers 9602, 9604, 9606, and 9608 may be grown epitaxially and are carefully engineered in terms of thickness and stoichiometry to keep the defect density due to the lattice mismatch between Si and SiGe low. The stoichiometry of the SiGe may be unique to each SiGe layer to provide for different etch rates as will be utilized later. Some techniques for achieving the defect density low include keeping the thickness of the SiGe layers below the critical thickness for forming defects. The top surface of donor wafer 9600 may be prepared for oxide wafer bonding with a deposition of an oxide. These processes may be done at temperatures above about 400° C. as the layer transfer to the processed substrate with metal interconnects may have yet to be done. A wafer sized layer denotes a continuous layer of material or combination of materials that may extend across the wafer to the full extent of the wafer edges and may be about uniform in thickness. If the wafer sized layer may include dopants, then the dopant concentration may be substantially the same in the x and y direction across the wafer, but may vary in the z direction perpendicular to the wafer surface.

Figure 36B:
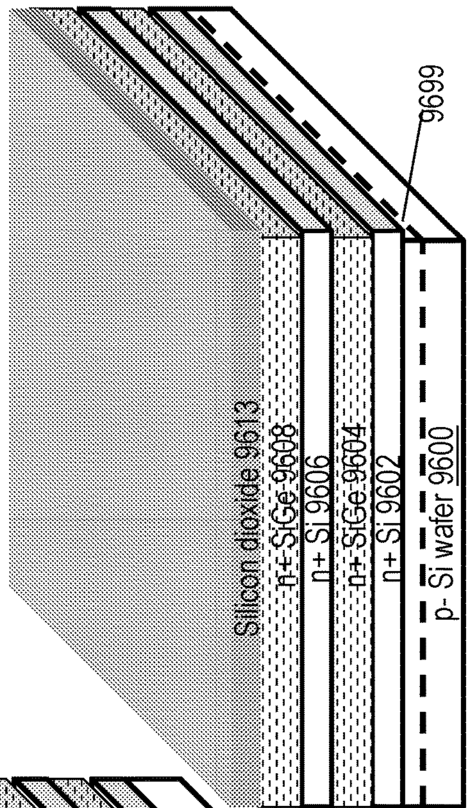

As illustrated in FIG. 36B, a layer transfer demarcation plane 9699 (shown as a dashed line) may be formed in donor wafer 9600 by hydrogen implantation or other layer transfer methods as previously described.

Figure 36C:
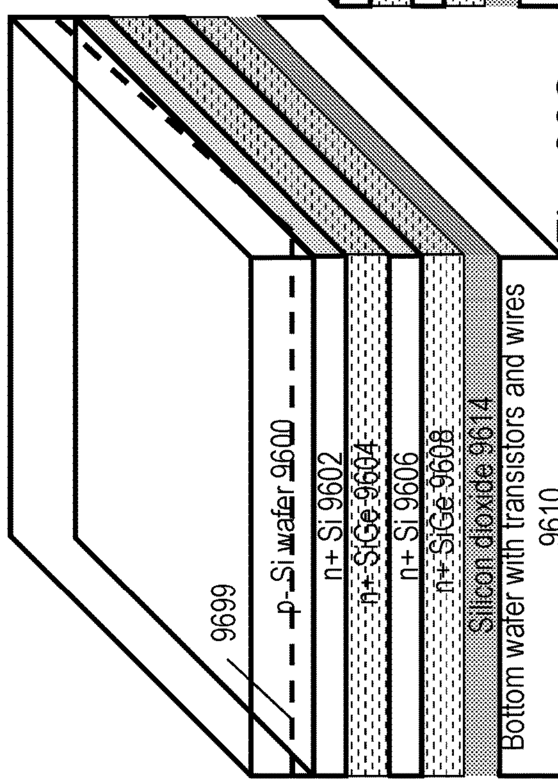

As illustrated in FIG. 36C, both the donor wafer 9600 and acceptor wafer 9610 top layers and surfaces may be prepared for wafer bonding as previously described and then donor wafer 9600 may be flipped over, aligned to the acceptor wafer 9610 alignment marks (not shown) and bonded together at a low temperature (less than about 400° C.). Oxide 9613 from the donor wafer and the oxide of the surface of the acceptor wafer 9610 may thus be atomically bonded together are designated as oxide 9614.

Figure 36D:
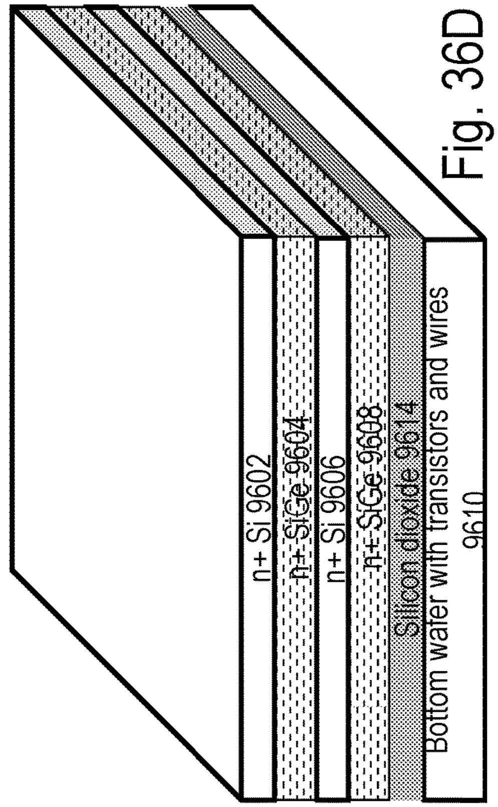

As illustrated in FIG. 36D, the portion of the P− donor wafer 9600 that may be above the layer transfer demarcation plane 9699 may be removed by cleaving and polishing, etching, or other low temperature processes as previously described. A CMP process may be used to remove the remaining P− layer until the N+ silicon layer 9602 is reached. This process of an ion implanted atomic species, such as Hydrogen, forming a layer transfer demarcation plane, and subsequent cleaving or thinning, may be called 'ion-cut'. Acceptor wafer 9610 may have similar meanings as wafer 808 previously described with reference to FIG. 1.

Figure 36F:
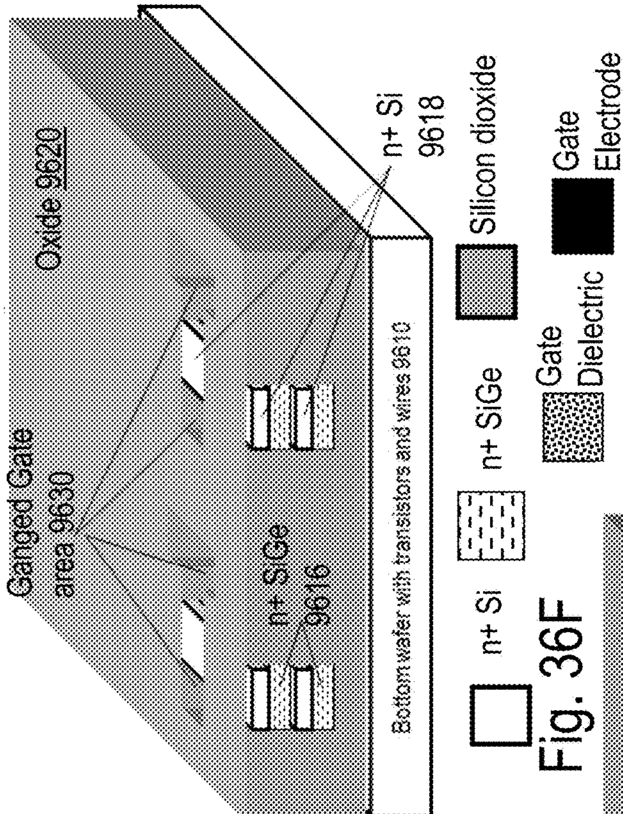
Figure 36E:
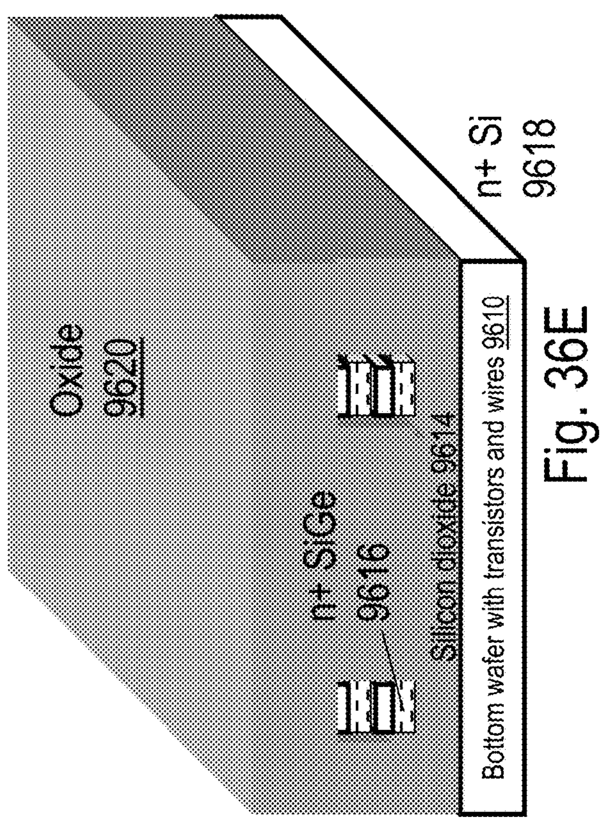
Figure 36G:
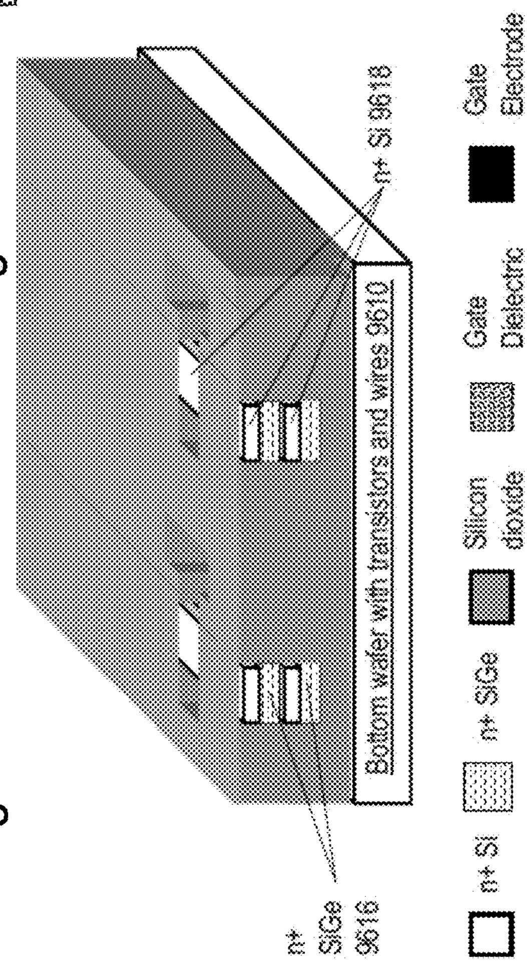

As illustrated in FIG. 36E, stacks of N+ silicon and n+ SiGe regions that may become transistor channels and gate areas may be formed by lithographic definition and plasma/RIE etching of N+ silicon layers 9602 & 9606 and n+ SiGe layers 9604 & 9608. The result may be stacks of n+ SiGe 9616 and N+ silicon 9618 regions. The isolation between stacks may be filled with a low temperature gap fill oxide 9620 and chemically and mechanically polished (CMP'ed) flat. This may fully isolate the transistors from each other. The stack ends may be exposed in the illustration for clarity of understanding.

As illustrated in FIG. 36F, eventual ganged or common gate area 9630 may be lithographically defined and oxide etched. This may expose the transistor channels and gate area stack sidewalls of alternating N+ silicon 9618 and n+ SiGe 9616 regions to the eventual ganged or common gate area 9630. The stack ends may be exposed in the illustration for clarity of understanding.

The exposed n+ SiGe regions 9616 may be removed by a selective etch recipe that does not attack the N+ silicon regions 9618. This may create air gaps between the N+ silicon regions 9618 in the eventual ganged or common gate area 9630. Such etching recipes are described in "High performance 5 nm radius twin silicon nanowire MOSFET (TSNWFET): Fabrication on bulk Si wafer, characteristics, and reliability," in *Proc. IEDM Tech. Dig.,* 2005, pp. 717-720 by S. D. Suk, et. al. The n+ SiGe layers farthest from the top edge may be stoichiometrically crafted such that the etch rate of the layer (now region) farthest from the top (such as n+ SiGe layer 9608) may etch slightly faster than the layer (now region) closer to the top (such as n+ SiGe layer 9604), thereby equalizing the eventual gate lengths of the two stacked transistors. The stack ends are exposed in the illustration for clarity of understanding.

Figure 36H:
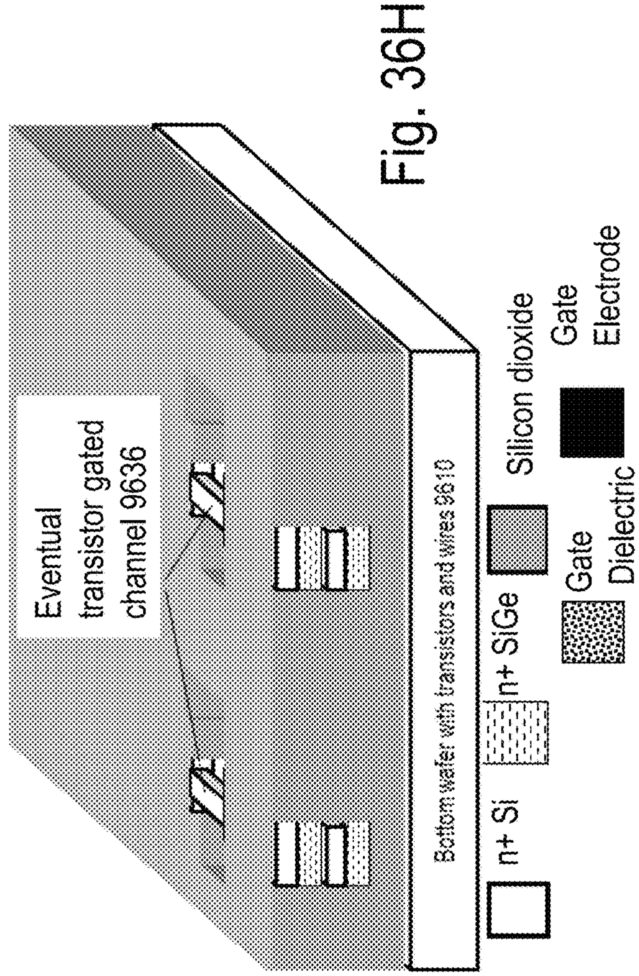

As illustrated in FIG. 36H, an example step of reducing the surface roughness, rounding the edges, and thinning the diameter of the N+ silicon regions 9618 that are exposed in the ganged or common gate area may utilize a low temperature oxidation and subsequent HF etch removal of the oxide just formed. This may be repeated multiple times. Hydrogen may be added to the oxidation or separately utilized atomically as a plasma treatment to the exposed N+ silicon surfaces. The result may be a rounded silicon nanowire-like structure to form the eventual transistor gated channel 9636. These methods of reducing surface roughness of silicon may be utilized in combination with other embodiments of the invention. The stack ends are exposed in the illustration for clarity of understanding.

Figure 36I:
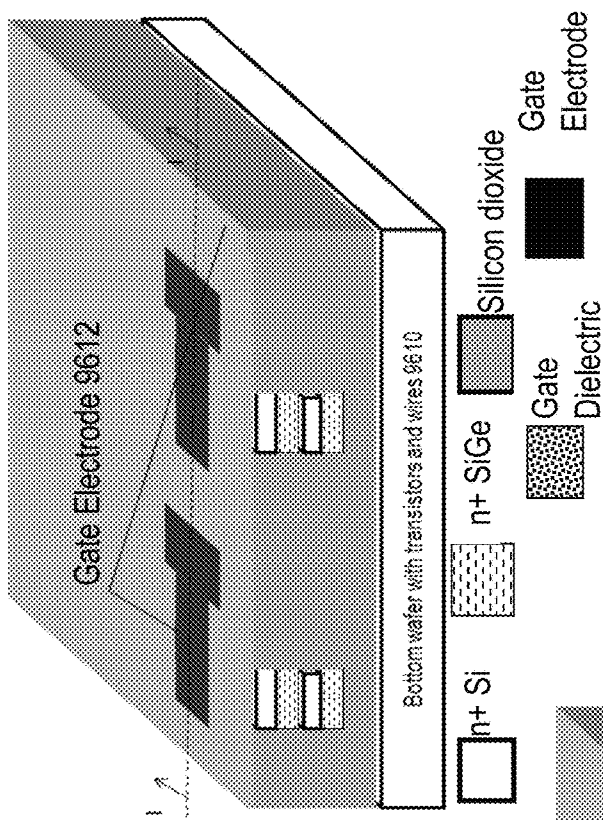

As illustrated in FIG. 36I a low temperature based gate dielectric 9611 may be deposited and densified to serve as the junction-less transistor gate oxide. Alternatively, a low temperature microwave plasma oxidation of the eventual transistor gated channel 9636 silicon surfaces may serve as the JLT gate oxide or an atomic layer deposition (ALD) technique may be utilized to form the HKMG gate oxide as previously described. Then deposition of a low temperature gate material, such as P+ doped amorphous silicon, may be performed. Alternatively, a HKMG gate structure may be formed as described previously. A CMP may be performed after the gate material deposition, thus forming gate electrode 9612. The stack ends may be exposed in the illustration for clarity of understanding.

Figure 36J:
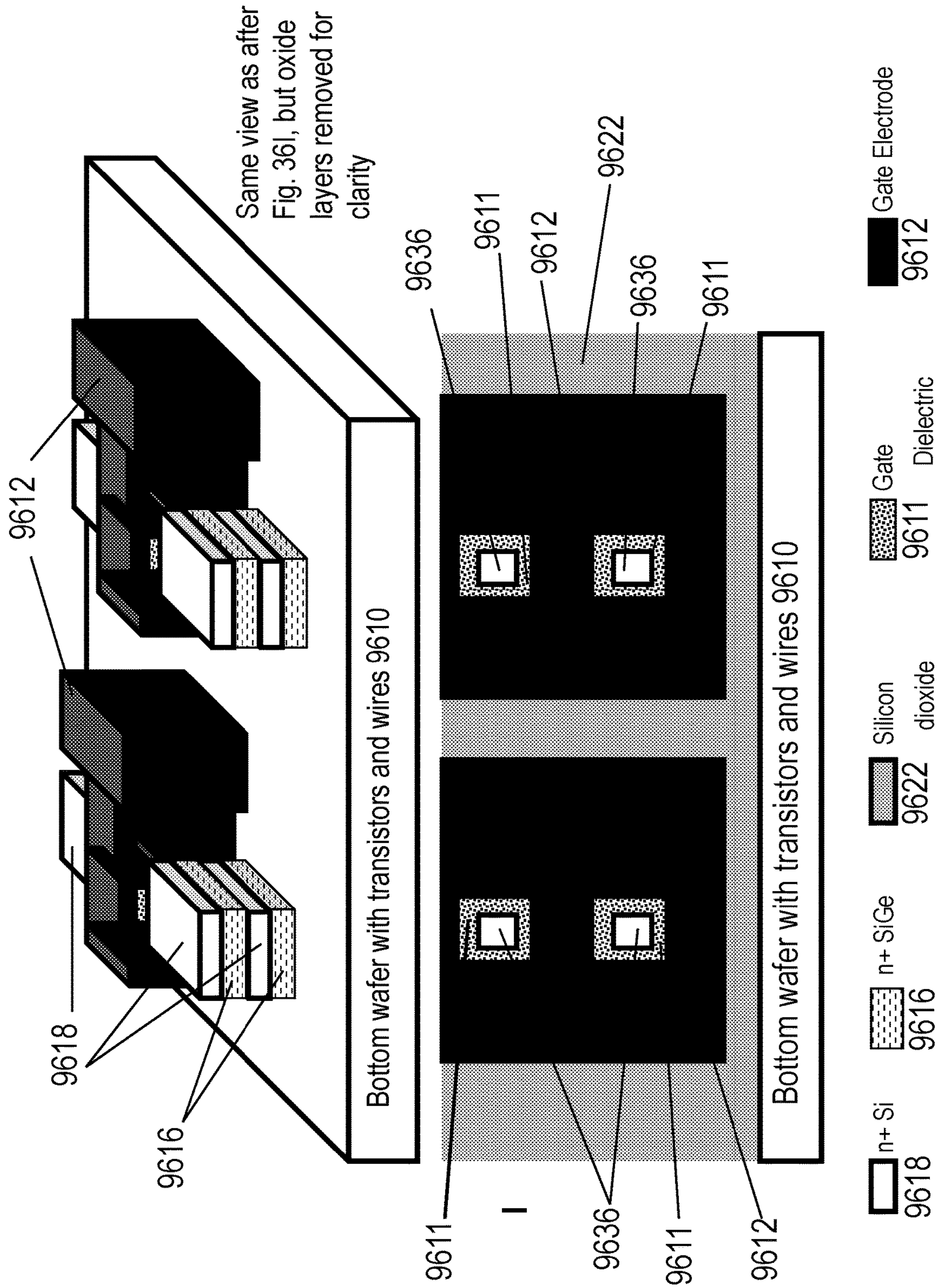

FIG. 36J shows the complete JLT transistor stack formed in FIG. 36I with the oxide removed for clarity of viewing and a cross-sectional cut I of FIG. 36I. Gate electrode 9612 and gate dielectric 9611 may surround the transistor gated channel 9636 and each ganged transistor stack may be isolated from one another by oxide 9622. The source and drain connections of the transistor stacks can be made to the N+ Silicon 9618 and n+ SiGe 9616 regions that may not be covered by the gate electrode 9612.

Contacts to the 4-sided gated JLT's source, drain, and gate may be made with conventional Back end of Line (BEOL) processing as described previously and coupling from the formed JLTs to the acceptor wafer may be accomplished with formation of a through layer via (TLV) connection to an acceptor wafer metal interconnect pad. This flow may enable the formation of a mono-crystalline silicon channel 4-sided gated junction-less transistor that may be formed and connected to the underlying multi-metal layer semiconductor device without exposing the underlying devices to a high temperature.

A p channel 4-sided gated JLT may be constructed as above with the N+ silicon layers 9602 and 9608 formed as P+ doped, and the metals/materials of gate electrode 9612 may be of appropriate work function to shutoff the p channel at a gate voltage of zero.

While the process flow shown in FIG. 36A to 36F and FIG. 36H to 36J illustrates the example steps involved in forming a four-sided gated JLT with 3D stacked components, it is conceivable to one skilled in the art that changes to the process can be made. For example, process steps and additional materials/regions to add strain to JLTs may be added. Moreover, N+ SiGe layers 9604 and 9608 may instead be comprised of p+ SiGe or undoped SiGe and the selective etchant formula adjusted. Furthermore, more than two layers of chips or circuits can be 3D stacked. Also, there are many methods to construct silicon nanowire transistors. These methods may be described in "High performance and highly uniform gate-all-around silicon nanowire MOSFETs with wire size dependent scaling," *Electron Devices Meeting* (*IEDM*), 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET(TSNWFET): Fabrication on bulk Si wafer, characteristics, and reliability," in *Proc. IEDM Tech. Dig.,* 2005, pp. 717-720 by S. D. Suk, S.-Y. Lee, S.-M. Kim, et al. ("Suk"). Contents of these publications are incorporated in this document by reference.

The techniques described in these publications can be utilized for fabricating four-sided gated JLTs.

Alternatively, an n-type 3-sided gated junction-less transistor may be constructed as illustrated in FIG. 19A to FIG. 19G. A silicon wafer is preprocessed to be used for layer transfer as illustrated in FIG. 19A and FIG. 19B. These processes may be at temperatures above about 400° C. as the layer transfer to the processed substrate with metal interconnects is yet to be done. As illustrated in FIG. 19A, an N− wafer 5700 may be processed to have a layer of N+ 5704, by implant and activation, by an N+ epitaxial growth, or may be a deposited layer of heavily N+ doped polysilicon. A screen oxide 5702 may be grown before the implant to protect the silicon from implant contamination and to provide an oxide surface for later wafer to wafer bonding. FIG. 19B is a drawing illustration of the pre-processed wafer made ready for a layer transfer by an implant 5707 of an atomic species, such as H+, preparing the "cleaving plane" 5799 in the N− region of N− wafer 5700, or the donor substrate, and plasma or other surface treatments to prepare the oxide surface for wafer oxide to oxide bonding. The acceptor wafer or house 808 with logic transistors and metal interconnects may be prepared for a low temperature oxide to oxide wafer bond with surface treatments of the top oxide and the two may be bonded as illustrated in FIG. 19C. The top donor wafer may be cleaved and removed from the bottom acceptor wafer 808 and the top N− substrate may be chemically and mechanically polished (CMP'ed) into the N+ layer 5704 to form the top gate layer of the junction-less transistor. A metal interconnect layer/strip 5706 in the acceptor wafer or house 808 is also illustrated in FIG. 19C. For illustration simplicity and clarity, the donor wafer oxide layer screen oxide 5702 will not be drawn independent of the acceptor wafer or house 808 oxides in FIG. 19D through FIG. 19G.

A thin oxide may be grown to protect the thin transistor silicon 5704 layer top, and then the transistor channel elements 5708 may be masked and etched as illustrated in FIG. 19D and then the photoresist may be removed. The thin oxide may be stripped in a dilute HF solution and a low temperature based Gate Dielectric may be deposited and densified to serve as the junction-less transistor gate oxide 5710. Alternatively, a low temperature microwave plasma oxidation of the silicon surfaces may serve as the junction-less transistor gate oxide 5710 or an atomic layer deposition (ALD) technique, such as described herein HKMG processes, may be utilized.

Then deposition of a low temperature gate material 5712, such as doped or undoped amorphous silicon as illustrated in FIG. 19E, may be performed. Alternatively, a high-k metal gate structure may be formed as described previously. The gate material 5712 may be then masked and etched to define the top and side gate 5714 of the transistor channel elements 5708 in a crossing manner, generally orthogonally as shown in FIG. 19F.

Then the entire structure may be covered with a Low Temperature Oxide 5716, the oxide planarized with chemical mechanical polishing, and then contacts and metal interconnects may be masked and etched as illustrated FIG. 19G. The gate contact 5720 may connect to the top and side gate 5714. The two transistor channel terminal contacts 5722 may independently connect to transistor element 5708 on each side of the top and side gate 5714. The through via 5724 may connect the transistor layer metallization to the acceptor wafer or house 808 at metal interconnect layer/strip 5706. This flow may enable the formation of mono-crystalline 3-sided gated junction-less transistor that may be formed and connected to the underlying multi-metal layer semiconductor device without exposing the underlying devices to a high temperature.

Figures 20A, 20B, 20C, 20D, 20E, 20F, 20G:
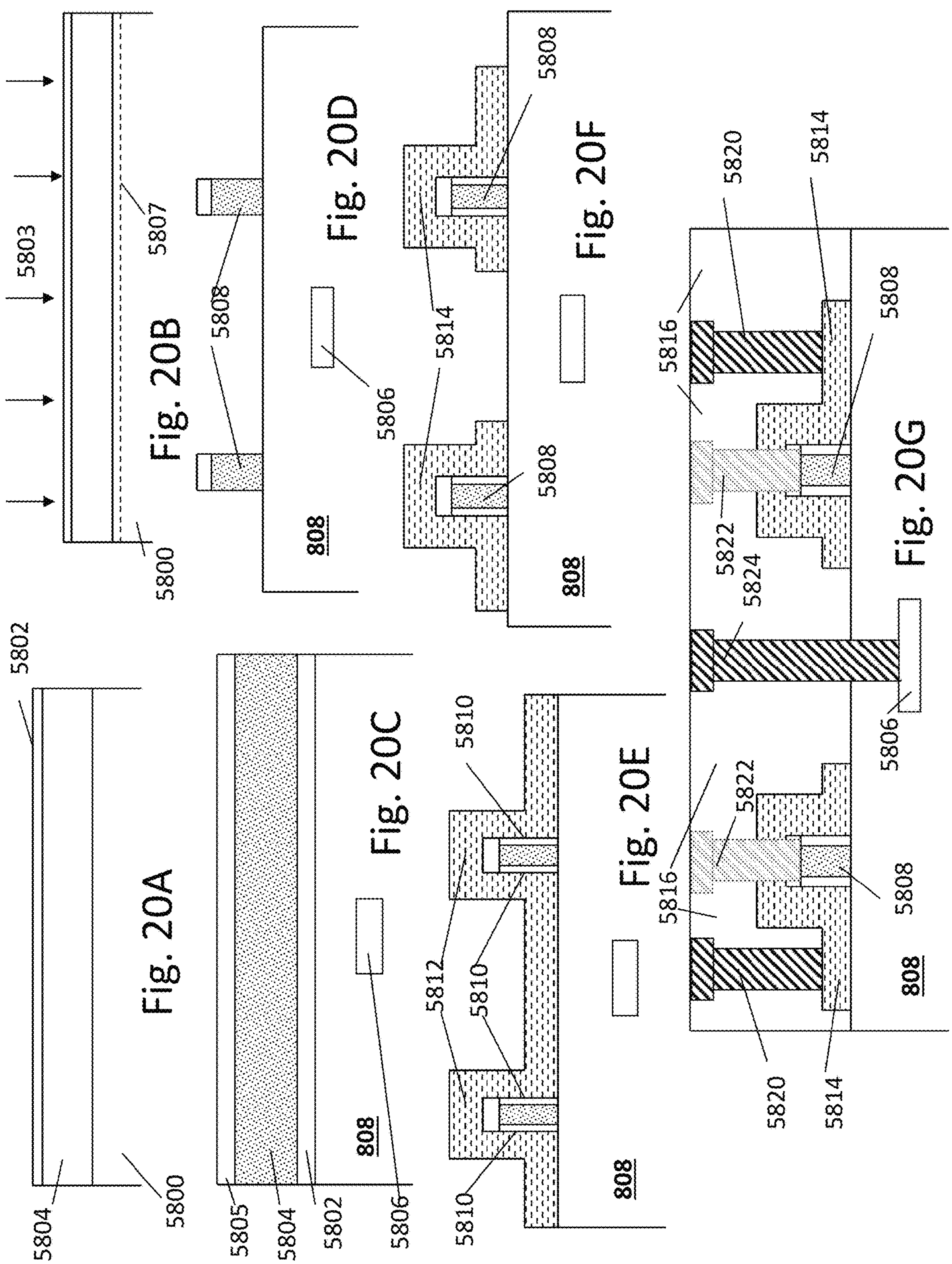
FIG. 20A-FIG. 20G are exemplary drawing illustrations of the formation of a junction-less transistor.

Alternatively, an n-type 3-sided gated thin-side-up junction-less transistor may be constructed as follows in FIG. 20A to FIG. 20G. A thin-side-up transistor, for example, a junction-less thin-side-up transistor, may have the thinnest dimension of the channel cross-section facing up (when oriented horizontally), that face being parallel to the silicon base substrate largest area surface or face. Previously and subsequently described junction-less transistors may have the thinnest dimension of the channel cross section oriented vertically and perpendicular to the silicon base substrate surface. A silicon wafer may be preprocessed to be used for layer transfer, as illustrated in FIG. 20A and FIG. 20B. These processes may be at temperatures above about 400° C. as the layer transfer to the processed substrate with metal interconnects is yet to be done. As illustrated in FIG. 20A, an N− wafer 5800 may be processed to have a layer of N+ 5804, by ion implantation and activation, by an N+ epitaxial growth, or may be a deposited layer of heavily N+ doped polysilicon. A screen oxide 5802 may be grown before the implant to protect the silicon from implant contamination and to provide an oxide surface for later wafer to wafer bonding. FIG. 20B is a drawing illustration of the pre-processed wafer made ready for a layer transfer by an implant 5803 of an atomic species, such as H+, preparing the "cleaving plane" 5807 in the N− region of N− wafer 5800, or the donor substrate, and plasma or other surface treatments to prepare the oxide surface for wafer oxide to oxide bonding. The acceptor wafer 808 with logic transistors and metal interconnects may be prepared for a low temperature oxide to oxide wafer bond with surface treatments of the top oxide and the two may be bonded as illustrated in FIG. 20C. The top donor wafer may be cleaved and removed from the bottom acceptor wafer 808 and the top N− substrate may be chemically and mechanically polished (CMP'ed) into the N+ layer 5804 to form the junction-less transistor channel layer. FIG. 20C also illustrates the deposition of a CMP and plasma etch stop layer 5805, such as low temperature SiN on oxide, on top of the N+ layer 5804. A metal interconnect layer 5806 in the acceptor wafer or house 808 is also shown in FIG. 20C. For illustration simplicity and clarity, the donor wafer oxide layer screen oxide 5802 will not be drawn independent of the acceptor wafer or house 808 oxide in FIG. 20D through FIG. 20G.

The transistor channel elements 5808 may be masked and etched as illustrated in FIG. 20D and then the photoresist may be removed. As illustrated in FIG. 20E, a low temperature based Gate Dielectric may be deposited and densified to serve as the junction-less transistor gate oxide 5810. Alternatively, a low temperature microwave plasma oxidation of the silicon surfaces may serve as the junction-less transistor gate oxide 5810 or an atomic layer deposition (ALD) technique may be utilized. Then deposition of a low temperature gate material 5812, such as P+ doped amorphous silicon may be performed. Alternatively, a high-k metal gate structure may be formed as described previously. As illustrated in FIG. 20F, gate material 5812 may be then masked and etched to define the top and side gate 5814 of the transistor channel elements 5808. As illustrated in FIG. 20G, the entire structure may be covered with a Low Temperature Oxide 5816, the oxide planarized with chemical mechanical polishing (CMP), and then contacts and metal interconnects may be masked and etched. The gate contact 5820 may connect to the transistor top and side gate 5814 (i.e., in front of and behind the plane of the other elements shown in FIG.

20G). The two transistor channel terminal contacts 5822 per transistor may independently connect to the transistor channel element 5808 on each side of the top and side gate 5814. The through via 5824 may connect the transistor layer metallization to the acceptor wafer or house 808 interconnect 5806. This flow may enable the formation of mono-crystalline 3-gated sided thin-side-up junction-less transistor that may be formed and connected to the underlying multi-metal layer semiconductor device without exposing the underlying devices to a high temperature. Persons of ordinary skill in the art will appreciate that the illustrations in FIG. 19A through FIG. 19G and FIG. 20A through FIG. 20G are exemplary only and are not drawn to scale. Such skilled persons will further appreciate that many variations may be possible, for example, the process described in conjunction with FIG. 19A through FIG. 19G could be used to make a junction-less transistor where the channel is taller than its width or that the process described in conjunction with FIG. 20A through FIG. 20G could be used to make a junction-less transistor that is wider than its height. Many other modifications within the scope of the illustrated embodiments of the invention will suggest themselves to such skilled persons after reading this specification. Thus the invention is to be limited only by the appended claims.

Figure 24C:
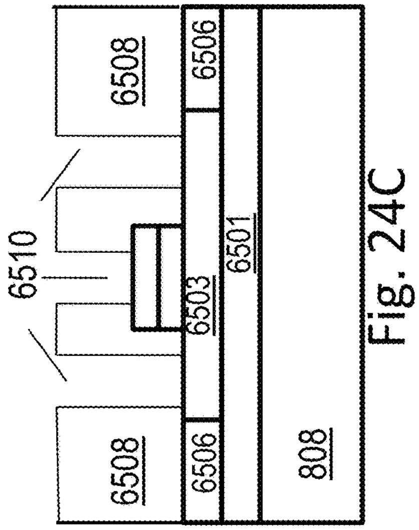
FIG. 24A-FIG. 24C are exemplary drawing illustrations of the formation of a junction-less transistor.
Figure 24B:
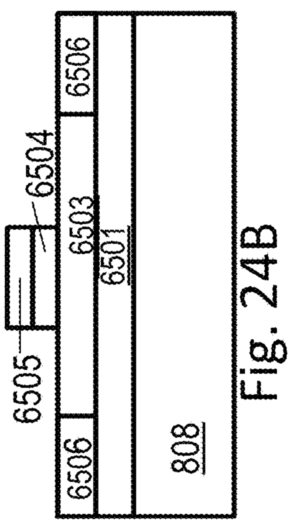
Figure 24A:
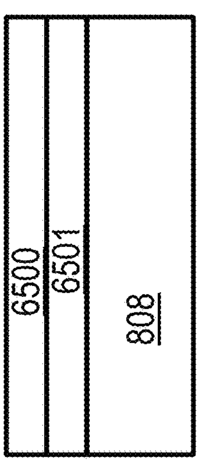

Alternatively, a 1-sided gated junction-less transistor can be constructed as shown in FIG. 24A-C. A thin layer of heavily doped silicon, such as transferred doped layer 6500, may be transferred on top of the acceptor wafer or house 808 using layer transfer techniques described previously wherein the donor wafer oxide layer 6501 may be utilized to form an oxide to oxide bond with the top of the acceptor wafer or house 808. The transferred doped layer 6500 may be N+ doped for an n-channel junction-less transistor or may be P+ doped for a p-channel junction-less transistor. As illustrated in FIG. 24B, oxide isolation 6506 may be formed by masking and etching transferred doped layer 6500, thus forming the N+ doped region 6503. Subsequent deposition of a low temperature oxide which may be chemical mechanically polished to form transistor isolation between N+ doped regions 6503. The channel thickness, i.e. thickness of N+ doped regions 6503, may also be adjusted at this step. A low temperature gate dielectric 6504 and gate metal 6505 may be deposited or grown as previously described and then photo-lithographically defined and etched. As shown in FIG. 24C, a low temperature oxide 6508 may then be deposited, which also may provide a mechanical stress on the channel for improved carrier mobility. Contact openings 6510 may then be opened to various terminals of the junction-less transistor. Persons of ordinary skill in the art will appreciate that the processing methods presented above are illustrative only and that other embodiments of the inventive principles described herein are possible and thus the scope if the invention is only limited by the appended claims.

A family of vertical devices can also be constructed as top transistors that are precisely aligned to the underlying pre-fabricated acceptor wafer or house 808. These vertical devices have implanted and annealed single crystal silicon layers in the transistor by utilizing the "SmartCut" layer transfer process that may not exceed the temperature limit of the underlying pre-fabricated structure. For example, vertical style MOSFET transistors, floating gate flash transistors, floating body DRAM, thyristor, bipolar, and Schottky gated JFET transistors, as well as memory devices, can be constructed. Junction-less transistors may also be constructed in a similar manner. The gates of the vertical transistors or resistors may be controlled by memory or logic elements such as MOSFET, DRAM, SRAM, floating flash, anti-fuse, floating body devices, etc. that are in layers above or below the vertical device, or in the same layer. As an example, a vertical gate-all-around n-MOSFET transistor construction is described below.

Figure 15B:
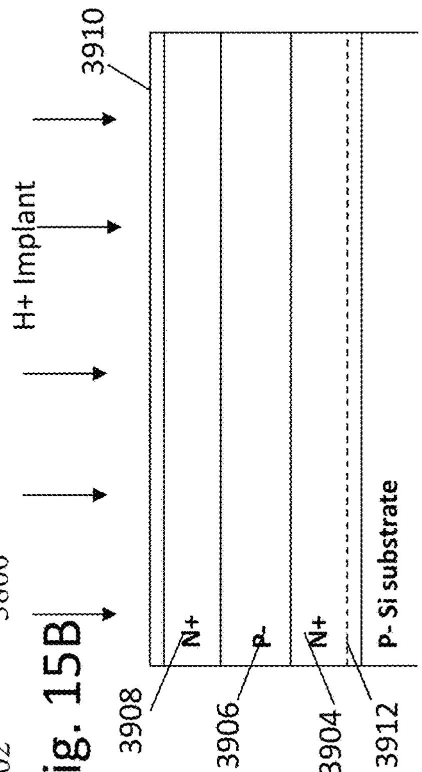
Figure 15A:
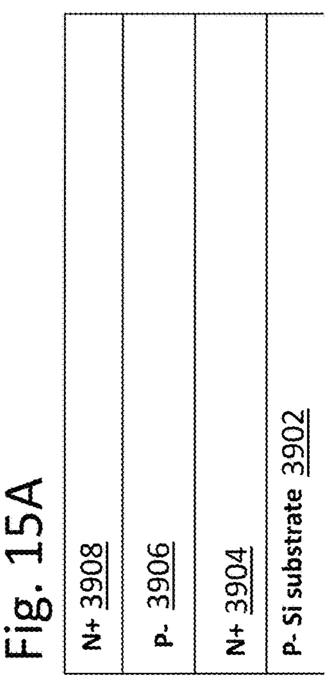

The donor wafer preprocessed for the general layer transfer process is illustrated in FIG. 15. A P− wafer 3902 may be processed to have a "buried" layer of N+ 3904, by either implant and activation, or by shallow N+ implant and diffusion. This process may be followed by depositing a P− epi growth (epitaxial growth) layer 3906 and finally an additional N+ layer 3908 may be processed on top. This N+ layer 3908 could again be processed, by implant and activation, or by N+ epi growth.

FIG. 15B is a drawing illustration of the pre-processed donor wafer which may be made ready for a conductive bond layer transfer by a deposition of a conductive barrier layer 3910 such as TiN or TaN on top of N+ layer 3908 and an implant of an atomic species, such as H+, preparing the SmartCut cleaving plane 3912 in the lower part of the N+ 3904 region.

As shown in FIG. 15C, the acceptor wafer may be prepared with an oxide pre-clean and deposition of a conductive barrier layer 3916 and Al—Ge eutectic layer 3914. Al—Ge eutectic layer 3914 may form an Al—Ge eutectic bond with the conductive barrier layer 3910 during a thermo-compressive wafer to wafer bonding process as part of the layer-transfer-flow, thereby transferring the pre-processed single crystal silicon with N+ and P− layers. Thus, a conductive path may be made from the house 808 top metal layer metal lines/strips 3920 to the now bottom N+ layer 3908 of the transferred donor wafer. Alternatively, the Al—Ge eutectic layer 3914 may be made with copper and a copper-to-copper or copper-to-barrier layer thermo-compressive bond may be formed. Likewise, a conductive path from donor wafer to house 808 may be made by house top metal lines/strips 3920 of copper with barrier metal thermo-compressively bonded with the copper layer of conductive barrier layer 3910 directly, where a majority of the bonded surface is donor copper to house oxide bonds and the remainder of the surface may be donor copper to house 808 copper and barrier metal bonds.

Figure 17C:
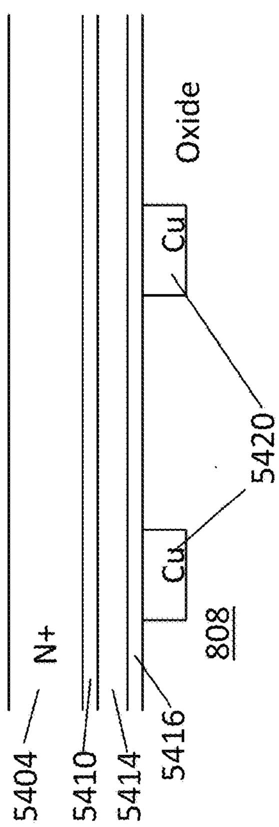

Additionally, a vertical gate all around junction-less transistor may be constructed as illustrated in at least FIG. 17A-17C. The donor wafer preprocessed for the general layer transfer process is illustrated in FIG. 17. FIG. 17A is a drawing illustration of a pre-processed wafer that may be used for a layer transfer. An N− wafer 5402 may be processed to have a layer of N+ 5404, by ion implantation and activation, or an N+ epitaxial growth. FIG. 17B is a drawing illustration of the pre-processed wafer that may be made ready for a conductive bond layer transfer by a deposition of a conductive barrier layer 5410 such as TiN or TaN and by an implant of an atomic species, such as H+, preparing the SmartCut cleaving plane 5412 in the lower part of the N+ 5404 region.

The acceptor wafer or house 808 may also be prepared with an oxide pre-clean and deposition of a conductive barrier layer 5416 and Al and Ge layers to form a Ge—Al eutectic bond, Al—Ge eutectic layer 5414, during a thermo-compressive wafer to wafer bonding as part of the layer-transfer-flow, thereby transferring the pre-processed single crystal silicon of FIG. 17B with an N+ layer 5404, on top of acceptor wafer or house 808, as illustrated in FIG. 17C. The N+ layer 5404 may be polished to remove damage from the cleaving procedure. Thus, a conductive path may be made from the acceptor wafer or house 808 top metal layers/lines 5420 to the N+ layer 5404 of the transferred donor wafer. Alternatively, the Al—Ge eutectic layer 5414 may be made with copper and a copper-to-copper or copper-to-barrier layer thermo-compressive bond may be formed. Likewise, a conductive path from donor wafer to acceptor wafer or house 808 may be made by house top metal layers/lines 5420 of copper with associated barrier metal thermo-compressively bonded with the copper layer 5420 directly, where a majority of the bonded surface may be donor copper to house oxide bonds and the remainder of the surface may be donor copper to acceptor wafer or house 808 copper and barrier metal bonds.

Figure 25:
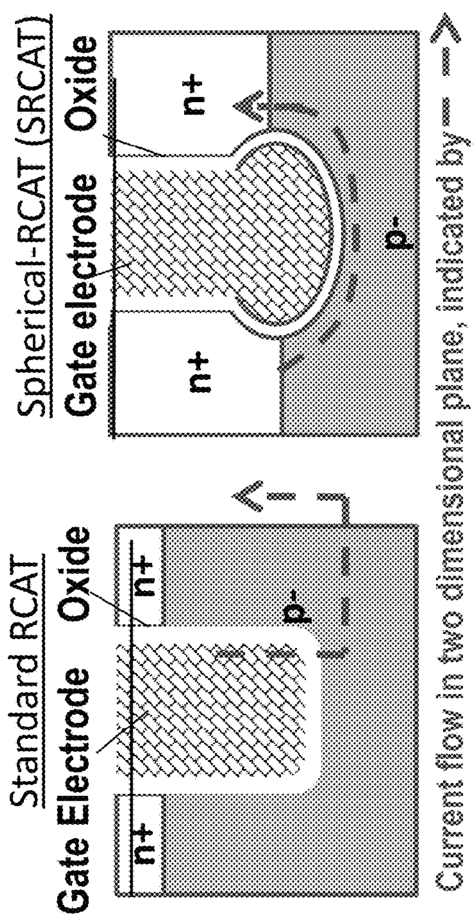
FIG. 25 are exemplary drawing illustrations of recessed channel array transistors.

Recessed Channel Array Transistors (RCATs) may be another transistor family that can utilize layer transfer and etch definition to construct a low-temperature monolithic 3D Integrated Circuit. The recessed channel array transistor may sometimes be referred to as a recessed channel transistor. Two types of RCAT device structures are shown in FIG. 25. These were described by J. Kim, et al. at the Symposium on VLSI Technology, in 2003 and 2005. Note that this prior art of J. Kim, et al. is for a single layer of transistors and no layer transfer techniques were ever employed. Their work also used high-temperature processes such as source-drain activation anneals, wherein the temperatures were above 400° C. In contrast, some embodiments of the invention employ this transistor family in a two-dimensional plane. Transistors in this document, such as, for example, junction-less, recessed channel array, or depletion, with the source and the drain in the same two dimensional planes may be considered planar transistors. The terms horizontal transistors, horizontally oriented transistors, or lateral transistors may also refer to planar transistors. Additionally, the gates of transistors in some embodiments of the invention that include gates on two or more sides of the transistor channel may be referred to as side gates.

Figure 26A:
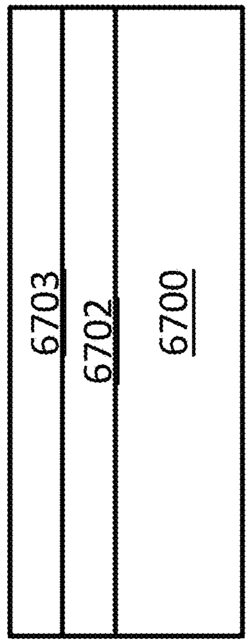
FIG. 26A-FIG. 26F are exemplary drawing illustrations of formation of recessed channel array transistors.

A layer stacking approach to construct 3D integrated circuits with standard RCATs is illustrated in FIG. 26A-F. For an n~channel MOSFET, a p− silicon wafer 6700 may be the starting point. A buried layer of n+ Si 6702 may then be implanted as shown in FIG. 26A, resulting in p− layer 6703 that may be at the surface of the donor wafer. An alternative may be to implant a shallow layer of n+ Si and then epitaxially deposit a layer of p− Si, thus forming p− layer 6703. To activate dopants in the n+ layer 6702, the wafer may be annealed, with standard annealing procedures such as thermal, or spike, or laser anneal.

Figure 26D:
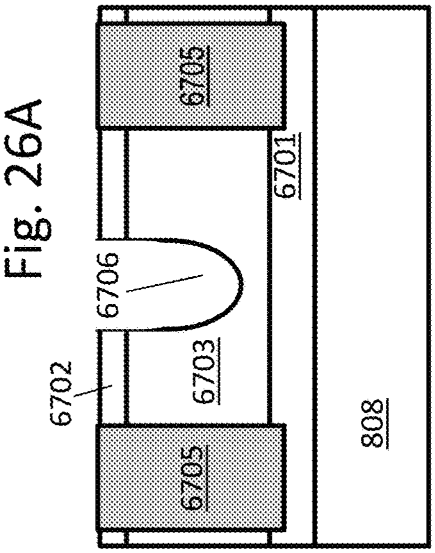
Figure 26C:
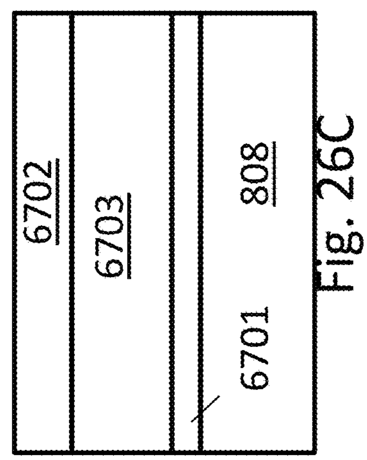
Figure 26B:
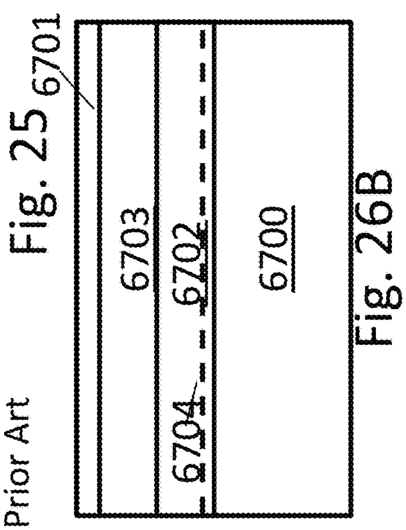

An oxide layer 6701 may be grown or deposited, as illustrated in FIG. 26B. Hydrogen may be implanted into the p silicon wafer 6700 to enable a "smart cut" process, as indicated in FIG. 26B as a dashed line for hydrogen cleave plane 6704.

A layer transfer process may be conducted to attach the donor wafer in FIG. 26B to a pre-processed circuits acceptor wafer 808 as illustrated in FIG. 26C. The hydrogen cleave plane 6704 may now be utilized for cleaving away the remainder of the p silicon wafer 6700.

After the cut, chemical mechanical polishing (CMP) may be performed. Oxide isolation regions 6705 may be formed and an etch process may be conducted to form the recessed channel 6706 as illustrated in FIG. 26D. This etch process may be further customized so that corners are rounded to avoid high field issues.

Figure 26F:
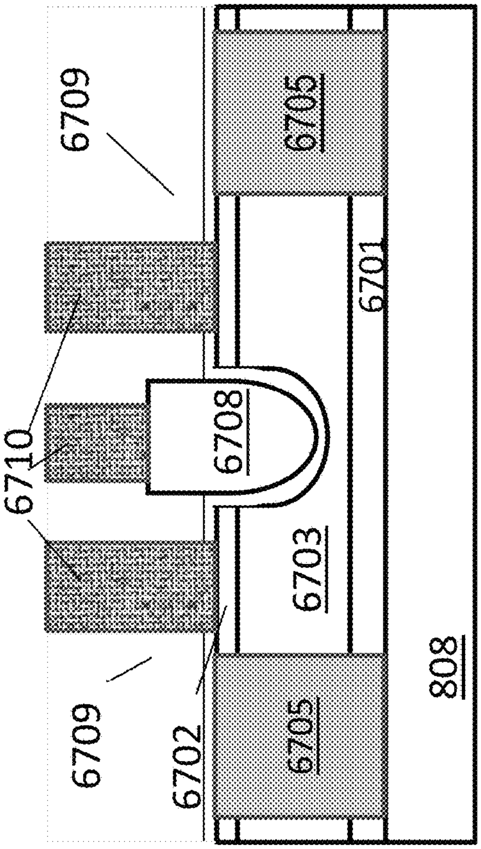
Figure 26E:
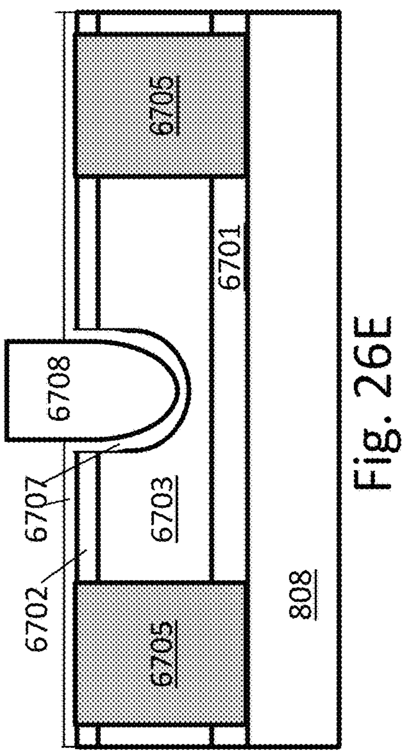

A gate dielectric 6707 may then be deposited, either through atomic layer deposition or through other low-temperature oxide formation procedures described previously. A metal gate 6708 may then be deposited to fill the recessed channel, followed by a CMP and gate patterning as illustrated in FIG. 26E.

A low temperature oxide 6709 may be deposited and planarized by CMP. Contacts 6710 may be formed to connect to all electrodes of the transistor as illustrated in FIG. 26F. This flow may enable the formation of a low temperature RCAT monolithically on top of pre-processed circuitry 808. A p-channel MOSFET may be formed with an analogous process. The p and n channel RCATs may be utilized to form a monolithic 3D CMOS circuit library as described later.

A planar n~channel junction-less recessed channel array transistor (JLRCAT) suitable for a 3D IC may be constructed. The JLRCAT may provide an improved source and drain contact resistance, thereby allowing for lower channel doping, and the recessed channel may provide for more flexibility in the engineering of channel lengths and characteristics, and increased immunity from process variations.

Figure 60A:
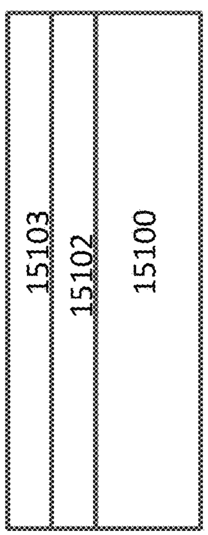
FIG. 60A-FIG. 60F are exemplary drawing illustrations of a process flow for manufacturing junction-less recessed channel array transistors.

As illustrated in FIG. 60A, an N− substrate donor wafer 15100 may be processed to include wafer sized layers of N+ doping 15102, and N− doping 15103 across the wafer. The N+ doped layer 15102 may be formed by ion implantation and thermal anneal. In addition, N− doped layer 15103 may have additional ion implantation and anneal processing to provide a different dopant level than N− substrate donor wafer 15100. N− doped layer 15103 may also have graded N− doping to mitigate transistor performance issues, such as, for example, short channel effects, after the formation of the JLRCAT. The layer stack may alternatively be formed by successive epitaxially deposited doped silicon layers of N+ doping 15102 and N− doping 15103, or by a combination of epitaxy and implantation. Annealing of implants and doping may utilize optical annealing techniques or types of Rapid Thermal Anneal (RTA or spike) or flash anneal.

Figure 60B:
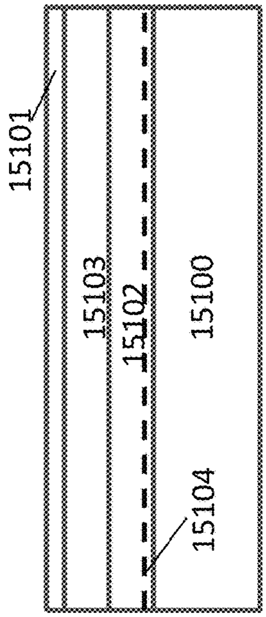

As illustrated in FIG. 60B, the top surface of N− substrate donor wafer 15100 layers stack from FIG. 60A may be prepared for oxide wafer bonding with a deposition of an oxide to form oxide layer 15101 on top of N− doped layer 15103. A layer transfer demarcation plane (shown as dashed line) 15104 may be formed by hydrogen implantation, co-implantation such as hydrogen and helium, or other methods as previously described.

Figure 60C:
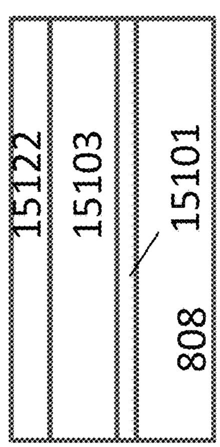

As illustrated in FIG. 60C, both the N− substrate donor wafer 15100 and acceptor substrate 808 may be prepared for wafer bonding as previously described and then low temperature (less than about 400° C.) aligned and oxide to oxide bonded. Acceptor substrate 808, as described previously, may include, for example, transistors, circuitry, metal, such as, for example, aluminum or copper, interconnect wiring, and through layer via metal interconnect strips or pads. The portion of the N− substrate donor wafer 15100 and N+ doped layer 15102 that is below the layer transfer demarcation plane 15104 may be removed by cleaving or other processes as previously described, such as, for example, ion-cut or other methods. Oxide layer 15101, N− doped layer 15103, and N+ doped layer 15122 may have been layer transferred to acceptor wafer 808. Now JLRCAT transistors may be formed with low temperature (less than about 400° C.) processing and may be aligned to the acceptor wafer 808 alignment marks (not shown).

Figure 60D:
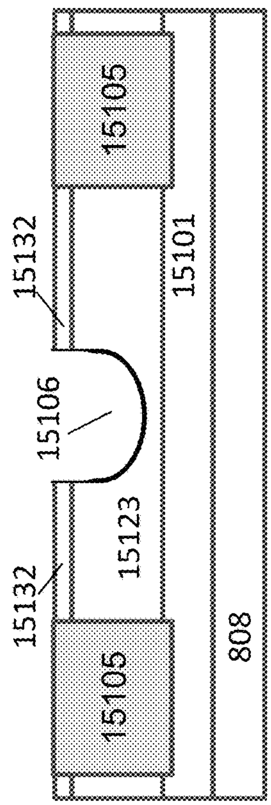

As illustrated in FIG. 60D, the transistor isolation regions 15105 may be formed by mask defining and then plasma/RIE etching N+ doped layer 15122, and N− doped layer 15103 to the top of oxide layer 15101 or into oxide layer 15101. A low-temperature gap fill oxide may be deposited and chemically mechanically polished, with the oxide remaining in isolation regions 15105. Recessed channel 15106 may be mask defined and etched through N+ doped layer 15122 and partially into N− doped layer 15103. The recessed channel 15106 surfaces and edges may be smoothed by processes such as, for example, wet chemical, plasma/RIE etching, low temperature hydrogen plasma, or low temperature oxidation and strip techniques, to mitigate high field and other effects. These process steps may form isolation regions 15105, N+ source and drain regions 15132 and N− channel region 15123.

Figure 60E:
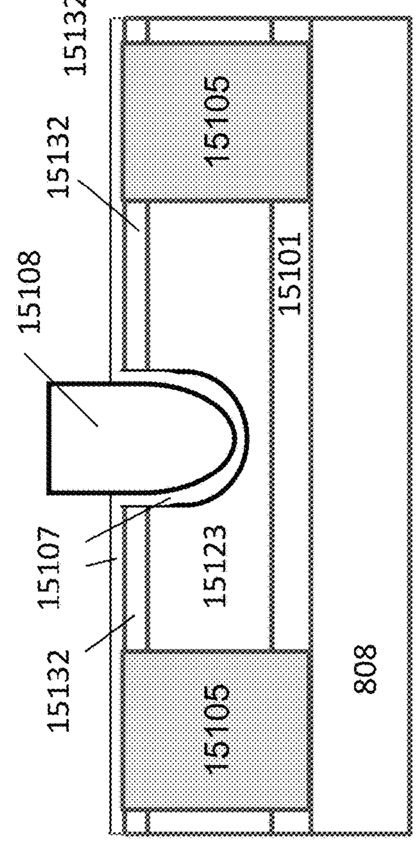

As illustrated in FIG. 60E, a gate dielectric 15107 may be formed and a gate metal material may be deposited. The gate dielectric 15107 may be an atomic layer deposited (ALD) gate dielectric that may be paired with a work function specific gate metal in the industry standard high k metal gate process schemes described previously. Or the gate dielectric 15107 may be formed with a low temperature oxide deposition or low temperature microwave plasma oxidation of the silicon surfaces and then a gate metal material such as, for example, tungsten or aluminum may be deposited. The gate metal material may be chemically mechanically polished, and the gate area defined by masking and etching, thus forming gate electrode 15108.

Figure 60F:
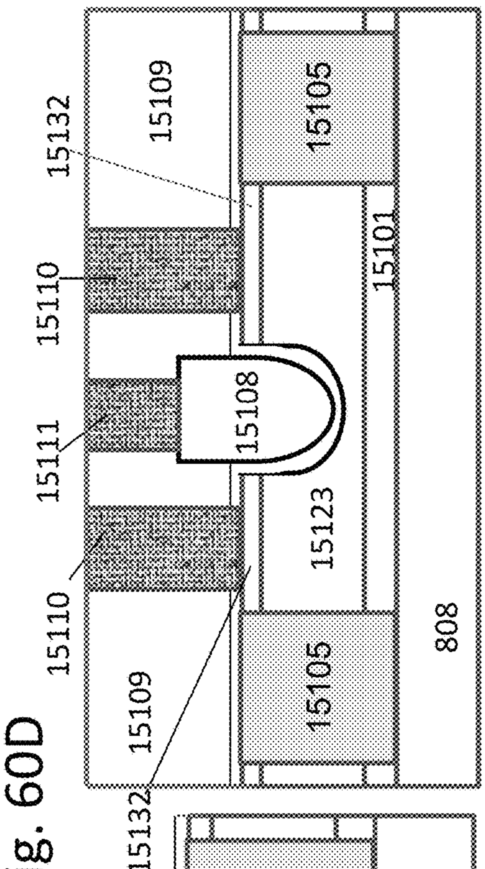

As illustrated in FIG. 60F, a low temperature thick oxide 15109 may be deposited and planarized, and source, gate, and drain contacts, and through layer via (not shown) openings may be masked and etched, thereby preparing the transistors to be connected via metallization. Thus gate contact 15111 may connect to gate electrode 15108, and source & drain contacts 15110 may connect to N+ source and drain regions 15132. Thru layer vias (not shown) may be formed to connect to the acceptor substrate connect strips (not shown) as described herein.

Persons of ordinary skill in the art will appreciate that the illustrations in FIG. 60A through FIG. 60F are exemplary only and are not drawn to scale. Such skilled persons will further appreciate that many variations may be possible such as, for example, a p-channel JLRCAT may be formed with changing the types of dopings appropriately. Moreover, the N− substrate donor wafer 15100 may be p type as well as the n type described above. Further, N− doped layer 15103 may include multiple layers of different doping concentrations and gradients to fine tune the eventual JLRCAT channel for electrical performance and reliability characteristics, such as, for example, off-state leakage current and on-state current. Furthermore, isolation regions 15105 may be formed by a hard mask defined process flow, wherein a hard mask stack, such as, for example, silicon oxide and silicon nitride layers, or silicon oxide and amorphous carbon layers. Moreover, CMOS JLRCATs may be constructed with n-JLRCATs in one mono-crystalline silicon layer and p-JLRCATs in a second mono-crystalline layer, which may include different crystalline orientations of the mono-crystalline silicon layers, such as, for example, <100>, <111> or <551>, and may include different contact silicides for substantially optimum contact resistance to p or n type source, drains, and gates. Furthermore, a back-gate or double gate structure may be formed for the JLRCAT and may utilize techniques described elsewhere in this document. Many other modifications within the scope of the illustrated embodiments of the invention will suggest themselves to such skilled persons after reading this specification. Thus the invention is to be limited only by the appended claims.

An n~channel Trench MOSFET transistor suitable for a 3D IC may be constructed. The trench MOSFET may provide an improved drive current and the channel length can be tuned without area penalty. The trench MOSFET can be formed utilizing layer transfer techniques.

3D memory device structures may also be constructed in layers of mono-crystalline silicon and utilize the pre-processing of a donor wafer by forming wafer sized layers of various materials without a process temperature restriction, then layer transferring the pre-processed donor wafer to the acceptor wafer, followed by some example processing steps, and repeating this procedure multiple times, and then processing with either low temperature (below about 400° C.) or high temperature (greater than about 400° C.) after the final layer transfer to form memory device structures, such as, for example, transistors or memory bit cells, on or in the multiple transferred layers that may be physically aligned and may be electrically coupled to the acceptor wafer. The term memory cells may also describe memory bit cells in this document.

Novel monolithic 3D Dynamic Random Access Memories (DRAMs) may be constructed in the above manner. Some embodiments of this present invention utilize the floating body DRAM type.

Floating-body DRAM may be a next generation DRAM being developed by many companies such as Innovative Silicon, Hynix, and Toshiba. These floating-body DRAMs store data as charge in the floating body of an SOI MOSFET or a multi-gate MOSFET. Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939, besides other literature. A monolithic 3D integrated DRAM can be constructed with floating-body transistors. Prior art for constructing monolithic 3D DRAMs used planar transistors where crystalline silicon layers were formed with either selective epi technology or laser recrystallization. Both selective epi technology and laser recrystallization may not provide perfectly single crystal silicon and often require a high thermal budget. A description of these processes is given in Chapter 13 of the book entitled "Integrated Interconnect Technologies for 3D Nanoelectronic Systems" by Bakir and Meindl.

FIG. 95A-J describes an alternative process flow to construct a horizontally-oriented monolithic 3D DRAM. This monolithic 3D DRAM utilizes the floating body effect and independently addressable double-gate transistors. One mask is utilized on a "per-memory-layer" basis for the monolithic 3D DRAM concept shown in FIG. 95A-J, while other masks may be shared between different layers. Independently addressable double-gated transistors provide an increased flexibility in the programming, erasing and operating modes of floating body DRAMs. The process flow may include several steps that occur in the following sequence.

Figure 95A:
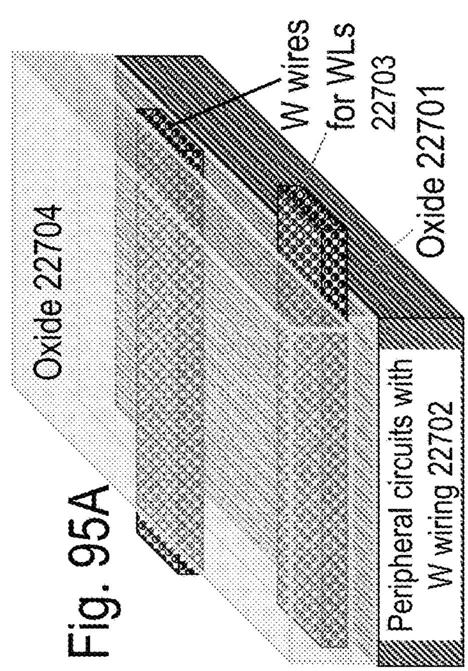

Step (A): Peripheral circuits 22702 with tungsten (W) wiring may be constructed. Isolation, such as oxide 22701, may be deposited on top of peripheral circuits 22702 and tungsten word line (WL) wires 22703 may be constructed on top of oxide 22701. WL wires 22703 may be coupled to the peripheral circuits 22702 through metal vias (not shown). Above WL wires 22703 and filling in the spaces, oxide layer 22704 may be deposited and may be chemically mechanically polished (CMP) in preparation for oxide-oxide bonding. FIG. 95A illustrates the structure after Step (A).

Figure 95B:
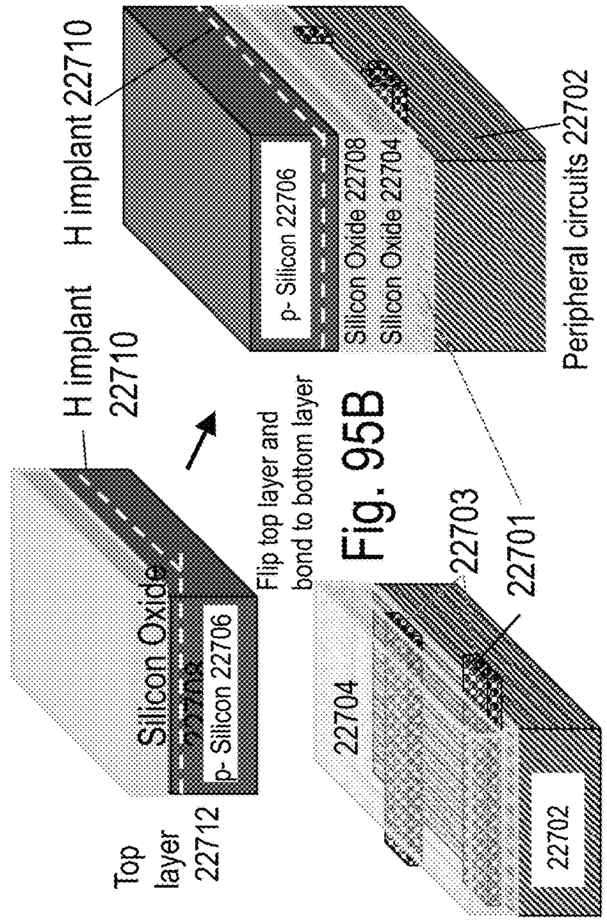

Step (B): FIG. 95B shows a drawing illustration after Step (B). A p− Silicon wafer 22706 may have an oxide layer 22708 grown or deposited above it. Following this, hydrogen may be implanted into the p− Silicon wafer at a certain depth indicated by dashed lines as hydrogen plane 22710. Alternatively, some other atomic species such as Helium could be (co-)implanted. This hydrogen implanted p− Silicon wafer 22706 may form the top layer 22712. The bottom layer 22714 may include the peripheral circuits 22702 with oxide layer 22704, WL wires 22703 and oxide 22701. The top layer 22712 may be flipped and bonded to the bottom layer 22714 using oxide-to-oxide bonding of oxide layer 22704 to oxide layer 22708.

Figure 95C:
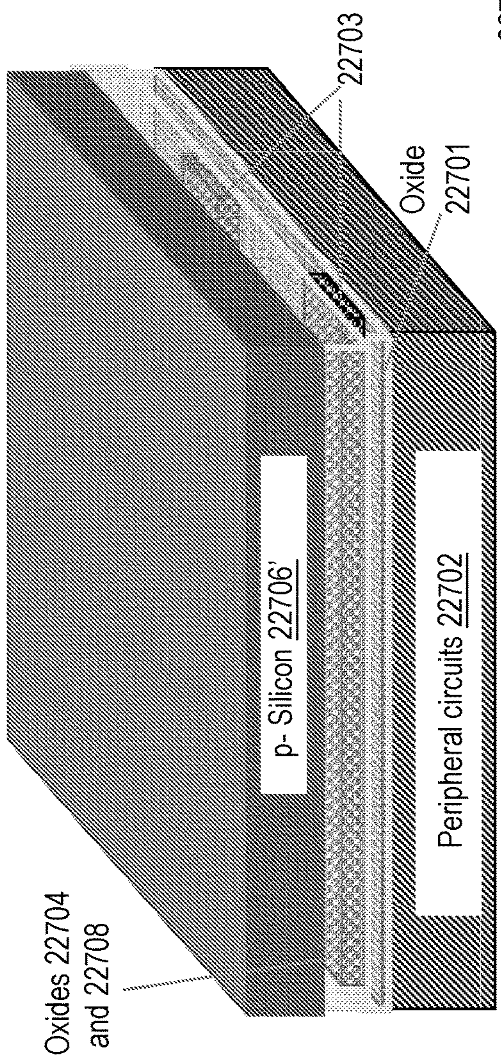

Step (C): FIG. 95C illustrates the structure after Step (C). The stack of top and bottom wafers after Step (B) may be cleaved at the hydrogen plane 22710 using either an anneal, a sideways mechanical force or other means of cleaving or thinning the top layer 22712 described elsewhere in this document. A CMP process may then be conducted. At the end of this step, a single-crystal p− Si layer 22706' may exist atop the peripheral circuits, and this has been achieved using layer-transfer techniques.

Figure 95D:
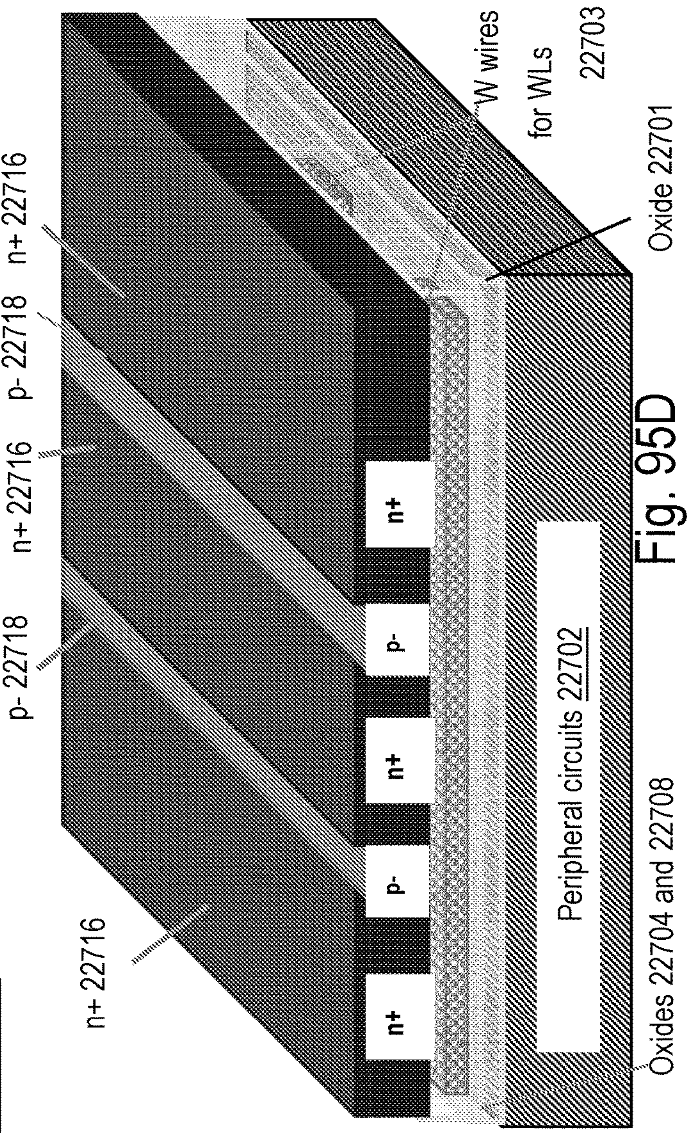

Step (D): FIG. 95D illustrates the structure after Step (D). Using lithography and then ion implantation or other semiconductor doping methods such as plasma assisted doping (PLAD), n+ regions 22716 and p− regions 22718 may be formed on the transferred layer of p− Si after Step (C).

Figure 95E:
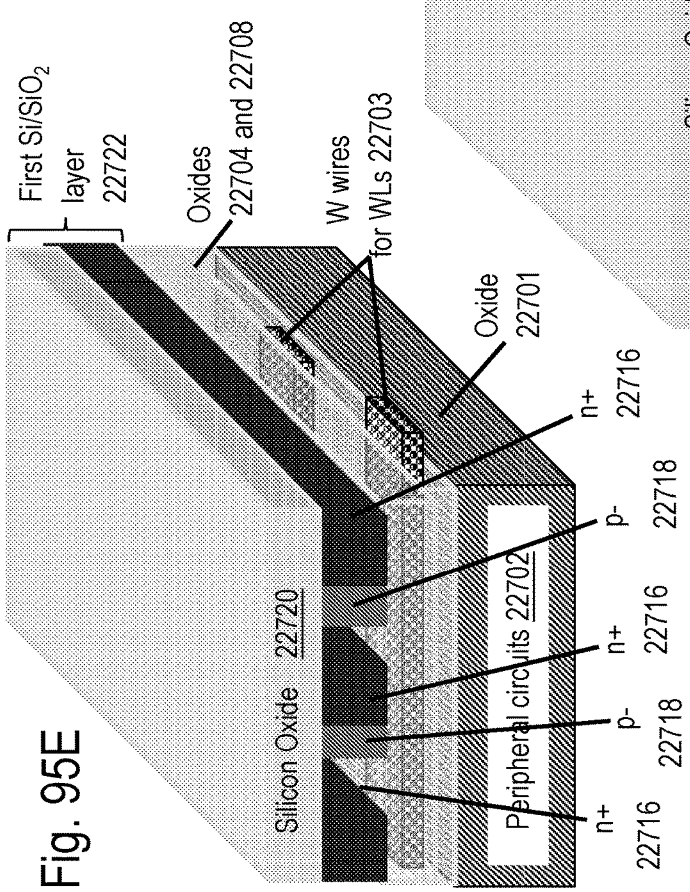

Step (E): FIG. 95E illustrates the structure after Step (E). An oxide layer 22720 may be deposited atop the structure obtained after Step (D). A first layer of $Si/SiO_2$ 22722 may be formed atop the peripheral circuits 22702, oxide 22701, WL wires 22703, oxide layer 22704 and oxide layer 22708.

Figure 95F:
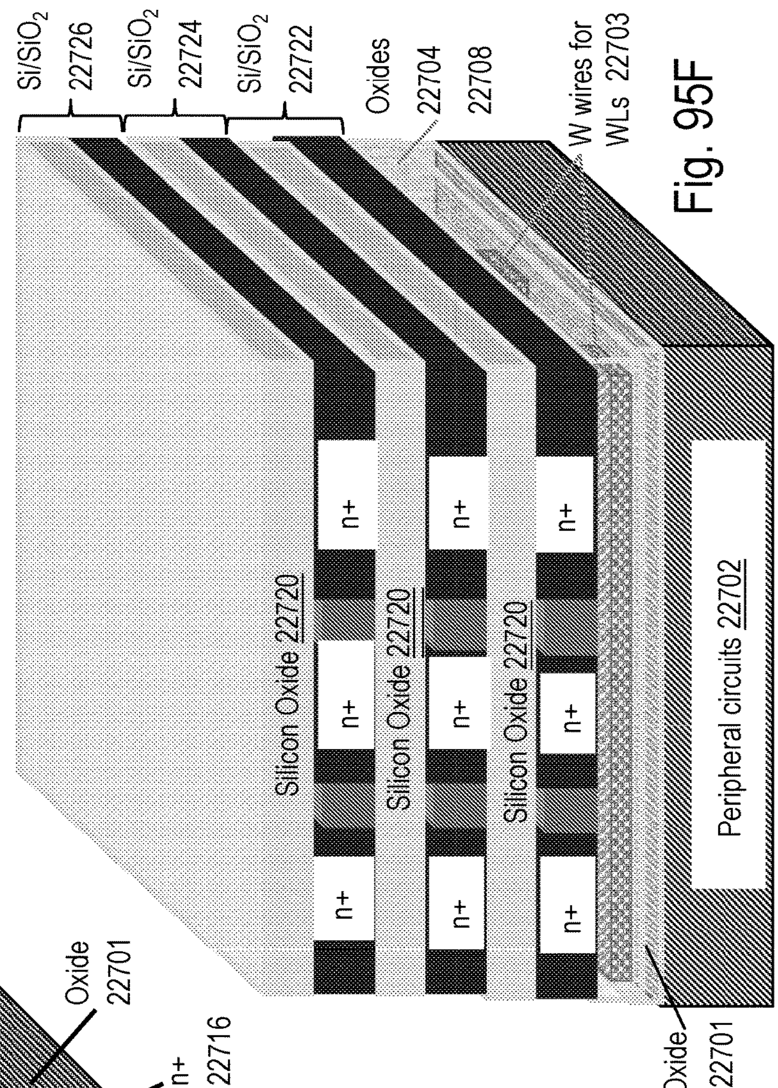

Step (F): FIG. 95F illustrates the structure after Step (F). Using procedures similar to Steps (B)-(E), additional $Si/SiO_2$ layers 22724 and 22726 may be formed atop $Si/SiO_2$ layer 22722. A rapid thermal anneal (RTA) or spike anneal or flash anneal or laser anneal may be done to activate all implanted or doped regions within $Si/SiO_2$ layers 22722, 22724 and 22726 (and possibly also the peripheral circuits 22702). Alternatively, the $Si/SiO_2$ layers 22722, 22724 and 22726 may be annealed layer-by-layer as soon as their implantations or dopings are done using an optical anneal system such as a laser anneal system. A CMP polish/plasma etch stop layer (not shown), such as silicon nitride, may be deposited on top of the topmost $Si/SiO_2$ layer, for example third $Si/SiO_2$ layer 22726.

Figures 95G, 95H, 95I, 95J:
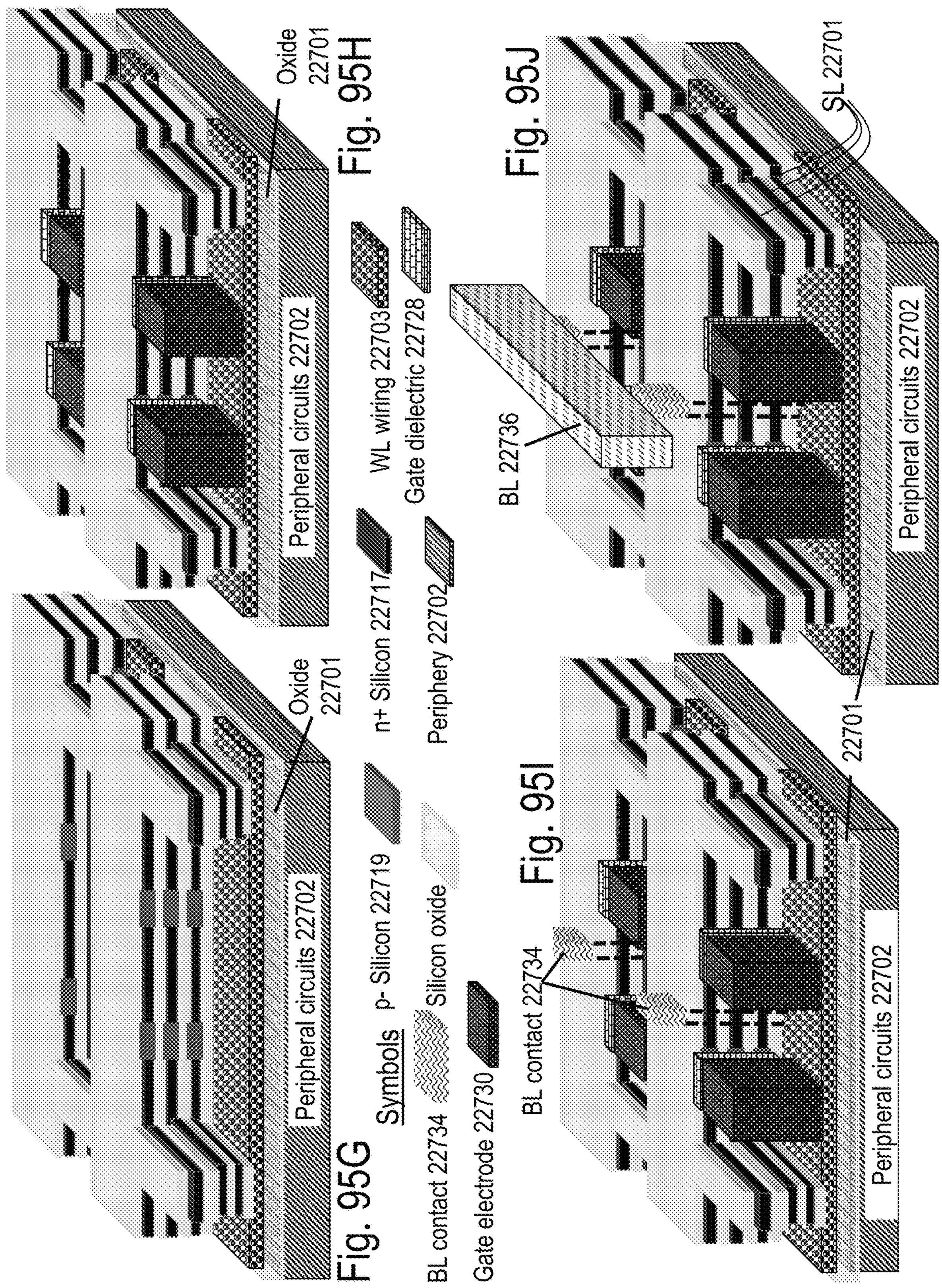

Step (G): FIG. 95G illustrates the structure after Step (G). Lithography and etch processes may be utilized to make an exemplary structure as shown in FIG. 95G, thus forming n+ regions 22717, p− regions 22719, and associated oxide regions.

Step (H): FIG. 95H illustrates the structure after Step (H). Gate dielectric 22728 may be deposited and then an etch-back process may be employed to clear the gate dielectric from the top surface of WL wires 22703. Then gate electrode 22730 may be deposited such that an electrical coupling may be made from WL wires 22703 to gate electrode 22730. A CMP may be done to planarize the gate electrode 22730 regions such that the gate electrode 22730 may form many separate and electrically disconnected regions. Lithography and etch may be utilized to define gate regions over the p− silicon regions (e.g. p− Si regions 22719 after Step (G)). Note that gate width could be slightly larger than p− region width to compensate for overlay errors in lithography. A silicon oxide layer may be deposited and planarized. For clarity, the silicon oxide layer is shown transparent in the figure.

Step (I): FIG. 95I illustrates the structure after Step (I). Bit-line (BL) contacts 22734 may be formed by etching and deposition. These BL contacts may be shared among all layers of memory.

Step (J): FIG. 95J illustrates the structure after Step (J). Bit Lines (BLs) 22736 may be constructed. SL contacts (not shown) can be made into stair-like structures using techniques described in "Bit Cost Scalable Technology with Punch and Plug Process for Ultra High Density Flash Memory," *VLSI Technology,* 2007*IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

A floating-body DRAM has thus been constructed, with (1) horizontally-oriented transistors, (2) some of the memory cell control lines, e.g., source-lines SL, constructed of heavily doped silicon and embedded in the memory cell layer, (3) side gates simultaneously deposited over multiple memory layers and independently addressable, and (4) monocrystalline (or single-crystal) silicon layers obtained by layer transfer techniques such as ion-cut. WL wires 22703 need not be on the top layer of the peripheral circuits 22702, they may be integrated. WL wires 22703 may be constructed of another high temperature resistant material, such as NiCr.

Novel monolithic 3D memory technologies utilizing material resistance changes may be constructed in a similar manner. There may be many types of resistance-based memories including phase change memory, Metal Oxide memory, resistive RAM (RRAM), memristors, solid-electrolyte memory, ferroelectric RAM, MRAM, etc. Background information on these resistive-memory types may be given in "Overview of candidate device technologies for storage-class memory," *IBM Journal of Research and Development*, vol. 52, no. 4.5, pp. 449-464, July 2008 by Burr, G. W., et. al. The contents of this document are incorporated in this specification by reference.

As illustrated in FIG. 37A to FIG. 37K, a resistance-based zero additional masking steps per memory layer 3D memory may be constructed that is suitable for 3D IC manufacturing. This 3D memory may utilize junction-less transistors and may have a resistance-based memory element in series with a select or access transistor.

Figures 37A, 37B, 37C:
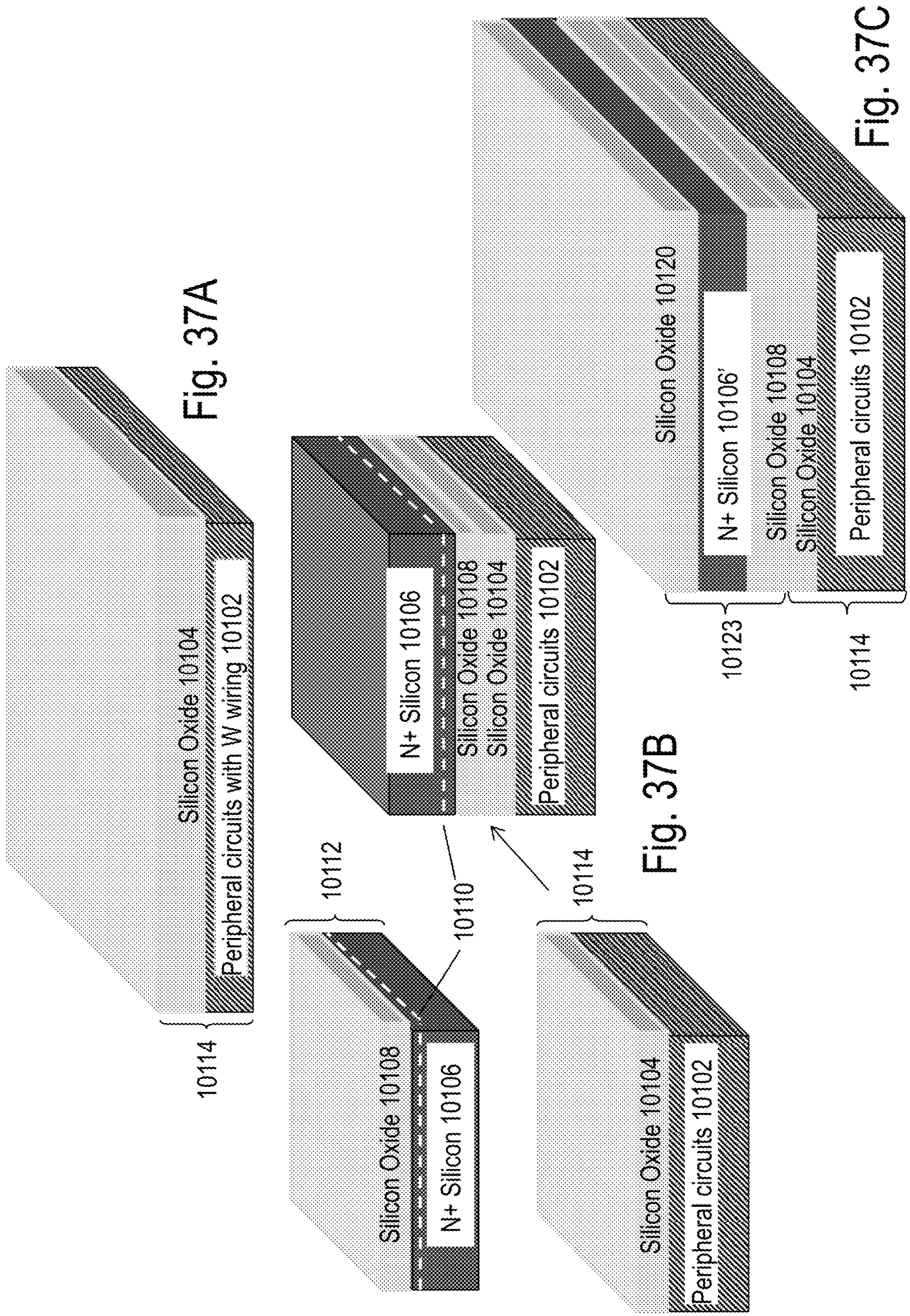

As illustrated in FIG. 37A, a silicon substrate with peripheral circuitry 10102 may be constructed with high temperature (greater than about 400° C.) resistant wiring, such as, for example, Tungsten. The peripheral circuitry substrate 10102 may include memory control circuits as well as circuitry for other purposes and of various types, such as, for example, analog, digital, RF, or memory. The peripheral circuitry substrate 10102 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuitry substrate 10102 may be prepared for oxide wafer bonding with a deposition of a silicon oxide layer 10104, thus forming acceptor wafer 10114.

As illustrated in FIG. 37B, a mono-crystalline silicon donor wafer 10112 may be, for example, processed to include a wafer sized layer of N+ doping (not shown) which may have a different dopant concentration than the N+ substrate 10106. The N+ doping layer may be formed by ion implantation and thermal anneal. A screen oxide layer 10108 may be grown or deposited prior to the implant to protect the silicon from implant contamination and to provide an oxide surface for later wafer to wafer bonding. A layer transfer demarcation plane 10110 (shown as a dashed line) may be formed in donor wafer 10112 within the N+ substrate 10106 or the N+ doping layer (not shown) by hydrogen implantation or other methods as previously described. Both the donor wafer 10112 and acceptor wafer 10114 may be prepared for wafer bonding as previously described and then bonded at the surfaces of oxide layer 10104 and oxide layer 10108, at a low temperature (less than about 400° C.) suitable for lowest stresses, or a moderate temperature (less than about 900° C.).

As illustrated in FIG. 37C, the portion of the N+ layer (not shown) and the N+ wafer substrate 10106 that are above the layer transfer demarcation plane 10110 may be removed by cleaving and polishing, or other processes as previously described, such as, for example, ion-cut or other methods, thus forming the remaining mono-crystalline silicon N+ layer 10106'. Remaining N+ layer 10106' and oxide layer 10108 may have been layer transferred to acceptor wafer 10114. The top surface of N+ layer 10106' may be chemically or mechanically polished smooth and flat. Now transistors or portions of transistors may be formed and aligned to the acceptor wafer 10114 alignment marks (not shown). Oxide layer 10120 may be deposited to prepare the surface for later oxide to oxide bonding, leading to the formation of the first $Si/SiO_2$ layer 10123 that includes silicon oxide layer 10120, N+ silicon layer 10106', and oxide layer 10108.

Figure 37D:
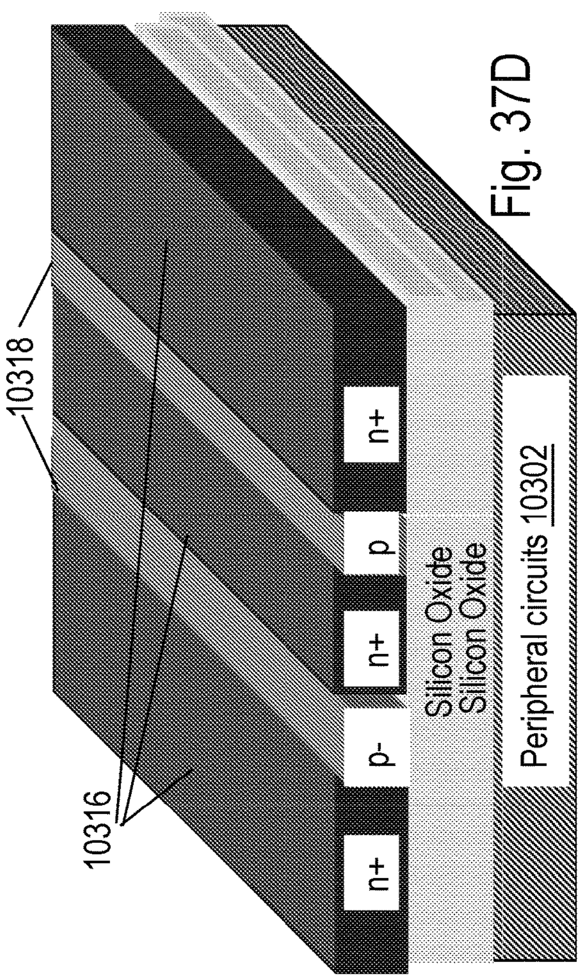

As illustrated in FIG. 37D, additional Si/SiO2 layers, such as, for example, second Si/SiO2 layer 10125 and third Si/SiO2 layer 10127, may each be formed as described in FIG. 37A to FIG. 37C. Oxide layer 10129 may be deposited to electrically isolate the top N+ silicon layer.

Figure 37E:
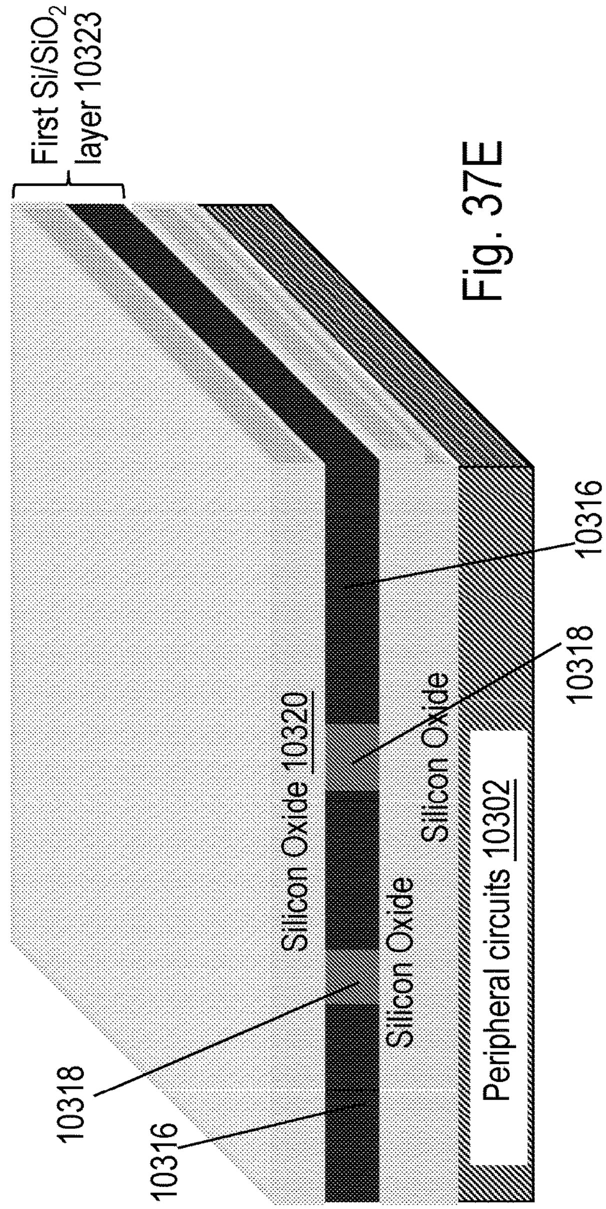

As illustrated in FIG. 37E, oxide layer 10129, third Si/SiO2 layer 10127, second Si/SiO2 layer 10125 and first Si/SiO2 layer 10123 may be lithographically defined and plasma/RIE etched to form a portion of the memory cell structure, which may now include regions of N+ silicon 10126 and oxide 10122. Thus, these transistor elements or portions may have been defined by a common lithography step, which also may be described as a single lithography step, same lithography step, or one lithography step.

Figure 37F:
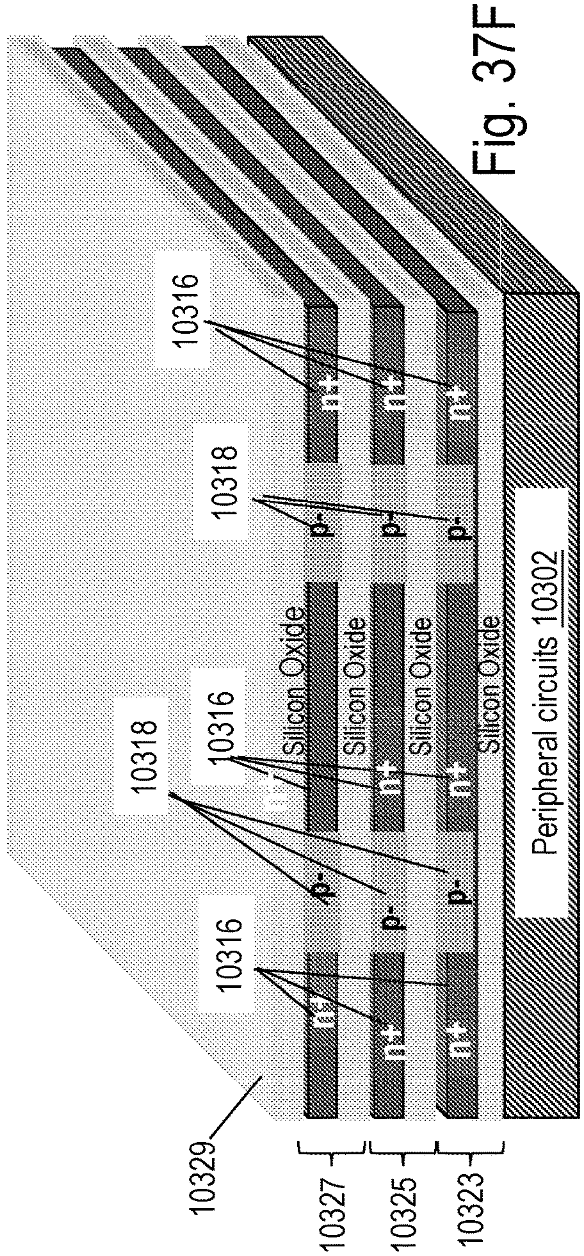

As illustrated in FIG. 37F, a gate dielectric and gate electrode material may be deposited, planarized with a chemical mechanical polish (CMP), and may then be lithographically defined and plasma/RIE etched to form gate dielectric regions 10128 which may either be self-aligned to and covered by gate electrodes 10130 (shown), or cover the entire N+ silicon 10126 and oxide 10122 multi-layer structure. The gate stack including gate electrode 10130 and gate dielectric 10128 may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal according to industry standard high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 37G:
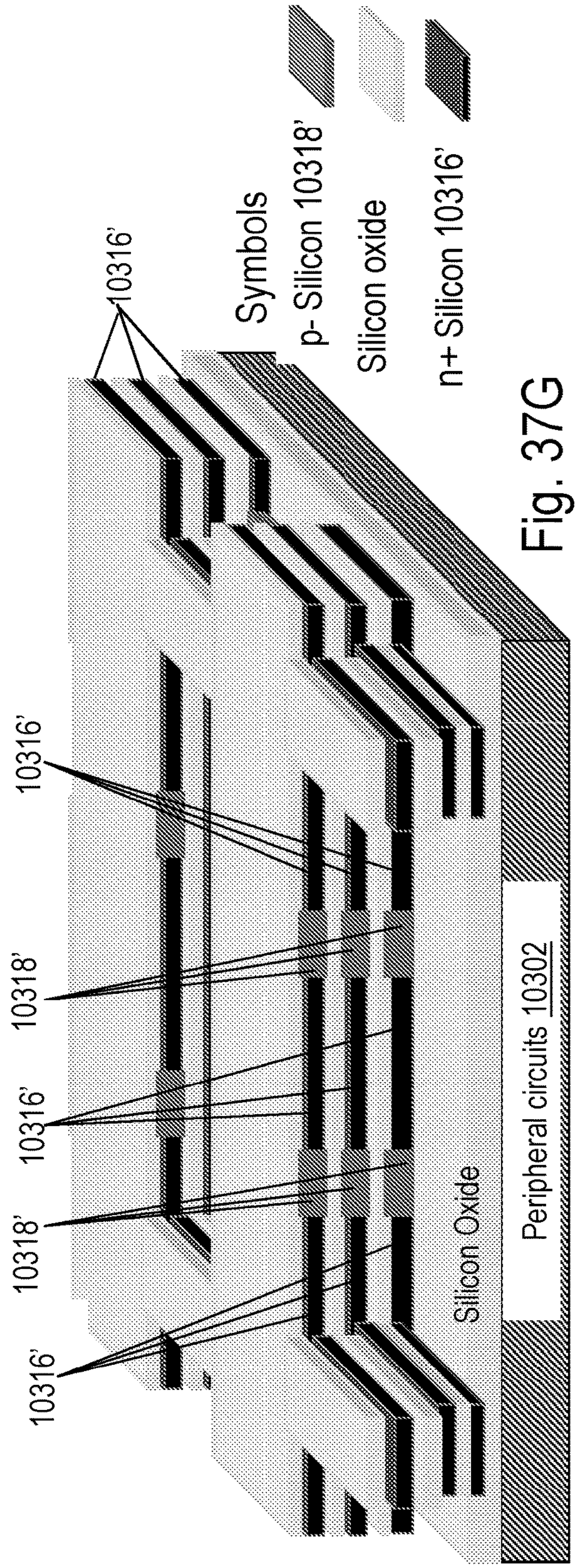

As illustrated in FIG. 37G, the entire structure may be covered with a gap fill oxide 10132, which may be planarized with chemical mechanical polishing. The oxide 10132 is shown transparent in the figure for clarity in illustration. Also shown are word-line regions (WL) 10150, coupled with and composed of gate electrodes 10130, and source-line regions (SL) 10152, composed of N+ silicon regions 10126.

Figures 37H, 37I:
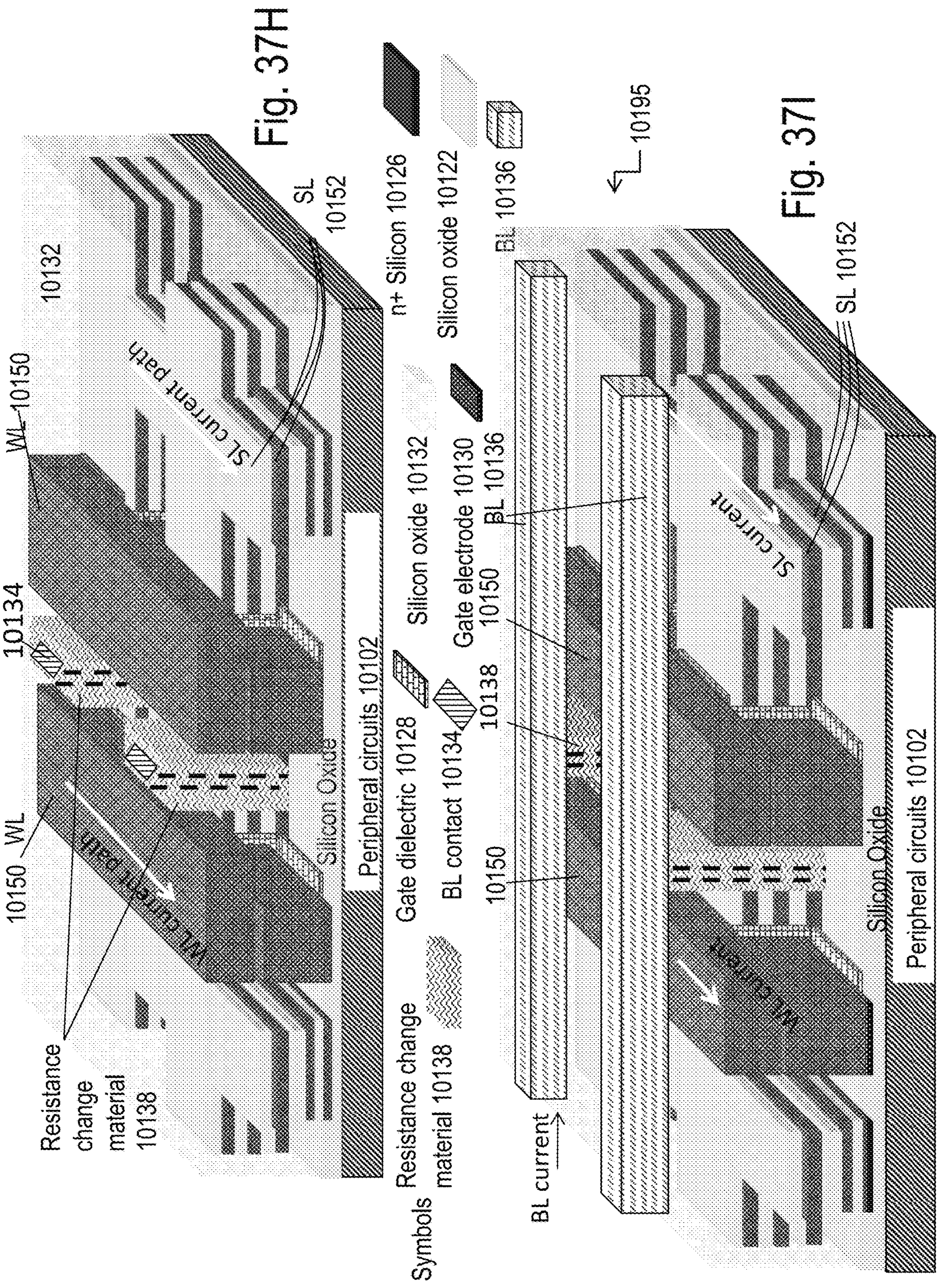

As illustrated in FIG. 37H, bit-line (BL) contacts 10134 may be lithographically defined, etched along with plasma/RIE through oxide 10132, the three N+ silicon regions 10126, and associated oxide vertical isolation regions to connect all memory layers vertically. BL contacts 10134 may then be processed by a photoresist removal. Resistive change material 10138, such as, for example, hafnium oxide, may then be deposited, for example, with atomic layer deposition (ALD). The electrode for the resistance change memory element may then be deposited by ALD to form the electrode/BL contact 10134. The excess deposited material may be polished to planarity at or below the top of oxide 10132. Each BL contact 10134 with resistive change material 10138 may be shared among substantially all layers of memory, shown as three layers of memory in FIG. 37H.

As illustrated in FIG. 37I, BL metal lines 10136 may be formed and may connect to the associated BL contacts 10134 with resistive change material 10138. Contacts and associated metal interconnect lines (not shown) may be formed for the WL and SL at the memory array 10195 edges. A through layer via (not shown) may be formed to electrically couple the BL, SL, and WL metallization to the acceptor wafer 10114 peripheral circuitry via an acceptor wafer metal connect pad (not shown).

Figures 37J, 37K:
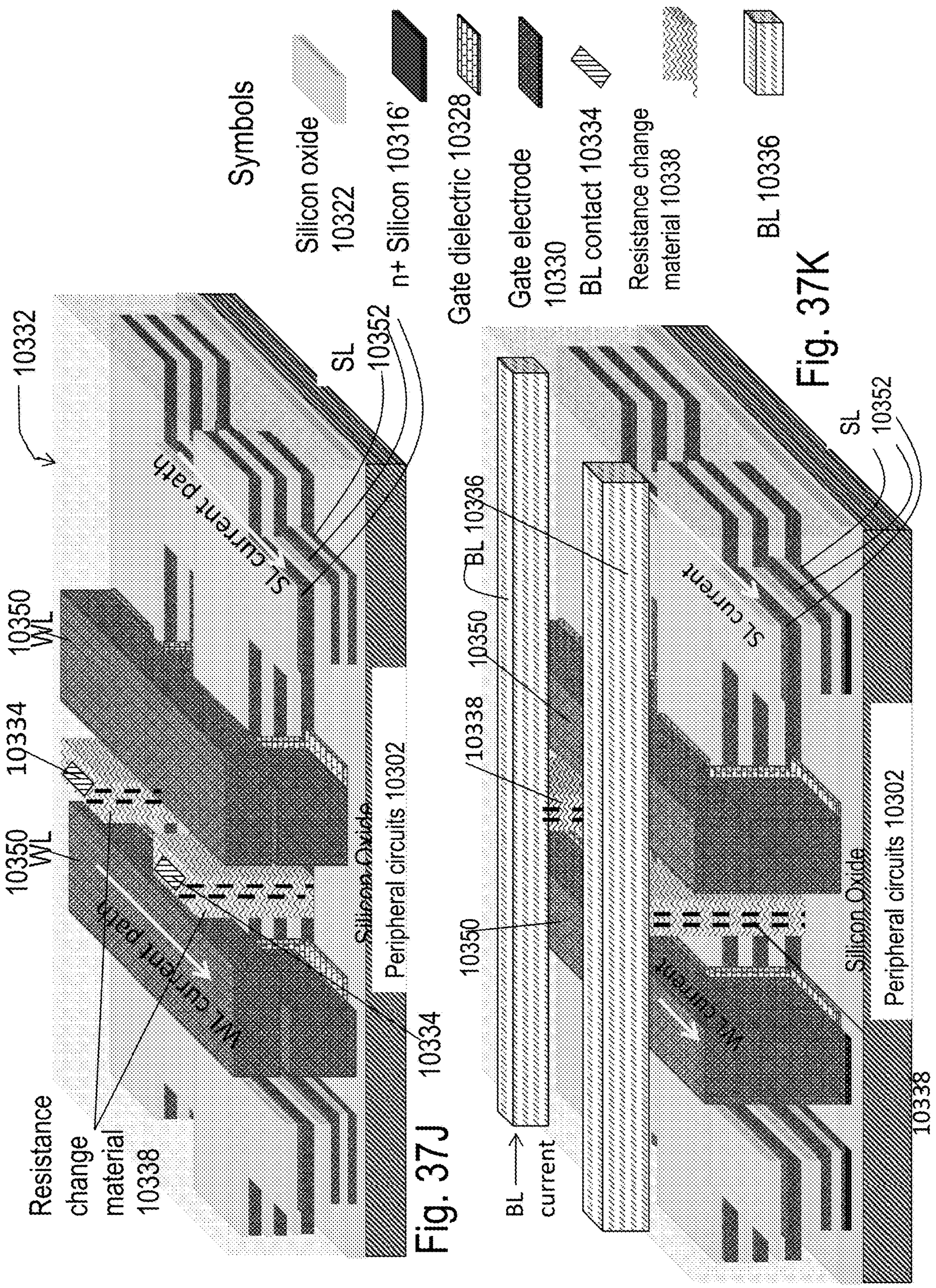

FIG. 37J1 shows a cross sectional cut II of FIG. 37J, while FIG. 37J2 shows a cross-sectional cut III of FIG. 37J. FIG. 37J1 shows BL metal line 10136, oxide 10132, BL contact/electrode 10134, resistive change material 10138, WL regions 10150, gate dielectric 10128, N+ silicon regions 10126, and peripheral circuitry substrate 10102. The BL contact/electrode 10134 may couple to one side of the three levels of resistive change material 10138. The other side of the resistive change material 10138 may be coupled to N+ regions 10126. FIG. 37J2 shows BL metal lines 10136, oxide 10132, gate electrode 10130, gate dielectric 10128, N+ silicon regions 10126, interlayer oxide region ('ox'), and peripheral circuitry substrate 10102. The gate electrode 10130 may be common to substantially all six N+ silicon regions 10126 and may form six two-sided gated junction-less transistors as memory select transistors.

As illustrated in FIG. 37K, a single exemplary two-sided gate junction-less transistor on the first Si/SiO2 layer 10123 may include N+ silicon region 10126 (functioning as the source, drain, and transistor channel), and two gate electrodes 10130 with associated gate dielectrics 10128. The transistor may be electrically isolated from beneath by oxide layer 10108.

This flow may enable the formation of a resistance-based multi-layer or 3D memory array with zero additional masking steps per memory layer, which may utilize junction-less transistors and may have a resistance-based memory element in series with a select transistor, and may be constructed by layer transfers of wafer sized doped mono-crystalline silicon layers, and this 3D memory array 10195 may be connected to an underlying multi-metal layer semiconductor device.

Persons of ordinary skill in the art will appreciate that the illustrations in FIG. 37A through FIG. 37K are exemplary only and are not drawn to scale. Such skilled persons will further appreciate that many variations may be possible such as, for example, the transistors may be of another type such as RCATs. Additionally, doping of each N+ layer may be slightly different to compensate for interconnect resistances. Moreover, the stacked memory layer may be connected to a periphery circuit that may be above the memory stack. Further, each gate of the double gate 3D resistance based memory can be independently controlled for better control of the memory cell. Many other modifications within the scope of the illustrated embodiments of the invention will suggest themselves to such skilled persons after reading this specification. Thus the invention is to be limited only by the appended claims.

Charge trap NAND (Negated AND) memory devices may be another form of popular commercial non-volatile memories. Charge trap device may store their charge in a charge trap layer, wherein this charge trap layer then may influence the channel of a transistor. Background information on charge-trap memory can be found in "*Integrated Interconnect Technologies for* 3D Nanoelectronic Systems", Chapter 13, Artech House, 2009 by Bakir and Meindl (hereinafter Bakir), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Introduction to Flash memory," Proc. IEEE 91, 489-502 (2003) by R. Bez, et al., Work described in Bakir utilized selective epitaxy, laser recrystallization, or polysilicon to form the transistor channel, which can result in less than satisfactory transistor performance. The architectures shown in FIG. 38 following may be relevant for any type of charge-trap memory.

As illustrated in FIG. 38A to FIG. 38G, a charge trap based 3D memory with zero additional masking steps per memory layer 3D memory may be constructed that may be suitable for 3D IC manufacturing. This 3D memory may utilize NAND strings of charge trap junction-less transistors with junction-less select transistors constructed in mono-crystalline silicon.

Figures 38A, 38B, 38C:
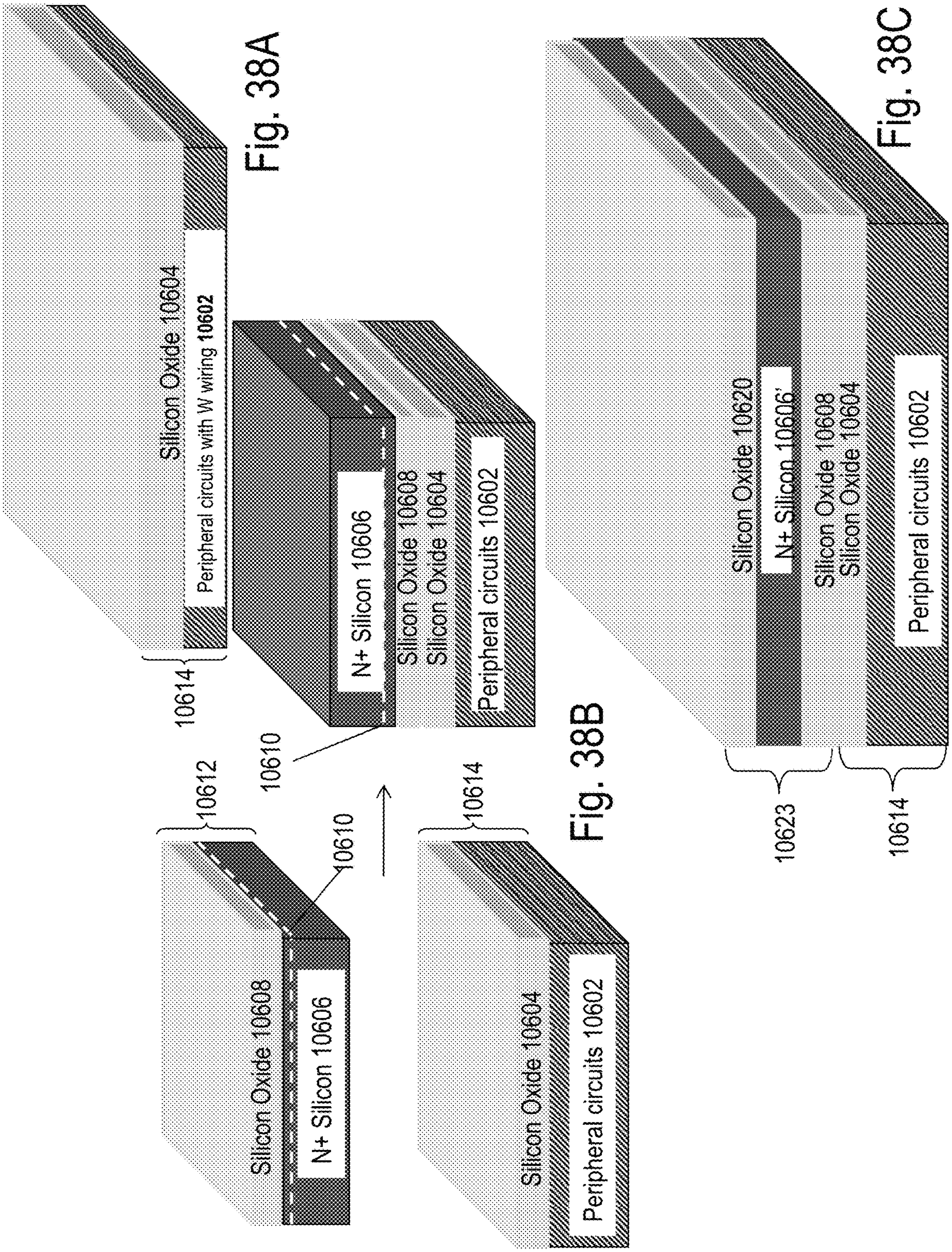
FIG. 38A-FIG. 38G are exemplary drawing illustrations of the formation of a charge trap memory transistor.

As illustrated in FIG. 38A, a silicon substrate with peripheral circuitry 10602 may be constructed with high temperature (e.g., greater than about 400° C.) resistant wiring, such as, for example, Tungsten. The peripheral circuitry substrate 10602 may include memory control circuits as well as circuitry for other purposes and of various types, such as, for example, analog, digital, RF, or memory. The peripheral circuitry substrate 10602 may include peripheral circuits that can withstand an additional rapid-thermal-anneal (RTA) or flash anneal and still remain operational and retain good performance. For this purpose, the peripheral circuits may be formed such that they have been subject to a weak RTA or no RTA for activating dopants. The top surface of the peripheral circuitry substrate 10602 may be prepared for oxide wafer bonding with a deposition of a silicon oxide layer 10604, thus forming acceptor substrate 10614.

As illustrated in FIG. 38B, a mono-crystalline silicon donor wafer 10612 may be processed to include a wafer sized layer of N+ doping (not shown) which may have a different dopant concentration than the N+ substrate 10606. The N+ doping layer may be formed by ion implantation and thermal anneal. A screen oxide layer 10608 may be grown or deposited prior to the implant to protect the silicon from implant contamination and to provide an oxide surface for later wafer to wafer bonding. A layer transfer demarcation plane 10610 (shown as a dashed line) may be formed in donor wafer 10612 within the N+ substrate 10606 or the N+ doping layer (not shown) by hydrogen implantation or other methods as previously described. Both the donor wafer 10612 and acceptor substrate 10614 may be prepared for wafer bonding as previously described and then bonded at the surfaces of oxide layer 10604 and oxide layer 10608, at a low temperature (e.g., less than about 400° C. suitable for lowest stresses), or a moderate temperature (e.g., less than about 900° C.).

As illustrated in FIG. 38C, the portion of the N+ layer (not shown) and the N+ wafer substrate 10606 that may be above the layer transfer demarcation plane 10610 may be removed by cleaving and polishing, or other processes as previously described, such as ion-cut or other methods, thus forming the remaining mono-crystalline silicon N+ layer 10606'. Remaining N+ layer 10606' and oxide layer 10608 may have been layer transferred to acceptor substrate 10614. The top surface of N+ layer 10606' may be chemically or mechanically polished smooth and flat. Oxide layer 10620 may be deposited to prepare the surface for later oxide to oxide bonding. This bonding may now form the first Si/SiO2 layer 10623 including silicon oxide layer 10620, N+ silicon layer 10606', and oxide layer 10608.

Figure 38D:
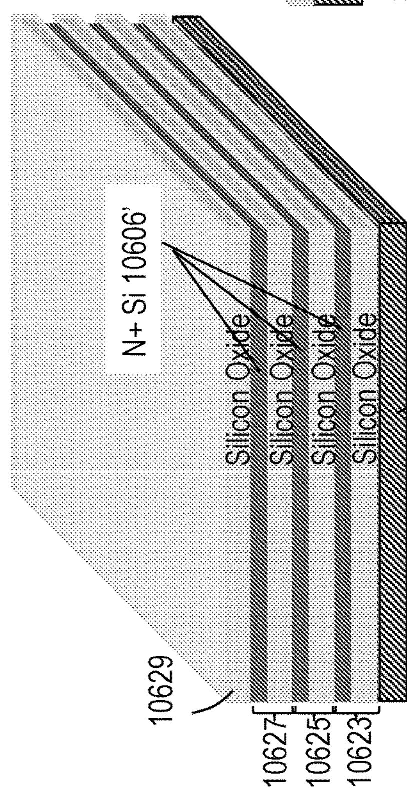

As illustrated in FIG. 38D, additional Si/SiO2 layers, such as, for example, second Si/SiO2 layer 10625 and third Si/SiO2 layer 10627, may each be formed as described in FIG. 38A to FIG. 38C. Oxide layer 10629 may be deposited to electrically isolate the top N+ silicon layer.

Figure 38E:
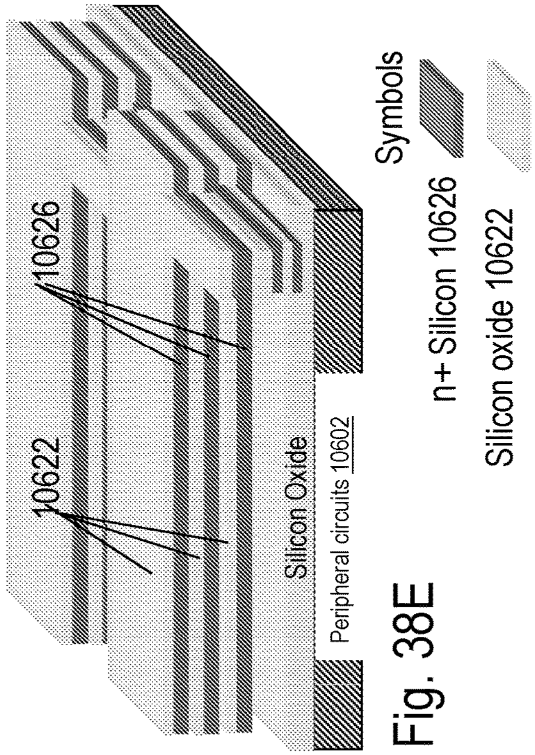

As illustrated in FIG. 38E, oxide layer 10629, third Si/SiO2 layer 10627, second Si/SiO2 layer 10625 and first Si/SiO2 layer 10623 may be lithographically defined and plasma/RIE etched to form a portion of the memory cell structure, which may now include regions of N+ silicon 10626 and oxide 10622. Thus, these transistor elements or portions may have been defined by a common lithography step, which also may be described as a single lithography step, same lithography step, or one lithography step.

Figure 38F:
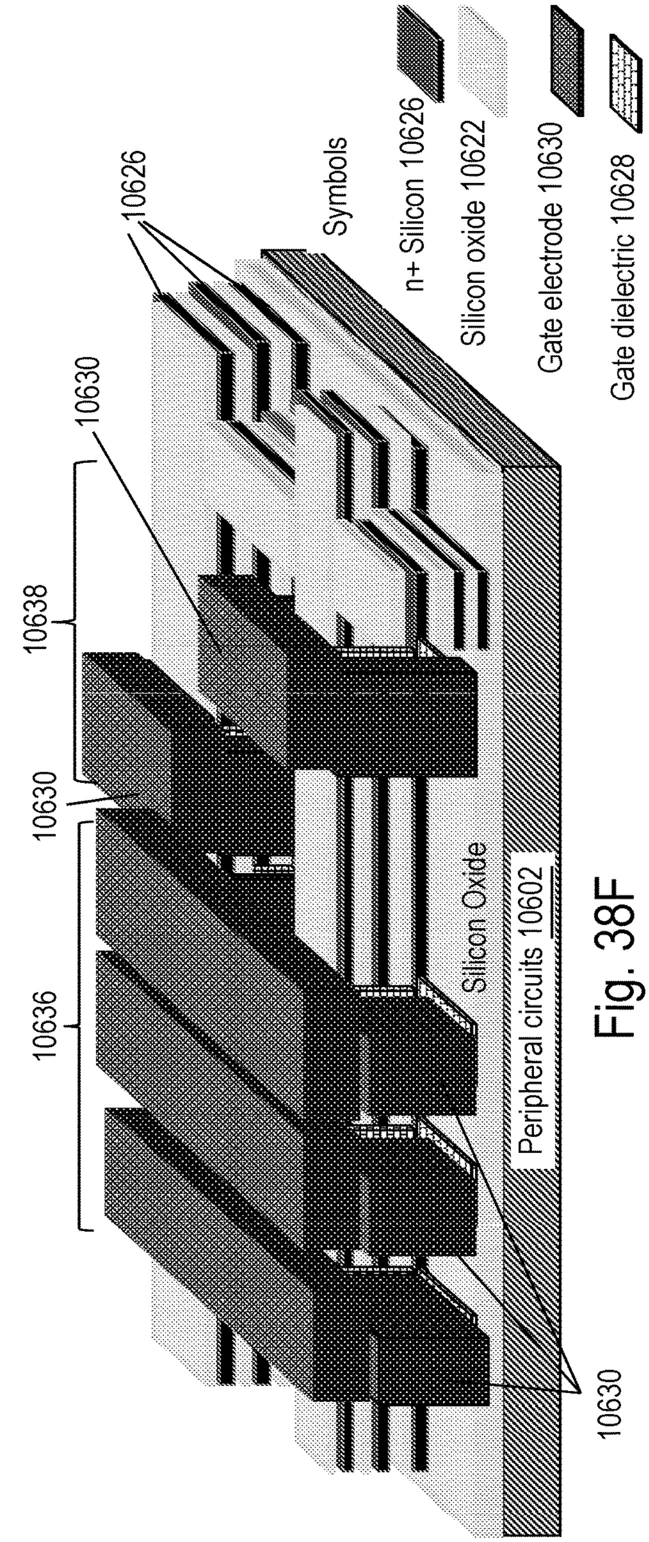

As illustrated in FIG. 38F, a gate stack may be formed with growth or deposition of a charge trap gate dielectric layer, such as thermal oxide and silicon nitride layers (ONO: Oxide-Nitride-Oxide), and a gate metal electrode layer, such as doped or undoped poly-crystalline silicon. The gate metal electrode layer may then be planarized with chemical mechanical polishing. Alternatively, the charge trap gate dielectric layer may include silicon or III-V nano-crystals encased in an oxide. The select transistor area 10638 may include a non-charge trap dielectric. The gate metal electrode regions 10630 and gate dielectric regions 10628 of both the NAND string area 10636 and select transistor area 10638 may be lithographically defined and plasma/RIE etched.

Figure 38G:
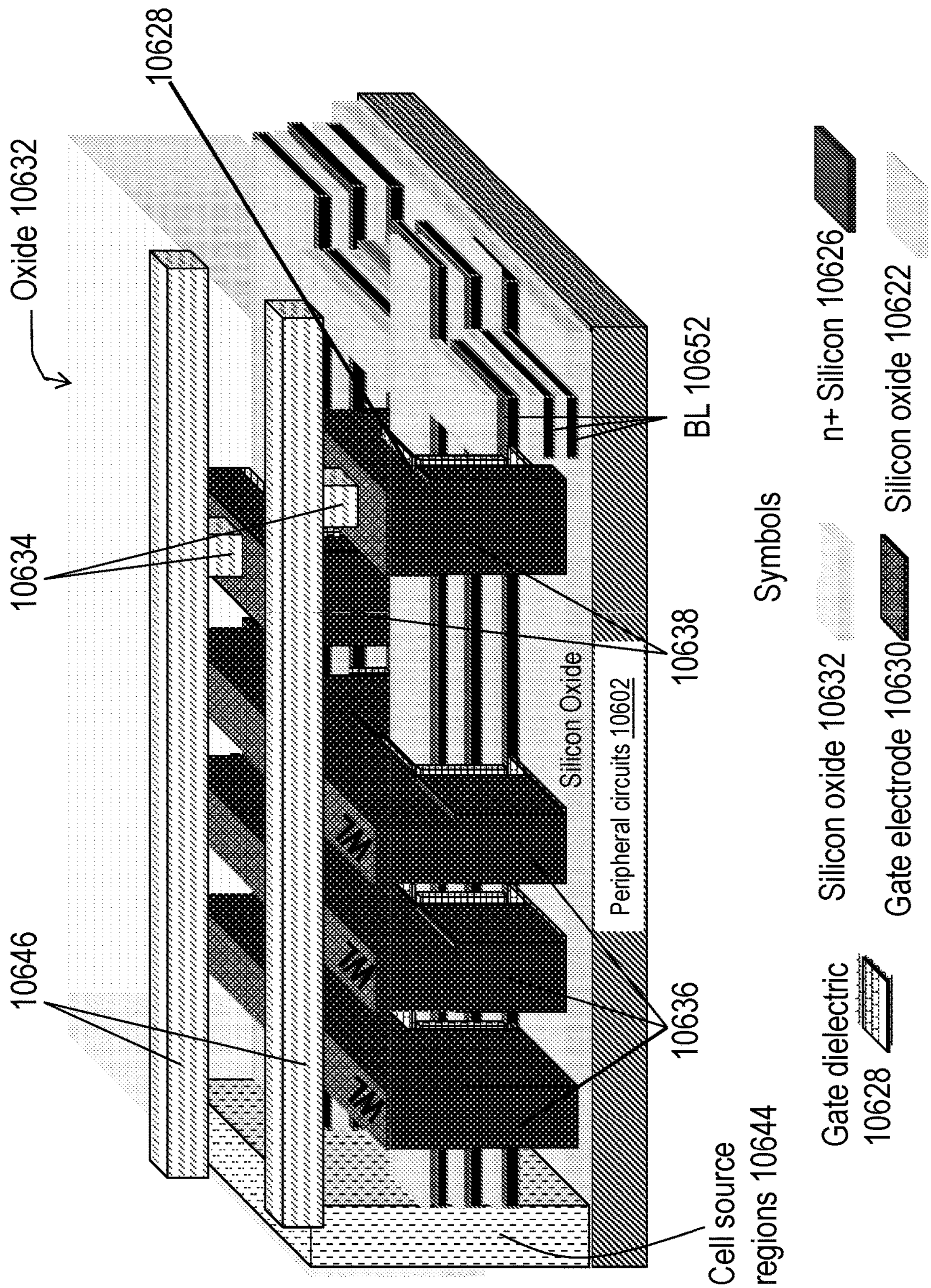

As illustrated in FIG. 38G, the entire structure may be covered with a gap fill oxide 10632, which may be planarized with chemical mechanical polishing. The gap fill oxide 10632 is shown transparent in the figure for clarity in illustration. Select metal lines 10646 may be formed and connected to the associated select gate contacts 10634. Contacts and associated metal interconnect lines (not shown) may be formed for the WL and SL at the memory array edges. Word-line regions (WL) 10636, gate metal electrode regions 10630, and bit-line regions (BL) 10652 including indicated N+ silicon regions 10626, are shown. Source regions 10644 may be formed by a trench contact etch and filled to couple to the N+ silicon regions on the source end of the NAND string 10636. A through layer via (not shown) may be formed to electrically couple the BL, SL, and WL metallization to the acceptor substrate 10614 peripheral circuitry via an acceptor wafer metal connect pad (not shown).

This flow may enable the formation of a charge trap based 3D memory with zero additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIG. 38A through FIG. 38G are exemplary only and are not drawn to scale. Such skilled persons will further appreciate that many variations may be possible such as, for example, BL or SL contacts may be constructed in a staircase manner as described previously. Moreover, the stacked memory layer may be connected to a periphery circuit that may be above the memory stack. Additionally, each tier of memory could be configured with a slightly different donor wafer N+ layer doping profile. Further, the memory could be organized in a different manner, such as BL and SL interchanged, or where buried wiring for the memory array may be below the memory layers but above the periphery. Additional types of 3D charge trap memories may be constructed by layer transfer of mono-crystalline silicon; for example, those found in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al., and "Multi-layered Vertical Gate NAND Flash overcoming stacking limit for terabit density storage", Symposium on VLSI Technology, 2009 by W. Kim, S. Choi, et al. Many other modifications within the scope of the illustrated embodiments of the invention will suggest themselves to such skilled persons after reading this specification. Thus the invention is to be limited only by the appended claims.

Floating gate (FG) memory devices may be another form of popular commercial non-volatile memories. Floating gate devices may store their charge in a conductive gate (FG) that may be nominally isolated from unintentional electric fields, wherein the charge on the FG then influences the channel of a transistor. Background information on floating gate flash memory can be found in "Introduction to Flash memory", Proc. IEEE 91, 489-502 (2003) by R. Bez, et al. The architectures shown in FIG. 39 and FIG. 40 may be relevant for any type of floating gate memory.

As illustrated in FIG. 39A to FIG. 39G, a floating gate based 3D memory with two additional masking steps per memory layer may be constructed that is suitable for 3D IC manufacturing. This 3D memory may utilize NAND strings of floating gate transistors constructed in mono-crystalline silicon.

Figures 39A, 39B, 39C, 39D, 39E, 39F, 39G:
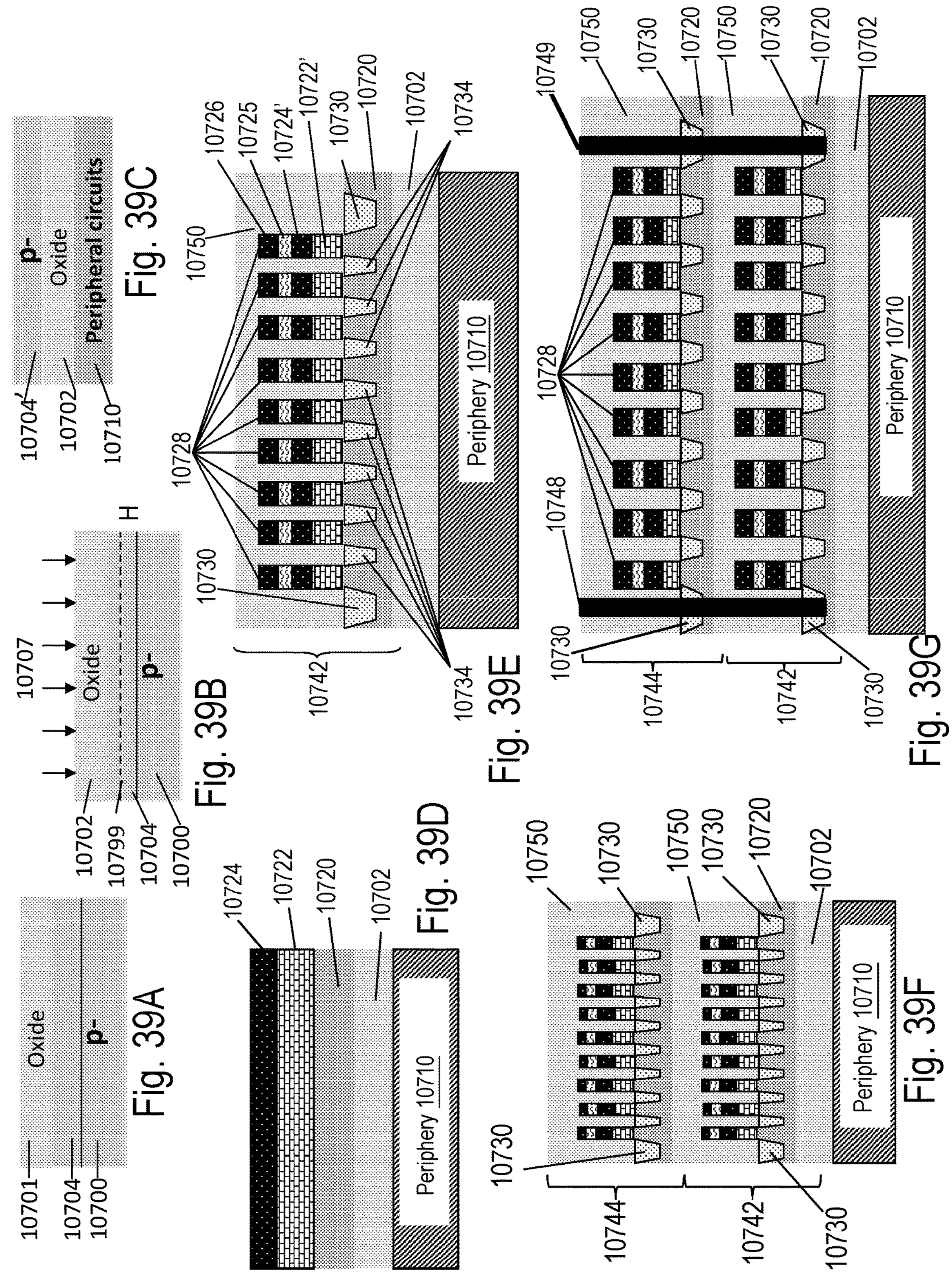
FIG. 39A-FIG. 39G are exemplary drawing illustrations of the formation of a floating gate memory transistor.

As illustrated in FIG. 39A, a P− substrate donor wafer 10700 may be processed to include a wafer sized layer of P− doping 10704. The P-doped layer 10704 may have the same or a different dopant concentration than the P− substrate donor wafer 10700. The P− doped layer 10704 may have a vertical dopant gradient. The P− doped layer 10704 may be formed by ion implantation and thermal anneal. A screen oxide 10701 may be grown before the implant to protect the silicon from implant contamination and to provide an oxide surface for later wafer to wafer bonding.

As illustrated in FIG. 39B, the top surface of P− substrate donor wafer 10700 may be prepared for oxide wafer bonding with a deposition of an oxide or by thermal oxidation of the P− doped layer 10704 to form oxide layer 10702, or a re-oxidation of implant screen oxide 10701. A layer transfer demarcation plane 10799 (shown as a dashed line) may be formed in P− substrate donor wafer 10700 or P− doped layer 10704 (shown) by hydrogen implantation 10707 or other methods as previously described. Both the P− substrate donor wafer 10700 and acceptor wafer 10710 may be prepared for wafer bonding as previously described and then bonded, for example, at a low temperature (less than about 400° C.) to minimize stresses. The portion of the P− doped layer 10704 and the P− substrate donor wafer 10700 that are above the layer transfer demarcation plane 10799 may be removed by cleaving and polishing, or other processes as previously described, such as ion-cut or other methods.

As illustrated in FIG. 39C, the remaining P− doped layer 10704', and oxide layer 10702 may have been layer transferred to acceptor wafer 10710. Acceptor wafer 10710 may include peripheral circuits such that they can withstand an additional rapid-thermal-anneal (RTA) or flash anneal and may still remain operational and retain good performance. For this purpose, the peripheral circuits may be formed such that they have been subjected to a weak RTA or no RTA for activating dopants. Also, the peripheral circuits may utilize a refractory metal such as, for example, tungsten that can withstand high temperatures greater than about 400° C. The top surface of P− doped layer 10704' may be chemically or mechanically polished smooth and flat. Transistors may be formed and aligned to the acceptor wafer 10710 alignment marks (not shown).

As illustrated in FIG. 39D a partial gate stack may be formed with growth or deposition of a tunnel oxide 10722, such as, for example, thermal oxide, and a FG gate metal material 10724, such as, for example, doped or undoped poly-crystalline silicon. Shallow trench isolation (STI) oxide regions (not shown) may be lithographically defined and plasma/RIE etched to at least the top level of oxide layer 10702, thus removing regions of P− doped layer 10704' of mono-crystalline silicon and forming P− doped regions 10720. A gap-fill oxide may be deposited and CMP'ed flat to form conventional STI oxide regions (not shown).

As illustrated in FIG. 39E, an inter-poly oxide layer, such as silicon oxide and silicon nitride layers (ONO: Oxide-Nitride-Oxide), and a Control Gate (CG) gate metal material, such as doped or undoped poly-crystalline silicon, may be deposited. The gate stacks 10728 may be lithographically defined and plasma/RIE etched, thus substantially removing regions of CG gate metal material, inter-poly oxide layer, FG gate metal material 10724, and tunnel oxide 10722. This removal may result in the gate stacks 10728 including CG gate metal regions 10726, inter-poly oxide regions 10725, FG gate metal regions 10724', and tunnel oxide regions 10722'. For example, only one gate stack 10728 is annotated with region tie lines for clarity in illustration. A self-aligned N+ source and drain implant may be performed to create inter-transistor source and drains 10734 and end ofNAND string source and drains 10730. The entire structure may be covered with a gap fill oxide 10750, which may be planarized with chemical mechanical polishing. The oxide surface may be prepared for oxide to oxide wafer bonding as previously described. This bonding may now form the first tier of memory transistors 10742 including oxide 10750, gate stacks 10728, inter-transistor source and drains 10734, end of NAND string source and drains 10730, P− silicon regions 10720, and oxide layer 10702.

As illustrated in FIG. 39F, the transistor layer formation, bonding to acceptor wafer 10710 oxide 10750, and subsequent transistor formation as described in FIG. 39A to FIG. 39D may be repeated to form the second tier 10744 of memory transistors on top of the first tier of memory transistors 10742. After substantially all the memory layers are constructed, a rapid thermal anneal (RTA) or flash anneal may be conducted to activate the dopants in substantially all of the memory layers and in the acceptor wafer 10710 peripheral circuits. Alternatively, optical anneals, such as, for example, a laser based anneal, may be performed.

As illustrated in FIG. 39G, source line (SL) ground contact 10748 and bit line contact 10749 may be lithographically defined, etched with plasma/RIE through oxide 10750, end of NAND string source and drains 10730, and P− regions 10720 of each memory tier, and the associated oxide vertical isolation regions to connect substantially all memory layers vertically. SL ground contact 10748 and bit line contact 10749 may then be processed by a photoresist removal. Metal or heavily doped poly-crystalline silicon may be utilized to fill the contacts and metallization utilized to form BL and SL wiring (not shown). The gate stacks 10728 may be connected with a contact and metallization to form the word-lines (WLs) and WL wiring (not shown). A through layer via (not shown) may be formed to electrically couple the BL, SL, and WL metallization to the acceptor substrate 10710 peripheral circuitry via an acceptor wafer metal connect pad (not shown).

This flow may enable the formation of a floating gate based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIG. 39A through FIG. 39G are exemplary only and are not drawn to scale. Such skilled persons will further appreciate that many variations may be possible such as, for example, BL or SL select transistors may be constructed within the process flow. Moreover, the stacked memory layer may be connected to a periphery circuit that is above the memory stack. Additionally, each tier of memory could be configured with a slightly different donor wafer P− layer doping profile. Further, the memory could be organized in a different manner, such as BL and SL interchanged, or where buried wiring for the memory array may be below the memory layers but above the periphery. Many other modifications within the scope of the illustrative embodiments of the invention will suggest themselves to such skilled persons after reading this specification. Thus the invention is to be limited only by the appended claims.

As illustrated in FIG. 40A to FIG. 40H, a floating gate based 3D memory with one additional masking step per memory layer 3D memory may be constructed that can be suitable for 3D IC manufacturing. This 3D memory may utilize 3D floating gate junction-less transistors constructed in mono-crystalline silicon.

Figures 40A, 40B, 40C, 40D:
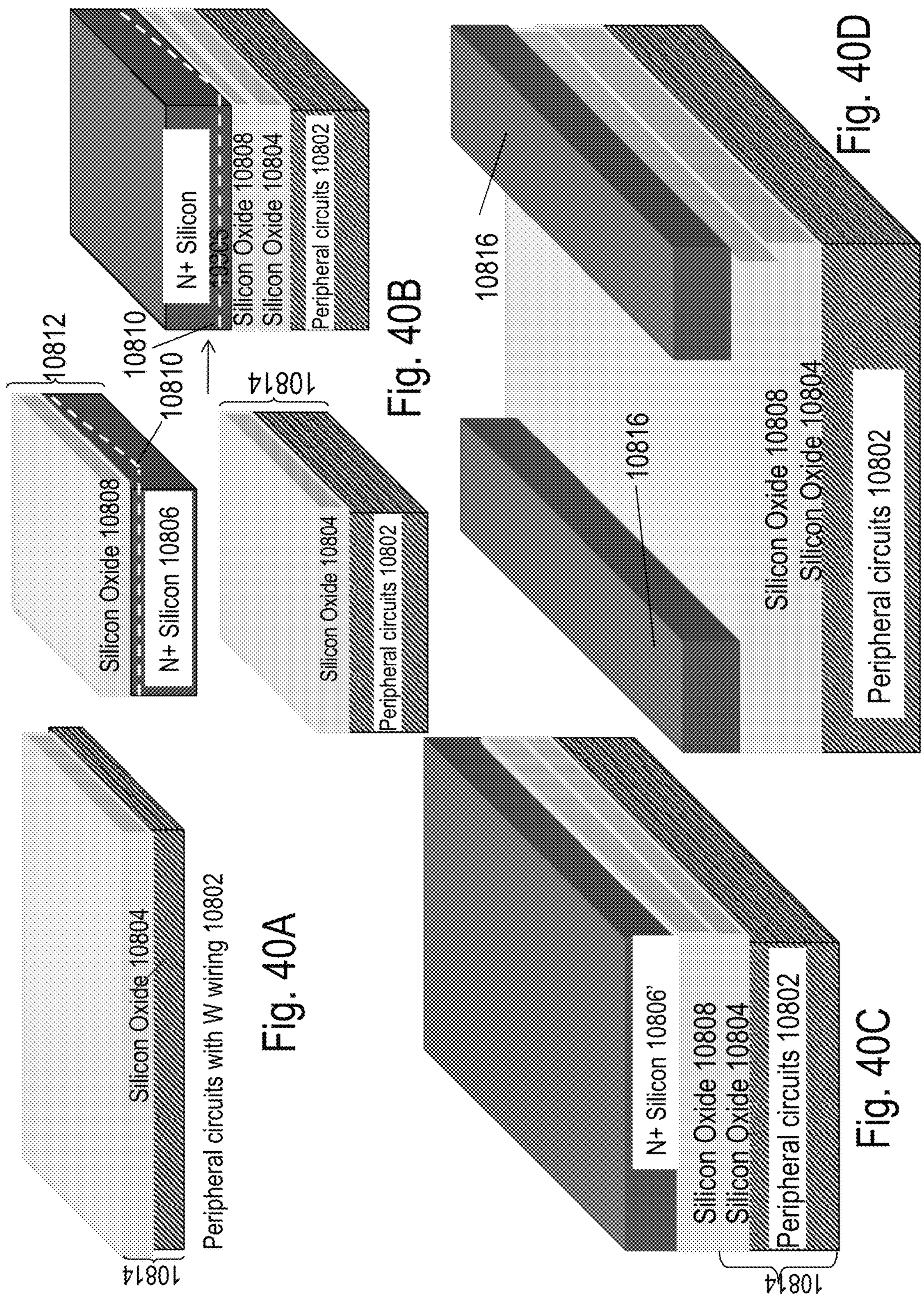
FIG. 40A-FIG. 40H are exemplary drawing illustrations of the formation of a floating gate memory transistor.

As illustrated in FIG. 40A, a silicon substrate with peripheral circuitry 10802 may be constructed with high temperature (greater than about 400° C.) resistant wiring, such as, for example, Tungsten. The peripheral circuitry substrate 10802 may include memory control circuits as well as circuitry for other purposes and of various types, such as, for example, analog, digital, RF, or memory. The peripheral circuitry substrate 10802 may include peripheral circuits that can withstand an additional rapid-thermal-anneal (RTA) or flash anneal and still remain operational and retain good performance. For this purpose, the peripheral circuits may be formed such that they may have been subject to a weak RTA or no RTA for activating dopants. The top surface of the peripheral circuitry substrate 10802 may be prepared for oxide wafer bonding with a deposition of a silicon oxide layer 10804, thus forming acceptor wafer 10814.

As illustrated in FIG. 40B, a mono-crystalline N+ doped silicon donor wafer 10812 may be processed to include a wafer sized layer of N+ doping (not shown) which may have a different dopant concentration than the N+ substrate 10806. The N+ doping layer may be formed by ion implantation and thermal anneal. A screen oxide layer 10808 may be grown or deposited prior to the implant to protect the silicon from implant contamination and to provide an oxide surface for later wafer to wafer bonding. A layer transfer demarcation plane 10810 (shown as a dashed line) may be formed in donor wafer 10812 within the N+ substrate 10806 or the N+ doping layer (not shown) by hydrogen implantation or other methods as previously described. Both the donor wafer 10812 and acceptor wafer 10814 may be prepared for wafer bonding as previously described and then may be bonded at the surfaces of oxide layer 10804 and oxide layer 10808, at a low temperature (e.g., less than about 400° C. suitable for lowest stresses), or a moderate temperature (e.g., less than about 900° C.).

As illustrated in FIG. 40C, the portion of the N+ layer (not shown) and the N+ wafer substrate 10806 that are above the layer transfer demarcation plane 10810 may be removed by cleaving and polishing, or other processes as previously described, such as ion-cut or other methods, thus forming the remaining mono-crystalline silicon N+ layer 10806'. Remaining N+ layer 10806' and oxide layer 10808 may have been layer transferred to acceptor wafer 10814. The top surface of N+ layer 10806' may be chemically or mechanically polished smooth and flat. Transistors or portions of transistors may be formed and aligned to the acceptor wafer 10814 alignment marks (not shown).

As illustrated in FIG. 40D, N+ regions 10816 may be lithographically defined and then etched with plasma/RIE, thus removing regions of N+ layer 10806' and stopping on or partially within oxide layer 10808.

Figure 40F:
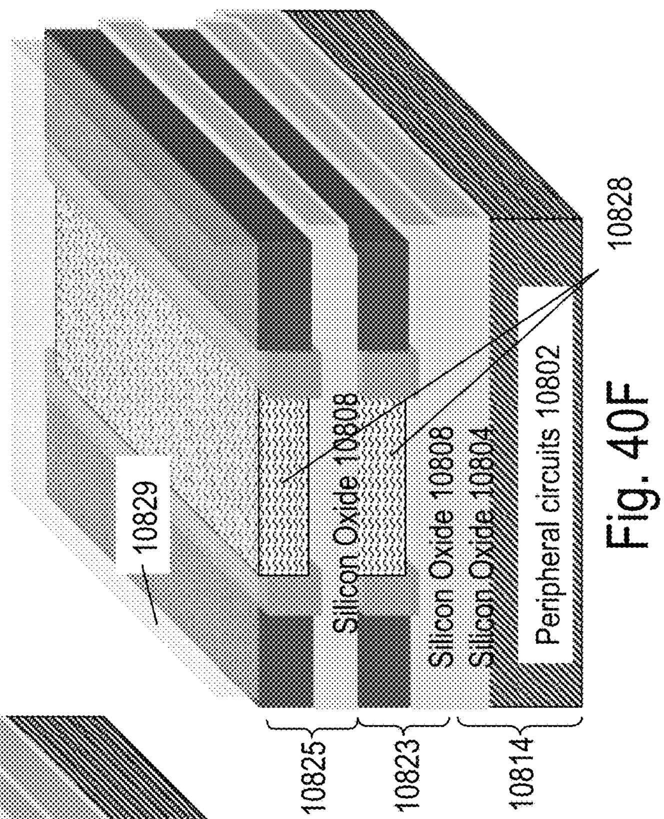
Figure 40E:
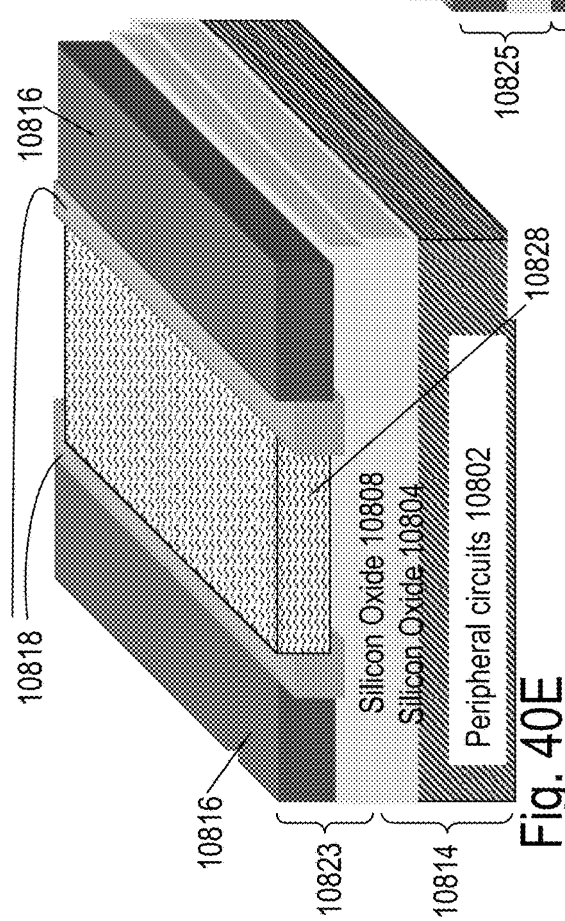

As illustrated in FIG. 40E, a tunneling dielectric 10818 may be grown or deposited, such as thermal silicon oxide, and a floating gate (FG) material 10828, such as doped or undoped poly-crystalline silicon, may be deposited. The structure may be planarized by chemical mechanical polishing to approximately the level of the N+ regions 10816. The surface may be prepared for oxide to oxide wafer bonding as previously described, such as a deposition of a thin oxide. This bonding may now form the first memory layer 10823 including future FG regions 10828, tunneling dielectric 10818, N+ regions 10816 and oxide layer 10808.

As illustrated in FIG. 40F, the N+ layer formation, bonding to an acceptor wafer, and subsequent memory layer formation as described in FIG. 40A to 108E may be repeated to form the second layer of memory 10825 on top of the first memory layer 10823. A layer of oxide 10829 may then be deposited.

Figure 40G:
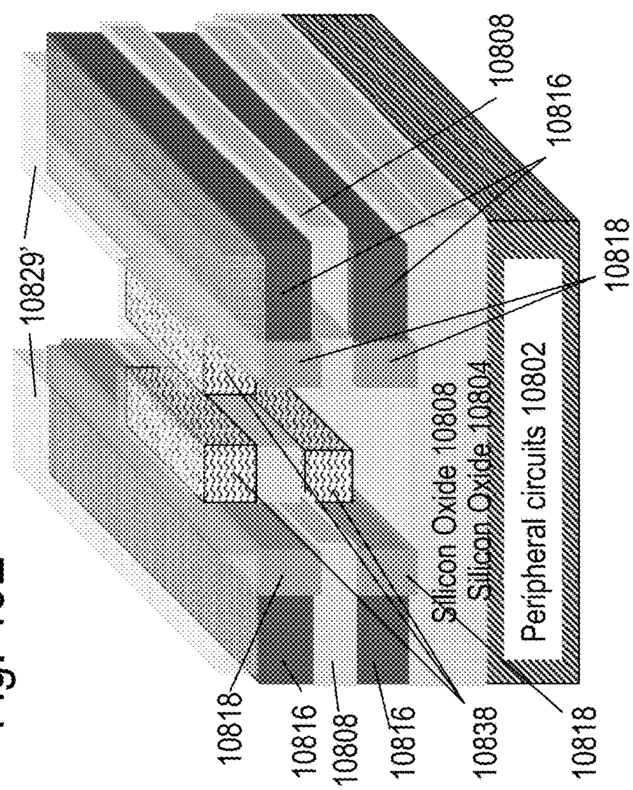

As illustrated in FIG. 40G, FG regions 10838 may be lithographically defined and then etched with, for example, plasma/RIE, removing portions of oxide layer 10829, future FG regions 10828 and oxide layer 10808 on the second layer of memory 10825 and future FG regions 10828 on the first memory layer 10823, thus stopping on or partially within oxide layer 10808 of the first memory layer 10823.

Figure 40H:
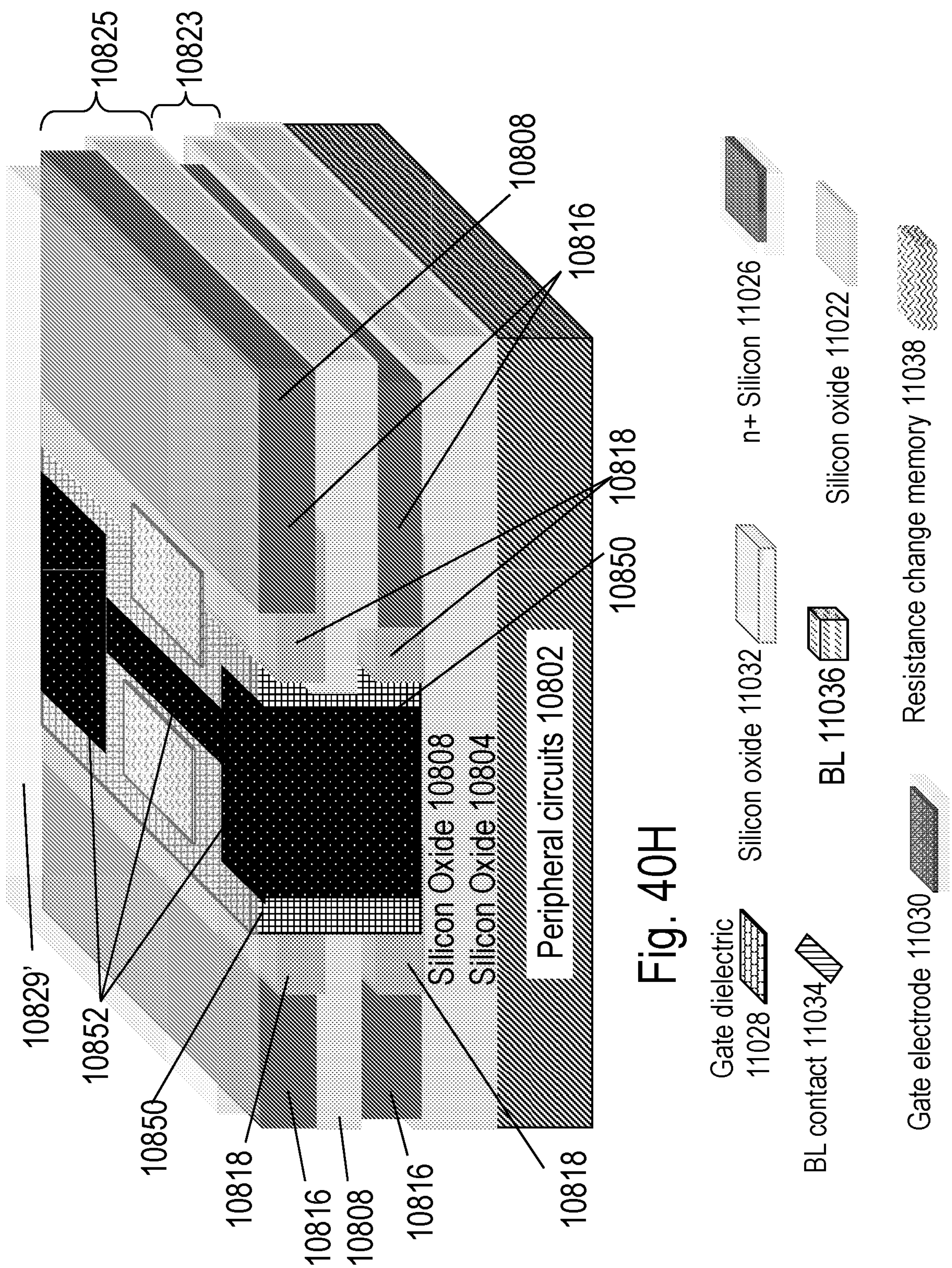

As illustrated in FIG. 40H, an inter-poly oxide layer 10850, such as, for example, silicon oxide and silicon nitride layers (ONO: Oxide-Nitride-Oxide), and a Control Gate (CG) gate material 10852, such as, for example, doped or undoped poly-crystalline silicon, may be deposited. The surface may be planarized by chemical mechanical polishing leaving a thinned oxide layer 10829'. As shown in the illustration, this results in the formation of 4 horizontally oriented floating gate memory bit cells with N+ junction-less transistors. Contacts and metal wiring to form well-know memory access/decoding schemes may be processed and a through layer via (TLV) may be formed to electrically couple the memory access decoding to the acceptor substrate peripheral circuitry via an acceptor wafer metal connect pad.

This flow may enable the formation of a floating gate based 3D memory with one additional masking step per memory layer constructed by layer transfer of wafer sized doped layers of mono-crystalline silicon and this 3D memory may be connected to an underlying multi-metal layer semiconductor device.

Persons of ordinary skill in the art will appreciate that the illustrations in FIG. 40A through FIG. 40H are exemplary only and are not drawn to scale. Such skilled persons will further appreciate that many variations may be possible such as, for example, memory cell control lines could be built in a different layer rather than the same layer. Moreover, the stacked memory layers may be connected to a periphery circuit that may be above the memory stack. Additionally, each tier of memory could be configured with a slightly different donor wafer N+ layer doping profile. Further, the memory could be organized in a different manner, such as BL and SL interchanged, or these architectures could be modified into a NOR flash memory style, or where buried wiring for the memory array may be below the memory layers but above the periphery. Many other modifications within the scope of the illustrative embodiments of the invention will suggest themselves to such skilled persons after reading this specification.

It may be desirable to place the peripheral circuits for functions such as, for example, memory control, on the same mono-crystalline silicon or polysilicon layer as the memory elements or string rather than reside on a mono-crystalline silicon or polysilicon layer above or below the memory elements or string on a 3D IC memory chip. However, that memory layer substrate thickness or doping may preclude proper operation of the peripheral circuits as the memory layer substrate thickness or doping provides a fully depleted transistor channel and junction structure, such as, for example, FD-SOI. Moreover, for a 2D IC memory chip constructed on, for example, an FD-SOI substrate, wherein the peripheral circuits for functions such as, for example, memory control, must reside and properly function in the same semiconductor layer as the memory element, a fully depleted transistor channel and junction structure may preclude proper operation of the periphery circuitry, but may provide many benefits to the memory element operation and reliability. Also, the NAND string source-drain regions may be formed separately from the select and periphery transistors. Furthermore, persons of ordinary skill in the art will appreciate that the process steps and concepts of forming regions of thicker silicon for the memory periphery circuits may be applied to many memory types, such as, for example, charge trap, resistive change, DRAM, SRAM, and floating body DRAM.

The monolithic 3D integration concepts described in this patent application can lead to novel embodiments of poly-crystalline silicon based memory architectures. While the following concepts in FIG. 41 are explained by using resistive memory architectures as an example, it will be clear to one skilled in the art that similar concepts can be applied to the NAND flash, charge trap, and DRAM memory architectures and process flows described previously in this patent application.

Figure 41:
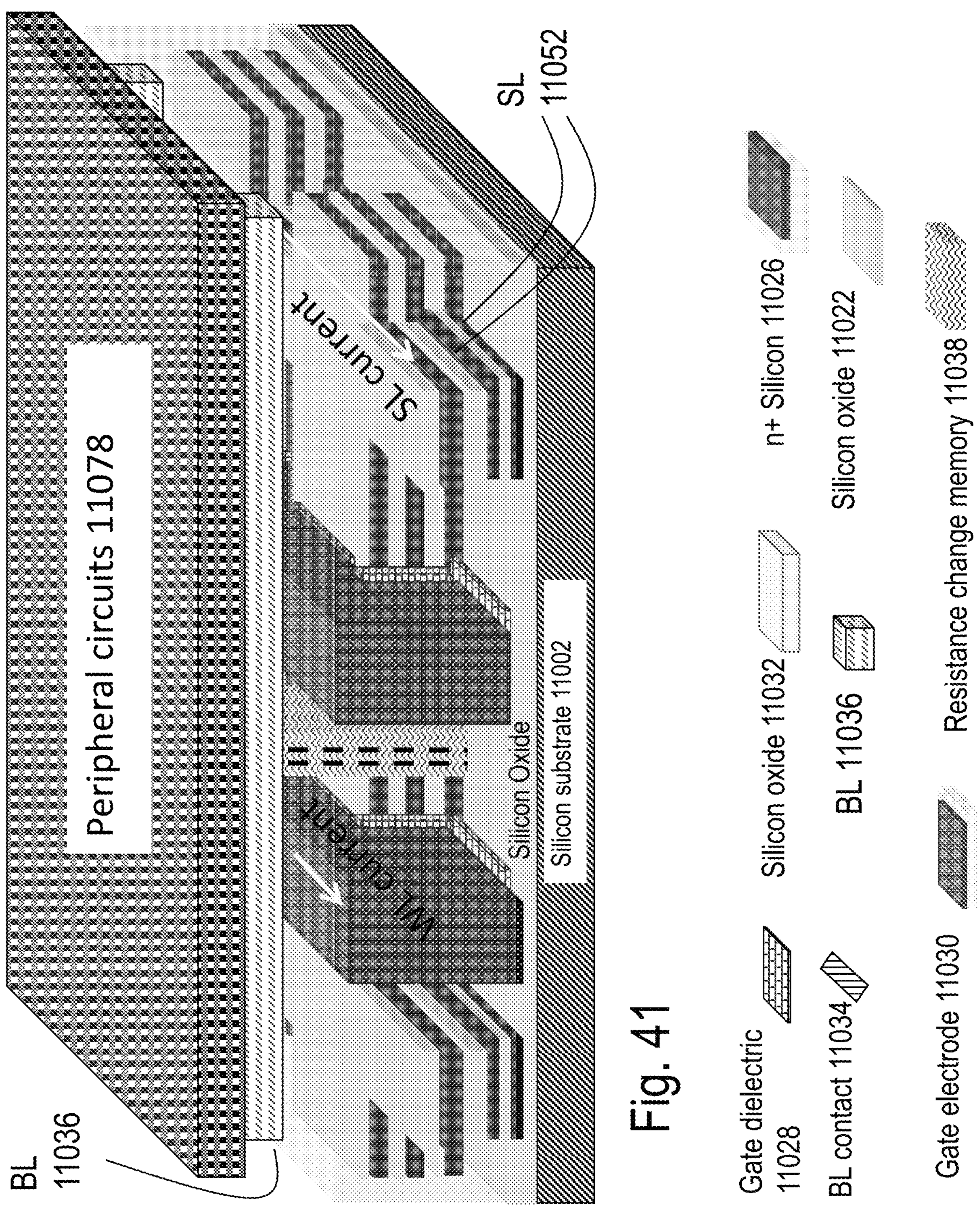
FIG. 41 is an exemplary drawing illustration of resistive memory transistors with periphery on top.

As illustrated in FIG. 41, an alternative embodiment of a resistance-based 3D memory with zero additional masking steps per memory layer may be constructed with methods that are suitable for 3D IC manufacturing. This 3D memory may utilize poly-crystalline silicon junction-less transistors that may have either a positive or a negative threshold voltage, a resistance-based memory element in series with a select or access transistor, and may have the periphery circuitry layer formed or layer transferred on top of the 3D memory array.

A silicon oxide layer 11032 may be deposited or grown on top of silicon substrate 11002.

A layer of N+ doped poly-crystalline or amorphous silicon (not shown) may be deposited. The N+ doped poly-crystalline or amorphous silicon layer may be deposited using a chemical vapor deposition process, such as LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide may then be deposited or grown (not shown). This oxide may now form the first Si/SiO2 layer comprised of N+ doped poly-crystalline or amorphous silicon layer and silicon oxide layer.

Additional Si/SiO2 layers, such as, for example, second Si/SiO2 layer and third Si/SiO2 layer, may each be formed. Oxide layer may be deposited to electrically isolate the top N+ doped poly-crystalline or amorphous silicon layer.

A Rapid Thermal Anneal (RTA) or flash anneal may be conducted to crystallize the N+ doped poly-crystalline silicon or amorphous silicon layers of first Si/SiO2 layer, second Si/SiO2 layer, and third Si/SiO2 layer, forming crystallized N+ silicon layers. Alternatively, an optical anneal, such as, for example, a laser anneal, could be performed alone or in combination with the RTA or other annealing processes. Temperatures during this step could be as high as about 700° C., and could even be as high as, for example, 1400° C. Since there may be no circuits or metallization underlying these layers of crystallized N+ silicon, very high temperatures (such as, for example, 1400° C.) can be used for the anneal process, leading to very good quality poly-crystalline silicon with few grain boundaries and very high carrier mobilities approaching those of mono-crystalline crystal silicon.

Oxide layer, third Si/SiO2 layer, second Si/SiO2 layer and first Si/SiO2 layer may be lithographically defined and plasma/RIE etched to form a portion of the memory cell structure, which may now include multiple layers of regions of crystallized N+ silicon 11026 (previously crystallized N+ silicon layers) and oxide 10032. Thus, these transistor elements or portions may have been defined by a common lithography step, which also may be described as a single lithography step, same lithography step, or one lithography step.

A gate dielectric and gate electrode material may be deposited, planarized with a chemical mechanical polish (CMP), and then lithographically defined and plasma/RIE etched to form gate dielectric regions 11028 which may either be self-aligned to and covered by gate electrodes 11030 (shown), or cover the entire crystallized N+ silicon regions and oxide regions multi-layer structure. The gate stack including gate electrode and gate dielectric regions may be formed with a gate dielectric, such as thermal oxide, and a gate electrode material, such as poly-crystalline silicon. Alternatively, the gate dielectric may be an atomic layer deposited (ALD) material that may be paired with a work function specific gate metal according to industry standard high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

The entire structure may be covered with a gap fill oxide, which may be planarized with chemical mechanical polishing.

Bit-line (BL) contacts, not shown for clarity, may be lithographically defined, etched with, for example, plasma/RIE, through oxide 11032, the three crystallized N+ silicon regions 11026, and the associated oxide vertical isolation regions 11022 to connect substantially all memory layers vertically. BL contacts may then be processed by a photoresist removal. Resistance change material 11038, such as hafnium oxides or titanium oxides, may then be deposited, for example, with atomic layer deposition (ALD). The electrode for the resistance change memory element may then be deposited by ALD to form the electrode/BL contact. The excess deposited material may be polished to planarity at or below the top of oxide. Each BL contact with resistive change material may be shared among substantially all layers of memory.

As illustrated in FIG. 41, peripheral circuits 11078 may be constructed and then layer transferred, using methods described previously such as, for example, ion-cut with replacement gates, to the memory array. Thru layer vias (not shown) may be formed to electrically couple the periphery circuitry to the memory array BL (11036), WL (using gate electrode material 11030), SL (regions 11052) and other connections such as, for example, power and ground. Alternatively, the periphery circuitry may be formed and directly aligned to the memory array and silicon substrate 11002 utilizing the layer transfer of wafer sized doped layers and subsequent processing, such as, for example, the junction-less, Recess Channel Array Transistor (RCAT), V-groove, or bipolar transistor formation flows as previously described.

This flow may enable the formation of a resistance-based multi-layer or 3D memory array with zero additional masking steps per memory layer, which may utilize poly-crystalline silicon junction-less transistors and may have a resistance-based memory element in series with a select transistor, and may be constructed by layer transfers of wafer sized doped poly-crystalline silicon layers, and this 3D memory array may be connected to an overlying multi-metal layer semiconductor device or periphery circuitry.

Persons of ordinary skill in the art will appreciate that the illustrations in FIG. 41 are exemplary only and are not drawn to scale. Such skilled persons will further appreciate that many variations may be possible such as, for example, the RTAs and/or optical anneals of the N+ doped poly-crystalline or amorphous silicon layers may be performed after each $Si/SiO_2$ layer may be formed. Additionally, N+ doped poly-crystalline or amorphous silicon layer may be doped P+, or with a combination of dopants and other polysilicon network modifiers to enhance the RTA or optical annealing crystallization and subsequent crystallization, and lower the N+ silicon layer resistivity. Moreover, doping of each crystallized N+ layer may be slightly different to compensate for interconnect resistances. Further, each gate of the double gated 3D resistance based memory may be independently controlled for better control of the memory cell. Furthermore, by proper choice of materials for memory layer transistors and memory layer wires (e.g., by using tungsten and other materials that withstand high temperature processing for wiring), standard CMOS transistors may be processed at high temperatures (e.g., greater than about 400° C.) to form the periphery circuits 11078. Many other modifications within the scope of the illustrated embodiments of the invention will suggest themselves to such skilled persons after reading this specification. Thus the invention is to be limited only by the appended claims.

An alternative embodiment of this present invention may be a monolithic 3D DRAM we call NuDRAM. It may utilize layer transfer and cleaving methods described in this document. It may provide high-quality single crystal silicon at low effective thermal budget, leading to considerable advantage over prior art.

An illustration of a NuDRAM constructed with partially depleted SOI transistors is given in FIG. 33A-F. FIG. 33A describes the first step in the process. A p− wafer 9201 may have an oxide layer 9202 grown over it. FIG. 33B shows the next step in the process. Hydrogen H+ may be implanted into the wafer at a certain depth in the p− wafer 9201. P− wafer 9201 may have a top layer of p doping of a differing concentration than that of the bulk of p− wafer 9201, and that layer may be transferred. The final position of the hydrogen is depicted by the dotted line as hydrogen plane 9203. FIG. 33C describes the next step in the process. A wafer with DRAM peripheral circuits 9204 may be prepared. This wafer may have transistors that have not seen RTA or flash anneal processes. Alternatively, a weak or partial RTA for the peripheral circuits may be used. Multiple levels of tungsten interconnect to connect together transistors in 9204 may be prepared. The wafer from FIG. 33B may be flipped and attached to the wafer with DRAM peripheral circuits 9204 using oxide-to-oxide bonding. The wafer may then be cleaved at the hydrogen plane 9203 using any cleave method described in this document. After cleave, the cleaved surface may be polished with CMP. FIG. 33D shows the next step in the process. A step of masking, etching, and low temperature oxide deposition may be performed, to define rows of diffusion, isolated by said oxide. The rows of diffusion and isolation may be aligned with the underlying peripheral circuits 9204. After forming isolation regions, partially depleted SOI (PD-SOI) transistors may be constructed with formation of a gate dielectric 9207, a gate electrode 9205, and then patterning and etch of 9207 and 9205 followed by formation of ion implanted source/drain regions 9208. Note that no Rapid Thermal Anneal (RTA) may be done at this step to activate the implanted source/drain regions 9208. The masking step in FIG. 33D may be aligned to the underlying peripheral circuits 9204. An oxide layer 9206 may be deposited and polished with CMP. FIG. 33E shows the next step of the process. A second Partial Depleted Silicon On Insulator (PD-SOI) transistor layer 9209 may be formed atop the first PD-SOI transistor layer using steps similar to FIG. 33A-D. These may be repeated multiple times to form the multilayer 3D DRAM. An RTA or flash anneal to activate dopants and crystallize polysilicon regions in substantially all the transistor layers may then be conducted. The next step of the process is described in FIG. 33F. Via holes 9210 may be masked and may be etched to word-lines and source and drain connections through substantially all of the layers in the stack. Note that the gates of transistors 9213 are connected together to form word-lines in a similar fashion to FIG. 89. Via holes may then be filled with a metal such as tungsten. Alternatively, heavily doped polysilicon may be used. Multiple layers of interconnects and vias may be constructed to form Bit-Lines 9211 and Source-Lines 9212 to complete the DRAM array. Array organization of the NuDRAM described in FIG. 33 may be similar to those depicted in FIG. 89.

An alternative method whereby to build both 'n' type and 'p' type transistors on the same layer may be to partially process the first phase of transistor formation on the donor wafer with normal CMOS processing including a 'dummy gate', a process known as gate-last transistors or process, or gate replacement transistors or process, or replacement gate transistors or process. In some embodiments of the invention, a layer transfer of the mono-crystalline silicon may be performed after the dummy gate is completed and before the formation of a replacement gate. Processing prior to layer transfer may have no temperature restrictions and the processing during and after layer transfer may be limited to low temperatures, generally, for example, below about 400° C. The dummy gate and the replacement gate may include various materials such as silicon and silicon dioxide, or metal and low k materials such as TiAlN and HfO2. An example may be the high-k metal gate (HKMG) CMOS transistors that have been developed for the 45 nm, 32 nm, 22 nm, and future CMOS generations. Intel and TSMC may have shown the advantages of a 'gate-last' approach to construct high performance HKMG CMOS transistors (C, Auth et al., VLSI 2008, pp 128-129 and C. H. Jan et al, 2009 IEDM p. 647).

As illustrated in FIG. 27A, a bulk silicon donor wafer 7000 may be processed in the normal state of the art HKMG gate-last manner up to the step prior to where CMP exposure of the polysilicon dummy gates takes place. FIG. 27A illustrates a cross section of the bulk silicon donor wafer 7000, the isolation 7002 between transistors, the polysilicon 7004 and gate oxide 7005 of both n-type and p-type CMOS dummy gates, their associated source and drains 7006 for NMOS and 7007 for PMOS, and the interlayer dielectric (ILD) 7008. These structures of FIG. 27A illustrate completion of the first phase of transistor formation. At this step, or alternatively just after a CMP of ILD 7008 to expose the polysilicon dummy gates or to planarize the ILD 7008 and not expose the dummy gates, an implant of an atomic species 7010, such as, for example, H+, may prepare the cleave plane 7012 in the bulk of the donor substrate for layer transfer suitability, as illustrated in FIG. 27B.

Figures 27C, 27D, 27E, 27F, 27G, 27H:
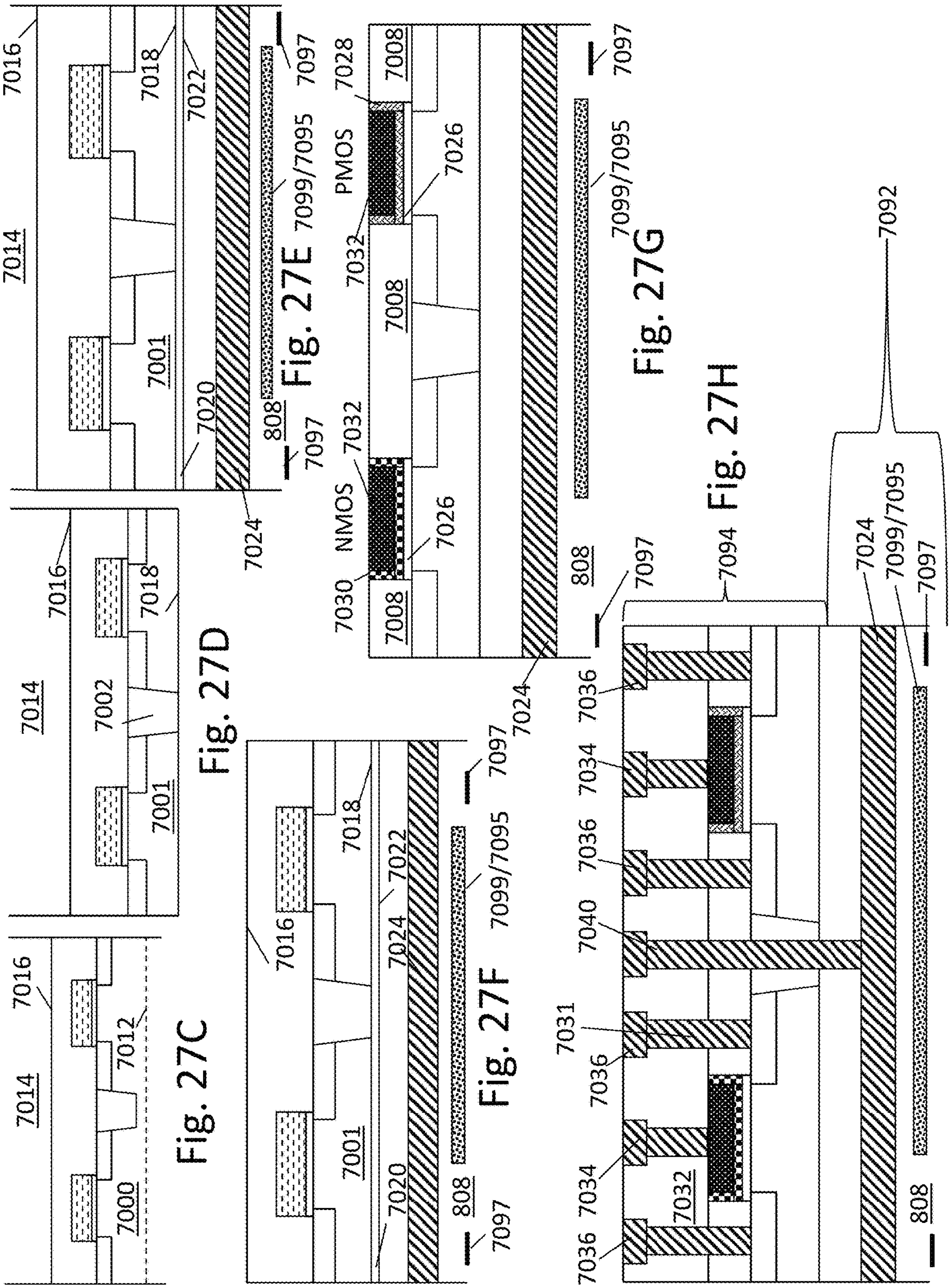

The donor wafer 7000 may be now temporarily bonded to carrier substrate 7014 at interface 7016 as illustrated in FIG. 27C with a low temperature process that may facilitate a low temperature release. The carrier substrate 7014 may be a glass substrate to enable state of the art optical alignment with the acceptor wafer. A temporary bond between the carrier substrate 7014 and the donor wafer 7000 at interface 7016 may be made with a polymeric material, such as polyimide DuPont HD3007, which can be released at a later step by laser ablation, Ultra-Violet radiation exposure, or thermal decomposition. Alternatively, a temporary bond may be made with uni-polar or bi-polar electrostatic technology such as, for example, the Apache tool from Beam Services Inc.

The donor wafer 7000 may then be cleaved at the cleave plane 7012 and may be thinned by chemical mechanical polishing (CMP) so that the transistor isolation 7002 may be exposed at the donor layer face 7018 as illustrated in FIG. 27D. Alternatively, the CMP could continue to the bottom of the junctions to create a fully depleted SOI layer.

As shown in FIG. 27E, the thin mono-crystalline donor layer face 7018 may be prepared for layer transfer by a low temperature oxidation or deposition of an oxide 7020, and plasma or other surface treatments to prepare the oxide surface 7022 for wafer oxide-to-oxide bonding. Similar surface preparation may be performed on the 808 acceptor wafer in preparation for oxide-to-oxide bonding.

A low temperature (for example, less than about 400° C.) layer transfer flow may be performed, as illustrated in FIG. 27E, to transfer the thinned and first phase of transistor formation pre-processed HKMG transistor silicon layer 7001 with attached carrier substrate 7014 to the acceptor wafer 808. Acceptor wafer 808 may include metallization comprising metal strips 7024 to act as landing pads for connection between the circuits formed on the transferred layer with the underlying circuits of layer or layer within acceptor wafer 808. The underlying circuits of layers or layer within acceptor wafer 808 may include various circuits and circuit elements as described elsewhere herein including transistors 7099, control circuits 7095 which may include transistors 7099, as well as base alignment marks 7097.

As illustrated in FIG. 27F, the carrier substrate 7014 may then be released using a low temperature process such as laser ablation.

The bonded combination of acceptor wafer 808 and HKMG transistor silicon layer 7001 may now be ready for normal state of the art gate-last transistor formation completion. As illustrated in FIG. 27G, the ILD 7008 may be chemical mechanically polished to expose the top of the polysilicon dummy gates. The dummy polysilicon gates may then be removed by etching and the hi-k gate dielectric 7026 and the PMOS specific work function metal gate 7028 may be deposited. The PMOS work function metal gate may be removed from the NMOS transistors and the NMOS specific work function metal gate 7030 may be deposited. An aluminum overfill 7032 may be performed on both NMOS and PMOS gates and the metal CMP'ed.

As illustrated in FIG. 27H, a dielectric layer 7031 may be deposited and the normal gate contact 7034 and source/drain 7036 contact formation and metallization may now be performed to connect the transistors on that mono-crystalline layer and to connect to the acceptor wafer 808 top metal strip 7024 with through via 7040 providing connection through the transferred layer from the donor wafer to the acceptor wafer. The top metal layer may be formed to act as the acceptor wafer landing strips for a repeat of the above process flow to stack another preprocessed thin mono-crystalline layer of two-phase formed transistors. The structure shown in FIG. 27H may include the description of first circuit layer 7092 (808) and second circuit layer 7094. The above process flow may also be utilized to construct gates of other types, such as, for example, doped polysilicon on thermal oxide, doped polysilicon on oxynitride, or other metal gate configurations, as 'dummy gates,' may perform a layer transfer of the thin mono-crystalline layer, replace the gate electrode and gate oxide, and then proceed with low temperature interconnect processing. An alternative layer transfer method may be utilized, such as, for example, SOI wafers with etchback of the bulk silicon to the buried oxide layer, in place of an ion-cut layer transfer scheme.

Figures 28A, 28B, 28C, 28D, 28E, 28F, 28G:
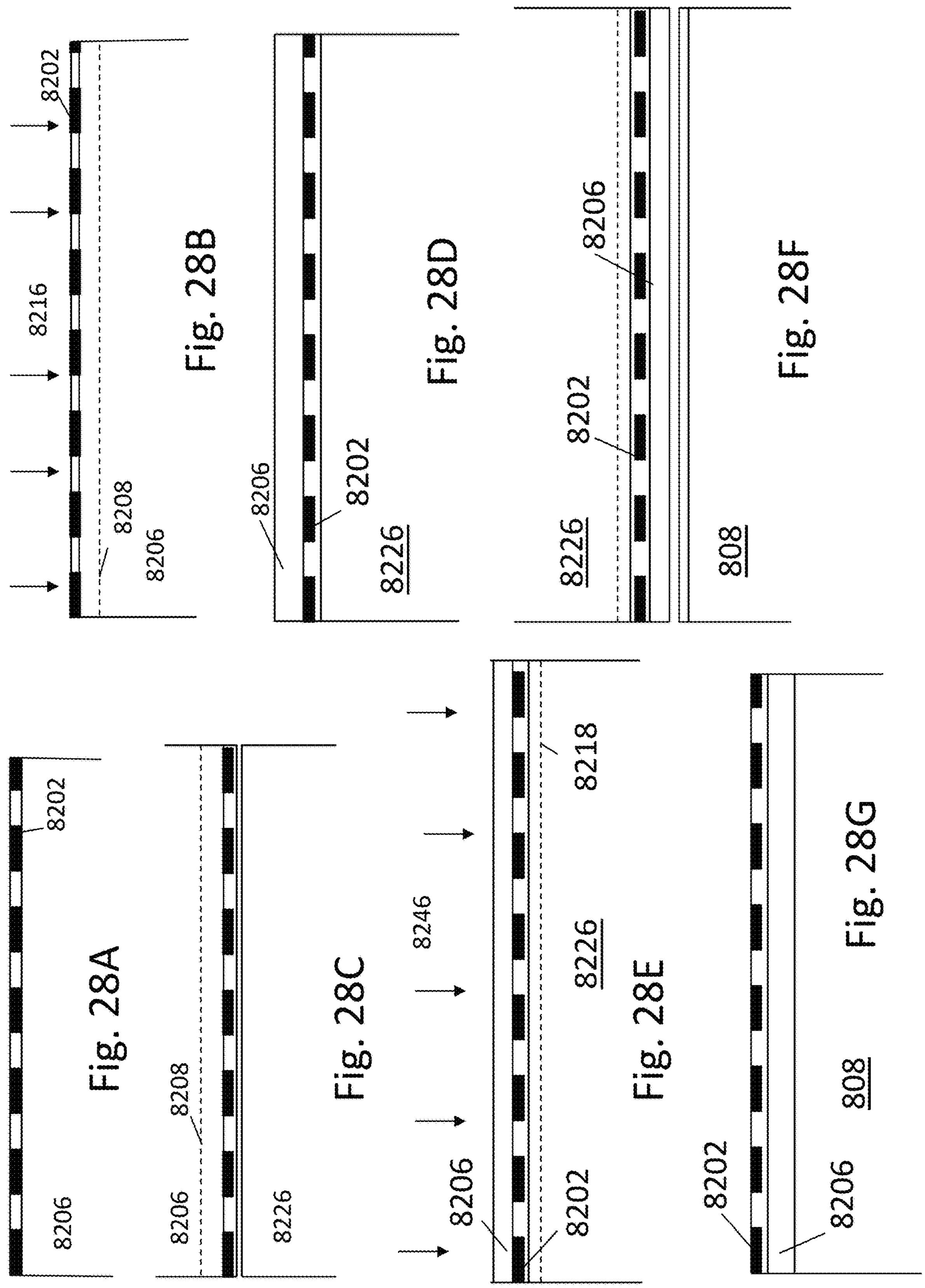
FIG. 28A-FIG. 28G are exemplary drawing illustrations of a formation of top planar transistors.

Alternatively, the carrier substrate 7014 may be a silicon wafer, and infra-red light and optics could be utilized for alignments. FIG. 28A-G illustrate the use of a carrier wafer. FIG. 28A illustrates the first step of preparing transistors with dummy gate transistors 8202 on first donor wafer 8206A. The first step may complete the first phase of transistor formation.

FIG. 28B illustrates forming a cleave line 8208 by implant 8216 of atomic particles such as H+.

FIG. 28C illustrates permanently bonding the first donor wafer 8206A to a second donor wafer 8226. The permanent bonding may be oxide-to-oxide wafer bonding as described previously.

FIG. 28D illustrates the second donor wafer 8226 acting as a carrier wafer after cleaving the first donor wafer off; leaving a thin layer 8206 of first donor wafer 8206A with the now buried dummy gate transistors 8202.

FIG. 28E illustrates forming a second cleave line 8218 in the second donor wafer 8226 by implant 8246 of atomic species such as, for example, H+.

FIG. 28F illustrates the second layer transfer step to bring the dummy gate transistors 8202 ready to be permanently bonded to the house 808. For simplicity of the explanation, the steps of surface layer preparation done for each of these bonding steps have been left out.

FIG. 28G illustrates the house 808 with the dummy gate transistors 8202 on top after cleaving off the second donor wafer and removing the layers on top of the dummy gate transistors. Now the flow may proceed to replace the dummy gates with the final gates, form the metal interconnection layers, and continue the 3D fabrication process. An alternative layer transfer method may be utilized, such as, for example, SOI wafers with etchback of the bulk silicon to the buried oxide layer, in place of an ion-cut layer transfer scheme.

An illustrative alternative may be available when using the carrier wafer flow. In this flow we can use the two sides of the transferred layer to build NMOS on one side and PMOS on the other side. Proper timing of the replacement gate step in such a flow could enable full performance transistors properly aligned to each other. Compact 3D library cells may be constructed from this process flow.

Figure 29L:
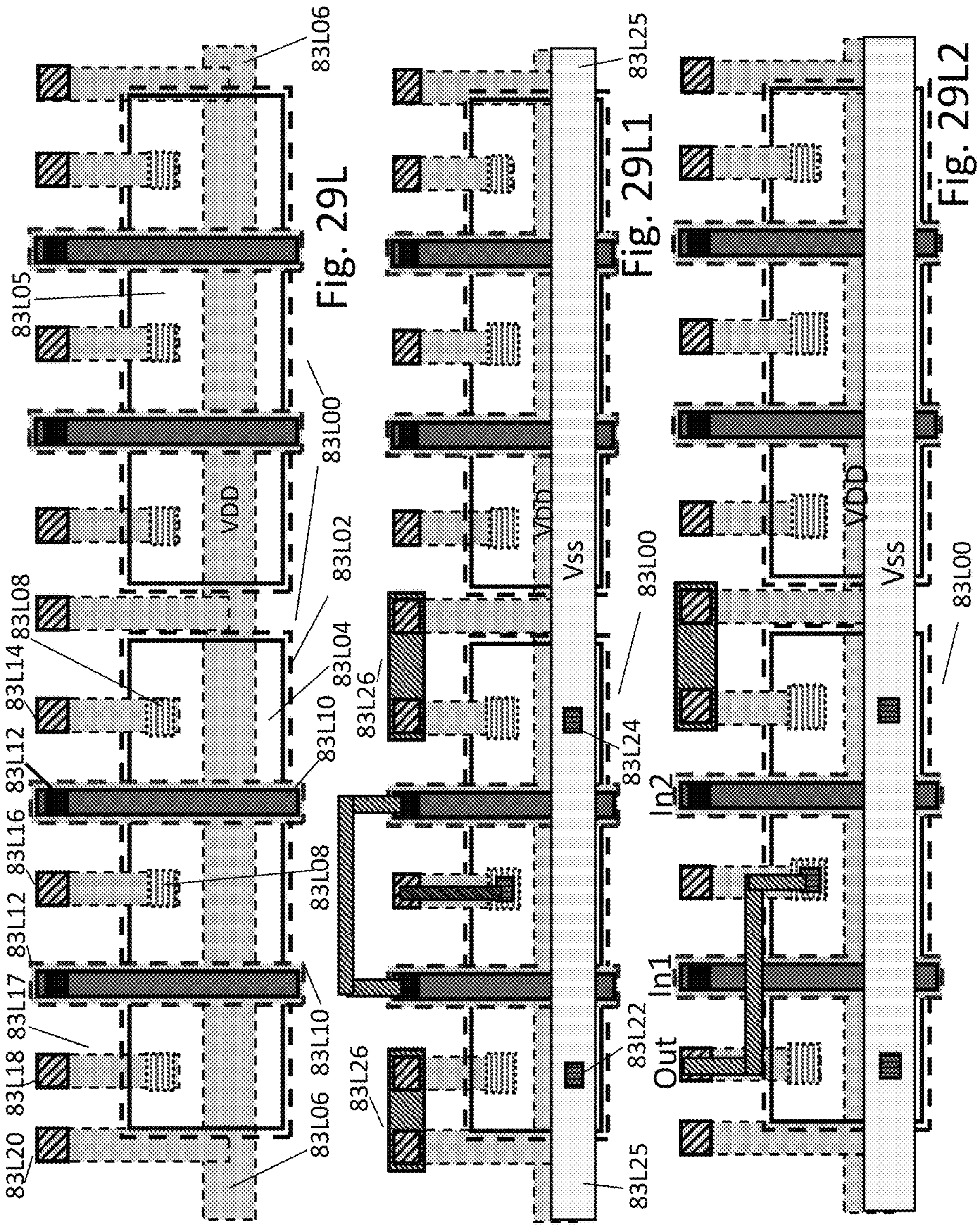
FIG. 29L is an exemplary drawing illustration of a formation of top planar transistors.

FIG. 29L is a top view drawing illustration of a repeating generic cell 83L00 as a building block for forming gate array, of two NMOS transistors 83L04 with shared diffusion 83L05 overlaying 'face down' two PMOS transistors 83L02 with shared diffusion. The NMOS transistors gates may overlay the PMOS transistors gates 83L10 and the overlayed gates may be connected to each other by via 83L12. The Vdd power line 83L06 could run as part of the face down generic structure with connection to the upper layer using vias 83L20. The diffusion connection 83L08 may be using the face down metal generic structure 83L17 and brought up by vias 83L14, 83L16, 83L18.

FIG. 29L1 is a drawing illustration of the generic cell 83L00 which may be customized by custom NMOS transistor contacts 83L22, 83L24 and custom metal 83L26 to form a double inverter. The Vss power line 83L25 may run on top of the NMOS transistors.

Figure 2B:
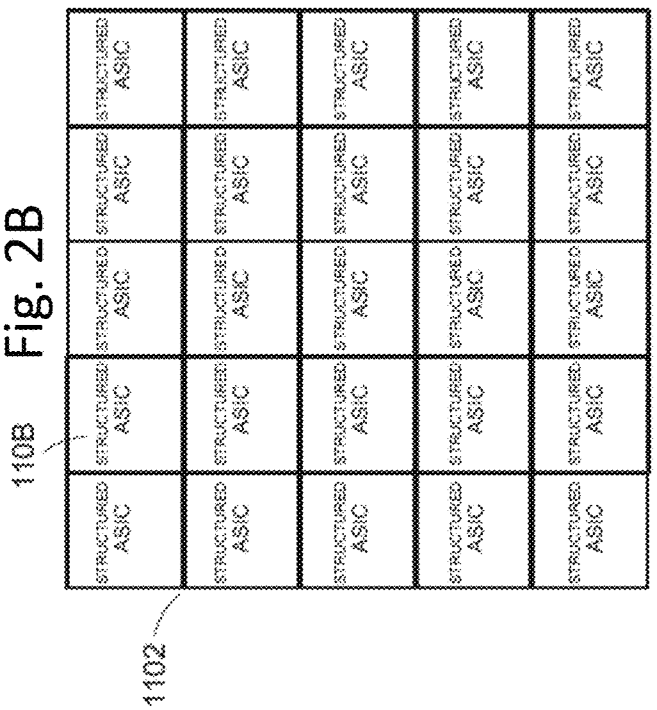
FIG. 2A through FIG. 2F are exemplary drawing illustrations of one reticle site on a wafer.
Figure 3B:
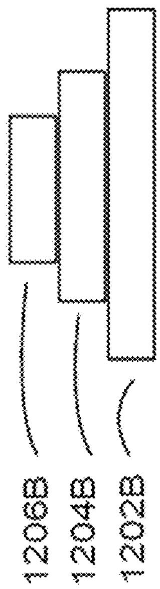
FIG. 3A through FIG. 3E are exemplary drawing illustrations of a Configurable system.
Figure 3D:
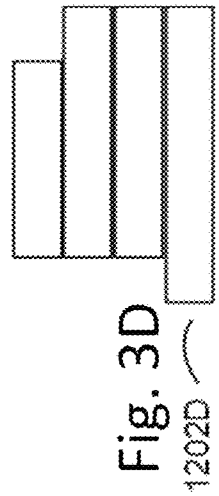
Figure 3E:
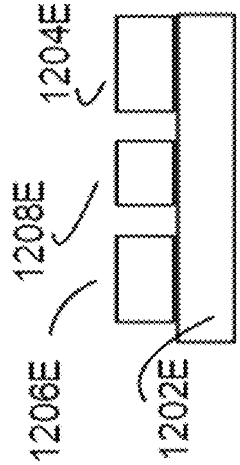
Figure 3C:
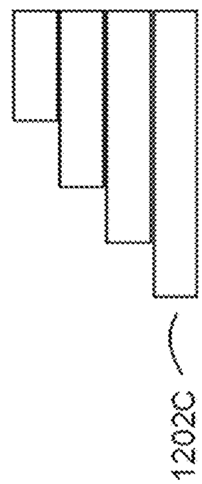
Figure 3A:
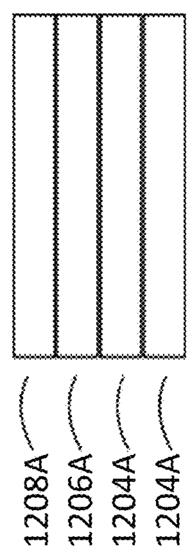
Figure 4:
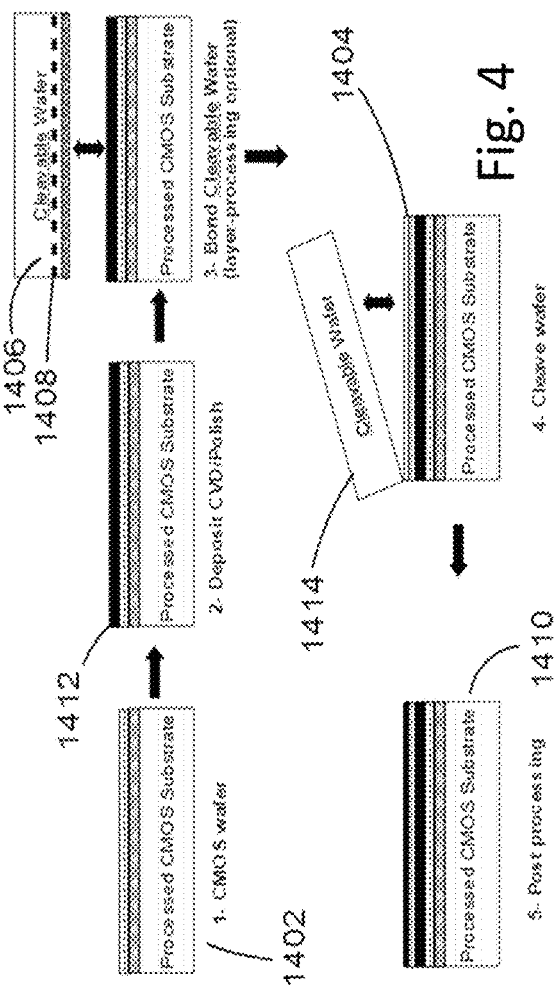
FIG. 4 is an exemplary drawing illustration of a layer transfer process flow.

FIG. 29L2 is a drawing illustration of the generic cell 83L00 which may be customized to a NOR function, FIG. 29L3 is a drawing illustration of the generic cell 83L00 which may be customized to a NAND function and FIG. 29L4 is a drawing illustration of the generic cell 83L00 which may be customized to a multiplexer function. Accordingly generic cell 83L00 could be customized to substantially provide the logic functions, such as, for example, NAND and NOR functions, so a generic gate array using array of generic cells 83L00 could be customized with custom contacts vias and metal layers to any logic function. Thus, the NMOS, or n-type, transistors may be formed on one layer and the PMOS, or p-type, transistors may be formed on another layer, and connection paths may be formed between the n-type and p-type transistors to create Complementary Metal-Oxide-Semiconductor (CMOS) logic cells. Additionally, the n-type and p-type transistors layers may reside on the first, second, third, or any other of a number of layers in the 3D structure, substantially overlaying the other layer, and any other previously constructed layer.

Another alternative, with reference to FIG. 27 and description, is illustrated in FIG. 27B-1 whereby the implant of an atomic species 7010, such as, for example, H+, may be screened from the sensitive gate areas 7003 by first masking and etching a shield implant stopping layer of a dense material 7050, for example 5000 angstroms of Tantalum, and may be combined with 5,000 angstroms of photoresist 7052. This implant may create a segmented cleave plane 7012 in the bulk of the donor wafer silicon wafer and additional polishing may be applied to provide a smooth bonding surface for layer transfer suitability.

The above flows, whether single type transistor donor wafer or complementary type transistor donor wafer, could be repeated multiple times to build a multi-level 3D monolithic integrated system. These flows could also provide a mix of device technologies in a monolithic 3D manner. For example, device I/O or analog circuitry such as, for example, phase-locked loops (PLL), clock distribution, or RF circuits could be integrated with CMOS logic circuits via layer transfer, or bipolar circuits could be integrated with CMOS logic circuits, or analog devices could be integrated with logic, and so on. Prior art shows alternative technologies of constructing 3D devices. The most common technologies are, either using thin film transistors (TFT) to construct a monolithic 3D device, or stacking prefabricated wafers and then using a through silicon via (TSV) to connect the prefabricated wafers. The TFT approach may be limited by the performance of thin film transistors while the stacking approach may be limited by the relatively large lateral size of the TSV via (on the order of a few microns) due to the relatively large thickness of the 3D layer (about 60 microns) and accordingly the relatively low density of the through silicon vias connecting them. According to many embodiments of the present invention that construct 3D IC based on layer transfer techniques, the transferred layer may be a thin layer of less than about 0.4 micron. This 3D IC with transferred layer according to some embodiments of the present invention may be in sharp contrast to TSV based 3D ICs in the prior art where the layers connected by TSV may be more than 5 microns thick and in most cases more than 50 microns thick.

The alternative process flows presented may provide true monolithic 3D integrated circuits. It may allow the use of layers of single crystal silicon transistors with the ability to have the upper transistors aligned to the underlying circuits as well as those layers aligned each to other and only limited by the Stepper capabilities. Similarly the contact pitch between the upper transistors and the underlying circuits may be compatible with the contact pitch of the underlying layers. While in the best current stacking approach the stack wafers are a few microns thick, the alternative process flows presented may suggest very thin layers of typically 100 nm, but recent work has demonstrated layers about 20 nm thin.

Accordingly the presented alternatives allow for true monolithic 3D devices. This monolithic 3D technology may provide the ability to integrate with full density, and to be scaled to tighter features, at the same pace as the semiconductor industry.

Additionally, true monolithic 3D devices may allow the formation of various sub-circuit structures in a spatially efficient configuration with higher performance than 2D equivalent structures. Illustrated below are some examples of how a 3D 'library' of cells may be constructed in the true monolithic 3D fashion.

Another compact 3D library may be constructed whereby one or more layers of metal interconnect may be allowed between the NMOS and PMOS devices and one or more of the devices may be constructed vertically.

Figure 23A:
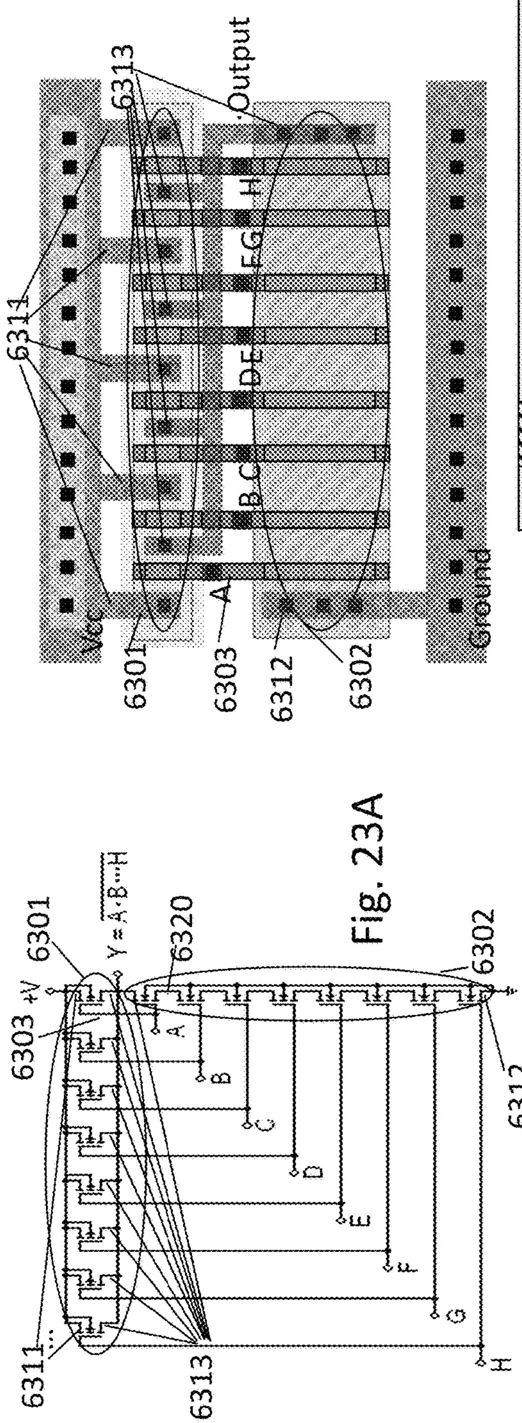
FIG. 23A-FIG. 23G are exemplary drawing illustrations of a 3D NAND8 cell.

A compact 3D CMOS 8 Input NAND cell may be constructed as illustrated in FIG. 23A through FIG. 23G. The NAND-8 cell schematic and 2D layout is illustrated in FIG. 23A. The eight PMOS transistor 6301 sources 6311 may be tied together and to V+ supply and the PMOS drains 6313 may be tied together and to the NMOS A drain and to the output Y. Inputs A to H may be tied to one PMOS gate and one NMOS gate. Input A may be tied to the PMOS A gate and NMOS A gate, input B may be tied to the PMOS B gate and NMOS B gate, and so forth through input H may be tied to the PMOS H gate and NMOS H gate. The eight NMOS transistors 6302 may be coupled in series between the output Y and the PMOS drains 6313 and ground. The structure built in 3D described below will take advantage of these connections in the 3rd dimension.

Figure 23C:
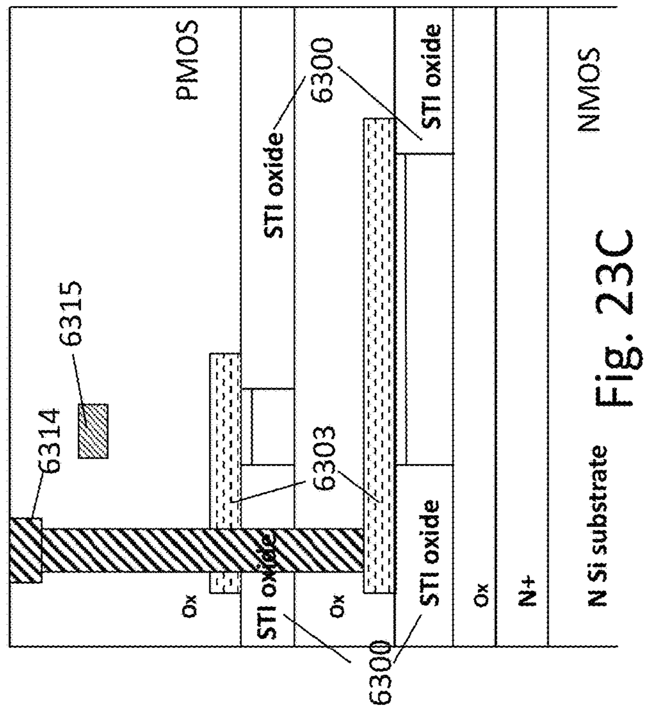
Figure 23B:
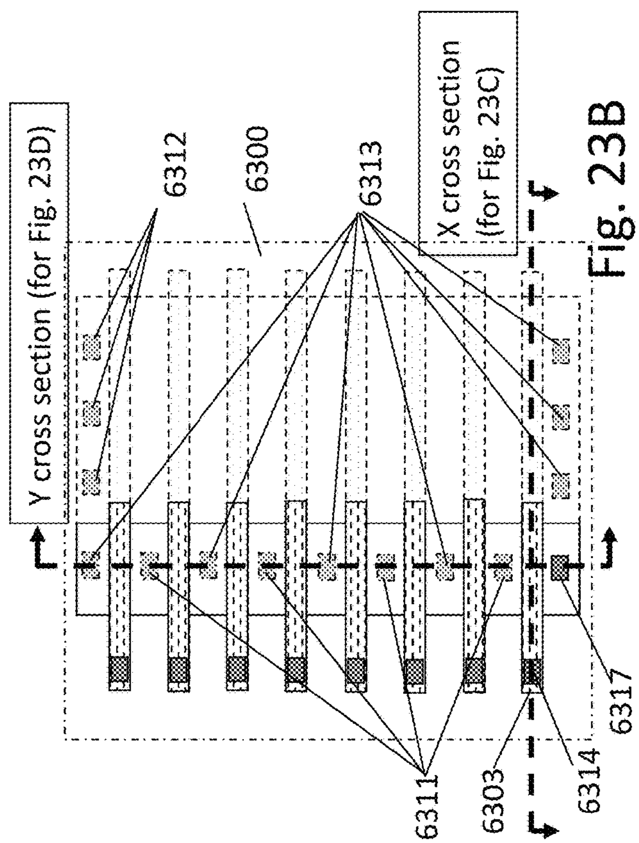
Figure 23D:
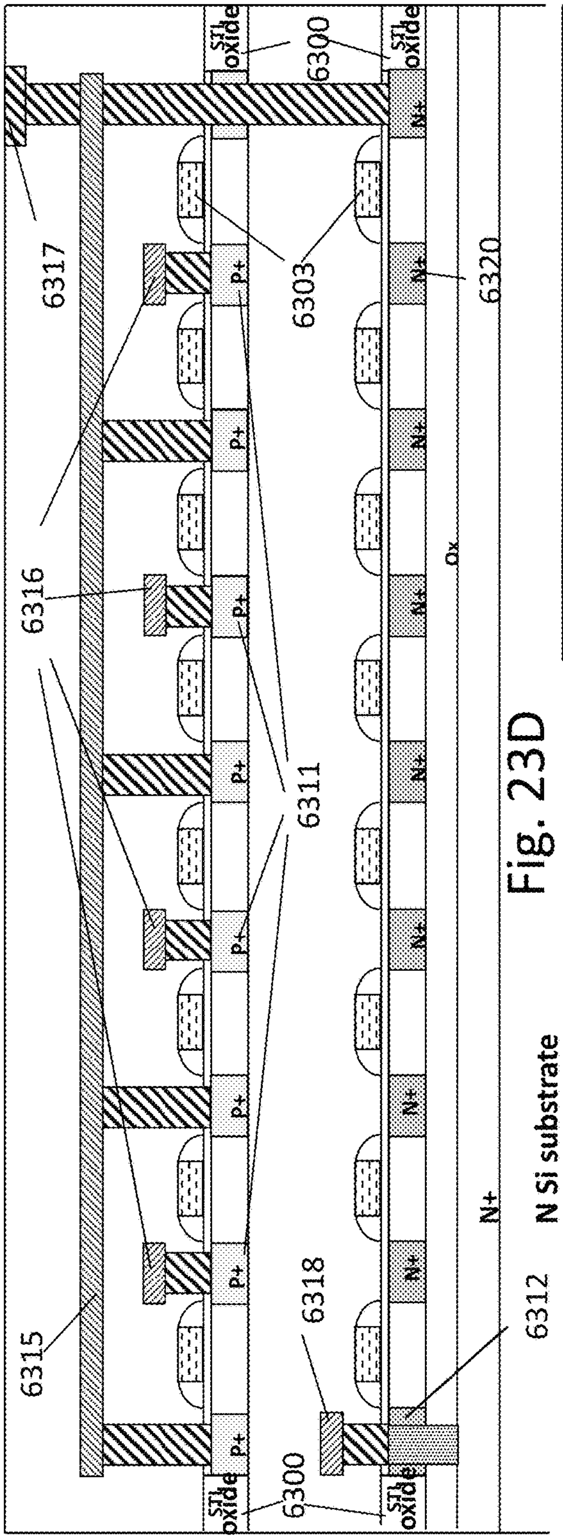
Figure 23F:
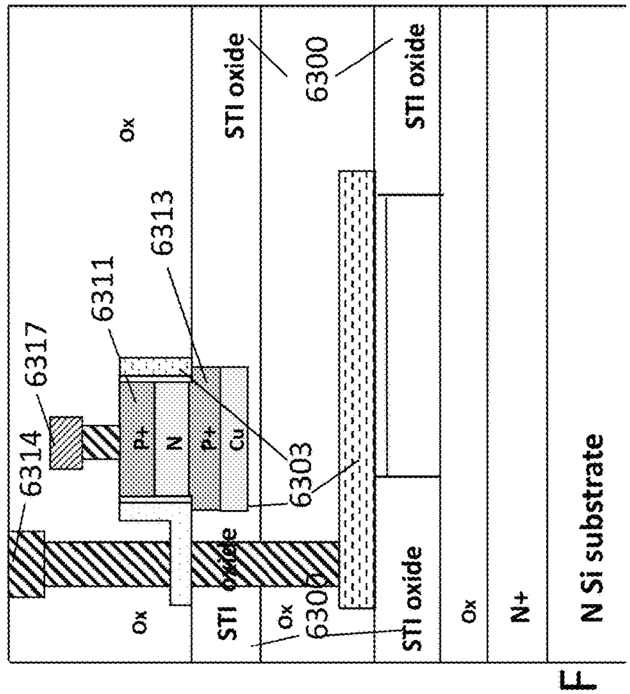
Figure 23E:
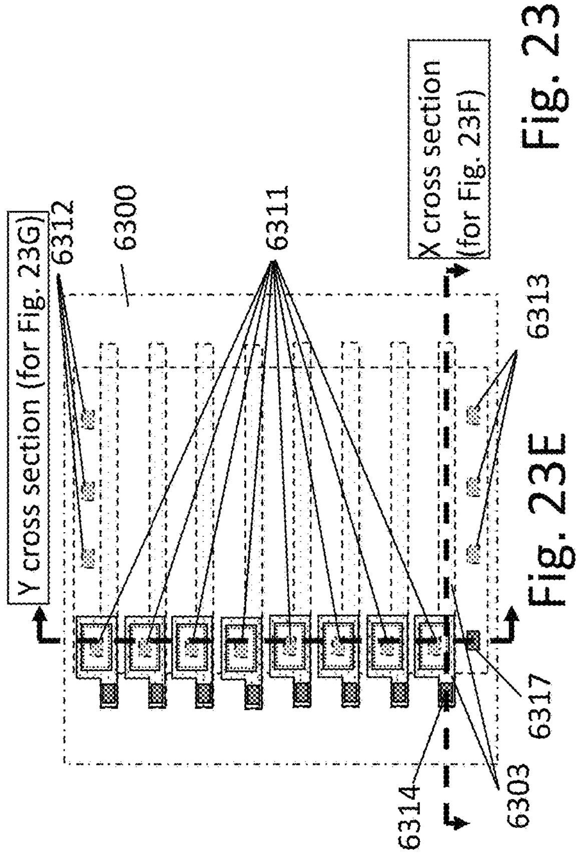
Figure 23G:
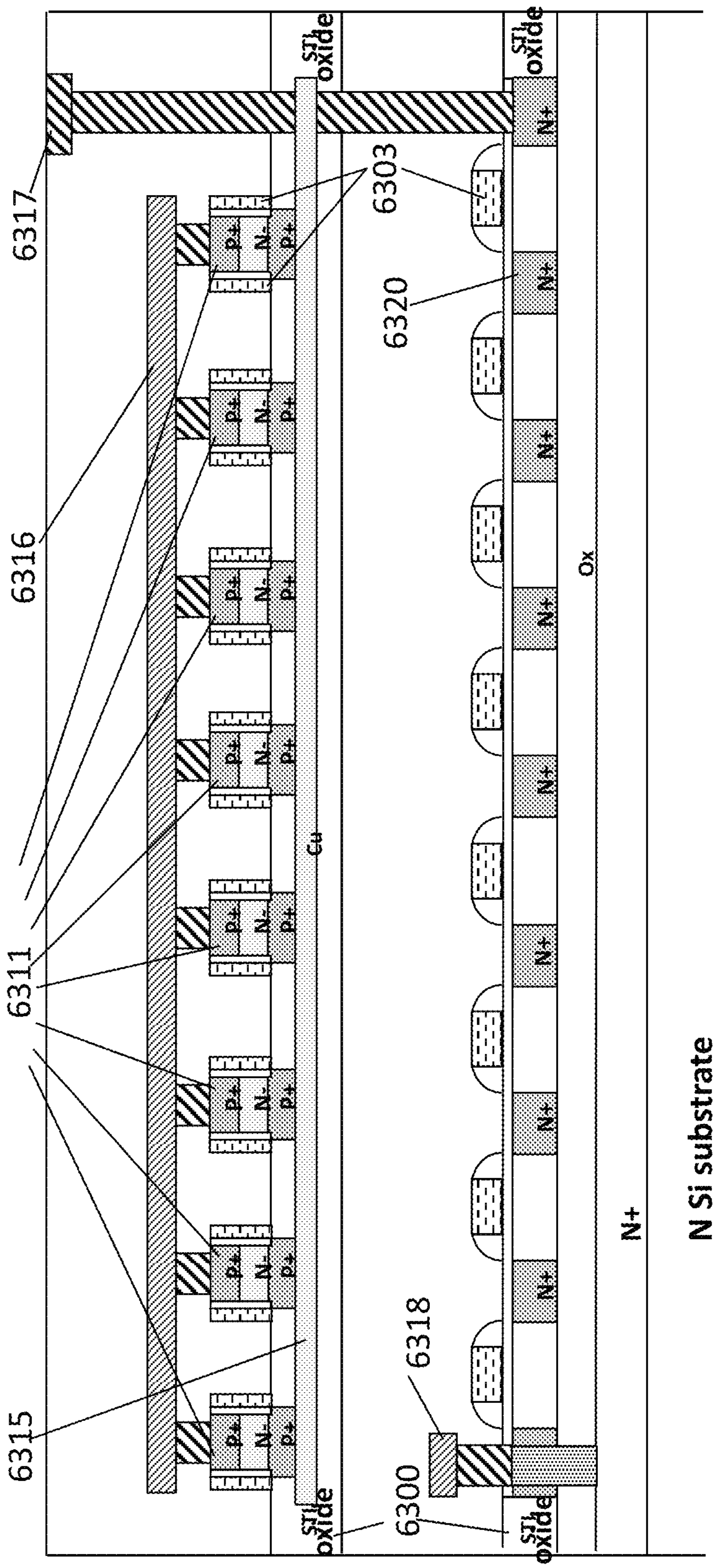

The topside view of the 3D NAND-8 cell, with no metal shown and with horizontal NMOS and PMOS devices, is illustrated in FIG. 23B, the cell X cross sectional views is illustrated in FIG. 23C, and the Y cross sectional view is illustrated in FIG. 23D. The NAND-8 cell with vertical PMOS and horizontal NMOS devices are shown in FIG. 23E for topside view, 23F for the X cross section view, and 23H for the Y cross sectional view. The same reference numbers are used for analogous structures in the embodiment shown in FIG. 23B through FIG. 23D and the embodiment shown in FIG. 23E through FIG. 23G. The eight PMOS transistor 6301 sources 6311 may be tied together in the PMOS silicon layer and to the V+ supply metal 6316 in the PMOS metal 1 layer through P+ to Metal contacts. The NMOS A drain and the PMOS A drain may be tied 6313 together with a through P+ to N+ contact 6317 and to the output Y supply metal 6315 in PMOS metal 2, and also may be connected to substantially all of the PMOS drain contacts through PMOS metal 1 6315. Input A on PMOS metal 2 6314 may be tied 6303 to both the PMOS A gate and the NMOS A gate with a PMOS gate on STI to NMOS gate on STI contact 6314. Substantially all the other inputs may be tied to P and N gates in similar fashion. The NMOS A source and the NMOS B drain may be tied together 6320 in the NMOS silicon layer. The NMOS H source 6312 may be tied connected to the ground line 6318 by a contact to NMOS metal 1 and to the back plane N+ ground layer. The transistor isolation oxides 6300 are illustrated.

Accordingly a CMOS circuit may be constructed where the various circuit cells may be built on two silicon layers achieving a smaller circuit area and shorter intra and inter transistor interconnects. As interconnects may become dominating for power and speed, packing circuits in a smaller area would result in a lower power and faster speed end device.

Persons of ordinary skill in the art will appreciate that a number of different process flows have been described with exemplary logic gates and memory bit cells used as representative circuits. Such skilled persons will further appreciate that whichever flow is chosen for an individual design, a library of all the logic functions for use in the design may be created so that the cells may easily be reused either within that individual design or in subsequent ones employing the same flow. Such skilled persons will also appreciate that many different design styles may be used for a given design. For example, a library of logic cells could be built in a manner that has uniform height called standard cells as is well known in the art. Alternatively, a library could be created for use in long continuous strips of transistors called a gated array which is also known in the art. In another alternative embodiment, a library of cells could be created for use in a hand crafted or custom design as is well known in the art. For example, in yet another alternative embodiment, any combination of libraries of logic cells tailored to these design approaches can be used in a particular design as a matter of design choice, the libraries chosen may employ the same process flow if they are to be used on the same layers of a 3D IC. Different flows may be used on different levels of a 3D IC, and one or more libraries of cells appropriate for each respective level may be used in a single design.

Also known in the art are computer program products that may be stored in computer readable media for use in data processing systems employed to automate the design process, more commonly known as computer aided design (CAD) software. Persons of ordinary skill in the art will appreciate the advantages of designing the cell libraries in a manner compatible with the use of CAD software.

Persons of ordinary skill in the art will realize that libraries of I/O cells, analog function cells, complete memory blocks of various types, and other circuits may also be created for one or more processing flows to be used in a design and that such libraries may also be made compatible with CAD software. Many other uses and embodiments will suggest themselves to such skilled persons after reading this specification, thus the scope of the illustrated embodiments of the invention is to be limited only by the appended claims.

Figure 21:
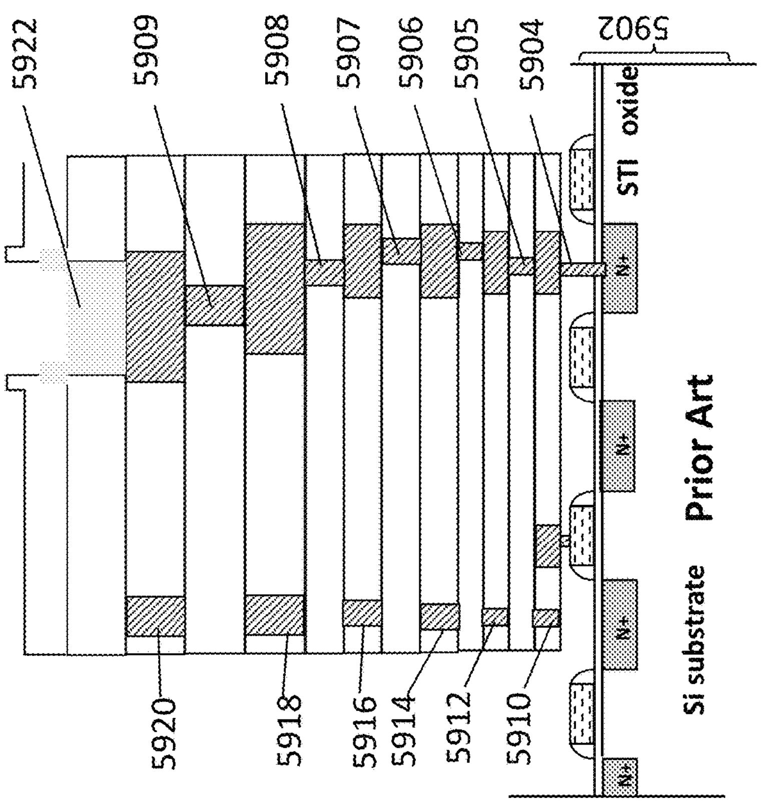
FIG. 21 is an exemplary drawing illustration of a metal interconnect stack prior art.

Additionally, when circuit cells are built on two or more layers of thin silicon as shown above, and enjoy the dense vertical through silicon via interconnections, the metallization layer scheme to take advantage of this dense 3D technology may be improved as follows. FIG. 21 illustrates the prior art of silicon integrated circuit metallization schemes. The conventional transistor silicon layer 5902 may be connected to the first metal layer 5910 through the contact 5904. The dimensions of this interconnect pair of contact and metal lines generally may be at the minimum line resolution of the lithography and etch capability for that technology process node. Traditionally, this is called a '1×' design rule metal layer. Usually, the next metal layer may be also at the "1×' design rule, the metal line 5912 and via below 5905 and via above 5906 that connects metal line 5912 with 5910 or with 5914 where desired. Then the next few layers often may be constructed at twice the minimum lithographic and etch capability and called '2×' metal layers, and have thicker metal for higher current carrying capability. These designs are illustrated with metal line 5914 paired with via 5907 and metal line 5916 paired with via 5908 in FIG. 21. Accordingly, the metal via pairs of 5918 with 5909, and 5920 with bond pad opening 5922, represent the '4×' metallization layers where the planar and thickness dimensions may be again larger and thicker than the 2× and 1× layers. The precise number of 1× or 2× or 4× layers may vary depending on interconnection needs and other requirements, however, the general flow may be that of increasingly larger metal line, metal space, and via dimensions as the metal layers may be farther from the silicon transistors and closer to the bond pads.

Figure 22:
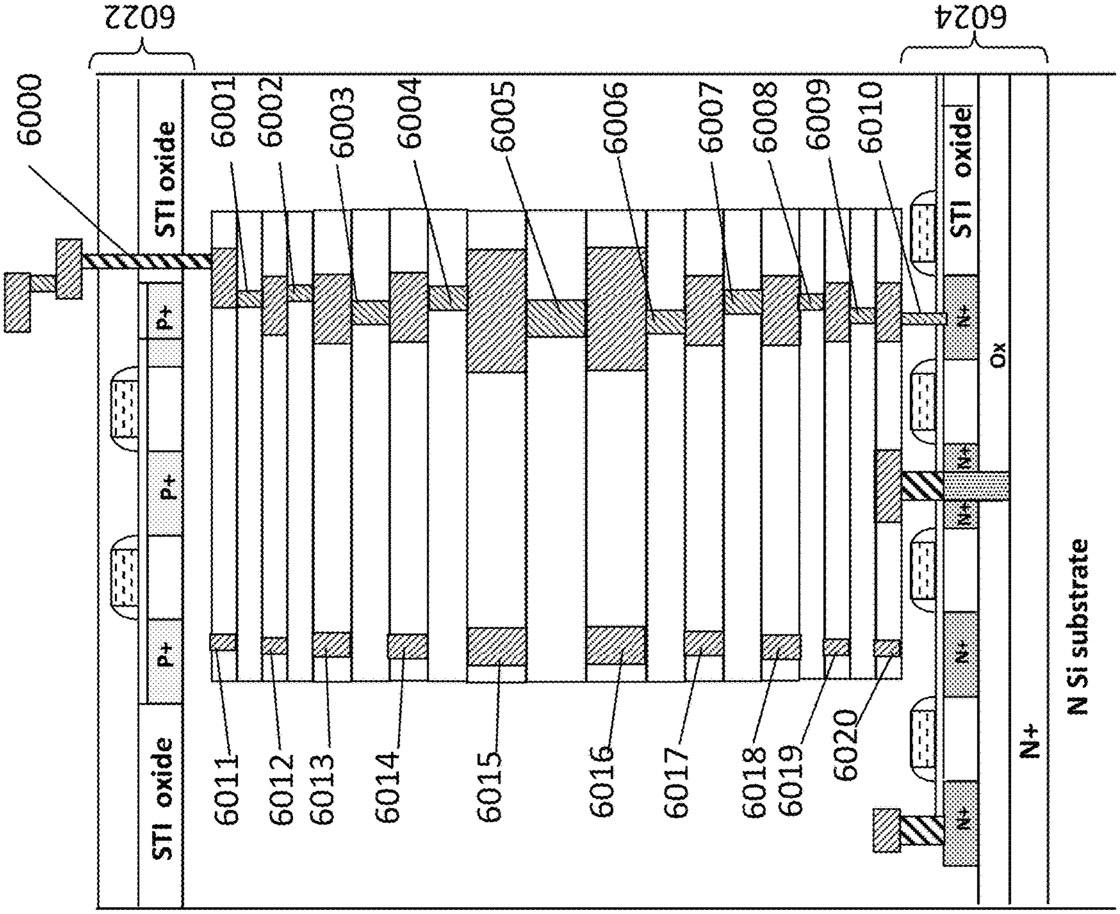
FIG. 22 is an exemplary drawing illustration of a metal interconnect stack.

The metallization layer scheme may be improved for 3D circuits as illustrated in FIG. 22. The first mono- or polycrystalline silicon device layer 6024 is illustrated as the NMOS silicon transistor layer from the above 3D library cells, but may also be a conventional logic transistor silicon substrate or layer. The '1×' metal layers 6020 and 6019 may be connected with contact 6010 to the silicon transistors and vias 6008 and 6009 to each other or metal 6018. The 2× layer pairs metal 6018 with via 6007 and metal 6017 with via 6006. The 4× metal layer 6016 may be paired with via 6005 and metal 6015, also at 4×. However, now via 6004 may be constructed in 2× design rules to enable metal line 6014 to be at 2×. Metal line 6013 and via 6003 may be also at 2× design rules and thicknesses. Vias 6002 and 6001 may be paired with metal lines 6012 and 6011 at the 1× minimum design rule dimensions and thickness. The through layer via 6000 of the illustrated PMOS layer transferred silicon 6022 may then be constructed at the 1× minimum design rules and provide for maximum density of the top layer. The precise numbers of 1× or 2× or 4× layers may vary depending on circuit area and current carrying metallization design rules and tradeoffs. The illustrated PMOS layer transferred silicon 6022 may be, for example, any of the low temperature devices illustrated herein.

When a transferred layer is not optically transparent to shorter wavelength light, and hence not able to detect alignment marks and images to a nanometer or tens of nanometer resolution, due to the transferred layer or its carrier or holder substrate's thickness, infra-red (IR) optics and imaging may be utilized for alignment purposes. However, the resolution and alignment capability may not be satisfactory. In some embodiments of the present invention, alignment windows may be created that allow use of the shorter wavelength light, for example, for alignment purposes during layer transfer flows.

Figures 42A, 42B, 42C, 42D:
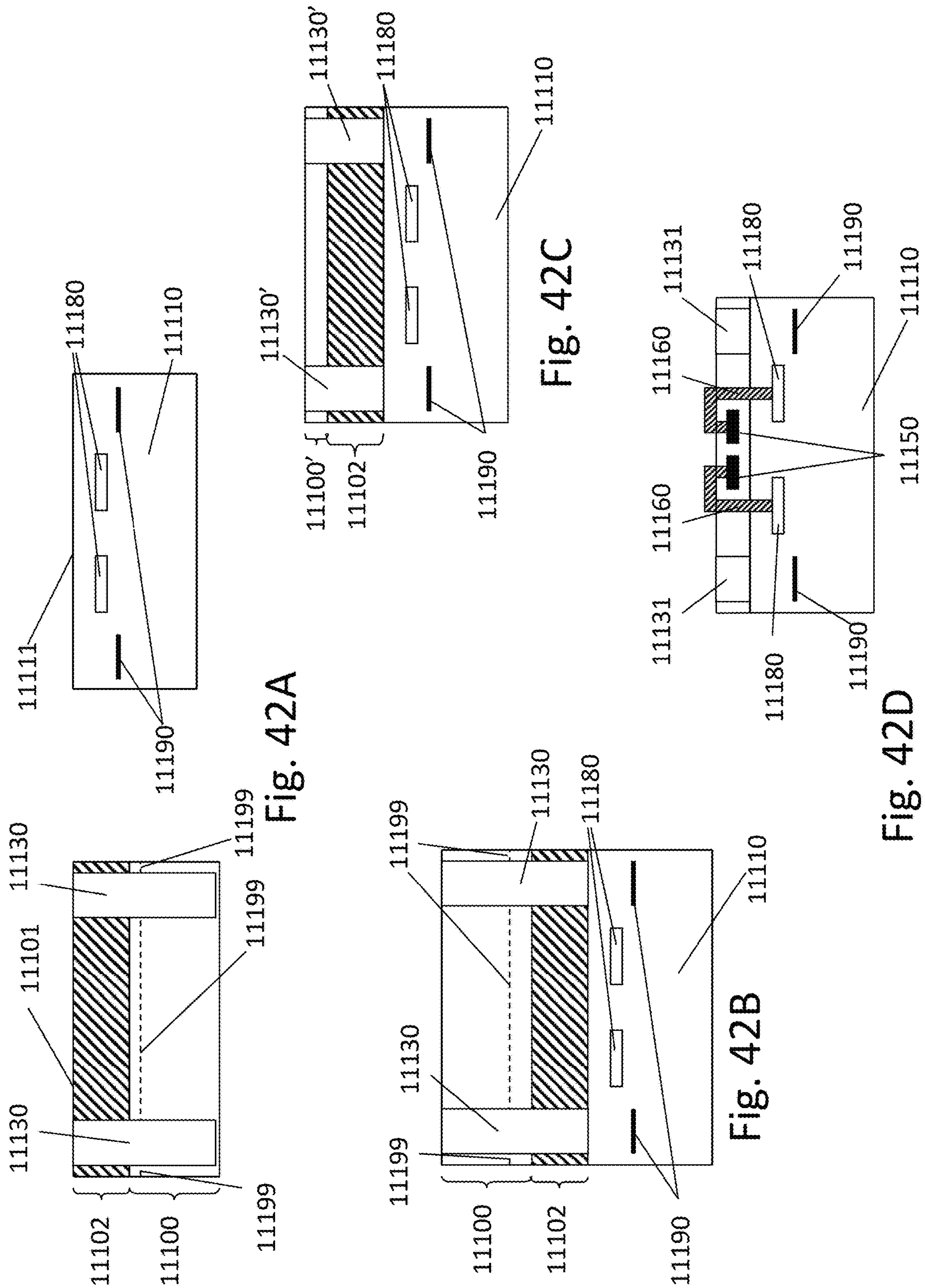
FIG. 42A-FIG. 42D are exemplary drawing illustrations of a generalized layer transfer process flow with alignment windows.

As illustrated in FIG. 42A, a generalized process flow may begin with a donor wafer 11100 that may be preprocessed with layers 11102 of conducting, semi-conducting or insulating materials that may be formed by deposition, ion implantation and anneal, oxidation, epitaxial growth, combinations of above, or other semiconductor processing steps and methods. The donor wafer 11100 may also be preprocessed with a layer transfer demarcation plane 11199, such as, for example, a hydrogen implant cleave plane, before or after layers 11102 are formed, or may be thinned by other methods previously described. Alignment windows 11130 may be lithographically defined, plasma/RIE etched substantially through layers 11102, layer transfer demarcation plane 11199, and donor wafer 11100, and then filled with shorter wavelength transparent material, such as, for example, silicon dioxide, and planarized with chemical mechanical polishing (CMP). For example, donor wafer 11100 may be further thinned by CMP. The size and placement on donor wafer 11100 of the alignment windows 11130 may be determined based on the maximum misalignment tolerance of the alignment scheme used while bonding the donor wafer 11100 to the acceptor wafer 11110, and the placement locations of the acceptor wafer alignment marks 11190. Alignment windows 11130 may be processed before or after layers 11102 are formed. Acceptor wafer 11110 may be a preprocessed wafer that has fully functional circuitry or may be a wafer with previously transferred layers, or may be a blank carrier or holder wafer, or other kinds of substrates and may be called a target wafer. The acceptor wafer 11110 and the donor wafer 11100 may be, for example, a bulk mono-crystalline silicon wafer or a Silicon On Insulator (SOI) wafer or a Germanium on Insulator (GeOI) wafer. Acceptor wafer 11110 metal connect pads or strips 11180 and acceptor wafer alignment marks 11190 are shown.

Both the donor wafer 11100 and the acceptor wafer 11110 bonding surfaces 11101 and 11111 may be prepared for wafer bonding by depositions, polishes, plasma, or wet chemistry treatments to facilitate successful wafer to wafer bonding.

As illustrated in FIG. 42B, the donor wafer 11100 with layers 11102, alignment windows 11130, and layer transfer demarcation plane 11199 may then be flipped over, high resolution aligned to acceptor wafer alignment marks 11190, and bonded to the acceptor wafer 11110.

As illustrated in FIG. 42C, the donor wafer 11100 may be cleaved at or thinned as described elsewhere in this document to approximately the layer transfer demarcation plane 11199, leaving a portion of the donor, donor wafer portion 11100', alignment windows 11130' and the pre-processed layers 11102 aligned and bonded to the acceptor wafer 11110.

As illustrated in FIG. 42D, the remaining donor wafer portion 11100' may be removed by polishing or etching and the transferred layers 11102 may be further processed to create donor wafer device structures 11150 that may be precisely aligned to the acceptor wafer alignment marks 11190, and the alignment windows 11130' may be further processed into alignment window regions 11131. These donor wafer device structures 11150 may utilize through layer vias (TLVs) 11160 to electrically couple the donor wafer device structures 11150 to the acceptor wafer metal connect pads or strips 11180. As the transferred layers 11102 may be thin, on the order of 200 nm or less in thickness, the TLVs may be easily manufactured as a normal metal to metal via may be, and said TLV may have state of the art diameters such as nanometers or tens of nanometers. TLV 11160 may be drawn in the database (not shown) so that it may be positioned approximately at the center of the acceptor wafer metal connect pads or strips 11180 and donor wafer devices structure metal connect pads or strips, and, hence, may be away from the ends of acceptor wafer metal connect pads or strips 11180 and donor wafer devices structure metal connect pads or strips at distances greater than approximately the nominal layer to layer misalignment margin.

Additionally, when monolithically stacking multiple layers of transistors and circuitry, there may be a practical limit on how many layers can be effectively stacked. For example, the processing time in the wafer fabrication facility may be too long or yield too risky for a stack of 8 layers, and yet it may be acceptable for creating 4 layer stacks. It therefore may be desirable to create two 4 layer sub-stacks, that may be tested and error or yield corrected with, for example, redundancy schemes described elsewhere in the document, and then stack the two 4-layer sub-stacks to create the desired 8-layer 3D IC stack. The sub-stack transferred layer and substrate or carrier substrate may not be optically transparent to shorter wavelength light, and hence not able to detect alignment marks and images to a nanometer or tens of nanometer resolution, due to the transferred layer or its carrier or holder substrate's thickness or material composition. Infra-red (IR) optics and imaging may be utilized for alignment purposes. However, the resolution and alignment capability may not be satisfactory. In some embodiments of the present invention, alignment windows may be created that allow use of the shorter wavelengths of light for alignment purposes during layer transfer flows or traditional through silicon via (TSV) flows as a method to stack and electrically couple the sub-stacks.

Figures 61A, 61B, 61C, 61D, 61E:
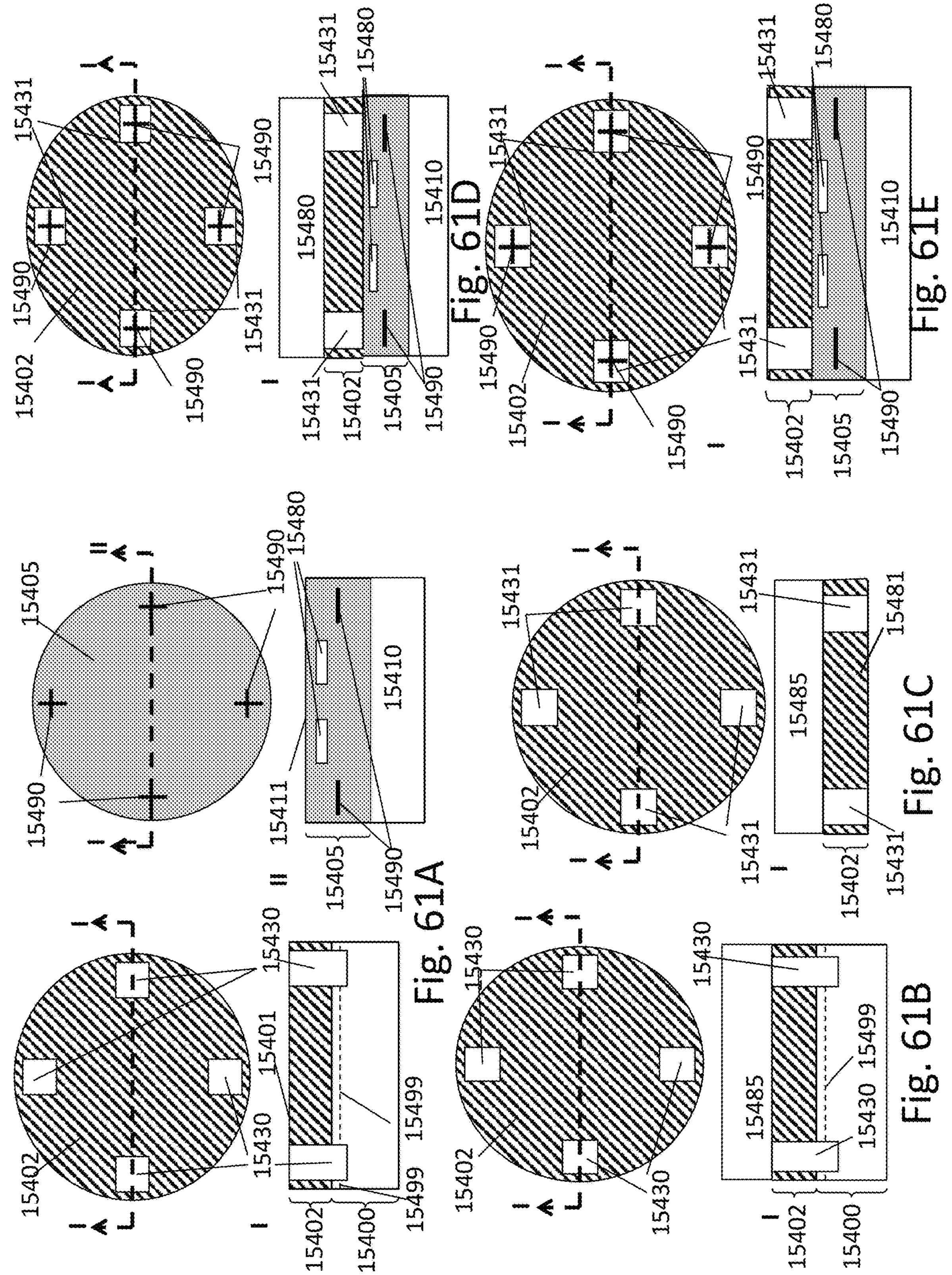
FIG. 61A-FIG. 61F are exemplary drawing illustrations of a generalized layer transfer process flow with alignment windows for stacking sub-stacks utilizing a carrier substrate.

As illustrated in FIG. 61A with cross-sectional cuts I and II, a generalized process flow utilizing a carrier wafer or substrate may begin with a donor wafer 15400 that may be preprocessed with multiple layers of monolithically stacked transistors and circuitry sub-stack 15402 by 3D IC methods, including, for example, methods such as described in general in FIG. 1 and in many embodiments in this document. The donor wafer 15400 may also be preprocessed with a layer transfer demarcation plane 15499, such as, for example, a hydrogen implant cleave plane, before or after multiple layers of monolithically stacked transistors and circuitry sub-stack 15402 is formed, or layer transfer demarcation plane 15499 may represent an SOI donor wafer buried oxide, or may be preprocessed by other methods previously described, such as, for example, use of a heavily boron doped layer. Alignment windows 15430 may be lithographically defined and may then be plasma/RIE etched substantially through the multiple layers of monolithically stacked transistors and circuitry sub-stack 15402 and then may be etched to approximately the layer transfer demarcation plane 15499. In FIG. 61A, the alignment windows 15430 are shown etched past the layer transfer demarcation plane 15499, but may be etched shallower than the layer transfer demarcation plane 15499. The alignment windows 15430 may then be filled with shorter wavelength transparent material, such as, for example, silicon dioxide, and then may be planarized with chemical mechanical polishing (CMP). The size and placement on donor wafer 15400 of the alignment windows 15430 may be determined based on the maximum misalignment tolerance of the alignment scheme used while bonding the donor wafer 15400 to the acceptor wafer 15410, and the number and placement locations of the acceptor wafer alignment marks 15490. Alignment windows 15430 may be processed before or after each or some of the layers of the multiple layers of monolithically stacked transistors and circuitry sub-stack 15402 are formed.

Acceptor wafer 15410 may be a preprocessed wafer with multiple layers of monolithically stacked transistors and circuitry sub-stack 15405. Acceptor wafer 15410 metal connect pads or strips 15480 and acceptor wafer alignment marks 15490 are shown and may be formed in the top device layer of the multiple layers of monolithically stacked transistors and circuitry sub-stack 15405 (shown), or may be formed in any of the other layers of multiple layers of monolithically stacked transistors and circuitry sub-stack 15405 (not shown), or may be formed in the substrate portion of the acceptor wafer 15410 (not shown).

As illustrated in FIG. 61B with cross-sectional cut I, carrier substrate 15485, such as, for example, a glass or quartz substrate, may be temporarily bonded to the donor wafer at surface 15401. Some carrier substrate temporary bonding methods and materials are described elsewhere in this document.

As illustrated in FIG. 61C with cross-sectional cut I, the donor wafer 15400 may be substantially thinned by previously described processes, such as, for example, cleaving at the layer transfer demarcation plane 15499 and polishing with CMP to approximately the bottom of the STI structures. The STI structures may be in the bottom layer of the donor wafer sub-stack multiple layers of monolithically stacked transistors and circuitry sub-stack 15402. Alignment windows 15431 may be thus formed.

Both the carrier substrate 15485 with donor wafer sub-stack multiple layers of monolithically stacked transistors and circuitry sub-stack 15402 and the acceptor wafer 15410 bonding surfaces, donor wafer bonding surface 15481 and acceptor bonding surface 15411, may be prepared for wafer bonding by depositions, polishes, plasma, or wet chemistry treatments to facilitate successful wafer to wafer bonding.

As illustrated in FIG. 61D with cross-sectional cut I, the carrier substrate 15485 with donor wafer multiple layers of monolithically stacked transistors and circuitry sub-stack 15402 and alignment windows 15431, may then be high resolution aligned to acceptor wafer alignment marks 15490, and may be bonded to the acceptor wafer 15410 with multiple layers of monolithically stacked transistors and circuitry sub-stack 15405 at acceptor bonding surface 15411 and donor wafer bonding surface 15481. Temperature controlled and profiled wafer bonding chucks may be utilized to compensate for run-out or other across the wafer and wafer section misalignment or expansion offsets.

As illustrated in FIG. 61E with cross-sectional cut I, the carrier substrate 15485 may be detached with processes described elsewhere in this document, for example, with laser ablation of a polymeric adhesion layer, thus leaving alignment windows 15431 and the pre-processed multiple layers of monolithically stacked transistors and circuitry sub-stack 15402 aligned and bonded to the acceptor wafer 15410 with multiple layers of monolithically stacked transistors and circuitry sub-stack 15405, acceptor wafer 15410 metal connect pads or strips 15480, and acceptor wafer alignment marks 15490.

Figure 61F:
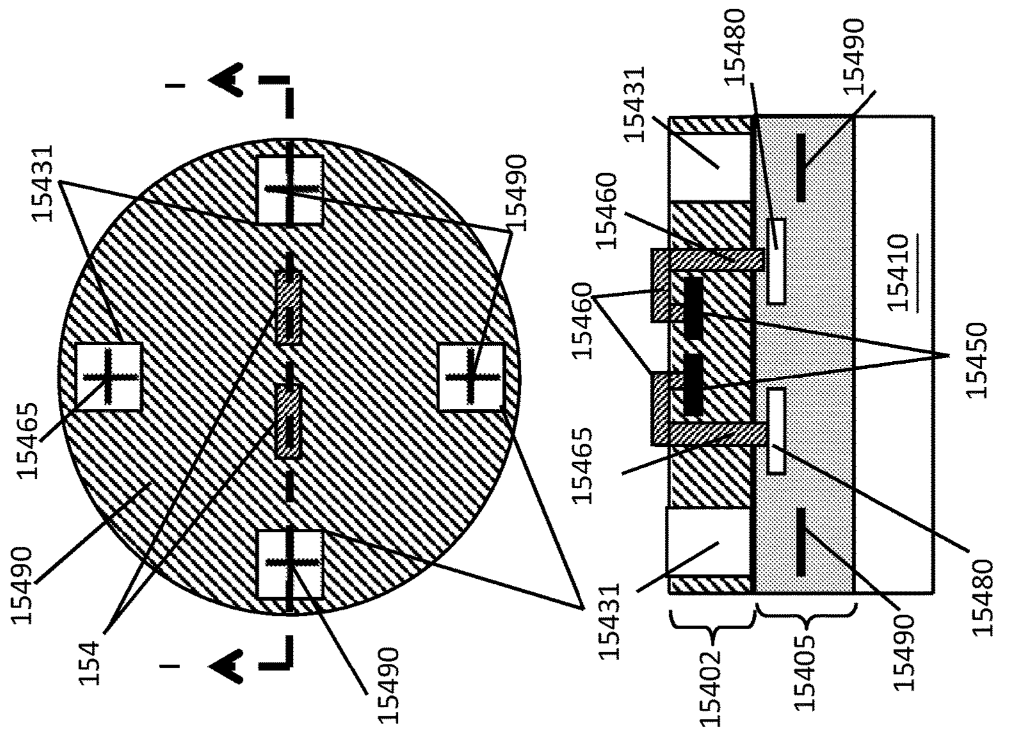

As illustrated in FIG. 61F with cross-sectional cut I, the transferred multiple layers of monolithically stacked transistors and circuitry sub-stack 15402 may be further processed to create layer to layer or sub-stack to sub-stack connections utilizing methods including, for example, through layer vias (TLVs) 15460 and metallization 15465 to electrically couple the transferred multiple layers of monolithically stacked transistors and circuitry sub-stack 15402 donor wafer device structures 15450 to the acceptor wafer metal connect pads or strips 15480. As the thickness of the transferred multiple layers of monolithically stacked transistors and circuitry sub-stack 15402 increases, traditional via last TSV (Thru Silicon Via) processing may be utilized to electrically couple the transferred multiple layers of monolithically stacked transistors and circuitry sub-stack 15402 donor wafer device structures 15450 to the acceptor wafer metal connect pads or strips 15480. TLV 15460 may be drawn in the database (not shown) so that it may be positioned approximately at the center of the acceptor wafer metal connect pads or strips 15480 and donor wafer devices structure metal connect pads or strips, and, hence, may be away from the ends of acceptor wafer metal connect pads or strips 15480 and donor wafer devices structure metal connect pads or strips at distances greater than approximately the nominal layer to layer misalignment margin.

Persons of ordinary skill in the art will appreciate that the illustrations in FIG. 61A through FIG. 61F are exemplary only and are not drawn to scale. Such skilled persons will further appreciate that many variations may be possible such as, for example, the acceptor wafer 15410 may have alignment windows over the alignment marks formed prior to the alignment and bonding step to the donor wafer. Additionally, a via-first TSV process may be utilized on the donor wafer 15400 prior to the wafer to wafer bonding. Moreover, the acceptor wafer 15410 and the donor wafer 15400 may be, for example, a bulk mono-crystalline silicon wafer or a Silicon On Insulator (SOI) wafer or a Germanium on Insulator (GeOI) wafer. Further, the carrier substrate may be a silicon wafer with a layer transfer demarcation plane and utilize methods, such as permanently oxide to oxide bonding the carrier wafer to the donor wafer and then cleaving and thinning after bonding to the acceptor wafer, described elsewhere in this document, to layer transfer the donor wafer device layers or sub-stack to the acceptor wafer. Moreover, the opening size of the alignment windows 15430 formed may be substantially minimized by use of pre-alignment with IR or other long wavelength light, and final high resolution alignment performed through the alignment windows 15430 with lower wavelength light. Many other modifications within the scope of the illustrated embodiments of the invention will suggest themselves to such skilled persons after reading this specification. Thus the invention is to be limited only by the appended claims.

With reference to FIG. 61, it may be desirable to have the circuitry interconnection between the underlying base wafer acceptor wafer 15410 with multiple layers of monolithically stacked transistors and circuitry sub-stack 15405 and the transferred layer of the donor wafer multiple layers of monolithically stacked transistors and circuitry sub-stack 15402 accomplished during the stacking step and processing. A potential advantage may be that there would be no need to leave room for the TLV 15460. This may be desirable if the transferred layer donor wafer multiple layers of monolithically stacked transistors and circuitry sub-stack 15402 includes transistor layers plus multiple layers of interconnections and when many connections may be required between the underlying acceptor wafer 15410 with multiple layers of monolithically stacked transistors and circuitry sub-stack 15405 and the overlying transferred layer donor wafer multiple layers of monolithically stacked transistors and circuitry sub-stack 15402. There are multiple techniques known in the art to form electrical connection as part of the bonding process of wafers but the challenge is the misalignment between the two structures bonded. This misalignment may be associated with the process of wafer bonding. As discussed before, the misalignment between wafers of current wafer to wafer bonding equipment is about one micrometer, which may be large with respect to the desired connectivity scale density of nanometer processing.

To accomplish electrical connections between the acceptor wafer and the donor wafer the acceptor wafer may have on its top surface connection pads, which may include, for example, copper or aluminum, which will be called bottom-pads. The bottom surface of the donor wafer transferred layer may also have connection pads, which may include, for example, copper or aluminum, which will be called upper-pads. The bottom-pads and upper-pads may be placed one on top of the other to form electrical connections. If the bottom-pads and upper-pads are constructed large enough, then the wafer to wafer bonding misalignment may not limit the ability to connect. And accordingly, for example, for a 1 micrometer misalignment, the connectivity limit would be on the order of one connection per 1 micron square with bottom-pads and upper-pads sizes on the order of 1 micrometer on a side. The following alternative of the invention would allow much higher vertical connectivity than the wafer to wafer bonding misalignment limits. The planning of these connection pads need to be such that regardless of the misalignment (within a given maximum limit, for example, 1 micrometer) all the desired connections would be made, while avoiding forming shorts between two active independent connection paths.

Figure 62A:
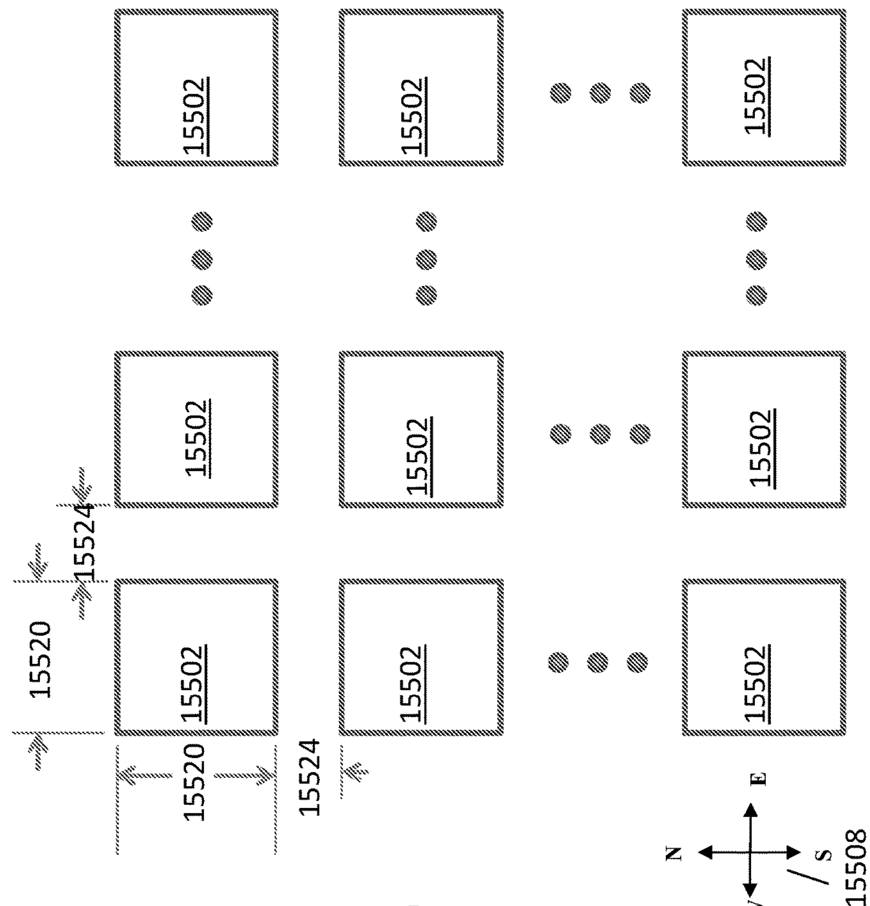
FIG. 62A is a drawing illustration of an exemplary portion of a wafer sized or die sized plurality of bottom-pads.
Figure 62D:
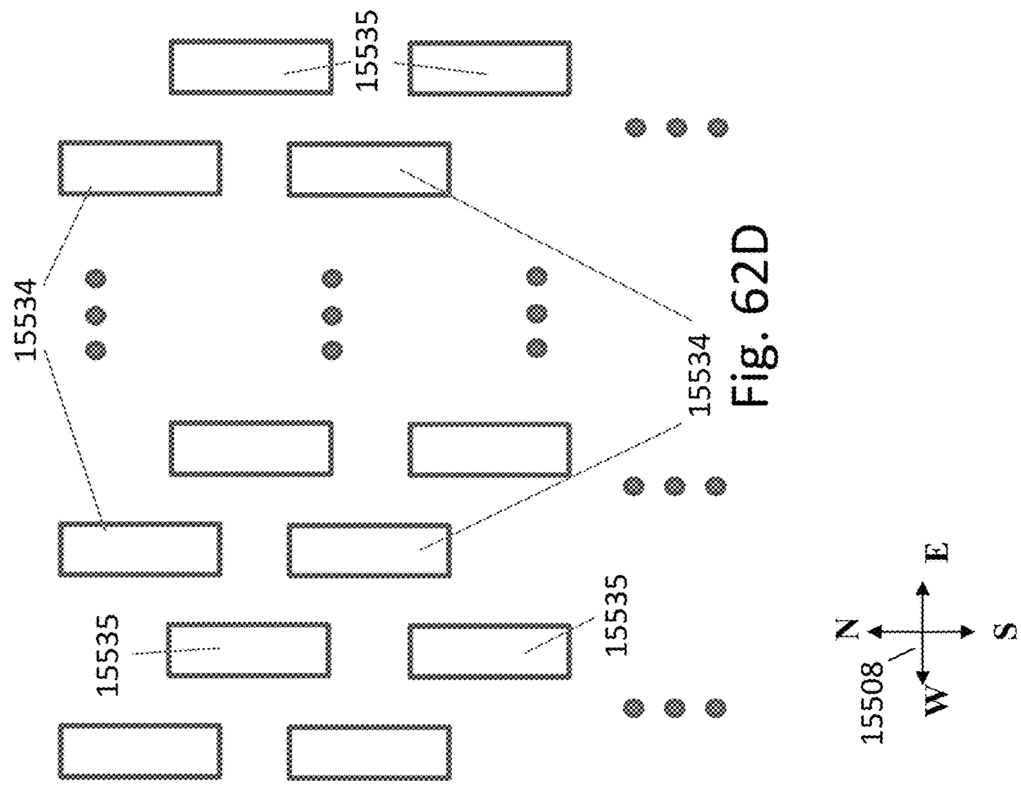
FIG. 62D is a drawing illustration of an exemplary portion of a wafer sized or die sized plurality of upper-strips.
Figure 62B:
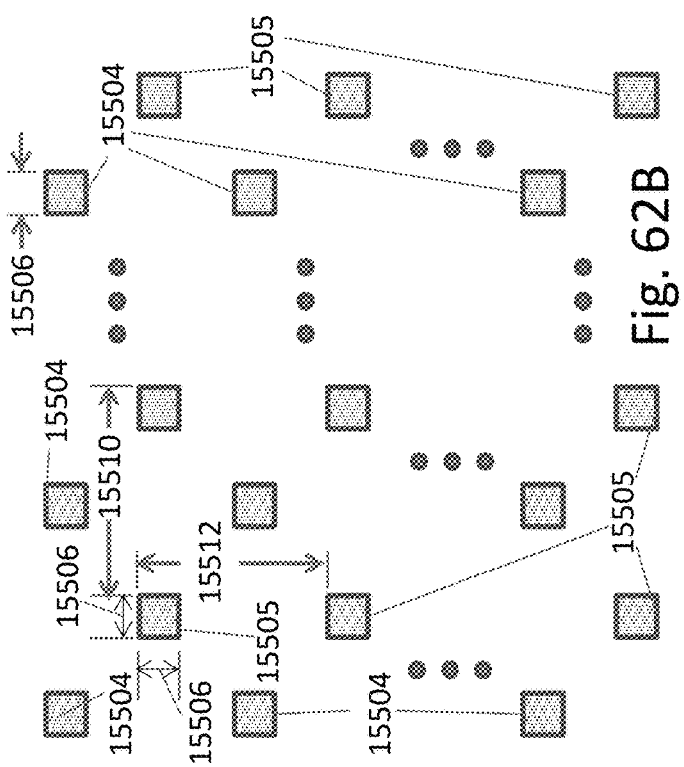
FIG. 62B is a drawing illustration of an exemplary portion of a wafer sized or die sized plurality of upper-pads.

FIG. 62A illustrates an exemplary portion of a wafer sized or die sized plurality of bottom-pads 15502 and FIG. 62B illustrates an exemplary portion of a wafer sized or die sized plurality of upper-pads 15504 and upper-pads 15505 (not all pads are reference number tie-lined for clarity of the illustrations). The design may be such that for each bottom-pad 15502 there may be at least one upper-pad 15504 or upper-pad 15505 that bottom-pad 15502 may be in full contact with after the layer transfer bonding and associated misalignment of designed pads, and in no case the upper-pad 15504 or upper-pad 15505 might form a short between two bottom-pads 15502. Bottom-pad space 15524, the space between two adjacent bottom-pads 15502, may be made larger than the size of the upper-pads 15504 or upper-pads 15505. An illustrative directional orientation cross 15508 is provided for FIG. 62A to FIG. 62D. It should be noted that in a similar manner as typical semiconductor device design rules, spaces and structure sizing may need to account for process variations, such as lithographic and etch variations and biases. For example, the bottom-pad space 15524 may need to be large enough to avoid shorts even if the sizes of some pads, for example some of upper-pads 15504 or upper-pads 15505, turn out large within the process window range at end of process. For simplicity of the explanation, the details of such rules extension for covering all the production-acceptable variations may be ignored, as these are well known in the practice of the art.

As illustrated in FIG. 62A, the bottom-pads 15502 may be arranged in repeating patterns of rows and columns. Each bottom-pad 15502 may be a square with sides 15520 and may be spaced bottom-pad space 15524 to the next column pad and spaced bottom-pad space 15524 to the next row. The upper-pads and layout may be constructed with sets of upper-pads 15504 and upper-pads 15505 as illustrated in FIG. 62B. Each set of upper-pads may be arranged in row and column with the same repetition cycle and distance as the bottom-pads 15502, and may be symmetrically offset with respect to each other so that each upper-pad 15505 may be placed in equal distance to the four upper-pads 15504 that may be around said upper-pad 15505. The sizing of the pads and the distance between them may be set so that when upper-pad 15504 lands perfectly aligned to the North-West corner of a bottom-pad 15502, the corresponding (of set) upper-pad 15505, which is South-East of bottom-pad 15502, may land aligned to the South-East corner of the same bottom-pad 15502. It should be noted, that, as has been described before, misalignment of up to 1 micrometer could happen in current wafer bonding equipment in the direction of North-South or West-East but the angular misalignment may be quite small and would be less than 1 micrometer over the substantially the entire wafer size of 300 mm. Accordingly the design rule pad sizes and spaces could be adjusted to accommodate the angular misalignment.

It may be appreciated that for any misalignment in North-Sought and in West-East direction that is within the misalignment range, there will at least one of the upper-pads in the set (upper-pads 15504 or upper-pads 15505) that may come in substantially full contact with their corresponding bottom-pad 15502. If upper-pads 15504 fall in the space between bottom-pads 15502, then upper-pads 15505 would be in substantially full contact with a bottom pad 155002, and vice-versa.

The layout structure of connections illustrated in FIG. 62A and FIG. 62B may be made as follows in exemplary steps A to E.

Step A: Upper-pad side length 15506 may be designed and drawn as the smallest allowed by the design rules, with upper-pads 15504 and upper-pads 15505 being the smallest square allowed by the design rules.

Step B: Bottom-pad space 15524 may be made large enough so that upper-pads 15504 or upper-pads 15505 may not electrically short two adjacent bottom-pads 15502.

Step C: Bottom-pads 15502 may be squares with sides 15520, sides 15520 which may be equal in distance to double the distance of bottom-pad space 15524.

Step D: The bottom-pads 15502 layout structure, as illustrated in FIG. 62A, may be rows of bottom-pads 15502 as squares sized of sides 15520 and spaced bottom-pad space 15524, and forming columns of squares bottom-pads 15502 spaced by bottom-pad space 15524. The horizontal and vertical repetition may then be three times the bottom-pad space 15524.

Step E: The upper-pads structure, as illustrated in FIG. 62B, may be two sets of upper-pads 15504 and upper-pads 15505. Each set may be rows of squares sized upper-pad side length 15506 and may repeat every E-W length 15510, where E-W length 15510 may be 3 times bottom-pad space 15524, and forming columns of these squares repeating every N—S length 15512, where N—S length 15512 may be 3 times bottom-pad space 15524. The two sets may be offset in both in the West-East direction and the North-South direction so that each upper-pad 15505 may be placed in the middle of the space between four adjacent upper-pads 15504.

Such a pad structure as illustrated in FIG. 62A and FIG. 62B may provide a successful electrical connection of wires between two bonded wafers so there may always be at least one successful connection between the bottom wafer pad and one of its corresponding upper wafer pads, and no undesired shorts can occur. The structure may be designed such that for every bottom-pad 15502 there may be a potential pair of upper-pads 15504 and upper-pads 15505 of which at least one is forming good contact. The selection of which upper-pad (upper-pad 15504 or upper-pad 15505) to utilize for electrical connections between the two bonded wafers could be based on a chip test structure which would test which pad set has a lower resistance, or by optical methods to measure the misalignment and then select upper-pads 15504 or upper-pads 15505 according to the misalignment the appropriate pad set.

An electronic circuit could be constructed to route a signal from the bottom-pads 15502 through the electrically connected upper-pads 15504 or upper-pads 15505 to the appropriate circuit at the upper layer, such as the transferred layer of the donor wafer multiple layers of monolithically stacked transistors and circuitry sub-stack 15402. Such switch matrix would need to be designed according to the maximum misalignment error and the number of signals within that range. The programming of the switch matrix to properly connect stack layer signals could be done based on, for example, an electrically read on-chip test structure or on an optical misalignment measurement. Such electronic switch matrices are known in the art and are not detailed herein. Additionally, the misalignment compensation and reroute to properly connect stack layer signals could be done in the transferred layer (such as the transferred layer of the donor wafer multiple layers of monolithically stacked transistors and circuitry sub-stack 15402) metal connection layers and misalignment compensation structures as has been described before with respect to FIG. 35.

Figure 62C:
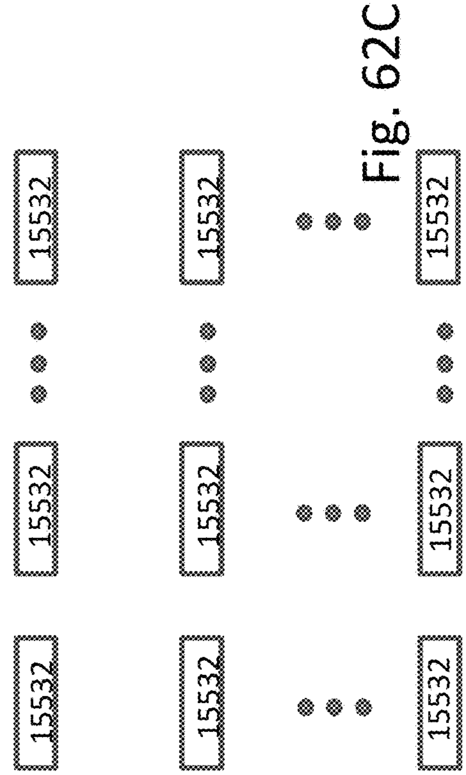
FIG. 62C is a drawing illustration of an exemplary portion of a wafer sized or die sized plurality of bottom-strips.

Another variation of such structures could be made to meet the same requirements as the bottom-pads/upper-pads structures described in FIG. 62A and FIG. 62B. FIG. 62C illustrates a repeating structure of bottom-pad strips 15532 and FIG. 62D illustrates the matching structures of upper-pad strips 15534 and the offset upper-pad strips 15535. The layout and design of the structures in FIG. 62C and FIG. 62D may be similar to that described for FIG. 62A and FIG. 62B.

Persons of ordinary skill in the art will appreciate that the illustrations in FIG. 62A through FIG. 62D are exemplary only and are not drawn to scale. Such skilled persons will further appreciate that many variations may be possible such as, for example, the acceptor wafer and donor wafer in the discussion may be sub-stacks of multiple layers of circuitry and interconnect or may be singular layers of processed or pre-processed circuitry or doped layers. Moreover, misalignment between the two layers of circuitry which are desired to be connected may be a result from more than the wafer to wafer bonding process; for example, from lithographic capability, or thermal or stress induced continental drift. Further, bottom-pad space 15524 may not be symmetric in North-South and East-West directions. Furthermore, the orientation of the bottom and upper pads and spaces may not be in an orthogonal or Cartesian manner as illustrated, they could be angular or of polar co-ordinate type. Moreover, sides 15520 of bottom-pad 15502 may instead be not equal to each other and bottom-pad 15502 may be shaped, for example, as a rectangle. Moreover, upper pad side length 15506 of upper-pad 15504 or upper-pad 15505 may not be equal to each other and upper-pad 15504 or upper-pad 15505 may be shaped, for example, as a rectangle. Furthermore, bottom-pad 15502 and upper-pad 15504 or upper-pad 15505 may be shaped in circular or oval shapes. Moreover, upper-pad 15504 may be sized or shaped differently than upper-pad 15505. Further, shorts may be designed in to allow for example, higher current carrying pad connections. Moreover, the misalignment compensation and reroute to properly connect stack layer signals may utilize programmable switches or programmable logic, and may be tied to the electrically read on-chip test structure. Furthermore, each set of upper-pads may be non-symmetrically offset with respect to each other so that each upper-pad 15505 may be placed in a non-equal distance to the four upper-pads 15504 that may be around said upper-pad 15505. Many other modifications within the scope of the illustrated embodiments of the invention will suggest themselves to such skilled persons after reading this specification. Thus the invention is to be limited only by the appended claims.

There may be many ways to build the multilayer 3D IC, as some embodiments of the invention may follow. Wafers could be processed sequentially one layer at a time to include one or more transistor layers and then connect the structure of one wafer on top of the other wafer. In such case the donor wafer, for example transferred layer of the donor wafer multiple layers of monolithically stacked transistors and circuitry sub-stack 15402, may be a fully processed multi-layer wafer and the placing on top of the acceptor wafer, for example acceptor wafer 15410, could include flipping it over or using a carrier method to avoid flipping. In each case the non-essential substrate could be cut or etched away using layer transfer techniques such as those described before.

Wafers could be processed in parallel, each one potentially utilizing a different wafer fab or process flow and then proceeding as in the paragraph directly above.

One wafer could contain non repeating structures while the other one would contain repeating structures such as memory or programmable logic. In such case there are strong benefits for high connectivity between the wafers, while misalignment can be less of an issue as the repeating structure might be tolerant of such misalignment.

The transferred wafer or layer, for example transferred layer of the donor wafer multiple layers of monolithically stacked transistors and circuitry sub-stack 15402, could include a repeating transistors structure but subsequent to the bonding the follow-on process would align to the structure correctly as described above to keep to a minimum the overhead resulting from the wafer bonding misalignment.

Figure 59:
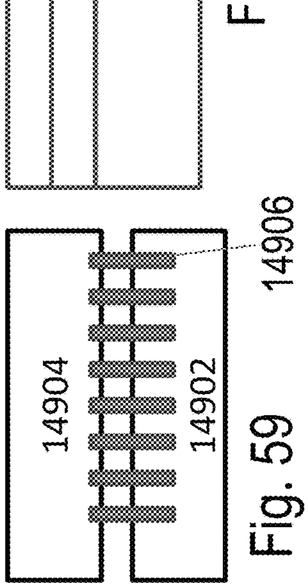
FIG. 59 is an exemplary drawing illustration of 3D stacked peripheral transistors constructed above a memory layer.

FIG. 59 describes an embodiment of the invention, wherein a memory array 14902 may be constructed on a piece of silicon and peripheral transistors 14904 may be stacked atop the memory array 14902. The peripheral transistors 14904 may be constructed well-aligned with the underlying memory array 14902 using any of the schemes described in this document. For example, the peripheral transistors may be junction-less transistors, recessed channel transistors or they could be formed with one of the repeating layout schemes described in this document. Through-silicon connections 14906 may connect the memory array 14902 to the peripheral transistors 14904. The memory array may be DRAM memory, SRAM memory, flash memory, some type of resistive memory or in general, could be any memory type that may be commercially available.

An additional use for the high density of TLVs 11160 in FIG. 42D, or any such TLVs in this document, may be to thermally conduct heat generated by the active circuitry from one layer to another connected by the TLVs, such as, for example, donor layers and device structures to acceptor wafer or substrate. TLVs 11160 may also be utilized to conduct heat to an on chip thermoelectric cooler, heat sink, or other heat removing device. A portion of TLVs on a 3D IC may be utilized primarily for electrical coupling, and a portion may be primarily utilized for thermal conduction. In many cases, the TLVs may provide utility for both electrical coupling and thermal conduction.

FIG. 64 illustrates a 3D integrated circuit. Two mono-crystalline silicon layers, 16004 and 16016 are shown. Silicon layer 16016 could be thinned down from its original thickness, and its thickness could be in the range of approximatelylum to approximately 50 um. Silicon layer 16004 may include transistors which could have gate electrode region 16014, gate dielectric region 16012, and shallow trench isolation (STI) regions 16010. Silicon layer 16016 may include transistors which could have gate electrode region 16034, gate dielectric region 16032, and shallow trench isolation (STI) regions 16030. A through-silicon via (TSV) 16018 could be present and may have a surrounding dielectric region 16020. Wiring layers for silicon layer 16004 are indicated as 16008 and wiring dielectric is indicated as 16006. Wiring layers for silicon layer 16016 are indicated as 16038 and wiring dielectric is indicated as 16036. The heat removal apparatus, which could include a heat spreader and a heat sink, is indicated as 16002. The heat removal problem for the 3D integrated circuit shown in FIG. 64 may be immediately apparent. The silicon layer 16016 is far away from the heat removal apparatus 16002, and it may be difficult to transfer heat between silicon layer 16016 and heat removal apparatus 16002. Furthermore, wiring dielectric regions 16006 do not conduct heat well, and this increases the thermal resistance between silicon layer 16016 and heat removal apparatus 16002.

FIG. 65 illustrates a 3D integrated circuit that could be constructed, for example, using techniques described herein and in US Patent Application 2011/0121366 and U.S. patent application Ser. No. 13/099,010. Two mono-crystalline silicon layers, 16104 and 16116 are shown. Silicon layer 16116 could be thinned down from its original thickness, and its thickness could be in the range of approximately 3 nm to approximately 1 um. Silicon layer 16104 may include transistors which could have gate electrode region 16114, gate dielectric region 16112, and shallow trench isolation (STI) regions 16110. Silicon layer 16116 may include transistors which could have gate electrode region 16134, gate dielectric region 16132, and shallow trench isolation (STI) regions 16122. It can be observed that the STI regions 16122 can go right through to the bottom of silicon layer 16116 and provide good electrical isolation. This, however, can cause challenges for heat removal from the STI surrounded transistors since STI regions 16122 may typically be insulators that do not conduct heat well. Therefore, the heat spreading capabilities of silicon layer 16116 with STI regions 16122 may be low. A through-layer via (TLV) 16118 could be present and may include its dielectric region 16120. Wiring layers for silicon layer 16104 are indicated as 16108 and wiring dielectric is indicated as 16106. Wiring layers for silicon layer 16116 are indicated as 16138 and wiring dielectric is indicated as 16136. The heat removal apparatus, which could include a heat spreader and a heat sink, is indicated as 16102. The heat removal problem for the 3D integrated circuit shown in FIG. 65 may be immediately apparent. The silicon layer 16116 is far away from the heat removal apparatus 16102, and it may be difficult to transfer heat between silicon layer 16116 and heat removal apparatus 16102. Furthermore, wiring dielectric regions 16106 do not conduct heat well, and this increases the thermal resistance between silicon layer 16116 and heat removal apparatus 16102. The heat removal challenge may be further exacerbated by the poor heat spreading properties of silicon layer 16116 with STI regions 16122.

FIG. 66 and FIG. 67 illustrate how the power or ground distribution network of a 3D integrated circuit could assist heat removal. FIG. 66 illustrates an exemplary power distribution network or structure of the 3D integrated circuit. The 3D integrated circuit, could, for example, be constructed with two silicon layers 16204 and 16216. The heat removal apparatus 16202 could include a heat spreader and a heat sink. The power distribution network or structure could consist of a global power grid 16210 that takes the supply voltage (denoted as VDD) from power pads and transfers it to local power grids 16208 and 16206, which then transfer the supply voltage to logic cells or gates such as 16214 and 16215. Vias 16218 and 16212, such as the previously described TSV or TLV, could be used to transfer the supply voltage from the global power grid 16210 to local power grids 16208 and 16206. The 3D integrated circuit could have similar distribution networks, such as for ground and other supply voltages, as well. Typically, many contacts may be made between the supply and ground distribution networks and silicon layer 16204. As a result there may exist a low thermal resistance between the power/ground distribution network and the heat removal apparatus 16202. Since power/ground distribution networks are typically constructed of conductive metals and could have low effective electrical resistance, they could have a low thermal resistance as well. Each logic cell or gate on the 3D integrated circuit (such as, for example 16214) is typically connected to VDD and ground, and therefore could have contacts to the power and ground distribution network. These contacts could help transfer heat efficiently (i.e. with low thermal resistance) from each logic cell or gate on the 3D integrated circuit (such as, for example 16214) to the heat removal apparatus 16202 through the power/ground distribution network and the silicon layer 16204.

FIG. 67 illustrates an exemplary NAND gate 16320 or logic cell and shows how all portions of this logic cell or gate could be located with low thermal resistance to the VDD or ground (GND) contacts. The NAND gate 16320 could consist of two pMOS transistors 16302 and two nMOS transistors 16304. The layout of the NAND gate 16320 is indicated in 16322. Various regions of the layout include metal regions 16306, poly regions 16308, n type silicon regions 16310, p type silicon regions 16312, contact regions 16314, and oxide regions 16324. pMOS transistors in the layout are indicated as 16316 and nMOS transistors in the layout are indicated as 16318. It can be observed that substantially all parts of the exemplary NAND gate 16320 could have low thermal resistance to VDD or GND contacts since they are physically very close to them. Thus, substantially all transistors in the NAND gate 16320 can be maintained at desirable temperatures if the VDD or ground contacts are maintained at desirable temperatures.

While the previous paragraph describes how an existing power distribution network or structure can transfer heat efficiently from logic cells or gates in 3D-ICs to their heat sink, many techniques to enhance this heat transfer capability will be described herein. These embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. These techniques may be useful for different implementations of 3D-ICs, including, for example, monolithic 3D-ICs and TSV-based 3D-ICs.

Figure 68:
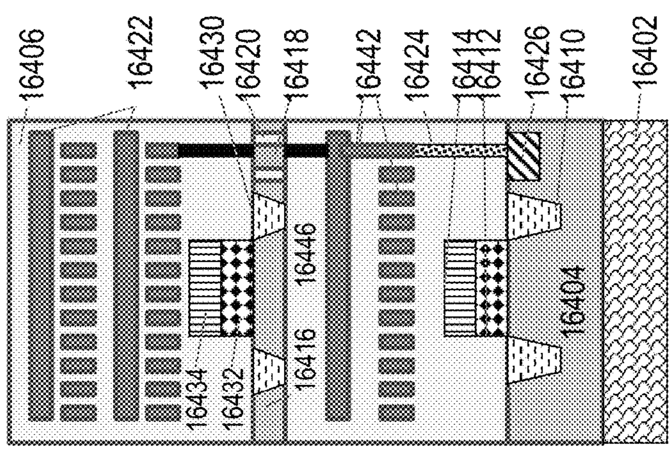
FIG. 68 is an exemplary drawing illustration of the thermal contact concept applied.

FIG. 68 describes an embodiment of the invention, where the concept of thermal contacts is described. Two mono-crystalline silicon layers, 16404 and 16416 may have transistors. Silicon layer 16416 could be thinned down from its original thickness, and its thickness could be in the range of approximately 3 nm to approximately 1 um. Mono-crystalline silicon layer 16404 could have STI regions 16410, gate dielectric regions 16412, gate electrode regions 16414 and several other regions required for transistors (not shown). Mono-crystalline silicon layer 16416 could have STI regions 16430, gate dielectric regions 16432, gate electrode regions 16434 and several other regions required for transistors (not shown). Heat removal apparatus 16402 may include, for example, heat spreaders and heat sinks. In the example shown in FIG. 68, mono-crystalline silicon layer 16404 is closer to the heat removal apparatus 16402 than other mono-crystalline silicon layers such as mono-crystalline silicon layer 16416. Dielectric regions 16406 and 16446 could be used to electrically insulate wiring regions such as 16422 and 16442 respectively. Through-layer vias for power delivery 16418 and their associated dielectric regions 16420 are shown. A thermal contact 16424 can be used that connects the local power distribution network or structure, which may include wiring layers 16442 used for transistors in the silicon layer 16404, to the silicon layer 16404. Thermal junction region 16426 can be either a doped or undoped region of silicon, and further details of thermal junction region 16426 will be given in FIG. 69. The thermal contact such as 16424 can be placed close to the corresponding through-layer via for power delivery 16418; this helps transfer heat efficiently from the through-layer via for power delivery 16418 to thermal junction region 16426 and silicon layer 16404 and ultimately to the heat removal apparatus 16402. For example, the thermal contact 16424 could be located within approximately 2 um distance of the through-layer via for power delivery 16418 in the X-Y plane (the through-layer via direction is considered the Z plane in FIG. 68). While the thermal contact such as 16424 is described above as being between the power distribution network or structure and the silicon layer closest to the heat removal apparatus, the thermal contact could also be placed between the ground distribution network and the silicon layer closest to the heat sink. Furthermore, more than one thermal contact 16424 can be placed close to the through-layer via for power delivery 16418. These thermal contacts can improve heat transfer from transistors located in higher layers of silicon such as 16416 to the heat removal apparatus 16402. While mono-crystalline silicon has been mentioned as the transistor material in this paragraph, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias need not be stacked in a vertical line through multiple stacks, layers, strata of circuits. Thermal contacts and vias may include materials such as sp2 carbon as conducting and sp3 carbon as non-conducting of electrical current.

Figure 69:
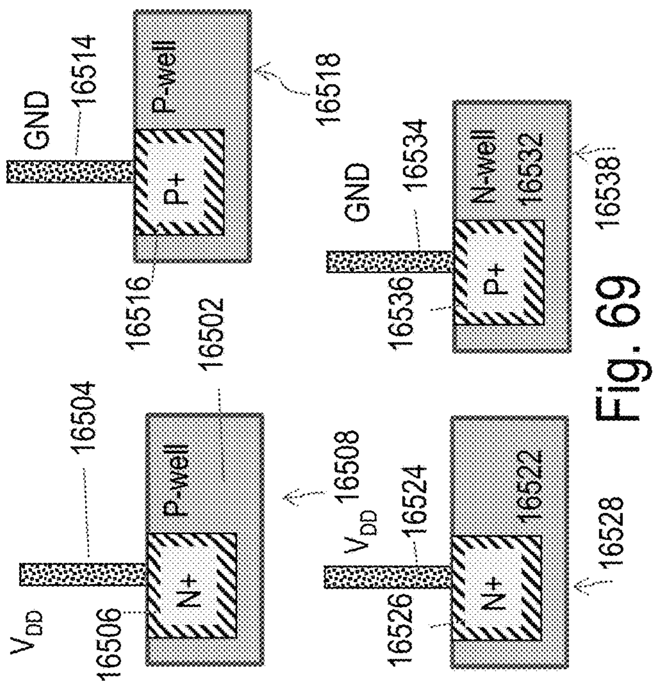
FIG. 69 is an exemplary drawing illustration of various types of thermal contacts.

FIG. 69 describes an embodiment of the invention, where various implementations of thermal junctions and associated thermal contacts are illustrated. P-wells in CMOS integrated circuits are typically biased to ground and N-wells are typically biased to the supply voltage VDD. This makes the design of thermal contacts and thermal junctions non-obvious. A thermal contact 16504 between the power (VDD) distribution network and a P-well 16502 can be implemented as shown in N+ in P-well thermal junction and contact example 16508, where an n+ doped region thermal junction 16506 may be formed in the P-well region at the base of the thermal contact 16504. The n+ doped region thermal junction 16506 may ensure that a reverse biased p-n junction can be formed in N+ in P-well thermal junction and contact example 16508 and makes the thermal contact viable (i.e. not highly conductive) from an electrical perspective. The thermal contact 16504 could be formed of a conductive material such as copper, aluminum or some other material. A thermal contact 16514 between the ground (GND) distribution network and a P-well 16512 may be implemented as shown in P+ in P-well thermal junction and contact example 16518, where a p+ doped region thermal junction 16516 may be formed in the P-well region at the base of the thermal contact 16514. The p+ doped region thermal junction 16516 makes the thermal contact viable (i.e. not highly conductive) from an electrical perspective. The p+ doped region thermal junction 16516 and the P-well 16512 would typically be biased at ground potential. A thermal contact 16524 between the power (VDD) distribution network and an N-well 16522 can be implemented as shown in N+ in N-well thermal junction and contact example 16528, where an n+ doped region thermal junction 16526 may be formed in the N-well region at the base of the thermal contact 16524. The n+ doped region thermal junction 16526 makes the thermal contact viable (i.e. not highly conductive) from an electrical perspective. Both the n+ doped region thermal junction 16526 and the N-well 16522 would typically be biased at VDD potential. A thermal contact 16534 between the ground (GND) distribution network and an N-well 16532 can be implemented as shown in P+ in N-well thermal junction and contact example 16538, where a p+ doped region thermal junction 16536 may be formed in the N-well region at the base of the thermal contact 16534. The p+ doped region thermal junction 16536 makes the thermal contact viable (i.e. not highly conductive) from an electrical perspective due to the reverse biased p-n junction formed in P+ in N-well thermal junction and contact example 16538. Note that the thermal contacts, a heat removal connection, may be designed to conduct negligible electricity, and the current flowing through them may be several orders of magnitude lower than the current flowing through a transistor when it is switching. Therefore, the thermal contacts, a heat removal connection, can be considered to be designed to conduct heat and conduct negligible (or no) electricity. Thermal contacts may include materials such as carbon nano-tubes. Thermal contacts and vias may include materials such as sp2 carbon as conducting and sp3 carbon as non-conducting of electrical current. Moreover, thermal contacts and vias need not be stacked in a vertical line through multiple stacks, layers, strata of circuits.

Figure 70:
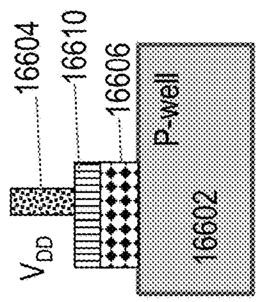
FIG. 70 is an exemplary drawing illustration of another type of thermal contact.

FIG. 70 describes an embodiment of the invention, where an additional type of thermal contact structure is illustrated. The embodiment shown in FIG. 70 could also function as a decoupling capacitor to mitigate power supply noise. It could consist of a thermal contact 16604, an electrode 16610, a dielectric 16606 and P-well 16602. The dielectric 16606 may be electrically insulating, and could be optimized to have high thermal conductivity. Dielectric 16606 could be formed of materials, such as, for example, hafnium oxide, silicon dioxide, other high k dielectrics, carbon, carbon based material, or various other dielectric materials with electrical conductivity below 1 nano-amp per square micron.

A thermal connection may be defined as the combination of a thermal contact and a thermal junction. The thermal connections illustrated in FIG. 69, FIG. 70 and other figures in this patent application may be designed into a chip to remove heat (conduct heat), and may be designed to not conduct electricity. Essentially, a semiconductor device comprising power distribution wires is described wherein some of said wires have a thermal connection designed to conduct heat to the semiconductor layer but the wires do not substantially conduct electricity through the thermal connection to the semiconductor layer.

Thermal contacts similar to those illustrated in FIG. 69 and FIG. 70 can be used in the white spaces of a design, i.e. locations of a design where logic gates or other useful functionality are not present. These thermal contacts connect white-space silicon regions to power and/or ground distribution networks. Thermal resistance to the heat removal apparatus can be reduced with this approach. Connections between silicon regions and power/ground distribution networks can be used for various device layers in the 3D stack, and need not be restricted to the device layer closest to the heat removal apparatus. A Schottky contact or diode may also be utilized for a thermal contact and thermal junction. Thermal contacts and vias may include materials such as sp2 carbon as conducting and sp3 carbon as non-conducting of electrical current. Moreover, thermal contacts and vias need not be stacked in a vertical line through multiple stacks, layers, strata of circuits.

Figure 71:
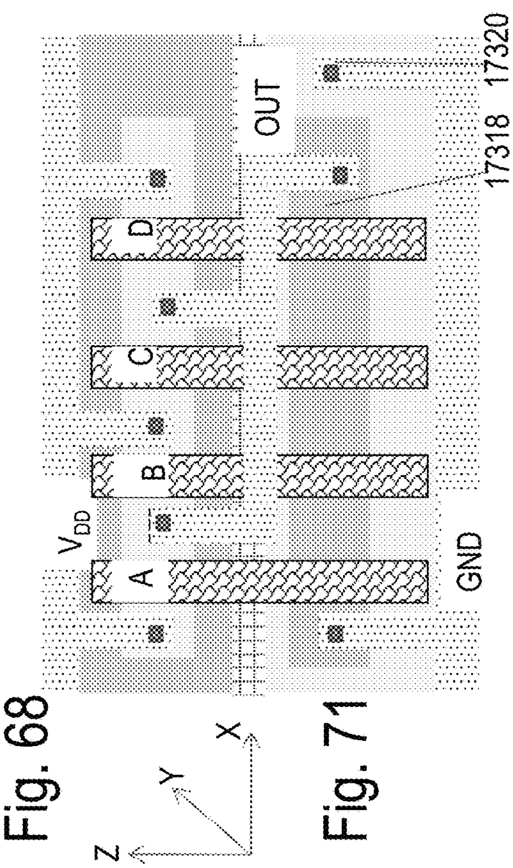
FIG. 71 is an exemplary drawing illustration of a 4 input NAND gate where all parts of the logic cell can be within desirable temperature limits.

FIG. 71 illustrates an embodiment of the invention wherein the layout of the 3D stackable 4 input NAND gate can be modified so that all parts of the gate are at desirable, such as sub-100° C., temperatures during chip operation. Inputs to the gate are denoted as A, B, C and D, and the output is denoted as OUT. Various sections of the 4 input NAND gate could include the metal 1 regions 17306, gate regions 17308, N-type silicon regions 17310, P-type silicon regions 17312, contact regions 17314, and oxide isolation regions 17316. An additional thermal contact 17320 (whose implementation can be similar to those described in FIG. 69 and FIG. 70) can be added to the layout to keep the temperature of region 17318 under desirable limits (by reducing the thermal resistance from region 17318 to the GND distribution network). Several other techniques can also be used to make the layout shown in FIG. 71 more desirable from a thermal perspective.

Figure 72:
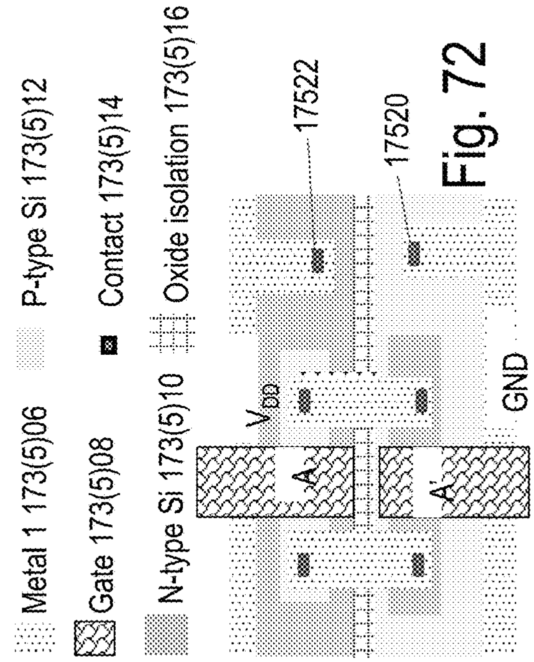
FIG. 72 is an exemplary drawing illustration of a transmission gate where all parts of the logic cell can be within desirable temperature limits.

FIG. 72 illustrates an embodiment of the invention wherein the layout of the 3D stackable transmission gate can be modified so that substantially all parts of the gate are at desirable, such as sub-100° C., temperatures during chip operation. Inputs to the gate are denoted as A and A'. Various sections of the transmission gate could include metal 1 regions 17506, gate regions 17508, N-type silicon regions 17510, P-type silicon regions 17512, contact regions 17514, and oxide isolation regions 17516. Additional thermal contacts, such as, for example 17520 and 17522 (whose implementation can be similar to those described in FIG. 69 and FIG. 70) can be added to the layout to keep the temperature of the transmission gate under desirable limits (by reducing the thermal resistance to the VDD and GND distribution networks). Several other techniques can also be used to make the layout shown in FIG. 72 more desirable from a thermal perspective.

The thermal path techniques illustrated with FIG. 71 and FIG. 72 are not restricted to logic cells such as transmission gates and NAND gates, and can be applied to a number of cells such as, for example, SRAMs, CAMs, multiplexers and many others. Furthermore, the techniques illustrated with FIG. 71 and FIG. 72 can be applied and adapted to various techniques of constructing 3D integrated circuits and chips, including those described in pending US Patent Application 2011/0121366 and U.S. patent application Ser. No. 13/099,010, now U.S. Pat. Nos. 8,362,480 and 8,581,349. Furthermore, techniques illustrated with FIG. 71 and FIG. 72 (and other similar techniques) need not be applied to all such gates on the chip, but could be applied to a portion of gates of that type, such as, for example, gates with higher activity factor, lower threshold voltage, or higher drive current. Moreover, thermal contacts and vias need not be stacked in a vertical line through multiple stacks, layers, strata of circuits.

When a chip is typically designed, a cell library consisting of various logic cells such as NAND gates, NOR gates and other gates may be created, and the chip design flow proceeds using this cell library. It will be clear to one skilled in the art that a cell library may be created wherein each cell's layout can be optimized from a thermal perspective and based on heat removal criteria such as maximum allowable transistor channel temperature (i.e. where each cell's layout can be optimized such that substantially all portions of the cell may have low thermal resistance to the VDD and GND contacts, and such, to the power bus and the ground bus).

While concepts in this patent application have been described with respect to 3D-ICs with two stacked device layers, those of ordinary skill in the art will appreciate that it can be valid for 3D-ICs with more than two stacked device layers.

As layers may be stacked in a 3D IC, the power density per unit area typically increases. The thermal conductivity of mono-crystalline silicon is poor at 150 W/m-K and silicon dioxide, the most common electrical insulator in modern silicon integrated circuits, may have a very poor thermal conductivity at 1.4 W/m-K. If a heat sink is placed at the top of a 3D IC stack, then the bottom chip or layer (farthest from the heat sink) has the poorest thermal conductivity to that heat sink, since the heat from that bottom layer may travel through the silicon dioxide and silicon of the chip(s) or layer(s) above it.

Figure 43:
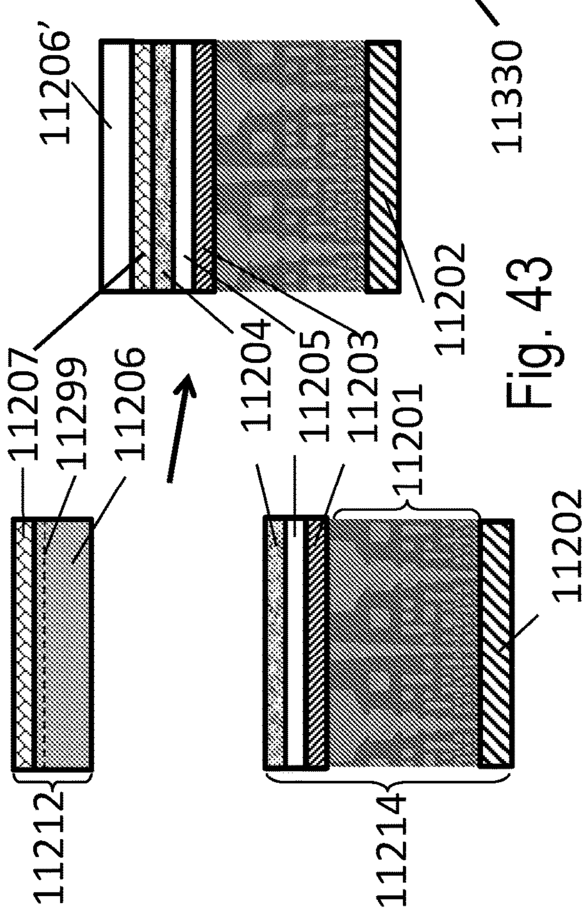
FIG. 43 is an exemplary drawing illustration of a heat spreader in a 3D IC.

As illustrated in FIG. 43, a heat spreader layer 11205 may be deposited on top of a thin silicon dioxide layer 11203 which may be deposited on the top surface of the interconnect metallization layers 11201 of substrate 11202. Heat spreader layer 11205 may include Plasma Enhanced Chemical Vapor Deposited Diamond Like Carbon (PECVD DLC), which may have a thermal conductivity of about 1000 W/m-K, or another thermally conductive material, such as Chemical Vapor Deposited (CVD) graphene (about 5000 W/m-K) or copper (about 400 W/m-K). Heat spreader layer 11205 may be of thickness about 20 nm up to about 1 micron. The illustrated thickness range may be about 50 nm to 100 nm and the illustrated electrical conductivity of the heat spreader layer 11205 may be an insulator to enable minimum design rule diameters of the future through layer vias. If the heat spreader is electrically conducting, the TLV openings may need to be somewhat enlarged to allow for the deposition of a non-conducting coating layer on the TLV walls before the conducting core of the TLV is deposited. Alternatively, if the heat spreader layer 11205 is electrically conducting, it may be masked and etched to provide the landing pads for the through layer vias and a large grid around them for heat transfer, which could also be used as the ground plane or as power and ground straps for the circuits above and below it. Oxide layer 11204 may be deposited (and may be planarized to fill any gaps in the heat transfer layer) to prepare for wafer to wafer oxide bonding. Acceptor substrate 11214 may include substrate 11202, interconnect metallization layers 11201, thin silicon dioxide layer 11203, heat spreader layer 11205, and oxide layer 11204. The donor substrate 11206 or wafer may be processed with wafer sized layers of doping as previously described, in preparation for forming transistors and circuitry (such as, for example, junction-less, RCAT, V-groove, and bipolar) after the layer transfer. A screen oxide layer 11207 may be grown or deposited prior to the implant or implants to protect the silicon from implant contamination, if implantation is utilized, and to provide an oxide surface for later wafer to wafer bonding. A layer transfer demarcation plane 11299 (shown as a dashed line) may be formed in donor substrate 11206 by hydrogen implantation, 'ion-cut' method, or other methods as previously described. Donor wafer 11212 may include donor substrate 11206, layer transfer demarcation plane 11299, screen oxide layer 11207, and any other layers (not shown) in preparation for forming transistors as discussed previously. Both the donor wafer 11212 and acceptor substrate 11214 may be prepared for wafer bonding as previously described and then bonded at the surfaces of oxide layer 11204 and oxide layer 11207, at a low temperature (less than about 400° C.). The portion of donor substrate 11206 that is above the layer transfer demarcation plane 11299 may be removed by cleaving and polishing, or other processes as previously described, such as ion-cut or other methods, thus forming the remaining transferred layers 11206'. Alternatively, donor wafer 11212 may be constructed and then layer transferred, using methods described previously such as, for example, ion-cut with replacement gates (not shown), to the acceptor substrate 11214. Now transistors or portions of transistors may be formed and aligned to the acceptor wafer alignment marks (not shown) and through layer vias formed as previously described. Thus, a 3D IC with an integrated heat spreader may be constructed.

Figure 44A:
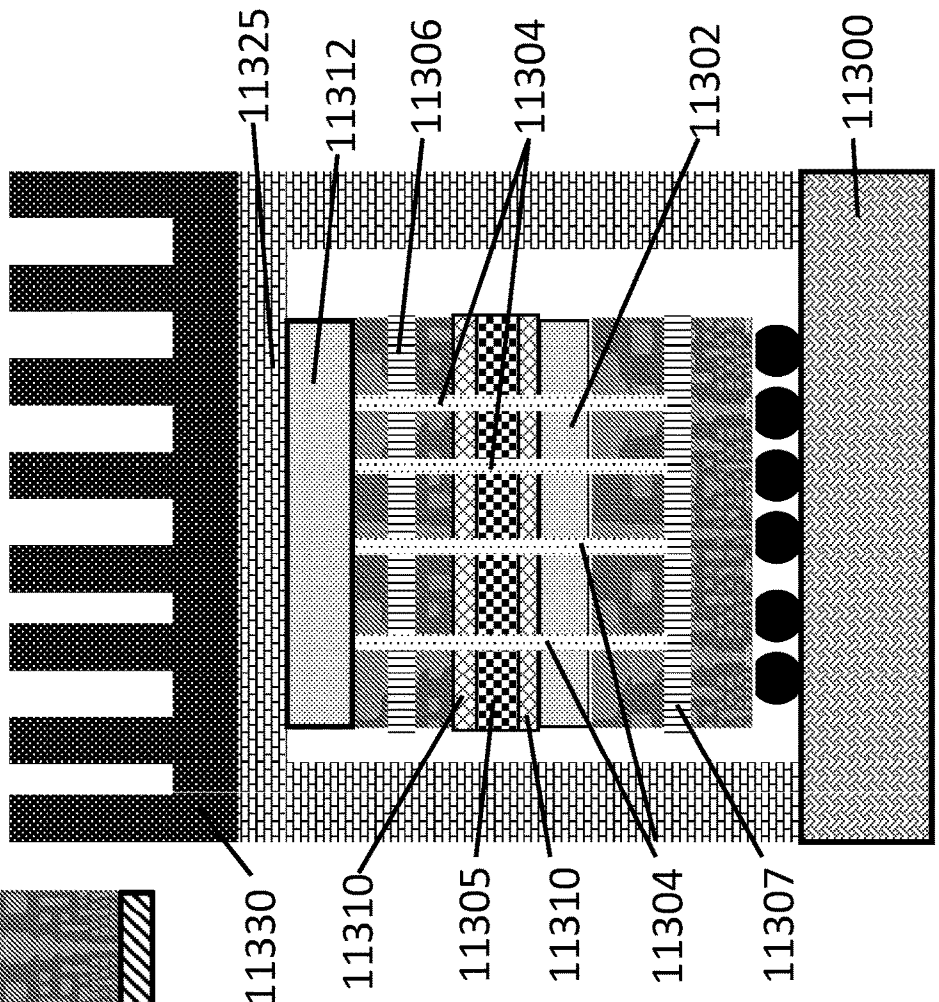
FIG. 44A-FIG. 44B are exemplary drawing illustrations of an integrated heat removal configuration for 3D ICs.

As illustrated in FIG. 44A, a set of power and ground grids, such as bottom transistor layer power and ground grid 11307 and top transistor layer power and ground grid 11306, may be connected by through layer power and ground vias 11304 and thermally coupled to the electrically non-conducting heat spreader layer 11305. If the heat spreader is an electrical conductor, then it could either, for example, only be used as a ground plane, or a pattern should be created with power and ground strips in between the landing pads for the TLVs. The density of the power and ground grids and the through layer vias to the power and ground grids may be designed to substantially improve a certain overall thermal resistance for substantially all the circuits in the 3D IC stack. Bonding oxides 11310, printed wiring board 11300, package heat spreader 11325, bottom transistor layer 11302, top transistor layer 11312, and heat sink 11330 are shown. Thus, a 3D IC with an integrated heat sink, heat spreaders, and through layer vias to the power and ground grid may be constructed.

Figure 44B:
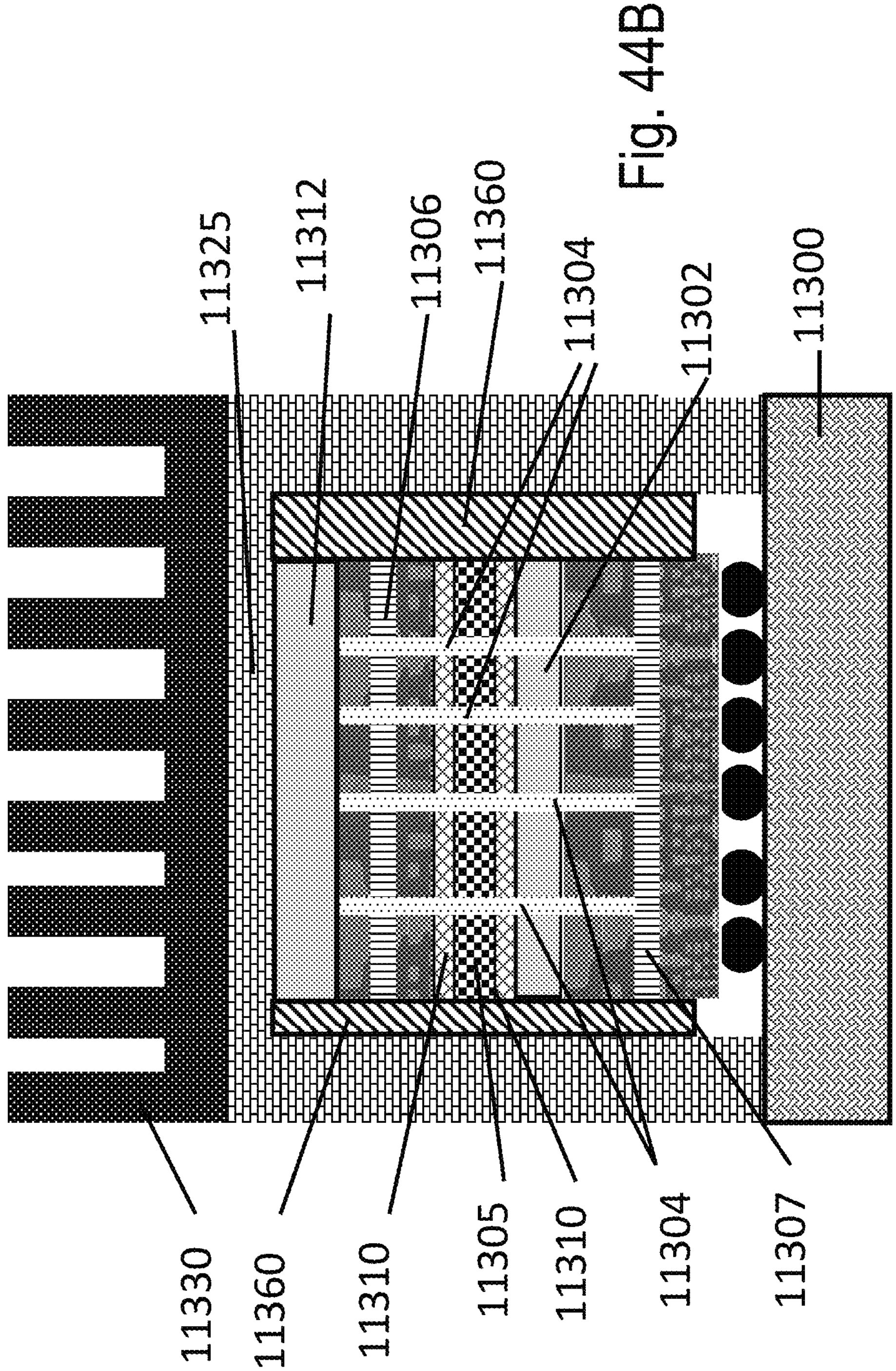

As illustrated in FIG. 44B, thermally conducting material, such as PECVD DLC, may be formed on the sidewalls of the 3D IC structure of FIG. 44A to form sidewall thermal conductors 11360 for sideways heat removal. Bottom transistor layer power and ground grid 11307, top transistor layer power and ground grid 11306, through layer power and ground vias 11304, heat spreader layer 11305, bonding oxides 11310, printed wiring board 11300, package heat spreader 11325, bottom transistor layer 11302, top transistor layer 11312, and heat sink 11330 may be shown.

Figure 54A:
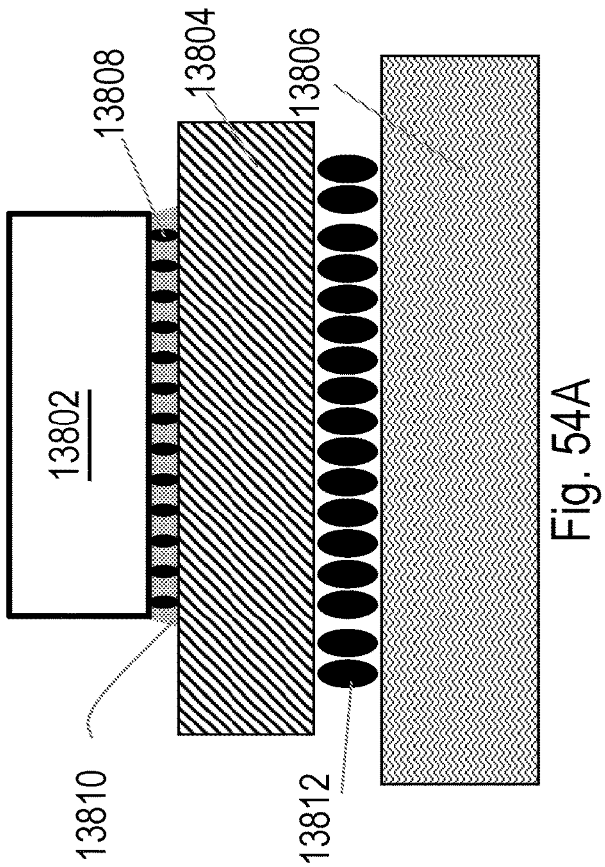
FIG. 54A-FIG. 54B are exemplary drawing illustrations of prior-art packaging schemes.

FIG. 54A illustrates a packaging scheme used for several high-performance microchips. A silicon chip 13802 may be attached to an organic substrate 13804 using solder bumps 13808. The organic substrate 13804, in turn, may be connected to an FR4 printed wiring board (also called board) 13806 using solder bumps 13812. The co-efficient of thermal expansion (CTE) of silicon may be about 3.2 ppm/K, the CTE of organic substrates is typically −17 ppm/K and the CTE of the FR4 printed wiring board material is typically −17 ppm/K. Due to this large mismatch between CTE of the silicon chip 13802 and the organic substrate 13804, the solder bumps 13808 may be subjected to stresses, which can cause defects and cracking in solder bumps 13808. To avoid this potential cause of defects and cracking, underfill material 13810 may be dispensed between solder bumps. While underfill material 13810 can prevent defects and cracking, it can cause other challenges. Firstly, when solder bump sizes are reduced or when high density of solder bumps is required, dispensing underfill material may become difficult or even impossible, since underfill cannot flow in small spaces. Secondly, underfill may be hard to remove once dispensed. As a result, if a chip on a substrate is found to have defects, removing the chip and replacing with another chip may be difficult. Hence, production of multi-chip substrates may be difficult. Thirdly, underfill can cause the stress, due to the mismatch of CTE between the silicon chip 13802 and the organic substrate 13804, to be more efficiently communicated to the low k dielectric layers may present between on-chip interconnects.

Figure 54B:
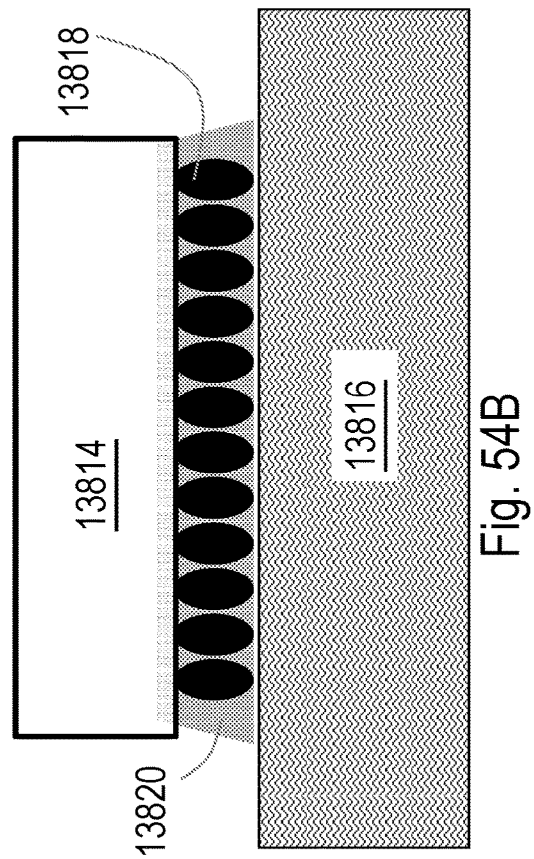

FIG. 54B illustrates a packaging scheme used for many low-power microchips. A silicon chip 13814 may be directly connected to an FR4 substrate 13816 using solder bumps 13818. Due to the large difference in CTE between the silicon chip 13814 and the FR4 substrate 13816, underfill 13820 may be dispensed many times between solder bumps. As mentioned previously, underfill may bring with it challenges related to difficulty of removal and to the stress communicated to the chip low k dielectric layers.

Figures 55A, 55B, 55C, 55D, 55E, 55F:
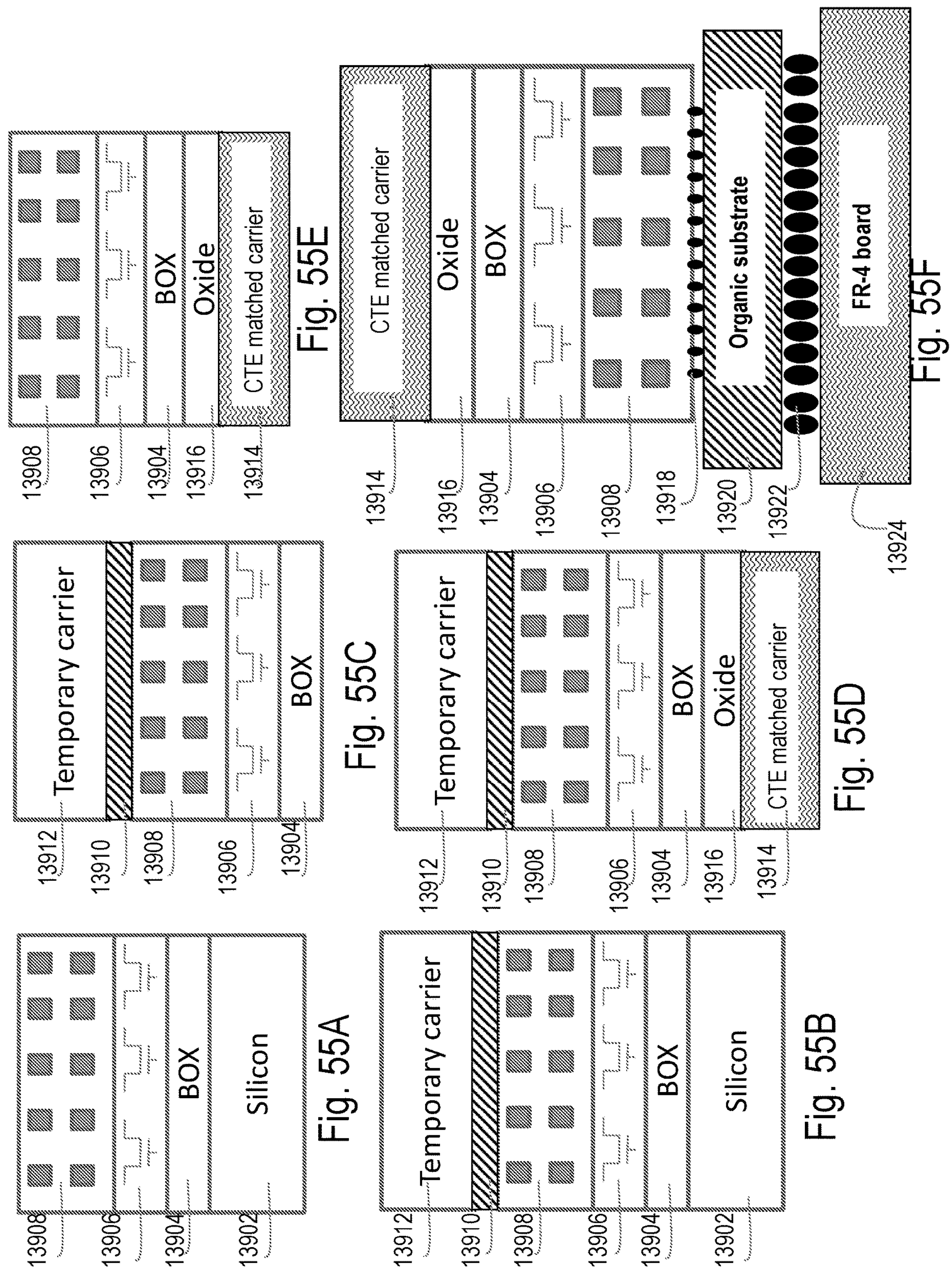
FIG. 55A-FIG. 55F are exemplary drawing illustrations of a process flow to construct packages.

In both of the packaging types described in FIG. 55A and FIG. 55B and also many other packaging methods available in the literature, the mismatch of co-efficient of thermal expansion (CTE) between a silicon chip and a substrate, or between a silicon chip and a printed wiring board, may be a serious issue in the packaging industry. A technique to solve this problem without the use of underfill may be advantageous as an illustration.

FIG. 55A-F describes an embodiment of this present invention, where use of underfill may be avoided in the packaging process of a chip constructed on a silicon-on-insulator (SOI) wafer. Although this embodiment of the present invention is described with respect to one type of packaging scheme, it will be clear to one skilled in the art that the invention may be applied to other types of packaging. The process flow for the SOI chip could include the following steps that occur in sequence from Step (A) to Step (F). When the same reference numbers are used in different drawing figures (among FIG. 55A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 55A. An SOI wafer with transistors constructed on silicon layer 13906 may have a buried oxide layer 13904 atop silicon layer/substrate 13902. Interconnect layers 13908, which may include metals such as aluminum or copper and insulators such as silicon oxide or low k dielectrics, may be constructed as well.

Step (B) is illustrated in FIG. 55B. A temporary carrier wafer 13912 can be attached to the structure shown in FIG. 55A using a temporary bonding adhesive 13910. The temporary carrier wafer 13912 may be constructed with a material, such as, for example, glass or silicon. The temporary bonding adhesive 13910 may include, for example, a polyimide.

Step (C) is illustrated in FIG. 55C. The structure shown in FIG. 55B may be subjected to a selective etch process, such as, for example, a Potassium Hydroxide etch, (potentially combined with a back-grinding process) where silicon layer/substrate 13902 may be removed using the buried oxide layer 13904 as an etch stop. Once the buried oxide layer 13904 may be reached during the etch step, the etch process may be stopped. The etch chemistry may be selected such that it etches silicon but does not etch the buried oxide layer 13904 appreciably. The buried oxide layer 13904 may be polished with CP to ensure a planar and smooth surface.

Step (D) is illustrated in FIG. 55D. The structure shown in FIG. 55C may be bonded to an oxide-coated carrier wafer having a co-efficient of thermal expansion (CTE) similar to that of the organic substrate used for packaging. This oxide-coated carrier wafer as described may be called a CTE matched carrier wafer henceforth in this document. The bonding step may be conducted using oxide-to-oxide bonding of buried oxide layer 13904 to the oxide coating 13916 of the CTE matched carrier wafer 13914. The CTE matched carrier wafer 13914 may include materials, such as, for example, copper, aluminum, organic materials, copper alloys and other materials.

Step (E) is illustrated in FIG. 55E. The temporary carrier wafer 13912 may be detached from the structure at the surface of the interconnect layers 13908 by removing the temporary bonding adhesive 13910. This detachment may be done, for example, by shining laser light through the glass temporary carrier wafer 13912 to ablate or heat the temporary bonding adhesive 13910.

Step (F) is illustrated in FIG. 55F. Solder bumps 13918 may be constructed for the structure shown in FIG. 55E. After dicing, this structure may be attached to organic substrate 13920. This organic substrate 13920 may then be attached to a printed wiring board 13924, such as, for example, an FR4 substrate, using solder bumps 13922.

The conditions for choosing the CTE matched carrier wafer 13914 for this embodiment of the present invention include the following. Firstly, the CTE matched carrier wafer 13914 can have a CTE close to that of the organic substrate 13920. For example, the CTE of the CTE matched carrier wafer 13914 should be within about 10 ppm/K of the CTE of the organic substrate 13920. Secondly, the volume of the CTE matched carrier wafer 13914 can be much higher than the silicon layer 13906. For example, the volume of the CTE matched carrier wafer 13914 may be greater than about 5 times the volume of the silicon layer 13906. When this volume mismatch happens, the CTE of the combination of the silicon layer 13906 and the CTE matched carrier wafer 13914 may be close to that of the CTE matched carrier wafer 13914. If these two conditions may be met, the issues of co-efficient of thermal expansion mismatch described previously may be ameliorated, and a reliable packaging process may be obtained without underfill being used.

The organic substrate 13920 typically may have a CTE of about 17 ppm/K and the printed wiring board 13924 typically may be constructed of FR4 which has a CTE of about 18 ppm/K. If the CTE matched carrier wafer is constructed of an organic material having a CTE of about 17 ppm/K, it can be observed that issues of co-efficient of thermal expansion mismatch described previously are ameliorated, and a reliable packaging process may be obtained without underfill being used. If the CTE matched carrier wafer is constructed of a copper alloy having a CTE of about 17 ppm/K, it can be observed that issues of co-efficient of thermal expansion mismatch described previously may be ameliorated, and a reliable packaging process may be obtained without underfill being used. If the CTE matched carrier wafer may be constructed of an aluminum alloy material having a CTE of about 24 ppm/K, it can be observed that issues of co-efficient of thermal expansion mismatch described previously are ameliorated, and a reliable packaging process may be obtained without underfill being used. Silicon layer 13906, buried oxide layer 13904, interconnect layers 13908 may be regions atop silicon layer/substrate 13902.

FIG. 56A-F describes an embodiment of this present invention, where use of underfill may be avoided in the packaging process of a chip constructed on a bulk-silicon wafer. Although this embodiment of the present invention is described with respect to one type of packaging scheme, it will be clear to one skilled in the art that the invention may be applied to other types of packaging. The process flow for the silicon chip could include the following steps that occur in sequence from Step (A) to Step (F). When the same reference numbers may be used in different drawing figures (among FIG. 56A-F), they may be used to indicate analogous, similar or identical structures to enhance the understanding of the present invention by clarifying the relationships between the structures and embodiments presented in the various diagrams—particularly in relating analogous, similar or identical functionality to different physical structures.

Figure 56A:
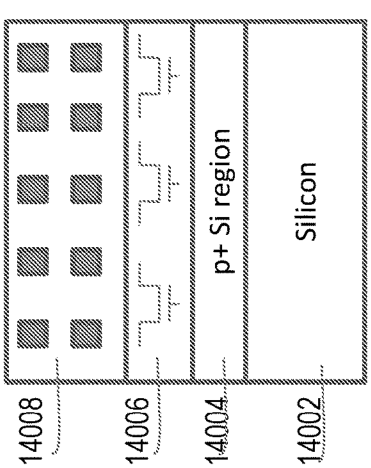
FIG. 56A-FIG. 56F are exemplary drawing illustrations of a process flow to construct packages.

Step (A) is illustrated in FIG. 56A. A bulk-silicon wafer with transistors constructed on silicon layer 14006 may have a buried p+ silicon layer 14004 atop silicon layer/substrate 14002. Interconnect layers 14008, which may include metals such as aluminum or copper and insulators such as silicon oxide or low k dielectrics, may be constructed. The buried p+ silicon layer 14004 may be constructed with a process, such as, for example, an ion-implantation and thermal anneal, or an epitaxial doped silicon deposition.

Figure 56B:
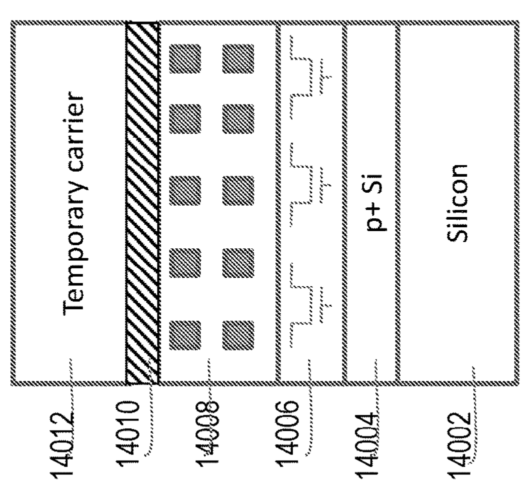

Step (B) is illustrated in FIG. 56B. A temporary carrier wafer 14012 may be attached to the structure shown in FIG. 56A using a temporary bonding adhesive 14010. The temporary carrier wafer 14012 may be constructed with a material, such as, for example, glass or silicon. The temporary bonding adhesive 14010 may include, for example, a polyimide.

Figure 56C:
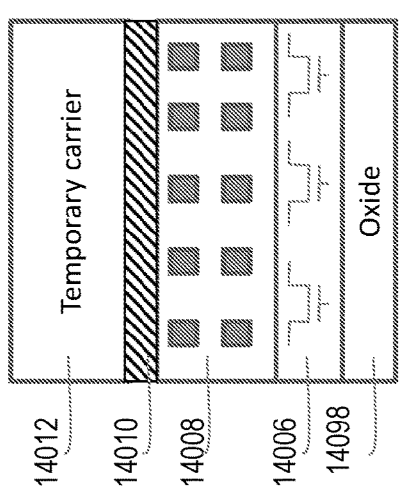

Step (C) is illustrated in FIG. 56C. The structure shown in FIG. 56B may be subjected to a selective etch process, such as, for example, ethylenediamine pyrocatechol (EDP) (potentially combined with a back-grinding process) where silicon layer/substrate 14002 may be removed using the buried p+ silicon layer 14004 as an etch stop. Once the buried p+ silicon layer 14004 may be reached during the etch step, the etch process may be stopped. The etch chemistry may be selected such that the etch process stops at the p+ silicon buried layer. The buried p+ silicon layer 14004 may then be polished away with CMP and planarized. Following this, an oxide layer 14098 may be deposited.

Figure 56D:
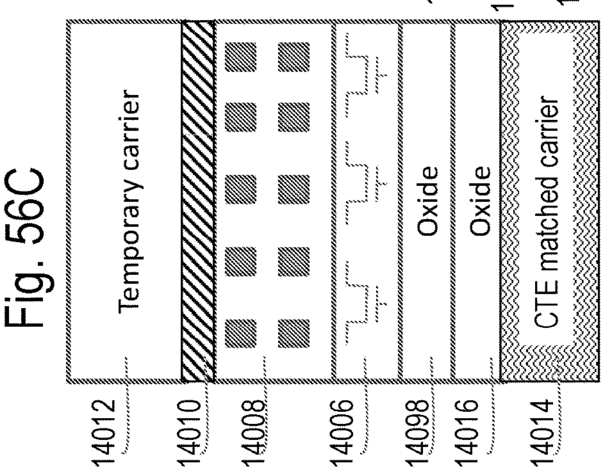

Step (D) is illustrated in FIG. 56D. The structure shown in FIG. 56C may be bonded to an oxide-coated carrier wafer having a co-efficient of thermal expansion (CTE) similar to that of the organic substrate used for packaging. The oxide-coated carrier wafer as described may be called a CTE matched carrier wafer henceforth in this document. The bonding step may be conducted using oxide-to-oxide bonding of oxide layer 14098 to the oxide coating 14016 of the CTE matched carrier wafer 14014. The CTE matched carrier wafer 14014 may include materials, such as, for example, copper, aluminum, organic materials, copper alloys and other materials.

Figure 56E:
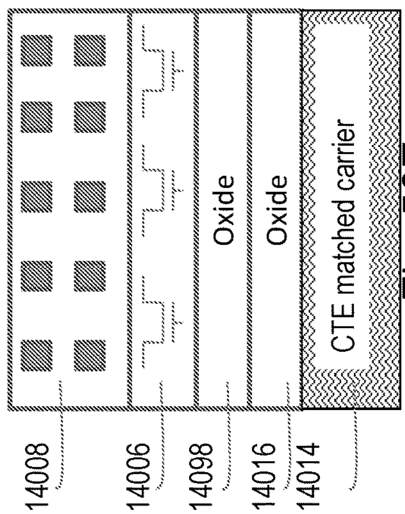

Step (E) is illustrated in FIG. 56E. The temporary carrier wafer 14012 may be detached from the structure at the surface of the interconnect layers 14008 by removing the temporary bonding adhesive 14010. This detachment may be done, for example, by shining laser light through the glass temporary carrier wafer 14012 to ablate or heat the temporary bonding adhesive 14010.

Figure 56F:
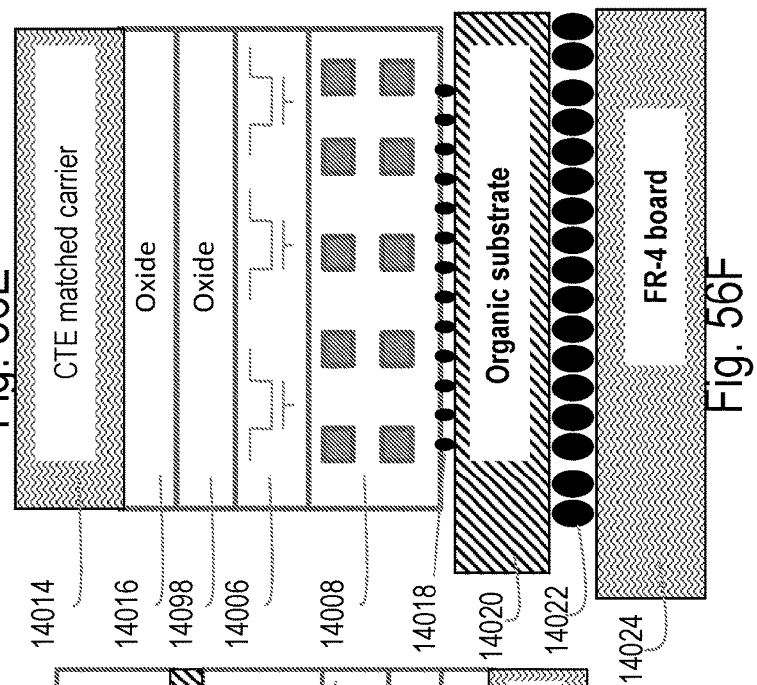

Step (F) is illustrated using FIG. 56F. Solder bumps 14018 may be constructed for the structure shown in FIG. 56E. After dicing, this structure may be attached to organic substrate 14020. This organic substrate may then be attached to a printed wiring board 14024, such as, for example, an FR4 substrate, using solder bumps 14022.

There may be two illustrative conditions while choosing the CTE matched carrier wafer 14014 for this embodiment of the invention. Firstly, the CTE matched carrier wafer 14014 may have a CTE close to that of the organic substrate 14020. Illustratively, the CTE of the CTE matched carrier wafer 14014 may be within about 10 ppm/K of the CTE of the organic substrate 14020. Secondly, the volume of the CTE matched carrier wafer 14014 may be much higher than the silicon layer 14006. Illustratively, the volume of the CTE matched carrier wafer 14014 may be, for example, greater than about 5 times the volume of the silicon layer 14006. When this happens, the CTE of the combination of the silicon layer 14006 and the CTE matched carrier wafer 14014 may be close to that of the CTE matched carrier wafer 14014. If these two conditions are met, the issues of co-efficient of thermal expansion mismatch described previously may be ameliorated, and a reliable packaging process may be obtained without underfill being used. Silicon layer 14006, buried p+ silicon layer 14004, and interconnect layers 14008 may also be regions that are atop silicon layer/substrate 14002.

The organic substrate 14020 typically has a CTE of about 17 ppm/K and the printed wiring board 14024 typically may be constructed of FR4 which has a CTE of about 18 ppm/K. If the CTE matched carrier wafer may be constructed of an organic material having a CTE of 17 ppm/K, it can be observed that issues of co-efficient of thermal expansion mismatch described previously are ameliorated, and a reliable packaging process may be obtained without underfill being used. If the CTE matched carrier wafer may be constructed of a copper alloy having a CTE of about 17 ppm/K, it can be observed that issues of co-efficient of thermal expansion mismatch described previously are ameliorated, and a reliable packaging process may be obtained without underfill being used. If the CTE matched carrier wafer may be constructed of an aluminum alloy material having a CTE of about 24 ppm/K, it can be observed that issues of co-efficient of thermal expansion mismatch described previously may be ameliorated, and a reliable packaging process may be obtained without underfill being used.

While FIGS. 55A-F and FIGS. 56A-F describe methods of obtaining thinned wafers using buried oxide and buried p+ silicon etch stop layers respectively, it will be clear to one skilled in the art that other methods of obtaining thinned wafers exist. Hydrogen may be implanted through the backside of a bulk-silicon wafer (attached to a temporary carrier wafer) at a certain depth and the wafer may be cleaved using a mechanical force. Alternatively, a thermal or optical anneal may be used for the cleave process. An ion-cut process through the back side of a bulk-silicon wafer could therefore be used to thin a wafer accurately, following which a CTE matched carrier wafer may be bonded to the original wafer.

It will be clear to one skilled in the art that other methods to thin a wafer and attach a CTE matched carrier wafer exist. Other methods to thin a wafer include, but not limited to, CMP, plasma etch, wet chemical etch, or a combination of these processes. These processes may be supplemented with various metrology schemes to monitor wafer thickness during thinning. Carefully timed thinning processes may also be used.

Figure 57:
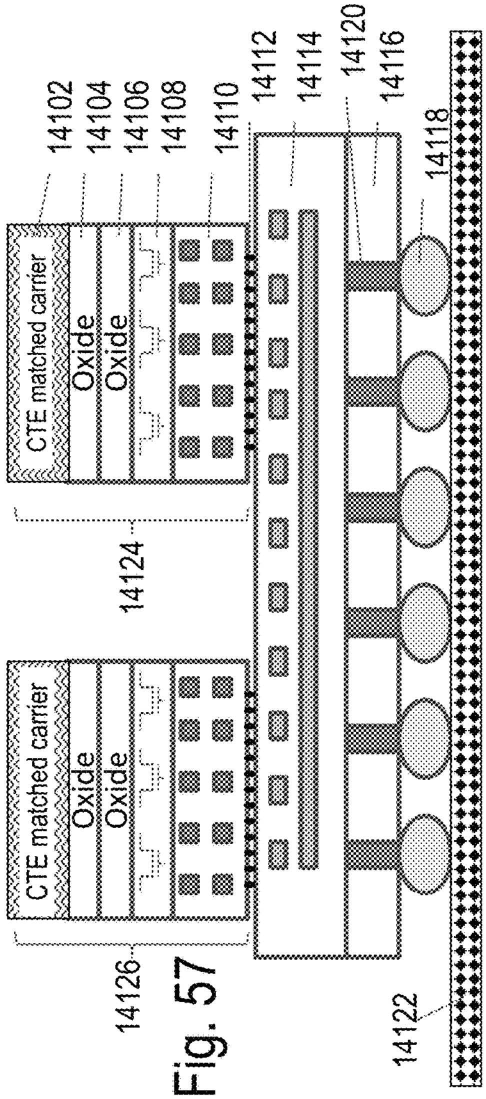
FIG. 57 is an exemplary drawing illustration of a technique to provide a high density of connections between different chips on the same packaging substrate.

FIG. 57 describes an embodiment of this present invention, where multiple dice, such as, for example, dice 14124 and 14126 may be placed and attached atop packaging substrate 14116. Packaging substrate 14116 may include packaging substrate high density wiring layers 14114, packaging substrate vias 14120, packaging substrate-to-printed-wiring-board connections 14118, and printed wiring board 14122. Die-to-substrate connections 14112 may be utilized to electrically couple dice 14124 and 14126 to the packaging substrate high density wiring levels 14114 of packaging substrate 14116. The dice 14124 and 14126 may be constructed using techniques described with FIGS. 55A-F and FIGS. 56A-F but may be attached to packaging substrate 14116 rather than organic substrate 13920 or 14020. Due to the techniques of construction described in FIGS. 55A-F and FIGS. 56A-F being used, a high density of connections may be obtained from each die, such as 14124 and 14126, to the packaging substrate 14116. By using a packaging substrate 14116 with packaging substrate high density wiring levels 14114, a large density of connections between multiple dice 14124 and 14126 may be realized. This may open up several opportunities for system design. In one embodiment of this invention, unique circuit blocks may be placed on different dice assembled on the packaging substrate 14116. In another embodiment, contents of a large die may be split among many smaller dice to reduce yield issues. In yet another embodiment, analog and digital blocks could be placed on separate dice. It will be obvious to one skilled in the art that several variations of these concepts are possible. The illustrative enabler for all these ideas may be the fact that the CTEs of the dice are similar to the CTE of the packaging substrate, so that a high density of connections from the die to the packaging substrate may be obtained, and provide for a high density of connection between dice. 14102 denotes a CTE matched carrier wafer, 14104 and 14106 are oxide layers, 14108 represents transistor regions, 14110 represents a multilevel wiring stack, 14112 represents die-to-substrate connections, 14116 represents the packaging substrate, 14114 represents the packaging substrate high density wiring levels, 14120 represents vias on the packaging substrate, 14118 denotes packaging substrate-to-printed-wiring-board connections and 14122 denotes a printed wiring board.

As well, the independent formation of each transistor layer may enable the use of materials other than silicon to construct transistors. For example, a thin III-V compound quantum well channel such as InGaAs and InSb may be utilized on one or more of the 3D layers described above by direct layer transfer or deposition and the use of buffer compounds such as GaAs and InAlAs to buffer the silicon and III-V lattice mismatches. This feature may enable high mobility transistors that can be optimized independently for p and n~channel use, solving the integration difficulties of incorporating n and p III-V transistors on the same substrate, and also the difficulty of integrating the III-V transistors with conventional silicon transistors on the same substrate. For example, the first layer silicon transistors and metallization generally cannot be exposed to temperatures higher than about 400° C. The III-V compounds, buffer layers, and dopings generally may need processing temperatures above that 400° C. threshold. By use of the pre deposited, doped, and annealed layer donor wafer formation and subsequent donor to acceptor wafer transfer techniques described above and illustrated, for example, in FIG. 14, FIG. 8, and FIG. 11, III-V transistors and circuits may be constructed on top of silicon transistors and circuits without damaging said underlying silicon transistors and circuits. As well, any stress mismatches between the dissimilar materials to be integrated, such as silicon and III-V compounds, may be mitigated by the oxide layers, or specialized buffer layers, that may be vertically in-between the dissimilar material layers. Additionally, this may now enable the integration of optoelectronic elements, communication, and data path processing with conventional silicon logic and memory transistors and silicon circuits. Another example of a material other than silicon that the independent formation of each transistor layer may enable is Germanium.

Figure 12:
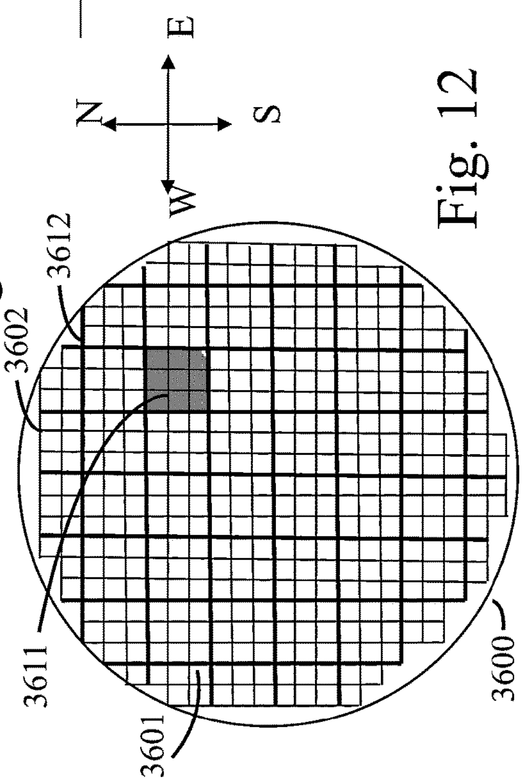
FIG. 12 is an exemplary drawing illustration of a tile array wafer.

It also should be noted that the 3D programmable system, where the logic fabric may be sized by dicing a wafer of tiled array as illustrated in FIG. 12, could utilize the 'monolithic' 3D techniques related to FIG. 14 in respect to the 'Foundation,' or to FIGS. 22 and 29 in respect to the Attic, to add IO or memories as presented in FIG. 11. So while in many cases constructing a 3D programmable system using TSV could be possible there might be cases where it will be better to use the 'Foundation' or 'Attic".

When a substrate wafer, carrier wafer, or donor wafer may be thinned by a ion-cut & cleaving method in this document, there may be other methods that may be employed to thin the wafer. For example, a boron implant and anneal may be utilized to create a layer in the silicon substrate to be thinned that will provide a wet chemical etch stop plane. A dry etch, such as a halogen gas cluster beam, may be employed to thin a silicon substrate and then smooth the silicon surface with an oxygen gas cluster beam. Additionally, these thinning techniques may be utilized independently or in combination to achieve the proper thickness and defect free surface as may be needed by the process flow.

Figure 96A:
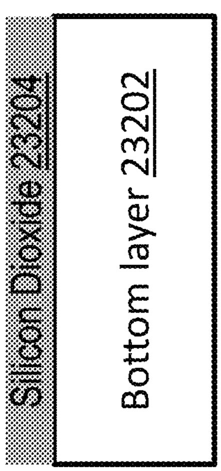

FIG. 96A-F shows a procedure using etch-stop layer controlled etch-back for layer transfer. The process flow in FIG. 96A-F may include several steps in the following sequence:

Step (A): A silicon dioxide layer 23204 may be deposited above the generic bottom layer 23202. FIG. 96A illustrates the structure after Step (A).

Figure 96B:
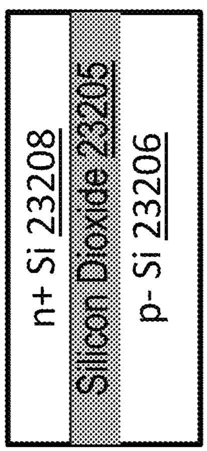

Step (B): SOI wafer 23206 may be implanted with n+ near its surface to form an n+ Si layer 23208. The buried oxide (BOX) of the SOI wafer may be silicon dioxide layer 23205. FIG. 96B illustrates the structure after Step (B).

Figure 96C:
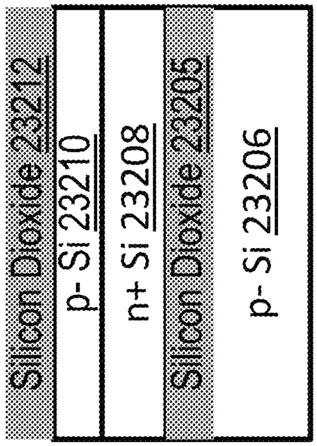

Step (C): A p− Si layer 23210 may be epitaxially grown atop the n+ Si layer 23208. A silicon dioxide layer 23212 may be grown/deposited atop the p− Si layer 23210. An anneal (such as a rapid thermal anneal RTA or spike anneal or laser anneal) may be conducted to activate dopants. FIG. 96C illustrates the structure after Step (C).

Alternatively, the n+ Si layer 23208 and p− Si layer 23210 can be formed by a buried layer implant of n+ Si in a p− SOI wafer.

Figure 96D:
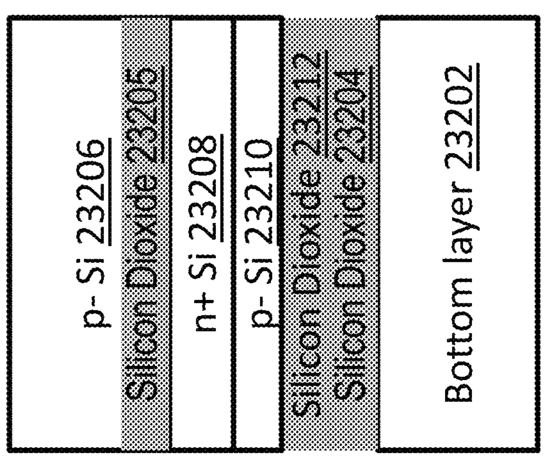

Step (D): The top layer wafer shown after Step (C) may be flipped and bonded atop the bottom layer wafer using oxide-to-oxide bonding. FIG. 96D illustrates the structure after Step (D).

Figure 96E:
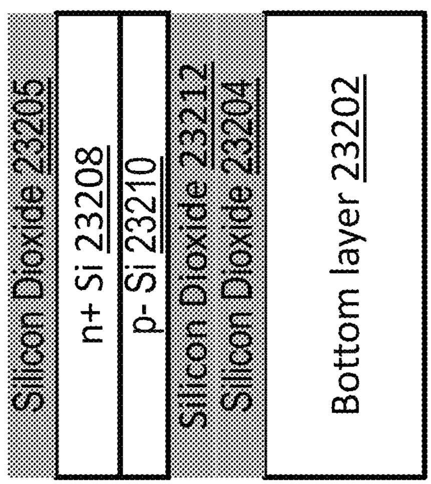

Step (E): An etch process that etches Si but does not etch silicon dioxide may be utilized to etch through the p− Si layer of SOI wafer 23206. The buried oxide (BOX) of silicon dioxide layer 23205 therefore acts as an etch stop. FIG. 96E illustrates the structure after Step (E).

Figure 96F:
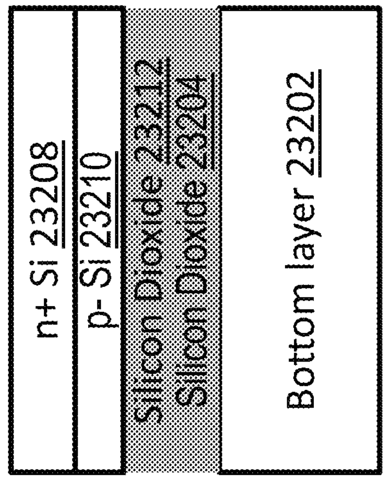

Step (F): Once the etch stop of silicon dioxide layer 23205 is substantially reached, an etch or CMP process may be utilized to etch the silicon dioxide layer 23205 till the n+ silicon layer 23208 may be reached. The etch process for Step (F) may be preferentially chosen so that it etches silicon dioxide but does not attack Silicon. FIG. 96F illustrates the structure after Step (F).

At the end of the process shown in FIG. 96A-F, the desired regions may be layer transferred atop the bottom layer 23202. While FIG. 96A-F shows an etch-stop layer controlled etch-back using a silicon dioxide etch stop layer, other etch stop layers such as SiGe or p+Si can be utilized in alternative process flows. As well, n+ Si layer 23208 and p− Si layer 23210 may be doped differently or may include other layers in combination with other embodiments herein.

Alternatively, according to an embodiment of this present invention, surface non-planarities may be removed or reduced by treating the cleaved surface of the wafer or substrate in a hydrogen plasma at less than about 400° C. The hydrogen plasma source gases may include, for example, hydrogen, argon, nitrogen, hydrogen chloride, water vapor, methane, and so on. Hydrogen anneals at about 1100° C. are known to reduce surface roughness in silicon. By having a plasma, the temperature requirement can be reduced to less than about 400° C. A tool that might be employed is the TEL SPA tool.

Alternatively, according to another embodiment of this present invention, a thin film, such as, for example, a Silicon oxide or photosensitive resist, may be deposited atop the cleaved surface of the wafer or substrate and etched back. The etchant that may be required for this etch-back process may have approximately equal etch rates for both silicon and the deposited thin film. This etchant could reduce non-planarities on the wafer surface.

Alternatively, Gas Cluster Ion Beam technology may be utilized for smoothing surfaces after cleaving along an implanted plane of hydrogen or other atomic species.

FIG. 58A-K describes an alternative embodiment of this invention, wherein a process flow is described in which a side gated monocrystalline Finfet may be formed with lithography steps shared among many wafers. The distinguishing characteristic of the Finfet is that the conducting channel is wrapped by a thin metal or semiconductor, such as silicon, "fin", which may form the gate of the device. The thickness of the fin (measured in the direction from source to drain) determines the effective channel length of the device. Finfet may be used somewhat generically to describe any fin-based, multigate transistor architecture regardless of number of gates. The process flow for the silicon chip may include the following steps that may occur in sequence from Step (A) to Step (J). When the same reference numbers are used in different drawing figures, they are used to indicate analogous, similar or identical structures to enhance the understanding of the embodiments of the invention by clarifying the relationships between the structures and embodiments presented in the various diagrams—particularly in relating analogous, similar or identical functionality to different physical structures.

Figure 58A:
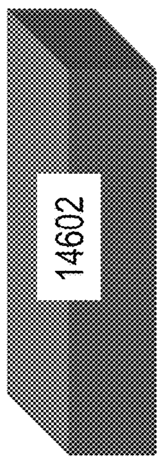
FIG. 58A-FIG. 58K are exemplary drawing illustrations of a process flow for manufacturing FinFET transistors with reduced lithography steps.

Step (A) is illustrated in FIG. 58A. An n− Silicon wafer/substrate 14602 may be taken.

Figure 58B:
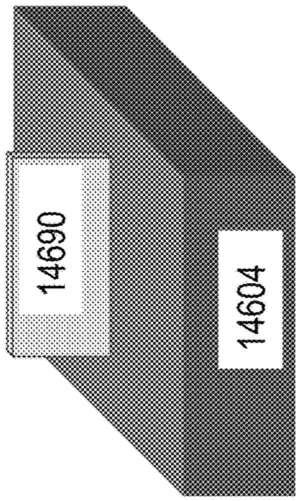

Step (B) is illustrated in FIG. 58B. P type dopant, such as, for example, Boron ions, may be implanted into the n− Silicon wafer/substrate 14604 of FIG. 58B. A thermal anneal, such as, for example, rapid, furnace, spike, flash, or laser may then be done to activate dopants. Following this, a lithography and etch process may be conducted to define n− silicon region 14604 and p− silicon region 14690. Regions with n− silicon, similar in structure and formation to p− silicon region 14690, where p-Finfets may be fabricated, are not shown.

Figure 58E:
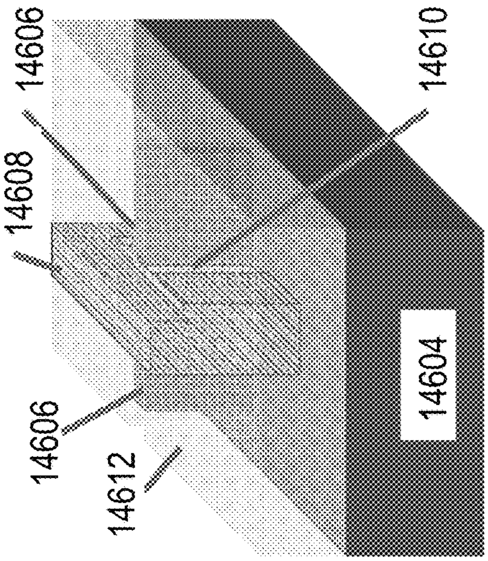
Figure 58D:
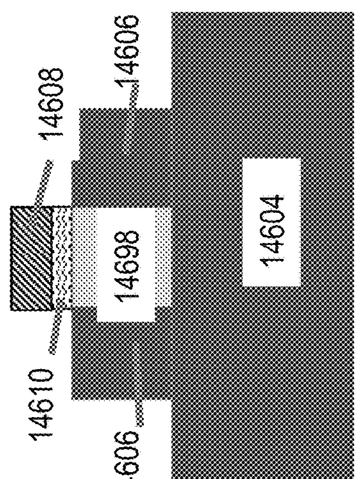
Figure 58C:
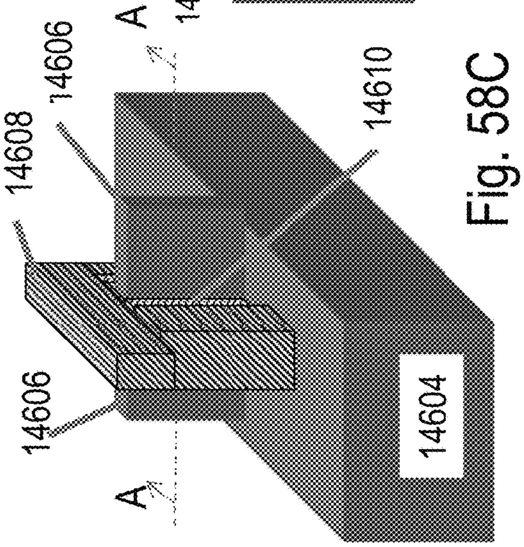

Step (C) is illustrated in FIG. 58C. Gate dielectric regions 14610 and gate electrode regions 14608 may be formed by oxidation or deposition of a gate dielectric, then deposition of a gate electrode, polishing with CMP, and then lithography and etch. The gate electrode regions 14608 may be, for example, doped polysilicon. Alternatively, various hi-k metal gate (HKMG) materials could be utilized for gate dielectric and gate electrode as described previously. N+ dopants, such as, for example, Arsenic, Antimony or Phosphorus, may then be implanted to form source and drain regions of the Finfet. The n+ doped source and drain regions may be indicated as 14606. FIG. 58D shows a cross-section of FIG. 58C along the AA' direction. P− doped region 14698 can be observed, as well as n+ doped source and drain regions 14606, gate dielectric regions 14610, gate electrode regions 14608, and n− silicon region 14604.

Step (D) is illustrated in FIG. 58E. Oxide regions 14612, for example, silicon dioxide, may be formed by deposition and may then be planarized and polished with CMP such that the oxide regions 14612 cover n+ silicon region 14604, n+ doped source and drain regions 14606, gate electrode regions 14608, p− doped region 14698, and gate dielectric regions 14610.

Figures 58F, 58G, 58H, 58I, 58J, 58K:
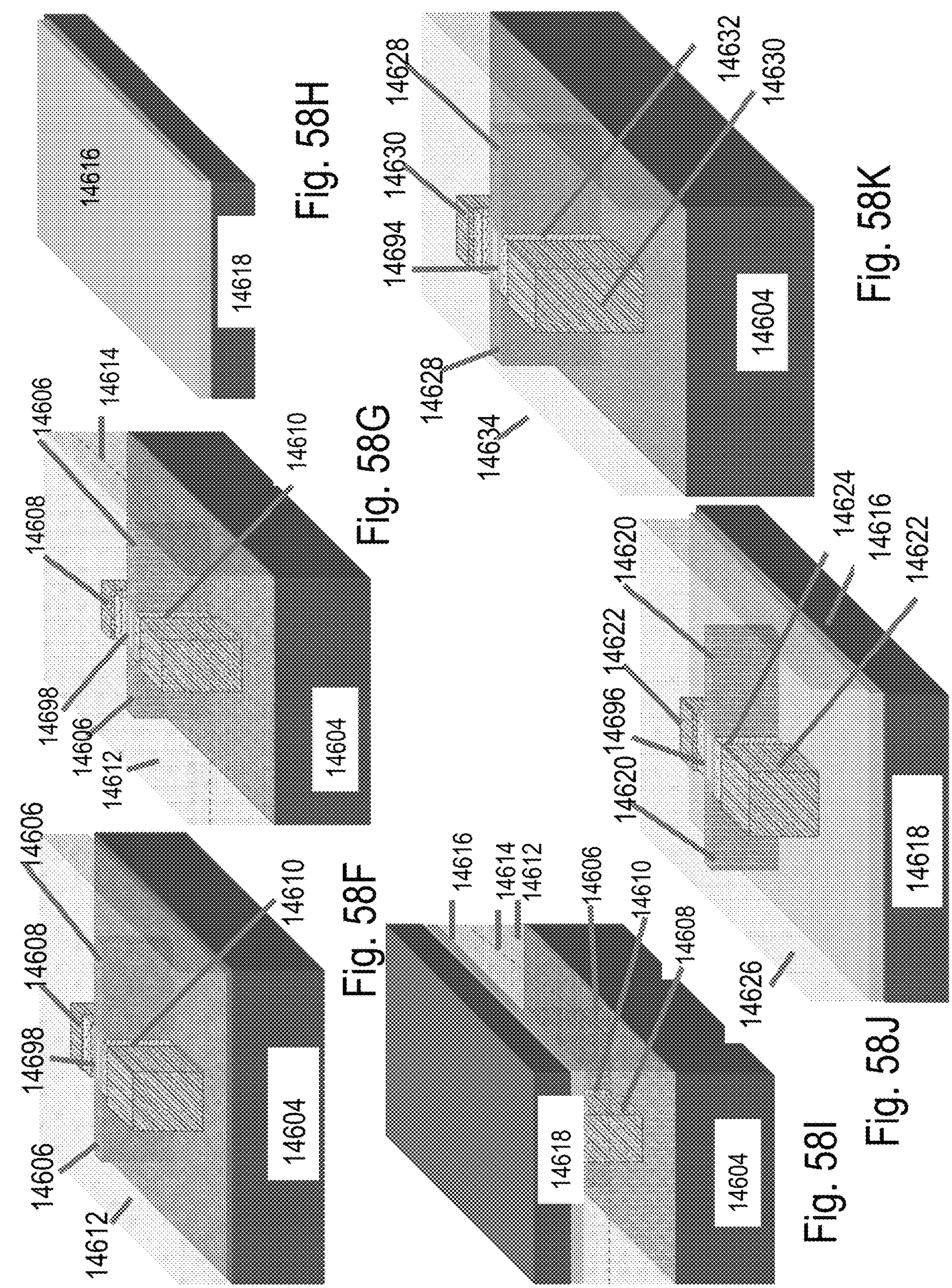

Step (E) is illustrated in FIG. 58F. The structure shown in FIG. 58E may be further polished with CMP such that portions of oxide regions 14612, gate electrode regions 14608, gate dielectric regions 14610, p− doped regions 14698, and n+ doped source and drain regions 14606 are polished. Following this, a silicon dioxide layer may be deposited over the structure.

Step (F) is illustrated in FIG. 58G. Hydrogen H+ may be implanted into the structure at a certain depth creating hydrogen plane 14614 indicated by dotted lines.

Step (G) is illustrated in FIG. 58H. A silicon wafer 14618 may have an oxide layer 14616, for example, silicon dioxide, deposited atop it.

Step (H) is illustrated in FIG. 58I. The structure shown in FIG. 58H may be flipped and bonded atop the structure shown in FIG. 58G using oxide-to-oxide bonding.

Step (I) is illustrated in FIG. 58J and FIG. 58K. The structure shown in FIG. 58J may be cleaved at hydrogen plane 14614 using a sideways mechanical force. Alternatively, a thermal anneal, such as, for example, furnace or spike, could be used for the cleave process. Following the cleave process, CMP processes may be done to planarize surfaces. FIG. 58J shows silicon wafer 14618 having an oxide layer 14616 and patterned features transferred atop it. These patterned features may include gate dielectric regions 14624, gate electrode regions 14622, n+ silicon region 14620, p− silicon region 14696 and silicon dioxide regions 14626. These patterned features may be used for further fabrication, with contacts, interconnect levels and other steps of the fabrication flow being completed. FIG. 58K shows the n+ silicon region 14604 on n− Silicon wafer/substrate (not shown) having patterned transistor layers. These patterned transistor layers may include gate dielectric regions 14632, gate electrode regions 14630, n+ silicon regions 14628, p− silicon region 14694, and silicon dioxide regions 14634. The structure in FIG. 58K may be used for transferring patterned layers to other substrates similar to the one shown in FIG. 58H using processes similar to those described in FIG. 58G-K. For example, a set of patterned features created with lithography steps once (such as the one shown in FIG. 58F) may be layer transferred to many wafers, thereby removing the requirement for separate lithography steps for each wafer. Lithography cost can be reduced significantly using this approach.

Implanting hydrogen through the gate dielectric regions 14610 in FIG. 58G may not degrade the dielectric quality, since the area exposed to implant species may be small (a gate dielectric is typically about 2 nm thick, and the channel length is typically less than about 20 nm, so the exposed area to the implant species is about 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of the invention may involve forming a dummy gate transistor structure, as previously described for the replacement gate process, for the structure shown in FIG. 58J. Post cleave, the gate electrode regions 14622 and the gate dielectric regions 14624 materials may be etched away and then the trench may be filled with a replacement gate dielectric and a replacement gate electrode.

In an alternative embodiment of the invention described in FIG. 58B-K, the substrate silicon wafer 14618 in FIG. 58B-K may be a wafer with one or more pre-fabricated transistor and interconnect layers. Low temperature (less than about 400° C.) bonding and cleave techniques as previously described may be employed. In that scenario, 3D stacked logic chips may be formed with fewer lithography steps. Alignment schemes similar to those described previously may be used.

In general logic devices may include varying quantities of logic elements, varying amounts of memories, and varying amounts of I/O. The continuous array of the prior art may allow defining various die sizes out of the same wafers and accordingly varying amounts of logic, but it may be far more difficult to vary the three-way ratio between logic, I/O, and memory. In addition, there may exist different types of memories such as SRAM, DRAM, Flash, and others, and there may exist different types of I/O such as SerDes. Some applications might need still other functions such as processor, DSP, analog functions, and others.

Some embodiments of the invention may enable a different approach. Instead of trying to put substantially all of these different functions onto one programmable die, which may need a large number of very expensive mask sets, it may use Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly some embodiments of the invention may suggest the use of a continuous array of tiles focusing each one on a single, or very few types of, function. The target system may then be constructed using desired number of tiles of desired type stacked on top of each other and electrically connected with TSVs or monolithic 3D approaches, thus, a 3D Configurable System may result.

Figure 2A:
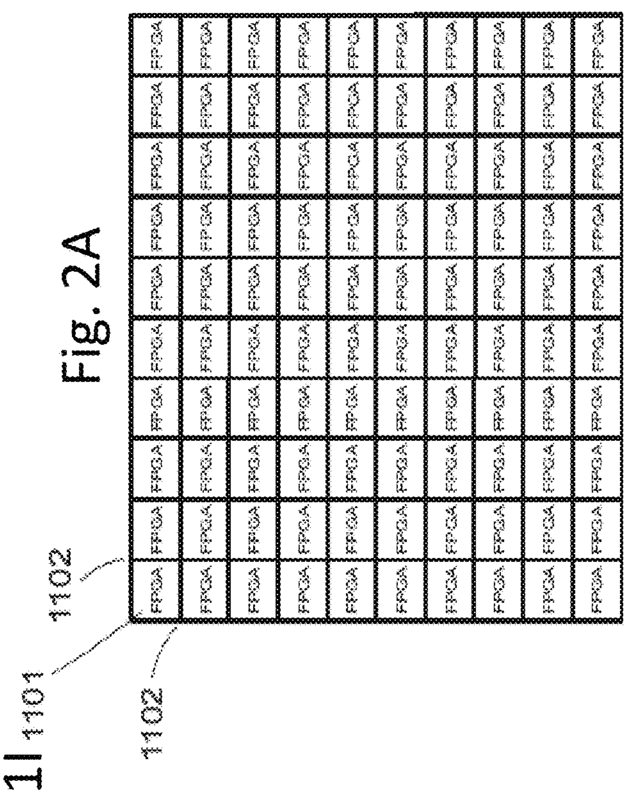

FIG. 2A is a drawing illustration of one reticle site on a wafer comprising tiles of programmable logic 1101 denoted FPGA. Such wafer may be a continuous array of programmable logic. 1102 are potential dicing lines to support various die sizes and the amount of logic to be constructed from one mask set. This die could be used as a base 1202A, 1202B, 1202C or 1202D of the 3D system as in FIG. 3. In one embodiment of this invention these dies may carry mostly logic, and the desired memory and I/O may be provided on other dies, which may be connected by means of Through-Silicon Via. It should be noted that in some cases it may be desired not to have metal lines, even if unused, in the dicing streets 1102. In such case, at least for the logic dies, one may use dedicated masks to allow connection over the unused potential dicing lines to connect the individual tiles according to the desired die size. The actual dicing lines may also be called streets.

It should be noted that in general the lithography projected over surface of the wafer may be done by repeatedly projecting a reticle image over the wafer in a "step-and-repeat" manner. In some cases it might be possible to consider differently the separation between repeating tile 1101 within a reticle image vs. tiles that relate to two projections. For simplicity this description will use the term wafer but in some cases it will apply, for example, only to tiles with one reticle.

The repeating tile 1101 could be of various sizes. For FPGA applications it may be reasonable to assume tile 1101 to have an edge size between about 0.5 mm to about 1 mm which may allow good balance between the end-device size and acceptable relative area loss due to the unused potential dice lines 1102. Potential dice lines may be area regions of the processed wafer where the layers and structures on the wafer may be arranged such that the wafer dicing process may optimally proceed. For example, the potential dice lines may be line segments that surround a desired potential product die wherein the majority of the potential dice line may have no structures and may have a die seal edge structure to protect the desired product die from damages as a result of the dicing process. The dicing process can be accomplished by scribing and breaking, by mechanical sawing (normally with a machine called a dicing saw) or by laser cutting.

There may be many illustrative advantages for a uniform repeating tile structure of FIG. 2A where a programmable device could be constructed by dicing the wafer to the desired size of programmable device. Yet it may be still helpful that the end-device may act as a complete integrated device rather than just as a collection of individual tiles 1101. FIG. 12 illustrates a wafer 3600 carrying an array of tile 3601 with potential dice lines 3602 to be diced along actual dice lines 3612 to construct an end-device 3611 of 3×3 tiles. The end-device 3611 may be bounded by the actual dice lines 3612.

Figure 13:
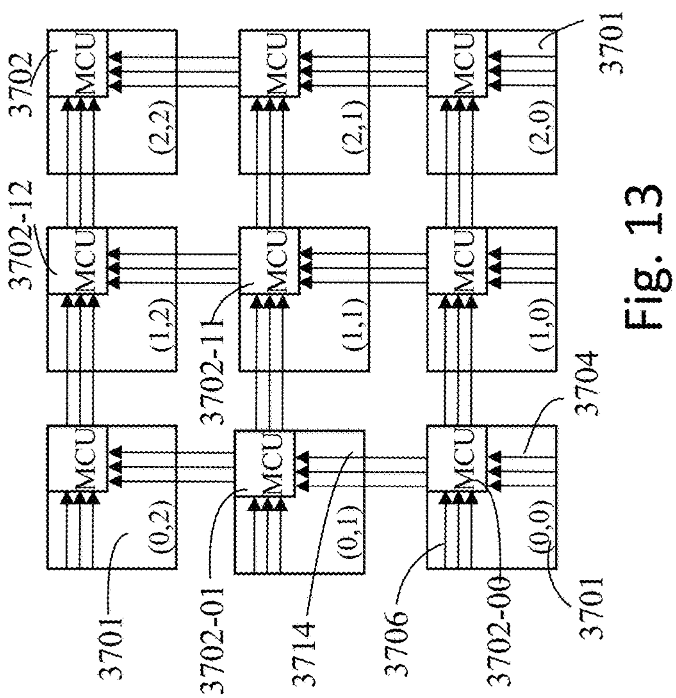
FIG. 13 is an exemplary drawing illustration of a programmable end device.

FIG. 13 is a drawing illustration of an end-device 3611 comprising 9 tiles 3701 [(0,0) to (2,2)] such as tile 3601. Each tile 3701 may contain a tiny micro control unit—MCU 3702. The micro control unit could have a common architecture such as an 8051 with its own program memory and data memory. The MCUs in each tile may be used to load the FPGA tile 3701 with its programmed function and substantially all its initialization for proper operation of the device. The MCU of each tile may be connected (for example, MCU-MCU connections 3714, 3706, & 3704) with a fixed electrical connection so to be controlled by the tile west of it or the tile south of it, in that order of priority. So, for example, the MCU 3702-11 may be controlled by MCU 3702-01. The MCU 3702-01 may have no MCU west of it so it may be controlled by the MCU south of it, MCU 3702-00, through connection 3714. Accordingly the MCU 3702-00 which may be in south-west corner may have no tile MCU to control it through connection 3706 or connection 3704 and it may therefore be the master control unit of the end-device.

FIG. 14 illustrates a simple control connectivity utilizing a slightly modified Joint Test Action Group (JTAG)-based MCU architecture to support such a tiling approach. These MCU connections may be made with a fixed electrical connection, such as, for example, a metallized via, during the manufacturing process. Each MCU may have two Time-Delay-Integration (TDI) inputs, TDI 3816 from the device on its west side and TDIb 3814 from the MCU on its south side. As long as the input from its west side TDI 3816 is active it may be the controlling input, otherwise the TDIb 3814 from the south side may be the controlling input. Again in this illustration the MCU at the south-west corner tile 3800 may take control as the master. Its control inputs 3802 may be used to control the end-device and through this MCU at the south-west corner tile 3800 it may spread to substantially all other tiles. In the structure illustrated in FIG. 14 the outputs of the end-device 3611 may be collected from the MCU of the tile at the north-east corner 3820 at the TDO output 3822. These MCUs and their connectivity would be used to load the end-device functions, initialize the end-device, test the end-device, debug the end-device, program the end-device clocks, and provide substantially all other desired control functions. Once the end-device has completed its set up or other control and initialization functions such as testing or debugging, these MCUs could be then utilized for user functions as part of the end-device operation and may be connected electrically or configured with programmable connections.

An additional advantage for this construction of a tiled FPGA array with MCUs may be in the construction of an SoC with embedded FPGA function. A single tile 3601 could be connected to an SoC using Through Silcon Vias (TSVs) and accordingly may provide a self-contained embedded FPGA function.

Clearly, the same scheme can be modified to use the East/North (or any other combination of orthogonal directions) to encode effectively an identical priority scheme.

FIG. 2B is a drawing illustration of an alternative reticle site on a wafer comprising tiles of Structured ASIC 1100B. Such wafer may be, for example, a continuous array of configurable logic. 1102 are potential dicing lines to support various die sizes and the amount of logic to be constructed. This die could be used as a base 1202A, 1202B, 1202C or 1202D of the 3D system as in FIG. 3.

Figure 2E:
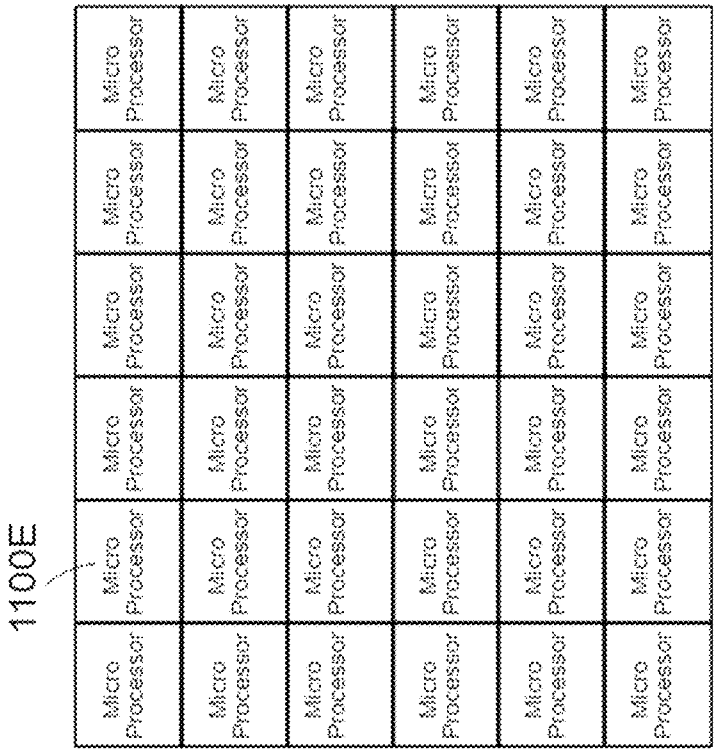
Figure 2C:
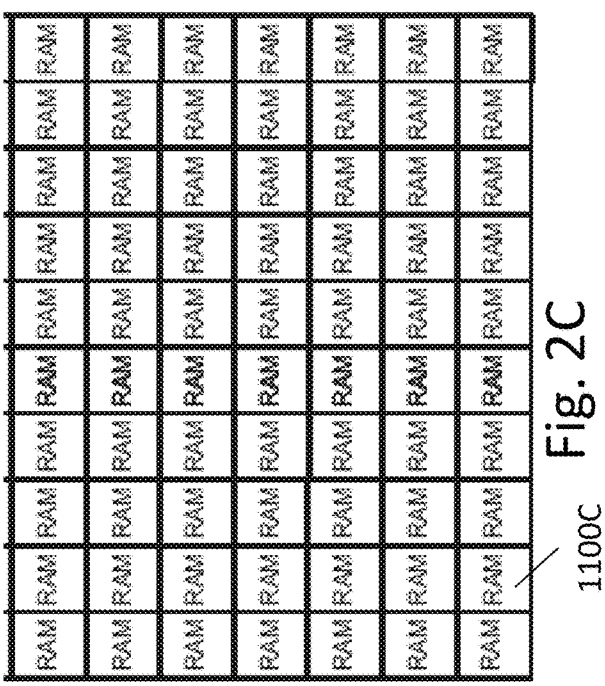

FIG. 2C is a drawing illustration of another reticle site on a wafer comprising tiles of RAM 1100C. Such wafer may be a continuous array of memories. The die diced out of such wafer may be a memory die component of the 3D integrated system. It might include, for example, an antifuse layer or other form of configuration technique to function as a configurable memory die. Yet it might be constructed as a multiplicity of memories connected by a multiplicity of Through Silicon Vias to the configurable die, which may also be used to configure the raw memories of the memory die to the desired function in the configurable system.

Figure 2D:
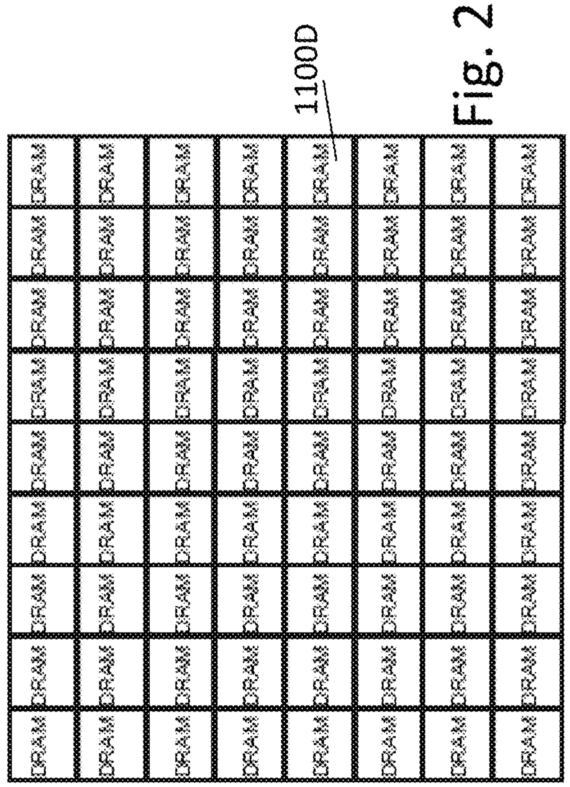

FIG. 2D is a drawing illustration of another reticle site on a wafer including tiles of DRAM 1100D. Such wafer may be a continuous array of DRAM memories.

FIG. 2E is a drawing illustration of another reticle site on a wafer comprising tiles of microprocessor or microcontroller cores 1100E. Such wafer may be a continuous array of Processors.

Figure 2F:
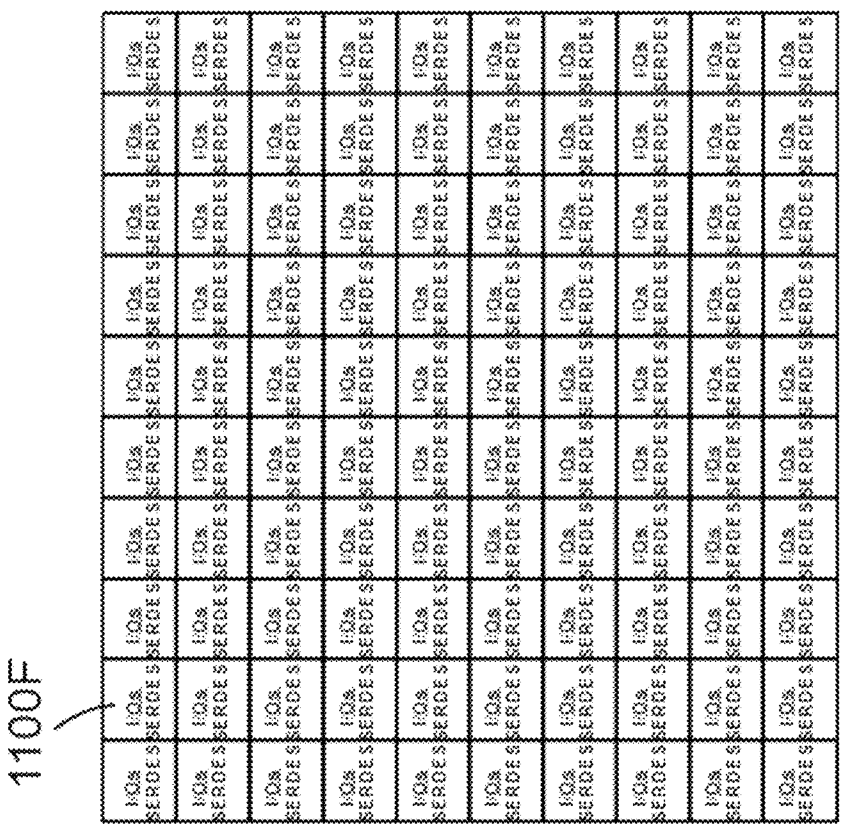

FIG. 2F is a drawing illustration of another reticle site on a wafer including tiles of I/Os 1100F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through Silicon Vias to the configurable die, which may also be used to configure the raw I/Os of the I/O die to the desired function in the configurable system.

I/O circuits may be a good example of where it could be illustratively advantageous to utilize an older generation process. Usually, the process drivers may be SRAM and logic circuits. It often may take longer to develop the analog function associated with I/O circuits, SerDes circuits, PLLs, and other linear functions. Additionally, while there may be an advantage to using smaller transistors for the logic functionality, I/Os may need stronger drive and relatively larger transistors and may enable higher operating voltages. Accordingly, using an older process may be more cost effective, as the older process wafer might cost less while still performing effectively.

An additional function that it might be advantageous to pull out of the programmable logic die and onto one of the other dies in the 3D system, connected by Through-Silicon-Vias, may be the Clock circuits and their associated PLL, DLL, and control clock circuits and distribution. These circuits may often be area consuming and may also be challenging in view of noise generation. They also could in many cases be more effectively implemented using an older process. The Clock tree and distribution circuits could be included in the I/O die. Additionally the clock signal could be transferred to the programmable die using the Through-Silicon-Vias (TSVs) or by optical means. A technique to transfer data between dies by optical means was presented for example in U.S. Pat. No. 6,052,498 assigned to Intel Corp.

Alternatively an optical clock distribution could be used. There may be new techniques to build optical guides on silicon or other substrates. An optical clock distribution may be utilized to minimize the power used for clock signal distribution and may enable low skew and low noise for the rest of the digital system. Having the optical clock constructed on a different die and then connected to the digital die by means of Through-Silicon-Vias or by optical means, make it very practical, when compared to the prior art of integrating optical clock distribution with logic on the same die.

Alternatively the optical clock distribution guides and potentially some of the support electronics such as the conversion of the optical signal to electronic signal could be integrated by using layer transfer and smart cut approaches as been described before in FIGS. 4 and 8. The optical clock distribution guides and potentially some of the support electronics could be first built on the 'Foundation' wafer 1402 and then a thin layer transferred silicon layer 1404 may be transferred on top of it using the ion-cut flow, so substantially all the following construction of the primary circuit would take place afterward. The optical guide and its support electronics would be able to withstand the high temperatures necessary for the processing of transistors on transferred silicon layer 1404.

And as related to FIG. 8, the optical guide, and the proper semiconductor structures on which at a later stage the support electronics would be processed, could be pre-built on semiconductor layer 2019. Using, for example, the ion-cut flow semiconductor layer 2019 may be then transferred on top of a fully processed wafer 808. The optical guide may be able to withstand the ion implant for the ion-cut to form the ion-cut layer/plane 2008 while the support electronics may be finalized in flows similar to the ones presented in, for example, FIGS. 9-11, and 15 to 35. Thus, the landing target for the clock signal may need to accommodate the about 1 micron misalignment of the transferred layer 2004 to the prefabricated primary circuit and its upper layer 808. Such misalignment could be acceptable for many designs. Alternatively, for example, only the base structure for the support electronics may be pre-fabricated on semiconductor layer 2019 and the optical guide may be constructed after the layer transfer along with finalized flows of the support electronics using flows similar to the ones presented in, for example, FIGS. 9-11, and 15 to 35. Alternatively, the support electronics could be fabricated on top of a fully processed wafer 808 by using flows similar to the ones presented in, for example, FIGS. 9-11, and 15 to 35. Then an additional layer transfer on top of the support electronics may be utilized to construct the optical wave guides at low temperature.

Having wafers dedicated to each of these functions may support high volume generic product manufacturing. Then, similar to Lego® blocks, many different configurable systems could be constructed with various amounts of logic memory and I/O. In addition to the alternatives presented in FIG. 2A through FIG. 2F there many other useful functions that could be built and that could be incorporated into the 3D Configurable System. Examples of such may be image sensors, analog, data acquisition functions, photovoltaic devices, non-volatile memory, and so forth.

An additional function that would fit well for 3D systems using TSVs, as described, may be a power control function. In many cases it may be desired to shut down power at times to a portion of the IC that is not currently operational. Using controlled power distribution by an external die connected by TSVs may be illustratively advantageous as the power supply voltage to this external die could be higher because it may be using an older process. Having a higher supply voltage allows easier and better control of power distribution to the controlled die.

Those components of configurable systems could be built by one vendor, or by multiple vendors, who may agree on a standard physical interface to allow mix-and-match of various dies from various vendors.

The construction of the 3D Programmable System could be done for the general market use or custom-tailored for a specific customer.

Another illustrative advantage of some embodiments of this invention may be an ability to mix and match various processes. It might be illustratively advantageous to use memory from a leading edge process, while the I/O, and maybe an analog function die, could be used from an older process of mature technology (e.g., as discussed above).

FIG. 3A through FIG. 3E illustrates integrated circuit systems. An integrated circuit system that may include configurable die could be called a Configurable System. FIG. 3A through FIG. 3E are drawings illustrating integrated circuit systems or Configurable Systems with various options of die sizes within the 3D system and alignments of the various dies. FIG. 3E presents a 3D structure with some lateral options. In such case a few dies 1204E, 1206E, 1208E may be placed on the same underlying die 1202E allowing relatively smaller die to be placed on the same mother die. For example die 1204E could be a SerDes die while die 1206E could be an analog data acquisition die. It could be advantageous to fabricate these die on different wafers using different process and then integrate them into one system. When the dies are relatively small then it might be useful to place them side by side (such as FIG. 3E) instead of one on top of the other (FIG. 3A-3D).

The Through Silicon Via technology is constantly evolving. In the early generations such via would be 10 microns in diameter. Advanced work now demonstrating Through Silicon Via with less than a about 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other functions.

Recent work on 3D integration may show effective ways to bond wafers together and then dice those bonded wafers. This kind of assembly may lead to die structures such as shown in FIG. 3A or FIG. 3D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

Figure 30A:
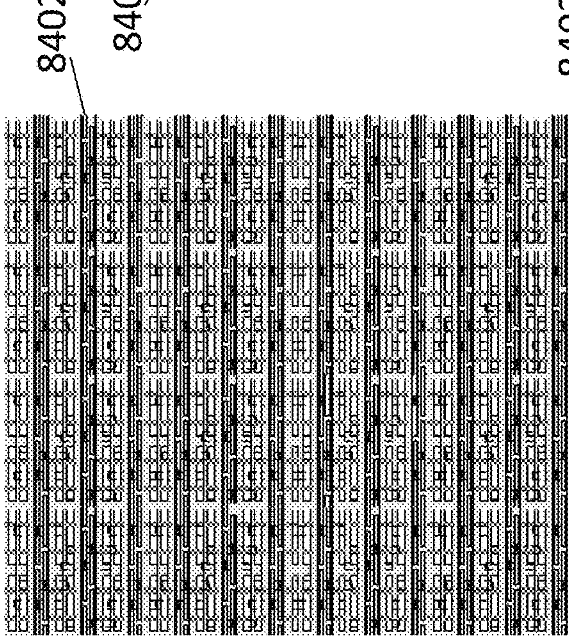
FIG. 30A-FIG. 30G are exemplary drawing illustrations of continuous transistor arrays.
Figure 30B:
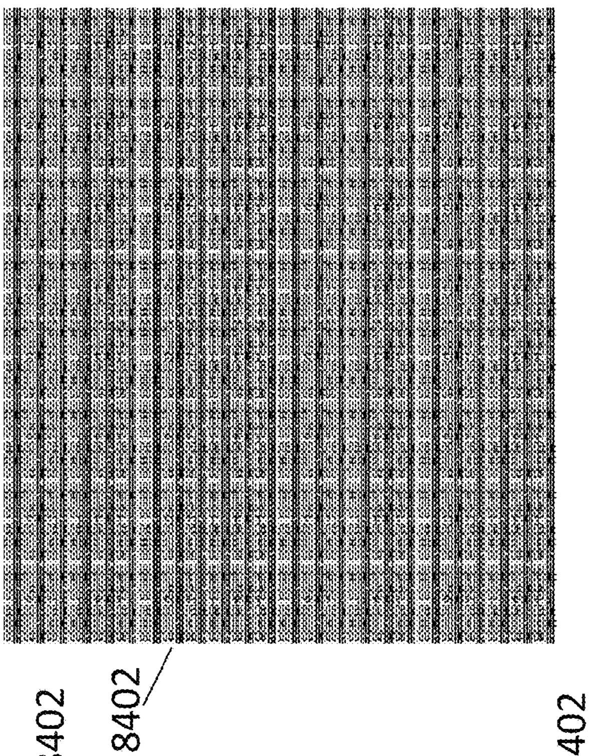
Figure 30C:
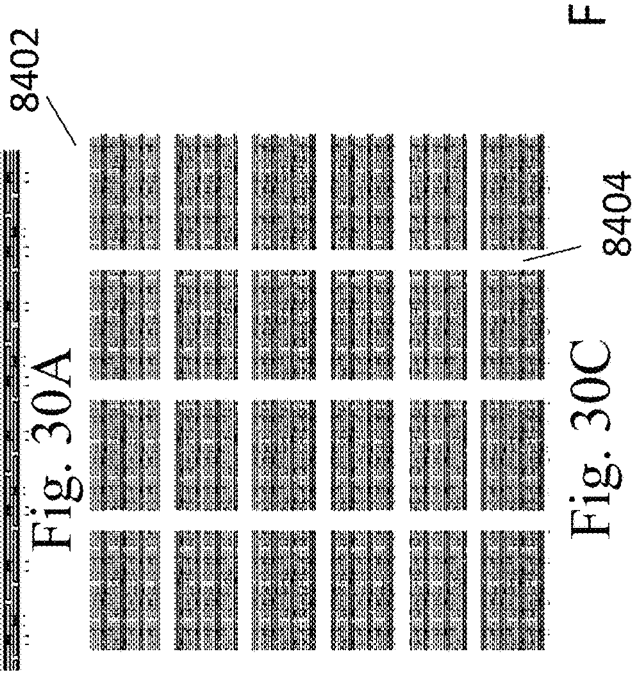

An additional variation of the present invention may be the adaptation of the continuous array (presented in relation to at least FIG. 2A-2F) to the general logic device and even more so for the 3D IC system. Lithography limitations may pose considerable concern to advanced device design. Accordingly regular structures may be highly desirable and layers may be constructed in a mostly regular fashion and in most cases with one orientation at a time. Additionally, highly vertically-connected 3D IC system could be most efficiently constructed by separating logic memories and I/O into dedicated layers. FIG. 30A illustrates a repeating pattern of the logic cells. In such a case, the repeating logic pattern 8402 could be made full reticle size. FIG. 30B illustrates the same repeating logic pattern 8402, repeating the device, array, cells, etc. many more times to substantially fully fill a reticle. The multiple masks used to construct the logic terrain could be used for multiple logic layers within one 3D IC and for multiple ICs. Such a repeating structure may include the logic P and N transistors, their corresponding contact layers, and even the landing strips for connecting to the underlying layers. The interconnect layers on top of these logic terrain could be made custom per design or partially custom depending on the design methodology used. The custom metal interconnect may leave the logic terrain unused in the dicing streets area. Alternatively a dicing-streets mask could be used to etch away the unused transistors in the streets area 8404 as illustrated in FIG. 30C.

The continuous logic terrain could use any transistor style including the various transistors previously presented. An additional advantage to some of the 3D layer transfer techniques previously presented may be the option to pre-build, in high volume, transistor terrains for further reduction of 3D custom IC manufacturing costs.

Similarly a memory terrain could be constructed as a continuous repeating memory structure with a fully populated reticle. The non-repeating elements of most memories may be the address decoder and sometimes the sense circuits. Those non repeating elements may be constructed using the logic transistors of the underlying or overlying layer.

Figure 30D:
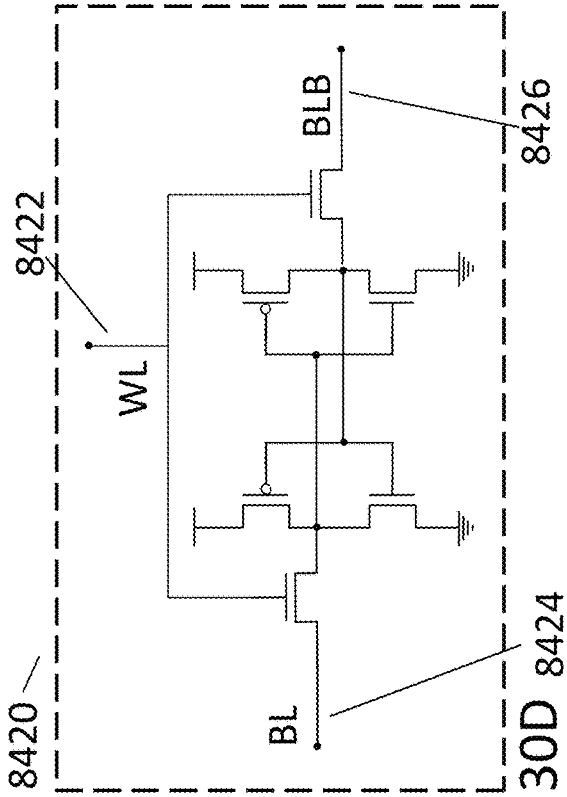

FIG. 30D-G are drawing illustrations of an SRAM memory terrain. FIG. 30D illustrates a conventional 6 transistor SRAM bit cell 8420 controlled by Word Line (WL) 8422 and Bit Lines (BL, BLB) 8424, 8426. The SRAM bit cell may be specially designed to be very compact.

Figure 30E:
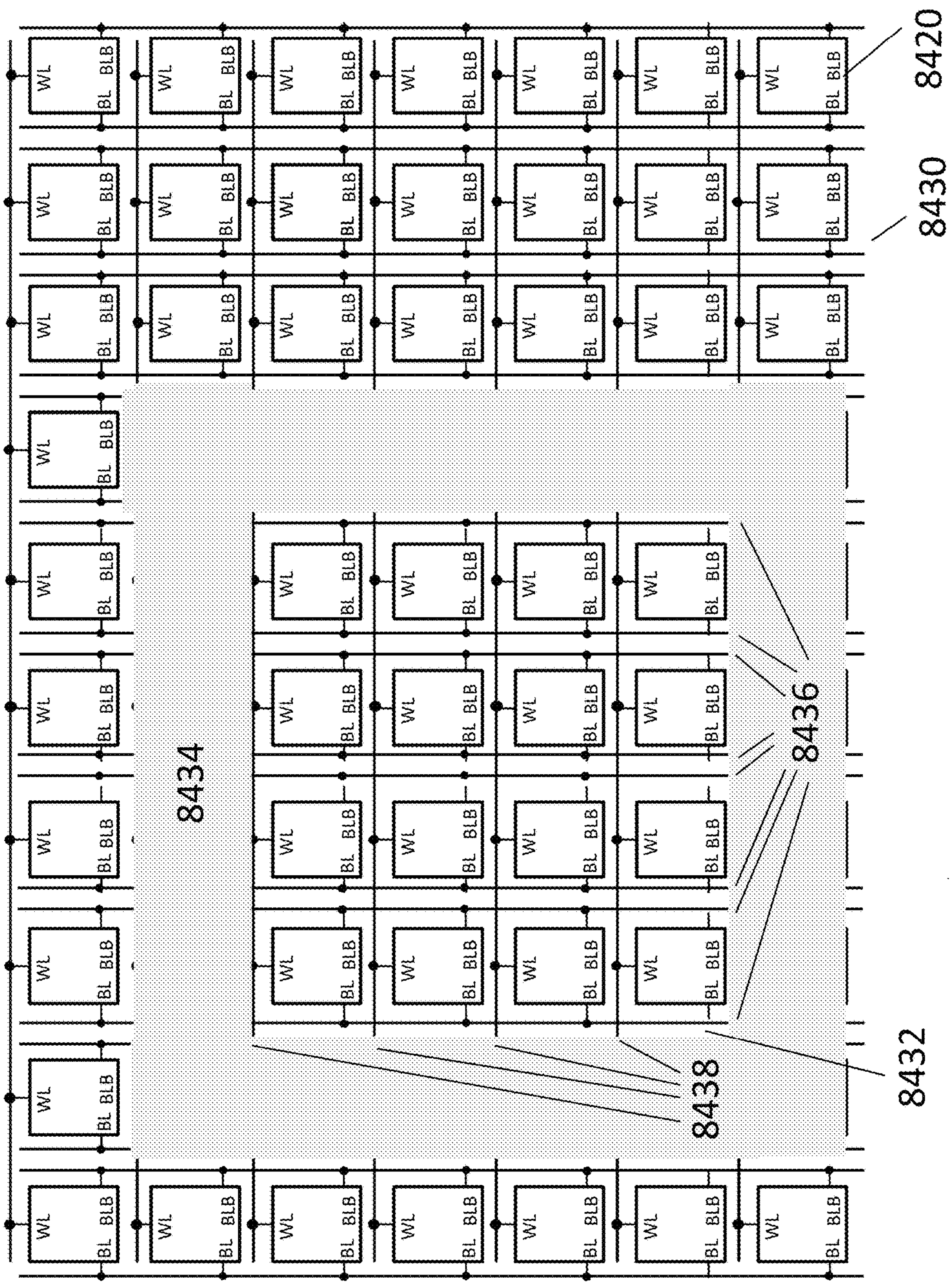

The generic continuous array 8430 may be a reticle step field sized terrain of SRAM bit cells 8420 wherein the transistor layers and even the Metal 1 layer may be used by substantially all designs. FIG. 30E illustrates such continuous array 8430 wherein a 4×4 memory block 8432 may be defined by custom etching the cells around it 8434. The memory may be customized by custom metal masks such metal 2 and metal 3. To control the memory block the Word Lines 8438 and the Bit Lines 8436 may be connected by through layer vias to the logic terrain underneath or above it.

Figure 30F:
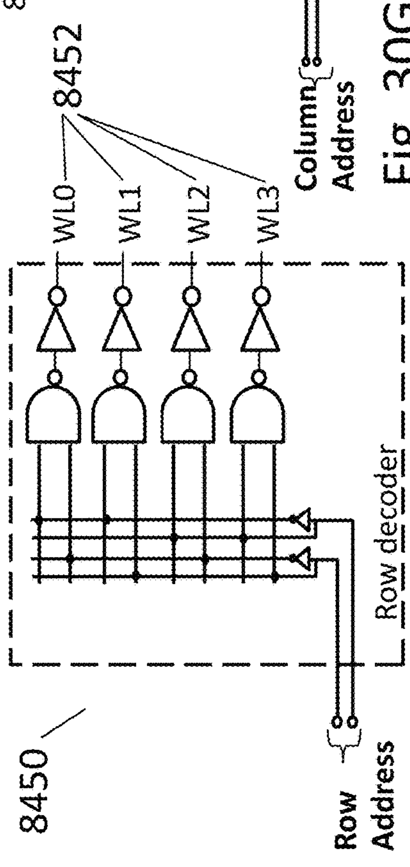
Figure 30G:
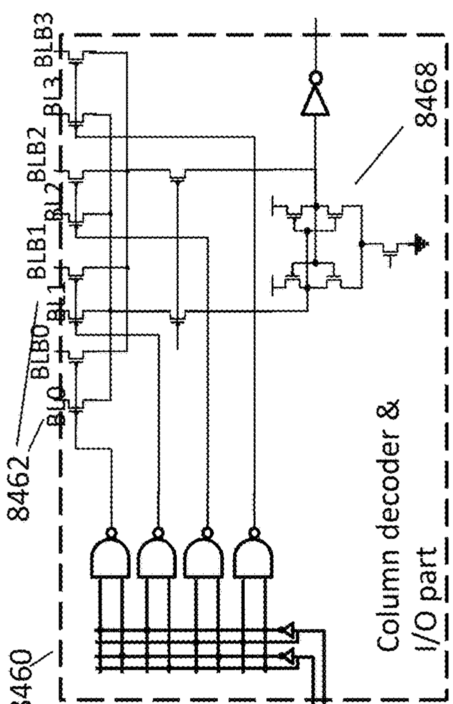

FIG. 30F illustrates a logic structure 8450 that may be constructed on the logic terrain to drive the Word Lines 8452. FIG. 30G illustrates the logic structure 8460 that may be constructed on the logic terrain to drive the Bit Lines 8462. FIG. 30G also illustrates the read sense circuit 8468 that may read the memory content from the bit lines 8462. In a similar fashion, other memory structures may be constructed from the uncommitted memory terrain using the uncommitted logic terrain close to the intended memory structure. In a similar fashion, other types of memory, such as flash or DRAM, may include the memory terrain. Furthermore, the memory terrain may be etched away at the edge of the projected die borders to define dicing streets similar to that indicated in FIG. 30C for a logic terrain.

Figure 73A:
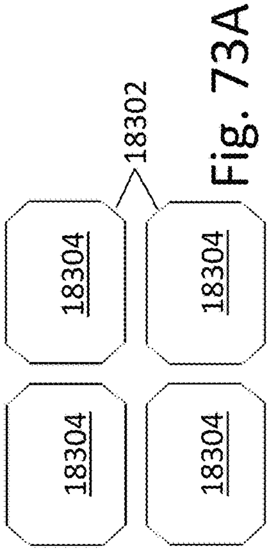
FIG. 73A is an exemplary drawing illustration of chamfering the custom function etching shape for stress relief.

As illustrated in FIG. 73A, the custom dicing line masking and etch referred to in the FIG. 30C discussion to create multiple thin strips of streets area 8404 for etching may be shaped to created chamfered block corners 18302 of custom blocks 18304 to relieve stress. Custom blocks 18304 may include functions, blocks, arrays, or devices of architectures such as logic, FPGA, I/O, or memory.

Figure 73B:
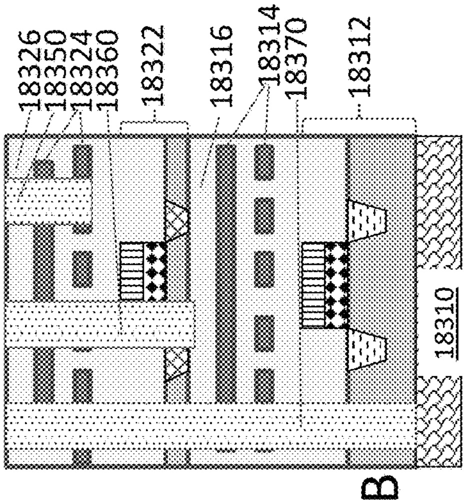
FIG. 73B is an exemplary drawing illustration of potential depths of custom function etching a continuous array in 3DIC.

As illustrated in FIG. 73B, this custom function etching and chamfering may extend through the BEOL metallization of one device layer of the 3DIC stack as shown in first structure 18350, or extend through the entire 3DIC stack to the bottom substrate and shown in second structure 18370, or may truncate at the isolation of any device layer in the 3D stack as shown in third structure 18360. The cross sectional view of an exemplary 3DIC stack may include second layer BEOL dielectric 18326, second layer interconnect metallization 18324, second layer transistor layer 18322, substrate layer BEOL dielectric 18316, substrate layer interconnect metallization 18314, substrate transistor layer 18312, and substrate 18310.

Figure 73C:
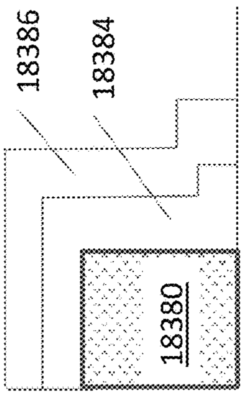
FIG. 73C is an exemplary drawing illustration of a method to passivate the edge of a custom function etch of a continuous array in 3DIC.

Passivation of the edge created by the custom function etching may be accomplished as follows. If the custom function etched edge is formed on a layer or strata that is not the topmost one, then it may be passivated or sealed by filling the etched out area with dielectric, such as a Spin-On-Glass (SOG) method, and CMPing flat to continue to the next 3DIC layer transfer. As illustrated in FIG. 73C, the topmost layer custom function etched edge may be passivated with an overlapping layer or layers of material including, for example, oxide, nitride, or polyimide. Oxide may be deposited over custom function etched block edge 18380 and may be lithographically defined and etched to overlap the custom function etched block edge 18380 shown as oxide structure 18384. Silicon nitride may be deposited over wafer and oxide structure 18384, and may be lithographically defined and etched to overlap the custom function etched block edge 18380 and oxide structure 18384, shown as nitride structure 18386.

In such way a single expensive mask set can be used to build many wafers for different memory sizes and finished through another mask set that is used to build many logic wafers that can be customized by few metal layers.

Person skilled in the art will recognize that it is now possible to assemble a true monolithic 3D stack of mono-crystalline silicon layers or strata with high performance devices using advanced lithography that repeatedly reuse same masks, with only few custom metal masks for each device layer. Such person will also appreciate that one can stack in the same way a mix of disparate layers, some carrying transistor array for general logic and other carrying larger scale blocks such as memories, analog elements, Field Programmable Gate Array (FPGA), and I/O. Moreover, such a person would also appreciate that the custom function formation by etching may be accomplished with masking and etching processes such as, for example, a hard-mask and Reactive Ion Etching (RIE), or wet chemical etching, or plasma etching. Furthermore, the passivation or sealing of the custom function etching edge may be stair stepped so to enable improved sidewall coverage of the overlapping layers of passivation material to seal the edge Constructing 3D ICs utilizing multiple layers of different function may combine 3D layers using the layer transfer techniques according to some embodiments of the invention, with substantially fully prefabricated devices connected by industry standard TSV techniques.

Yield repair for random logic may be an embodiment of the invention. The 3D IC techniques presented may allow the construction of a very complex logic 3D IC by using multiple layers of logic. In such a complex 3D IC, enabling the repair of random defects common in IC manufacturing may be highly desirable. Repair of repeating structures is known and commonly used in memories and will be presented in respect to FIG. 16. Another alternative may be a repair for random logic leveraging the attributes of the presented 3D IC techniques and Direct Write eBeam technology such as, for example, technologies offered by Advantest, Fujitsu Microelectronics and Vistec.

Figure 31A:
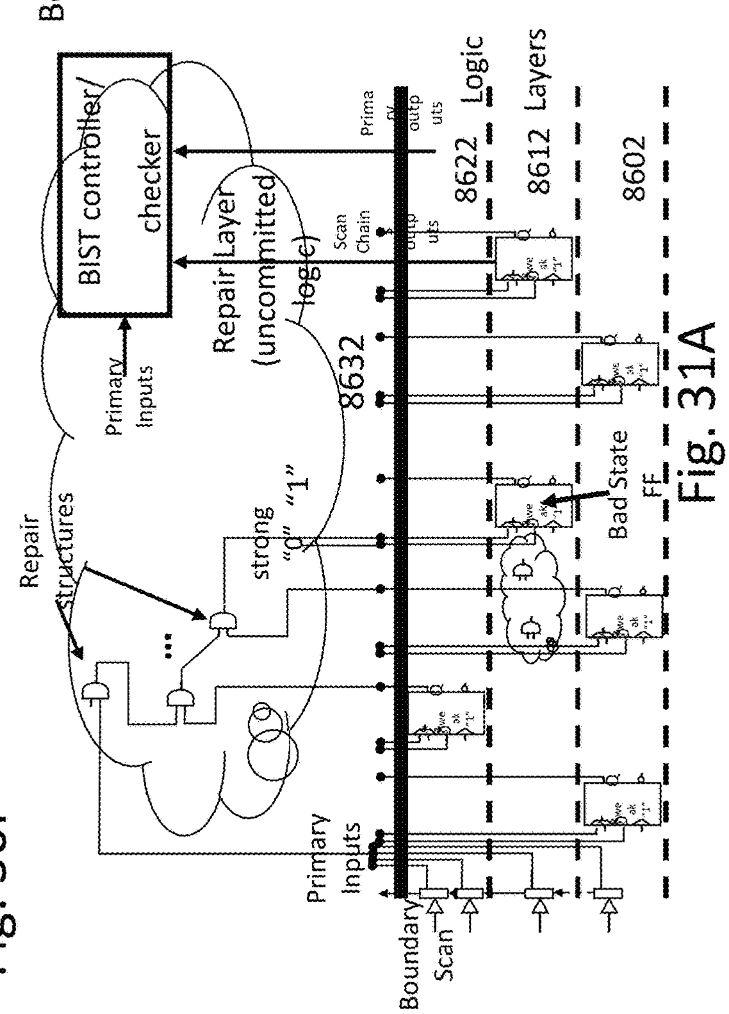
FIG. 31A is an exemplary drawing illustration of a 3D logic IC structured for repair.

FIG. 31A illustrates an exemplary 3D logic IC structured for repair. The illustrated 3D logic IC may include three logic layers 8602, 8612, 8622 and an upper layer of repair logic 8632. In each logic layer substantially all primary outputs, the Flip Flop (FF) outputs, may be fed to the upper layer of repair logic 8632, the repair layer. The upper layer of repair logic 8632 initially may include a repeating structure of uncommitted logic transistors similar to those of FIGS. 76 and 78. The circuitry of logic layer 8602 may be constructed on SOI wafers so that the performance of logic layer 8602 may more closely match logic layers 8612, 8622 and layer of repair logic 8632.

At the fabrication, the 3D IC wafer may go through a full scan test. If a fault is detected, a yield repair process may be applied. Using the design data base, repair logic may be built on the upper layer of repair logic 8632. The repair logic may have access to substantially all the primary outputs as they are all available on the top layer. Accordingly, those outputs needed for the repair may be used in the reconstruction of the exact logic found to be faulty. The reconstructed logic may include some enhancement such as drive size or metal wires strength to compensate for the longer lines going up and then down. The repair logic, as a de-facto replacement of the faulty logic 'cone,' may be built using the uncommitted transistors on the top layer. The top layer may be customized with a custom metal layer defined for each die on the wafer by utilizing the direct write eBeam. The repair flow may also be used for performance enhancement. If the wafer test includes timing measurements, a slow performing logic 'cone' could be replaced in a similar manner to a faulty logic 'cone' described previously, e.g., in the preceding paragraph.

Figure 31B:
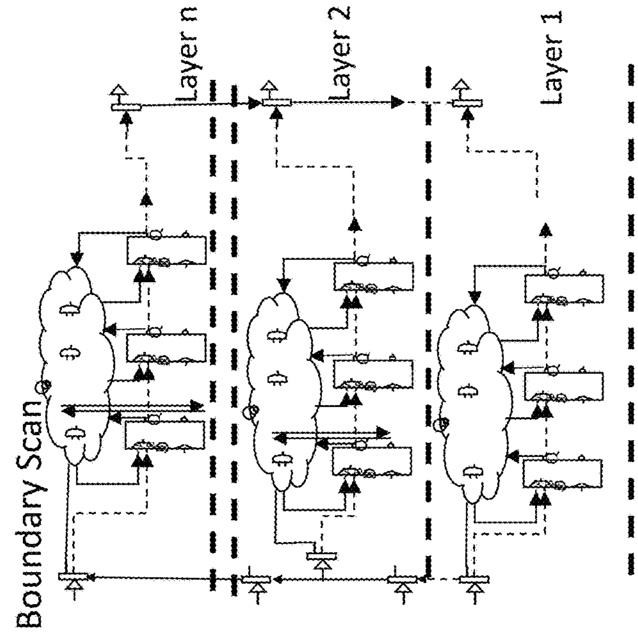
FIG. 31B is an exemplary drawing illustration of a 3D IC with scan chain confined to each layer.

FIG. 31B is a drawing illustration of a 3D IC wherein the scan chains are designed so each is confined to one layer. This confinement may allow testing of each layer as it is fabricated and could be useful in many ways. For example, after a circuit layer is completed and then tested showing very bad yield, then the wafer could be removed and not continued for building additional 3D circuit layers on top of bad base. Alternatively, a design may be constructed to be very modular and therefore the next transferred circuit layer could include replacement modules for the underlying faulty base layer similar to what was suggested in respect to FIG. 16.

Figure 31C:
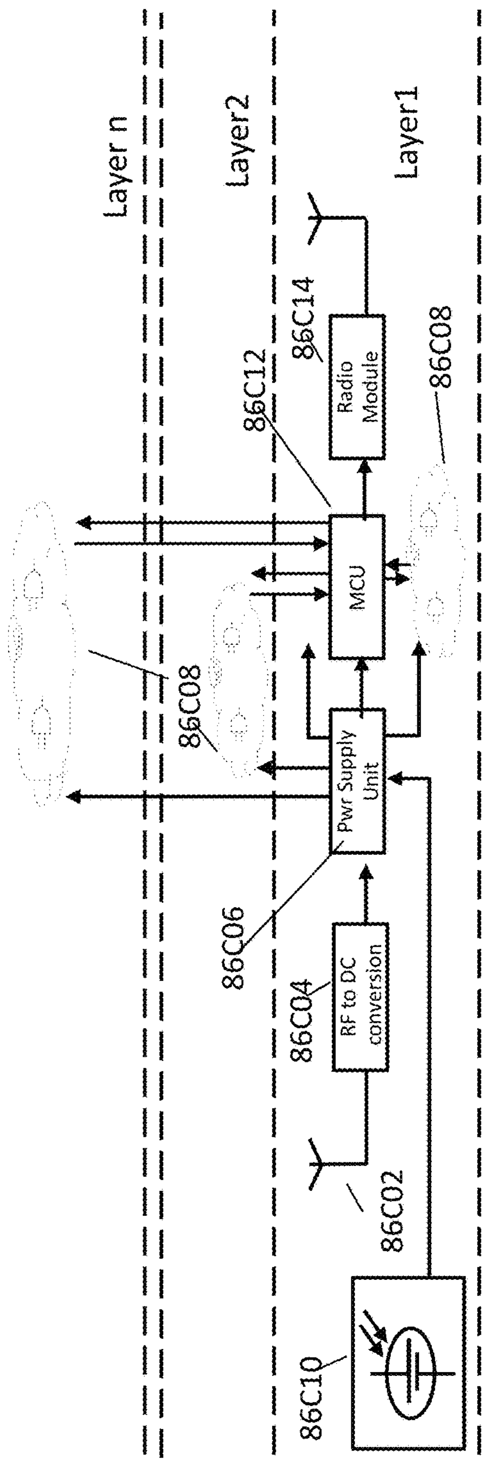
FIG. 31C is an exemplary drawing illustration of contactless testing.
Figure 32:
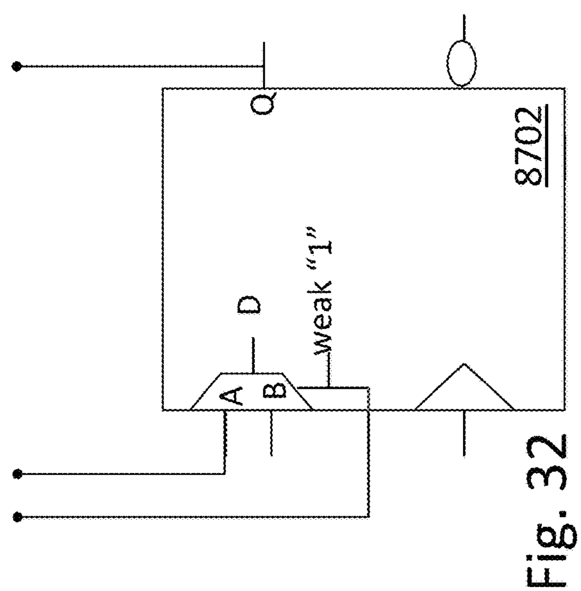
FIG. 32 is an exemplary drawing illustration of a Flip Flop designed for repairable 3D IC logic.

The elements of the present invention related to FIGS. 31A and 31B may need testing of the wafer during the fabrication phase, which might be of concern in respect to debris associated with making physical contact with a wafer for testing if the wafer may be probed when tested. FIG. 31C is a drawing illustration of an embodiment which may provide for contact-less automated self-testing. A contact-less power harvesting element might be used to harvest the electromagnetic energy directed at the circuit of interest by a coil base antenna 86C02, an RF to DC conversion circuit 86C04, and a power supply unit 86C06 to generate the necessary supply voltages to run the self-test circuits and the various 3D IC circuits 86C08 to be tested. Alternatively, a tiny photo voltaic cell 86C10 could be used to convert light beam energy to electric current which may be converted by the power supply unit 86C06 to the needed voltages. Once the circuits are powered, a Micro Control Unit 86C12 could perform a full scan test of all existing 3D IC circuits 86C08. The self-test could be full scan or other BIST (Built In Self-Test) alternatives. The test result could be transmitted using wireless radio module 86C14 to a base unit outside of the 3D IC wafer. Such contact less wafer testing could be used for the test as was referenced in respect to FIG. 31A and FIG. 31B or for other application such as wafer to wafer or die to wafer integration using TSVs. Alternative uses of contact-less testing could be applied to various combinations of the present invention. One example is where a carrier wafer method may be used to create a wafer transfer layer whereby transistors and the metal layers connecting them to form functional electronic circuits are constructed. Those functional circuits could be contactlessly tested to validate proper yield, and, if appropriate, actions to repair or activate built-in redundancy may be done. Then using layer transfer, the tested functional circuit layer may be transferred on top of another processed wafer 808, and may then be connected by utilizing one of the approaches presented before.

An additional advantage of this yield repair design methodology may be the ability to reuse logic layers from one design to another design. For example, a 3D IC system may be designed wherein one of the layers may comprise a WiFi transceiver receiver. And such circuit may now be needed for a completely different 3D IC. It might be advantageous to reuse the same WiFi transceiver receiver in the new design by just having the receiver as one of the new 3D IC design layers to save the redesign effort and the associated NRE (non-recurring expense) for masks and etc. The reuse could be applied to many other functions, allowing the 3D IC to resemble an old way of integrating functions—the PC (printed circuit) Board. For such a concept to work well, a connectivity standard for the connection of wires up and down may be desirable.

Another application of these concepts could be the use of the upper layer to modify the clock timing by adjusting the clock of the actual device and its various fabricated elements. Scan circuits could be used to measure the clock skew and report it to an external design tool. The external design tool could construct the timing modification that would be applied by the clock modification circuits. A direct write ebeam could then be used to form the transistors and circuitry on the top layer to apply those clock modifications for a better yield and performance of the 3D IC end product.

An alternative approach to increase yield of complex systems through use of 3D structure is to duplicate the same design on two layers vertically stacked on top of each other and use BIST techniques similar to those described in the previous sections to identify and replace malfunctioning logic cones. This approach may prove particularly effective repairing very large ICs with very low yields at the manufacturing stage using one-time, or hard to reverse, repair structures such as, for example, antifuses or Direct-Write e-Beam customization.

Triple Modular Redundancy (TMR) at the logic cone level can also function as an effective field repair method, though it may really create a high level of redundancy that can mask rather than repair errors due to delayed failure mechanisms or marginally slow logic cones. If factory repair is used to make sure all the equivalent logic cones on each layer test functional before the 3D IC is shipped from the factory, the level of redundancy may be even higher. The cost of having three layers versus having two layers, with or without a repair layer may be factored into determining an embodiment for any application.

Figure 45:
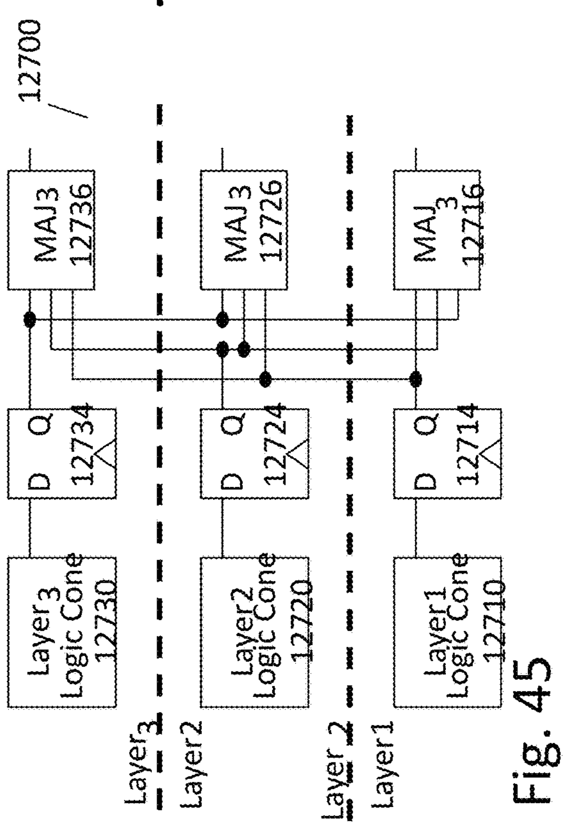
FIG. 45 is an exemplary drawing illustration of a second Triple Modular Redundancy 3D IC.

An alternative TMR approach may be shown in exemplary 3D IC 12700 in FIG. 45. FIG. 45 illustrates substantially identical Layers labeled Layer 1, Layer 2 and Layer 3 separated by dashed lines in the figure. Layer 1, Layer 2 and Layer 3 may each include one or more circuit layers and are bonded together to form 3D IC 12700 using techniques known in the art. Layer 1 may include Layer 1 Logic Cone 12710, flip-flop 12714, and majority-of-three (MAJ3) gate 12716. Layer 2 may include Layer 2 Logic Cone 12720, flip-flop 12724, and MAJ3 gate 12726. Layer 3 may include Layer 3 Logic Cone 12730, flip-flop 12734, and MAJ3 gate 12736.

The logic cones 12710, 12720 and 12730 all may perform a substantially identical logic function. The flip-flops 12714, 12724 and 12734 may be illustratively scan flip-flops. If a Repair Layer is present (not shown in FIG. 45), then the flip-flop 8702 of FIG. 32 may be used to implement repair of a defective logic cone before 3D IC 12700 may be shipped from the factory. The MAJ3 gates 12716, 12726 and 12736 may compare the outputs from the three flip-flops 12714, 12724 and 12734 and output a logic value consistent with the majority of the inputs: specifically if two or three of the three inputs equal logic-0, then the MAJ3 gate may output logic-0; and if two or three of the three inputs equal logic-1, then the MAJ3 gate may output logic-1. Thus if one of the three logic cones or one of the three flip-flops is defective, the correct logic value may be present at the output of all three MAJ3 gates.

One illustrative advantage of the embodiment of FIG. 45 may be that Layer 1, Layer 2 or Layer 3 can all be fabricated using all or nearly all of the same masks. Another illustrative advantage may be that MAJ3 gates 12716, 12726 and 12736 can also effectively function as a Single Event Upset (SEU) filter for high reliability or radiation tolerant applications as described in Rezgui cited above.

Figure 46:
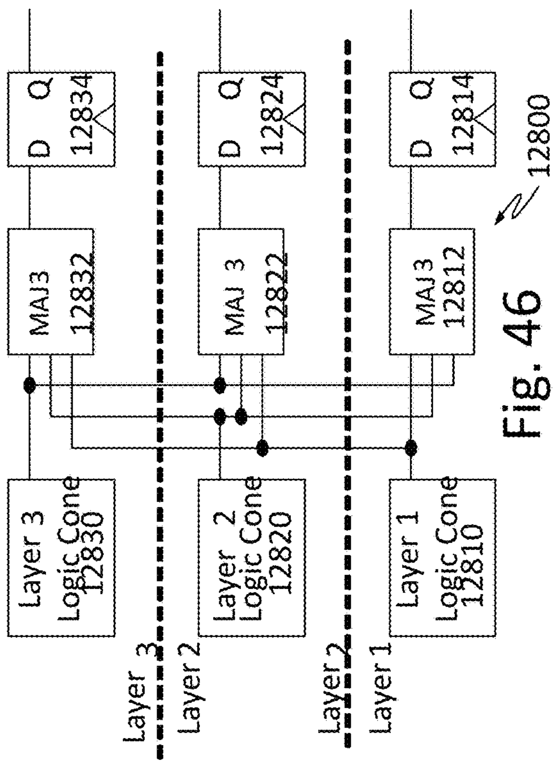
FIG. 46 is an exemplary drawing illustration of a third Triple Modular Redundancy 3D IC.

Another TMR approach is shown in exemplary 3D IC 12800 in FIG. 46. In this embodiment, the MAJ3 gates may be placed between the logic cones and their respective flip-flops. Present in FIG. 46 are substantially identical Layers labeled Layer 1, Layer 2 and Layer 3 separated by dashed lines in the figure. Layer 1, Layer 2 and Layer 3 may each include one or more circuit layers and may be bonded together to form 3D IC 12800 using techniques known in the art. Layer 1 may include Layer 1 Logic Cone 12810, flip-flop 12814, and majority-of-three (MAJ3) gate 12812. Layer 2 may include Layer 2 Logic Cone 12820, flip-flop 12824, and MAJ3 gate 12822. Layer 3 may include Layer 3 Logic Cone 12830, flip-flop 12834, and MAJ3 gate 12832.

The logic cones 12810, 12820 and 12830 all may perform a substantially identical logic function. The flip-flops 12814, 12824 and 12834 may be illustratively scan flip-flops. If a Repair Layer is present (not shown in FIG. 46), then the flip-flop 8702 of FIG. 32 may be used to implement repair of a defective logic cone before 3D IC 12800 is shipped from the factory. The MAJ3 gates 12812, 12822 and 12832 may compare the outputs from the three logic cones 12810, 12820 and 12830 and may output a logic value which may be consistent with the majority of the inputs. Thus if one of the three logic cones is defective, the correct logic value may be present at the output of all three MAJ3 gates.

One illustrative advantage of the embodiment of FIG. 46 is that Layer 1, Layer 2 or Layer 3 can all be fabricated using all or nearly all of the same masks. Another illustrative advantage may be that MAJ3 gates 12716, 12726 and 12736 can also effectively function as a Single Event Transient (SET) filter for high reliability or radiation tolerant applications as described in Rezgui cited above.

Figure 47:
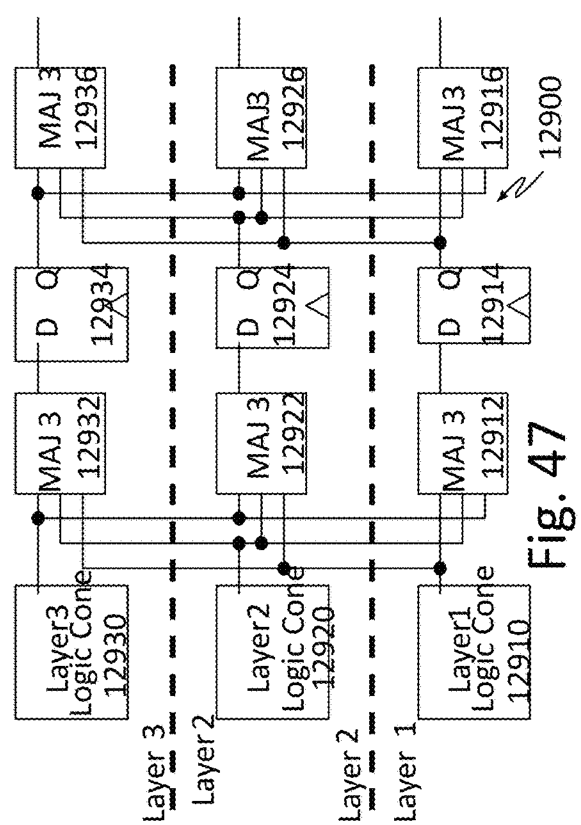
FIG. 47 is an exemplary drawing illustration of a fourth Triple Modular Redundancy 3D IC.

Another TMR embodiment is shown in exemplary 3D IC 12900 in FIG. 47. In this embodiment, the MAJ3 gates may be placed between the logic cones and their respective flip-flops. FIG. 47 illustrates substantially identical Layers labeled Layer 1, Layer 2 and Layer 3 separated by dashed lines in the figure. Layer 1, Layer 2 and Layer 3 may each include one or more circuit layers and may be bonded together to form 3D IC 12900 using techniques known in the art. Layer 1 may include Layer 1 Logic Cone 12910, flip-flop 12914, and majority-of-three (MAJ3) gates 12912 and 12916. Layer 2 may include Layer 2 Logic Cone 12920, flip-flop 12924, and MAJ3 gates 12922 and 12926. Layer 3 may include Layer 3 Logic Cone 12930, flip-flop 12934, and MAJ3 gates 12932 and 12936.

The logic cones 12910, 12920 and 12930 all may perform a substantially identical logic function. The flip-flops 12914, 12924 and 12934 may be illustratively scan flip-flops. If a Repair Layer is present (not shown in FIG. 47), then the flip-flop 8702 of FIG. 32 may be used to implement repair of a defective logic cone before 3D IC 12900 is shipped from the factory. The MAJ3 gates 12912, 12922 and 12932 may compare the outputs from the three logic cones 12910, 12920 and 12930 and output a logic value consistent with the majority of the inputs. Similarly, the MAJ3 gates 12916, 12926 and 12936 may compare the outputs from the three flip-flops 12914, 12924 and 12934 and output a logic value consistent with the majority of the inputs. Thus if one of the three logic cones or one of the three flip-flops is defective, the correct logic value will be present at the output of all six of the MAJ3 gates.

One illustrative advantage of the embodiment of FIG. 47 is that Layer 1, Layer 2 or Layer 3 can all be fabricated using all or nearly all of the same masks. Another illustrative advantage may be that MAJ3 gates 12716, 12726 and 12736 also effectively function as a Single Event Transient (SET) filter while MAJ3 gates 12716, 12726 and 12736 may also effectively function as a Single Event Upset (SEU) filter for high reliability or radiation tolerant applications as described in Rezgui cited above.

Some embodiments of the invention can be applied to a large variety of commercial as well as high-reliability aerospace and military applications. The ability to fix defects in the factory with Repair Layers combined with the ability to automatically fix delayed defects (by masking them with three layer Triple Modular Redundancy (TMR) embodiments or replacing faulty circuits with two layer replacement embodiments) may allow the creation of much larger and more complex three dimensional systems than may be possible with conventional two dimensional integrated circuit (IC) technology. These various aspects of the present invention can be traded off against the cost requirements of the target application.

In order to reduce the cost of a 3D IC according to some embodiments of the present invention, it may be desirable to use the same set of masks to manufacture each Layer. This can be done by creating an identical structure of vias in an appropriate pattern on each layer and then offsetting it by a desired amount when aligning Layer 1 and Layer 2.

Figure 48A:
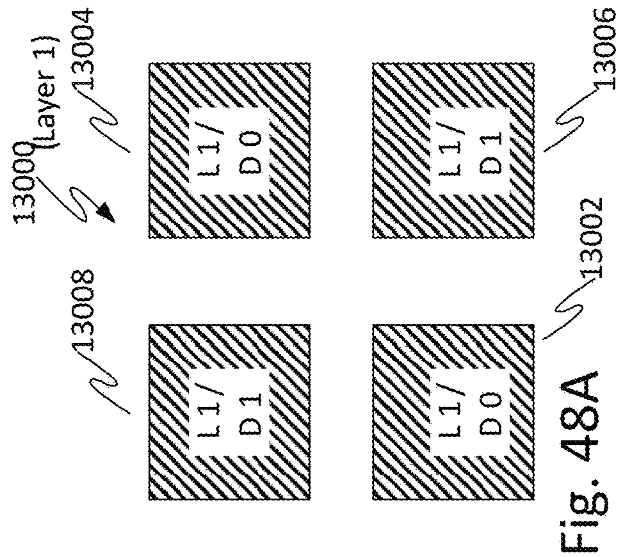
FIG. 48A is an exemplary drawing illustration of a first via metal overlap pattern.

FIG. 48A illustrates a via pattern 13000 constructed on Layer 1 of 3D ICs like 11900, 12100, 12200, 12300, 12400, 12500 and 12600 of U.S. Pat. No. 8,273,610, incorporated herein by reference. At a minimum the metal overlap pad at each via location 13002, 13004, 13006 and 13008 may be present on the top and bottom metal layers of Layer 1. Via pattern 13000 may occur in proximity to each repair or replacement multiplexer on Layer 1 where via metal overlap pads 13002 and 13004 (labeled L1/DO for Layer 1 input DO in the figure) may be coupled to the DO multiplexer input at that location, and via metal overlap pads 13006 and 13008 (labeled L1/D1 for Layer 1 input D1 in the figure) may be coupled to the D1 multiplexer input.

Figure 48C:
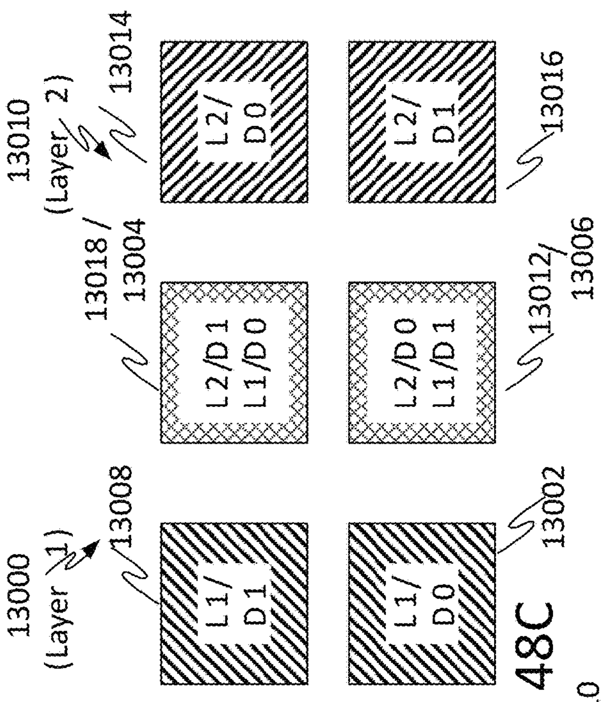
FIG. 48C is an exemplary drawing illustration of the alignment of the via metal overlap patterns of FIG. 48A and FIG. 48B in a 3D IC.
Figure 48B:
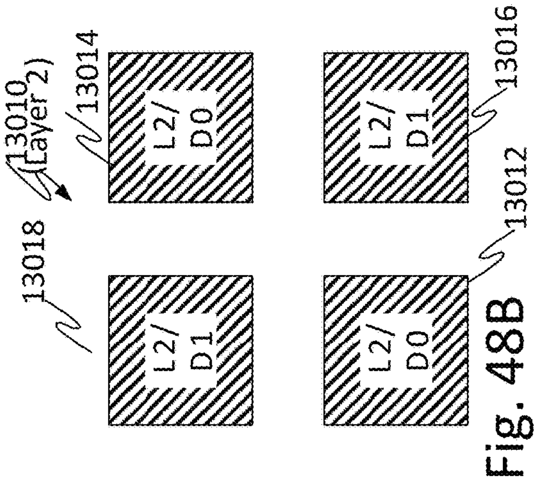
FIG. 48B is an exemplary drawing illustration of a second via metal overlap pattern.

Similarly, FIG. 48B illustrates a substantially identical via pattern 13010 which may be constructed on Layer 2 of 3D ICs like 11900, 12100, 12200, 12300, 12400, 12500 and 12600 of U.S. Pat. No. 8,273,610, incorporated herein by reference. At a minimum the metal overlap pad at each via location 13012, 13014, 13016 and 13018 may be present on the top and bottom metal layers of Layer 2. Via pattern 13010 may occur in proximity to each repair or replacement multiplexer on Layer 2 where via metal overlap pads 13012 and 13014 (labeled L2/DO for Layer 2 input DO in the figure) may be coupled to the DO multiplexer input at that location, and via metal overlap pads 13016 and 13018 (labeled L2/D1 for Layer 2 input D1 in the figure) may be coupled to the D1 multiplexer input.

FIG. 48C illustrates a top view where via patterns 13000 and 13010 may be aligned offset by one interlayer interconnection pitch. The interlayer interconnects may be TSVs or some other interlayer interconnect technology. FIG. 48C may illustrate via metal overlap pads 13002, 13004, 13006, 13008, 13012, 13014, 13016 and 13018 as previously discussed. In FIG. 48C, Layer 2 may be offset by one interlayer connection pitch to the right relative to Layer 1. This offset may cause via metal overlap pads 13004 and 13018 to physically overlap with each other. Similarly, this offset may cause via metal overlap pads 13006 and 13012 to physically overlap with each other. If Through Silicon Vias or other interlayer vertical coupling points are placed at these two overlap locations (using a single mask), then multiplexer input D1 of Layer 2 may be coupled to multiplexer input D0 of Layer 1 and multiplexer input D0 of Layer 2 may be coupled to multiplexer input D1 of Layer 1. This may be precisely the interlayer connection topology necessary to realize the repair or replacement of logic cones and functional blocks in, for example, the embodiments described with respect to FIGS. 121A and 123 of the parent application.

Figure 48D:
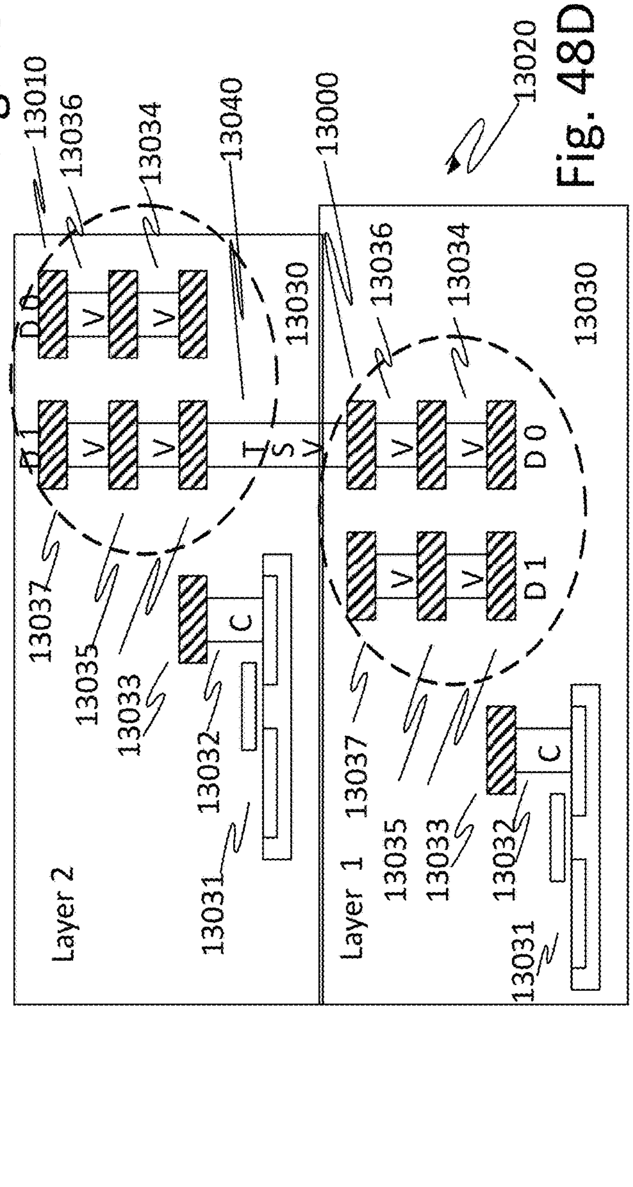
FIG. 48D is an exemplary drawing illustration of a side view of the structure of FIG. 48C.

FIG. 48D illustrates a side view of a structure employing the technique described in conjunction with FIGS. 48A, 48B and 48C. FIG. 48D illustrates an exemplary 3D IC generally indicated by 13020 including two instances of Layer 13030 stacked together with the top instance labeled Layer 2 and the bottom instance labeled Layer 1 in the figure. Each instance of Layer 13020 may include an exemplary transistor 13031, an exemplary contact 13032, exemplary metal 1 13033, exemplary via 1 13034, exemplary metal 2 13035, exemplary via 2 13036, and exemplary metal 3 13037. The dashed oval labeled 13000 may indicate the part of the Layer 1 corresponding to via pattern 13000 in FIGS. 48A and 48C. Similarly, the dashed oval labeled 13010 may indicate the part of the Layer 2 corresponding to via pattern 13010 in FIGS. 48B and 48C. An interlayer via such as TSV 13040 in this example may be shown coupling the signal D1 of Layer 2 to the signal D0 of Layer 1. A second interlayer via, not shown since it is out of the plane of FIG. 48D, may couple the signal D01 of Layer 2 to the signal D1 of Layer 1. As can be seen in FIG. 48D, while Layer 1 may be identical to Layer 2, Layer 2 can be offset by one interlayer via pitch allowing the TSVs to correctly align to each layer while for example, only a single interlayer via mask may make the correct interlayer connections.

As previously discussed, in some embodiments of the present invention it may be desirable for the control logic on each Layer of a 3D IC to know which layer it is in. It may also be desirable to use all of the same masks for each of the Layers. In an embodiment using the one interlayer via pitch offset between layers to correctly couple the functional and repair connections, a different via pattern can be placed in proximity to the control logic to exploit the interlayer offset and uniquely identify each of the layers to its control logic.

Figure 49A:
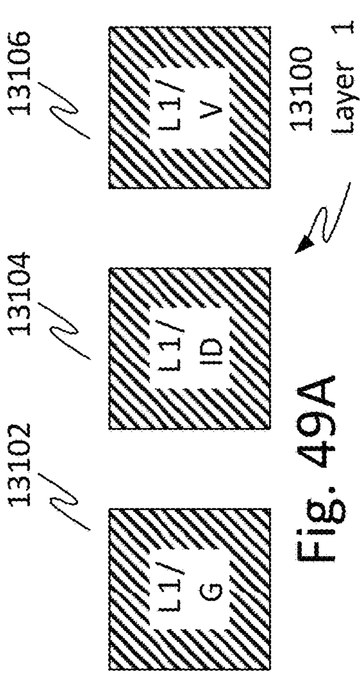
FIG. 49A is an exemplary drawing illustration of a third via metal overlap pattern.

FIG. 49A illustrates a via pattern 13100 which may be constructed on Layer 1 of 3D ICs like 11900, 12100, 12200, 12300, 12400, 12500 and 12600 of U.S. Pat. No. 8,273,610, incorporated herein by reference. At a minimum the metal overlap pad at each via location 13102, 13104, and 13106 may be present on the top and bottom metal layers of Layer 1. Via pattern 13100 may occur in proximity to control logic on Layer 1. Via metal overlap pad 13102 may be coupled to ground (labeled L1/G in the figure for Layer 1 Ground). Via metal overlap pad 13104 may be coupled to a signal named ID (labeled L1/ID in the figure for Layer 1 ID). Via metal overlap pad 13106 may be coupled to the power supply voltage (labeled L1/V in the figure for Layer 1 VCC).

Figure 49B:
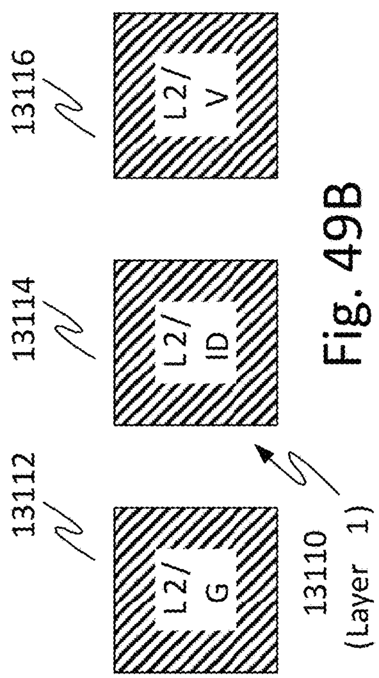
FIG. 49B is an exemplary drawing illustration of a fourth via metal overlap pattern.

FIG. 49B illustrates a via pattern 13110 which may be constructed on Layer 1 of 3D ICs like 11900, 12100, 12200, 12300, 12400, 12500 and 12600 of U.S. Pat. No. 8,273,610, incorporated herein by reference. At a minimum the metal overlap pad at each via location 13112, 13114, and 13116 may be present on the top and bottom metal layers of Layer 2. Via pattern 13110 may occur in proximity to control logic on Layer 2. Via metal overlap pad 13112 may be coupled to ground (labeled L2/G in the figure for Layer 2 Ground). Via metal overlap pad 13114 may be coupled to a signal named ID (labeled L2/ID in the figure for Layer 2 ID). Via metal overlap pad 13116 may be coupled to the power supply voltage (labeled L2/V in the figure for Layer 2 VCC).

Figure 49C:
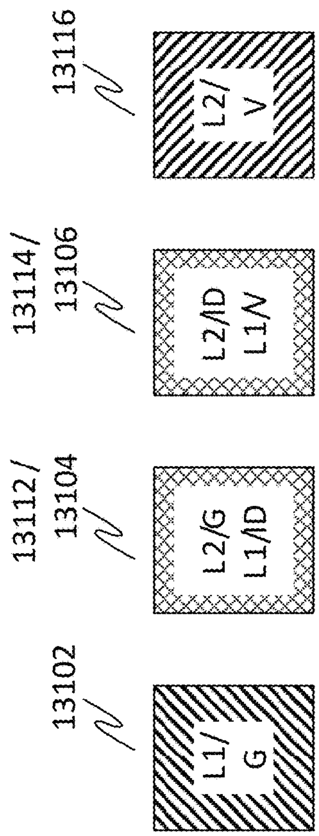
FIG. 49C is an exemplary drawing illustration of the alignment of the via metal overlap patterns of FIG. 49A and FIG. 49B in a 3D IC.

FIG. 49C illustrates a top view where via patterns 13100 and 13110 may be aligned offset by one interlayer interconnection pitch. The interlayer interconnects may be TSVs or some other interlayer interconnect technology. FIG. 48C illustrates via metal overlap pads 13102, 13104, 13106, 13112, 13114, and 13016 as previously discussed. In FIG. 48C, Layer 2 may be offset by one interlayer connection pitch to the right relative to Layer 1. This offset may cause via metal overlap pads 13104 and 13112 to physically overlap with each other. Similarly, this offset may cause via metal overlap pads 13106 and 13114 to physically overlap with each other. If Through Silicon Vias or other interlayer vertical coupling points may be placed at these two overlap locations (using a single mask) then the Layer 1 ID signal may be coupled to ground and the Layer 2 ID signal may be coupled to VCC. This configuration may allow the control logic in Layer 1 and Layer 2 to uniquely know their vertical position in the stack.

Persons of ordinary skill in the art will appreciate that the metal connections between Layer 1 and Layer 2 may typically be much larger including larger pads and numerous TSVs or other interlayer interconnections. This increased size may make alignment of the power supply nodes easy and ensures that L1/V and L2/V may both be at the positive power supply potential and that L1/G and L2/G may both be at ground potential.

Several embodiments of the invention may utilize Triple Modular Redundancy (TMR) distributed over three Layers. In such embodiments it may be desirable to use the same masks for all three Layers.

Figure 50A:
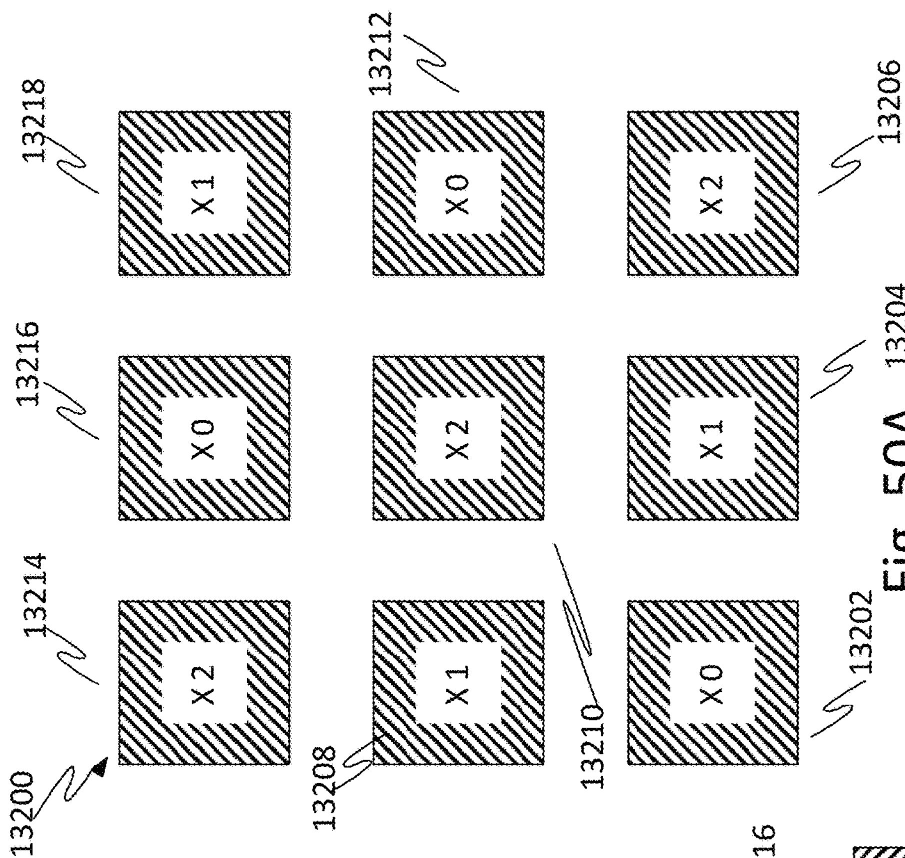
FIG. 50A is an exemplary drawing illustration of a fifth via metal overlap pattern.

FIG. 50A illustrates a via metal overlap pattern 13200 including a 3×3 array of TSVs (or other interlayer coupling technology). The TMR interlayer connections may occur in the proximity of a majority-of-three (MAJ3) gate typically fanning in or out from either a flip-flop or functional block. Thus at each location on each of the three layers, the function f(X0, X1, X2)=MAJ3(X0, X1, X2) may be implemented where X0, X1 and X2 are the three inputs to the MAJ3 gate. For purposes of this discussion, the X0 input may always be coupled to the version of the signal generated on the same layer as the MAJ3 gate and the X1 and X2 inputs come from the other two layers.

In via metal overlap pattern 13200, via metal overlap pads 13202, 13212 and 13216 may be coupled to the X0 input of the MAJ3 gate on that layer, via metal overlap pads 13204, 13208 and 13218 may be coupled to the X1 input of the MAJ3 gate on that layer, and via metal overlap pads 13206, 13210 and 13214 may be coupled to the X2 input of the MAJ3 gate on that layer.

Figure 50B:
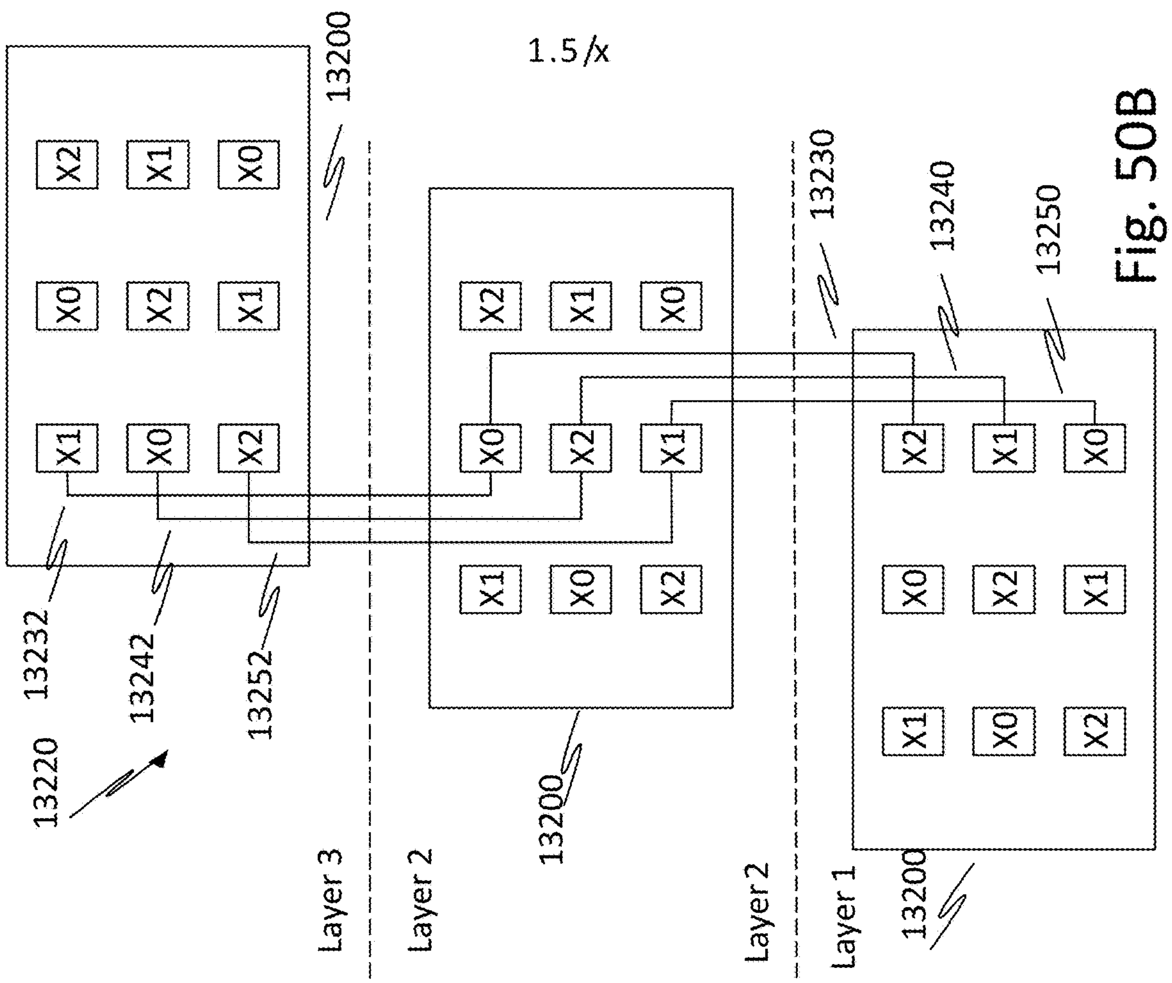
FIG. 50B is an exemplary drawing illustration of the alignment of three instances of the via metal overlap patterns of FIG. 50A in a 3D IC.

FIG. 50B illustrates an exemplary 3D IC generally indicated by 13220 having three Layers labeled Layer 1, Layer 2 and Layer 3 from bottom to top. Each layer may include an instance of via metal overlap pattern 13200 in the proximity of each MAJ3 gate used to implement a TMR related interlayer coupling. Layer 2 may be offset one interlayer via pitch to the right relative to Layer 1 while Layer 3 may be offset one interlayer via pitch to the right relative to Layer 2. The illustration in FIG. 50B may be an abstraction. While it may correctly show the two interlayer via pitch offsets in the horizontal direction, a person of ordinary skill in the art will realize that each row of via metal overlap pads in each instance of via metal overlap pattern 13200 may be horizontally aligned with the same row in the other instances.

Thus there may be three locations where a via metal overlap pad can be aligned on all three layers. FIG. 50B shows three interlayer vias 13230, 13240 and 13250 placed in those locations coupling Layer 1 to Layer 2 and three more interlayer vias 13232, 13242 and 13252 placed in those locations coupling Layer 2 to Layer 3. The same interlayer via mask may be used for both interlayer via fabrication steps.

Thus the interlayer vias 13230 and 13232 may be vertically aligned and couple together the Layer 1 X2 MAJ3 gate input, the Layer 2 X0 MAJ3 gate input, and the Layer 3 X1 MAJ3 gate input. Similarly, the interlayer vias 13240 and 13242 may be vertically aligned and couple together the Layer 1 X1 MAJ3 gate input, the Layer 2 X2 MAJ3 gate input, and the Layer 3 X0 MAJ3 gate input. Finally, the interlayer vias 13250 and 13252 may be vertically aligned and couple together the Layer 1 X0 MAJ3 gate input, the Layer 2 X1 MAJ3 gate input, and the Layer 3 X2 MAJ3 gate input. Since the X0 input of the MAJ3 gate in each layer may be driven from that layer, each driver may be coupled to a different MAJ3 gate input on each layer preventing drivers from being shorted together and the each MAJ3 gate on each layer may receive inputs from each of the three drivers on the three Layers.

Some embodiments of the invention can be applied to a large variety of commercial as well as high-reliability aerospace and military applications. The ability to fix defects in the factory with Repair Layers combined with the ability to automatically fix delayed defects (by masking them with three layer TMR embodiments or replacing faulty circuits with two layer replacement embodiments) may allow the creation of much larger and more complex three dimensional systems than may be possible with conventional two dimensional integrated circuit (IC) technology. These various aspects of the present invention can be traded off against the cost requirements of the target application.

For example, a 3D IC targeted at inexpensive consumer products where cost may be a dominant consideration might do factory repair to maximize yield in the factory but not include any field repair circuitry to minimize costs in products with short useful lifetimes. A 3D IC aimed at higher end consumer or lower end business products might use factory repair combined with two layer field replacement. A 3D IC targeted at enterprise class computing devices which balance cost and reliability might skip doing factory repair and use TMR for both acceptable yields as well as field repair. A 3D IC targeted at high reliability, military, aerospace, space, or radiation-tolerant applications might do factory repair to ensure that all three instances of every circuit may be fully functional and use TMR for field repair as well as SET and SEU filtering. Battery operated devices for the military market might add circuitry to allow the device to operate, for example, only one of the three TMR layers to save battery life and include a radiation detection circuit which automatically switches into TMR mode when needed if the operating environment may change. Many other combinations and tradeoffs may be possible within the scope of the illustrated embodiments of the invention.

It is worth noting that many of the principles of the invention may also applicable to conventional two dimensional integrated circuits (2D ICs). For example, an analogous of the two layer field repair embodiments could be built on a single layer with both versions of the duplicate circuitry on a single 2D IC employing the same cross connections between the duplicate versions. A programmable technology like, for example, fuses, antifuses, flash memory storage, etc., could be used to effect both factory repair and field repair. Similarly, analogous versions of some of the TMR embodiments may have unique topologies in 2D ICs as well as in 3D ICs which may also improve the yield or reliability of2D IC systems if implemented on a single layer.

Some embodiments of the invention may be to use the concepts of repair and redundancy layers to implement extremely large designs that extend beyond the size of a single reticle, up to and inclusive of a full wafer. This concept of Wafer Scale Integration ("WSI") was attempted in the past by companies such as Trilogy Systems and was abandoned because of extremely low yield. The ability of some of the embodiments of the invention is to effect multiple repairs by using a repair layer, or use of masking multiple faults by using redundancy layers, the result may be to make WSI with very high yield a viable option.

One embodiment of the invention may improve WSI by using the Continuous Array (CA) concept described herein this document. In the case of WSI, however, the CA may extend beyond a single reticle and may potentially span the whole wafer. A custom mask may be used to define unused parts of the wafer which may be etched away.

Particular care must be taken when a design such as WSI crosses reticle boundaries. Alignment of features across a reticle boundary may be worse than the alignment of features within the reticle, and WSI designs must accommodate this potential misalignment. One way of addressing this is to use wider than minimum metal lines, with larger than minimum pitches, to cross the reticle boundary, while using a full lithography resolution within the reticle.

Another embodiment of the invention uses custom reticles for location on the wafer, creating a partial of a full custom design across the wafer. As in the previous case, wider lines and coarser line pitches may be used for reticle boundary crossing.

In substantially all WSI embodiments yield-enhancement may be achieved through fault masking techniques such as TMR, or through repair layers, as illustrated in FIG. 24 through FIG. 44 of U.S. patent application Ser. No. 13/098,997. In another variation on the WSI invention one can selectively replace blocks on one layer with blocks on the other layer to provide speed improvement rather than to effect logical repair.

In another variation on the WSI invention one can use vertical stacking techniques as illustrated in FIG. 12A-12E of U.S. patent application Ser. No. 13/098,997 to flexibly provide variable amounts of specialized functions, and IO in particular, to WSI designs.

FIG. 16 is a drawing illustration of a 3D IC system with redundancy. It illustrates a 3D IC programmable system including: first programmable layer 4100 of 3×3 tiles 4102, overlaid by second programmable layer 4110 of 3×3 tiles 4112, overlaid by third programmable layer 4120 of 3×3 tiles 4122. Between a tile and its neighbor tile in the layer there may be many programmable connections 4104. The programmable element 4106 could include, for example, antifuse, pass transistor controlled driver, floating gate flash transistor, or similar electrically programmable element. An example of a commercial anti-fuse may be the oxide fuse of Kilopass Technology. Each inter-tile connection 4104 may have a branch out programmable connection 4105 connected to inter-layer vertical connection 4140. The end product may be designed so that at least one layer such as second programmable layer 4110 can be left for redundancy.

When the end product programmable system may be programmed for the end application, each tile can run its own Built-in Test, for example, by using its own MCU. A tile detected to have a defect may be replaced by the tile in the redundancy layer, such as second programmable layer 4110. The replacement may be done by the tile that may be at the same location but in the redundancy layer and therefore it may have an acceptable impact on the overall product functionality and performance. For example, if tile (1,0,0) has a defect then tile (1,0,1) may be programmed to have exactly the same function and may replace tile (1,0,0) by properly setting the inter tile programmable connections. Therefore, if defective tile (1,0,0) was supposed to be connected to tile (2,0,0) by connection 4104 with programmable element 4106, then programmable element 4106 may be turned off and programmable elements 4116, 4117, 4107 will be turned on instead. A similar multilayer connection structure may be used for any connection in or out of a repeating tile. So if the tile has a defect, the redundant tile of the redundant layer may be programmed to the defected tile functionality and the multilayer inter tile structure may be activated to disconnect the faulty tile and connect the redundant tile. The inter layer vertical connection 4140 could be also used when tile (2,0,0) is defective to insert tile (2,0,1), of the redundant layer, instead. In such case (2,0,1) may be programmed to have exactly the same function as tile (2,0,0), programmable element 4108 may be turned off and programmable elements 4118, 4117, 4107 may be turned on instead. This testing could be done from off chip rather than a BIST MCU.

An additional embodiment of the invention may be a modified TSV (Through Silicon Via) flow. This flow may be for wafer-to-wafer TSV and may provide a technique whereby the thickness of the added wafer may be reduced to about 1 micrometer (micron). FIG. 34A to FIG. 34D illustrate such a technique. The first wafer 9302 may be the base on top of which the 'hybrid' 3D structure may be built. A second wafer top substrate wafer 9304 may be bonded on top of the first wafer 9302. The new top wafer may be face-down so that the electrical circuits 9305 may be face-to-face with the first wafer 9302 circuits 9303.

The bond may be oxide-to-oxide in some applications or copper-to-copper in other applications. In addition, the bond may be by a hybrid bond wherein some of the bonding surface may be oxide and some may be copper.

Figure 34B:
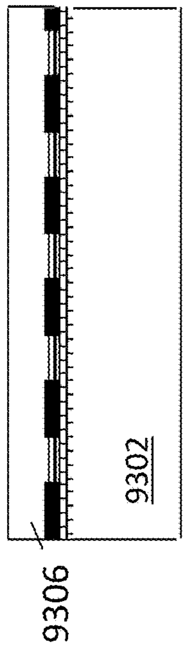
FIG. 34A-FIG. 34D are exemplary drawing illustrations of an advanced TSV flow.

After bonding, the top substrate wafer 9304 may be thinned down to about 60 micron in a conventional back-lap and CMP process. FIG. 34B illustrates the now thinned top wafer 9306 bonded to the first wafer 9302.

The next step may include a high accuracy measurement of the top wafer 9306 thickness. Then, using a high power 1-4 MeV H+ implant, a cleave plane 9310 may be defined in the top wafer 9306. The cleave plane 9310 may be positioned about 1 micron above the bond surface as illustrated in FIG. 34C. This process may be performed with a special high power implanter such as, for example, the implanter used by SiGen Corporation for their PV (Photo-Voltaic) application.

Figure 34D:
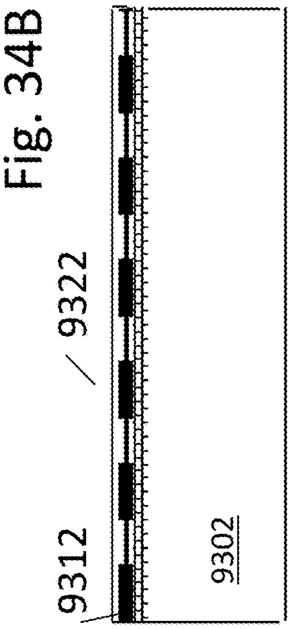
Figure 34A:
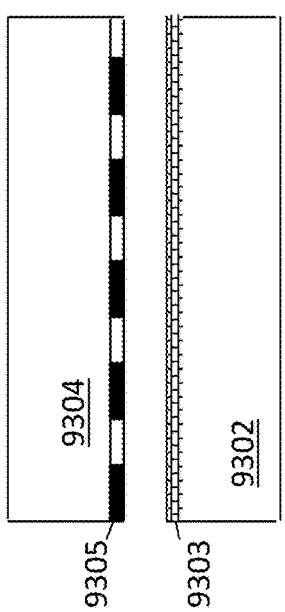
Figure 34C:
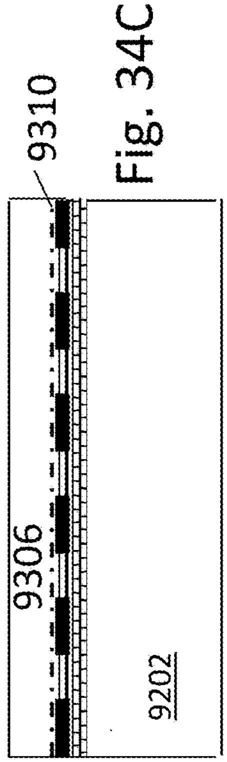

Having the accurate measure of the top wafer 9306 thickness and the highly controlled implant process may enable cleaving most of the top wafer 9306 out thereby leaving a very thin layer 9312 of about 1 micron, bonded on top of the first wafer 9302 as illustrated in FIG. 34D.

An advantage of this process flow may be that an additional wafer with circuits could now be placed and bonded on top of the bonded structure 9322 in a similar manner. But first a connection layer may be built on the back of thin layer 9312 to allow electrical connection to the bonded structure 9322 circuits. Having the top layer thinned to a single micron level may allow such electrical connection metal layers to be fully aligned to the top wafer thin layer 9312 electrical circuits 9305 and may allow the vias through the back side of top thin layer 9312 to be relatively small, of about 100 nm in diameter.

The thinness of the top thin layer 9312 may enable the modified TSV to be at the level of 100 nm vs. the 5 microns necessary for TSVs that need to go through 50 microns of silicon. Unfortunately the misalignment of the wafer-to-wafer bonding process may still be quite significant at about +/−0.5 micron. Accordingly, as described elsewhere in this document in relation to FIG. 75, a landing pad of about lxi microns may be used on the top of the first wafer 9302 to connect with a small metal contact on the face of the top substrate wafer 9304 while using copper-to-copper bonding. This process may represent a connection density of about 1 connection per 1 square micron.

Figure 80:
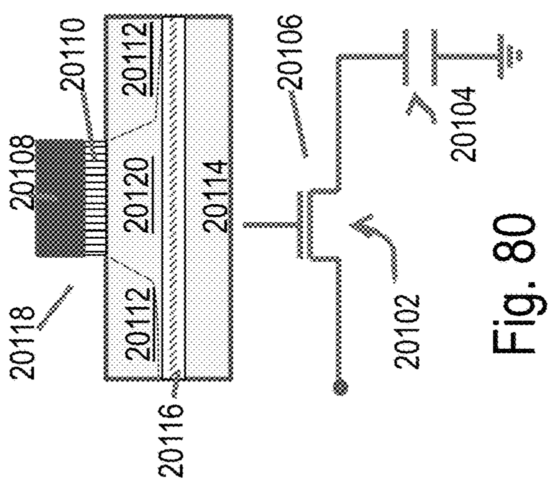
FIG. 80 illustrates a capacitor-based DRAM cell and capacitor-less floating-body RAM cell.

It may be desirable to increase the connection density using a concept as illustrated in FIG. 80 of U.S. Pat. No. 8,273,610, incorporated herein by reference, and the associated explanations. In the modified TSV case, it may be much more challenging to do so because the two wafers being bonded may be fully processed and once bonded, only very limited access to the landing strips may be available. However, to construct a via, etching through all layers may be needed. FIG. 35 illustrates a method and structures to address these issues.

Figure 35A:
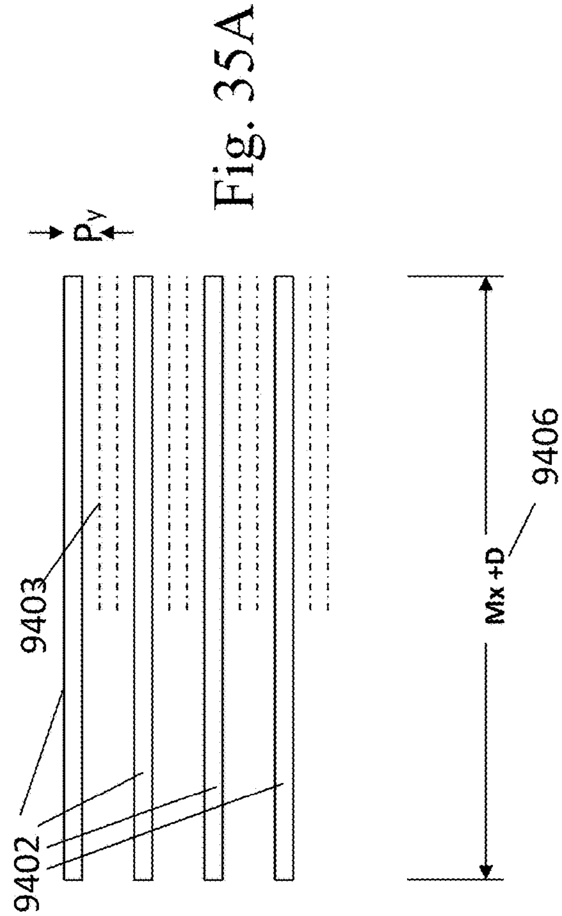
FIG. 35A-FIG. 35C are exemplary drawing illustrations of an advanced TSV multi-connections flow.

FIG. 35A illustrates four metal landing strips 9402 exposed at the upper layer of the first wafer 9302. The landing strips 9402 may be oriented East-West at a length 9406 of the maximum East-West bonding misalignment Mx plus a delta D, which will be explained later. The pitch of the landing strip may be twice the minimum pitch Py of this upper layer of the first wafer 9302. 9403 may indicate an unused potential room for an additional metal strip.

Figure 35C:
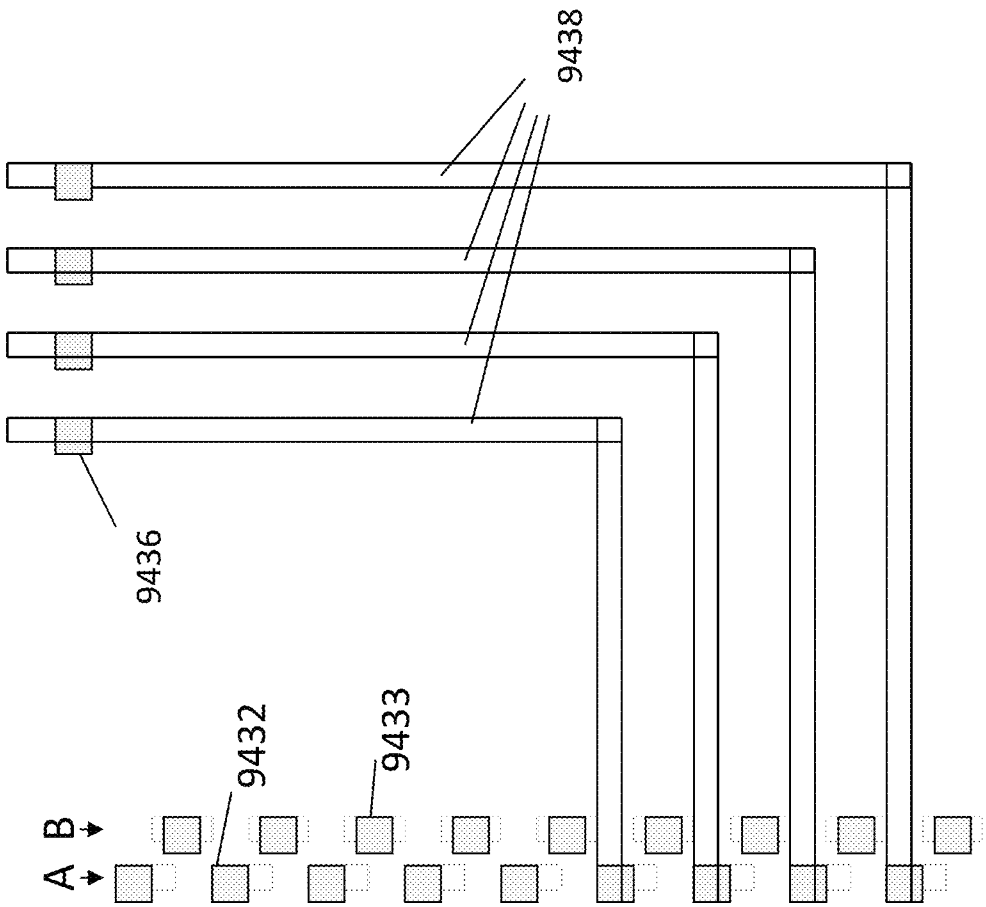
Figure 35B:
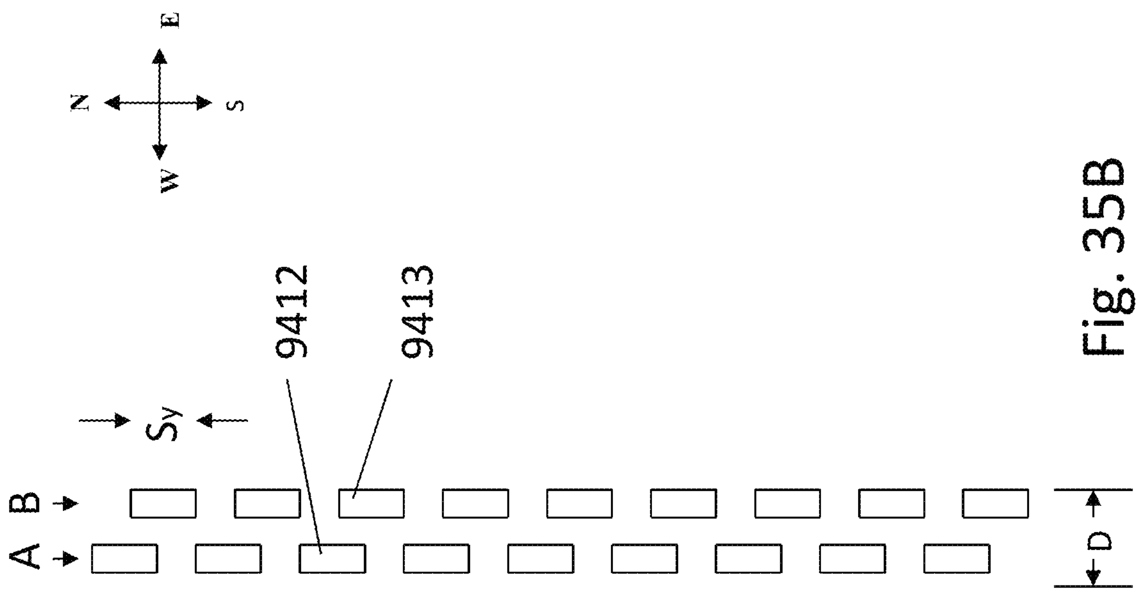

FIG. 35B illustrates landing strips 9412, 9413 exposed at the top of the second wafer thin layer 9312. FIG. 35B also shows two columns of landing strips, namely, A and B going North to South. The length of these landing strips may be 1.25 Py. The two wafers 9302 and top wafer thin layer 9312 may be bonded copper-to-copper and the landing strips of FIG. 35A and FIG. 35B may be designed so that the bonding misalignment does not exceed the maximum misalignment Mx in the East-West direction and My in the North-South direction. The landing strips 9412 and 9413 of FIG. 35B may be designed so that they may never unintentionally short to landing strips 9402 of 94A and that either row A landing strips 9412 or row B landing strips 9413 may achieve full contact with landing strips 9402. The delta D may be the size from the East edge of landing strips 9413 of row B to the West edge of A landing strips 9412. The number of landing strips 9412 and 9413 of FIG. 35B may be designed to cover the FIG. 35A landing strips 9402 plus My to cover maximum misalignment error in the North-South direction.

Substantially all the landing strips 9412 and 9413 of FIG. 35B may be routed by the internal routing of the top wafer thin layer 9312 to the bottom of the wafer next to the transistor layers. The location on the bottom of the wafer is illustrated in FIG. 34D as the upper side of the 9322 structure. Now new vias 9432 may be formed to connect the landing strips to the top surface of the bonded structure using conventional wafer processing steps. FIG. 35C illustrates all the via connections routed to the landing strips of FIG. 35B, arranged in row A 9432 and row B 9433. In addition, the vias 9436 for bringing in the signals may also be processed. All these vias may be aligned to the top wafer thin layer 9312.

As illustrated in FIG. 35C, a metal mask may now be used to connect, for example, four of the vias 9432 and 9433 to the four vias 9436 using metal strips 9438. This metal mask may be aligned to the top wafer thin layer 9312 in the East-West direction. This metal mask may also be aligned to the top wafer thin layer 9312 in the North-South direction but with a special offset that is based on the bonding misalignment in the North-South direction. The length of the metal structure metal strips 9438 in the North South direction may be enough to cover the worst case North-South direction bonding misalignment.

It should be stated again that embodiments of the invention could be applied to many applications other than programmable logic such a Graphics Processor which may include many repeating processing units. Other applications might include general logic design in 3D ASICs (Application Specific Integrated Circuits) or systems combining ASIC layers with layers comprising at least in part other special functions. Persons of ordinary skill in the art will appreciate that many more embodiments and combinations are possible by employing the inventive principles contained herein and such embodiments will readily suggest themselves to such skilled persons. Thus the invention is not to be limited in any way except by the appended claims.

Yet another alternative to implement 3D redundancy to improve yield by replacing a defective circuit may be by the use of Direct Write E-beam instead of a programmable connection.

An additional variation of the programmable 3D system may comprise a tiled array of programmable logic tiles connected with I/O structures that may be pre-fabricated on the base wafer 1402 of FIG. 4.

Additional flexibility and reuse of masks may be achieved by utilizing, for example, only a portion of the full reticle exposure. Modern steppers may allow covering portions of the reticle and hence projecting only a portion of the reticle. Accordingly a portion of a mask set may be used for one function while another portion of that same mask set would be used for another function. For example, let the structure of FIG. 13 represent the logic portion of the end device of a 3D programmable system. On top of that 3×3 programmable tile structure I/O structures could be built utilizing process techniques according to, for example, FIG. 22 or FIG. 11. There may be a set of masks where various portions may provide for the overlay of different I/O structures, for example, one portion including simple I/Os, and another of Serializer/Deserializer (Ser/Des) I/Os. Each set may be designed to provide tiles of I/O that substantially perfectly overlay the programmable logic tiles. Then out of these two portions on one mask set, multiple variations of end systems could be produced, including one with all nine tiles as simple I/Os, another with SerDes overlaying tile (0,0) while simple I/Os may be overlaying the other eight tiles, another with SerDes overlaying tiles (0,0), (0,1) and (0,2) while simple I/Os may be overlaying the other 6 tiles, and so forth.

In fact, if properly designed, multiples of layers could be fabricated one on top of the other offering a large variety of end products from a limited set of masks. Persons of ordinary skill in the art will appreciate that this technique can have applicability beyond programmable logic and may profitably be employed in the construction of many 3D ICs and 3D systems. Thus the scope of the invention is only to be limited by the appended claims.

In yet an additional alternative illustrative embodiment of the invention, the 3D antifuse Configurable System, may also include a Programming Die. In some cases of FPGA products, and primarily in antifuse-based products, there may be an external apparatus that may be used for the programming the device. In many cases it may be a user convenience to integrate this programming function into the FPGA device. This may result in a significant die overhead as the programming process may need higher voltages as well as control logic. The programmer function could be designed into a dedicated Programming Die. Such a Programmer Die could include the charge pump, to generate the higher programming voltage, and a controller with the associated programming to program the antifuse configurable dies within the 3D Configurable circuits, and the programming check circuits. The Programming Die might be fabricated using a lower cost older semiconductor process. An additional advantage of this 3D architecture of the Configurable System may be a high volume cost reduction option wherein the antifuse layer may be replaced with a custom layer and, therefore, the Programming Die could be removed from the 3D system for a more cost effective high volume production.

It will be appreciated by persons of ordinary skill in the art, that some embodiments of the invention may be using the term antifuse as used as the common name in the industry, but it may also refer, according to some embodiments, to any micro element that functions like a switch, meaning a micro element that initially may have highly resistive-OFF state, and electronically it could be made to switch to a very low resistance—ON state. It could also correspond to a device to switch ON-OFF multiple times—a re-programmable switch. As an example there may be new technologies being developed, such as the electro-statically actuated Metal-Droplet micro-switch introduced by C. J. Kim of UCLA micro & nano manufacturing lab, which may be compatible for integration onto CMOS chips.

It will be appreciated by persons skilled in the art that the present invention may not be limited to antifuse configurable logic and it can be applicable to other non-volatile configurable logic. An example for such application is the Flash based configurable logic. Flash programming may also need higher voltages, and having the programming transistors and the programming circuits in the base diffusion layer may reduce the overall density of the base diffusion layer. Using various illustrative embodiments of the invention may be useful and could allow a higher device density. It may therefore be suggested to build the programming transistors and the programming circuits, not as part of the diffusion layer, but according to one or more illustrative embodiments of the invention. In high volume production, one or more custom masks could be used to replace the function of the Flash programming and accordingly may save the need to add on the programming transistors and the programming circuits.

Unlike metal-to-metal antifuses that could be placed as part of the metal interconnection, Flash circuits may need to be fabricated in the base diffusion layers. As such it might be less efficient to have the programming transistor in a layer far above. An illustrative alternative embodiment of the invention may be to use Through-Silicon-Via 816 to connect the configurable logic device and its Flash devices to an underlying structure of Foundation layer 814 including the programming transistors.

In this document, various terms may have been used while generally referring to the element. For example, "house" may refer to the first mono-crystalline layer with its transistors and metal interconnection layer or layers. This first mono-crystalline layer may have also been referred to as the main wafer and sometimes as the acceptor wafer and sometimes as the base wafer.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems, such as, for example, mobile phones, smart phone, and cameras. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862, filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefitted by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the 12/903,862 application would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefitted from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array base ICs with reduced custom masks as described previously. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. There may be many ways to mix the many innovative elements to form 3D IC to support the need of an end system, including using multiple devices wherein more than one device incorporates elements of embodiments of the invention. An end system could benefit from a memory device utilizing embodiments of the invention 3D memory integrated together with a high performance 3D FPGA integrated together with high density 3D logic, and so forth. Using devices that can use one or multiple elements according to some embodiments of the invention may allow for better performance or lower power and other illustrative advantages resulting from the use of some embodiments of the invention to provide the end system with a competitive edge. Such end system could be electronic based products or other types of systems that may include some level of embedded electronics, such as, for example, cars, and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superhetrodyne techniques. In a superhetrodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

Figure 63:
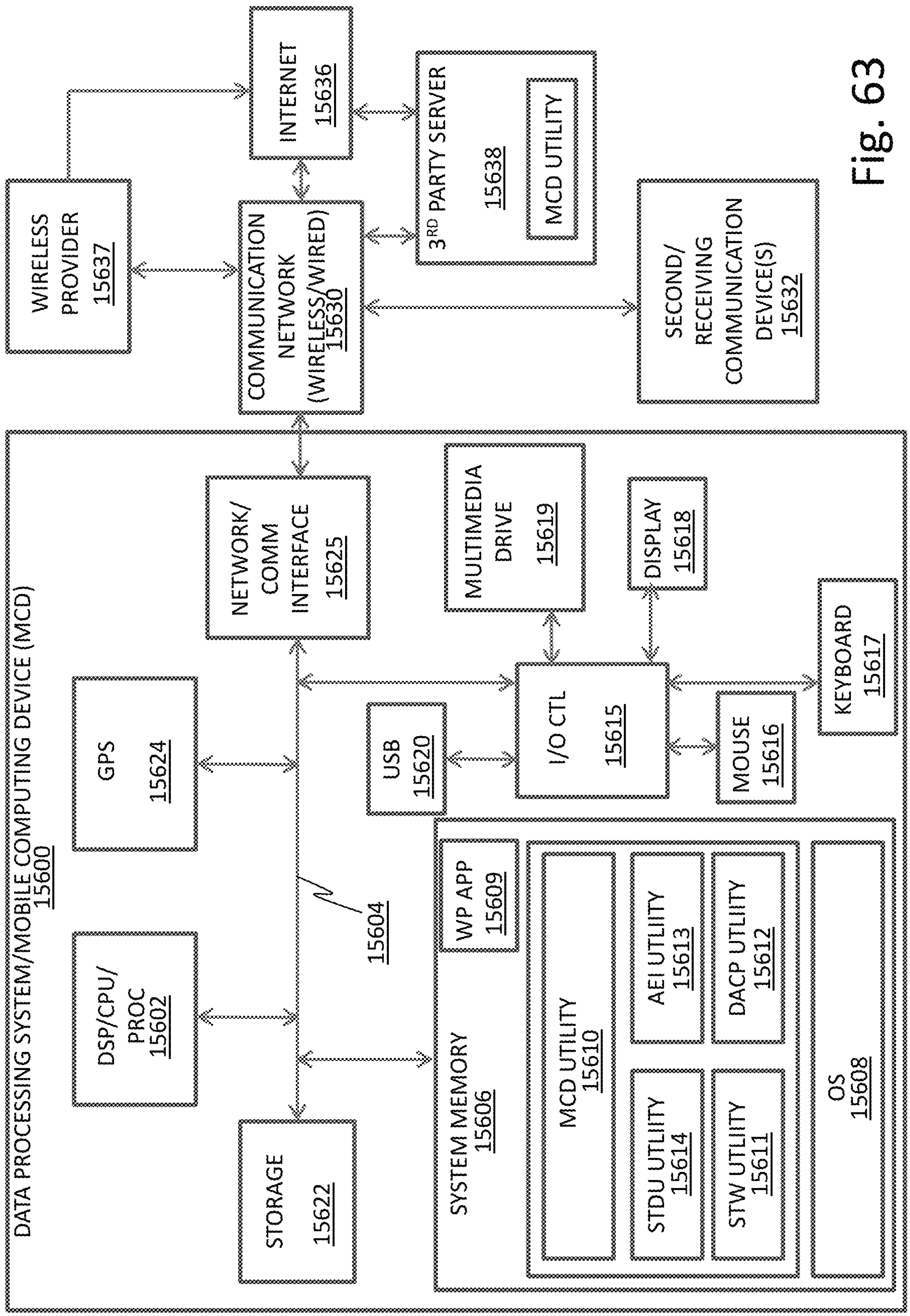
FIG. 63 is a drawing illustration of a block diagram representation of an exemplary mobile computing device.

A block diagram representation of an exemplary mobile computing device (MCD) is illustrated in FIG. 63, within which several of the features of the described embodiments may be implemented. MCD 15600 may be a desktop computer, a portable computing device, such as a laptop, personal digital assistant (PDA), a smart phone, and/or other types of electronic devices that may generally be considered processing devices. As illustrated, MCD 15600 may include at least one processor or central processing unit (CPU) 15602 which may be connected to system memory 15606 via system interconnect/bus 15604. CPU 15602 may include at least one digital signal processing unit (DSP). Also connected to system interconnect/bus 15604 may be input/output (I/O) controller 15615, which may provide connectivity and control for input devices, of which pointing device (or mouse) 15616 and keyboard 15617 are illustrated. I/O controller 15615 may also provide connectivity and control for output devices, of which display 15618 is illustrated. Additionally, a multimedia drive 15619 (e.g., compact disk read/write (CDRW) or digital video disk (DVD) drive) and USB (universal serial bus) port 15620 are illustrated, and may be coupled to I/O controller 15615. Multimedia drive 15619 and USB port 15620 may enable insertion of a removable storage device (e.g., optical disk or "thumb" drive) on which data/instructions/code may be stored and/or from which data/instructions/code may be retrieved. MCD 15600 may also include storage 15622, within/from which data/instructions/code may also be stored/retrieved. MCD 15600 may further include a global positioning system (GPS) or local position system (LPS) detection component 15624 by which MCD 15600 may be able to detect its current location (e.g., a geographical position) and movement of MCD 15600, in real time. MCD 15600 may include a network/communication interface 15625, by which MCD 15600 may connect to one or more second communication devices 15632 or to wireless service provider server 15637, or to a third party server 15638 via one or more access/external communication networks, of which a wireless Communication Network 15630 is provided as one example and the Internet 15636 is provided as a second example. It is appreciated that MCD 15600 may connect to third party server 15638 through an initial connection with Communication Network 15630, which in turn may connect to third party server 15638 via the Internet 15636.

In addition to the above described hardware components of MCD 15600, various features of the described embodiments may be completed/supported via software (or firmware) code or logic stored within system memory 15606 or other storage (e.g., storage 15622) and may be executed by CPU 15602. Thus, for example, illustrated within system memory 15606 are a number of software/firmware/logic components, including operating system (OS) 15608 (e.g., Microsoft Windows® or Windows Mobile®, trademarks of Microsoft Corp, or GNU®/Linux®, registered trademarks of the Free Software Foundation and The Linux Mark Institute, and AIX®, registered trademark of International Business Machines), and word processing and/or other application(s) 15609. Also illustrated are a plurality (four illustrated) software implemented utilities, each providing different one of the various functions (or advanced features) described herein. Including within these various functional utilities are: Simultaneous Text Waiting (STW) utility 15611, Dynamic Area Code Pre-pending (DACP) utility 15612, Advanced Editing and Interfacing (AEI) utility 15613 and Safe Texting Device Usage (STDU) utility 15614. In actual implementation and for simplicity in the following descriptions, each of these different functional utilities are assumed to be packaged together as sub-components of a general MCD utility 15610, and the various utilities are interchangeably referred to as MCD utility 15610 when describing the utilities within the figures and claims. For simplicity, the following description will refer to a single utility, namely MCD utility 15610. MCD utility 15610 may, in some embodiments, be combined with one or more other software modules, including for example, word processing application(s) 15609 and/or OS 15608 to provide a single executable component, which then may provide the collective functions of each individual software component when the corresponding combined code of the single executable component is executed by CPU 15602. Each separate utility 111/112/113/114 is illustrated and described as a standalone or separate software/firmware component/module, which provides specific functions, as described below. As a standalone component/module, MCD utility 15610 may be acquired as an off-the-shelf or after-market or downloadable enhancement to existing program applications or device functions, such as voice call waiting functionality (not shown) and user interactive applications with editable content, such as, for example, an application within the Windows Mobile® suite of applications. In at least one implementation, MCD utility 15610 may be downloaded from a server or website of a wireless provider (e.g., wireless provider server 15637) or a third party server 15638, and either installed on MCD 15600 or executed from the wireless provider server 15637 or third party server 156138.

CPU 15602 may execute MCD utility 15610 as well as OS 15608, which, in one embodiment, may support the user interface features of MCD utility 15610, such as generation of a graphical user interface (GUI), where required/supported within MCD utility code. In several of the described embodiments, MCD utility 15610 may generate/provide one or more GUIs to enable user interaction with, or manipulation of, functional features of MCD utility 15610 and/or of MCD 15600. MCD utility 15610 may, in certain embodiments, enable certain hardware and firmware functions and may thus be generally referred to as MCD logic.

Some of the functions supported and/or provided by MCD utility 15610 may be enabled as processing code/instructions/logic executing on DSP/CPU 15602 and/or other device hardware, and the processor thus may complete the implementation of those function(s). Among, for example, the software code/instructions/logic provided by MCD utility 15610, and which are specific to some of the described embodiments of the invention, may be code/logic for performing several (one or a plurality) of the following functions: (1) Simultaneous texting during ongoing voice communication providing a text waiting mode for both single number mobile communication devices and multiple number mobile communication devices; (2) Dynamic area code determination and automatic back-filling of area codes when a requested/desired voice or text communication is initiated without the area code while the mobile communication device is outside of its home-base area code toll area; (3) Enhanced editing functionality for applications on mobile computing devices; (4) Automatic toggle from manual texting mode to voice-to-text based communication mode on detection of high velocity movement of the mobile communication device; and (5) Enhanced e-mail notification system providing advanced e-mail notification via (sender or recipient directed) texting to a mobile communication device.

Utilizing monolithic 3D IC technology described herein and in related application Ser. Nos. 12/903,862, 12/903,847, 12/904,103 and 13/041,405 significant power and cost could be saved. Most of the elements in MCD 15600 could be integrated in one 3D IC. Some of the MCD 15600 elements may be logic functions which could utilize monolithic 3D transistors such as, for example, RCAT or Gate-Last. Some of the MCD 15600 elements are storage devices and could be integrated on a 3D non-volatile memory device, such as, for example, 3D NAND or 3D RRAM, or volatile memory such as, for example, 3D DRAM or SRAM formed from RCAT or gate-last transistors, as been described herein. Storage 15622 elements formed in monolithic 3D could be integrated on top or under a logic layer to reduce power and space. Keyboard 15617 could be integrated as a touch screen or combination of image sensor and some light projection and could utilize structures described in some of the above mentioned related applications. The Network Comm Interface 15625 could utilize another layer of silicon optimized for RF and gigahertz speed analog circuits or even may be integrated on substrates, such as GaN, that may be a better fit for such circuits. As more and more transistors might be integrated to achieve a high complexity 3D IC system there might be a need to use some embodiments of the invention such as what were called repair and redundancy so to achieve good product yield.

Some of the system elements including non-mobile elements, such as the 3rd Party Server 15638, might also make use of some embodiments of the 3D IC inventions including repair and redundancy to achieve good product yield for high complexity and large integration. Such large integration may reduce power and cost of the end product which is most attractive and most desired by the system end-use customers.

Some embodiments of the 3D IC invention could be used to integrate many of the MCD 15600 blocks or elements into one or a few devices. As various blocks get tightly integrated, much of the power required to transfer signals between these elements may be reduced and similarly costs associated with these connections may be saved. Form factor may be compacted as the space associated with the individual substrate and the associated connections may be reduced by use of some embodiments of the 3D IC invention. For mobile device these may be very important competitive advantages. Some of these blocks might be better processed in different process flow or wafer fab location. For example the DSP/CPU 15602 is a logic function that might use a logic process flow while the storage 15622 might better be done using a NAND Flash technology process flow or wafer fab. An important advantage of some of the embodiments of the monolithic 3D inventions may be to allow some of the layers in the 3D structure to be processed using a logic process flow while another layer in the 3D structure might utilize a memory process flow, and then some other function the modems of the GPS 15624 might use a high speed analog process flow or wafer fab. As those diverse functions may be structured in one device onto many different layers, these diverse functions could be very effectively and densely vertically interconnected.

Some embodiments of the invention may include alternative techniques to build IC (Integrated Circuit) devices including techniques and methods to construct 3D IC systems. Some embodiments of the invention may enable device solutions with far less power consumption than prior art, or with more functionality in a smaller physical footprint. These device solutions could be very useful for the growing application of Autonomous in vivo Electronic Medical (AEM) devices and AEM systems such as ingestible "camera pills," implantable insulin dispensers, implantable heart monitoring and stimulating devices, and the like. One such ingestible "camera pill" is the Philips' remote control "iPill". For example, incorporating the 3D IC semiconductor devices according to some embodiments of the invention within these AEM devices and systems could provide superior autonomous units that could operate much more effectively and for a much longer time than with prior art technology. Sophisticated AEM systems may be greatly enhanced by complex electronics with limited power budget. The 3D technology described in many of the embodiments of the invention would allow the construction of a low power high complexity AEM system. For example it would be possible to integrate into a small form function a complex logic circuit with high density high speed memory utilizing some of the 3D DRAM embodiments herein and to add some non-volatile 3D NAND charge trap or RRAM described in embodiments herein. Also in another application 12/903,862 filled by some of the inventors and assigned to the same assignee a 3D micro display and a 3D image sensor are presented. Integrating one or both to complex logic and or memory could be very effective for retinal implants. Additional AEM systems could be customized to some specific market applications. Utilizing 3D programmable logic or 3D gate array as has been described in some embodiments herein could be very effective. The need to reduce power to allow effective use of battery and also the light weight and small form factor derived by highly integrating functions with low waste of interconnect and substrate could benefit from the redundancy and repair idea of the 3D monolithic technology as has been presented in some of the inventive embodiments herein. This unique technology could enable disposable AEM devices that would be at a lower cost to produce and/or would require lower power to operate and/or would require lower size and/or lighter to carry and combination of these features to form a competitive or desirable AEM system.

3D ICs according to some embodiments of the invention could also enable electronic and semiconductor devices with a much higher performance due to the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These advantages could lead to more powerful computer systems and improved systems that have embedded computers.

Some embodiments of the invention may also enable the design of state of the art AEM systems at a greatly reduced non– recurring engineering (NRE) cost by the use of high density 3D FPGAs or various forms of 3D array based ICs with reduced custom masks as described in some inventive embodiments herein. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic masks for layers of memories and building a very complex system using the repair technology to overcome the inherent yield limitation. Another form of mix could be building a 3D FPGA and add on it 3D layers of customizable logic and memory resulting in an end system that may have field programmable logic on top of the factory customized logic. There may be many ways to mix the many innovative elements herein to form a 3D IC to support the needs of an end system, including using multiple devices wherein more than one device incorporates elements of embodiments of the invention. An end system could benefit from memory devices utilizing embodiments of the invention of 3D memory together with high performance 3D FPGA together with high density 3D logic and so forth. Using devices that can use one or multiple elements according to some embodiments of the invention may allow for better performance or lower power and other illustrative advantages resulting from the use of some embodiments of the invention to provide the end system with a competitive edge. Such end system could be electronic based products or other types of medical systems that may include some level of embedded electronics, such as, for example, AEM devices that combine multi-function monitoring, multi drug dispensing, sophisticated power-saving telemetrics for communication, monitoring and control, etc.

AEM devices have been in use since the 1980s and have become part of our lives, moderating illnesses and prolonging life. A typical AEM system may include a logic processor, signal processor, volatile and non-volatile memory, specialized chemical, optical, and other sensors, specialized drug reservoirs and release mechanisms, specialized electrical excitation mechanisms, and radio frequency (RF) or acoustic receivers/transmitters. It may also include additional electronic and non-electronic sub-systems that may require additional processing resources to monitor and control, such as propulsion systems, immobilization systems, heating, ablation, etc.

Prior art such as U.S. Pat. No. 7,567,841 or U.S. Pat. No. 7,365,594 provide example descriptions of such autonomous in-vivo electronic medical devices and systems. It is understood that the use of specific component, device and/or parameter names described herein are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following are generally defined:

AEM device: An Autonomous in-vivo Electronic Medical (AEM) device 19100, illustrated in FIG. 74, may include a sensing subsystem 19150, a processor 19102, a communication controller 19120, an antenna subsystem 19124, and a power subsystem 19170, all within a biologically-benign encapsulation 19101. Other subsystems an AEM may include some or all of therapy subsystem 19160, propulsion subsystem 19130, immobilization system 19132, an identifier element (ID) 19122 that uniquely identifies every instance of an AEM device, one or more signal processors 19104, program memory 19110, data memory 19112 and non-volatile storage 19114.

Figure 74:
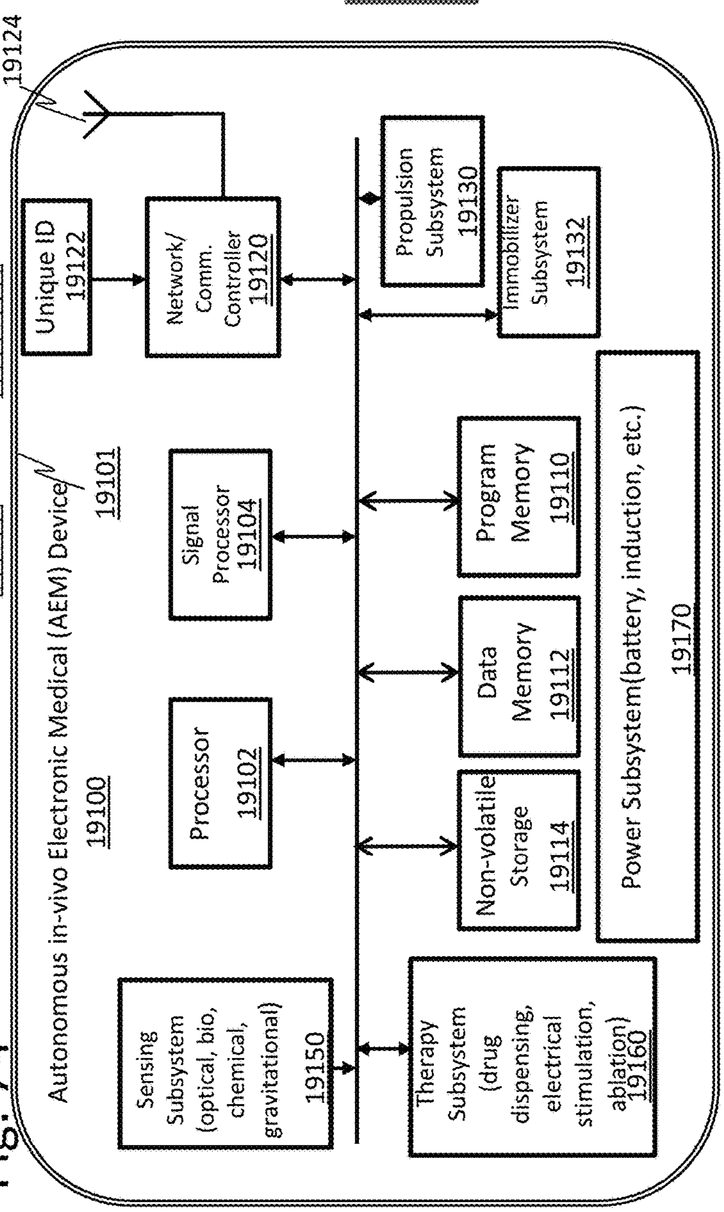
FIG. 74 is an exemplary block diagram representation of an exemplary Autonomous in-vivo Electronic Medical device.

The sensing subsystem 19150 may include one or more of optical sensors, imaging cameras, biological or chemical sensors, as well as gravitational or magnetic ones. The therapy subsystem 19160 may include one or more of drug reservoirs, drug dispensers, drug refill ports, electrical or magnetic stimulation circuitry, and ablation tools. The power subsystem 19170 may include a battery and/or an RF induction pickup circuitry that allows remote powering and recharge of the AEM device. The antenna subsystem 19124 may include one or more antennae, operating either as an array or individually for distinct functions. The unique ID 191222 can operate through the communication controller 19120 as illustrated in FIG. 74, or independently as an RFID tag.

In addition to the above described hardware components of AEM device 19100, various features of the described embodiments may be completed/supported via software (or firmware) code or logic stored within program memory 19110 or other storage (e.g., data memory 19112) and executed by processor 19102 and signal processors 19104. Such software may be custom written for the device, or may include standard software components that are commercially available from software vendors.

One example of AEM device is a so-called "camera pill" that may be ingested by the patient and capture images of the digestive tract as it is traversed, and transmits the images to external equipment. Because such traversal may take an hour or more, a large number of images may need to be transmitted, possibly depleting its power source before the traversal through the digestive tract is completed. The ability to autonomously perform high quality image comparison and transmit only images with significant changes is important, yet often limited by the compute resources on-board the AEM device.

Another example of an AEM device is a retinal implant, which may have severe size limitations in order to minimize the device's interference with vision. Similarly, cochlear implants may also impose strict size limitations. Those size limitations may impose severe constraints on the computing power and functionality available to the AEM device.

Many AEM devices may be implanted within the body through surgical procedures, and replacing their power supply may require surgical intervention. There is a strong interest in extending the battery life as much as possible through lowering the power consumption of the AEM device.

Utilizing monolithic 3D IC technology described here and in related application Ser. Nos. 12/903,862, 12/903,847, 12/904,103 13/098,997, and 13/041,405 significant power, physical footprint, and cost could be saved. Many of the elements in AEM device 19100 could be integrated in one 3D IC. Some of these elements are mostly logic functions which could use, for example, RCAT transistors or Gate-Last transistors. Some of the AEM device 19100 elements may be storage devices and could be integrated on another 3D non-volatile memory device, such as, for example, 3D NAND as has been described herein. Alternatively the storage elements, for example, program memory 19110, data memory 19112 and non-volatile storage 19114, could be integrated on top of or under a logic layer or layers to reduce power and space. Communication controller 19120 could similarly utilize another layer of silicon optimized for RF. Specialized sensors can be integrated on substrates, such as InP or Ge, that may be a better fit for such devices. As more and more transistors might be integrated into high complexity 3D IC systems there might be a need to use elements of the inventions such as what are described herein as repair and redundancy methods and techniques to achieve good product yield.

Some of the external systems communication with AEM devices might also make use of some embodiments of the 3D IC invention including repair and redundancy to achieve good product yield for high complexity and large integration. Such large integration may reduce power and cost of the end product which may be attractive to end customers.

The 3D IC invention could be used to integrate many of these blocks into one or multiple devices. As various blocks get tightly integrated much of the power required to communicate between these elements may be reduced, and similarly, costs associated with these connections may be saved, as well as the space associated with the individual substrate and the associated connections. For AEM devices these may be very important competitive advantages. Some of these blocks might be better processed in a different process flow and or with a different substrate. For example, processor 19102 is a logic function that might use a logic process flow while the non-volatile storage 19114 might better be done using NAND Flash technology. An important advantage of some of the monolithic 3D embodiments of the invention may be to allow some of the layers in the 3D structure to be processed using a logic process flow while others might utilize a memory process flow, and then some other function such as, for example, the communication controller 19120 might use a high speed analog flow. Additionally, as those functions may be structured in one device on different layers, they could be very effectively be vertically interconnected.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm, employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr_024377. To achieve the lowest nickel silicide contact and source/drain resistances, the nickel on silicon can be heated to about 450° C.

Thus it may be desirable to enable low resistances for process flows in this document where the post layer transfer temperature exposures may remain under about 400° C. due to metallization, such as, for example, copper and aluminum, and low-k dielectrics being present.

For junction-less transistors (JLTs), in particular, forming contacts can be a challenge. This may be because the doping of JLTs should be kept low (below about $0.5\text{-}5\times10^{19}/\text{cm}^3$ or so) to enable good transistor operation but should be kept high (above about $0.5\text{-}5\times10^{19}/\text{cm}^3$ or so) to enable low contact resistance. A technique to obtain low contact resistance at lower doping values may therefore be desirable. One such embodiment of the invention may be by utilizing silicides with different work-functions for n type JLTs than for p type JLTs to obtain low resistance at lower doping values. For example, high work function materials, including, such materials as, Palladium silicide, may be used to make contact to p-type JLTs and lower work-function materials, including, such as, Erbium silicide, may be used to make contact to n-type JLTs. These types of approaches are not generally used in the manufacturing of planar inversion-mode MOSFETs. This may be due to separate process steps and increased cost for forming separate contacts to n type and p type transistors on the same device layer. However, for 3D integrated approaches where p-type JLTs may be stacked above n-type JLTs and vice versa, it can be not costly to form silicides with uniquely optimized work functions for n type and p type transistors. Furthermore, for JLTs where contact resistance may be an issue, the additional cost of using separate silicides for n type and p type transistors on the same device layer may be acceptable.

The example process flow shown below may form a Recessed Channel Array Transistor (RCAT) with low contact resistance, but this or similar flows may be applied to other process flows and devices, such as, for example, S-RCAT, JLT, V-groove, JFET, bipolar, and replacement gate flows.

Figure 51A:
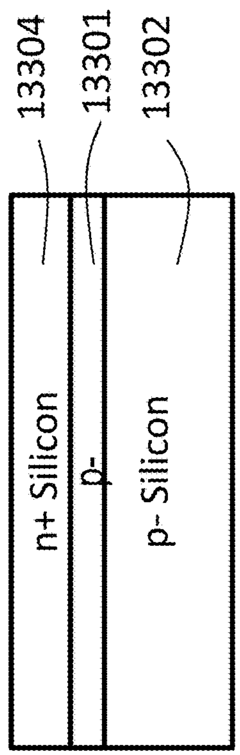
FIG. 51A-FIG. 51I are exemplary drawing illustrations of formation of a recessed channel array transistor with source and drain silicide.

A planar n~channel Recessed Channel Array Transistor (RCAT) with metal silicide source & drain contacts suitable for a 3D IC may be constructed. As illustrated in FIG. 51A, a P− substrate donor wafer 13302 may be processed to include wafer sized layers of N+ doping 13304, and P− doping 13301 across the wafer. The N+ doped layer 13304 may be formed by ion implantation and thermal anneal. In addition, P− doped layer 13301 may have additional ion implantation and anneal processing to provide a different dopant level than P− substrate donor wafer 13302. P− doped layer 13301 may also have graded P− doping to mitigate transistor performance issues, such as, for example, short channel effects, after the RCAT may be formed. The layer stack may alternatively be formed by successive epitaxially deposited doped silicon layers of P− doping 13301 and N+ doping 13304, or by a combination of epitaxy and implantation. Annealing of implants and doping may utilize optical annealing techniques or types of Rapid Thermal Anneal (RTA or spike) or flash anneal.

Figure 51B:
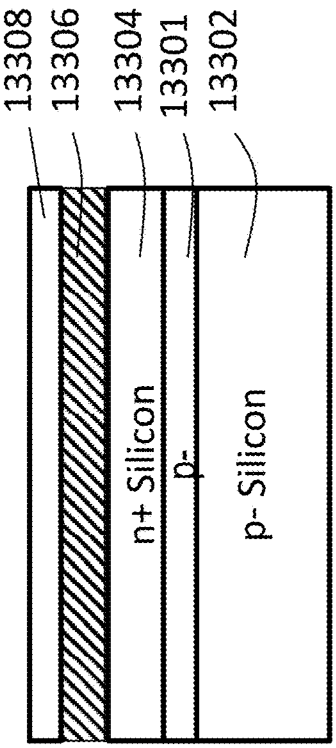

As illustrated in FIG. 51B, a silicon reactive metal, such as, for example, Nickel or Cobalt, may be deposited onto N+ doped layer 13304 and annealed, utilizing anneal techniques such as, for example, RTA, flash anneal, thermal, or optical, thus forming metal silicide layer 13306. The top surface of P− substrate donor wafer 13302 may be prepared for oxide wafer bonding with a deposition of an oxide to form oxide layer 13308.

Figure 51E:
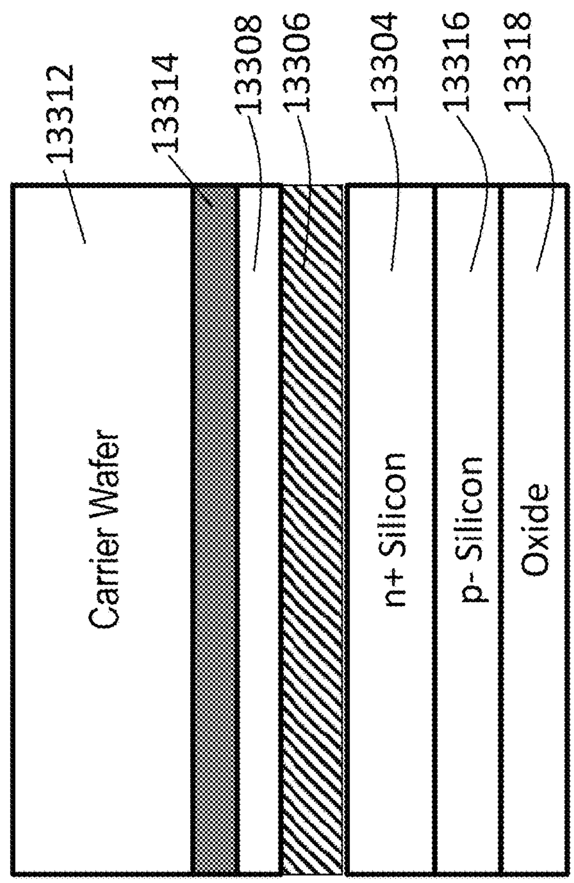
Figure 51C:
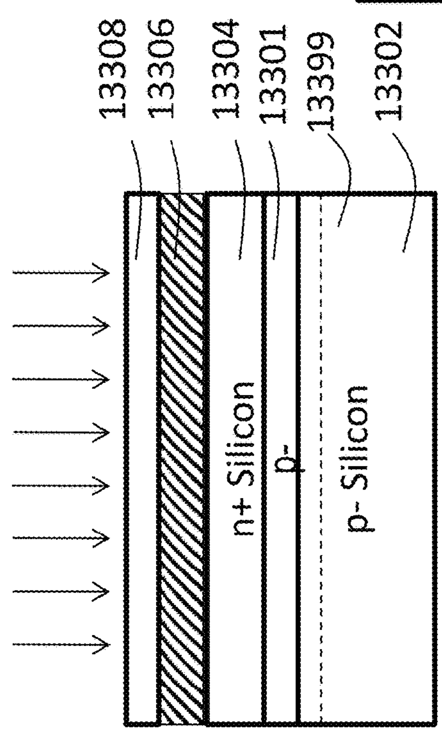

As illustrated in FIG. 51C, a layer transfer demarcation plane (shown as dashed line) 13399 may be formed by hydrogen implantation or other methods as previously described.

Figure 51D:
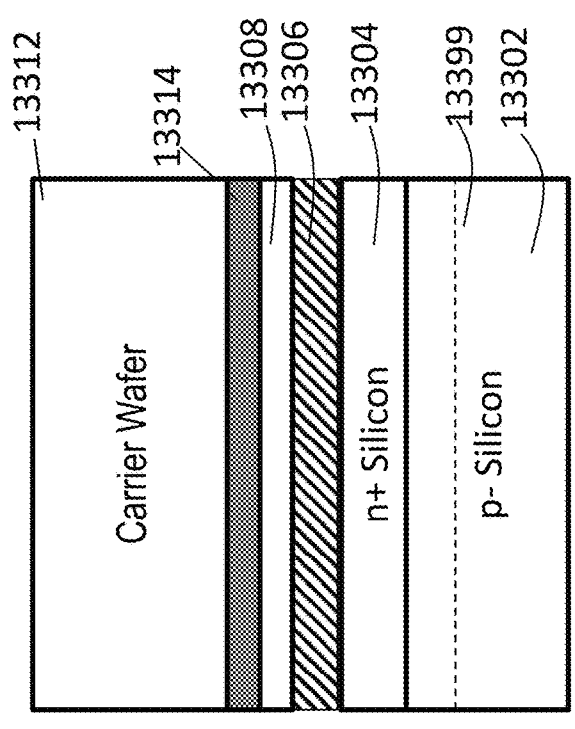

As illustrated in FIG. 51D P− substrate donor wafer 13302 with layer transfer demarcation plane 13399, P− doped layer 13301, N+ doped layer 13304, metal silicide layer 13306, and oxide layer 13308 may be temporarily bonded to carrier or holder substrate 13312 with a low temperature process that may facilitate a low temperature release. The carrier or holder substrate 13312 may be a glass substrate to enable state of the art optical alignment with the acceptor wafer. A temporary bond between the carrier or holder substrate 13312 and the P− substrate donor wafer 13302 may be made with a polymeric material, such as, for example, polyimide DuPont HD3007, which can be released at a later step by laser ablation, Ultra-Violet radiation exposure, or thermal decomposition, shown as adhesive layer 13314. Alternatively, a temporary bond may be made with uni-polar or bi-polar electrostatic technology such as, for example, the Apache tool from Beam Services Inc.

As illustrated in FIG. 51E, the portion of the P− substrate donor wafer 13302 that is below the layer transfer demarcation plane 13399 may be removed by cleaving or other processes as previously described, such as, for example, ion-cut or other methods. The remaining donor wafer P− doped layer 13301 may be thinned by chemical mechanical polishing (CMP) so that the P− layer 13316 may be formed to the desired thickness. Oxide layer 13318 may be deposited on the exposed surface of P− layer 13316.

Figure 51F:
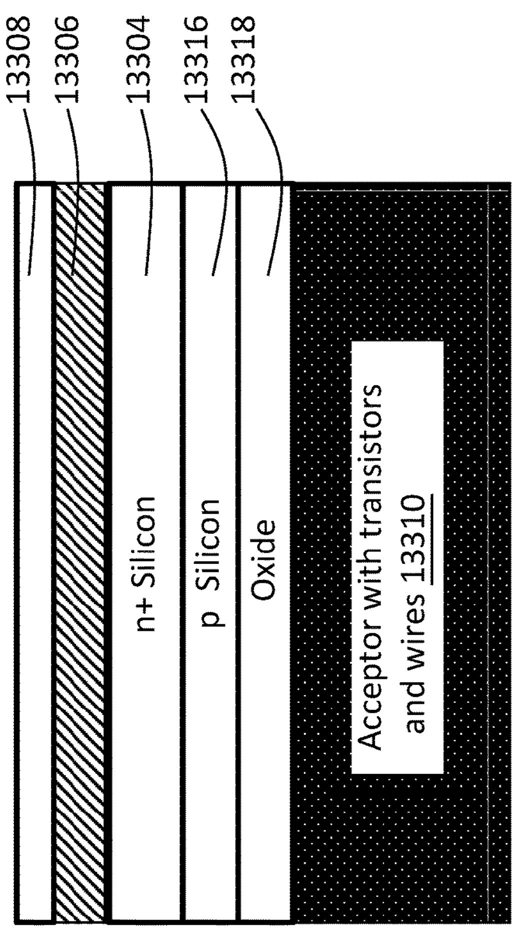

As illustrated in FIG. 51F, both the P− substrate donor wafer 13302 and acceptor substrate 13310 or wafer may be prepared for wafer bonding as previously described and then low temperature (less than about 400° C.) aligned and oxide to oxide bonded. Acceptor substrate 13310, as described previously, may include, for example, transistors, circuitry, metal, such as, for example, aluminum or copper, interconnect wiring, and through layer via metal interconnect strips or pads. The carrier or holder substrate 13312 may then be released using a low temperature process such as, for example, laser ablation. Oxide layer 13318, P− layer 13316, N+ doped layer 13304, metal silicide layer 13306, and oxide layer 13308 may have been layer transferred to acceptor substrate 13310. The top surface of oxide layer 13308 may be chemically or mechanically polished. Now RCAT transistors can be formed with low temperature (less than about 400° C.) processing and aligned to the acceptor substrate 13310 alignment marks (not shown).

Figure 51G:
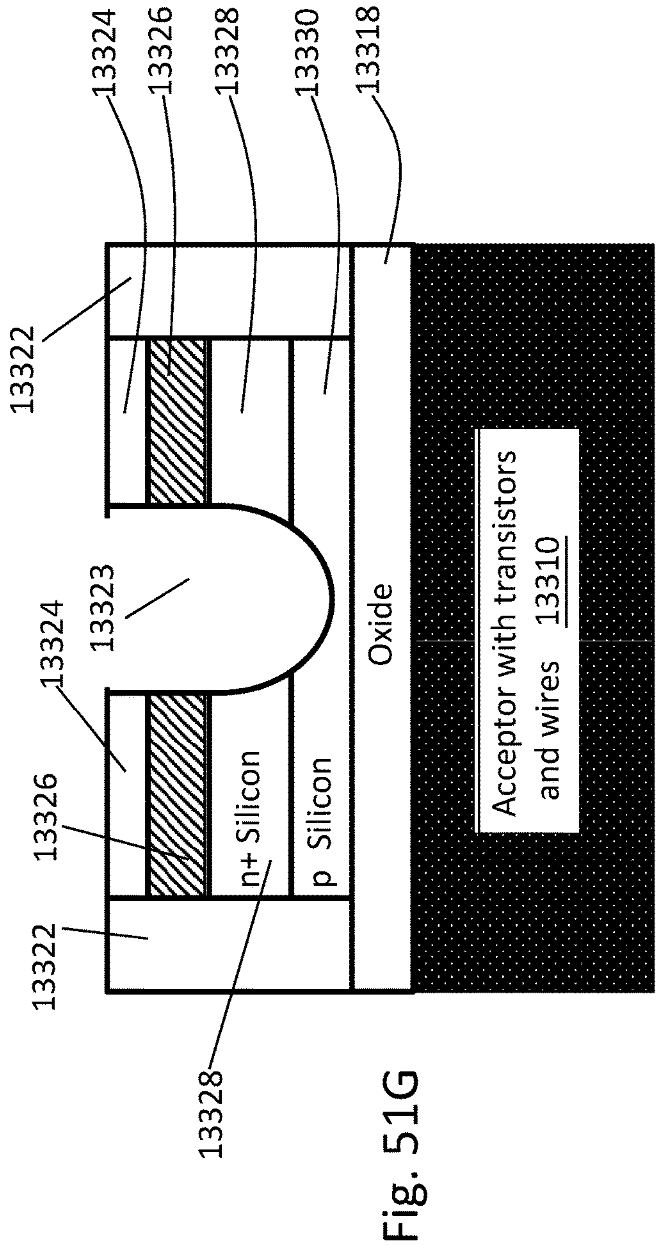

As illustrated in FIG. 51G, the transistor isolation regions 13322 may be formed by mask defining and then plasma/RIE etching oxide layer 13308, metal silicide layer 13306, N+ doped layer 13304, and P− layer 13316 to the top of oxide layer 13318. A low-temperature gap fill oxide may be deposited and chemically mechanically polished, with the oxide remaining in isolation regions 13322. Then the recessed channel 13323 may be mask defined and etched. The recessed channel surfaces and edges may be smoothed by wet chemical or plasma/RIE etching techniques to mitigate high field effects. These process steps may form oxide regions 13324, metal silicide source and drain regions 13326, N+ source and drain regions 13328 and P− channel region 13330.

Figure 51H:
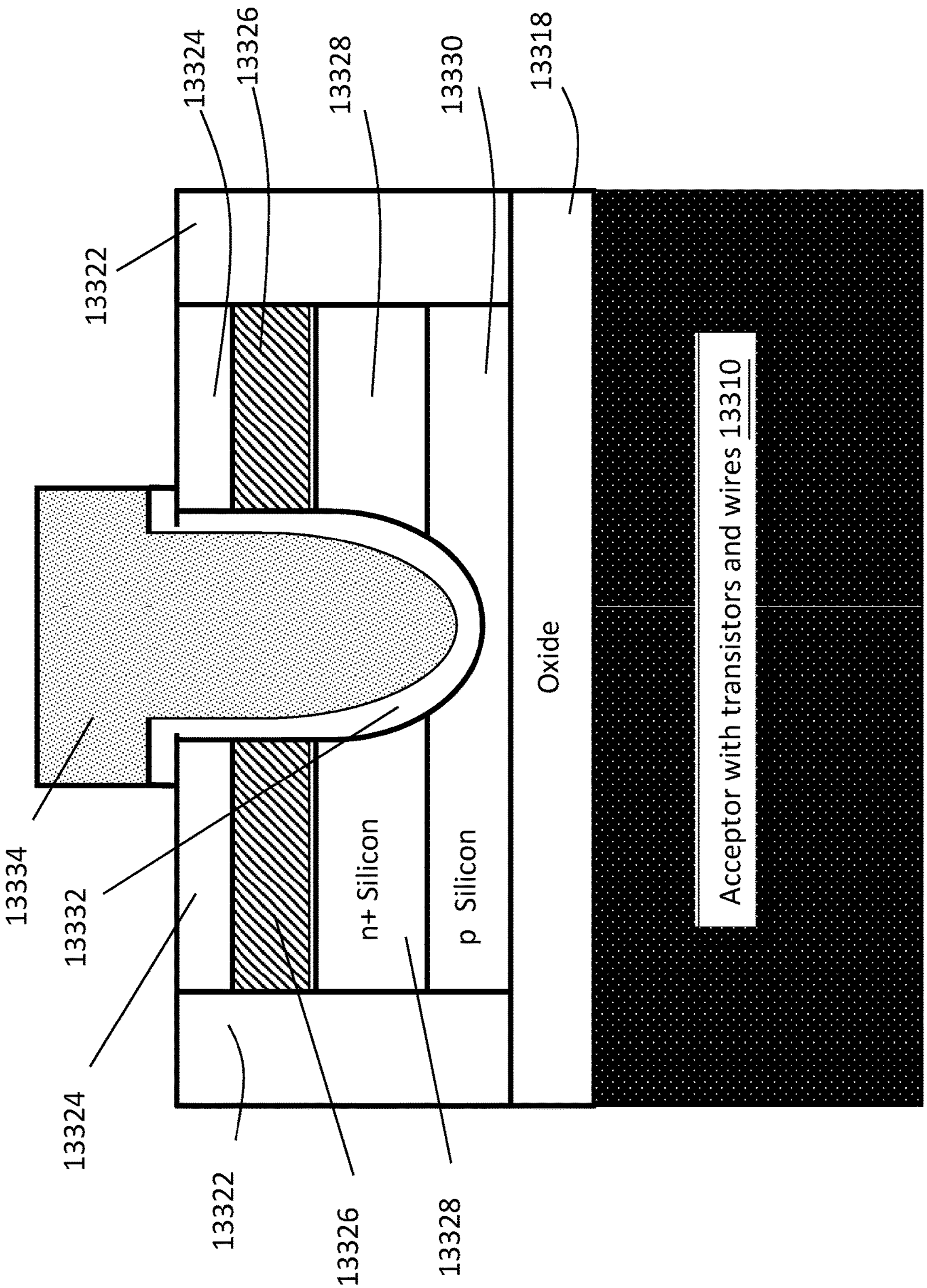

As illustrated in FIG. 51H, a gate dielectric 13332 may be formed and a gate metal material may be deposited. The gate dielectric 13332 may be an atomic layer deposited (ALD) gate dielectric that may be paired with a work function specific gate metal in the industry standard high k metal gate process schemes described previously. Or the gate dielectric 13332 may be formed with a low temperature oxide deposition or low temperature microwave plasma oxidation of the silicon surfaces and then a gate material such as, for example, tungsten or aluminum, may be deposited. The gate material may be chemically mechanically polished, and the gate area defined by masking and etching, thus forming gate electrode 13334.

Figure 51I:
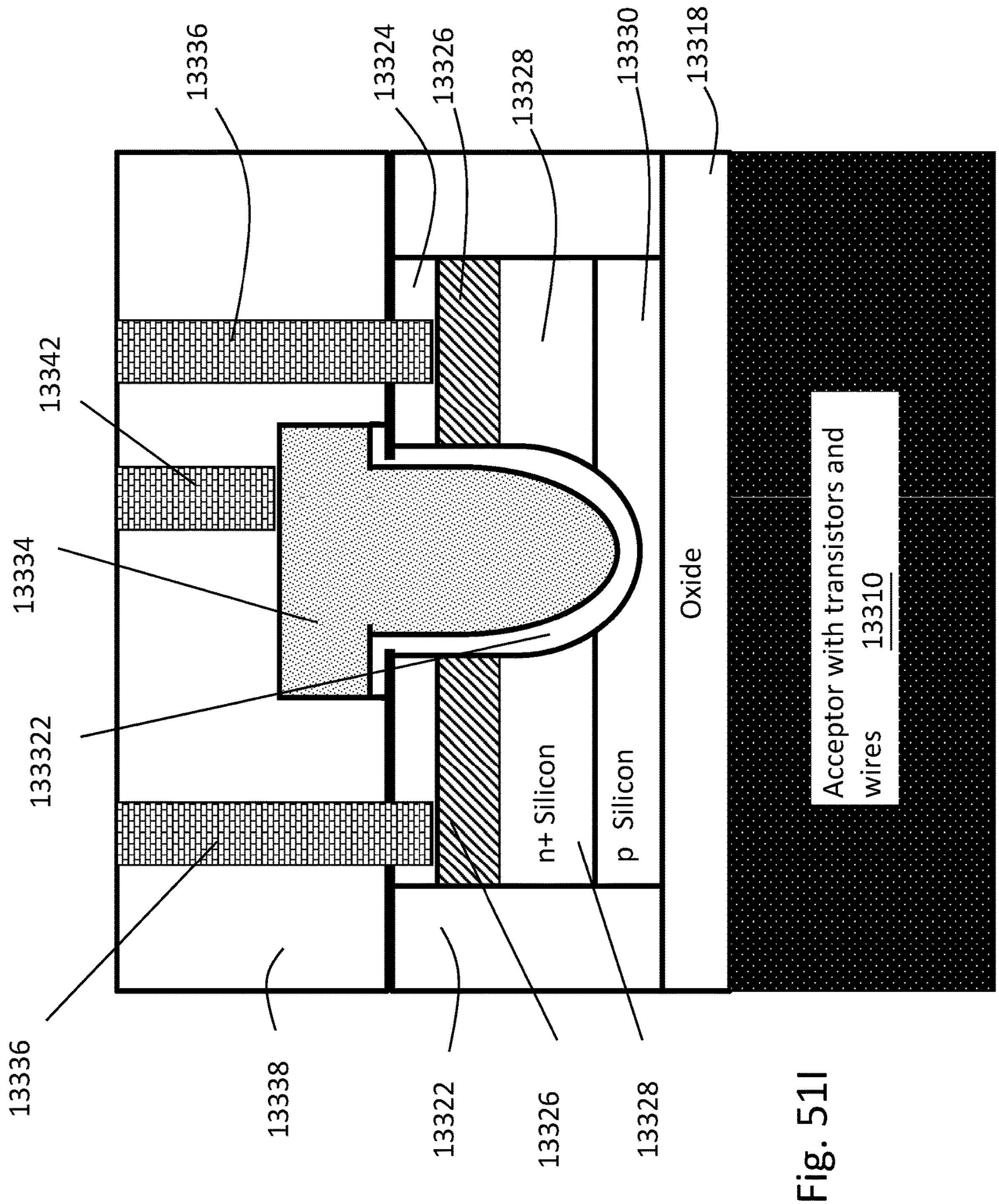

As illustrated in FIG. 51I, a low temperature thick oxide 13338 may be deposited and source, gate, and drain contacts, and through layer via (not shown) openings may be masked and etched preparing the transistors to be connected via metallization. Thus gate contact 13342 may connect to gate electrode 13334, and source & drain contacts 13336 may connect to metal silicide source and drain regions 13326.

Persons of ordinary skill in the art will appreciate that the illustrations in FIG. 51A through FIG. 51I are exemplary only and are not drawn to scale. Such skilled persons will further appreciate that many variations may be possible such as, for example, the temporary carrier substrate may be replaced by a carrier wafer and a permanently bonded carrier wafer flow such as described in FIG. 40 may be employed. Many other modifications within the scope of illustrated embodiments of the invention will suggest themselves to such skilled persons after reading this specification. Thus the invention is to be limited only by the appended claims.

With the high density of layer to layer interconnection and the formation of memory devices & transistors that are enabled by embodiments in this document, novel FPGA (Field Programmable Gate Array) programming architectures and devices may be employed to create cost, area, and performance efficient 3D FPGAs. The pass transistor, or switch, and the memory device that may control the ON or OFF state of the pass transistor may reside in separate layers and may be connected by through layer vias (TLVs) to each other and the routing network metal lines, or the pass transistor and memory devices may reside in the same layer and TLVs may be utilized to connect to the network metal lines.

Figures 52A, 52B, 52C, 52D, 52E, 52F:
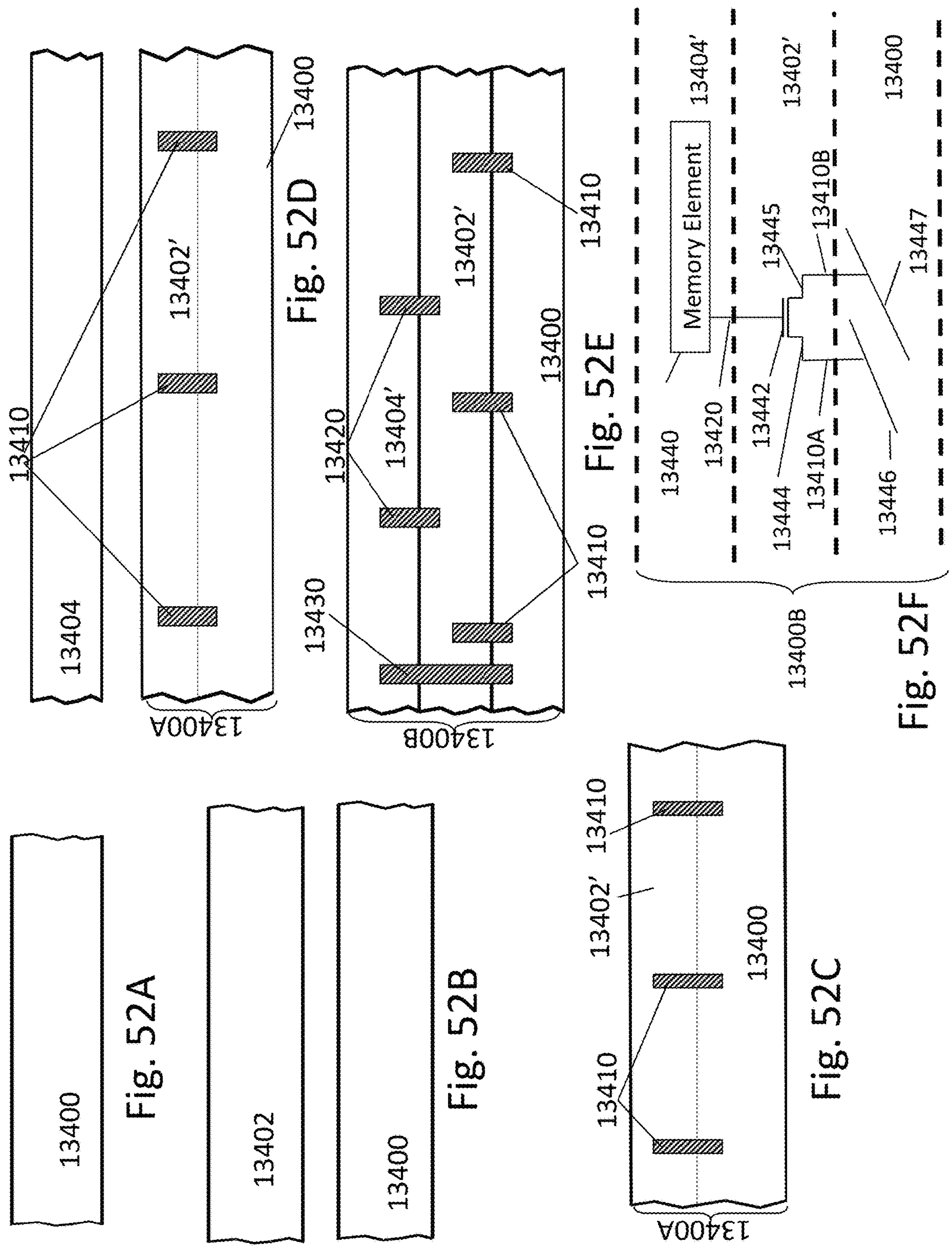
FIG. 52A-FIG. 52F are exemplary drawing illustrations of a 3D IC FPGA process flow.

As illustrated in FIG. 52A, acceptor wafer 13400 may be processed to include logic circuits, analog circuits, and other devices, with metal interconnection and a metal configuration network to form the base FPGA. Acceptor wafer 13400 may also include configuration elements such as, for example, switches, pass transistors, memory elements, programming transistors, and may contain a foundation layer or layers as described previously.

As illustrated in FIG. 52B, donor wafer 13402 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or gate array, with or without a carrier wafer, as described previously. Donor wafer 13402 and acceptor substrate 13400 and associated surfaces may be prepared for wafer bonding as previously described.

As illustrated in FIG. 52C, donor wafer 13402 and acceptor substrate 13400 may be bonded at a low temperature (less than about 400° C.) and a portion of donor wafer 13402 may be removed by cleaving and polishing, or other processes as previously described, such as, for example, ion-cut or other methods, thus forming the remaining pass transistor layer 13402'. Now transistors or portions of transistors may be formed or completed and may be aligned to the acceptor substrate 13400 alignment marks (not shown) as described previously. Thru layer vias (TLVs) 13410 may be formed as described previously and as well as interconnect and dielectric layers. Thus acceptor substrate with pass transistors 13400A may be formed, which may include acceptor substrate 13400, pass transistor layer 13402', and TLVs 13410.

As illustrated in FIG. 52D, memory element donor wafer 13404 may be preprocessed with a layer or layers of memory elements or partially formed memory elements. The memory elements may be constructed utilizing the partial memory process flows described previously, such as, for example, RCAT DRAM, JLT, or others, or may utilize the replacement gate techniques, such as, for example, CMOS gate array to form SRAM elements, with or without a carrier wafer, as described previously, or may be constructed with non-volatile memory, such as, for example, R-RAM or FG Flash as described previously. Memory element donor wafer 13404 and acceptor substrate with pass transistors 13400A and associated surfaces may be prepared for wafer bonding as previously described.

As illustrated in FIG. 52E, memory element donor wafer 13404 and acceptor substrate with pass transistors 13400A may be bonded at a low temperature (less than about 400° C.) and a portion of memory element donor wafer 13404 may be removed by cleaving and polishing, or other processes as previously described, such as, for example, ion-cut or other methods, thus forming the remaining memory element layer 13404'. Now memory elements & transistors or portions of memory elements & transistors may be formed or completed and may be aligned to the acceptor substrate with pass transistors 13400A alignment marks (not shown) as described previously. Memory to switch through layer vias 13420 and memory to acceptor through layer vias 13430 as well as interconnect and dielectric layers may be formed as described previously. Thus acceptor substrate with pass transistors and memory elements 13400B may be formed, which may include acceptor substrate 13400, pass transistor layer 13402', TLVs 13410, memory to switch through layer vias 13420, memory to acceptor through layer vias 13430, and memory element layer 13404'.

As illustrated in FIG. 52F, a simple schematic of illustrative elements of acceptor substrate with pass transistors and memory elements 13400B may be shown. An exemplary memory element 13440 residing in memory element layer 13404' may be electrically coupled to exemplary pass transistor gate 13442, residing in pass transistor layer 13402', with memory to switch through layer vias 13420. The pass transistor source 13444, residing in pass transistor layer 13402', may be electrically coupled to FPGA configuration network metal line 13446, residing in acceptor substrate 13400, with TLV 13410A. The pass transistor drain 13445, residing in pass transistor layer 13402', may be electrically coupled to FPGA configuration network metal line 13447, residing in acceptor substrate 13400, with TLV 13410B. The memory element 13440 may be programmed with signals from off chip, or above, within, or below the memory element layer 13404'. The memory element 13440 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 13446, which may be carrying the output signal from a logic element in acceptor substrate 13400, may be electrically coupled to FPGA configuration network metal line 13447, which may route to the input of a logic element elsewhere in acceptor substrate 13400.

Persons of ordinary skill in the art will appreciate that the illustrations in FIG. 52A through FIG. 52F are exemplary only and are not drawn to scale. Such skilled persons will further appreciate that many variations may be possible such as, for example, the memory element layer 13404' may be constructed below pass transistor layer 13402'. Additionally, the pass transistor layer 13402' may include control and logic circuitry in addition to the pass transistors or switches. Moreover, the memory element layer 13404' may comprise control and logic circuitry in addition to the memory elements. Further, the pass transistor element may instead be a transmission gate, or may be an active drive type switch. Many other modifications within the scope of the illustrated embodiments of the invention will suggest themselves to such skilled persons after reading this specification. Thus the invention is to be limited only by the appended claims.

Figure 53A:
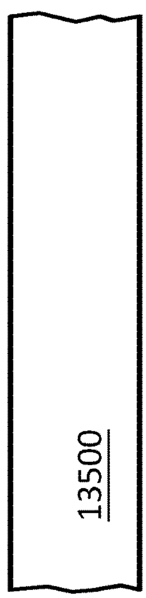
FIG. 53A-FIG. 53C are exemplary drawing illustrations of an alternative 3D IC FPGA process flow.

The pass transistor, or switch, and the memory device that controls the ON or OFF state of the pass transistor may reside in the same layer and TLVs may be utilized to connect to the network metal lines. As illustrated in FIG. 53A, acceptor substrate 13500 or wafer may be processed to include logic circuits, analog circuits, and other devices, with metal interconnection, such as copper or aluminum wiring, and a metal configuration network to form the base FPGA. Acceptor substrate 13500 may also include configuration elements such as, for example, switches, pass transistors, memory elements, programming transistors, and may contain a foundation layer or layers as described previously.

Figure 53B:
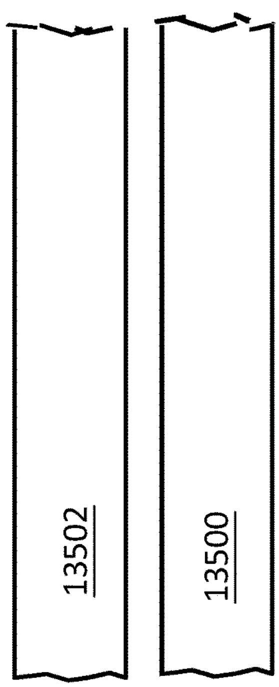

As illustrated in FIG. 53B, donor wafer 13502 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or CMOS gate array, with or without a carrier wafer, as described previously. Donor wafer 13502 may be preprocessed with a layer or layers of memory elements or partially formed memory elements. The memory elements may be constructed utilizing the partial memory process flows described previously, such as, for example, RCAT DRAM or others, or may utilize the replacement gate techniques, such as, for example, CMOS gate array to form SRAM elements, with or without a carrier wafer, as described previously. The memory elements may be formed simultaneously with the pass transistor, for example, such as, for example, by utilizing a CMOS gate array replacement gate process where a CMOS pass transistor and SRAM memory element, such as a 6-transistor cell, may be formed, or an RCAT pass transistor formed with an RCAT DRAM memory. Donor wafer 13502 and acceptor substrate 13500 and associated surfaces may be prepared for wafer bonding as previously described.

Figure 53C:
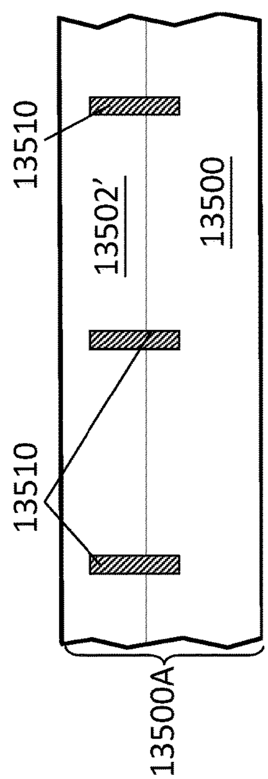

As illustrated in FIG. 53C, donor wafer 13502 and acceptor substrate 13500 may be bonded at a low temperature (less than about 400° C.) and a portion of donor wafer 13502 may be removed by cleaving and polishing, or other processes as previously described, such as, for example, ion-cut or other methods, thus forming the remaining pass transistor & memory layer 13502'. Now transistors or portions of transistors and memory elements may be formed or completed and may be aligned to the acceptor substrate 13500 alignment marks (not shown) as described previously. Thru layer vias (TLVs) 13510 may be formed as described previously. Thus acceptor substrate with pass transistors and memory elements 13500A may be formed, which may include acceptor substrate 13500, pass transistor & memory element layer 13502', and TLVs 13510.

It may be desirable to construct 2DICs with regions or 3DICs with layers or 31A that may be of dissimilar materials, such as, for example, mono-crystalline silicon based state of the art (SOA) CMOS circuits integrated with, on a 2DIC wafer or integrated in a 3DIC stack, InP optoelectronic circuits, such as, for example, sensors, imagers, displays. These dissimilar materials may include substantially different crystal materials, for example, mono-crystalline silicon and InP. This heterogeneous integration has traditionally been difficult and may result from the substrate differences. The SOA CMOS circuits may be typically constructed at state of the art wafer fabs on large diameter, such as 300 mm, silicon wafers, and the desired SOA InP technology may be made on 2 to 4 inch diameter InP wafers at a much older wafer fab.

Figure 75:
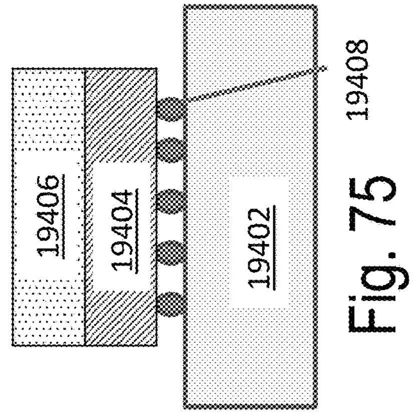
FIG. 75 is an exemplary drawing illustration of sub-threshold circuits that may be stacked above or below a logic chip layer.

FIG. 75 illustrates an embodiment of the invention wherein sub-threshold circuits may be stacked above or below a logic chip layer. The 3DIC illustrated in FIG. 75 may include input/output interconnect 19408, such as, for example, solder bumps and a packaging substrate 19402, logic layer 19406, and sub-threshold circuit layer 19404. The 3DIC may place logic layer 19406 above sub-threshold circuit layer 19404 and they may be connected with through layer vias (TLVs) as described elsewhere herein. Alternatively, the logic and sub-threshold layers may be swapped in position, for example, logic layer 19406 may be a sub-threshold circuit layer and sub-threshold circuit layer 19404 may be a logic layer. The sub-threshold circuit layer 19404 may include repeaters of a chip with level shifting of voltages done before and after each repeater stage or before and after some or all of the repeater stages in a certain path are traversed. Alternatively, the sub-threshold circuit layer may be used for SRAM. Alternatively, the sub-threshold circuit layer may be used for some part of the clock distribution, such as, for example, the last set of buffers driving latches in a clock distribution. Although the term sub-threshold is used for describing elements in FIG. 75, it will be obvious to one skilled in the art that similar approaches may be used when supply voltage for the stacked layers is slightly above the threshold voltage values and may be utilized to increase voltage toward the end of a clock cycle for a better latch. In addition, the sub-threshold circuit layer stacked above or below the logic layer may include optimized transistors that may have lower capacitance, for example, if it is used for clock distribution purposes.

Figures 76, 77A, 77B, 77C:
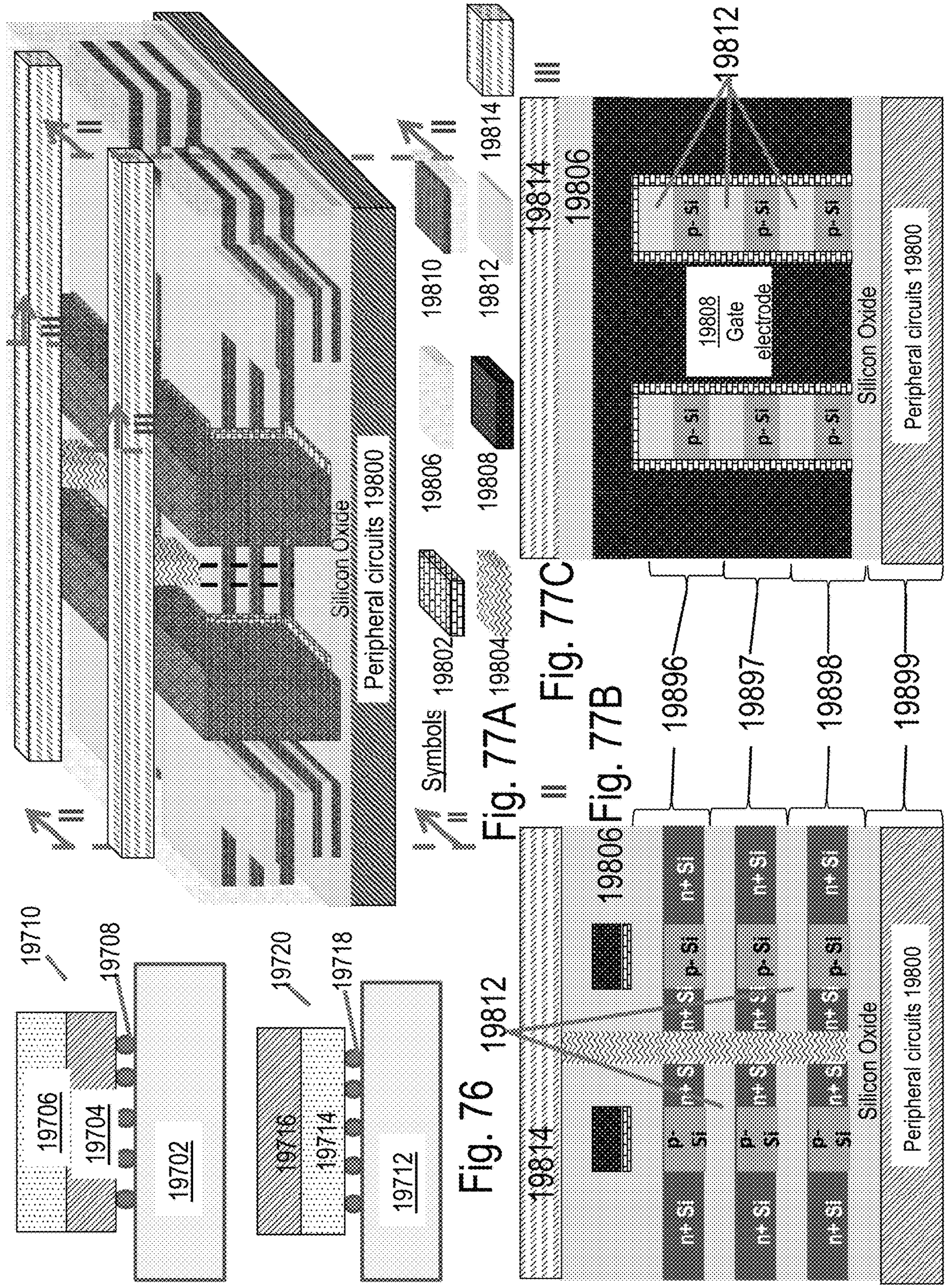
FIG. 76 is an exemplary drawing illustration of the 3D stacking of monolithic 3D DRAM with logic with TSV technology.
FIG. 77A-FIG. 77G are exemplary drawing illustrations of a process for monolithic 3D stacking of logic with DRAM produced using multiple memory layers and shared lithography steps.

FIG. 76 illustrates an embodiment of the invention, wherein monolithic 3D DRAM constructed with lithography steps shared among multiple memory layers may be stacked above or below a logic chip. DRAM, as well as SRAM and floating body DRAM, may be considered volatile memory, whereby the memory state may be substantially lost when supply power is removed. Monolithic 3D DRAM constructed with lithography steps shared among multiple memory layers (henceforth called M3DDRAM-LSSAMML) could be constructed using techniques, for example, described in co-pending published patent application 2011/0121366 (FIG. 98A-H to FIG. 100A-L). One configuration for 3D stack M3DDRAM-LSSAMML and logic 19710 may include logic chip 19704, M3DDRAM-LSSAMML chip 19706, solder bumps 19708, and packaging substrate 19702. M3DDRAM-LSSAMML chip 19706 may be placed above logic chip 19704, and logic chip 19704 may be coupled to packaging substrate 19702 via solder bumps 19708. A portion of or substantially the entirety of the logic chip 19704 and the M3DDRAM-LSSAMML chip 19706 may be processed separately on different wafers and then stacked atop each other using, for example, through-silicon via (TSV) stacking technology. This stacking may be done at the wafer-level or at the die-level or with a combination. Logic chip 19704 and the M3DDRAM-LSSAMML chip 19706 may be constructed in a monocrystalline layer or layers respectively. Another configuration for 3D stack M3DDRAM-LSSAMML and logic 19720 may include logic chip 19716, M3DDRAM-LSSAMML chip 19714, solder bumps 19718 and packaging substrate 19712. Logic chip 19716 may be placed above M3DDRAM-LSSAMML chip 19714, and M3DDRAM-LSSAMML chip 19714 may be coupled to packaging substrate 19712 via solder bumps 19718. A portion of or substantially the entirety of the logic chip 19716 and the M3DDRAM-LSSAMML chip 19714 may be processed separately on different wafers and then stacked atop each other using, for example, through-silicon via (TSV) stacking technology. This stacking may be done at the wafer-level or at the die-level or with a combination. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer may have a thickness of less than about 150 nm.

FIG. 77A-G illustrates an embodiment of the invention, wherein logic circuits and logic regions, which may be constructed in a monocrystalline layer, may be monolithically stacked with monolithic 3D DRAM constructed with lithography steps shared among multiple memory layers (M3DDRAM-LSSAMML), the memory layers or memory regions may be constructed in a monocrystalline layer or layers. The process flow for the silicon chip may include the following steps that may be in sequence from Step (1) to Step (5). When the same reference numbers are used in different drawing figures (among FIG. 77A-G), they may be used to indicate analogous, similar or identical structures to enhance the understanding of the invention by clarifying the relationships between the structures and embodiments presented in the various diagrams—particularly in relating analogous, similar or identical functionality to different physical structures.

Step (1): This may be illustrated with FIG. 77A-C. FIG. 77A illustrates a three-dimensional view of an exemplary M3DDRAM-LSSAMML that may be constructed using techniques described in patent application 2011/0121366 (FIG. 98A-H to FIG. 100A-L). FIG. 77B illustrates a cross-sectional view along the II direction of FIG. 77A while FIG. 77C illustrates a cross-sectional view along the III direction of FIG. 77A. The legend of FIG. 77A-C may include gate dielectric 19802, conductive contact 19804, silicon dioxide 19806 (nearly transparent for illustrative clarity), gate electrode 19808, n+ doped silicon 19810, silicon dioxide 19812, and conductive bit lines 19814. The conductive bit lines 19814 may include metals, such as copper or aluminum, in their construction. The M3DDRAM-LSSAMML may be built on top of and coupled with vertical connections to peripheral circuits 19800 as described in patent application 2011/0092030. The DRAM may operate using the floating body effect. Further details of this constructed M3DDRAM-LSSAMML are provided in patent application 2011/0121366 (FIG. 98A-H to FIG. 100A-L). For clarity, peripheral circuits 19800 may include transistors 19899 and may also be named a first circuit layer or first level/strata of the exemplary M3DDRAM-LSSAMML. Second circuit layer or second level/strata transistors 19898 may include the depicted DRAM N+/p−/N+ configuration with two side gates as cross-sections FIGS. 77B and 77C. Similarly third circuit layer or third level/strata transistors 19897 and fourth level/strata or fourth circuit layer transistors 19896 may include the depicted DRAM N+/p−/N+ configuration with two side gates as cross-sections FIGS. 77B and 77C. FIGS. 77A-77G illustrate a portion of a potential memory array, the precise organization of which may be determined by engineering and design choices.

Step (2): This may be illustrated with FIG. 77D. Activated p Silicon layer 19816 and activated n+ Silicon layer 19818 may be transferred atop the structure shown in FIG. 77A using a layer transfer technique, such as, for example, ion-cut. P Silicon layer 19816 and n+ Silicon layer 19818 may be constructed from monocrystalline silicon. Further details of layer transfer techniques and procedures are provided in patent application 2011/0121366. A transferred monocrystalline layer, such as silicon layer 19818, may have a thickness of less than about 150 nm.

Step (3): This may be illustrated with FIG. 77E. The p Silicon layer 19816 and the n+ Silicon layer 19818 that were shown in FIG. 77D may be lithographically defined and then etched to form monocrystalline semiconductor regions including p Silicon regions 19820 and n+ Silicon regions 19822. Silicon dioxide 19824 (nearly transparent for illustrative clarity) may be deposited and then planarized for dielectric isolation amongst adjacent monocrystalline semiconductor regions.

Figure 77D:
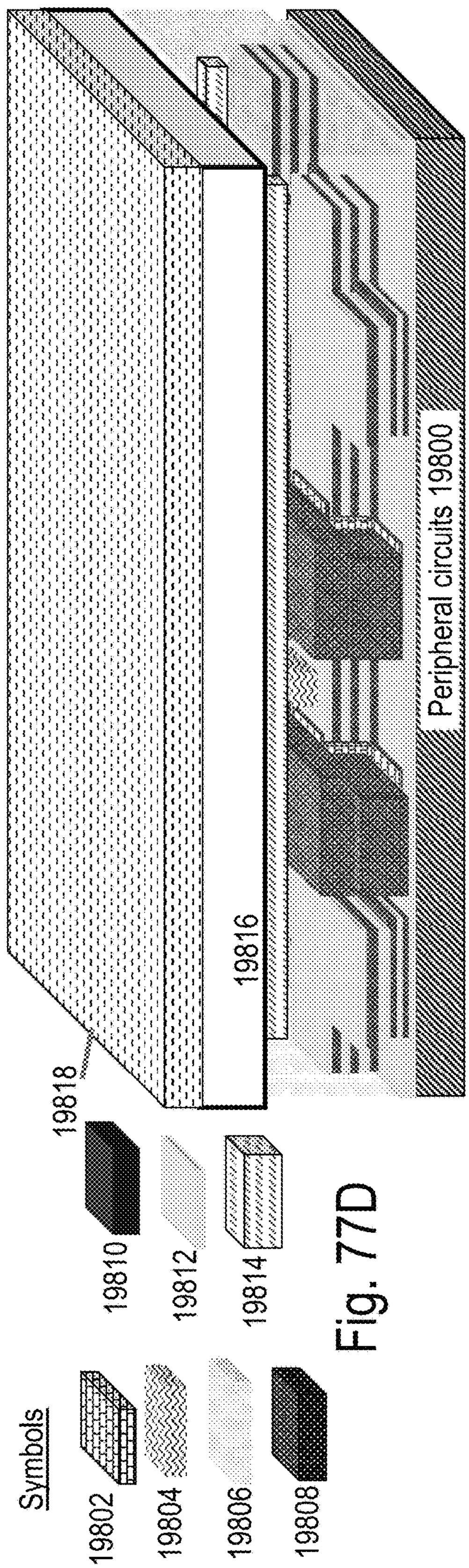
Figure 77E:
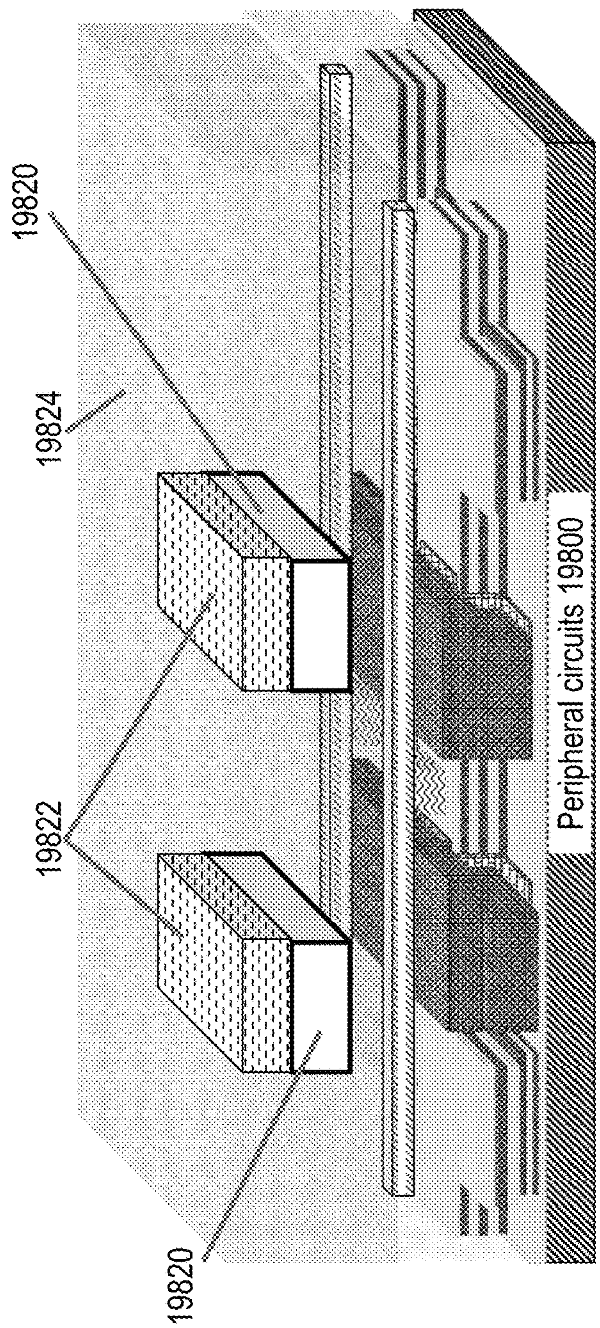
Figure 77F:
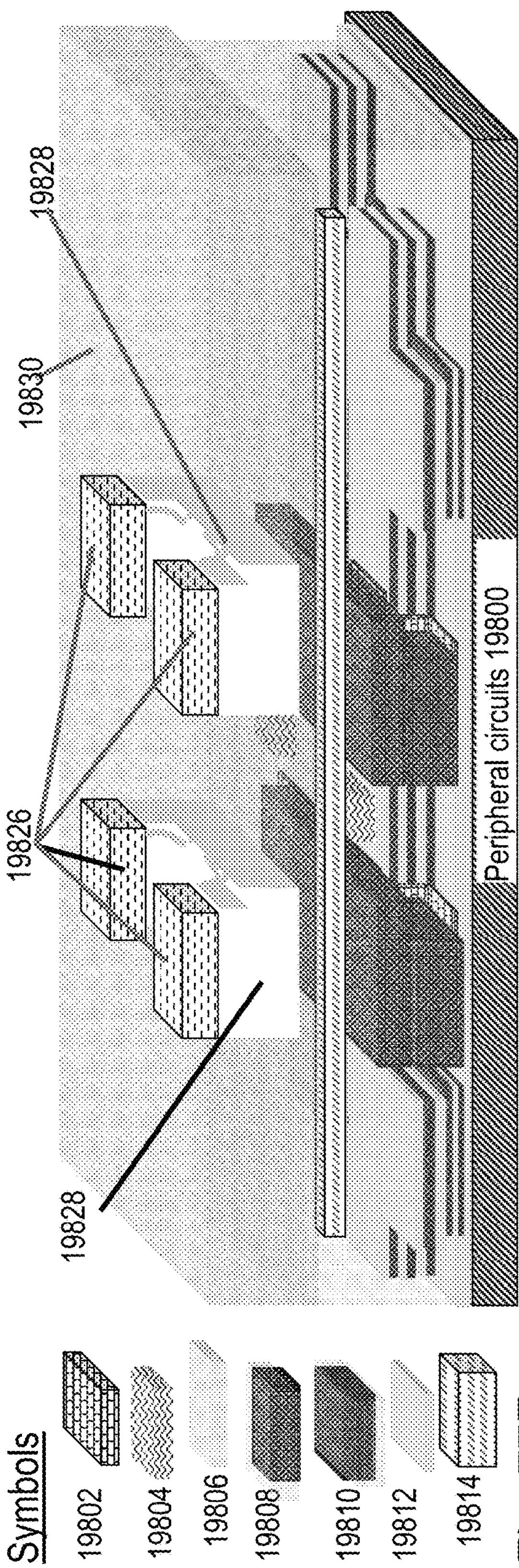
Figure 77G:
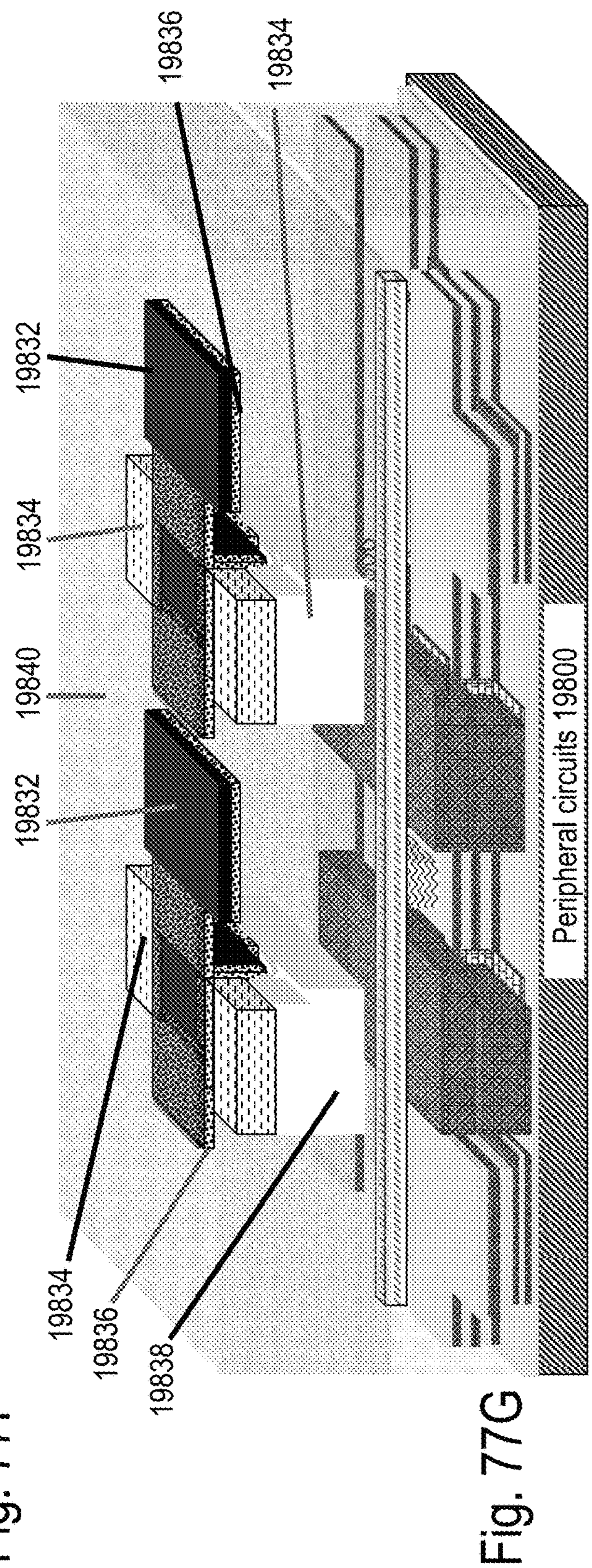

Step (4): This may be illustrated with FIG. 77F. The p Silicon regions 19820 and the n+ Silicon regions 19822 of FIG. 77E may be lithographically defined and etched with a carefully tuned etch recipe, thus forming a recessed channel structure such as shown in FIG. 77F and may include n+ source and drain Silicon regions 19826, p channel Silicon regions 19828, and oxide regions 19830 (nearly transparent for illustrative clarity). Clean processes may then be used to produce a smooth surface in the recessed channel.

Step (5): This may be illustrated with FIG. 77G. A low temperature (less than about 400° C.) gate dielectric and gate electrode, such as hafnium oxide and TiAlN respectively, may be deposited into the etched regions in FIG. 77F. A chemical mechanical polish process may be used to planarize the top of the gate stack. Then a lithography and etch process may be used to form the pattern shown in FIG. 77G, thus forming recessed channel transistors that may include gate dielectric regions 19836, gate electrode regions 19832, silicon dioxide regions 19840 (nearly transparent for illustrative clarity), n+ Silicon source and drain regions 19834, and p Silicon channel and body regions 19838.

A recessed channel transistor for logic circuits and logic regions may be formed monolithically atop a M3DDRAM-LSSAMML using the procedure shown in Step (1) to Step (5). The processes described in Step (1) to Step (5) do not expose the M3DDRAM-LSSAMML, and its associated metal bit lines 19814, to temperatures greater than about 400° C.

Persons of ordinary skill in the art will appreciate that the illustrations in FIG. 77A through FIG. 77G are exemplary only and are not drawn to scale. Such skilled persons will further appreciate that many variations may be possible such as, for example, the recessed channels etched in FIG. 77F may instead be formed before p Silicon layer 19816 and n+ Silicon layer 19818 may be etched to form the dielectric isolation and p Silicon regions 19820 and n+ Silicon regions 19822. Moreover, various types of logic transistors can be stacked atop the M3DDRAM-LSSAMML without exposing the M3DDRAM-LSSAMML to temperatures greater than about 400° C., such as, for example, junction-less transistors, dopant segregated Schottky source-drain transistors, V-groove transistors, and replacement gate transistors. This is possible using procedures described in patent application 2011/0121366 (FIG. 98A-H to FIG. 100A-L). The memory regions may have horizontally oriented transistors and vertical connections between the memory and logic layers may have a radius of less than about 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 20110121366 and 13/099,010. Many other modifications within the scope of the illustrated embodiments of the invention will suggest themselves to such skilled persons after reading this specification. Thus the invention is to be limited only by the appended claims.

Figure 78:
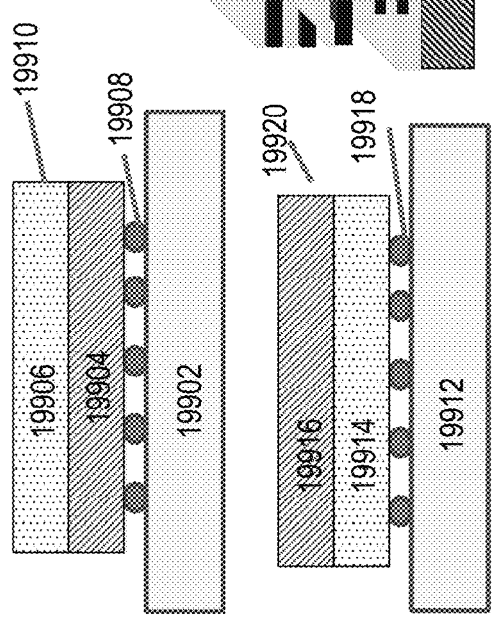
FIG. 78 is an exemplary drawing illustration of different configurations possible for monolithically stacked embedded memory and logic.

FIG. 78 illustrates an embodiment of the invention wherein different configurations for stacking embedded memory with logic circuits and logic regions may be realized. One stack configuration 19910 may include embedded memory solution 19906 made in a monocrystalline layer monolithically stacked atop the logic circuits 19904 made in a monocrystalline layer using monolithic 3D technologies and vertical connections described in patent applications 20110121366 and 13/099,010. Logic circuits 19904 may include metal layer or layers which may include metals such as copper or aluminum. Stack configuration 19910 may include input/output interconnect 19908, such as, for example, solder bumps and a packaging substrate 19902. Another stack configuration 19920 may include the logic circuits 19916 monolithically stacked atop the embedded memory solution 19914 using monolithic 3D technologies described in patent applications 20110121366 and 13/099,010. Embedded memory solution 19914 may include metal layer or layers which may include metals such as copper or aluminum. Stack configuration 19920 may include an input/output interconnect 19918, such as, for example, solder bumps and a packaging substrate 19912. The embedded memory solutions 19906 and 19914 may be a volatile memory, for example, SRAM. In this case, the transistors in SRAM blocks associated with embedded memory solutions 19906 and 19914 may be optimized differently than the transistors in logic circuits 19904 and 19916, and may, for example, have different threshold voltages, channel lengths and/or other parameters. The embedded memory solutions 19906 and 19914, if constructed, for example, as SRAM, may have, for example, just one device layer with 6 or 8 transistor SRAM. Alternatively, the embedded memory solutions 19906 and 19914 may have two device layers with pMOS and nMOS transistors of the SRAM constructed in monolithically stacked device layers using techniques described patent applications 20110121366 and 13/099,010. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as logic circuits 19904, may have a thickness of less than about 150 nm.

Persons of ordinary skill in the art will appreciate that the illustrations in FIG. 78 are exemplary only and are not drawn to scale. Such skilled persons will further appreciate that many variations may be possible such as, for example, the embedded memory solutions 19906 and 19914, if constructed, for example, as SRAM, may be built with three monolithically stacked device layers for the SRAM with architectures similar to "The revolutionary and truly 3-dimensional 25F2 SRAM technology with the smallest S3 stacked single-crystal Si) cell, 0.16 um2, and SSTFT (stacked single-crystal thin film transistor) for ultra high density SRAM", Symposium on VLSI Technology, 2004 by Soon-Moon Jung, et al. but implemented with technologies described in patent applications 20110121366 and 13/099,010. Moreover, the embedded memory solutions 19906 and 19914 may be embedded DRAM constructed with stacked capacitors and transistors. Further, the embedded memory solutions 19906 and 19914 may be embedded DRAM constructed with trench capacitors and transistors. Moreover, the embedded memory solutions 19906 and 19914 may be capacitor-less floating-body RAM. Further, the embedded memory solutions 19906 and 19914 may be a resistive memory, such as RRAM, Phase Change Memory or MRAM. Furthermore, the embedded memory solutions 19906 and 19914 may be a thyristor RAM. Moreover, the embedded memory solutions 19906 and 19914 may be a flash memory. Furthermore, embedded memory solutions 19906 and 19914 may have a different number of metal layers and different sizes of metal layers compared to those in logic circuits 19904 and 19916. This is because memory circuits typically perform well with fewer numbers of metal layers (compared to logic circuits). Many other modifications within the scope of the illustrated embodiments of the invention described herein will suggest themselves to such skilled persons after reading this specification. Thus the invention is to be limited only by the appended claims.

Many of the configurations described with FIG. 78 may represent an integrated device that may have a first monocrystalline layer that may have logic circuit layers and/or regions and a second monolithically stacked monocrystalline layer that may have memory regions. The memory regions may have horizontally oriented transistors and vertical connections between the memory and logic layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 20110121366 and 13/099,010.

Figure 79A:
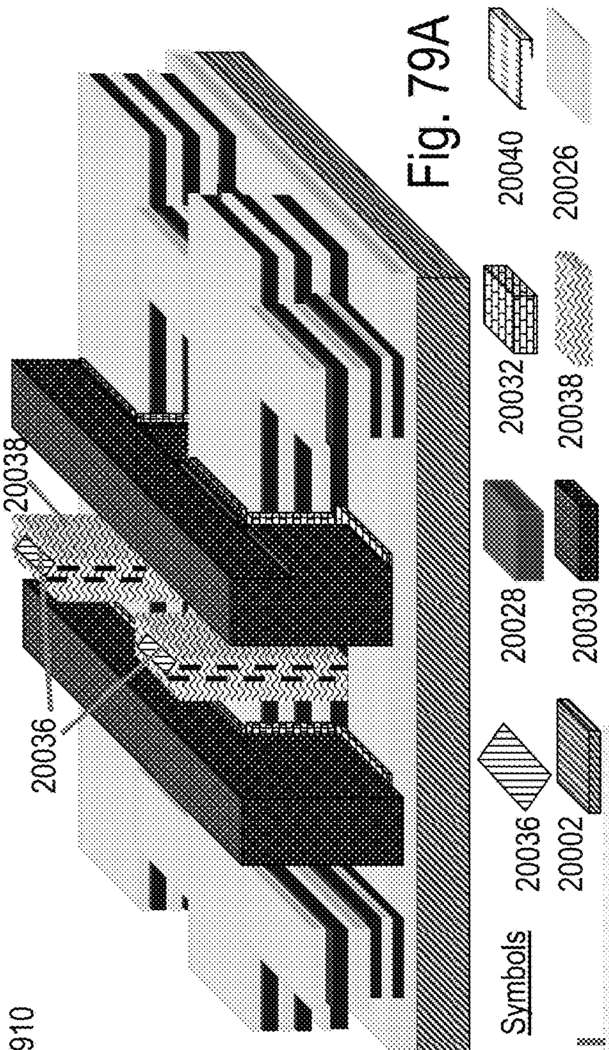
FIG. 79A-FIG. 79C are exemplary drawing illustrations of a process flow for constructing monolithic 3D capacitor-based DRAMs with lithography steps shared among multiple memory layers.
Figure 79B:
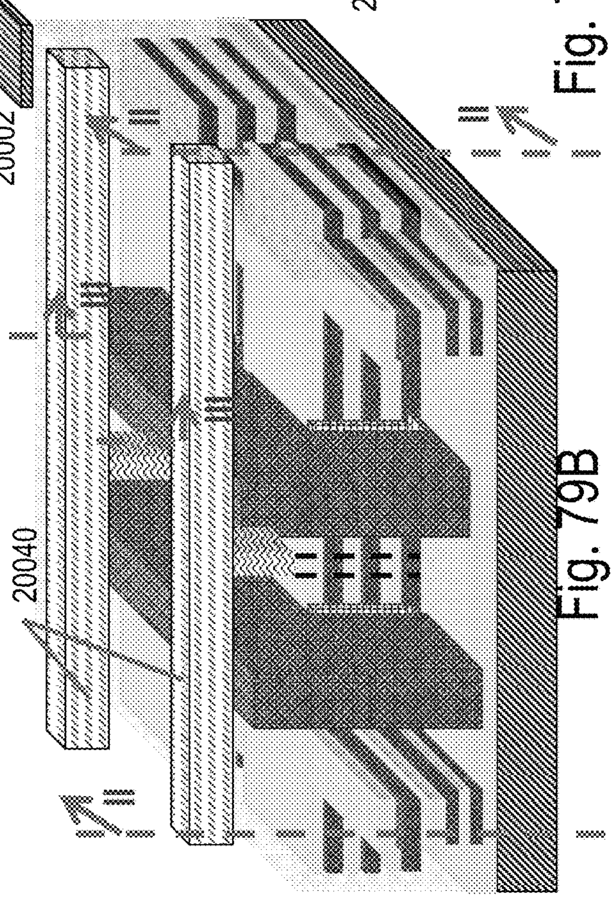
Figure 79C:
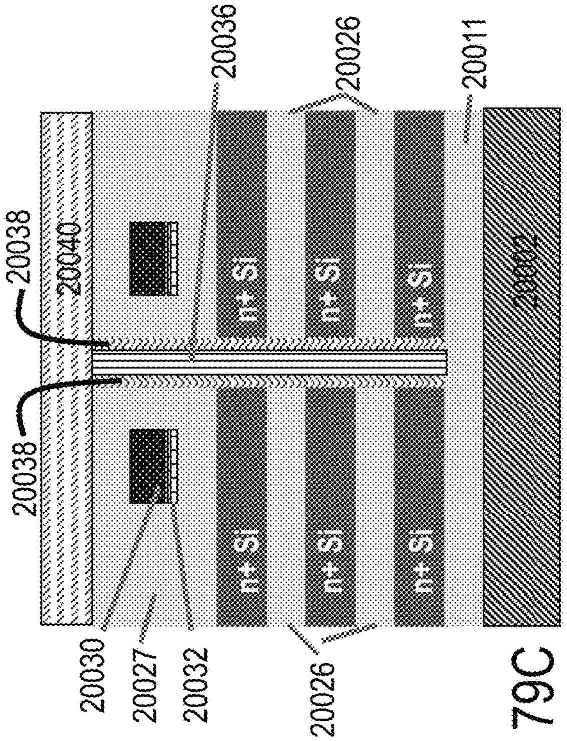

FIGS. 79A-C illustrates an embodiment of the invention, wherein a horizontally-oriented monolithic 3D DRAM array may be constructed and may have a capacitor in series with a transistor selector. No mask may utilized on a "per-memory-layer" basis for the monolithic 3D DRAM shown in FIGS. 79A-C, and substantially all other masks may be shared among different layers. The process flow may include the following steps which may be in sequence from Step (A) to Step (H). When the same reference numbers are used in different drawing figures (among FIGS. 79A-C), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Step (A): Peripheral circuits 20002, which may include high temperature wiring, made with metals such as, for example, tungsten, and which may include logic circuit regions, may be constructed. Oxide layer (eventually part of oxide layer 20011) may be deposited above peripheral circuits 20002.

Step (B): N+ Silicon wafer may have an oxide layer (eventually part of oxide layer 20011) grown or deposited above it. Hydrogen may be implanted into the n+ Silicon wafer to a certain depth indicated by hydrogen plane. Alternatively, some other atomic species, such as Helium, may be (co-)implanted. Thus, top layer may be formed. The bottom layer may include the peripheral circuits 20002 with oxide layer. The top layer may be flipped and bonded to the bottom layer using oxide-to-oxide bonding to form top and bottom stack.

Step (C): The top and bottom stack may be cleaved at the hydrogen plane using methods including, for example, a thermal anneal or a sideways mechanical force. A CMP process may be conducted. Thus n+ Silicon layer may be formed. A layer of silicon oxide may be deposited atop the n+ Silicon layer. At the end of this step, a single-crystal n+ Silicon layer may exist atop the peripheral circuits 20002, and this has been achieved using layer-transfer techniques.

Step (D): Using methods similar to Step (B) and (C), multiple n+ silicon layers 20028 (now including n+ Silicon layer) may be formed with associated silicon oxide layers 20026.

Step (E): Lithography and etch processes may then be utilized to make a structure as shown in the figure. The etch of multiple n+ silicon layers and associated silicon oxide layers may stop on oxide layer or may extend into and etch a portion of oxide layer (not shown). Thus exemplary patterned oxide regions 20026 and patterned n+ silicon regions 20028 may be formed.

Step (F): A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 20032 and gate electrode regions 20030 may be formed.

Step (G): FIG. 79A illustrates the structure after Step (G). A trench, for example two of which may be placed as shown in FIG. 79A, may be formed by lithography, etch and clean processes. A high dielectric constant material and then a metal electrode material may be deposited and polished with CMP. The metal electrode material may substantially fill the trenches. Thus high dielectric constant regions 20038 and metal electrode regions 20036 may be formed, which may substantially reside inside the exemplary two trenches. The high dielectric constant regions 20038 may be include materials such as, for example, hafnium oxide, titanium oxide, niobium oxide, zirconium oxide and any number of other possible materials with dielectric constants greater than or equal to 4. The DRAM capacitors may be defined by having the high dielectric constant regions 20038 in between the surfaces or edges of metal electrode regions 20036 and the associated stacks of n+ silicon regions 20028.

Step (H): FIG. 79B illustrates the structure after Step (H). A silicon oxide layer 20027 may then be deposited and planarized. The silicon oxide layer is shown transparent in the figure for clarity. Bit Lines 20040 may then be constructed. Contacts may then be made to Bit Lines, Word Lines and Source Lines of the memory array at its edges. Source Line contacts can be made into stair-like structures using techniques described in "Bit Cost Scalable Technology with Punch and Plug Process for Ultra High Density Flash Memory," VLSI Technology, 2007 IEEE Symposium on, vol., no., pp. 14-15, 12-14 Jun. 2007 by Tanaka, H.; Kido, M.; Yahashi, K.; Oomura, M.; et al., following which contacts can be constructed to them. Formation of stair-like structures for Source Lines could be done in steps prior to Step (H) as well. Vertical connections, for example, with TLVs, may be made to peripheral circuits 20002 (not shown).

FIG. 79C show cross-sectional views of the exemplary memory array along FIG. 79B planes II respectively. Multiple junction-less transistors in series with capacitors constructed of high dielectric constant materials such as high dielectric constant regions 20038 can be observed in FIG. 79C.

A procedure for constructing a monolithic 3D DRAM has thus been described, with (1) horizontally-oriented transistors, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as n+ Silicon layer, may have a thickness of less than about 150 nm.

Persons of ordinary skill in the art will appreciate that the illustrations in FIG. 79A through FIG. 79C are exemplary only and are not drawn to scale. Such skilled persons will further appreciate that many variations may be possible such as, for example, layer transfer techniques other than the described hydrogen implant and ion-cut may be utilized. Moreover, while FIG. 79A-FIG. 79C described the procedure for forming a monolithic 3D DRAM with substantially all lithography steps shared among multiple memory layers, alternative procedures could be used. For example, procedures similar to those described in FIGS. 33A-K, FIGS. 34A-L and FIGS. 35A-F of patent application Ser. No. 13/099,010, now U.S. Pat. No. 8,581,349, may be used to construct a monolithic 3D DRAM. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (e.g. third or fourth) monocrystalline layers that may have memory regions may be added to the stack. Decoders and other driver circuits of said memory may be part of the stacked logic circuit layer or logic circuit regions. Many other modifications within the scope of the illustrated embodiments of the invention will suggest themselves to such skilled persons after reading this specification. Thus the invention is to be limited only by the appended claims.

Over the past few years, the semiconductor industry has been actively pursuing floating-body RAM technologies as a replacement for conventional capacitor-based DRAM or as a replacement for embedded DRAM/SRAM. In these technologies, charge may be stored in the body region of a transistor instead of having a separate capacitor. This could have several potential advantages, including lower cost due to the lack of a capacitor, easier manufacturing and potentially scalability. There are many device structures, process technologies and operation modes possible for capacitor-less floating-body RAM. Some of these are included in "Floating-body SOI Memory: The Scaling Tournament", Book Chapter of Semiconductor-On-Insulator Materials for Nanoelectronics Applications, pp. 393-421, Springer Publishers, 2011 by M. Bawedin, S. Cristoloveanu, A. Hubert, K. H. Park and F. Martinez ("Bawedin").

FIG. 80 shows a prior art illustration of capacitor-based DRAM and capacitor-less floating-body RAM. A capacitor-based DRAM cell 20106 may be schematically illustrated and may include transistor 20102 coupled in series with capacitor 20104. The transistor 20102 may serve as a switch for the capacitor 20104, and may be ON while storing or reading charge in the capacitor 20104, but may be OFF while not performing these operations. One illustrative example capacitor-less floating-body RAM cell 20118 may include transistor source and drain regions 20112, gate dielectric 20110, gate electrode 20108, buried oxide 20116 and silicon region 20114. Charge may be stored in the transistor body region 20120. Various other structures and configurations of floating-body RAM may be possible, and are not illustrated in FIG. 80. In many configurations of floating-body RAM, a high (electric) field mechanism such as impact ionization, tunneling or some other phenomenon may be used while writing data to the memory cell. High-field mechanisms may be used while reading data from the memory cell. The capacitor-based DRAM cell 20106 may often operate at much lower electric fields compared to the floating-body RAM cell 20118.

Figure 81A:
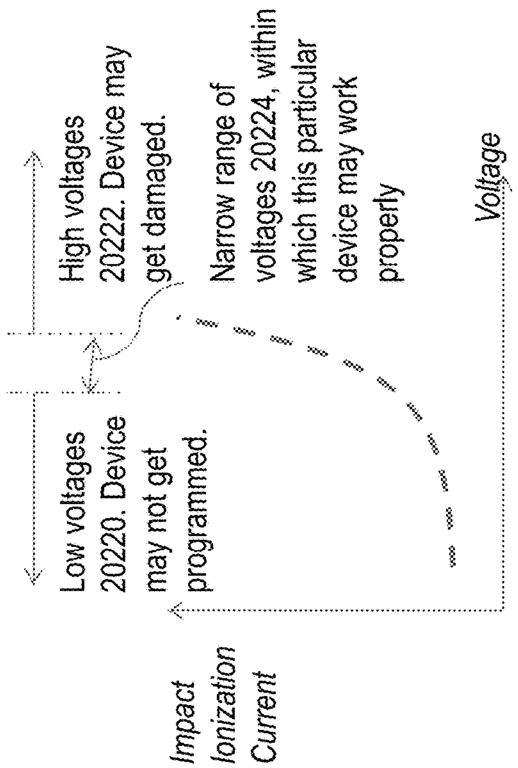
FIG. 81A-FIG. 81B are exemplary drawing illustrations of potential challenges associated with high field effects in floating-body RAM.
Figure 81B:
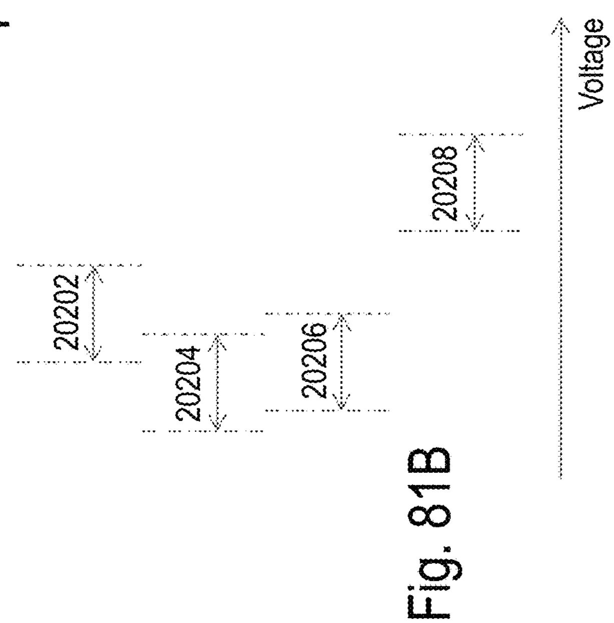

FIG. 81A-81B illustrates some of the potential challenges associated with possible high field effects in floating-body RAM. The Y axis of the graph shown in FIG. 81A may indicate current flowing through the cell during the write operation, which may, for example, consist substantially of impact ionization current. While impact ionization may be illustrated as the high field effect in FIG. 81A, some other high field effect may alternatively be present. The X axis of the graph shown in FIG. 81B may indicate some voltage applied to the memory cell. While using high field effects to write to the cell, some challenges may arise. At low voltages 20220, not enough impact ionization current may be generated while at high voltages 20222, the current generated may be exponentially higher and may damage the cell. The device may therefore work only at a narrow range of voltages 20224.

A challenge of having a device work across a narrow range of voltages is illustrated with FIG. 81B. In a memory array, for example, there may be millions or billions of memory cells, and each memory individual cell may have its own range of voltages between which it operates safely. Due to variations across a die or across a wafer, it may not be possible to find a single voltage that works well for substantially all members of a memory array. In the plot shown in FIG. 81B, four different memory cells may have their own range of "safe" operating voltages 20202, 20204, 20206 and 20208. Thus, it may not be possible to define a single voltage that can be used for writing substantially all cells in a memory array. While this example described the scenario with write operation, high field effects may make it potentially difficult to define and utilize a single voltage for reading substantially all cells in a memory array. Solutions to this potential problem may be required.

Figure 82:
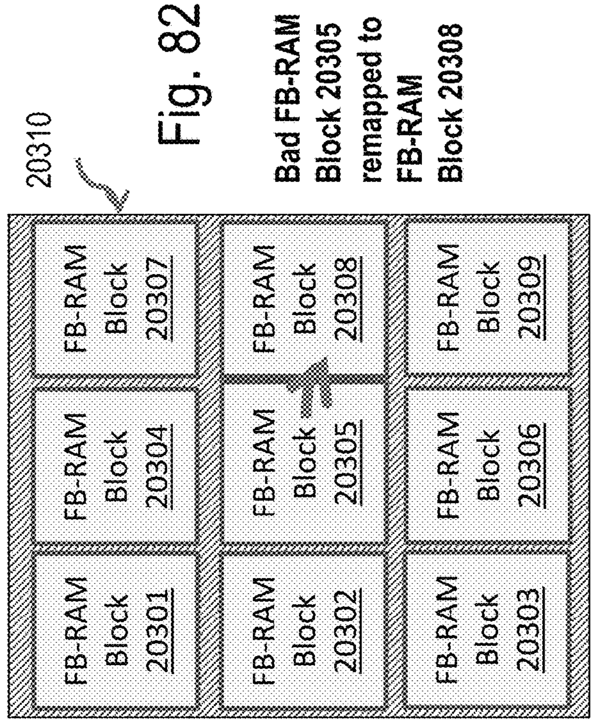
FIG. 82 is an exemplary drawing illustration of how a floating-body RAM chip may be managed when some memory cells may have been damaged.

FIG. 82 illustrates an embodiment of the invention that describes how floating-body RAM chip 20310 may be managed wherein some memory cells within floating-body RAM chip 20310 may have been damaged due to mechanisms, such as, for example, high-field effects after multiple write or read cycles. For example, a cell rewritten a billion times may have been damaged more by high field effects than a cell rewritten a million times. As an illustrative example, floating-body RAM chip 20310 may include nine floating-body RAM blocks, 20301, 20302, 20303, 20304, 20305, 20306, 20307, 20308 and 20309. If it is detected, for example, that memory cells in floating-body RAM block 20305 may have degraded due to high-field effects and that redundancy and error control coding schemes may be unable to correct the error, the data within floating-body RAM block 20305 may be remapped in part or substantially in its entirety to floating-body RAM block 20308. Floating-body RAM block 20305 may not be used after this remapping event.

Figure 83:
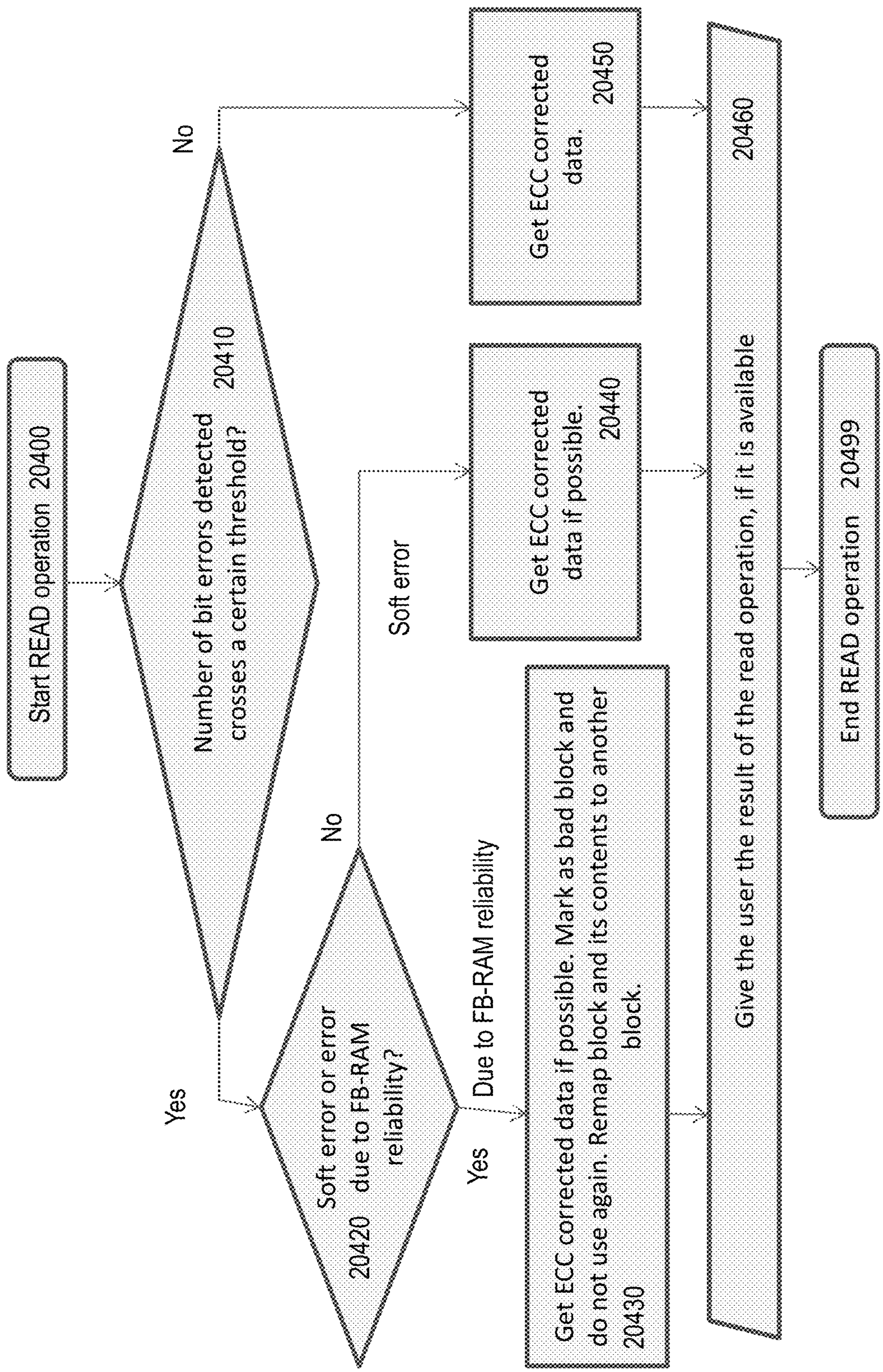
FIG. 83 is an exemplary drawing illustration of a methodology for implementing the bad block management scheme.

FIG. 83 illustrates an embodiment of the invention wherein an exemplary methodology for implementing the bad block management scheme may be described with respect to FIG. 82. For example, during a read operation 20400, if the number of errors increases beyond a certain threshold 20410, an algorithm may be activated. The first step of this algorithm may be to check or analyze the causation or some characteristic of the errors, for example, if the errors may be due to soft-errors or due to reliability issues because of high-field effects. Soft-errors may be transient errors and may not occur again and again in the field, while reliability issues due to high-field effects may occur again and again (in multiple conditions), and may occur in the same field or cell. Testing circuits may be present on the die, or on another die, which may be able to differentiate between soft errors and reliability issues in the field by utilizing the phenomenon or characteristic of the error in the previous sentence or by some other method. If the error may result from floating-body RAM reliability 20420, the contents of the block may be mapped and transferred to another block as described with respect to FIG. 82 and this block may not be reused again 20430. Alternatively, the bad block management scheme may use error control coding to correct the bad data 20440. As well, if the number of bit errors detected in 20410 does not cross a threshold, then the methodology may use error control coding to correct the bad data 20450. In all cases, the methodology may provide the user data about the error and correction 20460. The read operation may end 20499.

Figure 84:
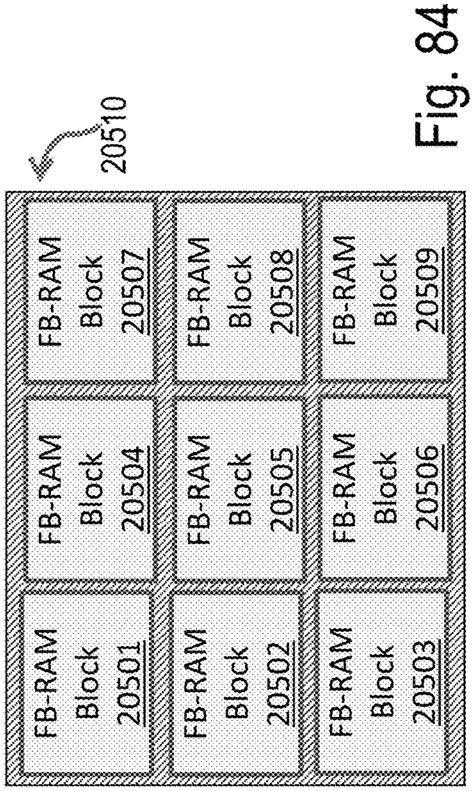
FIG. 84 is an exemplary drawing illustration of wear leveling techniques and methodology utilized in floating body RAM.

FIG. 84 illustrates an embodiment of the invention wherein wear leveling techniques and methodology may be utilized in floating body RAM. As an illustrative example, floating-body RAM chip 20510 may include nine floating-body RAM blocks 20501, 20502, 20503, 20504, 20505, 20506, 20507, 20508 and 20509. While writing data to floating-body RAM chip 20510, the writes may be controlled and mapped by circuits that may be present on the die, or on another die, such that substantially all floating-body RAM blocks, such as 20501-20509, may be exposed to an approximately similar number of write cycles. The leveling metric may utilize the programming voltage, total programming time, or read and disturb stresses to accomplish wear leveling, and the wear leveling may be applied at the cell level, or at a super-block (groups of blocks) level. This wear leveling may avoid the potential problem wherein some blocks may be accessed more frequently than others. This potential problem typically limits the number of times the chip can be written. There are several algorithms used in flash memories and hard disk drives that perform wear leveling. These techniques could be applied to floating-body RAM due to the high field effects which may be involved. Using these wear leveling procedures, the number of times a floating body RAM chip can be rewritten (i.e. its endurance) may improve.

Figure 85A:
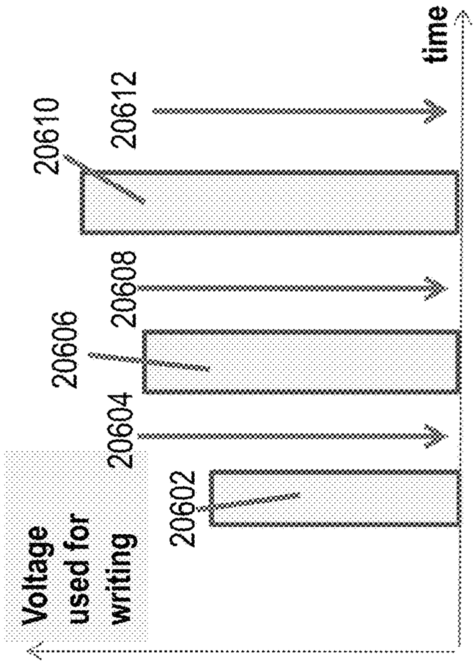
FIG. 85A-FIG. 85B are exemplary drawing illustrations of incremental step pulse programming techniques and methodology utilized for floating-body RAM.
Figure 85B:
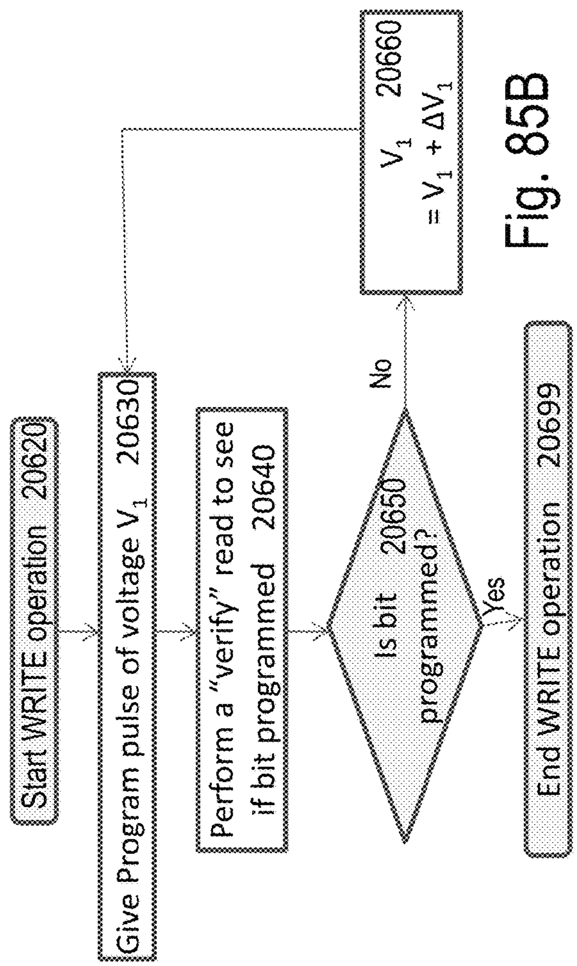

FIG. 85A-B illustrates an embodiment of the invention wherein incremental step pulse programming techniques and methodology may be utilized for floating-body RAM. The Y axis of the graph shown in FIG. 85A may indicate the voltage used for writing the floating-body RAM cell or array and the X axis of the graph shown in FIG. 85A may indicate time during the writing of a floating-body RAM cell or array. Instead of using a single pulse voltage for writing a floating-body RAM cell or array, multiple write voltage pulses, such as, initial write pulse 20602, second write pulse 20606 and third write pulse 20610, may be applied to a floating-body RAM cell or array. Write voltage pulses such as, initial write pulse 20602, second write pulse 20606 and third write pulse 20610, may have differing voltage levels and time durations ('pulse width'), or they may be similar. A "verify" read may be conducted after every write voltage pulse to detect if the memory cell has been successfully written with the previous write voltage pulse. A "verify" read operation may include voltage pulses and current reads. For example, after initial write pulse 20602, a "verify" read operation 20604 may be conducted. If the "verify" read operation 20604 has determined that the floating-body RAM cell or array has not finished storing the data, a second write pulse 20606 may be given followed by a second "verify" read operation 20608. Second write pulse 20606 may be of a higher voltage and/or time duration (shown) than that of initial write pulse 20602. If the second "verify" read operation 20608 has determined that the floating-body RAM cell or array has not finished storing the data, a third write pulse 20610 may be given followed by a third "verify" read operation 20612. Third write pulse 20610 may be of a higher voltage and/or time duration (shown) than that of initial write pulse 20602 or second write pulse 20606. This could continue until a combination ofwrite pulse and verify operations indicate that the bit storage is substantially complete. The potential advantage of incremental step pulse programming schemes may be similar to those described with respect to FIG. 80 and FIG. 81A-81B as they may tackle the cell variability and other issues, such as effective versus applied write voltages.

FIG. 85B illustrates an embodiment of the invention wherein an exemplary methodology for implementing a write operation using incremental step pulse programming scheme may be described with respect to FIG. 85A. Although FIG. 85B illustrates an incremental step pulse programming scheme where subsequent write pulses may have higher voltages, the flow may be general and may apply to cases, for example, wherein subsequent write pulses may have higher time durations. Starting a write operation 20620, a write voltage pulse of voltage V1 may be given 20630 to the floating-body RAM cell or array, following which a verify read operation may be conducted 20640. If the verify read indicates that the bit of the floating-body RAM cell or array has been written 20650 satisfactorily, the write operation substantially completes 20699. Otherwise, the write voltage pulse magnitude may be increased (+ΔV1 shown) 20660 and further write pulses and verify read pulses may be given 20630 to the memory cell. This process may repeat until the bit is written satisfactorily.

Persons of ordinary skill in the art will appreciate that the illustrations in FIG. 85A through FIG. 85B are exemplary only and are not drawn to scale. Such skilled persons will further appreciate that many variations may be possible such as, for example, pulses may utilize delivered current rather than measured or effective voltage, or some combination thereof. Moreover, multiple write pulses before a read verify operation may be done. Further, write pulses may have more complex shapes in voltage and time, such as, for example, ramped voltages, soaks or holds, or differing pulse widths. Furthermore, the write pulse may be of positive or negative voltage magnitude and there may be a mixture of unipolar or bipolar pulses within each pulse train. The write pulse or pulses may be between read verify operations. Further, ΔV1 may be of polarity to decrease the write program pulse voltage V1 magnitude. Moreover, an additional 'safety' write pulse may be utilized after the last successful read operation. Further, the verify read operation may utilize a read voltage pulse that may be of differing voltage and time shape than the write pulse, and may have a different polarity than the write pulse. Furthermore, the write pulse may be utilized for verify read purposes. Many other modifications within the scope of the illustrated embodiments of the invention described herein will suggest themselves to such skilled persons after reading this specification. Thus the invention is to be limited only by the appended claims.

FIG. 86 illustrates an embodiment of the invention wherein optimized and possibly different write voltages may be utilized for different dice across a wafer. As an illustrative example, wafer 20700 may include dice 20702, 20704, 20706, 20708, 20710, 20712, 20714, 20716, 20718, 20720, 20722 and 20724. Due to variations in process and device parameters across wafer 20700, which may be induced by, for example, manufacturing issues, each die, for example die 20702, on wafer 20700 may suitably operate at its own optimized write voltage. The optimized write voltage for die 20702 may be different than the optimized write voltage for die 20704, and so forth. During, for example, the test phase of wafer 20700 or individual dice, such as, for example, die 20702, tests may be conducted to determine the optimal write voltage for each die. This optimal write voltage may be stored on the floating body RAM die, such as die 20702, by using some type of non-volatile memory, such as, for example, metal or oxide fuse-able links, or intentional damage programming of floating-body RAM bits, or may be stored off-die, for example, on a different die within wafer 20700. Using an optimal write voltage for each die on a wafer may allow higher-speed, lower-power and more reliable floating-body RAM chips.

Persons of ordinary skill in the art will appreciate that the illustrations in FIG. 86 are exemplary only and are not drawn to scale. Such skilled persons will further appreciate that many variations may be possible such as, for example, while FIG. 86 discussed using optimal write voltages for each die on the wafer, each wafer in a wafer lot may have its own optimal write voltage that may be determined, for example, by tests conducted on circuits built on scribe lines of wafer 20700, a 'dummy' mini-array on wafer 20700, or a sample of floating-body RAM dice on wafer 20700. Moreover, interpolation or extrapolation of the test results from, such as, for example, scribe line built circuits or floating-body RAM dice, may be utilized to calculate and set the optimized programming voltage for untested dice. For example, optimized write voltages may be determined by testing and measurement of die 20702 and die 20722, and values ofwrite voltages for die 20708 and die 20716 may be an interpolation calculation, such as, for example, to a linear scale. Many other modifications within the scope of the illustrated embodiments of the invention described herein will suggest themselves to such skilled persons after reading this specification. Thus the invention is to be limited only by the appended claims.

FIG. 87 illustrates an embodiment of the invention wherein optimized for different parts of a chip (or die) write voltages may be utilized. As an illustrative example, wafer 20800 may include chips 20802, 20804, 20806, 20808, 20810, 20812, 20814, 20816, 20818, 20820, 20822 and 20824. Each chip, such as, for example, chip 20812, may include a number of different parts or blocks, such as, for example, blocks 20826, 20828, 20830, 20832, 20834, 20836, 20838, 20840 and 20842. Each of these different parts or blocks may have its own optimized write voltage that may be determined by measurement of test circuits which may, for example, be built onto the memory die, within each block, or on another die. This optimal write voltage may be stored on the floating body RAM die, such as die 20802, by using some type of non-volatile memory, such as, for example, metal or oxide fuse-able links, or intentional damage programming of floating-body RAM bits, or may be stored off-die, for example, on a different die within wafer 20800, or may be stored within a block, such as block 20826.

FIG. 88 illustrates an embodiment of the invention wherein write voltages for floating-body RAM cells may be substantially or partly based on the distance of the memory cell from its write circuits. As an illustrative example, memory array portion 20900 may include bit-lines 20910, 20912, 20914 and 20916 and may include memory rows 20902, 20904, 20906 and 20908, and may include write driver circuits 20950. The memory row 20902 with memory cells may be farthest away from the write driver circuits 20950, and so, due to the large currents of floating-body RAM operation, may suffer a large IR drop along the wires. The memory row 20908 with memory cells may be closest to the write driver circuits 20950 and may have a low IR drop. Due to the IR drops, the voltage delivered to each memory cell of a row may not be the same, and may be significantly different. To tackle this issue, write voltages delivered to memory cells may be adjusted based on the distance from the write driver circuits. When the IR drop value may be known to be higher, which may be the scenario for memory cells farther away from the write driver circuits, higher write voltages may be used. When the IR drop may be lower, which may be the scenario for memory cells closer to the write driver circuits, lower write voltages may be used.

Write voltages may be tuned based on temperature at which a floating body RAM chip may be operating. This temperature based adjustment of write voltages may be useful since required write currents may be a function of the temperature at which a floating body RAM device may be operating. Furthermore, different portions of the chip or die may operate at different temperatures in, for example, an embedded memory application. Another embodiment of the invention may involve modulating the write voltage for different parts of a floating body RAM chip based on the temperatures at which the different parts of a floating body RAM chip operate. Refresh can be performed more frequently or less frequently for the floating body RAM by using its temperature history. This temperature history may be obtained by many methods, including, for example, by having reference cells and monitoring charge loss rates in these reference cells. These reference cells may be additional cells placed in memory arrays that may be written with known data. These reference cells may then be read periodically to monitor charge loss and thereby determine temperature history.

In FIG. 82 to FIG. 88, various techniques to improve floating-body RAM were described. Many of these techniques may involve addition of additional circuit functionality which may increase control of the memory arrays. This additional circuit functionality may be henceforth referred to as 'controller circuits' for the floating-body RAM array, or any other memory management type or memory regions described herein. FIG. 89A-C illustrates an embodiment of the invention where various configurations useful for controller functions are outlined. FIG. 89A illustrates a configuration wherein the controller circuits 21002 may be on the same chip 21006 as the memory arrays 21004. FIG. 89B illustrates a 3D configuration 21012 wherein the controller circuits may be present in a logic layer 21008 that may be stacked below the floating-body RAM layer 21010. As well, FIG. 89B illustrates an alternative 3D configuration 21014 wherein the controller circuits may be present in a logic layer 21018 that may be stacked above a floating-body RAM array 21016. 3D configuration 21012 and alternative 3D configuration 21014 may be constructed with 3D stacking techniques and methodologies, including, for example, monolithic or TSV. FIG. 89C illustrates yet another alternative configuration wherein the controller circuits may be present in a separate chip 21020 while the memory arrays may be present in floating-body chip 21022. The configurations described in FIG. 89A-C may include input-output interface circuits in the same chip or layer as the controller circuits. Alternatively, the input-output interface circuits may be present on the chip with floating-body memory arrays. The controller circuits in, for example, FIG. 89, may include memory management circuits that may extend the useable endurance of said memory, memory management circuits that may extend the proper functionality of said memory, memory management circuits that may control two independent memory blocks, memory management circuits that may modify the voltage of a write operation, and/or memory management circuits that may perform error correction and so on. Memory management circuits may include hardwired or soft coded algorithms.

Figure 90A:
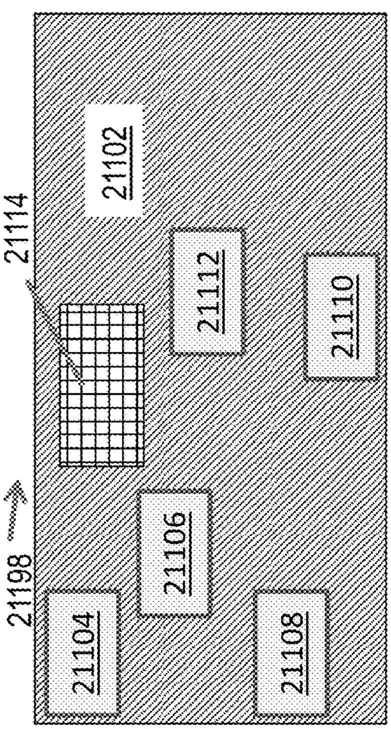
FIG. 90A-FIG. 90B are exemplary drawing illustrations of controller functionality and architecture applied to applications.
Figure 90B:
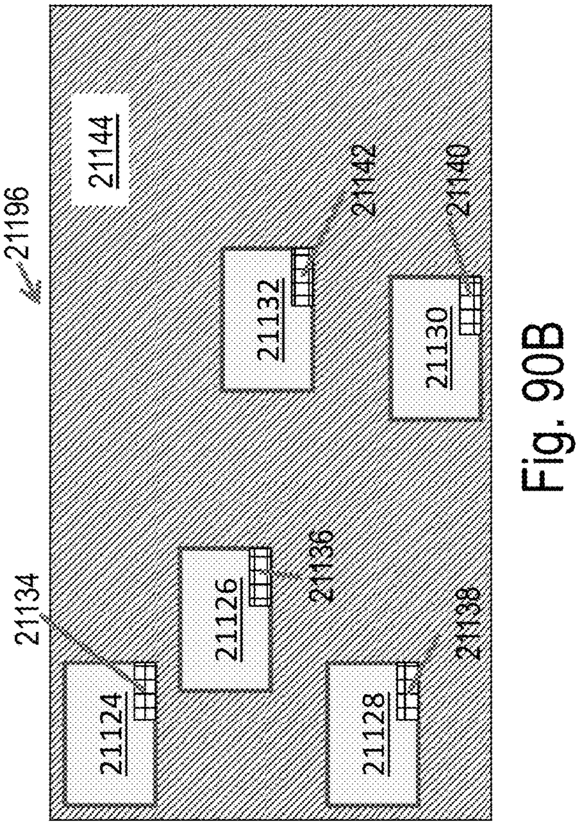

FIG. 90A-B illustrates an embodiment of the invention wherein controller functionality and architecture may be applied to applications including, for example, embedded memory. As an illustrated in FIG. 90A, embedded memory application die 21198 may include floating-body RAM blocks 21104, 21106, 21108, 21110 and 21112 spread across embedded memory application die 21198 and logic circuits or logic regions 21102. In an embodiment of the invention, the floating-body RAM blocks 21104, 21106, 21108, 21110 and 21112 may be coupled to and controlled by a central controller 21114. As illustrated in FIG. 90B, embedded memory application die 21196 may include floating-body RAM blocks 21124, 21126, 21128, 21130 and 21132 and associated memory controller circuits 21134, 21136, 21138, 21140 and 21142 respectively, and logic circuits or logic regions 21144. In an embodiment of the invention, the floating-body RAM blocks 21124, 21126, 21128, 21130 and 21132 may be coupled to and controlled by associated memory controller circuits 21134, 21136, 21138, 21140 and 21142 respectively.

Figure 91:
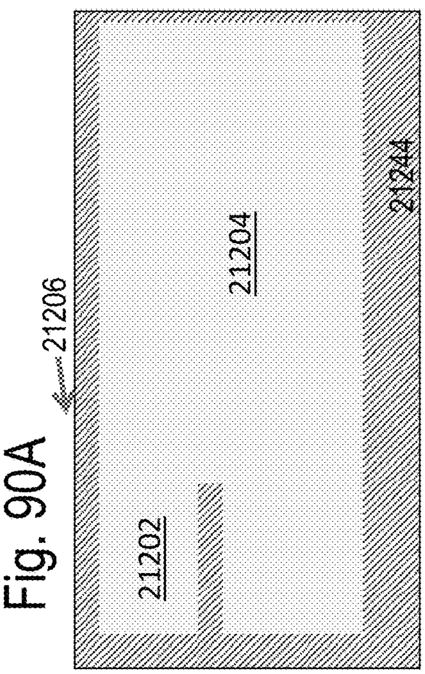
FIG. 91 is an exemplary drawing illustration of a cache structure in a floating body RAM chip.

FIG. 91 illustrates an embodiment of the invention wherein cache structure 21202 may be utilized in floating body RAM chip 21206 which may have logic circuits or logic regions 21244. The cache structure 21202 may have shorter block sizes and may be optimized to be faster than the floating-body RAM blocks 21204. For example, cache structure 21202 may be optimized for faster speed by the use of faster transistors with lower threshold voltages and channel lengths. Furthermore, cache structure 21202 may be optimized for faster speed by using different voltages and operating conditions for cache structure 21202 than for the floating-body RAM blocks 21204.

Persons of ordinary skill in the art will appreciate that the illustrations in FIG. 80 through FIG. 91 are exemplary only and are not drawn to scale. Such skilled persons will further appreciate that many variations may be possible such as, for example, many types of floating body RAM may be utilized and the invention may not be limited to any one particular configuration or type. For example, monolithic 3D floating-body RAM chips, 2D floating-body RAM chips, and floating-body RAM chips that might be 3D stacked with through-silicon via (TSV) technology may utilize the techniques illustrated with FIG. 80 to FIG. 91. Many other modifications within the scope of the illustrated embodiments of the invention described herein will suggest themselves to such skilled persons after reading this specification. Thus the invention is to be limited only by the appended claims.

Refresh may be a key constraint with conventional capacitor-based DRAM. Floating-body RAM arrays may require better refresh schemes than capacitor-based DRAM due to the lower amount of charge they may store. Furthermore, with an auto-refresh scheme, floating-body RAM may be used in place of SRAM for many applications, in addition to being used as an embedded DRAM or standalone DRAM replacement.

Figure 92:
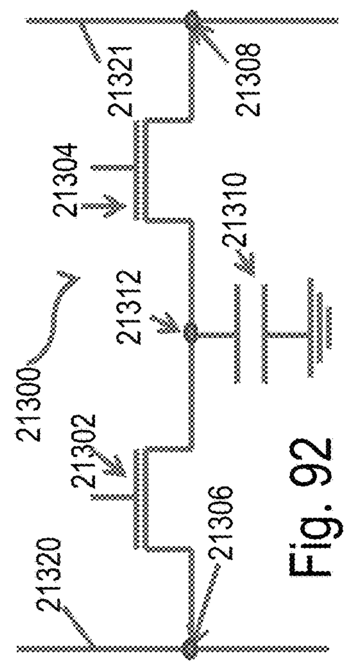

FIG. 92 illustrates an embodiment of the invention wherein a dual-port refresh scheme may be utilized for capacitor-based DRAM. A capacitor-based DRAM cell 21300 may include capacitor 21310, select transistor 21302, and select transistor 21304. Select transistor 21302 may be coupled to bit-line 21320 at node 21306 and may be coupled to capacitor 21310 at node 21312. Select transistor 21304 may be coupled to bit-line 21321 at node 21308 and may be coupled to capacitor 21310 at node 21312. Refresh of the capacitor-based DRAM cell 21300 may be performed using the bit-line 21321 connected to node 21308, for example, and leaving the bit-line 21320 connected to node 21306 available for read or write, i.e., normal operation. This may tackle the key challenge that some memory arrays may be inaccessible for read or write during refresh operations. Circuits required for refresh logic may be placed on a logic region located either on the same layer as the memory, or on a stacked layer in the 3DIC. The refresh logic may include an access monitoring circuit that may allow refresh to be conducted while avoiding interference with the memory operation. The memory or memory regions may, for example, be partitioned such that one portion of the memory may be refreshed while another portion may be accessed for normal operation. The memory or memory regions may include a multiplicity of memory cells such as, for example, capacitor-based DRAM cell 21300.

Persons of ordinary skill in the art will appreciate that the illustrations in FIG. 92 are exemplary only and are not drawn to scale. Such skilled persons will further appreciate that many variations may be possible such as, for example, a dual-port refresh scheme may be used for standalone capacitor based DRAM, embedded capacitor based DRAM that may be on the same chip or on a stacked chip, and monolithic 3D DRAM with capacitors. Moreover, refresh of the capacitor-based DRAM cell 21300 may be performed using the bit-line 21320 connected to node 21306 and leaving the bit-line 21321 connected to node 21308 available for read or write. Many other modifications within the scope of the illustrated embodiments of the invention described herein will suggest themselves to such skilled persons after reading this specification. Thus the invention is to be limited only by the appended claims.

Other refresh schemes may be used for monolithic 3D DRAMs and for monolithic 3D floating-body RAMs similar to those described in US patent application 2011/0121366 and in FIG. 79 of this patent application. For example, refresh schemes similar to those described in "The ideal SoC memory: 1T-SRAMTM," Proceedings of the ASIC/SOC Conference, pp. 32-36, 2000 by Wingyu Leung, Fu-Chieh Hsu and Jones, M.-E may be used for any type of floating-body RAM. Alternatively, these types of refresh schemes may be used for monolithic 3D DRAMs and for monolithic 3D floating body RAMs similar to those described in US patent application 2011/0121366 and in FIG. 79 of this patent application. Refresh schemes similar to those described in "Autonomous refresh of floating body cells", Proceedings of the Intl. Electron Devices Meeting, 2008 by Ohsawa, T.; Fukuda, R.; Higashi, T.; et al. may be used for monolithic 3D DRAMs and for monolithic 3D floating body RAMs similar to those described in US patent application 2011/0121366 and in FIG. 79 of this patent application.

Figure 93:
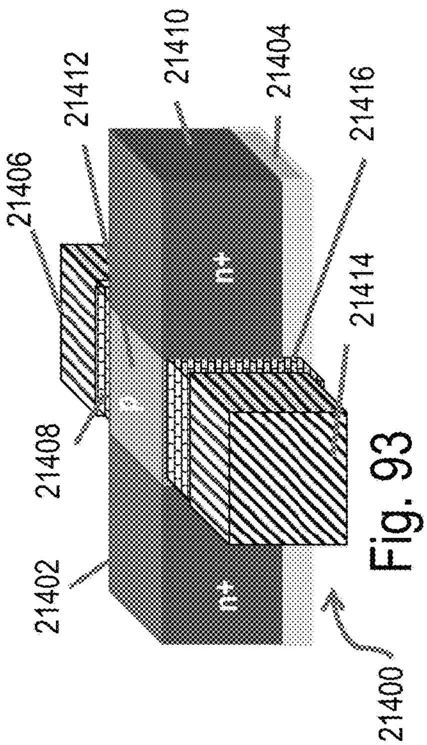

FIG. 93 illustrates an embodiment of the invention in which a double gate device may be used for monolithic 3D floating-body RAM wherein one of the gates may utilize tunneling for write operations and the other gate may be biased to behave like a switch. As an illustrative example, nMOS double-gate DRAM cell 21400 may include first n+ region 21402, second n+ region 21410, oxide regions 21404 (partially shown for illustrative clarity), gate dielectric region 21408 and associated gate electrode region 21406, gate dielectric region 21416 and associated gate electrode region 21414, and p-type channel region 21412. nMOS double-gate DRAM cell 21400 may be formed utilizing the methods described in FIG. 79 of this patent application. For example, the gate stack including gate electrode region 21406 and gate dielectric region 21408 may be designed and electrically biased during write operations to allow tunneling into the p-type channel region 21412. The gate dielectric region 21408 thickness may be engineered to be thinner than the mean free path for trapping, so that trapping phenomena may be reduced or substantially eliminated.

Persons of ordinary skill in the art will appreciate that the illustrations in FIG. 93 are exemplary only and are not drawn to scale. Such skilled persons will further appreciate that many variations may be possible such as, for example, a pMOS transistor may be used in place of or in complement to nMOS double gate DRAM cell 21400. Moreover, nMOS double gate DRAM cell 21400 may be used such that one gate may be used for refresh operations while the other gate may be used for standard write and read operations. Furthermore, nMOS double-gate DRAM cell 21400 may be formed by method such as described in U.S. patent application 20110121366. Many other modifications within the scope of the illustrated embodiments of the invention described herein will suggest themselves to such skilled persons after reading this specification. Thus the invention is to be limited only by the appended claims.

Figure 94A:
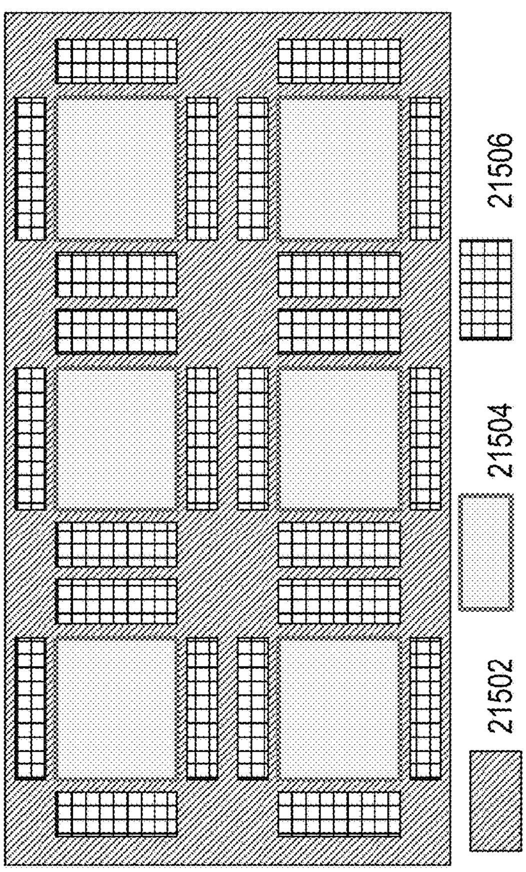

FIG. 94A illustrates a conventional chip with memory wherein peripheral circuits 21506 may substantially surround memory arrays 21504, and logic circuits or logic regions 21502 may be present on the die. Memory arrays 21504 may need to be organized to have long bit-lines and word-lines so that peripheral circuits 21506 may be small and the chip's array efficiency may be high. Due to the long bit-lines and word-lines, the energy and time needed for refresh operations may often be unacceptably high.

Figure 94B:
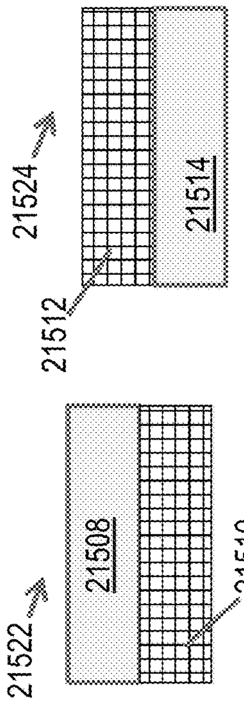

FIG. 94B illustrates an embodiment of the invention wherein peripheral circuits may be stacked monolithically above or below memory arrays using techniques described in patent application 2011/0121366, such as, for example, monolithic 3D stacking of memory and logic layers. Memory array stack 21522 may include memory array layer 21508 which may be monolithically stacked above peripheral circuit layer 21510. Memory array stack 21524 may include peripheral circuits 21512 which may be monolithically stacked above memory array layer 21514. Memory array stack 21522 and Memory array stack 21524 may have shorter bit-lines and word-lines than the configuration shown in FIG. 94A since reducing memory array size may not increase die size appreciably (since peripheral circuits may be located underneath the memory arrays). This may allow reduction in the time and energy needed for refresh.

Figure 94C:
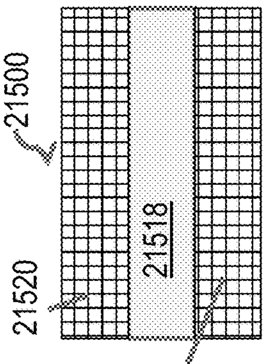

FIG. 94C illustrates an embodiment of the invention wherein peripheral circuits may be monolithically stacked above and below memory array layer 21518 using techniques described in US patent application 2011/0121366, such as, for example, monolithic 3D stacking of memory and logic layers including vertical connections. 3D IC stack 21500 may include peripheral circuit layer 21520, peripheral circuit layer 21516, and memory array layer 21518. Memory array layer 21518 may be monolithically stacked on top of peripheral circuit layer 21516 and then peripheral circuit layer 21520 may then be monolithically stacked on top of memory array layer 21518. This configuration may have shorter bit-lines and word-lines than the configuration shown in FIG. 94A and may allow shorter bit-lines and word-lines than the configuration shown in FIG. 94B. 3D IC stack 21500 may allow reduction in the time and energy needed for refresh. A transferred monocrystalline layer, such as, for example, memory array layer 21518 and peripheral circuit layer 21520, may have a thickness of less than about 150 nm.

Persons of ordinary skill in the art will appreciate that the illustrations in FIG. 94A through FIG. 94C are exemplary only and are not drawn to scale. Such skilled persons will further appreciate that many variations may be possible such as, for example, 3D IC stack may include, for example, two memory layers as well as two logic layers. Many other modifications within the scope of the illustrated embodiments of the invention described herein will suggest themselves to such skilled persons after reading this specification. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems, such as, for example, mobile phones, smart phone, and cameras. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. The need to reduce power to allow effective use of limited battery energy and also the lightweight and small form factor derived by highly integrating functions with low waste of interconnect and substrate could be highly benefitted by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system. 3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superheterodyne techniques. In a super heterodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

Some embodiments of the invention may include alternative techniques to build IC (Integrated Circuit) devices including techniques and methods to construct 3D IC systems. Some embodiments of the invention may enable device solutions with far less power consumption than prior art, or with more functionality in a smaller physical footprint. These device solutions could be very useful for the growing application of Autonomous in vivo Electronic Medical (AEM) devices and AEM systems such as ingestible "camera pills," implantable insulin dispensers, implantable heart monitoring and stimulating devices, and the like. One such ingestible "camera pill" is the Philips' remote control "iPill". For example, incorporating the 3D IC semiconductor devices according to some embodiments of the invention within these AEM devices and systems could provide superior autonomous units that could operate much more effectively and for a much longer time than with prior art technology. Sophisticated AEM systems may be greatly enhanced by complex electronics with limited power budget. The 3D technology described in many of the embodiments of the invention would allow the construction of a low power high complexity AEM system. For example it would be possible to integrate into a small form function a complex logic circuit with high density high speed memory utilizing some of the 3D DRAM embodiments herein and to add some non-volatile 3D NAND charge trap or RRAM described in embodiments herein. Also in another application 12/903,862 filed by some of the inventors and assigned to the same assignee a 3D micro display and a 3D image sensor are presented. Integrating one or both to complex logic and or memory could be very effective for retinal implants. Additional AEM systems could be customized to some specific market applications.

3D ICs according to some embodiments of the invention could also enable electronic and semiconductor devices with a much higher performance due to the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These advantages could lead to more powerful computer systems and improved systems that have embedded computers.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described herein above as well as modifications and variations which would occur to such skilled persons upon reading the foregoing description. Thus the invention is to be limited only by the appended claims.

We claim:

1. A method for producing a 3D memory device, the method comprising:

providing a first level comprising a single-crystal layer and control circuits, wherein said first level comprises at least two interconnecting metal layers;

forming at least one second level disposed above said first level;

performing a first etch step comprising etching holes within said at least one second level;

forming at least one third level disposed above said at least one second level;

performing a second etch step comprising etching holes within said third level; and performing additional processing steps to form a plurality of first memory cells within said second level and a plurality of second memory cells within said third level, wherein each of said first memory cells comprise one first transistor, wherein each of said second memory cells comprise one second transistor, wherein said control circuits comprise a plurality of third transistors, wherein at least one of said first or second transistors has a channel, a source, and a drain each having a same doping type, wherein said first etch step is directly followed by a first deposition of a tunneling dielectric and then a second deposition comprising polysilicon, wherein said control circuits comprise memory peripheral circuits, wherein at least one of said first memory cells is at least partially atop a portion of said memory peripheral circuits, and wherein said first memory cells and said second memory cells are a NAND nonvolatile type memory.

2. The method according to claim 1, wherein said processing steps to form said plurality of first memory cells comprise a gate replacement process.

3. The method according to claim 1, wherein said third level comprises at least two overlying layers comprising different materials.

4. The method according to claim 1, wherein said method of processing at least said memory peripheral circuits accounts for a thermal budget associated with processing said first transistors and with processing said second transistors by adjusting an annealing of said plurality of third transistors accordingly.

5. The method according to claim 1, further comprising:

an etch step comprising formation of said first transistors and said second transistors, wherein at least a portion of said second transistors are atop said first transistors.

6. The method according to claim 1, wherein said first deposition or said second deposition comprises use of Atomic Layer Deposition ("ALD").

7. The method according to claim 1, wherein said first etch step comprises use of a Reactive Ion Etching ("RIE") process.

8. A method for producing a 3D memory device, the method comprising:

providing a first level comprising a first single-crystal layer and control circuits, wherein said first level comprises at least two interconnecting metal layers;

forming at least one second level disposed above said first level;

performing a first etch step comprising etching holes within said second level;

forming at least one third level above said at least one second level;

performing a second etch step comprising etching holes within said third level; and performing additional processing steps to form a plurality of first memory cells within said second level and a plurality of second memory cells within said third level;

wherein each of said first memory cells comprise one first transistor, wherein each of said second memory cells comprise one second transistor, wherein said first memory cells and said second memory cells are a NAND nonvolatile type memory, and wherein at least one of said second transistors comprise a metal gate.

9. The method according to claim 8, wherein said control circuits comprise memory peripheral circuits, and wherein said memory peripheral circuits comprise control of said first memory cells and said second memory cells.

10. The method according to claim 8, wherein said third level comprises at least two overlying layers each comprising different materials, and wherein said different materials each comprise a differing etch rate and are selectively etch-able with respect to each other.

11. The method according to claim 8, wherein said method of processing at least said memory peripheral circuits accounts for a thermal budget associated with processing of said first transistors and said second transistors by adjusting an annealing of said plurality of third transistors accordingly.

12. The method according to claim 8, further comprising:

an etch step comprising formation of said first transistors and said second transistors, wherein at least a portion of said second transistors are atop said first transistors.

13. The method according to claim 8, wherein said first deposition or said second deposition comprises use of Atomic Layer Deposition ("ALD").

14. The method according to claim 8, wherein said first etch step comprises use of Reactive Ion Etching (RIE) process.

15. A method for producing a 3D memory device, the method comprising:

providing a first level comprising a first single crystal layer and control circuits, wherein said control level comprises at least two interconnecting metal layers;

forming at least one second level above said first level;

performing a first etch step comprising etching holes within said second level;

forming at least one third level above said at least one second level;

performing a second etch step comprising etching holes within said third level; and performing additional processing steps to form a plurality of first memory cells within said second level and a plurality of second memory cells within said third level, wherein each of said first memory cells comprise one first transistor, wherein each of said second memory cells comprise one second transistor, wherein said performing additional processing steps comprises performing Atomic Layer Deposition ("ALD"), and wherein at least one of said first or second transistors has a channel, a source, and a drain having a same doping type.

16. The method according to claim 15, wherein said control circuits comprise memory peripheral circuits, and wherein said memory peripheral circuits comprise control of said first memory cells and said second memory cells.

17. The method according to claim 15, wherein said first memory cells and said second memory cells are a NAND nonvolatile type memory.

18. The method according to claim 15, wherein said second level comprises at least two overlying layers each comprising different materials, and wherein said different materials each comprise a differing etch rate, and are selectively etch-able with respect to each other.

19. The method according to claim 15, further comprising:

an etch step comprising the formation of said first transistors and said second transistors, wherein at least a portion of said second transistors are atop said first transistors.

20. The method according to claim 15, wherein at least one of said second transistors comprise a metal gate.

* * * * *